United States Patent [19]

Smith-Vaniz

[11] Patent Number: 4,723,220

[45] Date of Patent: Feb. 2, 1988

[54] APPARATUS FOR POWER MEASURING AND CALCULATING FOURIER COMPONENTS OF POWER LINE PARAMETERS

[75] Inventor: William R. Smith-Vaniz, Darien, Conn.

[73] Assignee: Niagara Mohawk Power Corporation, Syracuse, N.Y.

[21] Appl. No.: 841,944

[22] Filed: Mar. 20, 1986

Related U.S. Application Data

[62] Division of Ser. No. 484,681, Apr. 13, 1983, Pat. No. 4,689,752.

[51] Int. Cl.[4] ........................ H02J 13/00; G06F 15/56

[52] U.S. Cl. .................................... 364/492; 340/539; 340/657; 340/870.17; 364/576

[58] Field of Search ........................ 364/483, 492, 576; 324/127; 340/538, 539, 657, 870.17, 870.38

[56] References Cited

U.S. PATENT DOCUMENTS

| | | | |
|---|---|---|---|
| 3,931,502 | 1/1976 | Kohlas | 364/492 |
| 4,158,810 | 6/1979 | Leskovar | 324/127 |
| 4,261,038 | 4/1981 | Johns et al. | 364/576 |
| 4,384,289 | 5/1983 | Stillwell et al. | 340/870.17 |
| 4,420,752 | 12/1983 | Davis et al. | 340/870.17 |

FOREIGN PATENT DOCUMENTS

| | | | |
|---|---|---|---|
| 0125050 | 11/1984 | European Pat. Off. | 374/152 |

*Primary Examiner*—Errol A. Krass
*Assistant Examiner*—Kevin J. Teska
*Attorney, Agent, or Firm*—Lalos & Keegan

[57] ABSTRACT

Self contained radio transmitting state estimator modules are mounted on power conductors on both sides of power transformers in electrical substations and on power conductors at various places along electrical transmission lines. They are electrically isolated from ground and all other conductors. These modules are capable of measuring current, voltage, frequency and power factor (or the fourier components thereof) the temperature of the conductor, and the temperature of the ambient air. The modules transmit these parameters to local receivers. The receivers are connected by an appropriate data transmission link, to a power control center which allows determination of the state of the power system. The module measures the Fourier components of voltage and current over a number of cycles and transmits the components to the local receiver.

22 Claims, 72 Drawing Figures

FIG. 38

| Word | | | |
|---|---|---|---|
| 0 | SPARE | AUX I.D. | DONUT I.D. |
| 1 | $V_A$ | | |
| 2 | $V_B$ | | |
| 3 | $I_A$ | | |
| 4 | $I_B$ | | |
| 5 | AUXILLIARY DATA | | |
| 6 | CRC | | |

| AUXILLIARY I D: | | |
|---|---|---|
| | 0100 | TEMPERATURE 1 |
| | 0110 | TEMPERATURE 2 |
| | 1000 | CHECK GROUND |
| | 1010 | CHECK VOLTAGE |
| | 1100 | SPARE |
| | 1110 | SPARE |

THE MOST SIGNIFICANT BIT OF EACH WORD IS TRANSMITTED FIRST.

FIG. 65

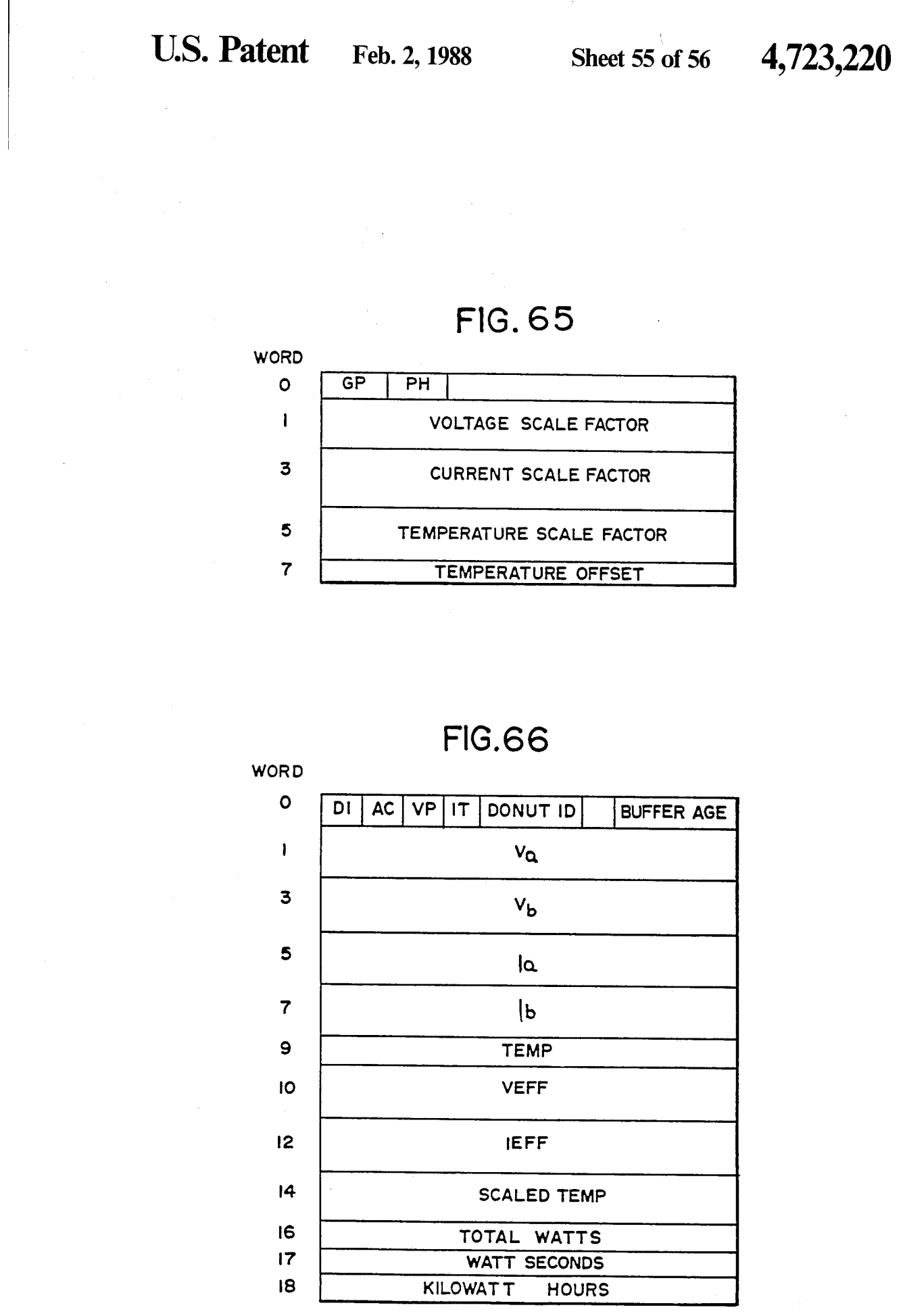

| WORD | | | |
|---|---|---|---|
| 0 | GP | PH | |
| 1 | VOLTAGE SCALE FACTOR | | |
| 3 | CURRENT SCALE FACTOR | | |
| 5 | TEMPERATURE SCALE FACTOR | | |
| 7 | TEMPERATURE OFFSET | | |

FIG. 66

| WORD | | | | | | | |
|---|---|---|---|---|---|---|---|
| 0 | DI | AC | VP | IT | DONUT ID | | BUFFER AGE |
| 1 | $V_a$ | | | | | | |
| 3 | $V_b$ | | | | | | |
| 5 | $I_a$ | | | | | | |
| 7 | $I_b$ | | | | | | |
| 9 | TEMP | | | | | | |
| 10 | VEFF | | | | | | |
| 12 | IEFF | | | | | | |
| 14 | SCALED TEMP | | | | | | |
| 16 | TOTAL WATTS | | | | | | |
| 17 | WATT SECONDS | | | | | | |
| 18 | KILOWATT HOURS | | | | | | |

FIG. 67

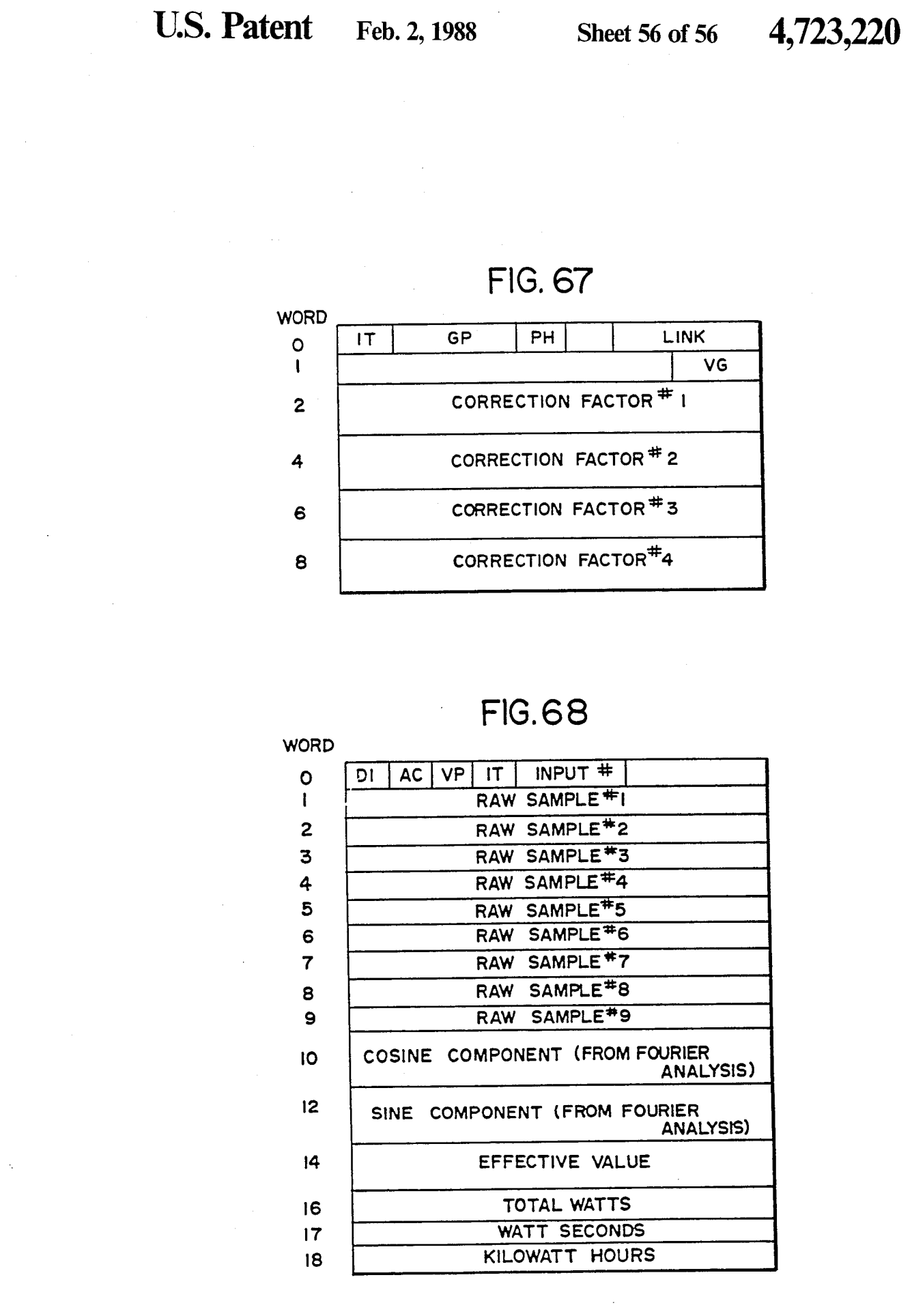

| WORD | | | | | |
|---|---|---|---|---|---|
| 0 | IT | GP | PH | | LINK |
| 1 | | | | | VG |
| 2 | CORRECTION FACTOR # 1 | | | | |
| 4 | CORRECTION FACTOR # 2 | | | | |
| 6 | CORRECTION FACTOR # 3 | | | | |
| 8 | CORRECTION FACTOR # 4 | | | | |

FIG. 68

| WORD | | | | | | |
|---|---|---|---|---|---|---|
| 0 | DI | AC | VP | IT | INPUT # | |
| 1 | RAW SAMPLE # 1 | | | | | |
| 2 | RAW SAMPLE # 2 | | | | | |
| 3 | RAW SAMPLE # 3 | | | | | |
| 4 | RAW SAMPLE # 4 | | | | | |
| 5 | RAW SAMPLE # 5 | | | | | |
| 6 | RAW SAMPLE # 6 | | | | | |
| 7 | RAW SAMPLE # 7 | | | | | |
| 8 | RAW SAMPLE # 8 | | | | | |
| 9 | RAW SAMPLE # 9 | | | | | |
| 10 | COSINE COMPONENT (FROM FOURIER ANALYSIS) | | | | | |
| 12 | SINE COMPONENT (FROM FOURIER ANALYSIS) | | | | | |
| 14 | EFFECTIVE VALUE | | | | | |
| 16 | TOTAL WATTS | | | | | |
| 17 | WATT SECONDS | | | | | |
| 18 | KILOWATT HOURS | | | | | |

APPARATUS FOR POWER MEASURING AND CALCULATING FOURIER COMPONENTS OF POWER LINE PARAMETERS

This is a divisional of co-pending application Ser. No. 484,681 filed on Apr. 13, 1983, now U.S. Pat. No. 4,689,752.

RELATED APPLICATION

This application is related to the prior U.S. patent application of Howard R. Stillwel and Roosevelt A. Fernandes entitled TRANSPONDER UNIT FOR MEASURING TEMPERATURE AND CURRENT ON LIVE TRANSMISSION LINES, U.S. Pat. No. 4,384,289, issued May 17, 1983, which application is incorporated herein by reference.

TECHNICAL FIELD

This invention relates to a system and apparatus for monitoring and control of a bulk electric power delivery system. More particularly it relates to such systems employing transmission line mounted radio transmitting electrically isolated modules, preferably mounted on all power conductors connected to both the primary and secondary sides of each power transformer to be monitored, on the highest temperature portions of transmission lines, and at intervals through the power delivery system. When so attached the modules form the basis for a dynamic state estimation for real-time computer control of an electric power delivery system.

Each module takes the form of a two piece donut that may be hot stick mounted on a live conductor utilizing a novel hinge clamp and novel hot stick tool.

Novel voltage measuring and fourier component measuring apparatus and a novel common channel unsynchronized transmission system are disclosed.

BACKGROUND ART

Various power line monitored sensors have been disclosed in the prior art. For example, see U.S. Pat. Nos. 3,428,896, 3,633,191, 4,158,810 and 4,268,818. It has been proposed to use sensors of this type and of the greatly improved form disclosed in the above-identified Stillwel and Fernandes application for dynamic line rating of electrical power transmission lines. See for example, papers numbered 82 SM 377-0 and 82 SM 378-8 entitled DYNAMIC THERMAL LINE RATINGS, PART I, DYNAMIC AMPACITY RATING ALGORITHM; and, DYNAMIC THERMAL LINE RATINGS, PART II, CONDUCTOR TEMPERATURE SENSOR AND LABORATORY FIELD TEST EVALUATION; papers presented at the Institute of Electrical and Electronic Engineers P.E.S. 1982 summer meeting. These papers are incorporated herein by reference. However, the full potential of this new technology has not been realized.

Today, for control and protection, power supply to and from an electrical substation over various transmission lines is monitored by separates devices (current transformers, potential transformers and reactive power transducers) for measuring electrical potential, power factor and current in the conductors of the transmission line and the conductors connected to substation power transformers. These measurements are transmitted in analog fashion by various wires to a central console at the substation where their values may or may not be digitized and sent to a central station for control of the entire power system. The wiring of these devices is difficult and expensive, and every excess wire in a substation presents an additional electrical shock hazard or an induction point for electromagnetic interference on protection/telemetry circuits. Furthermore, when a failure occurs, these sensor lines may be abruptly raised to higher voltages, thus increasing the possibility of shock and failure in the measurement system.

The high cost of capital, uncertain power utility load growth trends, coupled with increasing constraints in acquiring and licensing new facilities including right-of-way for transmission lines make greater use of existing power delivery facilities (remote generating stations, the EHV bulk power network, subtransmission and distribution facilities) a paramount consideration. With deferrals that have occurred in new generation and power transmission facilities, all elements of the power system will be strained to a greater degree than in the past. In order to maintain current reliability levels under these conditions, additional real-time monitoring will be required to assist the dispatch operator and other bulk network functions conducted through a modern Power Control Center.

Some of the functions in a hierarchical modern Power Control Center, operating through Regional Control Centers down to the distribution level, that require a real-time Supervisory Control and Data Acquisition System are as follows:

1. State Estimation
2. On-Line Load Flow Detection
3. Optimum Power Flow Control for Real and Reactive Power Dispatch
4. Security (i.e. Stability) Constrained Economic Dispatch
5. Contingency Analysis
6. Automatic Generation Control and Minimum Area Control Error
7. Dynamic System Security Analysis
8. Energy Interchange Billing
9. System Restoration After an Emergency
10. Load Shedding and Generation Redispatch
11. Determination of Effects of Voltage Reduction and Real and Reactive Power
12. Synchronization of System Load Profiles to validate various computer models and to provide snap shots of maximum, minimum loads, peak day real and reactive powers on lines and equipment
13. Maintain Power Delivery Quality Including Harmonic Content for Critical Loads and Power Factor
14. Limit checking of voltage, line thermal loadings and rate of change under contingency conditions
15. Protective Relaying.

The key parameters that require measurement for a modern Power Control Center State Estimator and On-Line Load Flow that provide the input data base for the various functions listed above are:

Line and Transformer Bank or Bus Power (MW) Flows
Line and Transformer Bank or Bus Reactive Power (MVAR)
Flow
Branch Currents (I), Bus Voltage and Phase Angles
Bus MW and MVAR Injections
Energy (MWh) and Reactive Energy (MVAR-h)
Circuit Breaker Status
Manual Switch Positions
Tap Changer Positions Frequency (f)
Protective Relaying (Differential Currents, etc.) Operation
Power Line Dynamic Ratings Based on Conductor Thermal
(Temperature) Limits or Sag
Ambient Temperature/Wind Speed
Line and Equipment Power Factors
Sequence-of-Events Monitoring One of the major problems in implementing a modern Power Control System is to add instrumentation throughout the bulk transmission network at Extra High Voltage (up to 765 kV) line voltages and at distribution substations and feeders. This must be done without disrupting existing operations of equipment and facilities that are largely in place. Another requirement is to avoid adding too many transducers that might alter the burden on existing current transformers and degrade accuracy of existing metering or relaying instrumentation.

The toroidal conductor State Estimator Module and ground station processor, receiver/transmitter of the present invention eliminates the necessity for multiple wiring of transducers required with conventional current and potential transformers and collects all the data required from lines and station buses with a compact system. The invention results in significant investment, installation labor and time savings. It completely eliminates the need for multiple transducers, hard-wiring to current transformers and potential transformers and any degrading effects on existing relaying or metering links. The system can be retrofitted on existing lines or stations or new installations with equal ease and measures:

Line Voltage
Power Factor or Phase Angle
Power Per Phase
Line Current
Reactive Power Per Phase
Conductor Temperature
Ambient Temperature
Wind Speed
Harmonic Currents
Frequency
MW-h and MVAR-h (processed quantities)
Profiles of above quantities from stored values The state-estimator data collection system described in this application enables power utilities to implement modern power control systems more rapidly, at lower cost and with considerable flexibility, since the devices can be moved around using hot-sticks without having to interrupt power flow. The devices can be calibrated and checked through the radio link and the digital output can be multiplexed with other station data to a central processor via remote communication link.

Many problems had to be overcome to provide an electrically isolated state estimator module that can be hot stick mounted to energized conductors including the highest used in electrical transmission.

Among these were: The design of a positive acting mechanism for hinging the two parts of the module and securely clamping and unclamping them about a live conductor while they were supported by a hot stick. Measurement of the voltage of the conductor in a self-contained electrically isolated module. The desire to make many electrical measurements with a necessarily small and light module and common utilization of a single radio channel by the up to 15 modules which might be required at a single substation.

Such hot stick activated hinge and clamp mechanisms do not exist in the prior art. The voltage transformers and capacitive dividers of the prior art are not electrically isolated. Separate measurements of all electrical quantities desired wound require too much apparatus in the module. Synchronization of module transmissions would require a radio receiver in each module.

DISCLOSURE OF THE INVENTION

Referring to FIG. 1, toroidal shaped sensor and transmitter modules 20 are mounted on live power conductors 22 by use of a special, detachable hot-stick tool 108 (see FIG. 2) which opens and closes a positively actuated hinging and clamping mechanism. Each module contains means for sensing one or more of a plurality of parameters associated with the power conductor 22 and its surrounding environment. These parameters include the temperature of the power conductor 22, the ambient air temperature near the conductor, the current flowing in the conductor, and the conductor's voltage, frequency, power factor and harmonic currents. Other parameters such as wind velocity and direction and solar thermal load could be sensed, if desired. In addition, each module 20 contains means for transmitting the sensed information to a local receiver 24.

Referring to FIG. 3, each toroidal module 20 is configured with an open, spoked area 26 surrounding the mounting hub 28 to permit free air circulation around the conductor 22 so that the conductor temperature is not disturbed. The power required to operate the module is collected from the power conductor by coupling its magnetic field to a transformer core encircling the line within the toroid. The signals produced by the various sensors are converted to their digital equivalents by the unit electronics and are transmitted to the ground receiver in periodic bursts of transmission, thus minimizing the average power required.

One or more of these toroidal sensor units, or modules, may be mounted to transmission lines within the capture range of the receiver and operated simultaneously on the same frequency channel. By slightly varying the intervals between transmissions on each module, keeping them integral numbers without a common further and limiting the maximum number of modules in relation to these intervals, the statistical probability of interference between transmissions is controlled to an acceptable degree. Thus, one receiver, ground station 24, can collect data from a plurality of modules 20.

The ground station 24, containing a receiver and its antenna 30, which processes the data received, stores the data until time to send or delivery it to another location, and provides the communication port indicated at 32 linking the system to such location. The processing of the data at the ground station 24 includes provisions for scaling factors, offsets, curve correction, waveform analysis and correlative and computational conversion of the data to the forms and parameters desired for transmission to the host location. The ground station processor is programmed to contain the specific calibration corrections required for each sensor in each module in its own system.

Referring to FIG. 5, the ground stations 24 are connected to the Power Control Center 54 by appropriate data transmission links 32 (radio, land lines or satellite channels) where the measured data is processed by a Dynamic State Estimator which then issues appropriate control signals over other transmission links 33 to the switchgear 58 at electrical substations 44. Thus the power supply to transmission lines may be varied in accordance with their measured temperatures and measured electrical parameters. Similar, when sensors are located in both the primary and secondary circuits of power transformers, transformer faults may be detected and the power supplied to the transformer controlled by the Dynamic State Estimator through switchgear.

In one aspect of the invention a Dynamic State Estimator may be located at one or more substations to control the supply of electrical power to the transformers located there or to perform other local control functions.

Thus, as shown in FIG. 4, an electrical substation 34 may be totally monitored by the electrically isolated modules 20 of the invention. Up to 15 of these modules may be connected as shown transmitting to a single receiver 24. The receiver may have associated therewith local control apparatus 36 for controlling the illustrative transformer bank 38 and the electrical switchgear indicated by the small squares 40. The modules 20 may be mounted to live conductors without the expense and inconvenience of disconnecting any circuits and require no wiring at the substation 34. The receiver 24 also transmits via its transmission link 32 the information received, from the modules 20 (for determining the total state of the electrical substation) to the Central Control Station 54 of the electrical delivery system.

The system of the invention is adapted for total monitoring and control of a bulk electrical power delivery system as illustrated in FIG. 5. Here, modules 20 are located throughout the delivery system monitoring transformer banks 40 and 42, substations 44 and 46, transmission lines generally indicated at 48 and 50, and feeder sections generally indicated at 52.

A number of modules are preferably located along transmission lines such as lines 48 and 50, one per phase at each monitoring position. By monitoring the temperature of the conductors they indicate the instantaneous dynamic capacity of the transmission line. Since they are located at intervals along the transmission line they can be utilized to determine the nature and location of faults and thus facilitate more rapid and effective repair.

The ground stations 24 collect the data from their local modules 20 and transmit it to the Power Control Center 54 on transmission links 33. The Power Control Center, in turn, controls automatic switching devices 56, 58 and 60 to control the system.

As illustrated in FIG. 5, ground station 24 located at transformer bank 42 may be utilized to control the power supplied to transformer bank 42 via a motorized tap system generally indicated at 62.

As shown in FIG. 6, the module 20 according to the invention comprises two halves of a magnetic core 64 and 66, and a power takeoff coil 68, and two spring loaded temperature probes 70 and 72 which contact the conductor and an ambient temperature probe 74.

In order to insure that the case 76 is precisely at the potential of the conductor 22 when the conductors are contacted by the probes 70 and 72, a spring 78 is provided, which engages the conductor 22 and remains engaged with the conductor and connects it to the case 76 before and during contact of the probes 70 and 72 with the conductor. Alternatively, or simultaneously, contact may be maintained through conductive inputs in the hub 28.

The electrical current in the conductor is measured by a Rogowski coil 80 shown in FIG. 7.

The voltage of the conductor is measured by a pair of arcuate capacitor plates 82 in the cover portions of the donut, only one of which is shown in FIGS. 8 and 9. The electronics is contained in sealed boxes 84 within the donut 20 as shown in FIG. 10.

Block diagrams of the electronics of the donut 20 are shown in FIGS. 28 and 30.

Referring to FIG. 30, the voltage sensing plates 82 are connected to one of a plurality of input amplifiers generally indicated at 86. The input amplifier 86 connected to the voltage sensing plates 82 measures the current between them and local ground indicated at 88, which is the electrical potential of the conductor 22 on which the donut 20 is mounted. Thus the amplifier 86 provides a measure of the current flowing between the plates 82 and the earth through a capacitance $C_1$ (see FIGS. 32 and 33). That is, it measures the current collected by the plates 86 which would otherwise flow to local ground. This is a direct measure of the voltage of the conductor with respect to earth.

As also shown in FIG. 30, the temperature transducers 70, 72, and 74, and Rogowski coil 80 are each connected to one of the input amplifiers 86. An additional temperature transducer may be connected to one of the spare amplifiers 86 to measure the temperature of the electronics in the donut. The outputs of the amplifiers are multiplexed by multiplexer 90 and supplied to a digital-to-analog converter and computer generally indicated at 92, coded by encoder 94, and transmitted by transmitter 96 via antenna 98, which may be a patch antenna on the surface of the donut as illustrated in FIG. 3.

As illustrated in the timing diagram of FIG. 34, the current and voltage are sampled by the computer 92 nine times at one-ninth intervals of the current wave form; each measurement being taken in a successive cycle. The computer initially goes through nine cycles to adjust the one-ninth interval timing period to match the exact frequency of the current at that time, and then makes the nine measurements. These measurements are transmitted to the ground station 24 and another computer 334 at the ground station (FIG. 62) calculates the current, voltage, power, reactive power, power factor, and harmonics as desired; provides these to a communications board 106; and thus to a communications link 32.

For a maximum of fifteen donuts for which it is desired to transmit information each second or two, the relative transmission intervals can be chosen to be between 37/60ths and 79/60ths of a second; each transmission interval being an integral number of 60ths of a second which do not have a common factor. This form of semi-random transmission according to the invention will insure 76% successful transmission with less than two seconds between successful transmissions from the same donut in the worst case.

The hot stick mounting tool of the invention generally indicated at 108 in FIG. 3 is shown in detail in FIGS. 25, 26, and 27. It comprises a Allen wrench portion 110 and a threaded portion 112, mounted to a universal generally indicated at 114. Universal 114 is mounted within a shell 116 which in turn is mounted to a conventional hot stick mounting coupling generally indicated at 118; and thus the hot stick 176.

When the hot stick tool 108, as shown in FIG. 3, is inserted into the opening 122 in the donut 20, the Allen wrench portion engages barrel 124 (FIG. 24) which is oppositely threaded on each of its ends 126 and 128. Threaded portion 126 is engaged with a mating threaded portion of a cable clamp 130 and threaded portion 128 engages a mating threaded portion 144 of a nut 132. The nut 132 is fixed by means of bosses 134 in plates 136 and 138, mounted to hinge pins 140 and 142 (FIG. 23). Thus, when the hot stick tool 108 is inserted, and barrel 124 rotated in one direction, cable clamp 130 is brought towards nut 132, while when barrel 124 is rotated in the other direction, cable clamp 130 moves away from nut 132. Threaded portion 144 of nut 132 engages the threaded portion 112 of the hot stick tool 108, such that when cable clamp 130 and nut 132 are spread apart the threaded portion 112 of the hot stick tool is threaded into nut 132 so that the donut module 20 may be supported on the tool 108.

Since hinge pins 140 and 142 are located near the outer edge of the donut 20 and fixed pins 146 and 148 are affixed to the donut more inwardly, if the pins 146 and 148 are spread apart, the donut will open to the position shown in FIG. 6 and if the pins 146 and 148 are brought together, the donut will close. The pins 142 and 146 and 140 and 148 are joined by respective ramp arms 150 and 152. When cable clamp 130 is separated from nut 132, the ramp arms, and thus pins 146 and 148, are spread apart by the wedge portions 154 and 156 of cable clamp 130. At the same time the threaded portion 112 of the hot stick tool 108 engages the threaded portion 144 of nut 132 so that the donut 20 is securely mounted to the tool 108. A cable 158 passes around pins 146 and 148 and is held in cable clamp 130 by cable terminating caps 160 and 162. Thus when cable clamp 130 and nut 132 are brought together, the cable 158 pulls fixed pins 146 and 148 together to securely close the donut 20 and clamp it about the conductor 22. Shortly after it is drawn tight, the threaded portion of the hot stick tool 108 disengages the threaded portion 144 of nut 132 by continued turning in the same direction.

If for any reason the donut 20 cannot be removed from a conductor 22 by using the hot stick tool 108, another hot stick tool generally indicated at 164 in FIG. 20 may be used to cut the cable 158. Tool 164 has a file 166 mounted thereon for this purpose. It may also be provided with a threaded portion 168 to engage the threaded portion 144 of nut 132 after the cable 158 has been severed.

OBJECTS OF THE INVENTION

It is therefore an object of the invention to provide a system and apparatus for monitoring and control of an electric power delivery system.

Another object of the invention is to provide such a system predominantly employing radio transmitting modules mounted to power conductors.

A further object of the invention is to provide such a system greatly reducing, if not eliminating, the use of wiring to transmit measurements at an electrical substation.

Still another object of the invention is to provide such a system for determining the state of a substation dynamically.

Yet still another object of the invention is to provide such a system for determining the state of an electrical power delivery system dynamically.

Yet still another object of the invention is to provide such a system for determining dynamic thermal line ratings.

A further object of the invention is to provide such a system for monitoring and controlling the status of electrical power station equipment.

Another object of the invention is to provide such a system wherein the sensors are capable of measuring, as desired, current, voltage, frequency, phase angle, the fourier components of current and voltage from which other quantities may be calculated, the temperature of the conductor to which they are attached, or the temperature of the ambient air surrounding the conductor to which they are attached.

Another object of the invention is to provide a state estimator module to sense various power quantities including those necessary for dynamic line ratings that can be rapidly, safely and reliably installed and removed from an energized high voltage transmission facility, up to 345 KV line to line.

A further object of the invention is to provide a state estimator module that can be installed and removed with standard utility "hot stick" tools with an adaptor tailored for the module and for operation by a single lineman or robot.

Still another object of the invention is to provide a "hot stick" mountable unit that is light weight, compact in size, can be remotely calibrated, is toroidal in shape with a metallic housing consisting of a central hub suitable for various conductor sizes with the "hot stick" tool capable of opening and closing the toroidal housing around the conductor; the hub being provided with ventilating apertures and thermally insulated inserts which grip the transmission line.

A still further object of the invention is to provide a module of the above character that is brought to conductor potential before delicate electric equipment contacts the conductor.

Yet another object of the invention is to provide a state estimator module that maintains positive engagement with a hot stick mountable tool except when it is "snap shut" around the conductor.

Yet still another object of the invention is to provide a hinge clamp for a module of the above character.

A yet still further object of the invention is to provide a hinge clamp of the above character that may be opened by an alternative hot stick mounted tool in case of failure of the hinge clamp.

Another object of the invention is to provide an electrically isolated voltage sensor for a state estimator module of the above character.

Still another object of the invention is to provide an unsynchronized single channel radio transmission system for a plurality of modules of the above character.

Other objects of the invention will in part be obvious and will in part appear hereinafter. The invention accordingly comprises the functions and relationship thereof and the features of construction, organization and arrangement of parts, which will be exemplified in the system and apparatus hereinafter set forth. The scope of the invention is indicated in the claims.

BRIEF DESCRIPTION OF THE DRAWINGS

For a fuller understanding of the nature and objects of the invention reference should be had to the following detailed description taken in connection with the accompanying drawings, in which:

FIG. 38 is a diagram of the message transmitted by the donuts 20;

FIGS. 65, 66, 67, and 68 are diagrams of tables and buffers utilized in the program of FIG. 64.

The same reference characters refer to the same elements throughout the several views of the drawings.

BEST MODE FOR CARRYING OUT THE INVENTION

The State Estimator Module

General

Figure 1:
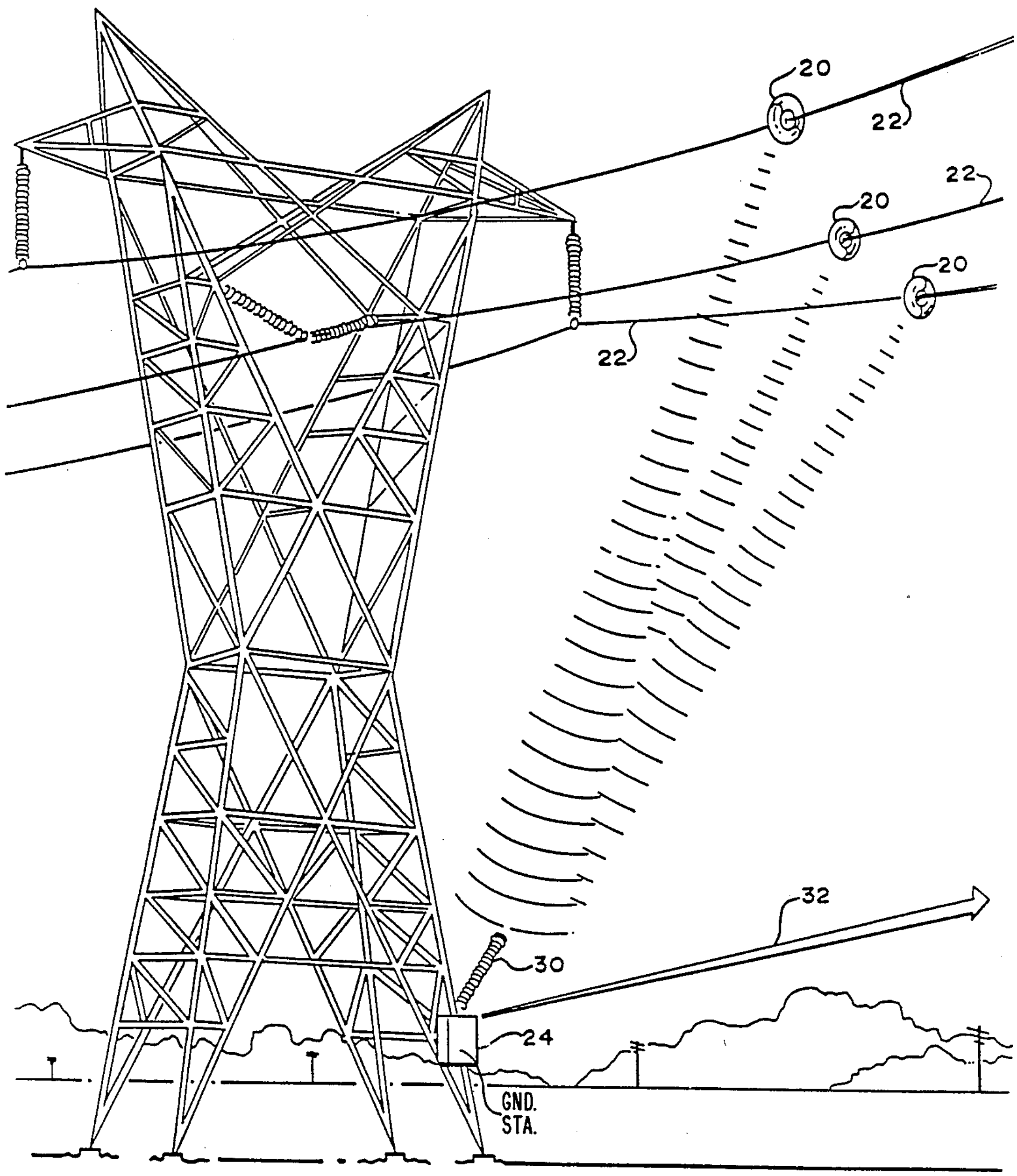
FIG. 1 is a perspective view of the state estimator module of the invention installed on an electrical transmission line.
Figure 2:
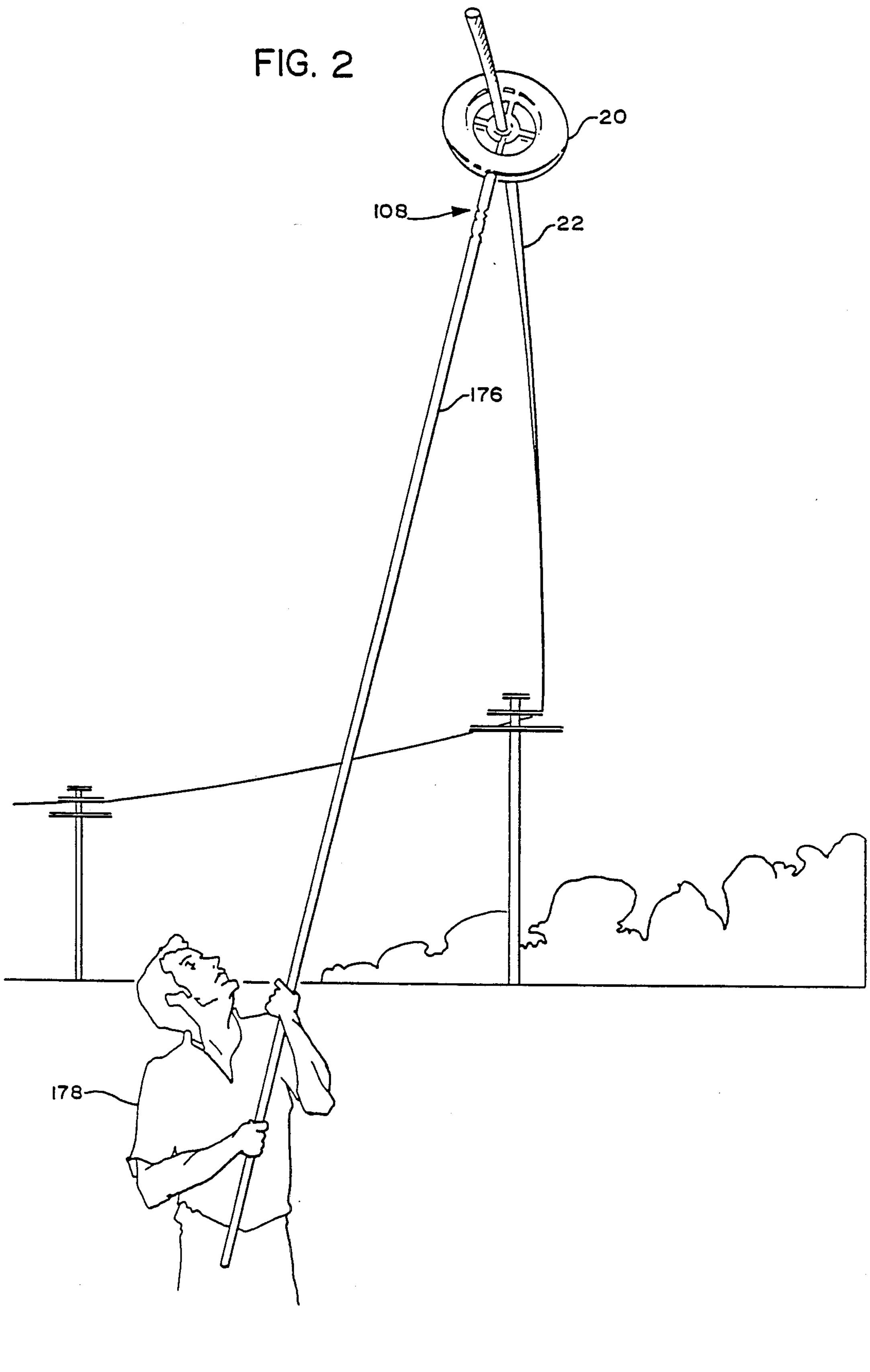
FIG. 2 is a perspective view showing how a state estimator module according to the invention may be hot stick mounted to a live conductor.

The state estimator modules 20 ("Donuts") clamp to a high-tension power conductor 22 and telemeter power parameters to a ground station 24 (FIG. 1). Each module obtains its operating power from the magnetic field generated by the current flowing in the high-tension conductor 22. Each module is relatively small and shaped like a donut, with a 12⅝" major diameter and a maximum thickness of 4¾". It weighs approximately 16 pounds and may be mounted in the field in a matter of minutes using a "hot stick" (FIG. 2).

Typically, three donuts 20 are used on a circuit; one for each phase. Each donut is equipped to measure line current, line to neutral voltage, frequency, phase angle, conductor temperature and ambient temperature. Digital data is transmitted by means of a 950 MHz FM radio link in a 5-10 millisecond burst. A microcomputer at the ground station 24 processes data from the 3 phase set and calculates any desired power parameter such as total circuit kilowatts, kilovars, and volt-amps. Individual conductor current and voltage is also available. This data may then be passed on to a central monitoring host computer (typically once a second) over a data link 32.

Figure 4:
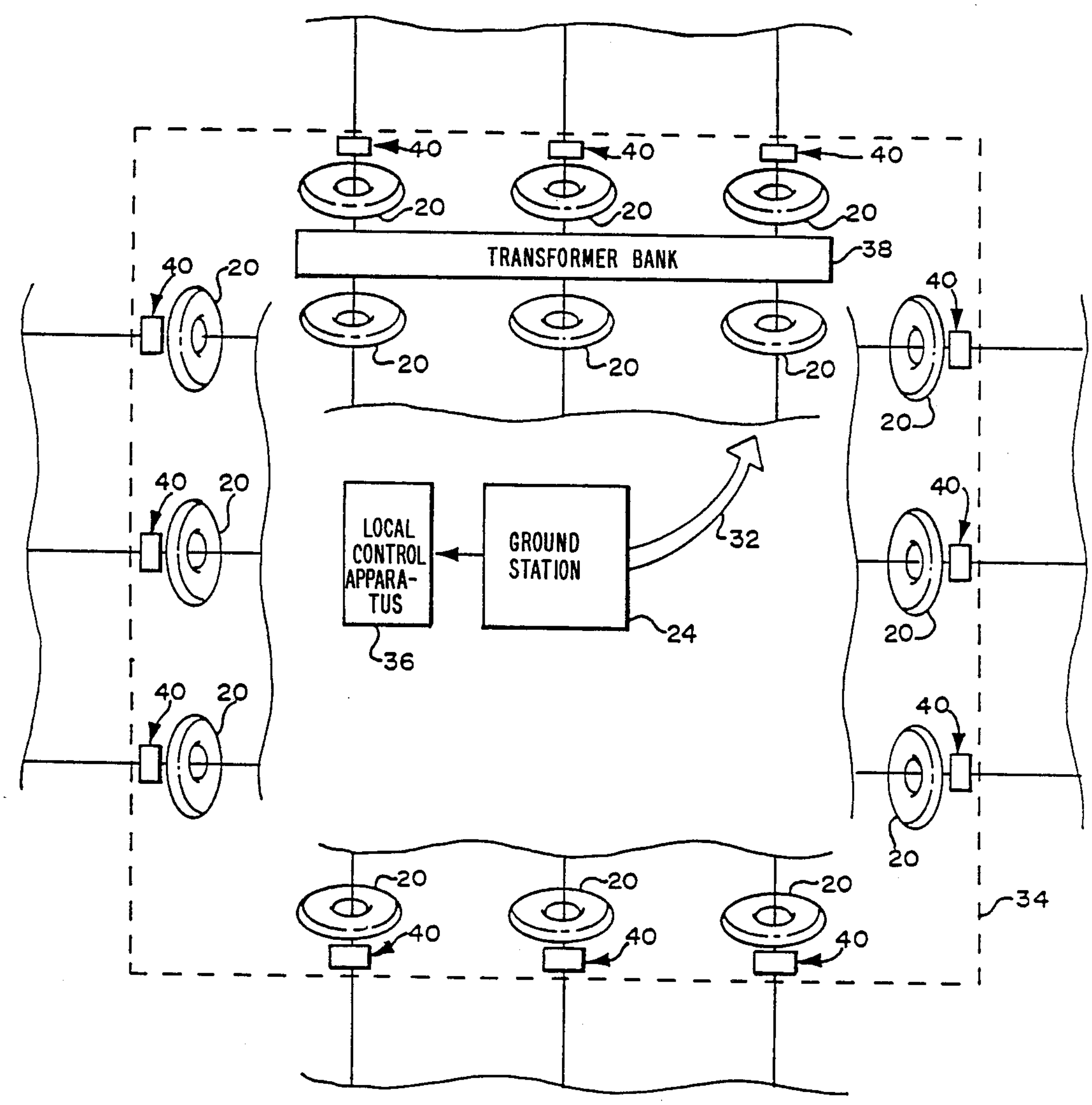
FIG. 4 is a diagrammatic view of a substation totally monitored by means of the system of the invention.

One ground station 24 may receive data from as many as 15 donuts 20, all on the same RF frequency (FIG. 4). Each donut transmits with a different interval between its successive transmission bursts, ranging from approximately 0.3 seconds to 0.7 seconds. Thus, there will be occasional collisions, but on the average, greater than 70% of all transmissions will get through.

Environmental operating conditions include an ambient air temperature range of −40° F. to +100° F.; driving rain, sleet, snow, and ice buildup; falling ice from conductor overhead; sun loading; and vibrations of conductors 22.

Current measurements over a range of 80-3000 amperes must be accurate to within 0.5%. Voltage measurements over a range of 2.4-345 KV (line-line) must be accurate to within 0.5%. Conductor diameters range from 0.5 to 2 inches.

Figure 13:
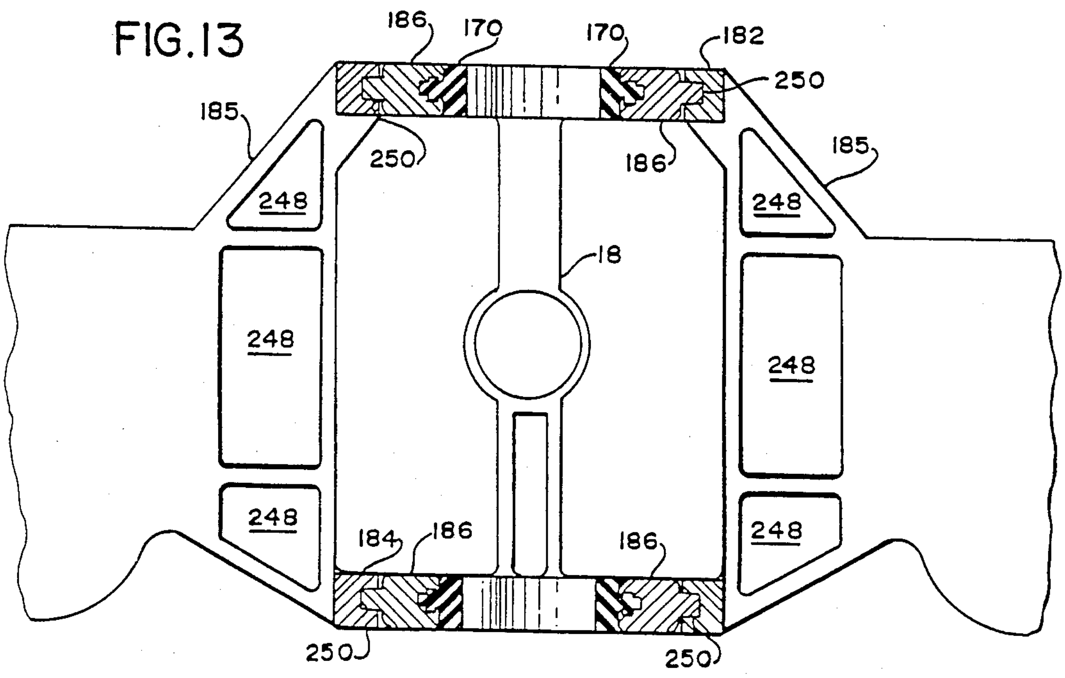
FIG. 13 is a cross sectional view taken along the line 13—13 of FIG. 12.

All exterior surfaces are rounded and free from sharp edges so as to prevent corona. The module weighs approximately 16 pounds. It is provided with clamping inserts for different conductor diameters which are easily removeable and replaceable. The conductor clamping does not damage the conductor, even after prolonged conductor vibration due to the use of neoprene conductor facings 170 in the inserts 186 (FIG. 13).

The special hot stick tool 108 is inserted into the donut 20. Turning of the hot stick causes the donut to split so that it may be placed over a conductor. Turning the hot stick in the opposite direction causes the donut to close over a conductor and clamp onto it tightly. The tool 108 may then be removed by simply pulling it away. Reinsertion and turning will open the donut and allow it to be removed from the line.

Conductor temperature probes 70 and 72 (FIG. 6) are spring loaded against the conductor when the donut is installed. The contacting tip 174 (FIG. 10) is beryllia and inhibits corrosion and yet conducts heat efficiently to the temperature transducer within. It is also a non-conductor of electricity so as not to create a low resistance path from the conductor to the electronics.

The hub and spoke area in the center of the donut 20 and the temperature probe placement are designed with as much free space as possible so as not to affect the temperature of the conductor.

Figure 10:
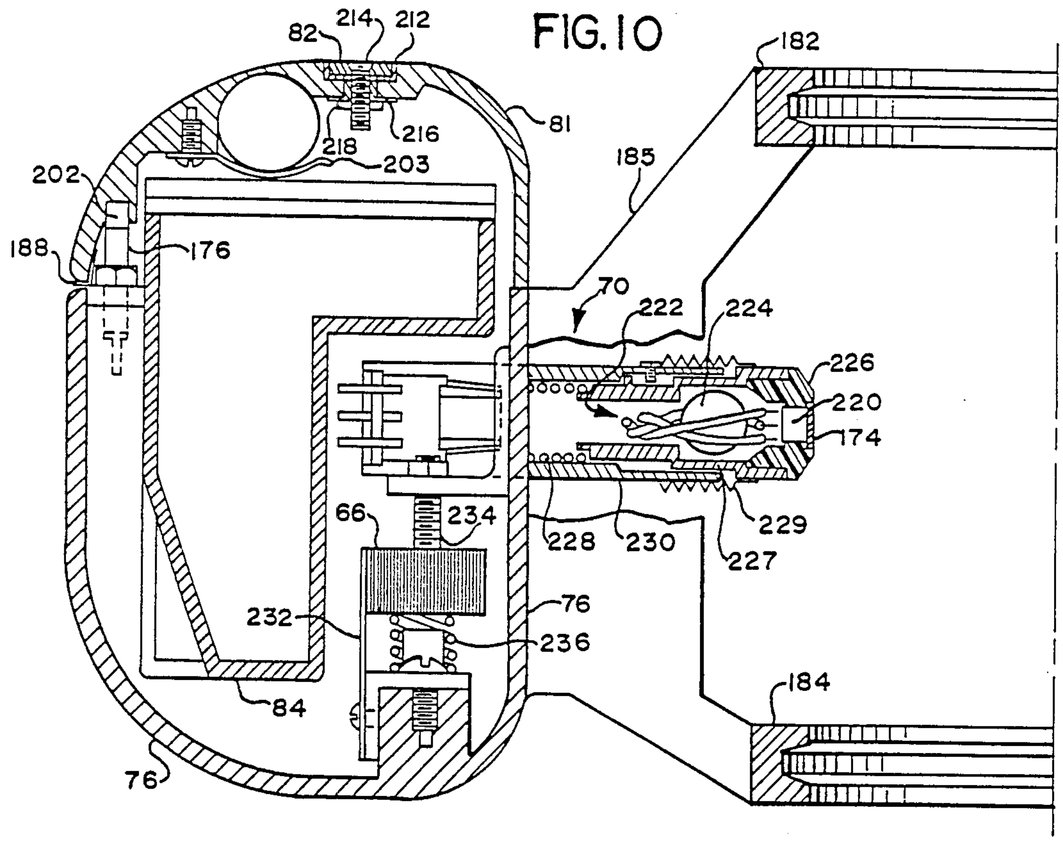
FIG. 10 is an enlarged cross sectional view taken along the line 10—10 of FIG. 6 with the cover in place.

All electronics within the donut are sealed in water-tight compartments 84 (FIG. 10).

The radio frequency transmitter power of the donut 20 is typically 100 milliwatts. However, it may be as high as 4 watts. The donut 20 is protected against lightning surges by MOV devices and proper grounding and shielding practice. All analog and digital circuitry is CMOS to minimize power consumption.

No potentiometers or other variable devices are used for calibration in donut 20. All calibration is done by the ground station 24 by scaling factors recorded in computer memory.

Each donut is jumper programmable for current ranges of 80-3000 amperes or 80-1500 amperes.

Figure 7:
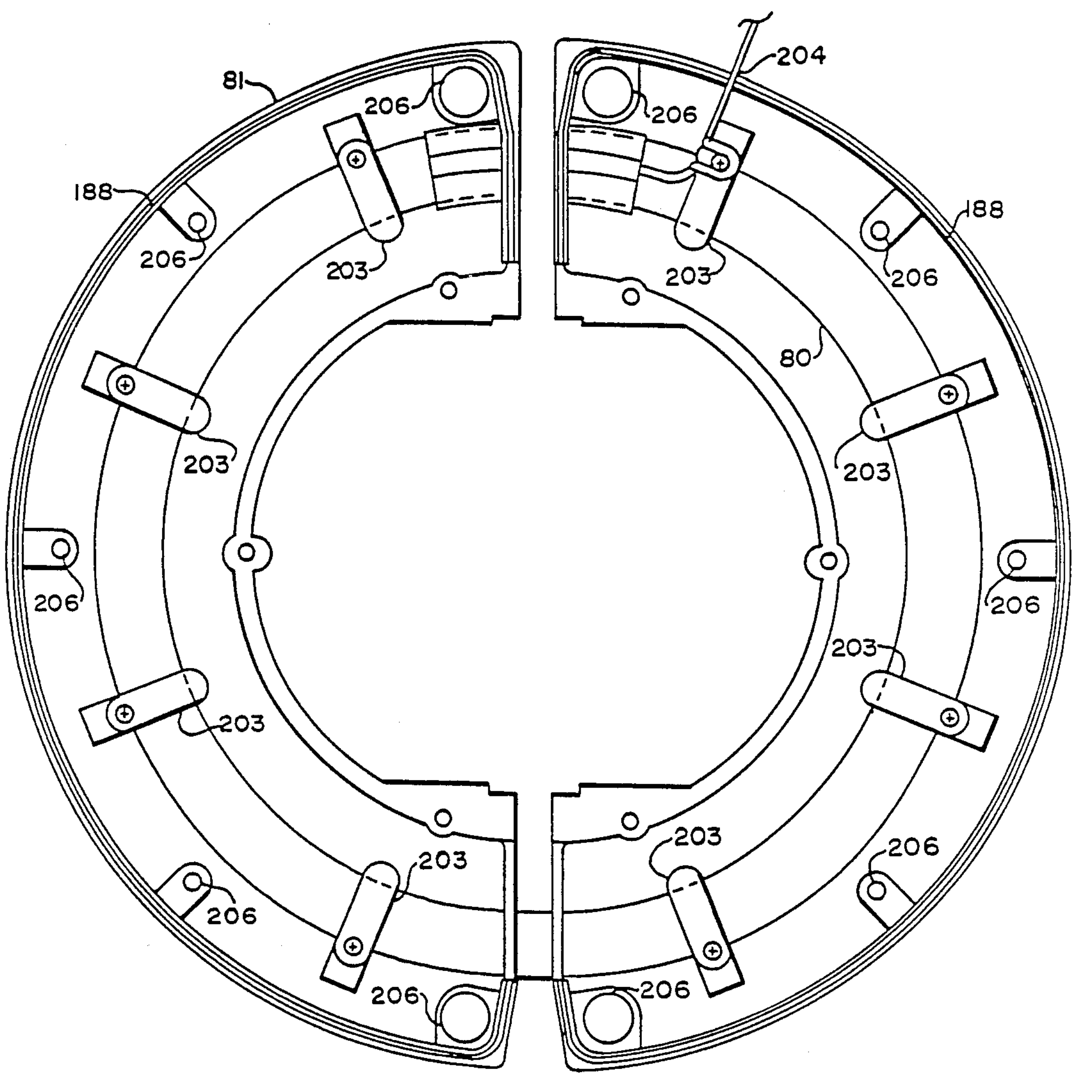
FIG. 7 is a bottom view of the covers of a state estimator module according to the invention.

Current is measured by using a Rogowski coil 80 (FIG. 7). Voltage is measured by two electrically insulated strips of metal 82 (FIG. 8) imbedded flush on the exterior of one face of the donut. These strips act as one plate of a capacitor at the potential of the conductor. The other plate is the rest of the universe and is essentially at calibrated ground (neutral) potential with respect to the donut. The amount of current collected by the donut plate from ground is thus proportional to the potential of the donut and the conductor on which it is mounted.

Power to operate donut electronics is derived from a winding 68 on a laminated iron core 64-66 which surrounds the line conductor. This core is split to accommodate the opening of the donut when it clamps around the conductor. The top and bottom portions of the aluminum outer casing of the donut are partially insulated from each other so as not to form a short circuited turn. The insulation is shunted at high frequency by capacitors 176 (FIG. 10) to insure that the top and bottom portions 76 and 81 are at the same radio frequency potential.

The data is transmitted in Manchester code. Each message comprises the latest measured Fourier components of voltage and current and another measured condition called the auxiliary parameter, as well as an auxiliary parameter number to identify each of the five possible auxiliary parameters. Thus, each message format is as follows:

| | |
|---|---|
| Donut Identification Number | 4 bits |
| Auxiliary Parameter Number | 4 bits |
| Voltage Sine Component (Fourier Fundamental) | 12 bits |
| Voltage Cosine Component (Fourier Fundamental) | 12 bits |
| Current Sine Component (Fourier Fundamental) | 12 bits |
| Current Cosine Component (Fourier Fundamental) | 12 bits |
| Auxiliary Parameter | 12 bits |
| Cyclic Redundancy Check | 12 bits |

The auxiliary parameter rotates among 5 items on each successive transmission as follows:

| Auxiliary Parameter No. | Parameter |
|---|---|
| 0 | Conductor Temperature |
| 1 | Ambient Exterior Temperature |
| 2 | Check Ground (0 volts nominal) |
| 3 | Check Voltage (1.25 volts nominal) |
| 4 | Interior Temperature |

More specifically, and referring to FIG. 2, the hot stick tool 108 may be mounted on a conventional hot stick 176 so that the module 20 may be mounted on an energized conductor 22 by a man 178.

Figure 3:
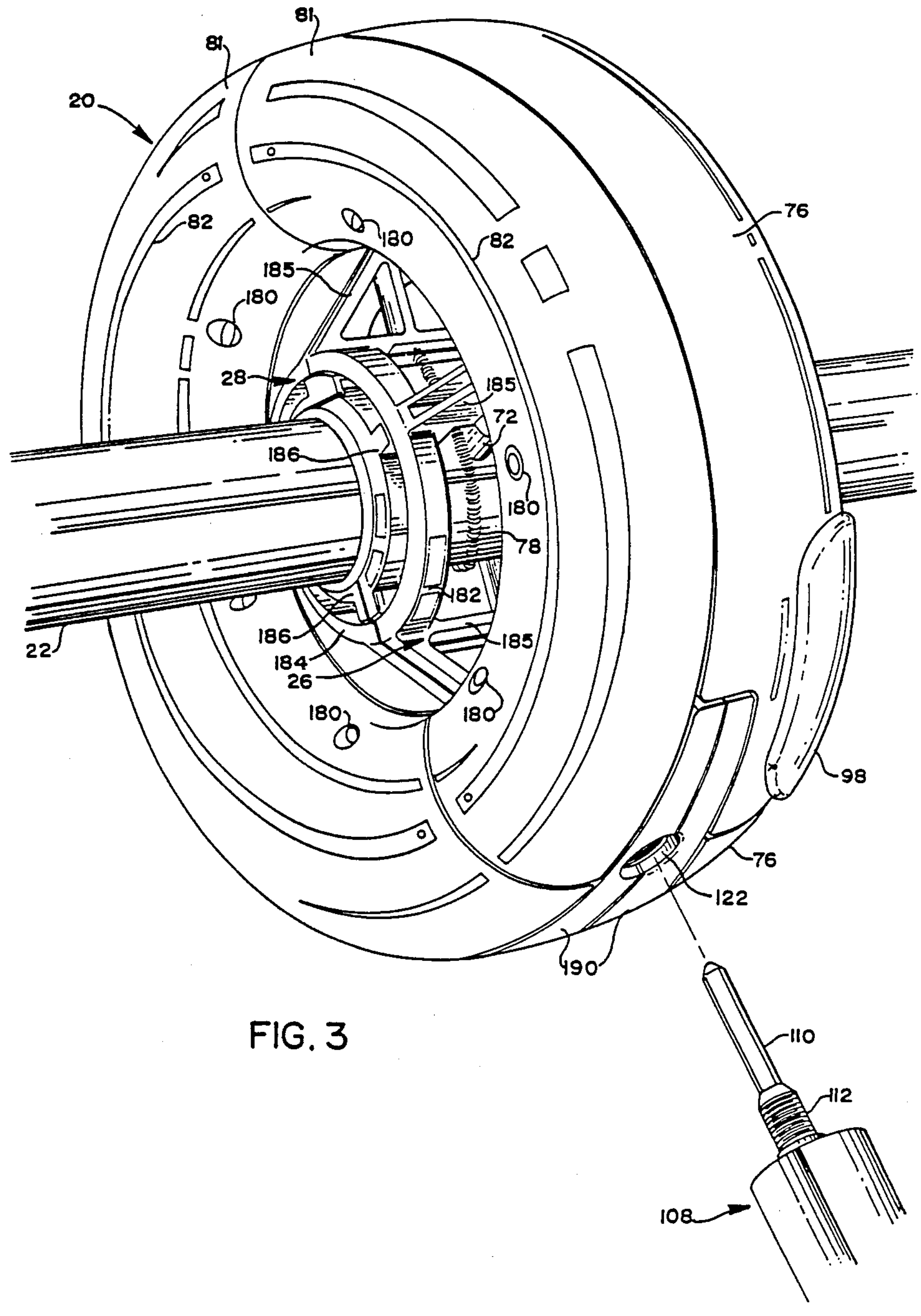
FIG. 3 is a perspective view of a state estimator module according to the invention mounted to a conductor.

In FIG. 3 it can be seen how the hot stick tool 108 provided with an Allen wrench portion 110 and a threaded portion 112 fits within a hole 122 provided in the donut 20 mounted on conductor 22. The donut comprises two bottom portions 76 and two covers, or top portions 81, held together by six bolts 180. Each bottom portion 76 is provided with a top hub 182 and a bottom hub 184 (see also FIG. 13), supported on three relatively open spokes 185.

Conductor temperature probes 70 and 72 (see also FIG. 6) are aligned within opposed spokes 185.

Identical clamping inserts 186 are held within opposed hubs 182 and 184 (see FIG. 13) and clamp conductor 22 with hard rubber facings 170 provided therein. The tops 81 (FIG. 3) are each provided with an arcuate flat flush conductor 82 insulated from the housing for measuring voltage and one of the bottom portions 76 is provided with a patch antenna 98 for transmitting data to the ground station.

Although the top portions 81 are each provided with a non-conductive rubber seal 188 (FIG. 7) and the area around the hinge is closed by cover plates 190, water escape vents are provided in and around the access opening 122, which due to the hot stick mounting is always at the lower portion of the donut 20 when installed on a conductor 22.

Figure 6:
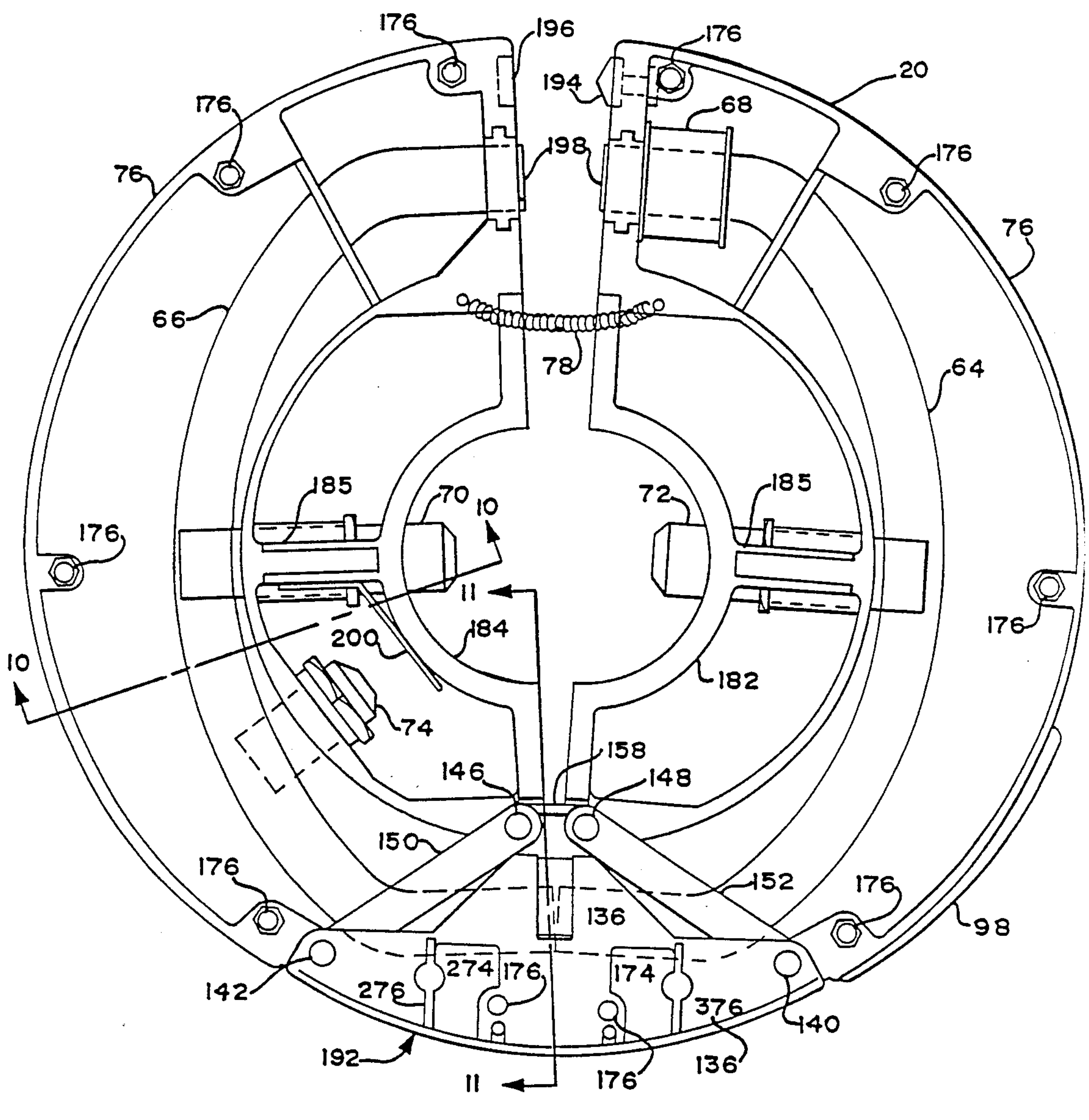
FIG. 6 is a top view of a state estimator according to the invention with the covers thereof removed.

Now referring to FIG. 6, a hinge mechanism is provided, generally indicated at 192. It comprises hinge pins 140 and 142, mounted in a top plate 136 and a bottom plate 138 (see FIG. 23). When opening or closing, the bottom portions 76 along with their covers 81 rotate about pins 140 and 142. The two halves of the donut 76—76 are drawn together to clamp the conductor by bringing fixed pins 146 and 148 together by means of cable 158. They are separated by pushing a wedge against wedge arms 150 and 152 to separate pins 146 and 148 which are affixed to the bottom portion 76—76.

To make certain that the bottom portions 76—76 of the donut 20 are at the potential of the conductor, a spring 78 is provided which continuously contacts the conductor during use and contacts it before it comes in contact with the temperature probes 70 and 72, protecting them against arcing.

To insure that the unit comes together precisely, a locating pin 194 and locating opening 196 are provided. The multi-layer power transformer cores 64 and 66 come together with their faces in abutting relationship when the unit is closed. They are spring loaded against each other and mounted for slight relative rotations so that the flat faces, such as the upper faces 198 shown in FIG. 6 will fit together with a minimum air gap when the unit is closed. The temperature probes 70 and 72 are spring loaded so that they press against the conductor when the unit is closed. The ambient probe 74 is provided with a shield 200 covering the hub area so that it looks at the temperature of the shield 200 rather than the temperature of the conductor.

The temperature probes 70 and 72 are located in alignment with opposed spokes 185 so as to provide the least amount of wind resistance so that the conductor at the probes 70 and 72 will be cooled by the ambient air in substantially the same way as the conductor a distance away from the module 20.

The ten radio frequency shunting capacitors 176 can also be seen in FIG. 6, as well as the patch antenna 98.

Now referring to FIG. 7, a Rogowski coil 80 is affixed to the covers 81 by eight brackets 202 and is connected by lead 203 to the electronics in the bottom portions 76 (FIG. 10). The non-conductive rubber seal 188 may be seen in FIG. 7, as well as recesses 206 for stainless steel fiber contacting pads 202 which contact the RF shunting capacitors 176 (FIG. 10).

Figure 9:
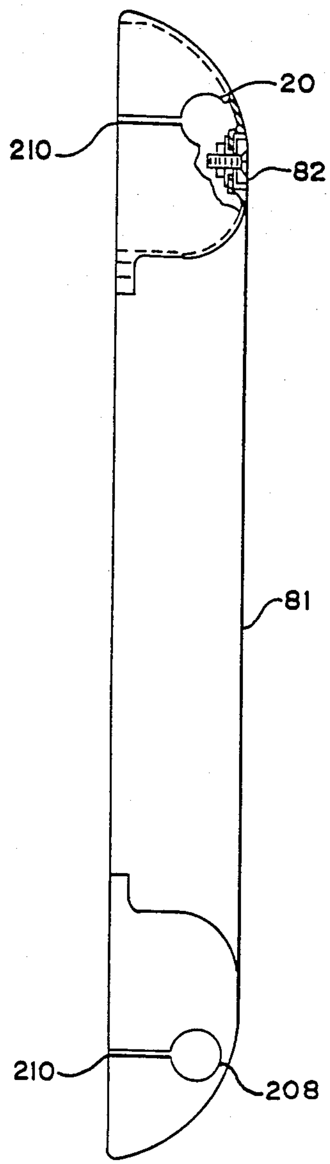
FIG. 9 is a side view of one of the covers, partly in cross section.
Figure 8:
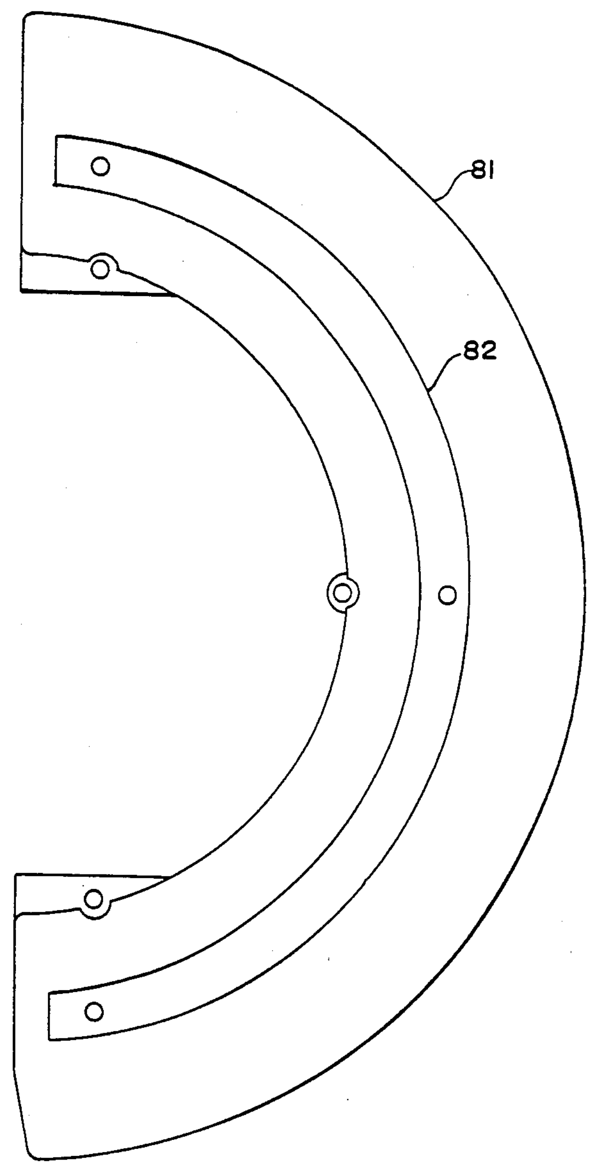
FIG. 8 is a top view of one of the covers.

Now referring to FIGS. 8 and 9, the capacitor plate 82 can be seen mounted flush with the surface of one of the covers 81. It may also be seen in FIG. 9 how the openings 206–208 for the Rogowski coil are provided with slots 210 to prevent the formation of a short circuiting path around it.

Now referring to FIG. 10, the arcuate capacitor plates 82 are insulated from the case 81 by teflon or other non-conducting material 212. The surface gap between the capacitor plate 82 and the surface of the case 81 is 0.005 inches. The plates 82 are mounted to the tops 81 by means of screws 214 passing through insulated bushings 216 and nuts 218, or by other comparable insulated mounting means. Connection between the capacitor plates 82 and the electronics may be made by means of the screws 214. A stainless steel wool pad 202 may be seen in FIG. 10 connecting to the shunt capacitor 176 which may be in the form of a feed through capacitor. The insulating seal 188 is shown next to the shunt capacitor 176.

The temperature probe 70 comprises an Analog Device AD-590 sensor 220 mounted against a beryllia insert 174 which contacts the conductor 22. The three conductors generally indicated at 222 connect the electronics to the sensor 220 through an MOV 224.

The sensor 220 and beryllia insert 174 are mounted in a probe head 226 which in turn is mounted to a generally cylindrical carriage 227 pushed out by spring 228 to force the beryllia insert 174 against the conductor. A rubber boot 229 protects the interior of the probe 70. The probe head 226 is formed of an electrical and heat insulating material. The probe 72 is mounted in a cylindrical post 230 which preferably is adjustable in and out of the lower casing 76 for adjustment to engage conductors of differing diameters. The other conductor temperature probe 72 is identical.

An electronics box 84 is mounted within each of the two bottom portions 76 and top portion 81. The boxes 84 are hermetically sealed. The power pickup transformer core 66 and its mating transformer core 64 (FIG. 6) in the other half of the module is pressed by leaf spring 232 against the mating core 64 and is pushed against post 234 by means of spring 236 so that the flat faces 198 of the two cores 64 and 66, shown in FIG. 6, will come together in a flat face to face alignment when the module is closed.

Figure 11:
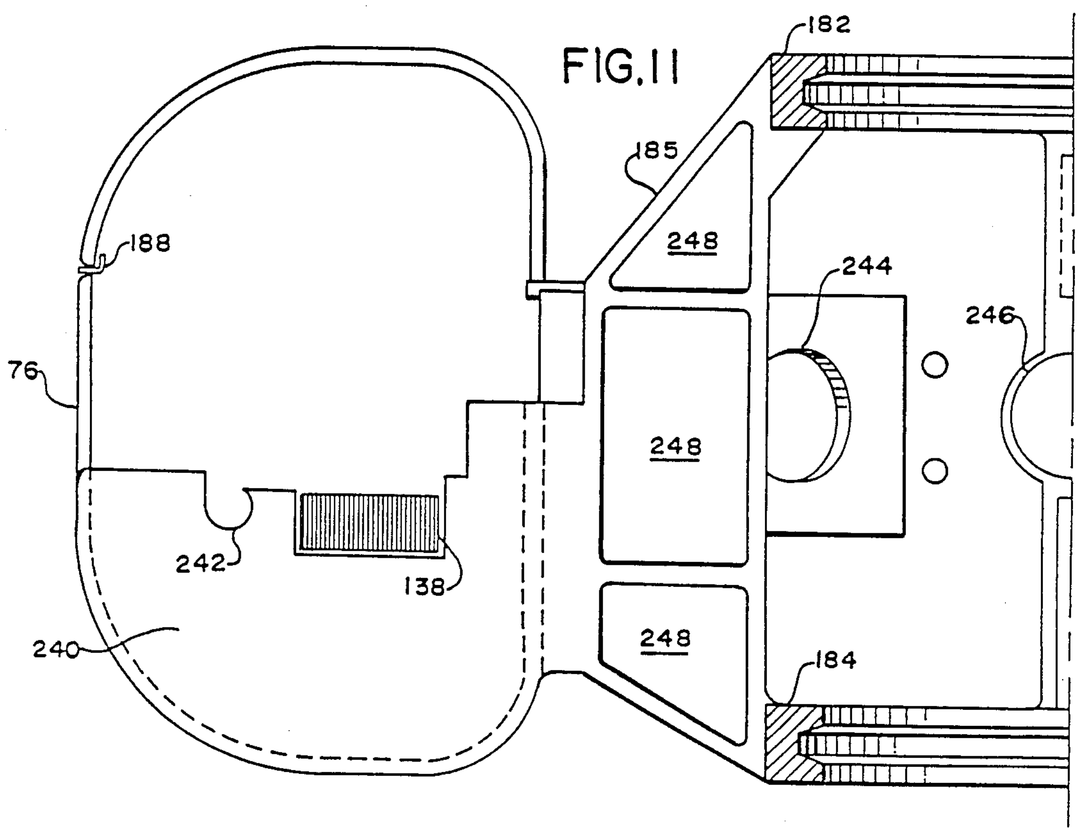
FIG. 11 is an enlarged cross sectional view taken along the line 11—11 of FIG. 6 with the cover in place.

Referring now to FIG. 11, it can be seen how the end face 238 of the core 66 passes through the end plate 240 of lower portion 76. Opening 242 is provided for electrical wiring connecting the sealed circuit containers 84 in both halves of the device. It should be noted how opening 242 is open, again to prevent encircling the wiring.

The opening 244 for the ambient sensor 74 and the opening 246 for the conductor sensor 70 may be seen in FIG. 11. The hubs 182 and 184 and spokes 185 may be seen in FIGS. 10 and 11 although the openings 248 in the spoke 185 of FIG. 10 are not shown in order that the temperature probe 70 may be shown in detail.

Figure 12:
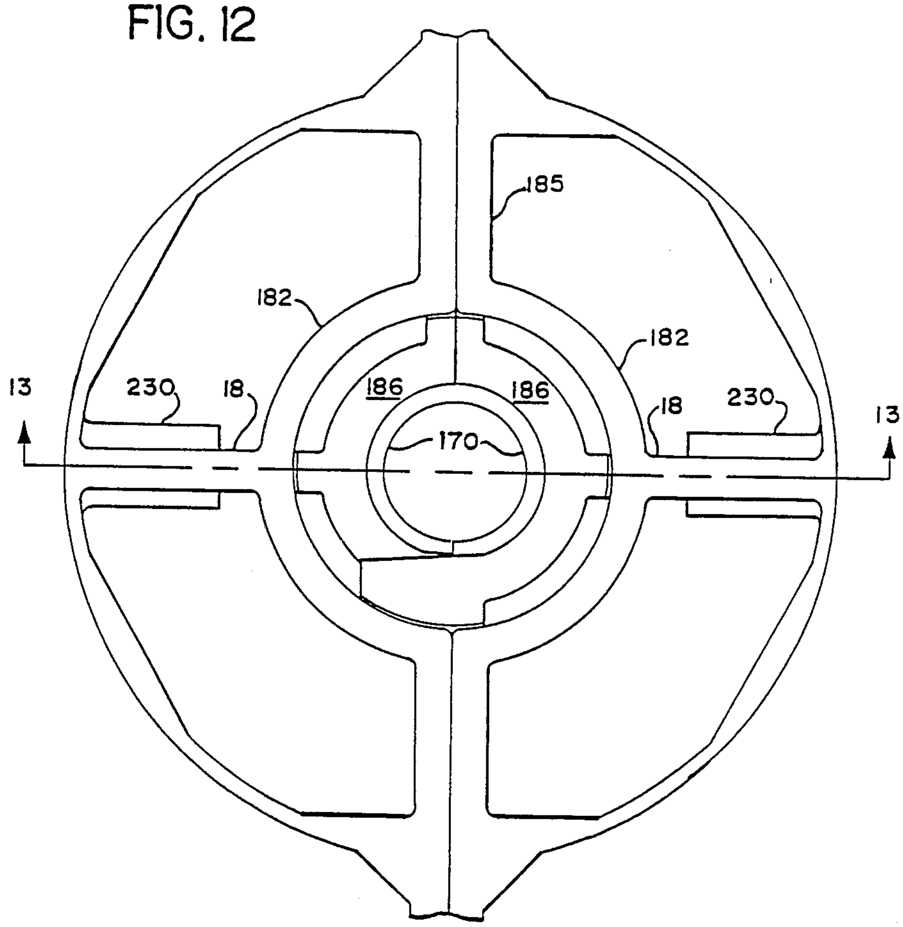
FIG. 12 is an enlarged fragmentary view of the hub portion of the state estimator module of FIG. 6.

Now referring to FIGS. 12 and 13, it can be seen how the clamping inserts 186 fit within the hubs 182 and 184 and how the facings 170 fit within the inserts 186. The inserts 186 are made in sets having differing inner diameters to accommodate conductors 22 of differing diameters.

Figure 15:
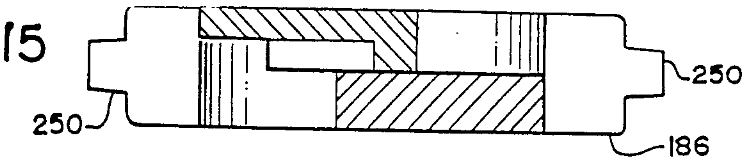
FIG. 15 is a cross section taken along the line 15—15 of FIG. 14.
Figure 14:
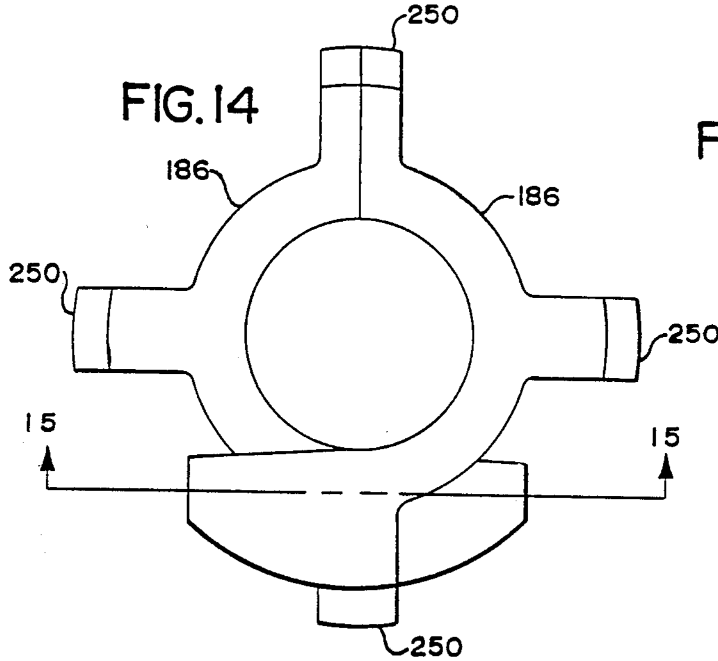
FIG. 14 is an enlarged view of the conductor clamping jaws shown in FIG. 12.
Figure 16:
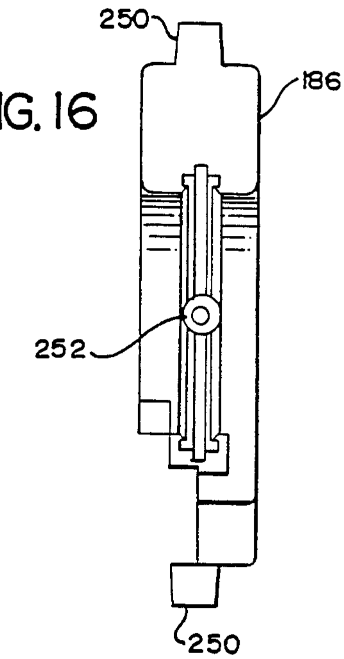
FIG. 16 is a side view showing the inside of one of the jaws shown in FIG. 14.
Figure 17:
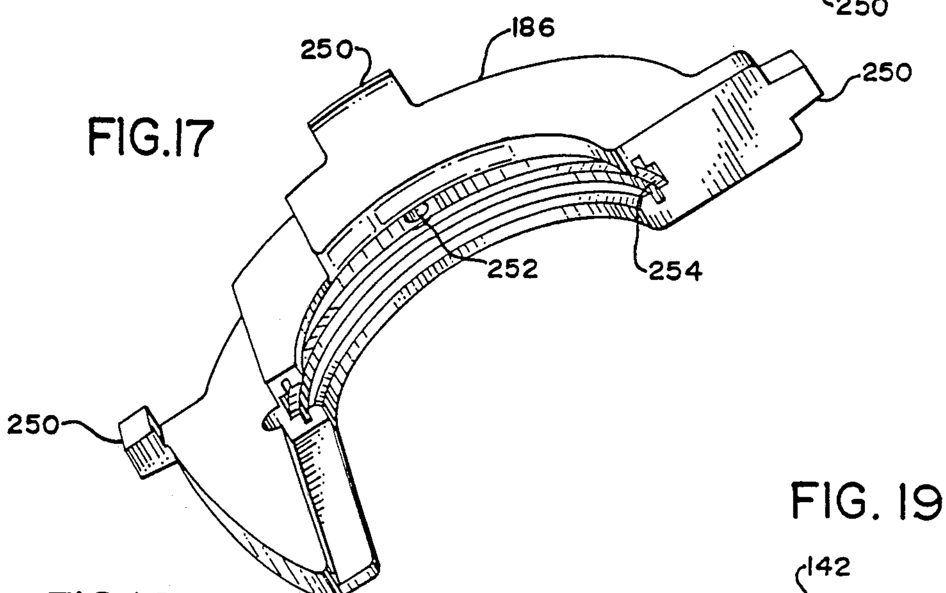
FIG. 17 is a enlarged perspective view of one of the jaws of FIG. 14.

As shown in FIGS. 15 through 17, the clamping inserts 186 are provided with alignment tabs 250 which fit into the hubs 182 and 184. Each of the inserts 186 is identical, one being upside down with respect to the other when installed as shown in FIG. 14. Each is provided with a screw hole 252 for screw mounting them within hubs 182 and 184 and are provided with a raceway 254 for insertion of and to hold the hard conducting neoprene rubber facings 170, which may be of material, having a hardness of 70 durometer on the Shore A scale. The facings 170 are preferably filled with a conducting powder, such as graphite, to establish electrical contact with the conductor 22.

Figure 18:
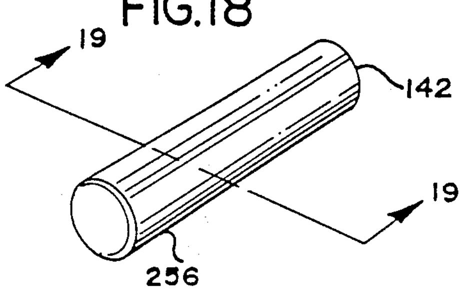
FIG. 18 is a view of one of the pins of the hinge clamp mechanism of the invention.
Figure 19:
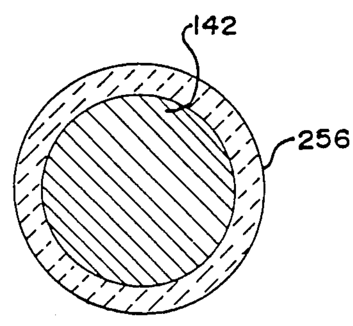
FIG. 19 is a cross sectional view thereof taken along the line 19—19 of FIG. 18.

One of the pins 142 of the hinge is shown in FIG. 18. All of the pins are provided with a non-conducting ceramic coating 256 which may be plasma sprayed thereon, so that the pins do not provide, together with the plates 136 and 138 of the hinge (FIG. 23), a shorted turn.

Figure 20:
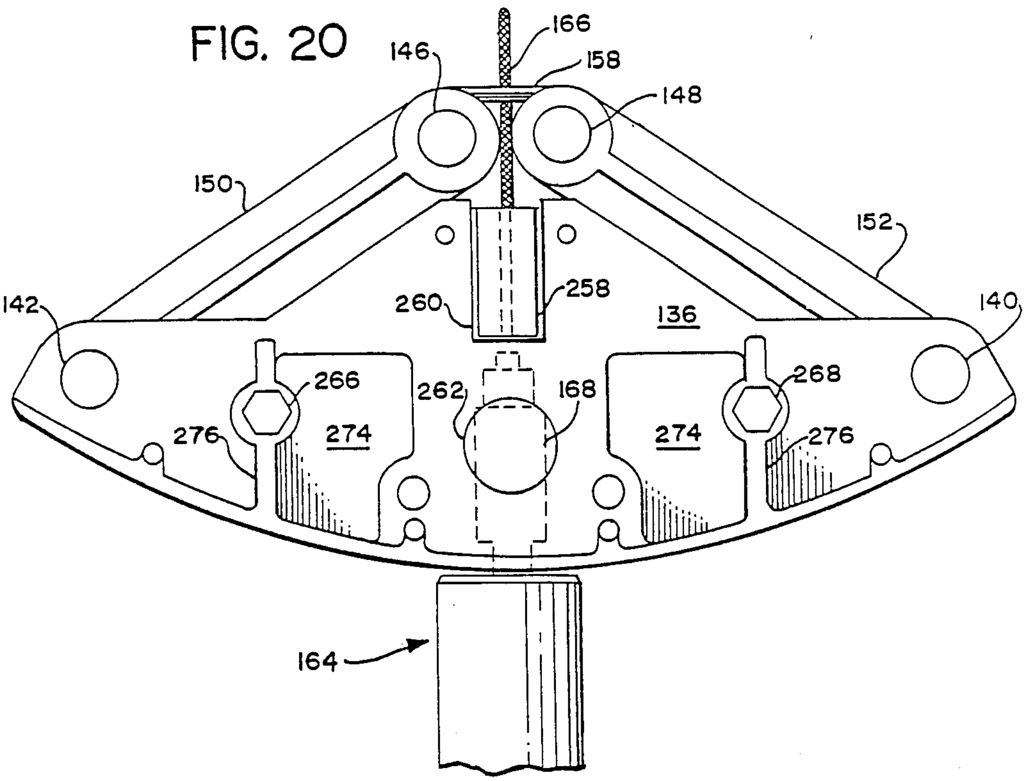
FIG. 20 is a fragmented partially diagrammatic top view of the hinge clamp of the invention and the tool utilized to open it if it jams.
Figure 24:
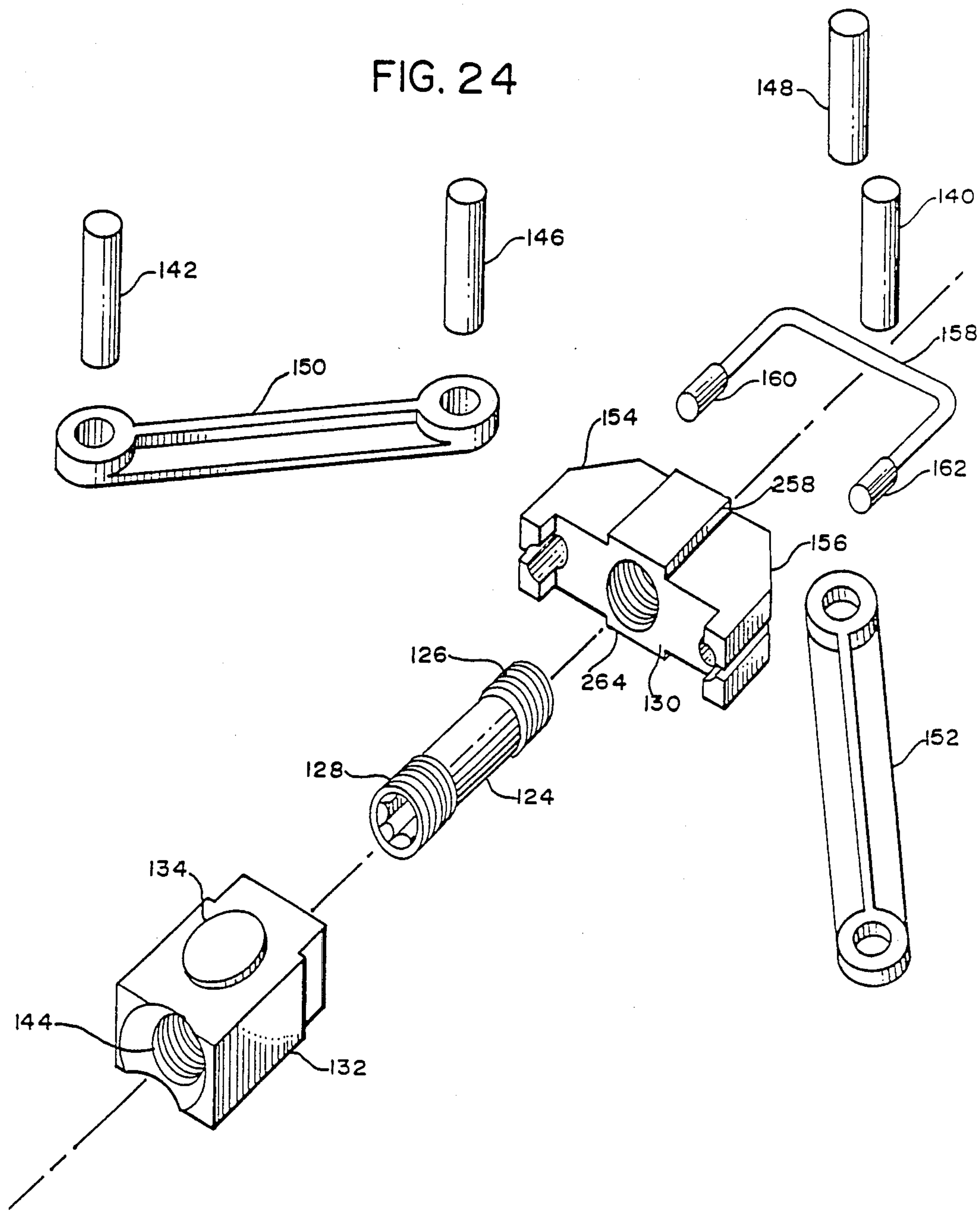
FIG. 24 is an exploded cross sectional view of the working mechanism of the hinge clamp of the invention.

Now referring to FIG. 20, an emergency hot stick mountable tool 164 can be used to open the donut 20 if for any reason the hinge clamp jams. This tool comprises an elongated file 166 used to cut the cable 158. After the cable 158 has been cut, a threaded portion 168 of the emergency tool may be threaded into the thread portion 144 of nut 132 (see FIG. 24) to remove the opened donut 20.

Also, in FIG. 20, it can be seen how the cable clamp 130 is provided with a raised key portion 258 which guides the cable clamp's motion in a guideway opening 260 in the top plate 136. Also, the circular opening 262 in the top plate 136 may be seen, in which the boss 134 of nut 132 fits to keep it from moving. A similar boss on the bottom of the nut 132 fits into a circular opening in bottom plate 138, as does a similar key 264 on the bottom of cable clamp 130 fit into a guiding opening in bottom plate 138. The plates 136 and 138 are secured together by bolts 266 and 268 and are held apart by spacers 270 and 272 (FIGS. 21 and 23) about the bolts 266 and 268. Cover plate 136 is machined with openings 274 and ribs 276 to make it as strong and light as possible.

Figure 21:
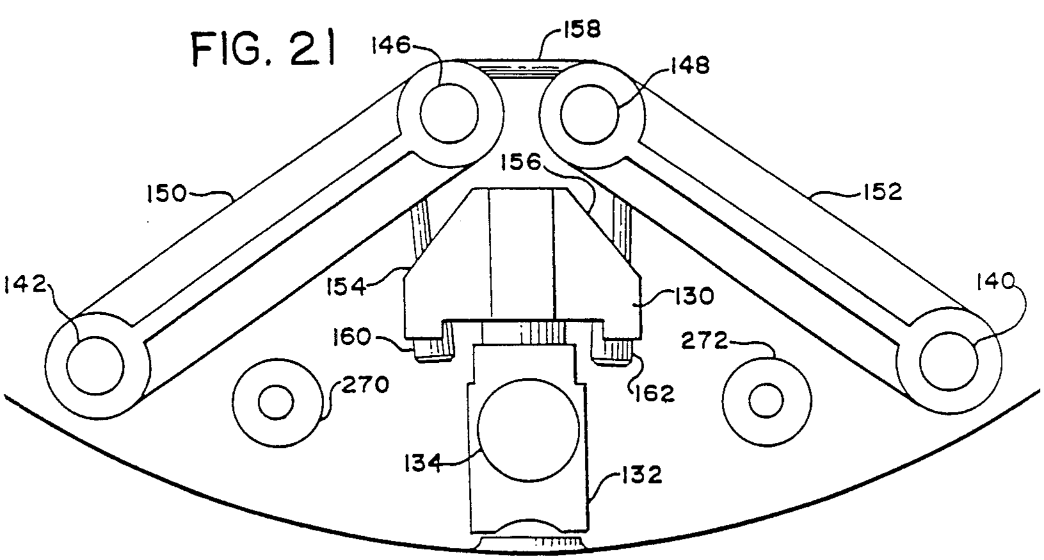
FIG. 21 is a top view similar to FIG. 20 showing the hinge clamp mechanism of the invention when the state estimator module of the invention is clamped about a conductor.

FIG. 21 shows the hinge clamp mechanism with the top plate 136 removed and the donut 20 closed, the cable 158 pulling pins 146 and 148 tightly together.

Figure 22:
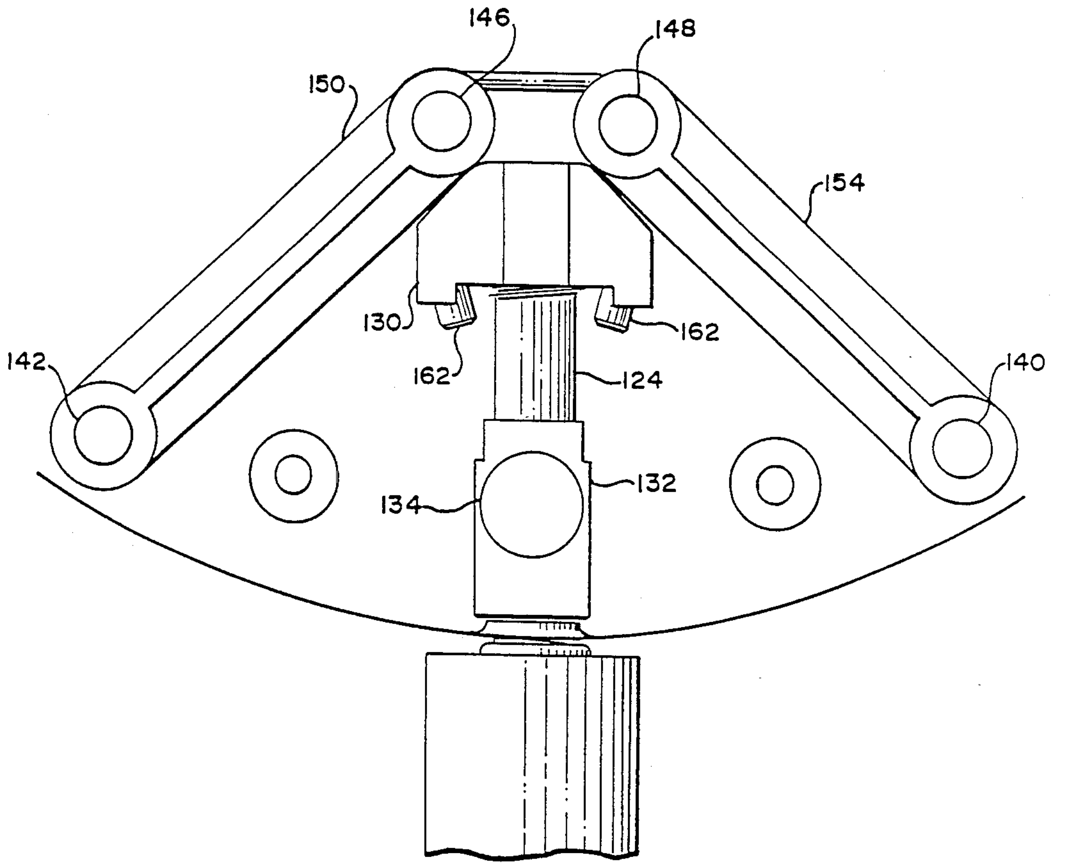
FIG. 22 is a view similar to FIG. 21 showing the hinge clamp mechanism when the state estimator module of the invention is opened for engagement or removal from a conductor.

In FIG. 22 the hinge clamp mechanism is shown with top plate 136 removed and the cable clamp 130 spread apart from the nut 132 by the barrel 124. The wedges 154 and 156 have pushed ramp arms 150 and 154 to spread apart fixed pins 146 and 148, to open the donut.

Figure 23:
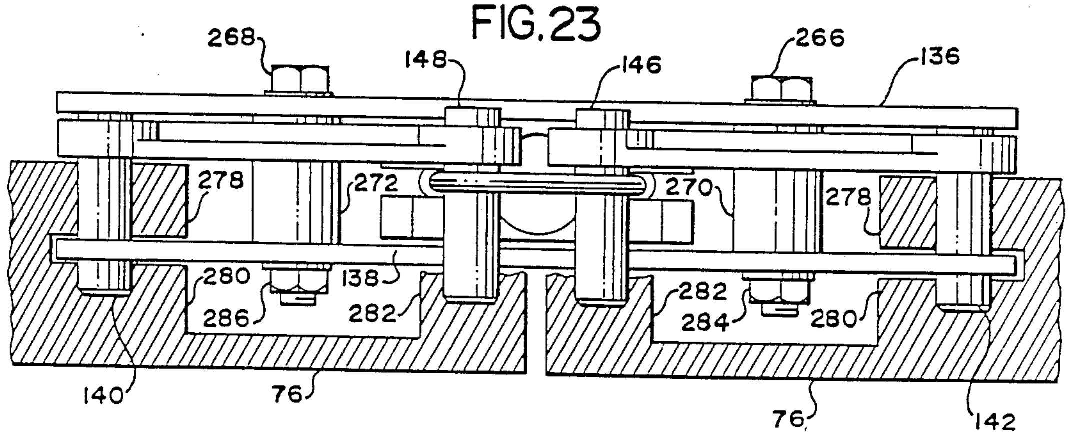
FIG. 23 is a fragmentary side view, partially in cross section taken from the top of FIG. 22.

In FIG. 23 it can be seen how hinge pins 140 and 142 fit into receiving portions 278 and 280 of each bottom portion 76 of the donut 20. Similarly, fixed pins 146 and 148 fit into portions 282 which are shown partly cut away in FIG. 23. Portions 282 are located closer to the central axis of the donut 20 than hinge pins 142.

Also seen in FIG. 23 are the nuts 284 and 286 on the bolts 266 and 268.

Figure 25:
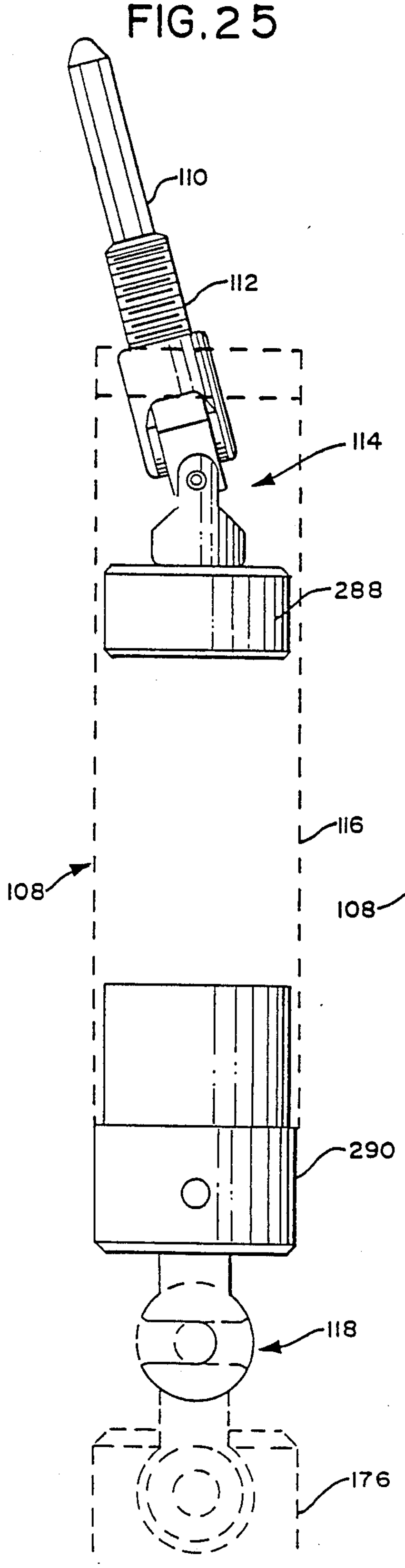
FIG. 25 is a diagrammatic front view of the hot stick hinge clamp operating tool of the invention.
Figure 26:
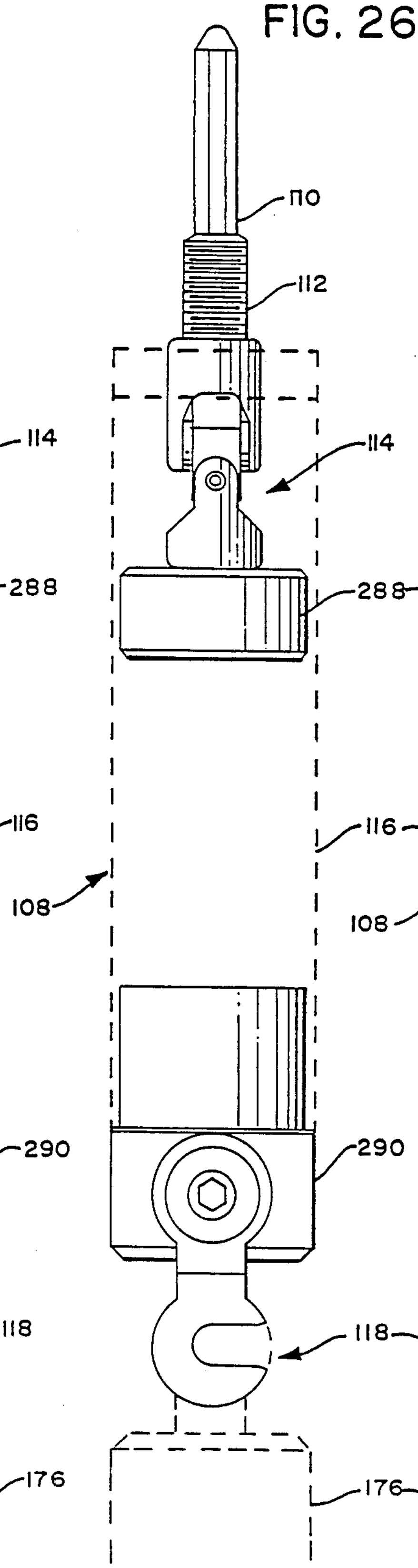
FIG. 26 is a back view thereof.
Figure 27:
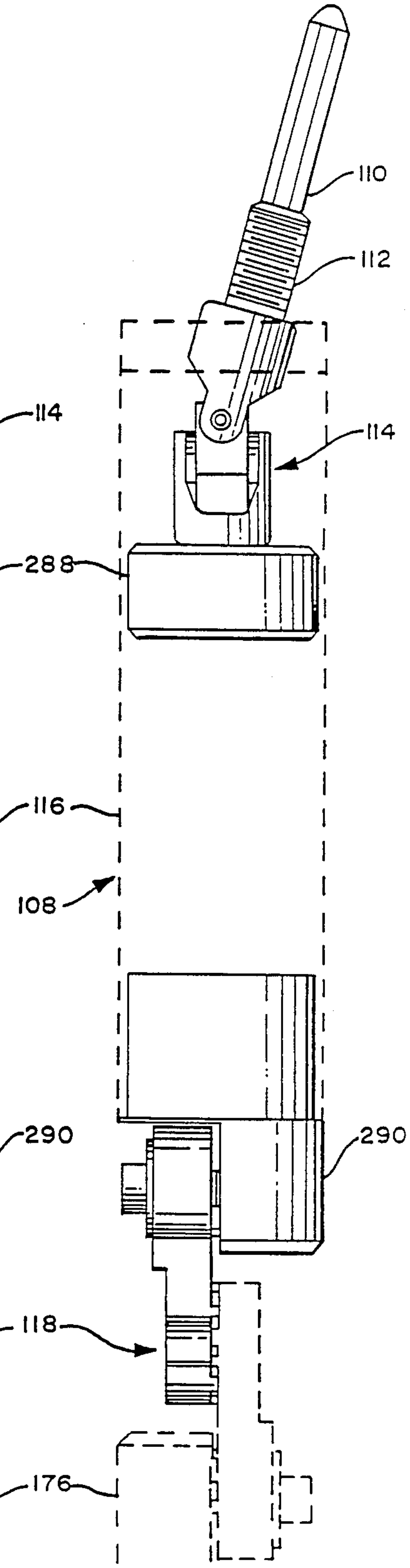
FIG. 27 is a side view thereof.

As previously described the hot stick tool 108 (FIGS. 25, 26 and 27) for mounting to a conventional hot stick 176 comprises a conventional hot stick mounting coupling 118, a barrel portion 116, a universal joint 114 which accommodates misalignment of the line of the stick 120 and the receiving opening 122 (see FIG. 3) in the donut 20. Also seen in FIGS. 25, 26, and 27 are the donut engaging Allen wrench portion 110 and threaded portion 112 of the hot stick tool 108, and the sleeve 116 which holds the base 288 of the universal 114 rigidly to the mounting 290 for the hot stick tool mounted portion of the coupling 118.

State Estimator Module Electronics

Figure 28:
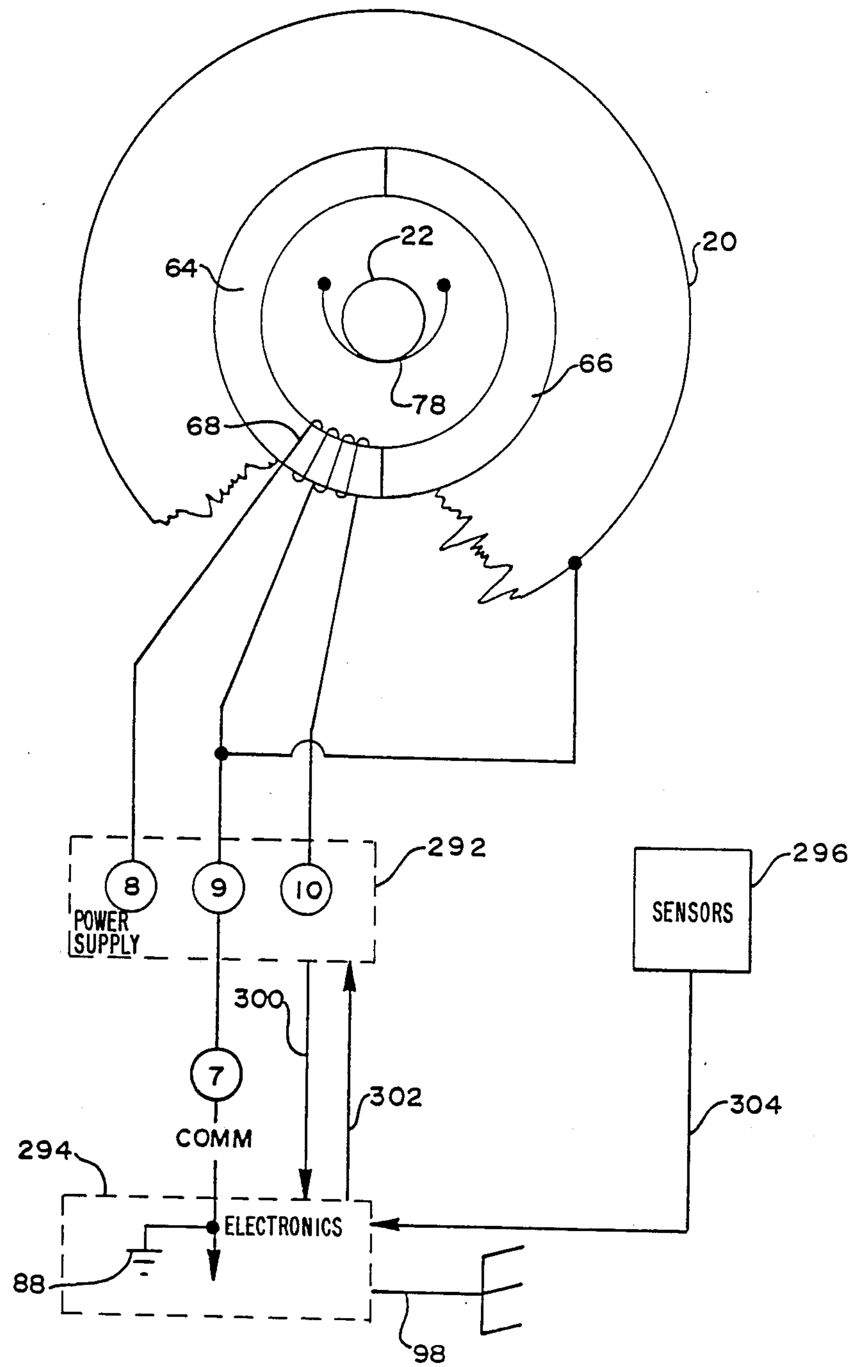
FIG. 28 is a schematic block diagram of the electronics of the state estimator of the invention.

The state estimator module electronics are shown in their overall configuration in FIG. 28. They comprise a power supply 292, digitizing and transmitting electronics 294, sensors indicated by the box 296, and antenna 98.

Figure 29:
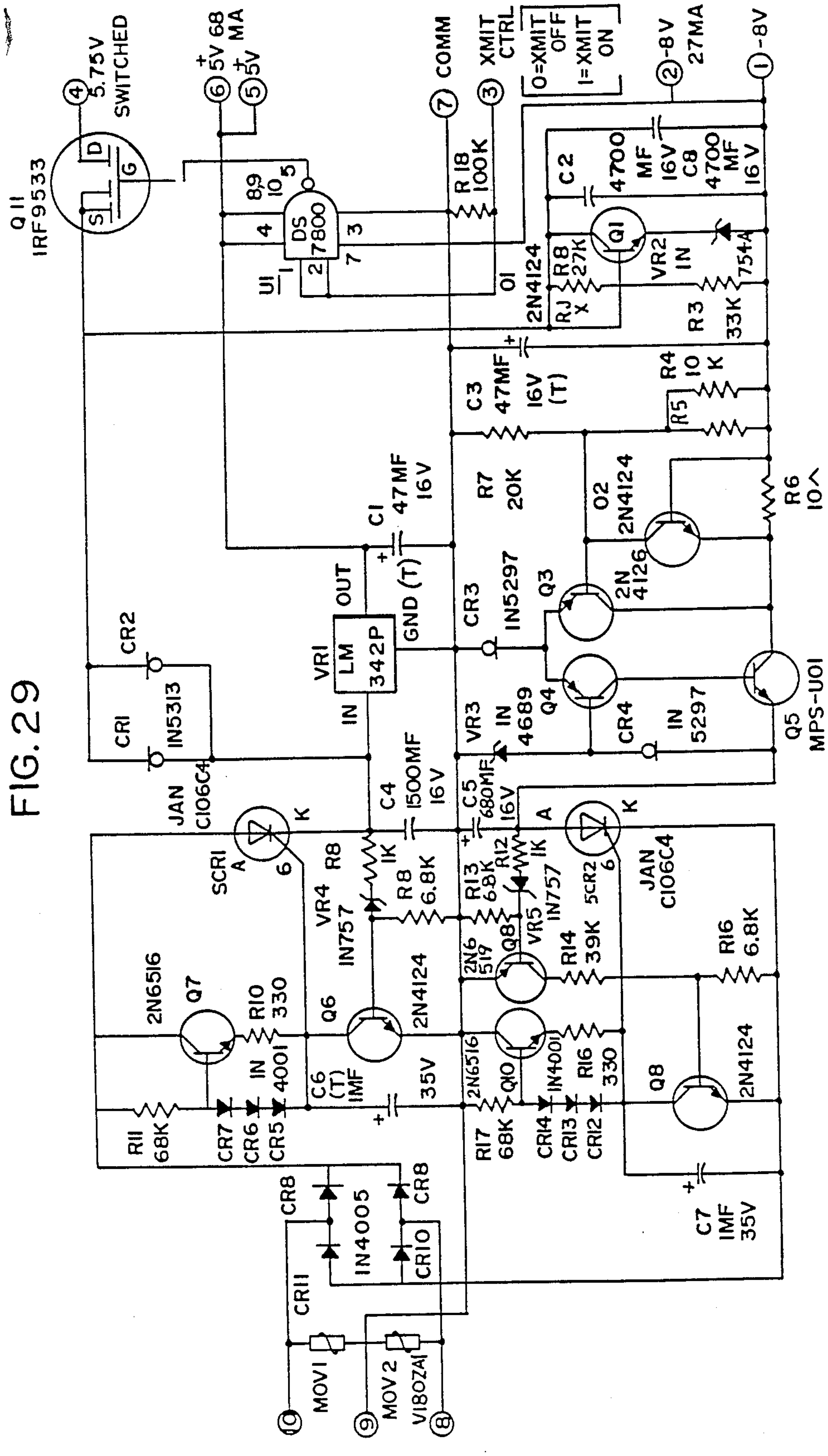
FIG. 29 is a detailed schematic electrical circuit diagram of the power supply of the state estimator of the invention.

The center tap 9 of the power pickoff coil 68 is connected to the aluminum shell of the module 20, which in turn is connected directly to the power conductor 22 by spring 78 and by the conducting facings 170 (FIGS. 12 and 13). Thus, the power conductor 22 becomes the local ground as shown at 88 for the electronics 294. The power supply supplies regulated +5 and −8 volts to the electronics 294 and an additional switched 5.75 volts for the transmitter as indicated at 300. The electronics 294 provides a transmitter control signal on line 302 to control the power supply to the transmitter. The sensors 296 provide analog signals as indicated at 304 to the electronics 294. The detailed schematic electrical circuit diagram of the power supply 292 is shown in FIG. 29.

Figure 30:
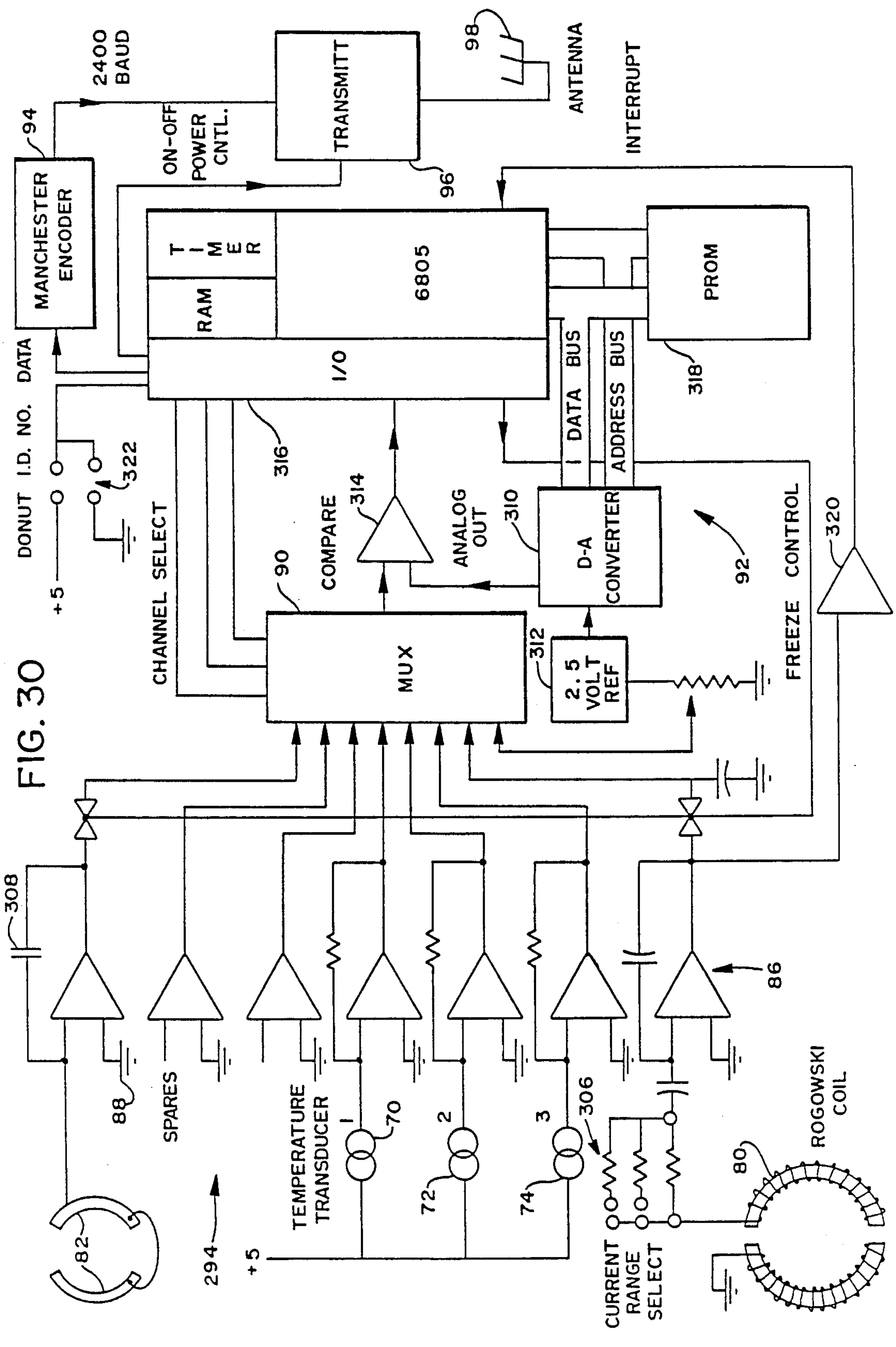
FIG. 30 is a detailed electrical schematic block diagram of a portion of the electronics illustrated in FIG. 28.

FIG. 30 is a schematic block diagram of the electronics 294. As shown therein, the Rogowski coil 80 is connected to one of a plurality of input amplifiers 86 through current range select resistors 306. The voltage sensing plates 82 are connected to the uppermost amplifier which is provided with a capacitor 308 in the feedback circuit which sets gain and provides an amplifier output voltage in phase with line to neutral high tension voltage. It also provides integrator action for the measurement of current the same way as the amplifier connected to the Rogowski coil. Thus amplifier 86 connected to the voltage sensing plate 82 is a low impedance current measuring means connected between the power conductor 22 (i.e., ground 88) and the plates 82.

Each of the temperature transducers 72 and 74 is connected to a separate one of the amplifiers 86 as shown. Spare amplifiers are provided for measurement of additional characteristics such as the interior temperature of the donut 20. Each of the amplifiers 86 is connected for comparison with the output of digital analog converter means 310, 2.5 volt reference source 312 at comparator 314 by the multiplexer 90 under control of the digital computer 316. The digital computer may be a Motorola CMOS 6805 microprocessor having I/O, RAM, and timer components. A programmable read only memory 318 is connected thereto for storing the program. A zero crossing detector 320 detects the zero crossings of the current in the Rogowski coil 80 and provide basic synchronization. The donut ID number is selected by jumpers generally indicated at 322. The digitized data assembled into appropriate messages is encoded in Manchester code by the encoder 94 and supplied to a 950 megahertz transmitter 96 which then supplies it to the antenna 98.

Figure 31:
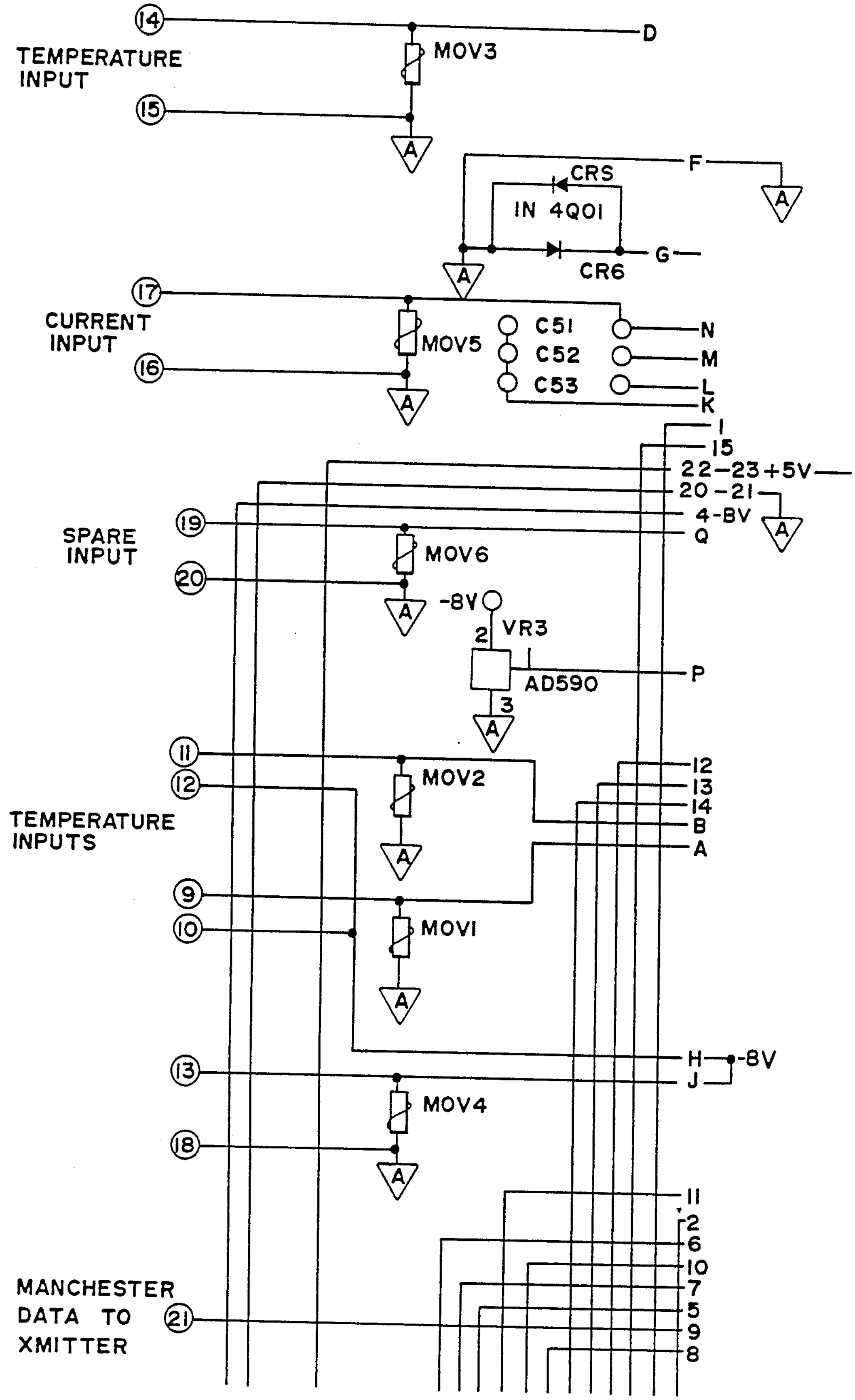
FIG. 31, comprising FIGS. 31A through 31D which may be put together as shown in FIG. 31E, is a detailed schematic electrical circuit diagram of the electronics shown in FIG. 30.
Figure 31:
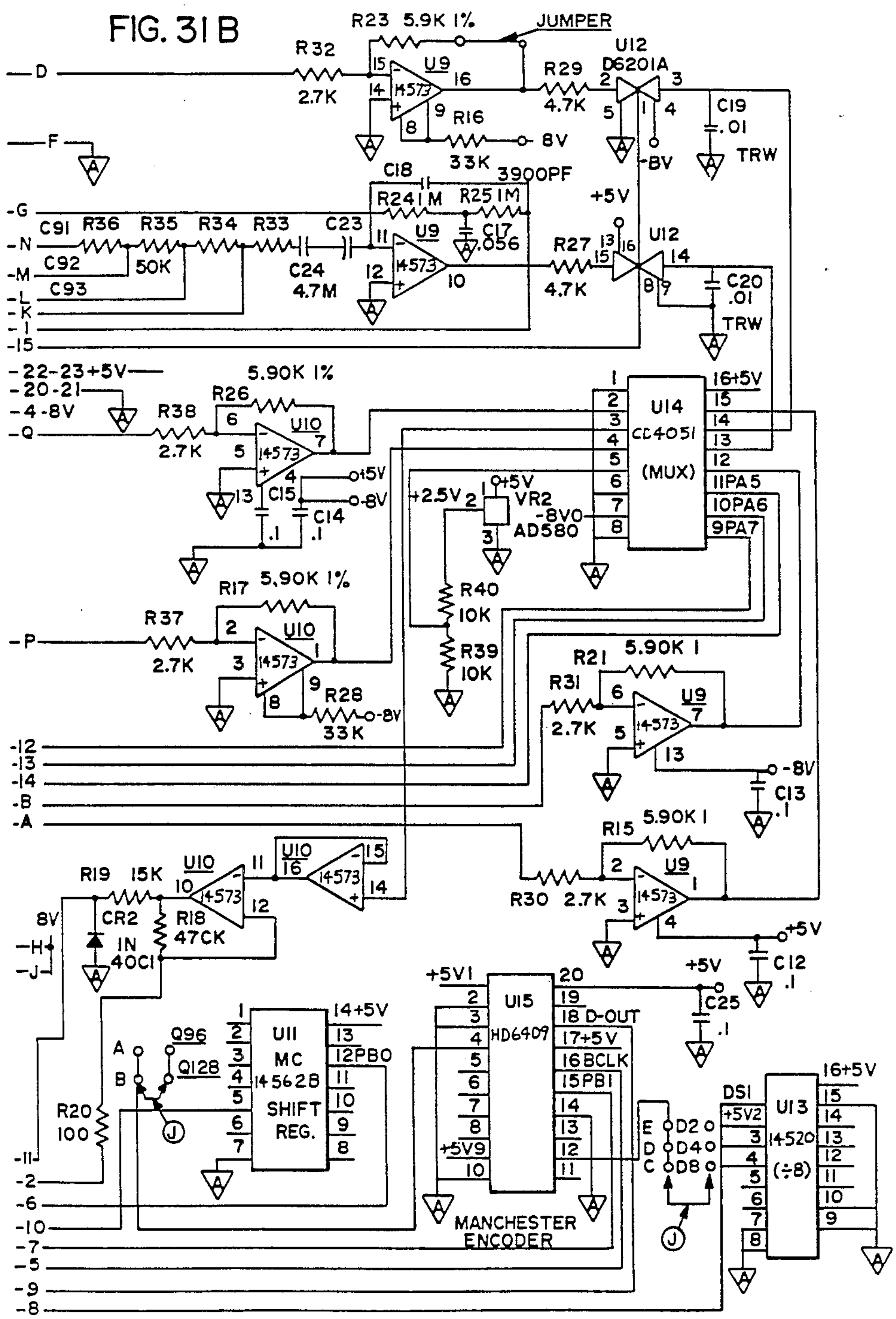
Figure 31:
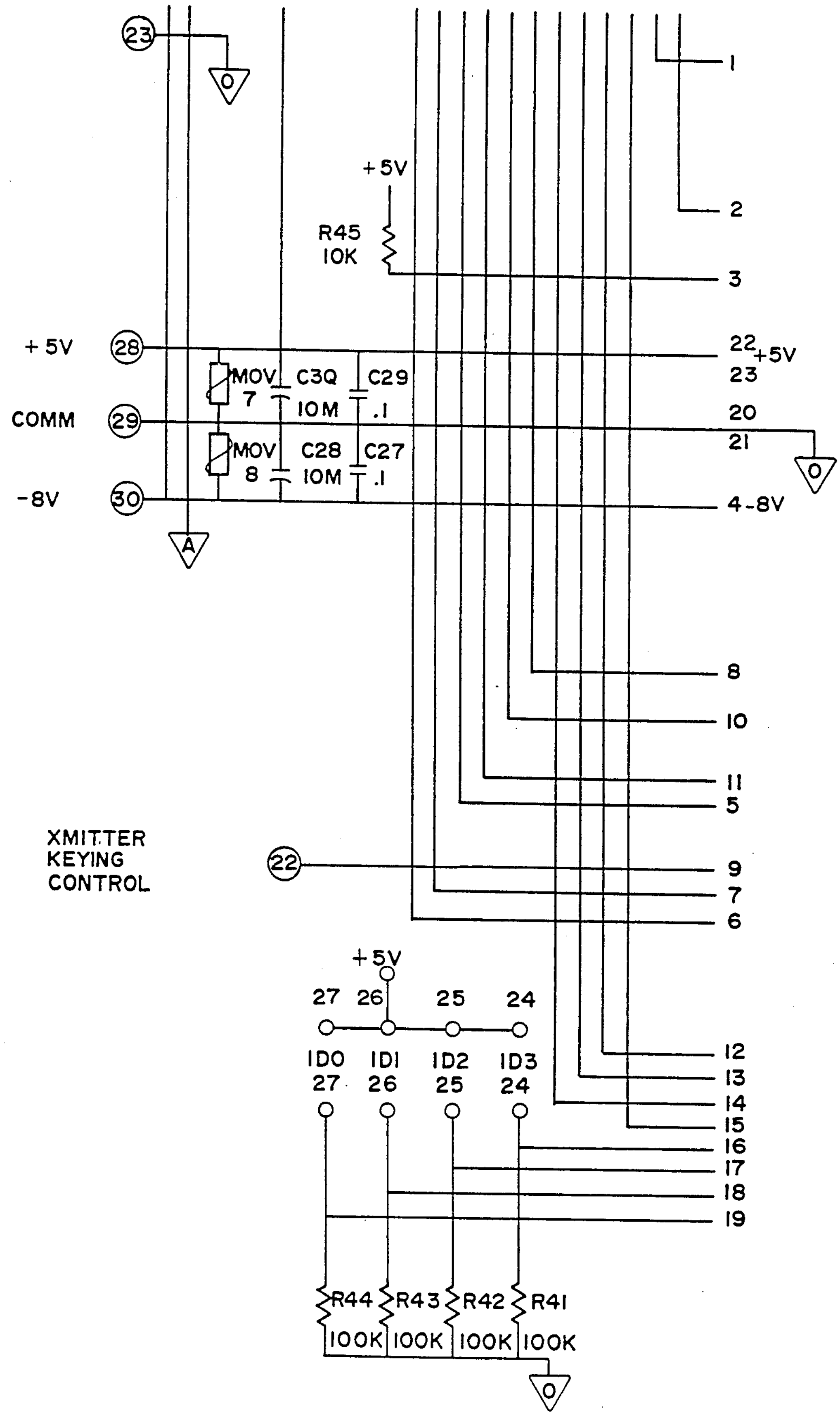
Figure 31:
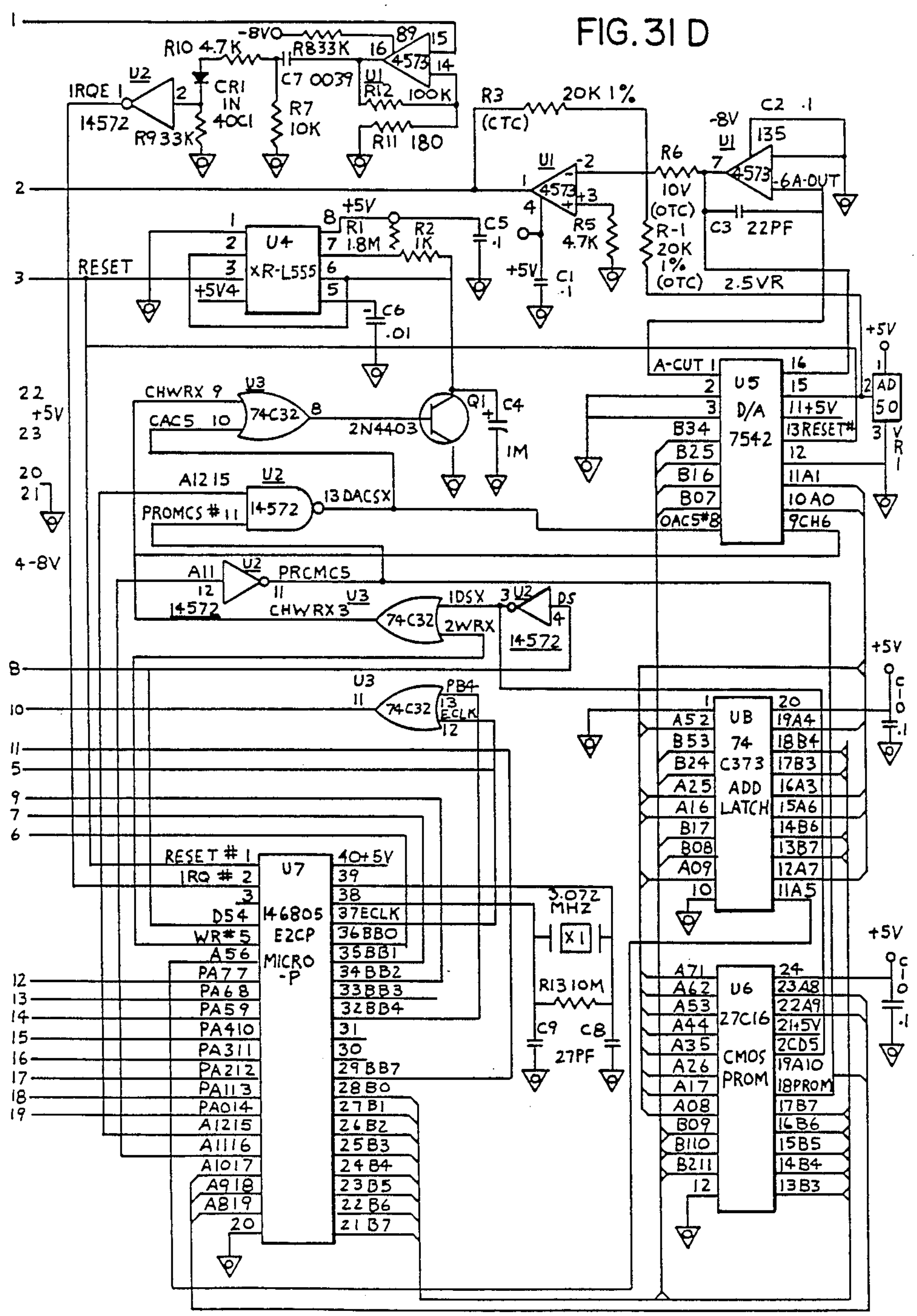
Figure 31:
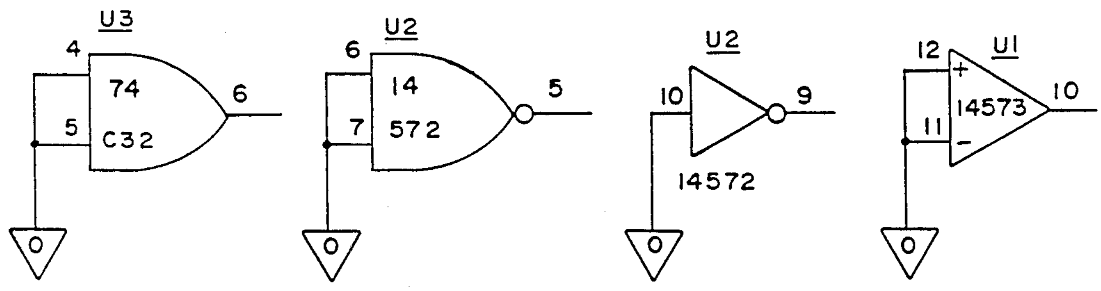
Figure 31:
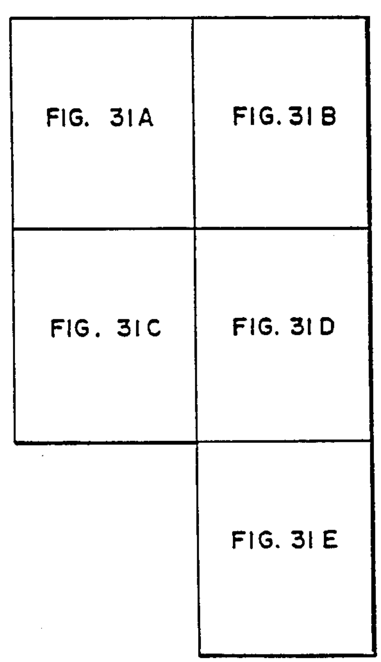

The schematic electrical circuit diagram of the electronics 294 is shown in FIG. 31, comprising FIGS. 31A through 31D which may be put together to form FIG. 31 as shown in FIG. 31E. The grounds therein are shown as triangles. A inside the triangle indicates an analog ground and D a digital ground. Both are connected to the common terminal as indicated in FIGS. 28 and 31C.

The Voltage Sensor

Figure 32:
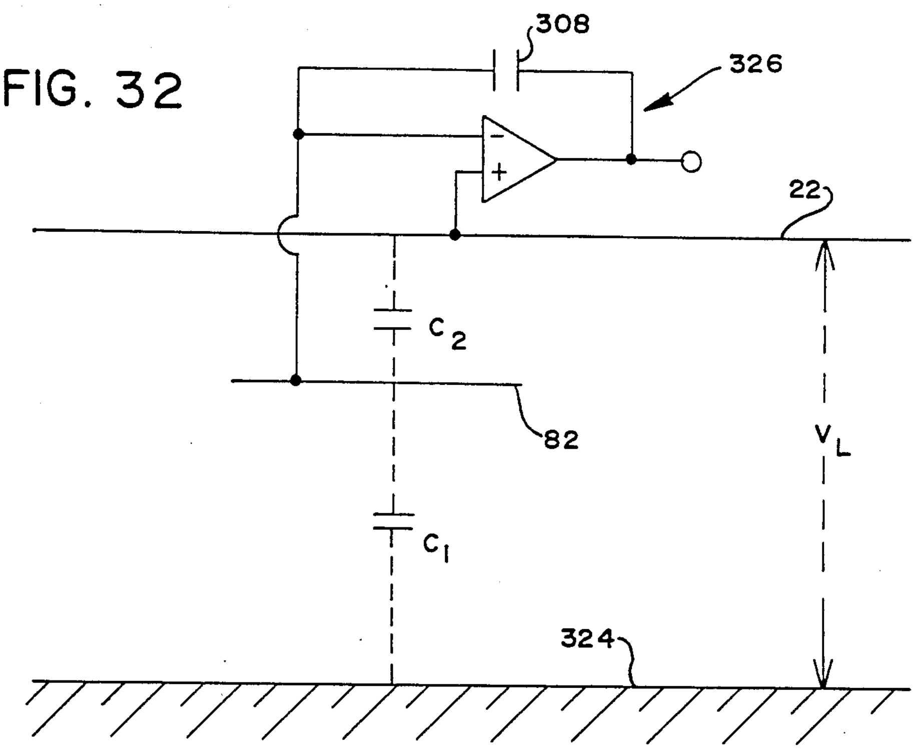
FIGS. 32 and 33 are schematic electrical circuit diagrams illustrating the voltage measurement system according to the invention.

The operation of the voltage sensor may be understood with reference to FIG. 32. We wish to measure the alternating current voltage $V_L$ between the conductor 22 and the ground 324. The metal plates 82 form one plate of a capacitive divider between conductor 22 and ground, comprising the equivalent capacitor C1 between ground and plate 82 and equivalent C2 between conductor 22 and the plate 82.

The voltage $V_L$ between ground and the conductor 22 is thus divided across the equivalent capacitor C1 and C2.

Prior art methods have attempted to measure the potential developed across capacitance C2. However this capacitance can change value and affect the accuracy of the measurement. It may also develop a spurious voltage across it due to the high electric field in the vicinity of the high voltage conductor 22. The low impedance integrating operational amplifier of the invention, generally indicated at 326, shunts capacitance C2 and effectively eliminates it from the circuit. The potential of plates 82 is therefore made to be the same as that of conductor 22 through the operational amplifier 326. Now the potential between the plates 82 and ground 324 is the potential $V_L$ between the line 22 and the ground 324. Therefore, the current in the capacitance $C_1$ is now directly proportional to the voltage $V_L$. Therefore, the low impedance integrater connected operational amplifier 326 will provide an AC output voltage exactly proportional to the current in the capacitance $C_1$ and thus directly proportional to the high voltage $V_L$ on the conductor 22.

Figure 33:
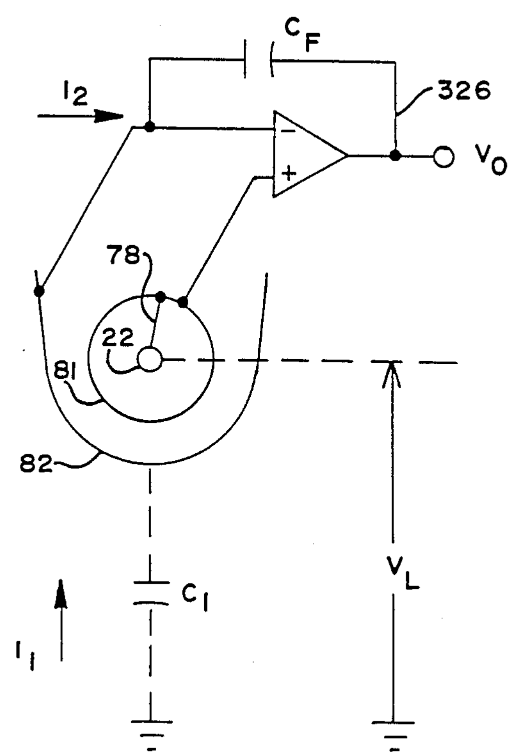

Now referring to FIG. 33, all of the circuitry including the integrater connected operational amplifier 326 is housed within a metal housing 81, which is connected to the conductor 22 via the spring 78. The plates 82 are on the outside of the housing 81 and must be electrically insulated from it. The plates 82 cannot protrude from the housing 81 since this would invite corona on very high voltage lines. It therefore must either be flush with the surface of the housing 81 or recessed slightly in it.

Unfortunately rain water or snow collecting on the surface will provide a path of high dielectric constant shunting the high electric field about the conductor 22 so that the current $I_2$ to the operational amplifier 326 will not be equal to the current $I_1$ in the capacitance $C_1$. Thus the measurement will be in error.

In order to minimize this effect the width and length of the sensing plates must be made very large in comparison with the width of the gap separating them from the housing and if any protective coating is used over the sensing plate it must have no appreciable thickness. Furthermore, the outer surface of the sensing plate must conform, as closely as possible, with the outer surface of the housing 81.

Thus the sensing plates 82 shown in FIGS. 8, 9, and 10, are made very long and have gaps to the housing at their ends of only 0.020 inches and gaps 212 along them of 0.005 inches in width. The plates 82 are approximately ⅜ of an inch in width, which is of course very much greater than the gaps of 0.05 inches and 0.020 inches.

When constructed in this manner, water droplets covering the metallic sensing plate and bridging the adjacent housing do not materially affect the measurement of $V_L$. This is true because:

1. the sensing plates 82 are directly exposed and water overlying them which has a high dielectric constant, simply conducts the capacitive current $I_1$ directly to the plate;
2. the amount of current shunted by water at the gap between the plates 82 and the housing 81 is very small in proportion to the amount collected by the much larger area sensing plates themselves;
3. the alternating current lost through the shunt path across the gap between the plates 82 and housing 81 is very small because of the low input impedance of the integrater connected operational amplifier 326.

Deriving the Fourier Components of Current and Voltage

Since the state estimator module 20 is mounted in isolation on a high-tension transmission line it is desirable to derive as much information as possible from the sensors contained within it with a minimum of complexity and to transmit this raw data to the ground station 24 (FIG. 1). Calculation of various desired quantities may then be made on the ground.

It is therefore convenient to sample and hold both the current and voltage simultaneously and to send these quantities to the ground sequentially by pulse code modulation.

When it is desired to derive phase and harmonic data rather than merely transmitting the root mean square of the voltage and current to the ground, the shape of the waveforms and their relative phase must be transmitted.

We do this by transmitting Fourier components. We sample the waveform of both current and voltage at intervals of 1/9th of a cycle. However, rather than doing this during one cycle, we do this making one measurement at each cycle, changing the interval over nine cycles.

The ground station can then easily compute the quantities of interest, for example, RMS amplitude of voltage and current, their relative phase and harmonic content.

Since current and voltage are sampled simultaneously, their relative phases are the same as the relative phases of the sample sequence. The harmonic structures are also the same, so that, except for brief phenomena, any desired analysis may be made by the ground station.

The data transmissions take place in a five to ten second millisecond interval, which is synchronized with the zero crossing of the donut 20. With this information, the relative phase of three phases of a transmission line as shown in FIG. 1 may be derived.

In the embodiment disclosed herein we only compute the fundamental Fourier components of $V_A$ and $V_B$ and $I_A$ and $I_B$ which are:

$$V_A = \frac{2}{S_T} \cdot \sum_{S=1}^{S_T} V_S \cdot \cos\left(\frac{2\pi}{S_T} \cdot S\right)$$

$$V_B = \frac{2}{S_T} \cdot \sum_{S=1}^{S_T} V_S \cdot \sin\left(\frac{2\pi}{S_T} \cdot S\right)$$

$$I_A = \frac{2}{S_T} \cdot \sum_{S=1}^{S_T} I_S \cdot \cos\left(\frac{2\pi}{S_T} \cdot S\right)$$

$$I_B = \frac{2}{S_T} \cdot \sum_{S=1}^{S_T} I_S \cdot \sin\left(\frac{2\pi}{S_T} \cdot S\right)$$

where $S_T$ equals the total number of samples in the apparatus disclosed 9, S equals the sample, and $V_S$ and $I_S$ are the value of the measured voltage and current at each sample S. From these the RMS voltage V and current I may be derived by the formulas:

$$V = [(V_a)^2 + (V_B)^2]^{\frac{1}{2}}$$

$$I = [(I_A)^2 + (I_B)^2]^{\frac{1}{2}}$$

real power is:

$$(V_B \times I_B) + (V_A \times I_A)$$

and reactive power is:

$$(V_A \times I_B) - (V_B \times I_A).$$

If it is desired to have information about the shape of the waveform (that is harmonic data) more samples may be taken and the desired Fourier harmonic components calculated and transmitted.

"Random" Transmissions on a Single Radio Channel

As shown in FIG. 4, a single substation 34 may have as many as fifteen donuts 20 transmitting data to a single receiver 24. Since radio receivers are expensive and radio frequency channel allocations are hard to obtain, it is desirable to have all units share a single channel. For weight and economy it is desirable to minimize the equipment in the donuts 20 at the expense of complicating the receiver 24.

Idealy, all donuts 20 transmitting on a single channel would transmit, in turn, in assigned time slots. Unfortunately, the only way to synchronize them according to the prior art would be to provide them each with a radio receiver.

Our donuts 20 are programmed to send out short burst transmissions at "random" with respect to each other, and to do so often enough that occasional interference between two or more transmissions does not destroy a significant portion of the data. This is accomplised by assigning to each donut 20 transmitting to a single receiver 24 a fixed transmission repetition interval so that no synchronization is required. The interval between transmissions of each of the donuts is an integral number and these numbers are chosen so that no two have a common factor.

For example, for fifteen donuts, we choose the intervals W measured in sixtieths of a second according to the following table:

| Donut Number | W |
|---|---|
| 0 | 37 |
| 1 | 41 |
| 2 | 43 |
| 3 | 47 |
| 4 | 51 |
| 5 | 53 |
| 6 | 59 |
| 7 | 61 |
| 8 | 64 |
| 9 | 65 |
| 10 | 67 |
| 11 | 71 |
| 12 | 73 |
| 13 | 77 |
| 14 | 79 |

It is desirable that the message length be reduced to a bare minimum in order to minimize simultaneous message transmission. One way we accomplish this is to transmit "auxiliary" information in repeating cycles of five transmissions.

Timing of the Measurements and Transmissions

Figure 34:
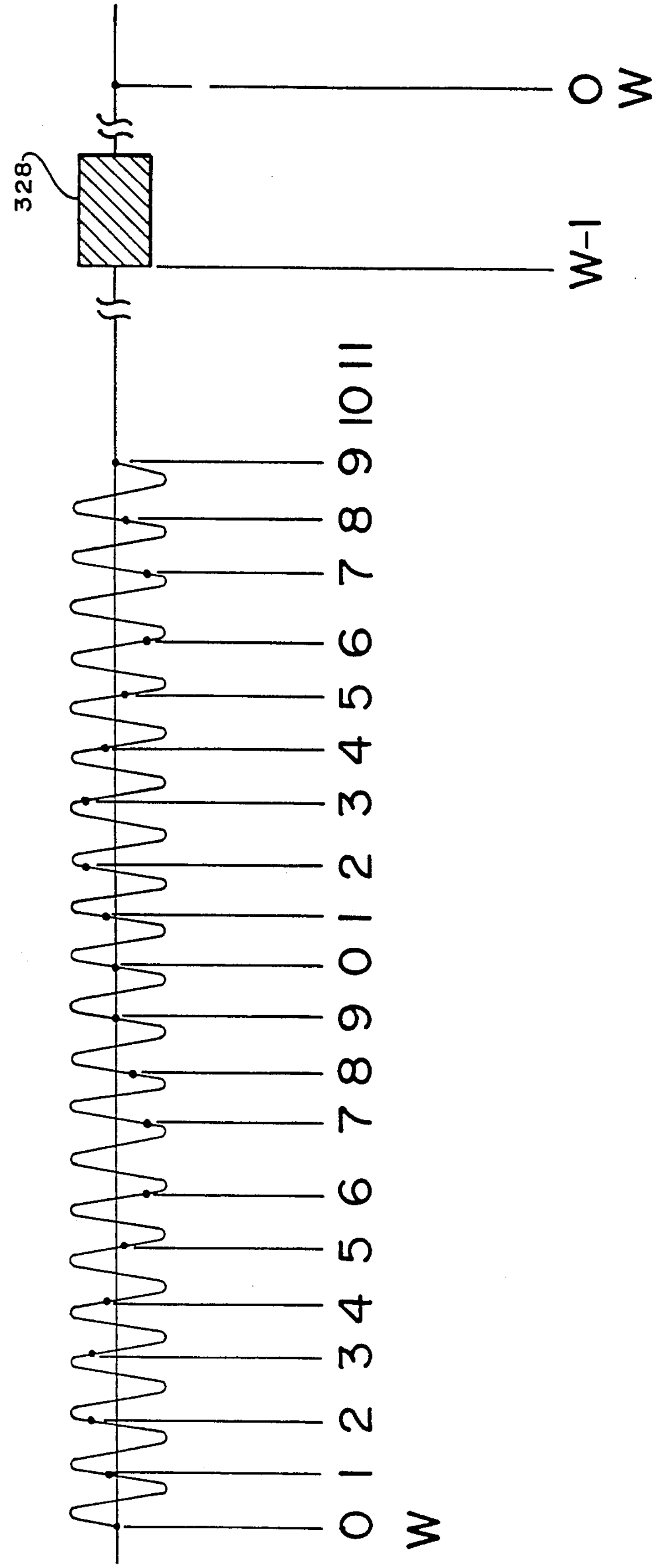
FIG. 34 is a timing diagram of the electronics illustrated in FIG. 30.

A timing diagram is shown in FIG. 4, where the sine wave is the current as measured by the Rogowski coil. At zero crossing labeled Ø timing is started. During the next cycle labled 1 and succeeding cycles through the eighth, the nine successive Fourier measurements $I_S$ and $V_S$ are made. During the ninth cycle the period of the previous eight cycles is utilized to define the sampling interval and the Fourier samples of the current and voltage are again taken during the next eight cycles. These measurements are utilized to compute $V_A$, $V_B$, $I_A$ and $I_B$. At the end of the next cycle labeled 9 at the Ø crossings, twenty-one cycles have occurred. During the followup period of time, up to a total of $W-1$ cycles, the program loads shift registers with the identification number of the donut, the auxiliary number, the Fourier components $V_A$, $V_B$, $I_A$, $I_B$, the digitized auxiliary parameters and the CRC (a check sum). At $W-1$ the transmission 328 begins and takes place over a short interval of 5 to 10 milliseconds, (approximately 5 milliseconds in the apparatus disclosed). Then at the Ø crossing at the end of the cycle beginning at $W-1$, that is after W cycles, the program is reset to Ø going back to the left hand side of the timing diagram of FIG. 34.

In the program discussed below there is a timer labeled Z which is set to Ø at the far left, beginning Ø cross over. It is reset to $Z=21$ at the end of the twenty-first cycle, the second nine to the right in FIG. 34.

The Donut Software

Copyright © 1983,
Product Development Services, Incorporated (PDS)

Scope

The state estimator module 20 (sometimes called herein the substation monitor) is a MC146805E2 microprocessor device.

Introduction

The "Donut" software specification is divided into three major sections, reflecting the three tasks performed by the software. They are:

Data structures,

The background processing that performs the bulk of the "Donut" operations. Included are transmitter control, sample rate timing, analog value conversion, and general "housekeeping", Common utility sub-routines, The interrupt processing that handles A.C. power zero-crossing interrupts and maintains the on-board clock which is used for cycle timing, and The restart processing that occurs whenever the microprocessor is restarted.

The program listings are found in Appendix A.

Notation Conventions (a) Logic Statements

Program modules are described via flowcharts and an accompanying narrative. The flowcharts use standard symbols, and within each symbol is noted the function being performed, and often a detailed logic statement.

Detailed statements conform to the following conventions:

| | |
|---|---|
| IX | Index Register |
| SP | Stack Pointer |
| PC | Program Counter |
| A,B | Register A or B |
| CC | Condition Codes |
| Y | Contents of register or contents of memory location Y |
| (y) | Contents of memory location addressed by the contents of register or contents of memory location y. |
| A,X | Contents of location whose address is A - IX. |
| y(m-n) | Bits m-n of the contents of register y or the contents of memory location y. |
| a→b | a replaces b. The length of the move (one or two bytes) is determined by the longer of a or b. |
| For instance: | |
| ABC→XYZ | Move the contents of memory location ABC to memory location XYZ. |
| IX→XYZ | Save the Index Register in location XYZ. |
| (IX)→XYZ | Store the contents of the address pointed to by the Index Register in location XYZ. |
| Ø,X→XYZ | Same as above. |
| XYZ+2,X→SP | Move the bytes in location XYZ+2+(IX) and XYZ+3+(IX) to the Stack Pointer |
| IX→(XYZ) | Store the Index Register in the memory location pointed to by location XYZ. |
| (IX)→(XYZ) | Store the contents of the memory location pointed to by the Index Register in the memory location pointed to by location XYZ. |
| ABC (2-3) | Bits 2-3 of memory location ABC. |

(b) Subroutine Calls

Figure 35:
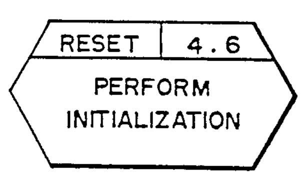
FIG. 35 shows a sub-routine call as utilized in the flow charts of FIGS. 40 through 61.

Subroutine calls contain the name of the subroutine, a statement of the sub-outline, a statement of its function, and the flowchart section which describes it as shown in FIG. 35.

Data Structures

Figure 36:
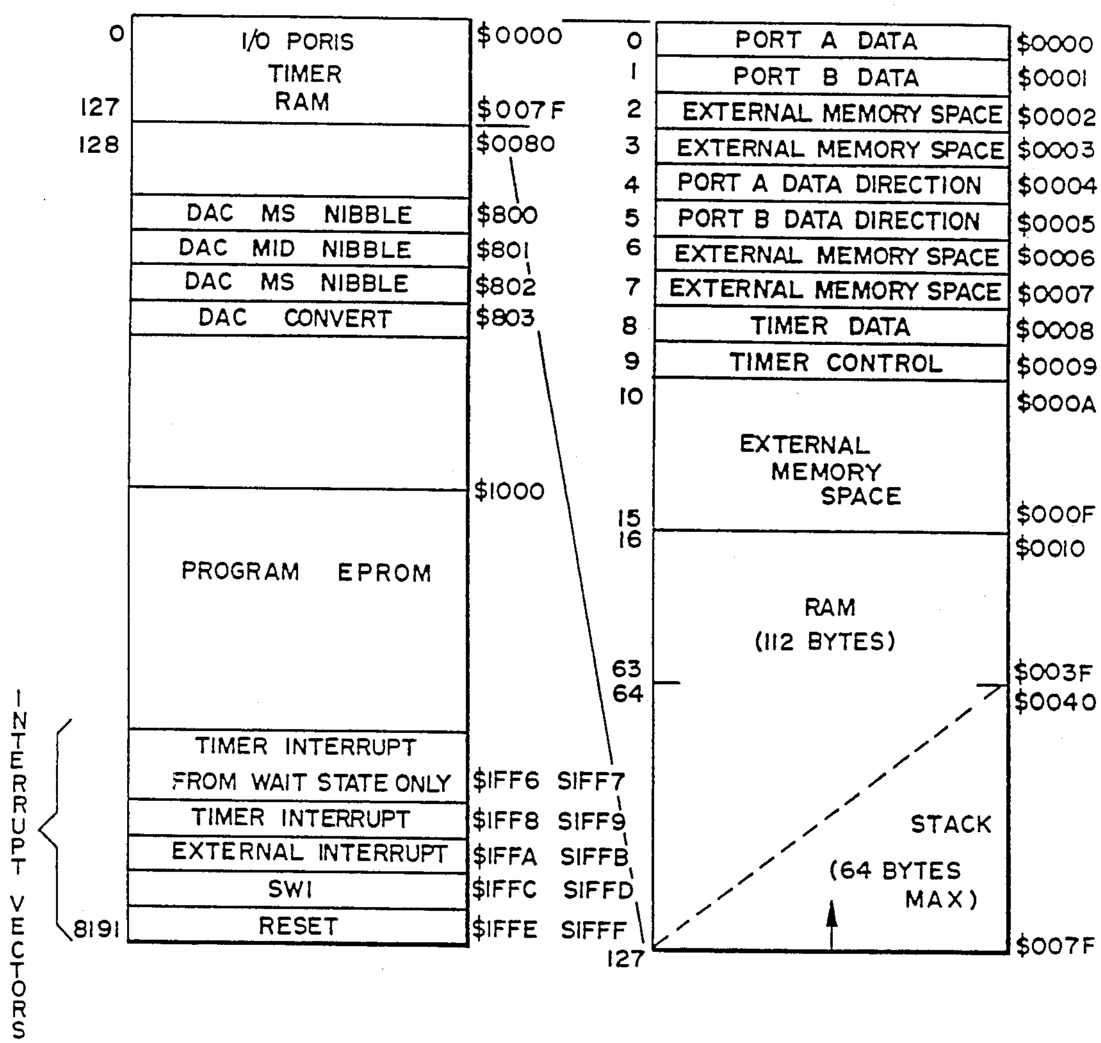
FIG. 36 is a memory map of the program.
Figure 37:
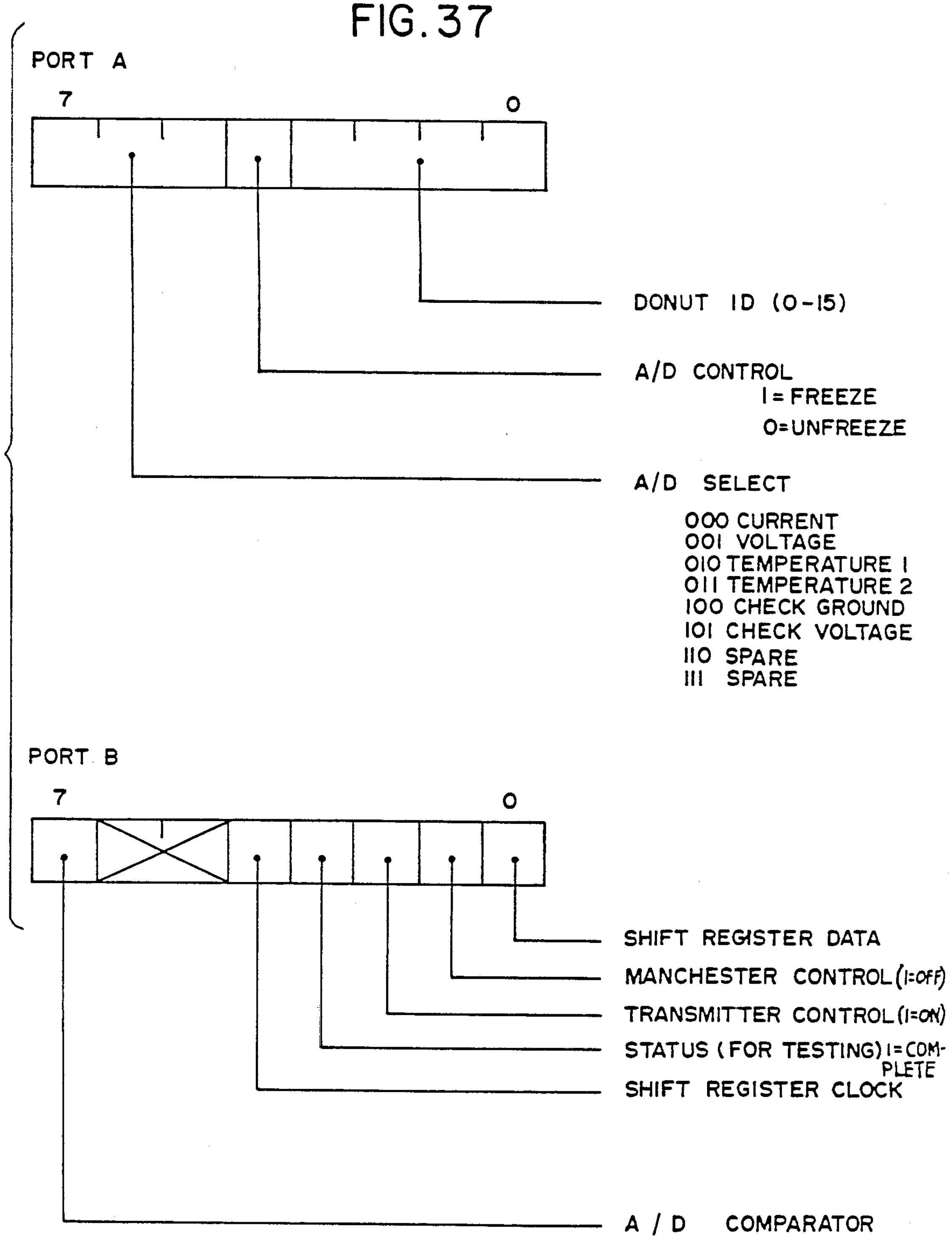
FIG. 37 is a diagram of PIA port assignments of the program.

The memory map is shown in FIG. 36, the PIA Definitions in FIG. 37, and the Data Transmission Format in FIG. 38.

Background Processing

Figure 39:
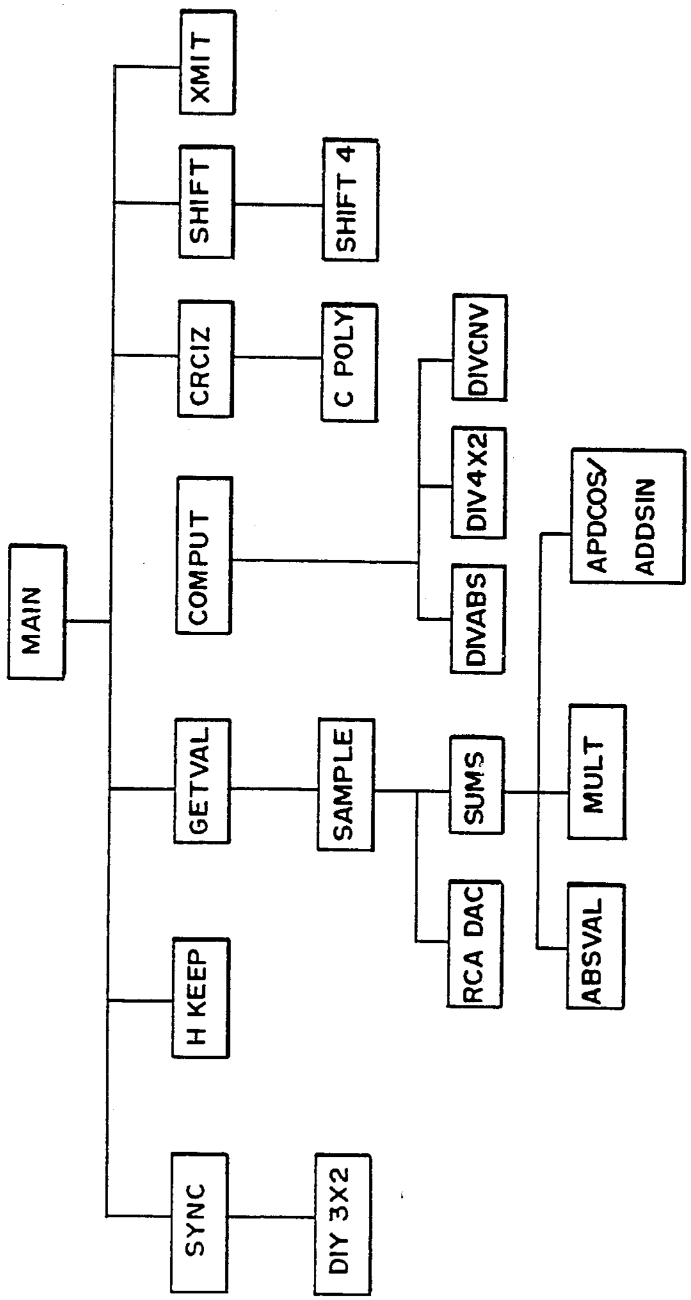
FIG. 39 is a diagram of task management of the program.

The Background Processing Hierarchy is shown in FIG. 39.

Figure 40:
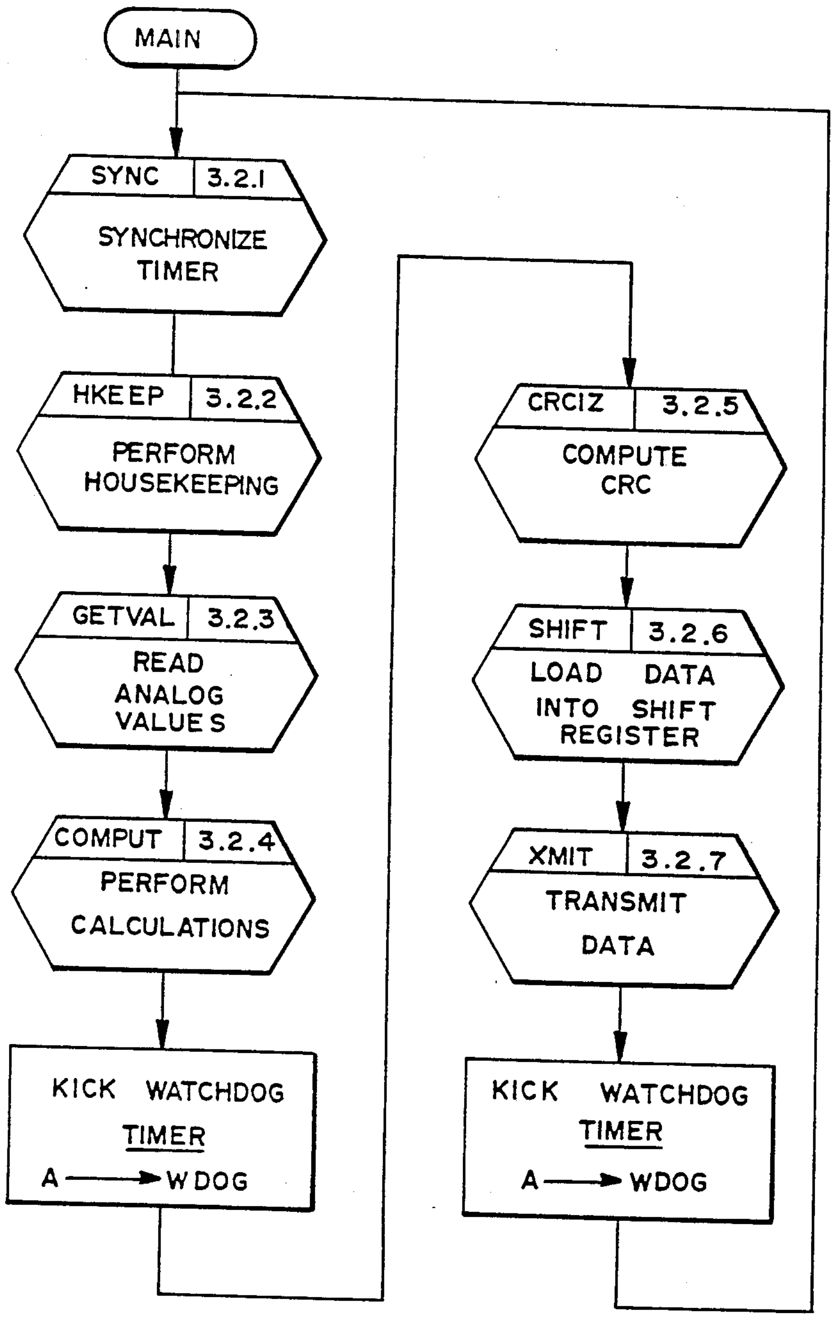
FIGS. 40 through 61 are flow charts of the subroutines of a program that may be utilized in the donuts 20.

Substation Monitor Mainline (MAIN) FIG. 40

PURPOSE: MAIN is the monitor background processing loop.
ENTRY POINT: MAIN
CALLING SEQUENCE: JMP MAIN (from RESET)
REGISTER STATUS: A, X not preserved.
TABLES USED: None.
CALLED BY: RESET
CALLS: SYNC, HKEEP, GETVAL, COMPUT, CRC12, SHIFT, XMIT
EXCEPTION CONDITIONS: None.
DESCRIPTION:

MAIN calls SYNC to time the AC frequency and compute the sampling rate, HKEEP to perform general initialization, and GETVAL to sample the analog values, COMPUT is called to finish the Fourier calculations, the watchdog timer is kicked, and CRC12 is called to calculate the CRC value for the data to be transmitted. SHIFT is called to load the shift register, XMIT is called to transmit the data to the ground station, the watchdog is kicked, and the entire cycle is repeated.

Figure 41:
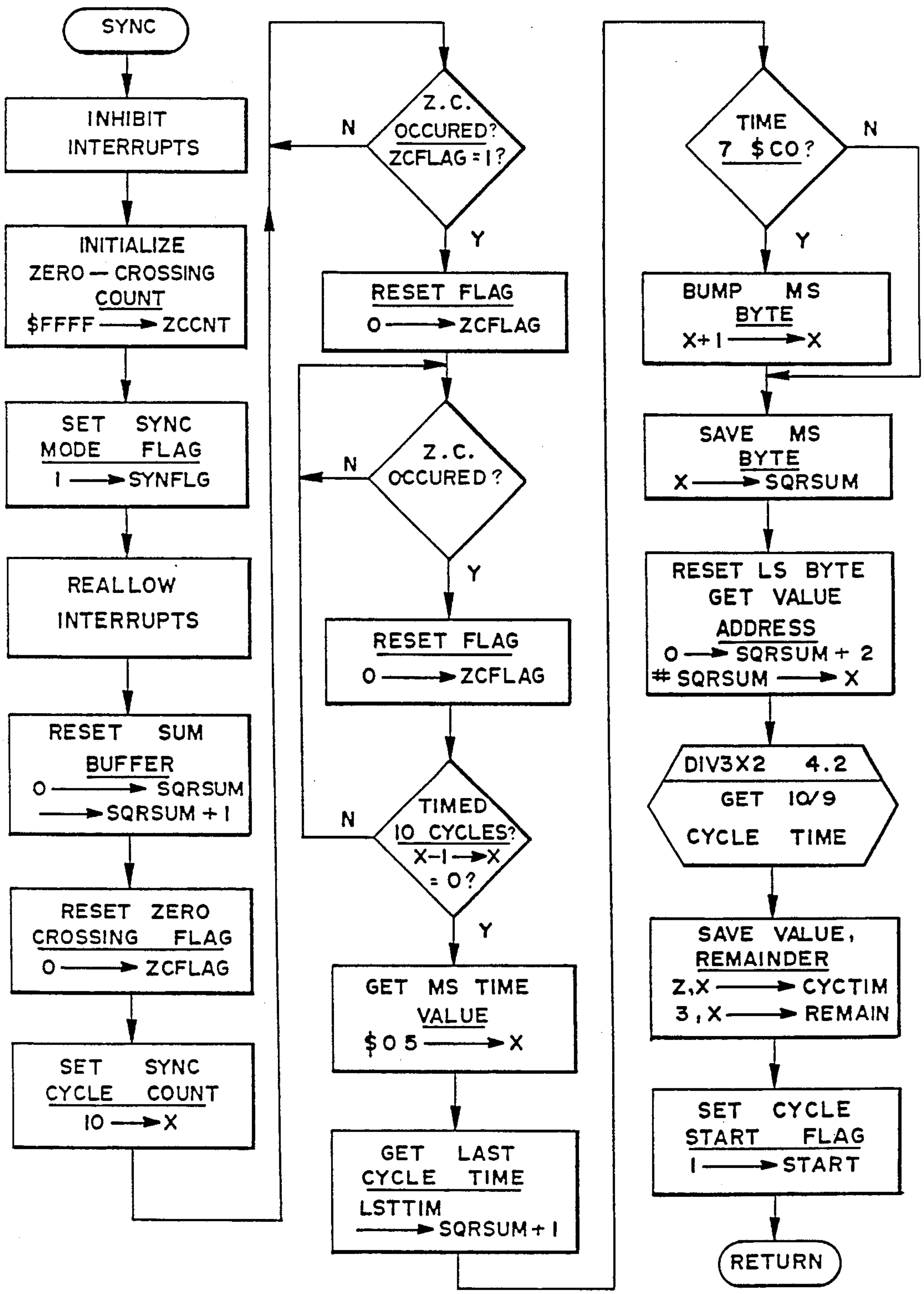

Synchronize Timing (SYNC) FIG. 41

PURPOSE: SYNC times the AC frequency and calculates the sampling interval.
ENTRY POINT: SYNC
CALLING SEQUENCE:
JSR SYNC
Return
REGISTER STATUS: A, X not preserved.
TABLES USED: None.
CALLED BY: MAIN
CALLS: DIV3X9
EXCEPTION CONDITIONS: None.
DESCRIPTION:

SYNC initializes the zero crossing count and sets the sync mode flag. The sum buffer is cleared for use as a time accumulator, the zero crossing occurred flag is reset, and the cycle counter is set to 10. The zero crossing occurred flag is monitored until 10 zero crossing interrupts have occurred, at which point the time value is moved to the sum buffer. DIV3X2 is called to divide the 10 cycle time by 8, the quotient is saved as the sampling time, the start flag is set, and a return is executed.

Figure 42:
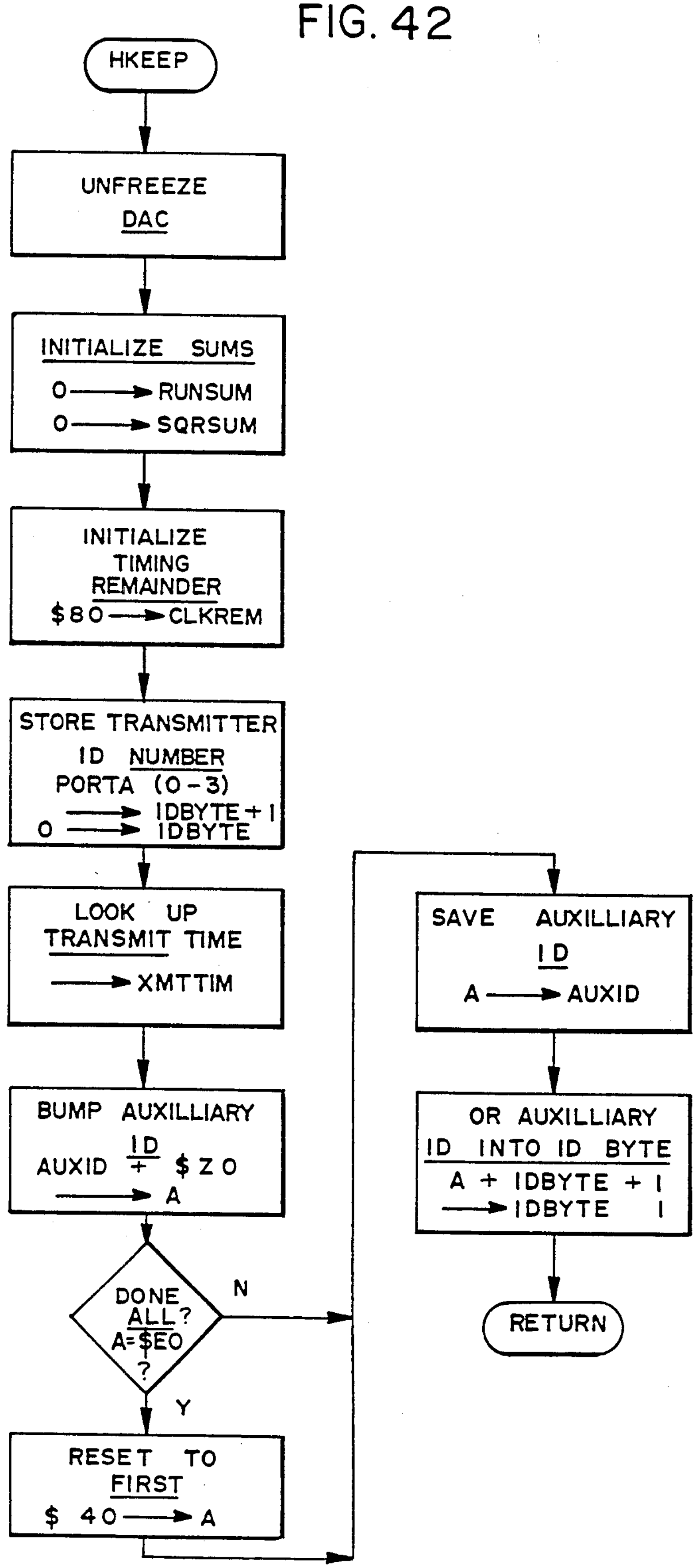

Perform Housekeeping (HKEEP) FIG. 42

PURPOSE: HKEEP performs cycle initialization.
ENTRY POINT: HKEEP
CALLING SEQUENCE:
JSR HKEEP
Return
REGISTER STATUS: A, X not preserved.
TABLES USED: TIMTBL—Timing Interval Table
CALLED BY: MAIN
CALLS: None.
EXCEPTION CONDITIONS: None.
DESCRIPTION:

HKEEP releases the DAC tracking register, clears the sum buffers, and resets the timing value remainder. The Donut I.D. number is read and stored in the data buffer, the cycle interval time is retrieved from the TIMTBL based on the I.D. number, and the auxilliary data I.D. number is bumped. A return is then executed.

Figure 43:
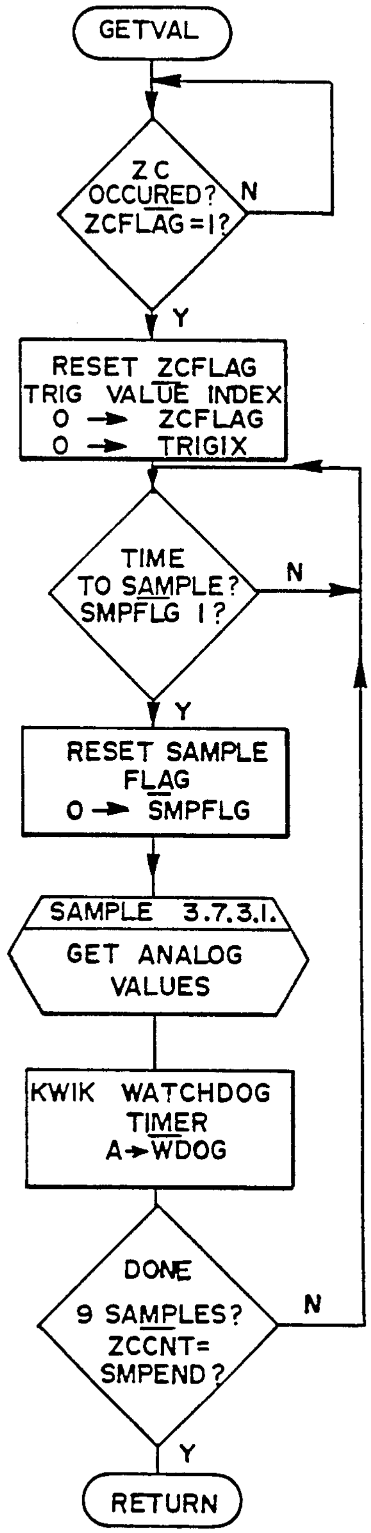

Collect All Data (GETVAL) FIG. 43

PURPOSE: GETVAL reads the nine data samples.
ENTRY POINT: GETVAL
CALLING SEQUENCE:
JSR GETVAL
Return
REGISTER STATUS: A, X not preserved.
TABLES USED: None.
CALLED BY: MAIN
CALLS: SAMPLE
EXCEPTION CONDITIONS: None.
DESCRIPTION:

GETVAL monitors the time-to-sample flag. When set, the flag is reset, SAMPLE is called to sample the analog values, and the watchdog timer is kicked. When the cycle has been repeated nine times, a return is executed.

Figure 44:
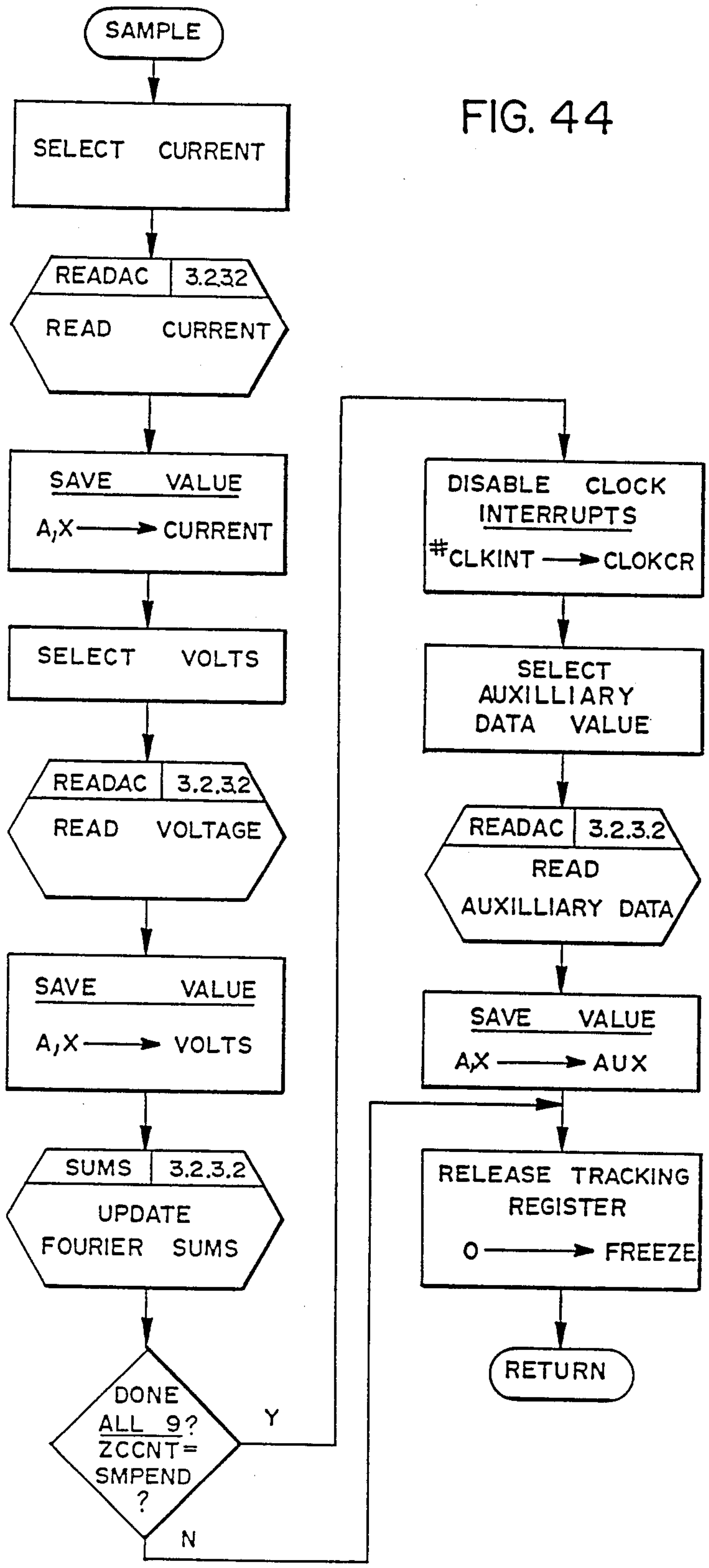

Read Analog Values (SAMPLE) FIG. 44

PURPOSE: SAMPLE reads and saves the analog values.
ENTRY POINT: SAMPLE
CALLING SEQUENCE:
JSR SAMPLE
Return
REGISTER STATUS: A, X not preserved.
TABLES USED: None.
CALLED BY: GETVAL
CALLS: READAC, SUMS
EXCEPTION CONDITIONS: None.
DESCRIPTION:

SAMPLE calls READAC to read the current and voltage values and SUMS to update the Fourier sums. A return is executed unless all nine samples have been taken, in which case READAC is called to read the auxilliary data value. The analog value tracking register is released, and a return is executed.

Figure 45:
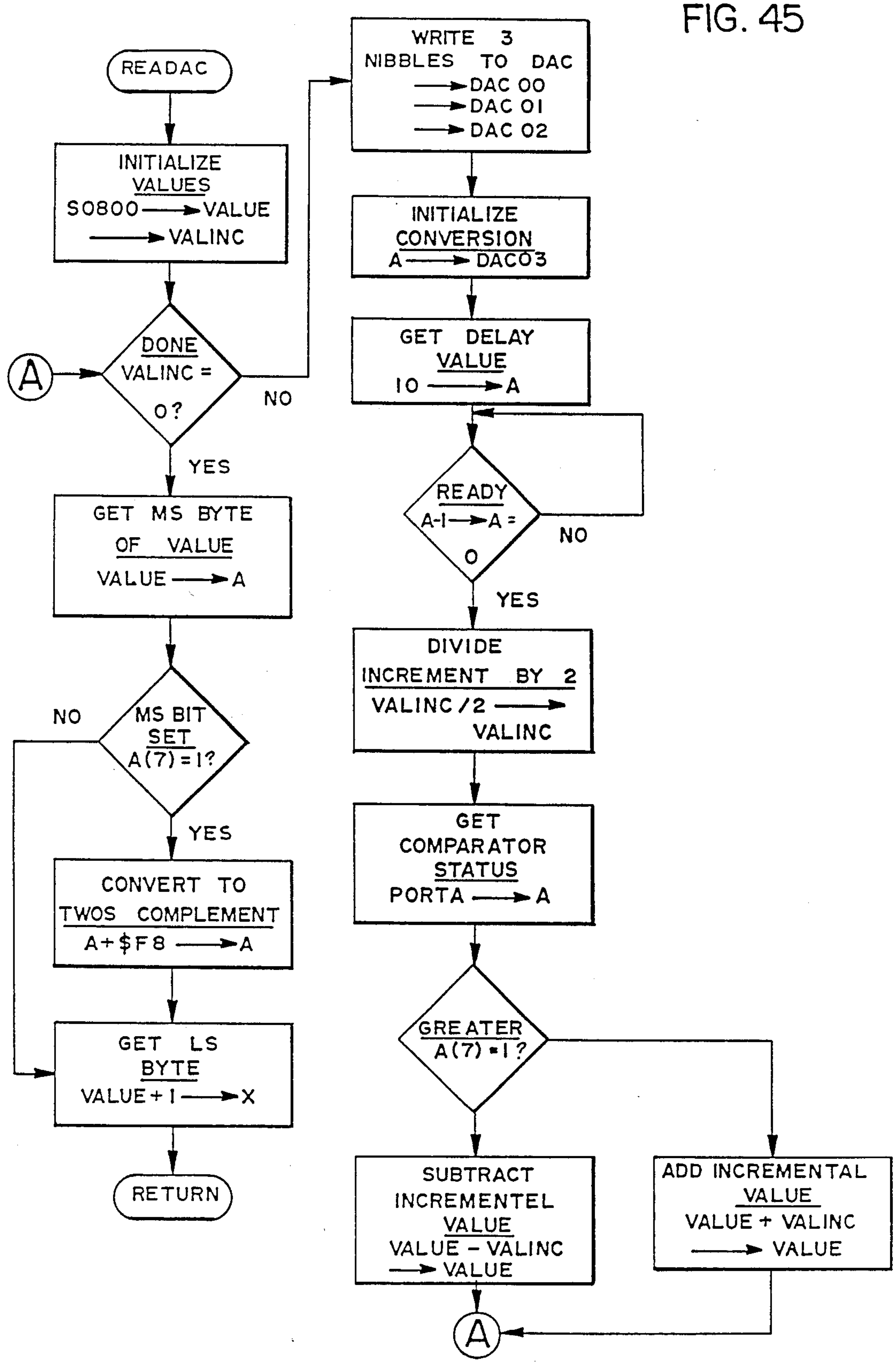

Read DAC/Comparator Circuit (READAC) FIG. 45

PURPOSE: READAC converts the analogs to digital values.
ENTRY POINT: READAC
CALLING SEQUENCE:
JSR READAC
Return
A, X=12 bit value
REGISTER STATUS: A, B, X not preserved.
TABLES USED: None
CALLED BY: SAMPLE
CALLS: None
EXCEPTION CONDITIONS: None
DESCRIPTION: READAC initializes the trial and incremental values. The trial value is written to the DAC as three four-bit values, and the DAC conversion is initiated. A short register-decrement delay loop allows the DAC time to convert, the incremental value is divided by two, and the comparator input is checked. The incremental value is subtracted/added to the test value if the test value was higher/lower than the actual analog value.

When the incremental value reaches zero, the value is converted to true two's complement and a return is executed with the value in A, X.

Figure 46:
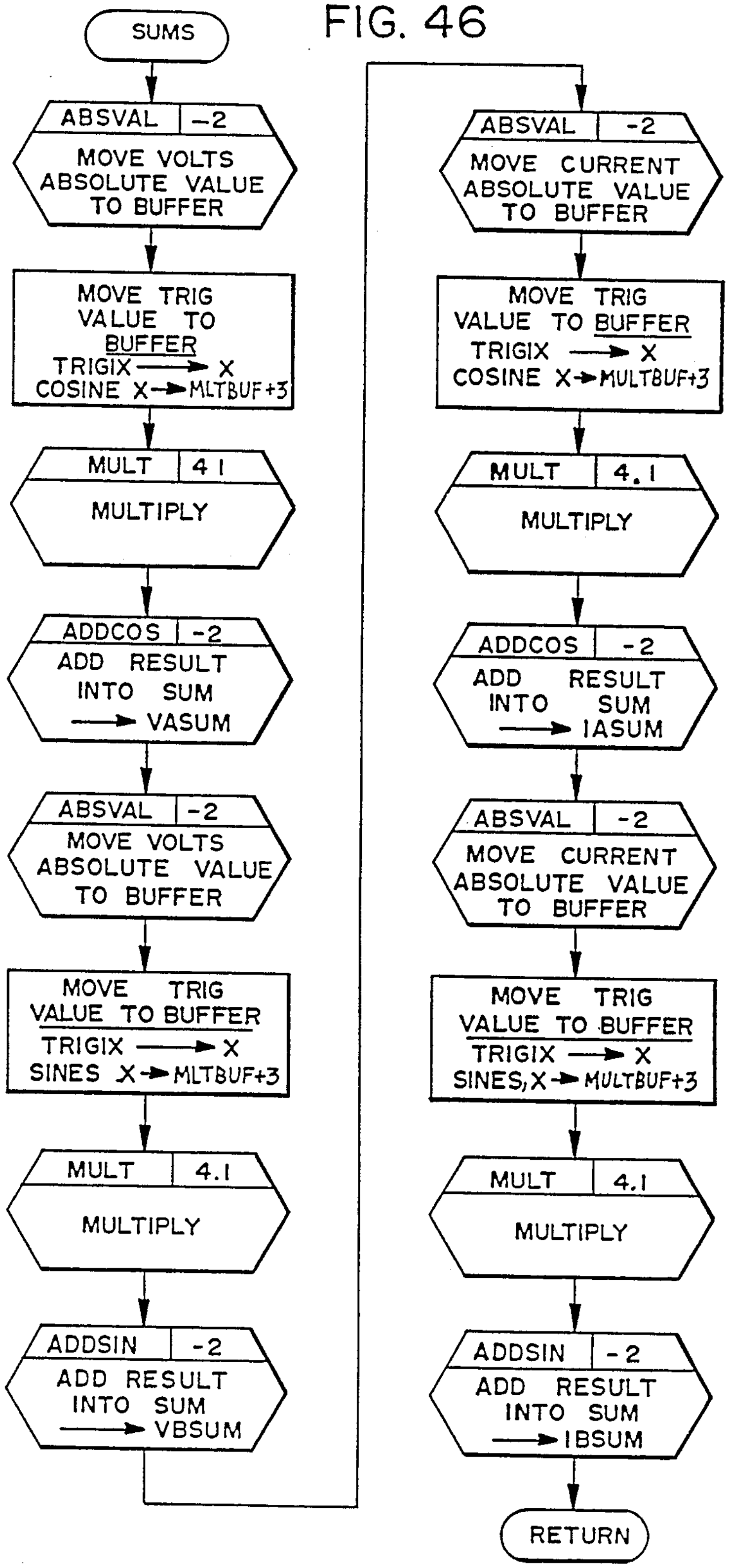

Maintain Fourier Sums (SUMS) FIG. 46

PURPOSE: SUMS multiplies the analog values by the trigonometric values of the phase angles and sums the results.

ENTRY POINT: SUMS

CALLING SEQUENCE:

JSR SUMS

Return

REGISTER STATUS: A, X not preserved.

TABLES USED: COSINE—Table of cosine values, SINES—Table of sine values

CALLED BY: GETVAL

Figure 47:
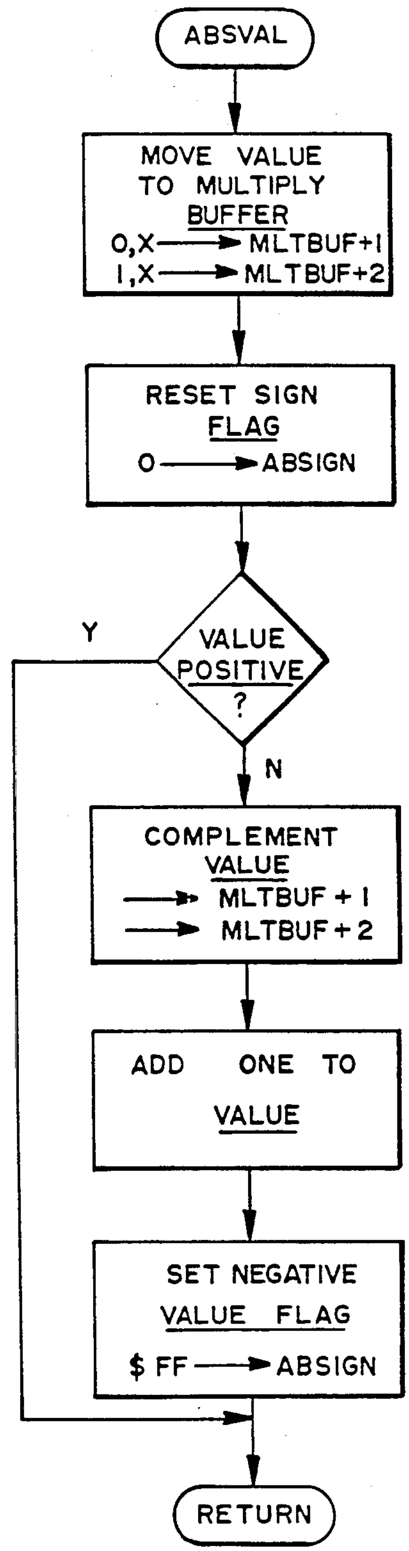
Figure 48:
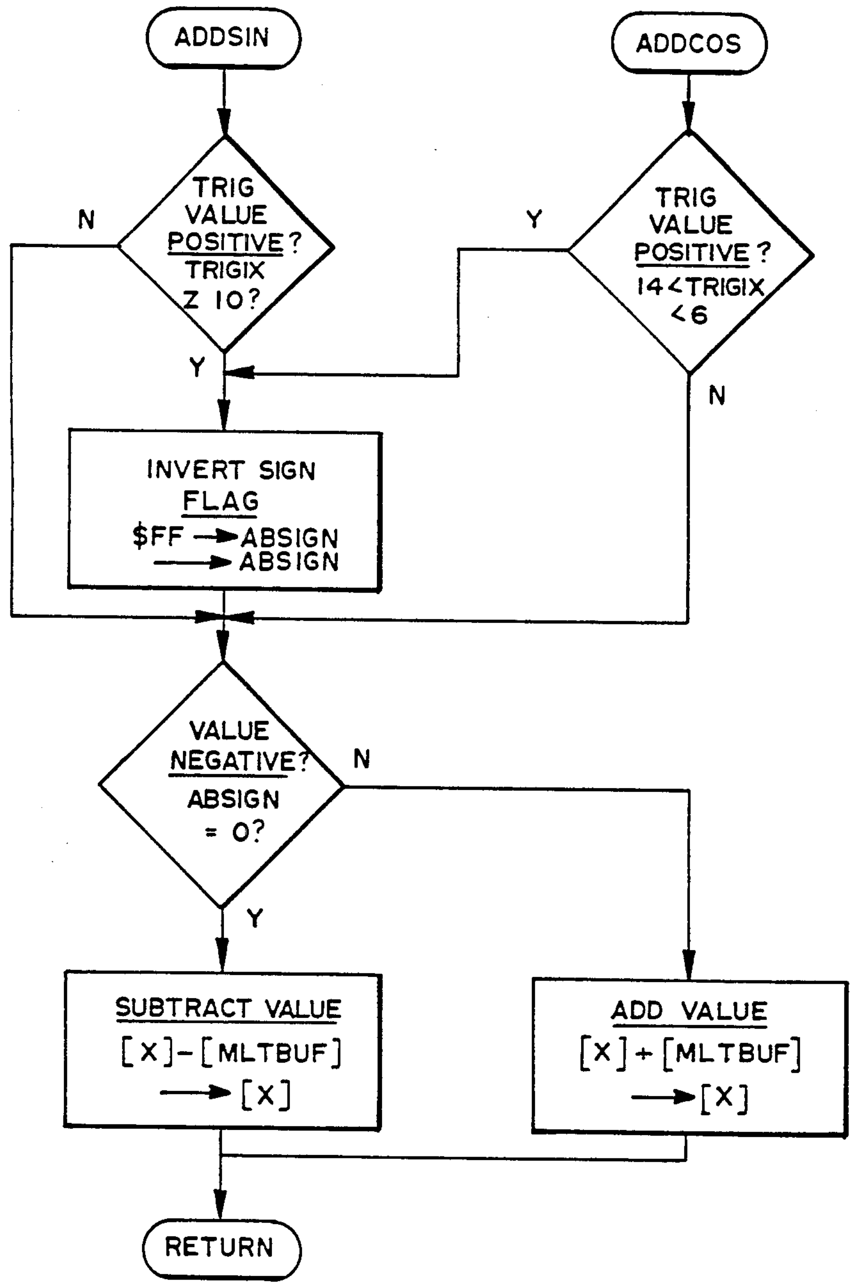

CALLS: HULT, Local subroutines: ABSVAL, ADDCOS/ADDSIN—FIGS. 47 & 48

EXCEPTION CONDITIONS: None.

DESCRIPTION:

SUMS calls ABSVAL to move the absolute value of the analog value to the multiply buffer, moves the trig value to the buffer, and calls MULT to perform the multiplication. ADDCOS or ADDSIN is called to add the product to the appropriate sum buffer. This cycle is repeated for the sine and cosine values for both voltage and current.

Figure 49:
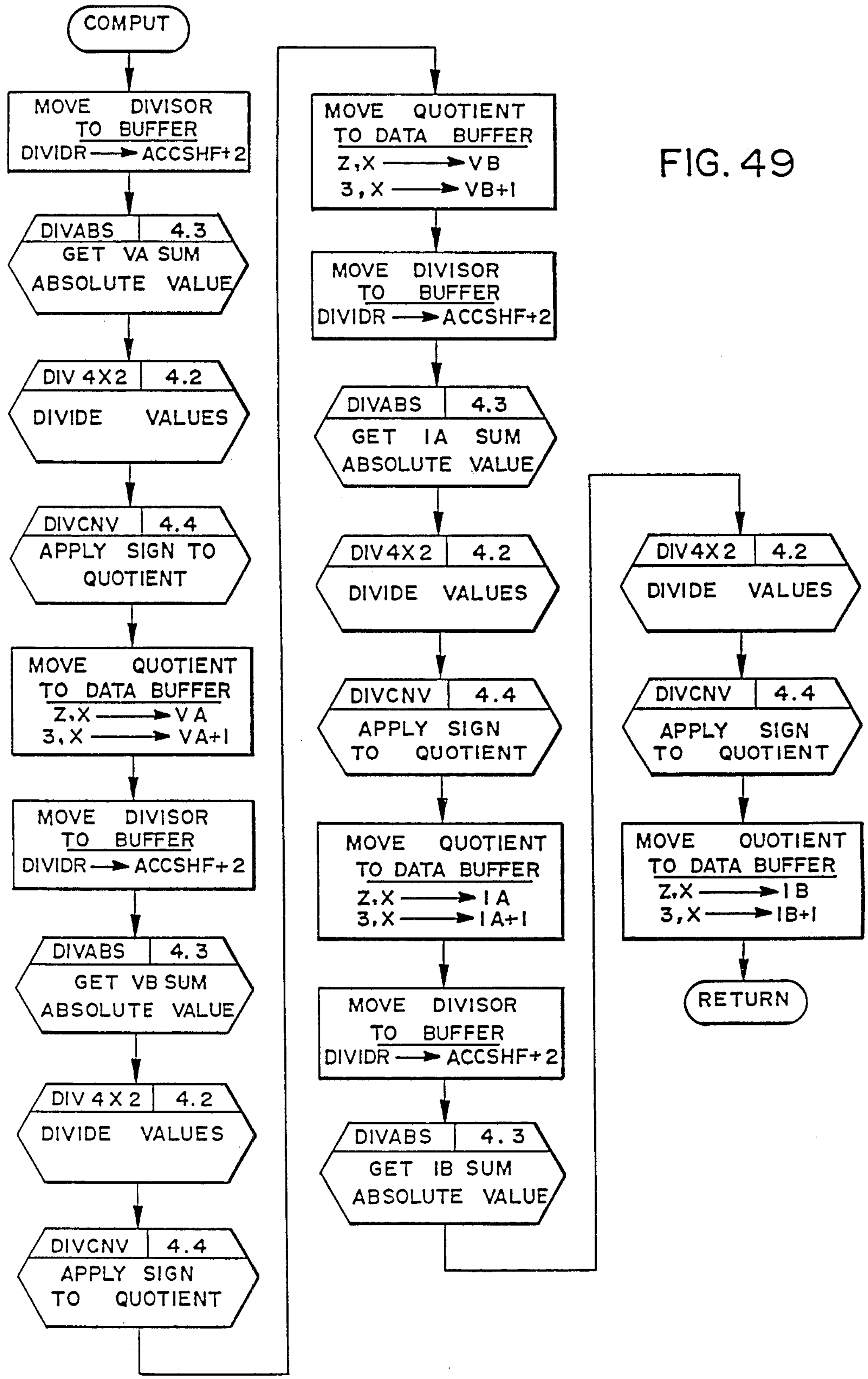

Perform Data Manipulations (COMPUT) FIG. 49

PURPOSE: COMPUT performs necessary scaling functions.

ENTRY POINT: COMPUT

CALLING SEQUENCE:

JSR COMPUT

Return

REGISTER STATUS: A, X not preserved.

TABLES USED: None.

CALLED BY: MAIN

CALLS: DIVABS, DiV4X2, DIVCNV

EXCEPTION CONDITIONS: None.

DESCRIPTION:

COMPUT moves the scale factor to the divide buffer, calls DIVABS to move the absolute value of the fourier sum to the buffer, and calls DIV4X2 to perform the division. DIVCNV is called to apply the proper sign to the quotient, and the value is moved to the data buffer. This cycle is repeated for each of the four fourier sums, and a return is executed.

Figure 50:
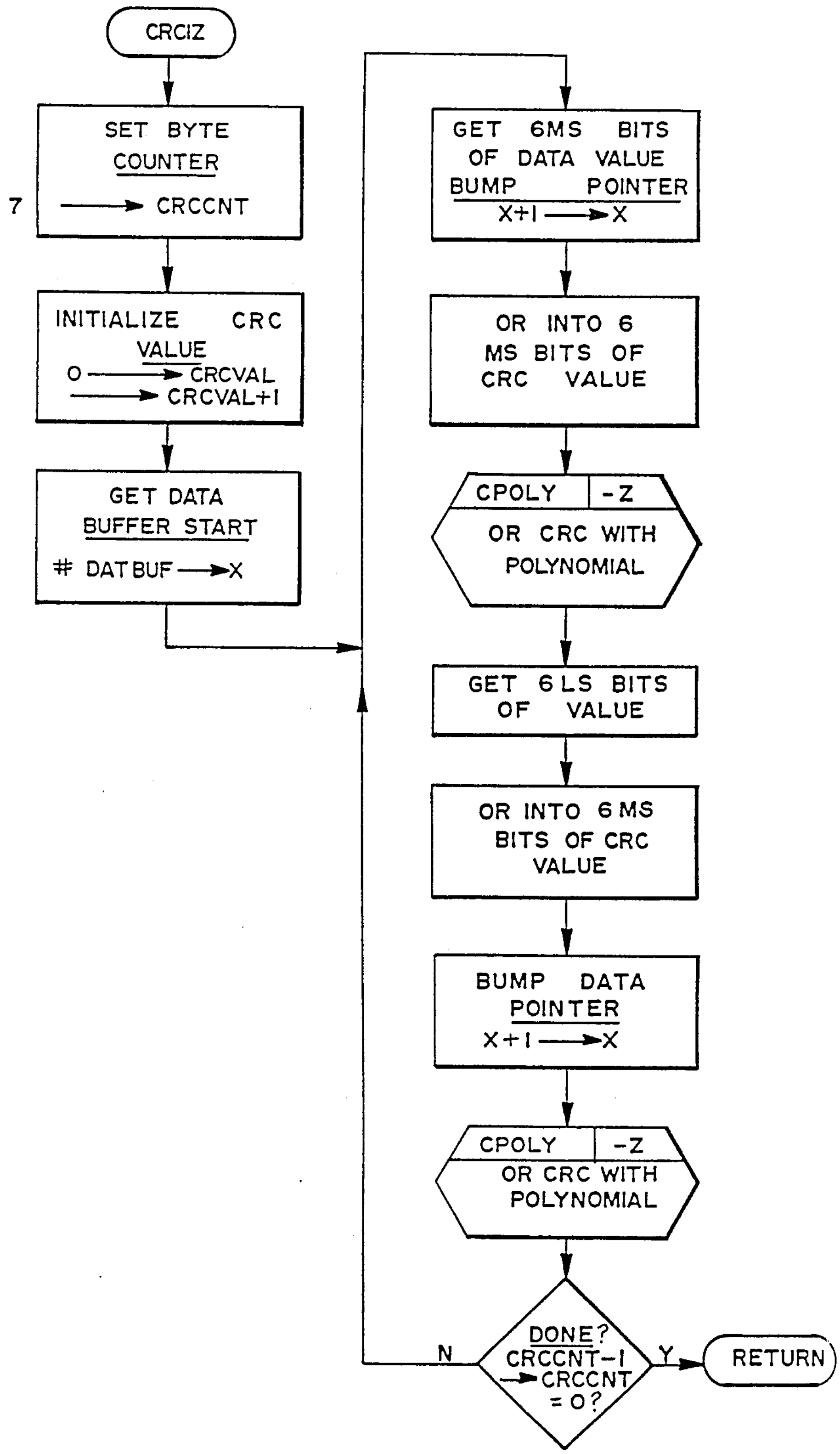

Compute Cyclic Redundancy Check Value (CRC12) FIG. 50

PURPOSE: CRC12 computes the CRC value.

ENTRY POINT: CRC12

CALLING SEQUENCE:

JSR CRC12

Return

REGISTER STATUS: A, X not preserved.

TABLES USED: None.

CALLED BY: MAIN

Figure 51:
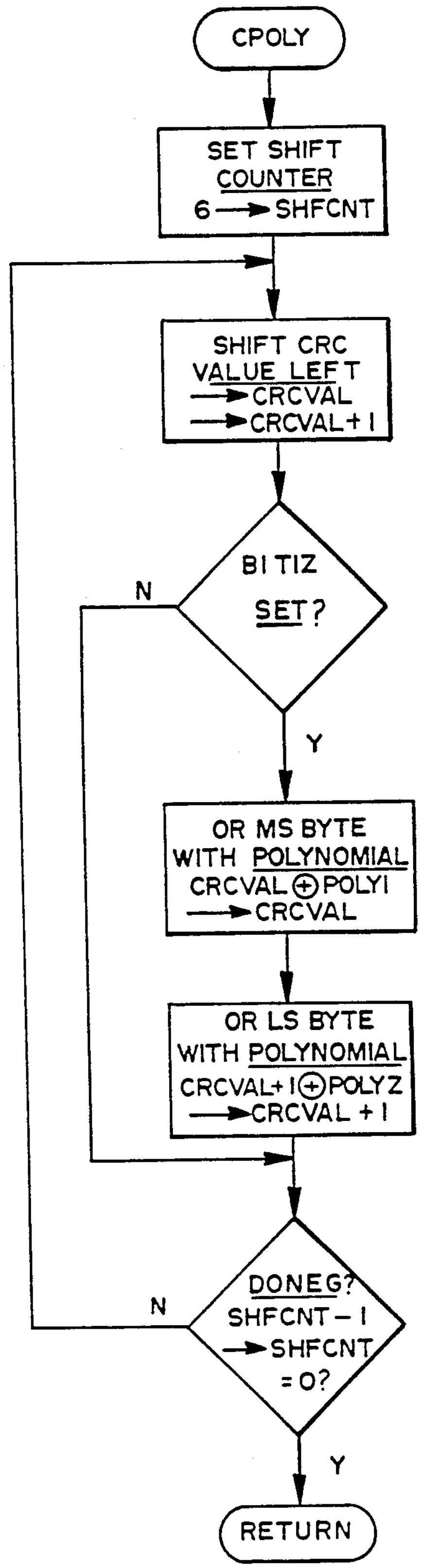

CALLS: Local Subroutine: CPOLY—FIG. 51

EXCEPTION CONDITIONS: None.

DESCRIPTION:

CRC12 sets a counter to the number of bytes in the data buffer, initializes the CRC value, and gets the data buffer start address. Each 6 bit group of data is exclusively "or" ed into the CRC value, and CPOLY is called to "or" the resulting value with the polynomial value. When all bits have been processed, a return is executed.

CPOLY sets a shift counter for 6 bits. The CRC value is shifted left one bit. If the bit shifted out is a one, the CRC value is exclusively "or" ed with the polynomial value. When 6 bits have been shifted, a return is executed.

Figure 52:
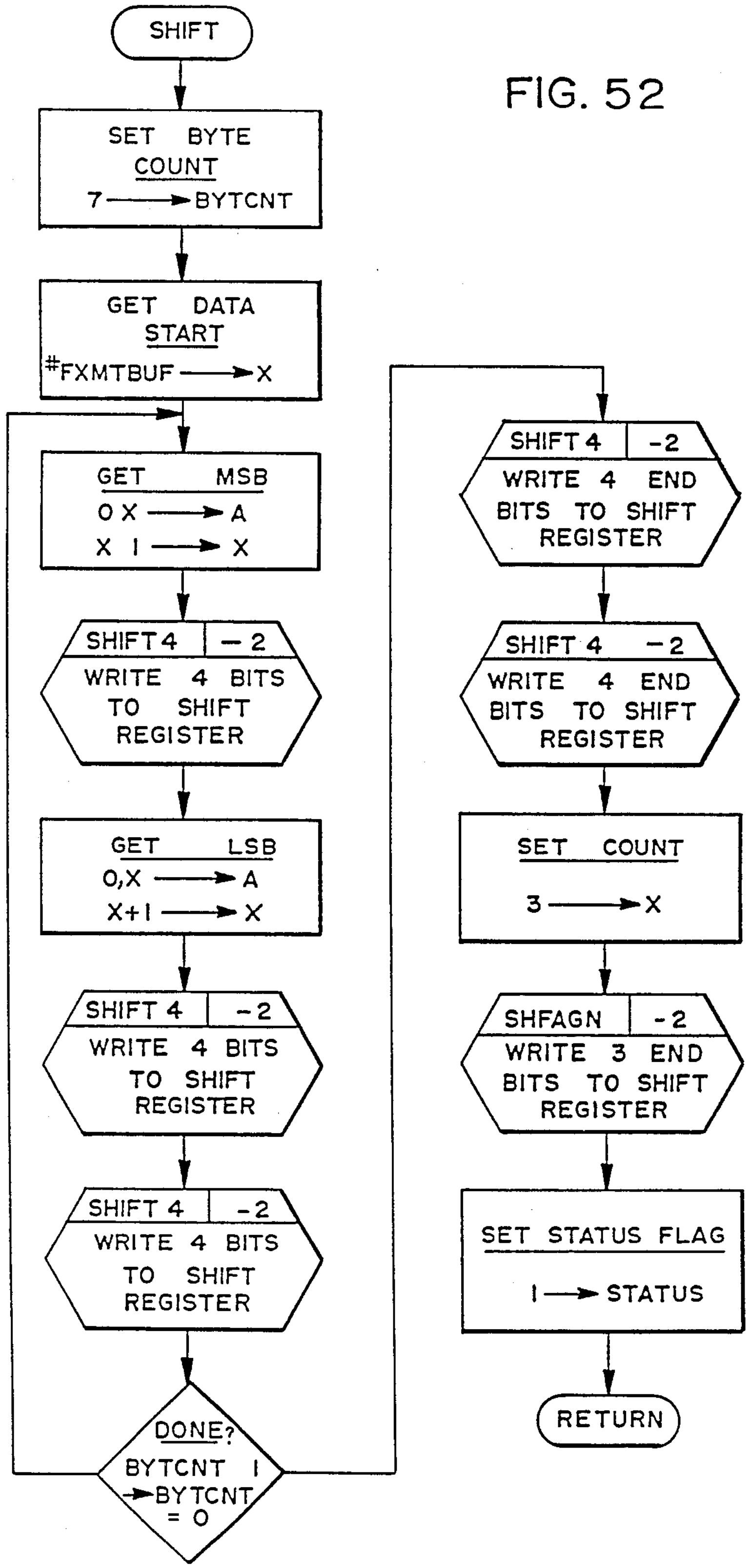

Load Shift Register (SHIFT) FIG. 52

PURPOSE: SHIFT loads the shift register with the data to be transmitted.

ENTRY POINT: SHIFT

CALLING SEQUENCE:

JSR SHIFT

Return

REGISTER STATUS: A, X not preserved.

TABLES USED: None.

CALLED BY: MAIN

Figure 53:
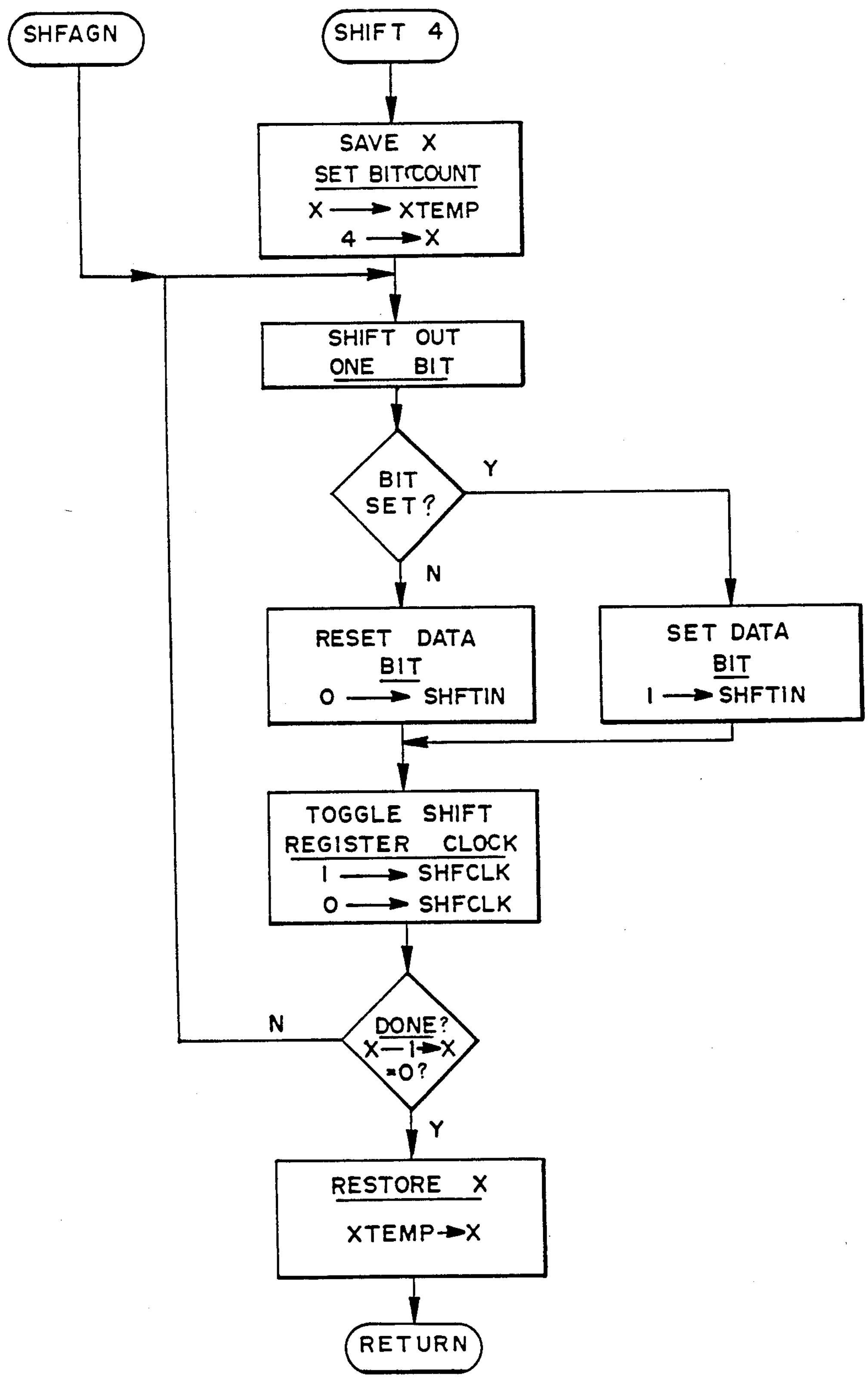

CALLS: Local Subroutine: SHIFT4/SHFAGN—FIG. 53

EXCEPTION CONDITIONS: None.

DESCRIPTION:

SHIFT calls SHIFT4 successively to shift four bits of data at a time into the shift register, starting with the most significant bit. When all twelve-bit values have been shifted in, SHIFT4 and SHFAGN are called to fill the shift register with trailing zeroes and a return is executed.

SHIFT4 shifts the four data bits in A(0–3) into the hardware shift register by setting/resetting the data bit and toggling the register clock bit. When four bits have been shifted, a return is executed.

SHFAGN is a special entry to SHIFT4 which allows the desired bit count (1–4) to be passed in X.

Figure 54:
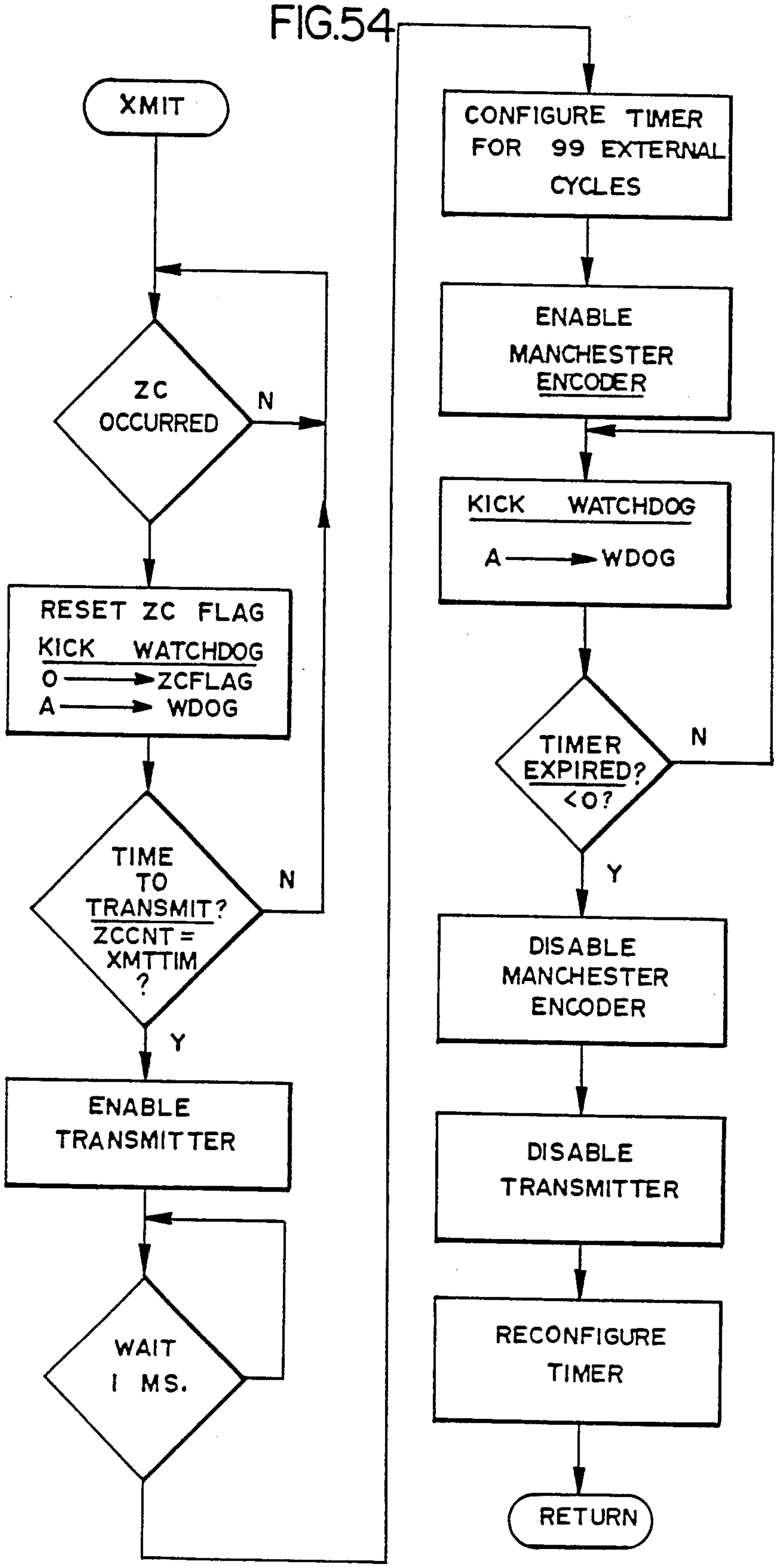

Transmit Data (XMIT) FIG. 54

PURPOSE: XMIT transmits the contents of the shift register to the ground station.

ENTRY POINT: XMIT

CALLING SEQUENCE:

JSR XMIT

Return

REGISTER STATUS: A, X not preserved.

TABLES USED: None.

CALLED BY: MAIN

CALLS: None.

EXCEPTION CONDITIONS: None.

DESCRIPTION:

XMIT monitors the zero-crossing count. When the count reaches the timed-to-transmit count, the transmitter is enabled, and a one millisecond warmup delay is executed. The processor clock is initialized for external oscillator, and the clock value is set to the bit count plus shut-off delay. The Manchester encoder is enabled and the watchdog timer is kicked while monitoring the clock. When all data has been sent (clock=0), the Manchester encoder and transmitter are disabled, the timer is reconfigured for its internal oscillator, and a return is executed.

Figure 55:
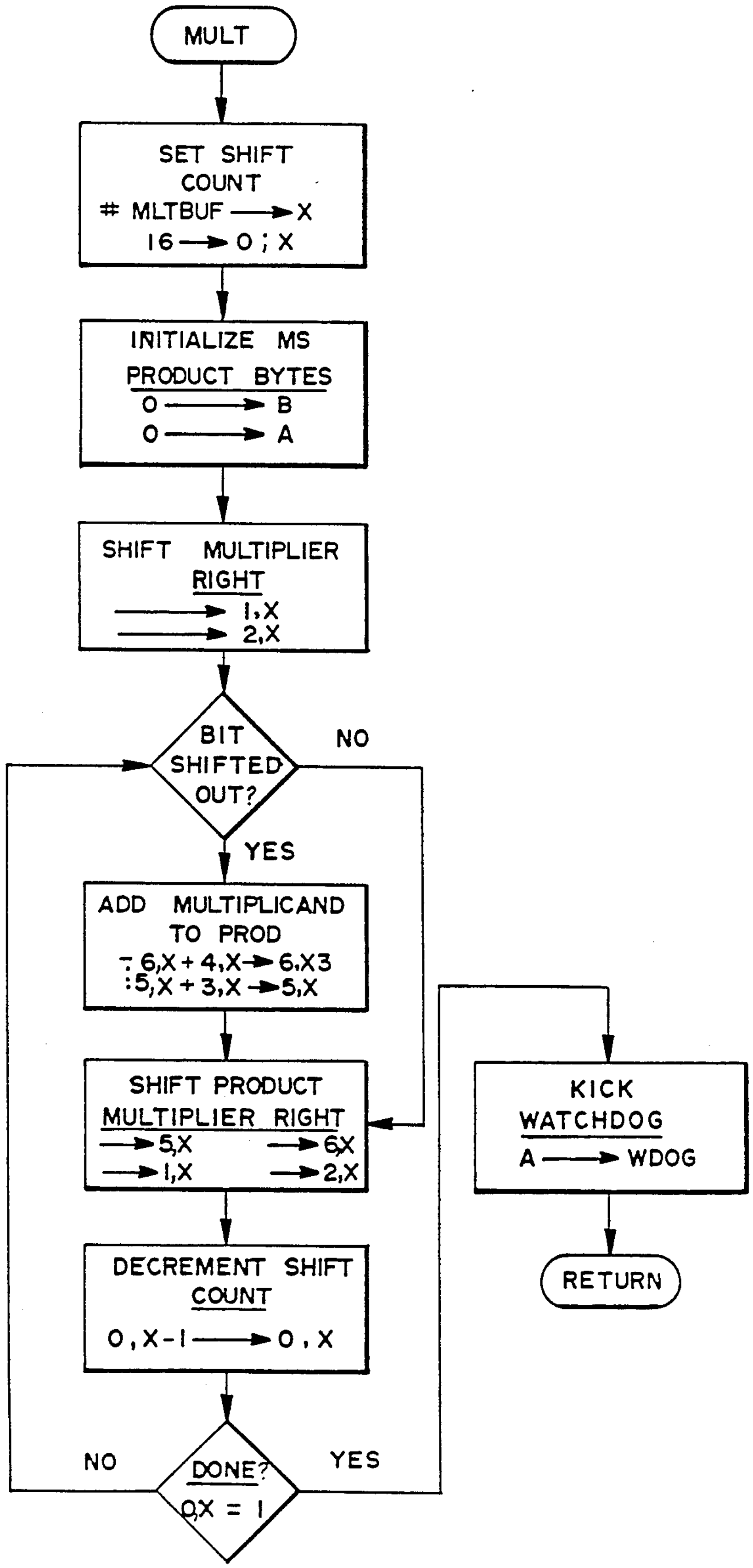

Double Precision Multiply (MULT) FIG. 55

PURPOSE: MULT performs a double precision multiply.

ENTRY POINT: MULT

CALLING SEQUENCE:

MLTBUF+1,2=Multiplier

MLTBUF+3,4=Multiplicand

JSR MULT2

Return

MLTBUF+5,6,1,2=Product

REGISTER STATUS: A, X not preserved.

TABLES USED: None

CALLED BY: COMPUT, SUMS

CALLS: None

EXCEPTION CONDITIONS: None

DESCRIPTION: MULT performs a double precision multiplication by shifting a bit out of the multiplier, successively adding the multiplicand to the product, and shifting the product. When finished, the watchdog timer is kicked, and a return is executed.

Figure 56:
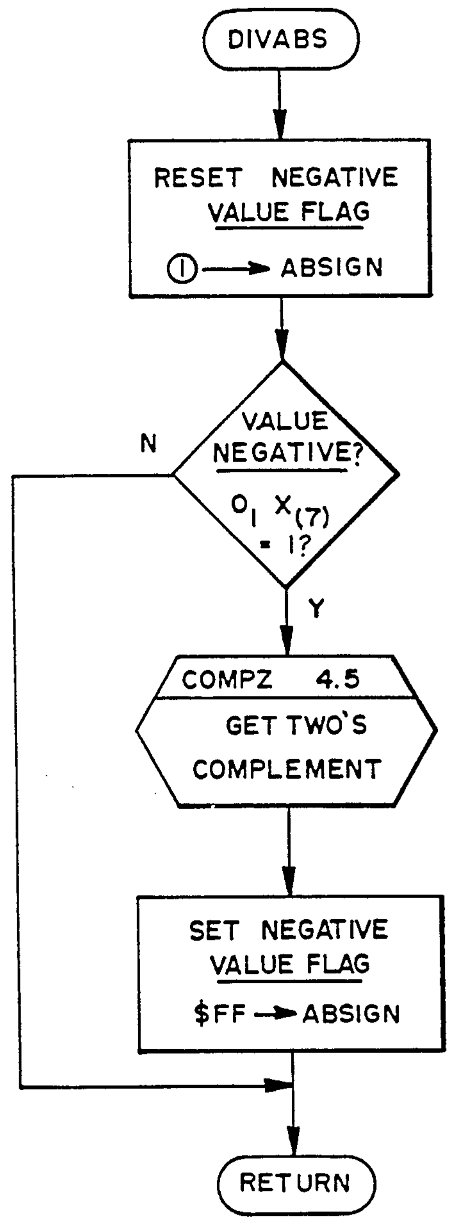

Get Absolute Valve (DIVABS) FIG. 56

PURPOSE: DIVABS gets the absolute value of the value at X and sets the sign flag.

ENTRY POINT: DIVABS

CALLING SEQUENCE:

X=Value Address

JSR DIVABS

Return

ABSIGN=Sign flag ($FF=Negative)

REGISTER STATUS: X is preserved.

TABLES USED: None.

CALLED BY: COMPUT

CALLS: COMP2

EXCEPTION CONDITIONS: None.

DESCRIPTION:

DIVABS resets the sign flag and tests the most significant bit of the value at X. If set, COMP2 is called to find the two's complement of the four byte value, and the sign flag is set to $FF. A return is then executed.

Figure 57:
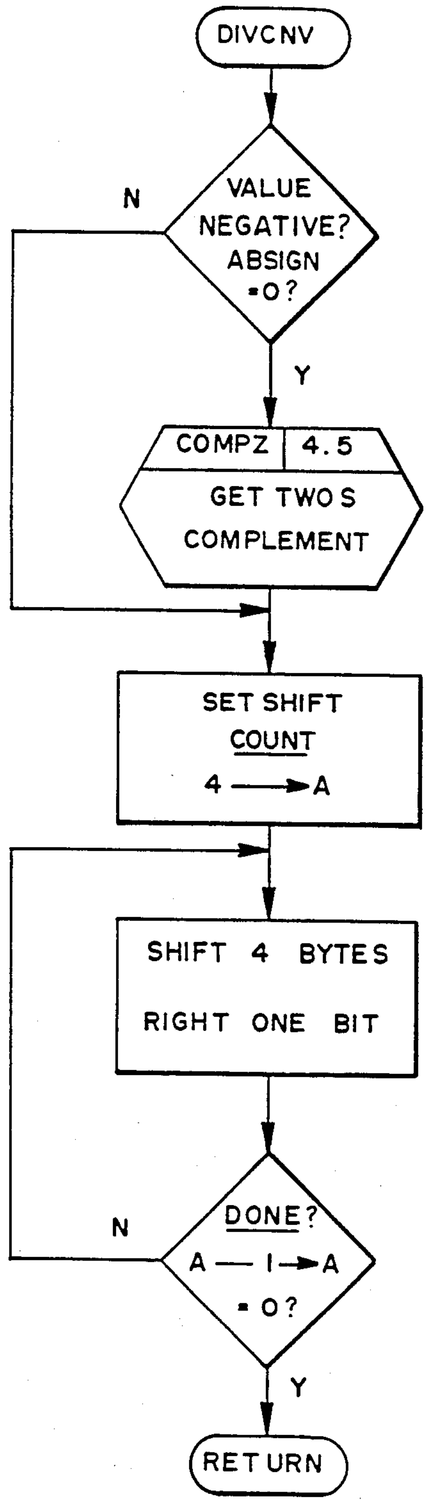

Convert Scaled Value (DIVCNV) FIG. 57

PURPOSE: DIVCNV applies the sign and divides the value by sixteen.

ENTRY POINT: DIVCNV

CALLING SEQUENCE:

X=Value Address

JSR DIVCNV

Return

REGISTER STATUS: A, X not preserved.

TABLES USED: None.

CALLED BY: COMPUT

CALLS: COMP2

EXCEPTION CONDITIONS: None.

DESCRIPTION:

DIVCNV tests the signal flag, ABSIGN. If non-zero, COMP2 is called to find the two's complement of the four byte value at X. The value is then shifted right four bits, and a return is executed.

Figure 58:
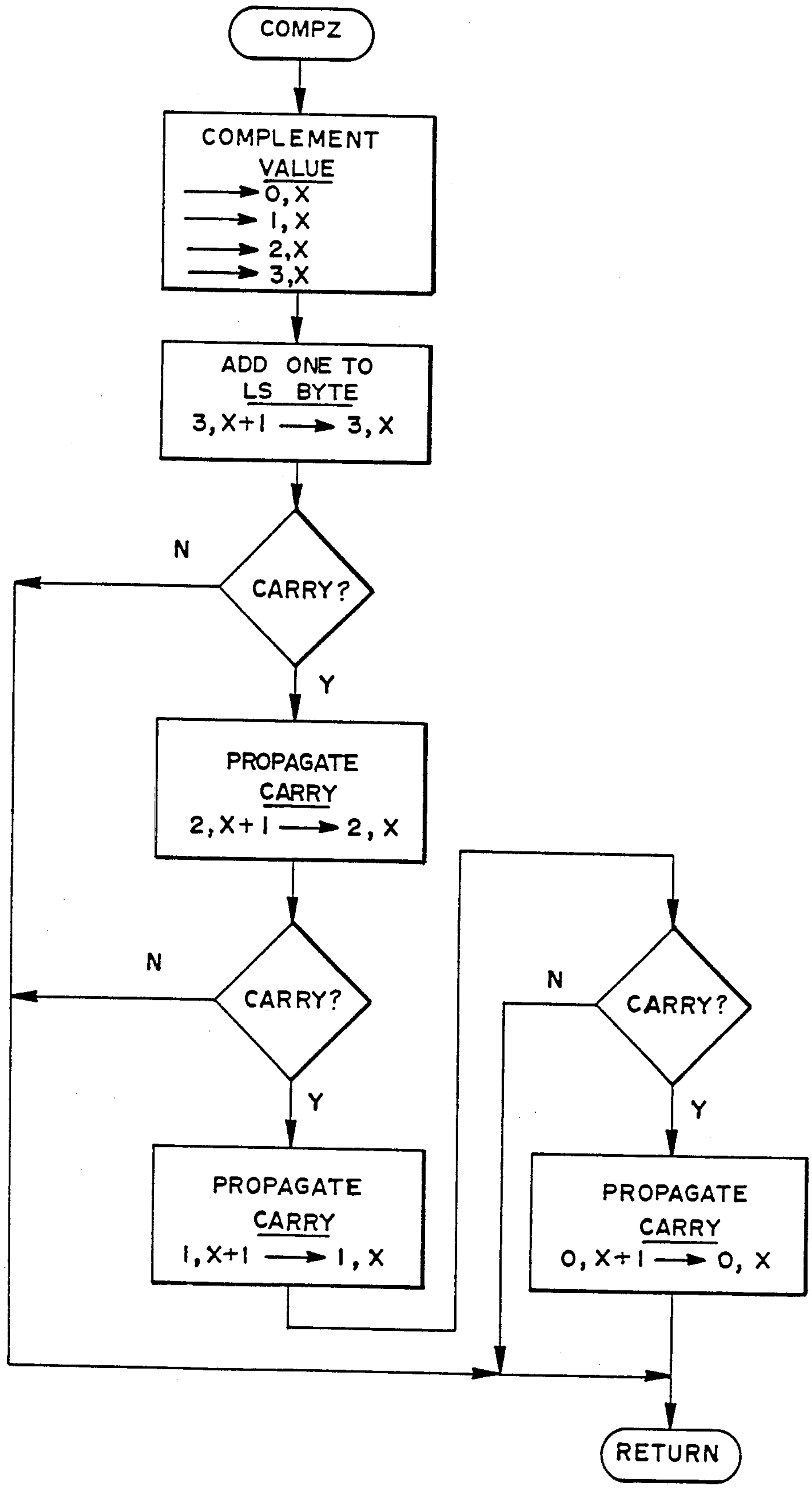

Find Two's Complement Value (COMP2) FIG. 58

PURPOSE: COMP2 finds the two's complement value of the value at X.

ENTRY POINT: COMP2

CALLING SEQUENCE:

X=Value Address

JSR COMP2

Return

REGISTER STATUS: X is Preserved.

TABLES USED: None.

CALLED BY: DIVABS, DIVCNV

CALLS: None.

EXCEPTION CONDITIONS: None.

DESCRIPTION:

COMP2 complements each byte of the four byte value at X, adds one to the least significant byte, and propagates the carry through the remaining bytes.

Figure 59:
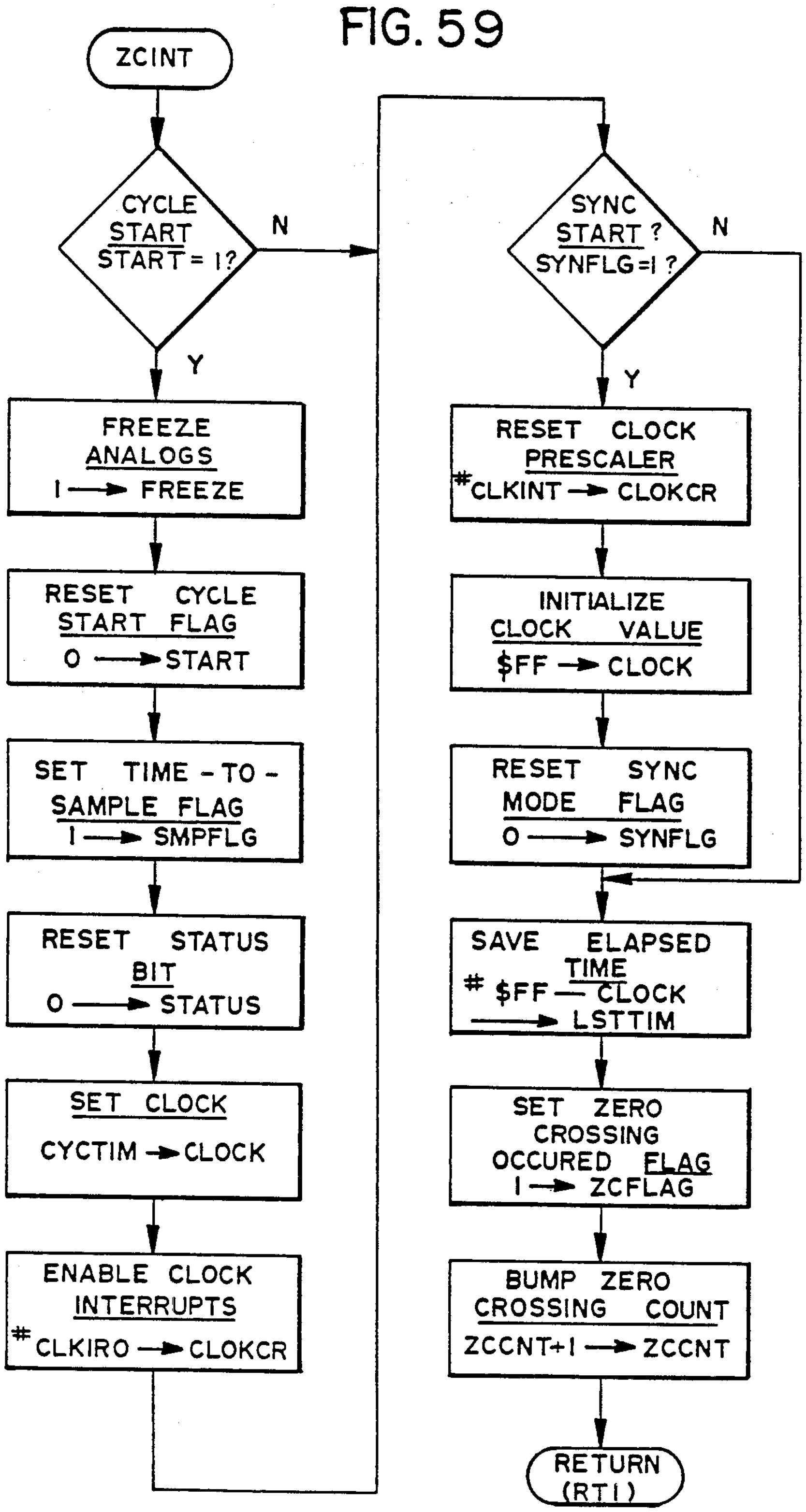

Process Zero Crossing Interrupts (ZCINT) FIG. 59

PURPOSE: ZCINT processes zero crossing interrupts.

ENTRY POINT: ZCINT

CALLING SEQUENCE:

From IRQ Vector

Return (RTI)

REGISTER STATUS: A, X are preserved.

TABLES USED: None.

CALLED BY: Hardware IRQ Vector

CALLS: None.

EXCEPTION CONDITIONS: None.

DESCRIPTION:

ZCINT tests the cycle start flag. If set, the analog tracking register is frozen, the cycle start flag is reset, the time-to-sample flag is set, and the clock is set to the 1-1/9 cycle time.

If the start synchronize flag is set, the clock prescaler is reset, the clock is reset to maximum value, and the start synchronize flag is reset.

The elapsed clock time is saved as the last cycle time, the zero-crossing-occurred flag is set, the zero-crossing count is bumped, and a return is executed.

Figure 60:
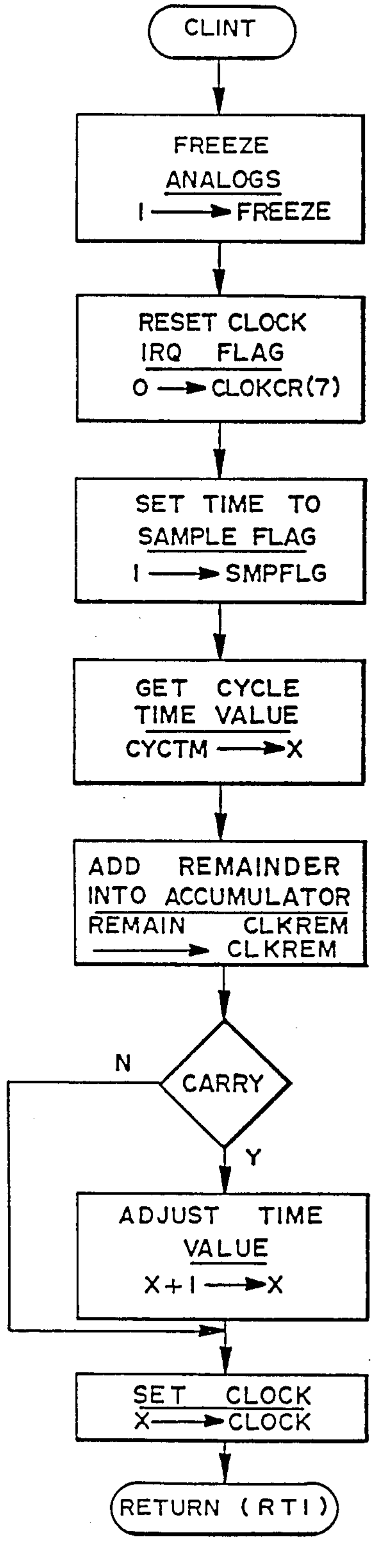

Process Clock Interrupt (CLINT) FIG. 60

PURPOSE: CLINT processes clock interrupts.

ENTRY POINT: CLINT

CALLING SEQUENCE:

From IRQ Vector

Return (RIT)

REGISTER STATUS: A, X are preserved.

TABLES USED: None.

CALLED BY: Hardware Clock IRQ Vector

CALLS: None.

EXCEPTION CONDITIONS: None.

DESCRIPTION:

CLINT freezes the analog tracking register, resets the clock IRQ flag, and sets the time-to-sample flag. The cycle time remainder value is added into the time accumulator. If a carry results, the 1-1/9 cycle time is increased by one. The clock is reset to the cycle time, and a return is executed.

Figure 61:
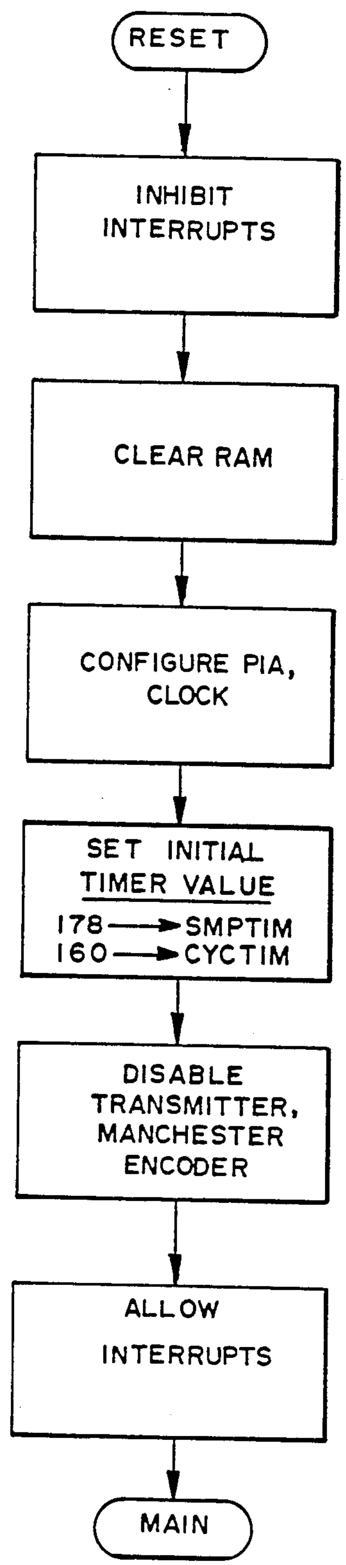

Perform Power-On Reset (RESET) FIG. 61

PURPOSE: RESET performs power-on initialization.

ENTRY POINT: RESET

CALLING SEQUENCE:

From Hardware Reset Vector

JMP MAIN

REGISTER STATUS: A, X not preserved.

TABLES USED: None.

CALLED BY: Hardware Reset Vector

CALLS: MAIN

EXCEPTION CONDITIONS: None.

DESCRIPTION:

RESET inhibits interrupts, clears RAM to zeroes, and initializes the internal clock and PIA's. The initial time values are initialized, and the Manchester encoder and transmitter are disabled. Interrupts are reallowed, and a jump to the background processing loop is executed.

The Receiver

The receiver 24 at a substation 34 as shown in FIG. 4 receives data from fifteen donuts.

Figure 62:
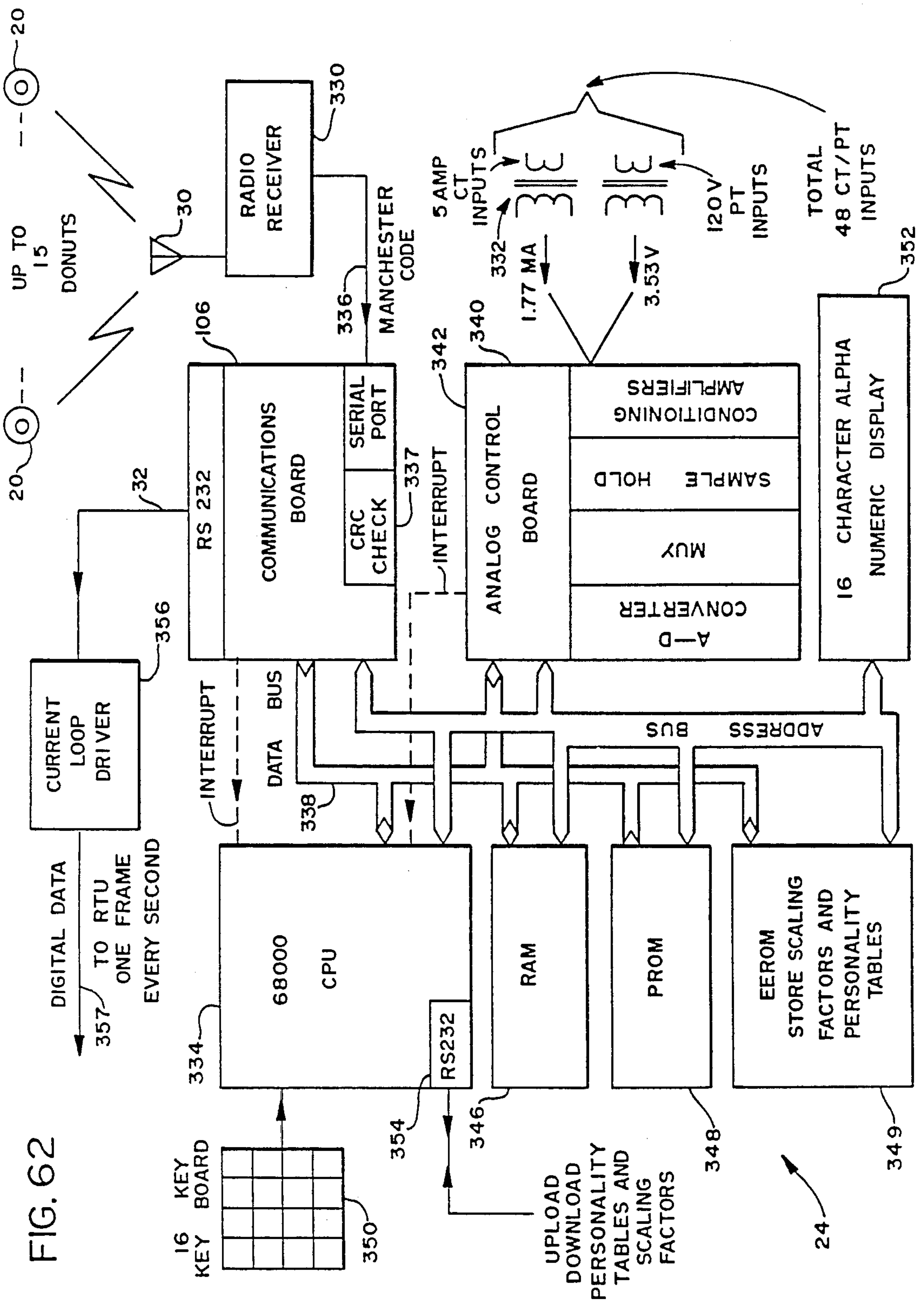
FIG. 62 is an overall block diagram of a ground station receiver remote terminal interface according to the invention.

In FIG. 62 there is shown an overall circuit block diagram for such a receiver 24.

In addition to receiving transmissions from up to fifteen donuts 20, via its antenna 30 and radio receiver 330, the receiver 24 can also receive analog data from up to 48 current transformers and potential transformers generally indicated at 332. The receiver 24 is operated by a type 68000 Central Processing Unit 334. The Manchester coded transmissions from the donuts 20 received by the receiver 330 are transmitted via line 336 to a communication board 106 and thence on data bus 338 to the 68000 CPU 334. The transformer inputs 332 are conditioned in analog board 340 comprising conditioning amplifiers, sample and hold, multiplexing and analog-to-digital conversion circuits under control of analog control board 342. The digitized data is supplied on data bus 338 to the CPU 334. The CPU 334 is provided with a random access memory 346, a programmable read only memory 348 for storing its program, and an electrically erasable read only memory 349 for storing the scaling factors and personality tables.

The central processing unit 334 may be provided with a keyboard 350 and a 16 character single line display 352. It is also provided with an RS232 port 354 for loading and unloading so called personality tables comprising scaling factors and the like for the donuts 20 and the transformer inputs 332. The receiver 24 which is sometimes called herein a remote terminal unit interface, supplies data to a remote terminal unit via current loop 356 from an RS232 communications port on communications board 106.

The Receiver Software

Copyright © 1983,
Product Development Services, Incorporated (PDS)

Functional Specification of the Receiver

Figure 5:
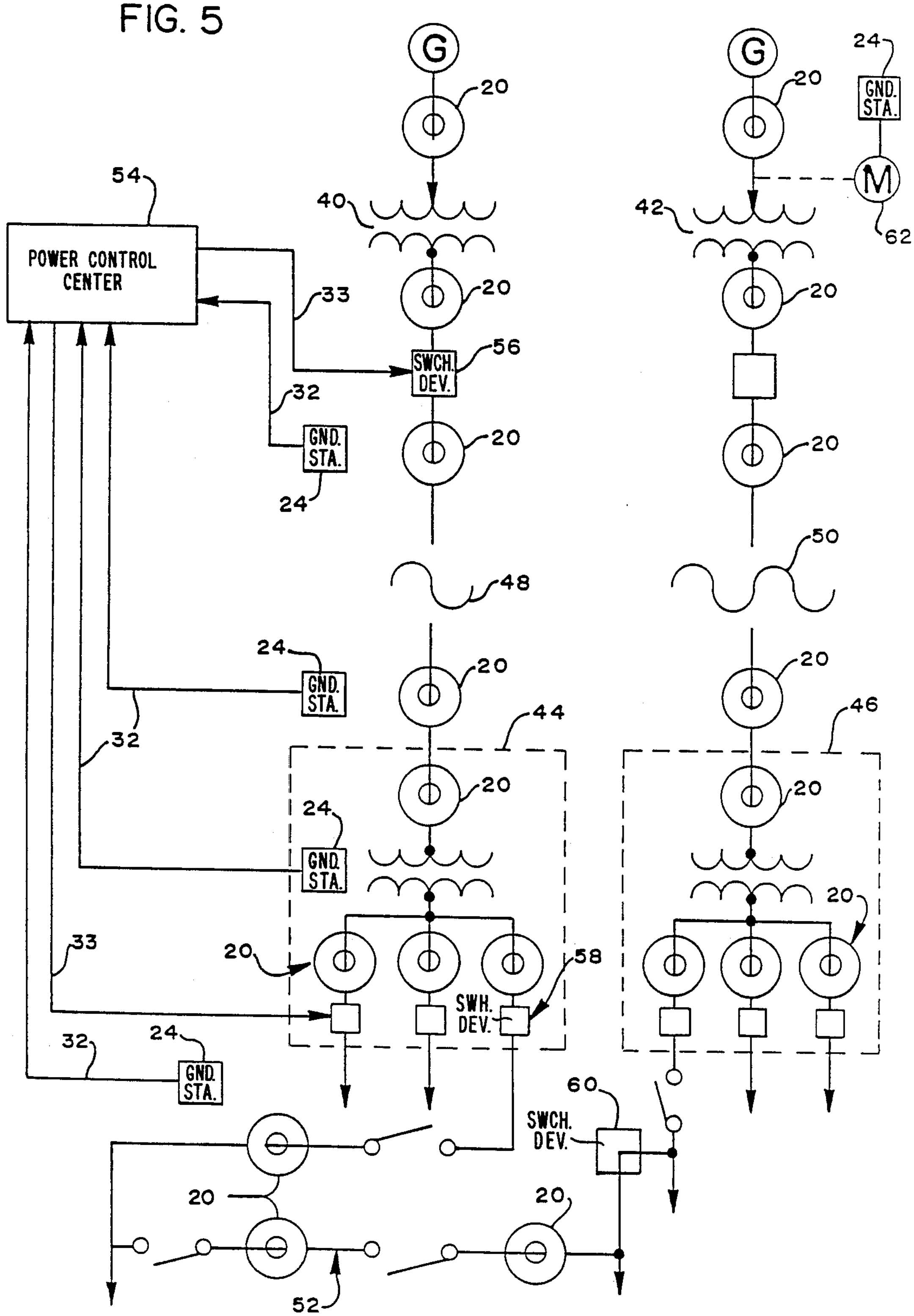
FIG. 5 is a diagrammatic schematic view of a power deliver system monitored and controlled according to the system of the invention.

The remote terminal unit may be a Moore MPS-9000-S manufactured by Moore Systems, Inc., 1730 Technology Drive, San Jose, Calif. 95110, modified to receive and store a table of digital data each second sent on line 357. Unmodified, the MPS-900-S receives inputs from potential and current transformers, temperature sensors and the like at a substation, and converts these measurements to a digital table for transmission to a power control center 54 (FIG. 5) or for use in local substation control.

Simultaneous transmissions from two or more donuts 20 are ignored since the garbled message received will not produce a check sum (CRC) that matches the check sum as received. The CRC check portion of the circuit is shown at 337.

Overview:

An integral part of commercial power generation is monitoring the amount of power delivered to customers and, if necessary, purchase of power from other companies during peak demand periods. It is advantageous to the power company to be able to make measurements at remote substations, and be able to relay all the measurements to a central point for monitoring. Because of the large voltages and currents involved in commercial power distribution, direct measurement is not feasible. Instead, these values are scaled down to easily measured values through the use of Potential Transformers (PT's) for voltage, and Current Transformers (CT's) for current. Recently, we have developed another means for monitoring power line voltage and current. This is the Remote Line Monitor, a donut shaped (hence the nickname "donut") device which clamps around the power line itself, and transmits the measured values to a radio receiver on the ground.

The Remote Terminal Interface (RTI) monitors power line voltage, current, and temperature by means of Potential Transformers (PT's), Current Transformers (CT's), and temperature transducers respectively. These parameters may also be obtained from Remote Line Monitors, or "donuts" which are attached to the power lines themselves. It is the job of the RTI to receive this data, and in the case of PT's, CT's and temperature transducers, digitize and analyze the data. This data is then used to calculate desired output parameters which include voltage, current, temperature, frequency, kilowatt hours, watts, va, and vars, (the last three being measures of power). These values are then sent to the Remote Terminal Unit (RTU), and are updated once per second.

Data obtained from PT's, CT's, and temperature transducers must be digitized by the RTI before it can be used. Data obtained in this way is termed "analog" data. Donuts, on the other hand, send their data to the RTI in digital form. For this reason, input received from donuts is said to be "digital" input. Each donut supplies three parameters, (voltage, current, and temperature) thus it is equivalent to three analog inputs.

Virtually all commercial power systems in the United States today are three phase systems. There are two configurations used: the 3 conductor or delta configuration, and the 4 conductor or wye configuration. To calculate power (va, vars) it is necessary to measure the voltage and current in all but one of the conductors. That one conductor is used as a reference point for all voltages measured. For a delta configuration, voltage and current in. two of the three conductors must be measured (only two phases). This is referred to as the two wattmeter method. It is desirable to use the two wattmeter method whenever possible because only 2 PT's and CT's are required. For a wye configuration however, voltage and current must be measured in all 3 phases. (The fourth conductor is an explicit reference point. No such reference is provided in the delta configuration, so one of the phases must be used instead.) This latter method is known as the three wattmeter method.

The program listings for the receiver remote terminal interface are found in Appendix B. They comprise a number of subroutines on separately numbered sets of pages. The subroutines are in alphabetical order in Appendix B. At the top of page 1 of each subroutine the name of the subroutine is given, (e.g., ACIA at the top of the first page of Appendix B). The routine INIT initializes the computer and begins all tasks.

Appendix C comprises equates and macro definitions used in the system. Those headed STCEQU are for the system timing controller (an AM9513 chip). Those headed XECEQU are for the Executive program EXEC in Appendix B. Those headed RTIEQU are unique to the remote terminal interface and used throughout the programs of Appendix B.

GENERAL

Accuracy:

All calculations will be performed to 5 significant digits, representing an accuracy of 0.01% of full scale.

Input ranges:

Analog voltages and currents will be digitized to a 12 bit bipolar value ranging from −2048 to 2047.

Analog temperature will also be digitized to a 12 bit value which may or may not be bipolar.

All incoming digital data will be 12 bit values ranging from −2048 to 2047.

Number of inputs/outputs:

There shall be no more than 48 analog inputs and 15 digital inputs, and no more than 64 outputs. The analog inputs may monitor no more than 5 separate groups. (A group is defined as a circuit whose voltage is used for the frequency reference and power calculations) The donuts may be used to monitor a maximum of 5 additional groups.

Digital inputs:

Digital inputs, if used, will be supplied by 'donuts', (see donut documentation)

Scaling Ranges:

1. Range of donut scaling factors will be from 0.5 to 2. In addition, the temperature value may also have an offset from −1024 to +1023 added to it.
2. Each PT has a scaling factor associated with it. This factor may range from 0.5 to 2.0.
3. Each CT has four scaling factors associated with it. These factors may each range from 0.5 to 2.0.

GENERAL

Accuracy:

All calculations will be performed to 5 significant digits, representing an accuracy of 0.01% of full scale.

Input ranges:

Analog voltages and currents will be digitized to a 12 bit bipolar value ranging from −2048 to 2047.

Analog temperature will also be digitized to a 12 bit value which may or may not be bipolar.

All incoming digital data will be 12 bit values ranging from −2048 to 2047.

Number of inputs/outputs:

There shall be no more than 48 analog inputs and 15 digital inputs, and no more than 64 outputs. The analog inputs may monitor no more than 5 separate groups. (A group is defined as a circuit whose voltage is used for the frequency reference and power calculations) The donuts may be used to monitor a maximum of 5 additional groups.

Digital inputs:

Digital inputs, if used, will be supplied by 'donuts'. (see donut documentation)

Scaling Ranges:

1. Range of donut scaling factors will be from 0.5 to 2. In addition, the temperature value may also have an offset from −1024 to +1023 added to it.
2. Each PT has a scaling factor associated with it. This factor may range from 0.5 to 2.0.
3. Each CT has four scaling factors associated with it. These factors may each range from 0.5 to 2.0.

Data Acquisition:

A. Analog data input:

Analog data can come from three sources: Potential Transformers, (PT's), Current Transformers (CT's), or temperature transducers. The order of sampling will be determined by the outputs desired. (see Data Output) For voltage and current, 9 equally spaced samples must be taken over the space of a power line voltage cycle for the purposes of data analysis. (see Data Processing). For each voltage group (maximum of 5), a timer must be maintained to provide proper sampling intervals. This timer will be checked each sampling period and adjusted if necessary. The first phase of the voltage sampled will be used as the reference for checking the sampling period timer.

The input task knows it may begin sampling for a given group of inputs (cluster) when all of the input buffers connected with it are ready for input. The necessary data is collected from the A/D converter, and stored in the appropriate input buffer. When this sampling is complete, the buffer is marked as unavailable for further input, and made available for Fourier analysis. The sampling timer is then adjusted if necessary, and the input task then proceeds to the next group of buffers in the Input Sequence Table.

B. Digital Input:

Input from the 'donuts' (if used) is already digitized and analyzed. It is only necessary to apply a scaling factor (unique for each parameter from each donut) to the data, and convert it to 2's complement form. After this has been done, the data is in a suitable form to calculate output data.

Donut input is not solicited, but rather is transmitted in a continuous stream to the RTI. When data is received from a donut, the processor is interrupted. The incoming data is then collected in a local buffer until a full message from a donut is received and validated. If the data is not valid, the transmission is ignored, and normal processing continues. If the buffer has already received valid input data for this sampling period, the transmission is ignored. Otherwise, the new data is moved from the receive buffer into the appropriate data buffer, the age count is cleared, is marked as waiting to be processed, and is made available for effective value calculations.

C. Analog Input Error Detection/Action:

None.

D. Digital Input Error Detection/Action:

A Cyclical Redundancy Check (CRC) word will be provided at the end of each donut transmission. If the CRC fails, the last good data transmitted by that particular donut will be reused. If the output task references the buffer before new data comes in, the old data will be reused. If a donut should fail more than N (to be defined) consecutive times, that donut will be considered to be bad, and its data will be reset to zero.

Data Processing

Analog data must be subjected to Fourier transformation to extract the sine and cosine components of the voltage and current prior to calculating output values. Also, if the input was a voltage, the sine and cosine components must be scaled by a factor between 0.5 and 2.0. This scaling factor is found in the Input Personality Table, and is unique to each input. If the input was a current, the effective value and the Fourier components must be scaled by one of four factors ranging between 0.5 and 2.0. The scale factor used is dependent on the raw value of the effective current (Ieff). Each current input has a unique set of four factors. These may also be found in the Input Personality Table.

The purpose of Fourier transformation is to extract the peak sine and cosine components of an input waveform. These components are then used to calculate the amplitude (effective value) of the waveform. For this application, we are only concerned with the components of the fundamental (60 Hz) line frequency.

If the buffer is an analog input buffer, then the 9 samples are analyzed, yielding the sine and cosine components of the fundamental. The effective value of the waveform is then computed and stored in the buffer. The buffer is then marked as being ready for more raw data.

If the buffer is a digital (donut) buffer, then only the effective voltage and current are computed and stored in the buffer. When these calculations are complete, the buffer is marked as being ready for more raw data.

After the data has been appropriately processed, then the output values may be calculated. Parameters that may be calculated are: voltage, current, kilowatt hours, watts, va, and vars. Also, temperature, and frequency may be output. (These are measured, not calculated parameters.)

Error Detection/Action:

None.

Data Output

Output data will be transmitted to the host in serial fashion. Data to be transmitted to the host will be stored in a circular FIFO buffer to be emptied by the transmission routine which will be interrupt driven. All data must be converted to offset binary and formatted before transmission. A new set of output data will be transmitted to the host once per second.

When a buffer is ready to be output, the wattage must be calculated (If it hasn't been already) and stored in the buffer corresponding to the phase 1 of the current involved in the calculation. When the wattage is calculated, the kilowatt hour value is updated also. After calculating power and updating KWH, the output task will calculate the requested output parameter and output it (if the appropriate buffers to perform the calculation are ready). The output task will then proceed to the next entry in the Output Personality Table. When the end of the table is reached, all buffers, both analog and digital, are marked as ready for analysis. In addition, the output task will enable the transmission of the block of data just calculated, and wait until the start of the next one second interval before starting at the top of the table again.

If the second current input specifier in the output table entry is not −1, the parameter will be calculated using the Breaker-and-a-half method. (see glossary)

Error Detection/Action:

If the requested paramater cannot be calculated because the requisite buffers are not yet ready, and the output buffer is empty, we have a fatal error in that we haven't been able to calculate the requisite data in time for transmission. For now we'll just wait until the data does come along.

RTI Monitoring/Programming

The RTI will be supplied with an integral 16 key keypad, and single line (16 column) display. From this keyboard, the user may:

- continuously monitor any particular output value (the display being updated once per second).
- display all diagnostic error counts.
- transmit an upload request to the host thru the auxiliary port.

In addition, the RTI will have the capability to upload/-download any EEPROM based table through the auxiliary port upon request from the host. All programming of the RTI (configuration and scaling factor entry) will be performed through this link. Communications protocols will be defined in the design spec.

Error Detection/Action:

When each table is up/down loaded, a 16 bit CRC word is transmitted with it. Should this CRC check fail on down load, the RTI will request a retransmission and the table in EEPROM will not be updated. On upload, it is the responsibility of the host to request a retransmission.

Initialization

A. Various hardware must be initialized prior to start of operation. Presently defined hardware is:

STC (System Timing Controller). The STC consists of 5 independent timers, any one of which may be selected to generate an interrupt upon timing out. This is used to insure that the analog samples are taken at the proper time. The STC is made by Advanced Micro Devices, and its part number is 9513.

PI/T: Set timer to provide interrupts at one second intervals to signal the start of data transmission to the host.

ACTA 1: Host interface
4800 baud
Odd parity
1 stop bit
8 data bits
Host interface monitor (RCV half of ACIA 1)
ACIA 2: Auxiliary link
To be defined.
Error Detection/Action: None.

B. Software initialization:

The analog and digital buffers must be initialized at startup time. Also at this time, the Input Sequence Table and Cluster Status Masks are built. Finally, the various tasks must be initialized and started.

Equations:

Fourier analysis (voltage and current):

$$Va(\text{cosine component}) = \sum_{S=1}^{9} Vs \times \cos(s \times 40°)/4.5$$

$$Vb(\text{sine component}) = \sum_{S=1}^{9} Vs \times \sin(s \times 40°)/4.5$$

Where s is the sample number.

Note: sin $(s\times40°)/4.5$ and cos $(s\times40°)/4.5$ are constants, and may be stored in a table.

Effective voltage (current):

$$Veff = \sqrt{Va^2 + Vb^2}$$

Temperature: no calculation—the input value is just passed on.

Power:

Watts:

per phase:

$$\text{Watts} = (Vb \times Ib) + (Va \times Ia)$$

Total power: (this applies to Watts, VARS, and VA)

Three phase (wattmeter) method:

$$pwr = (\text{Phase 1 } pwr + \text{Phase 2 } pwr + \text{Phase 3 } pwr)/6144$$

Two phase (wattmeter) method:

$$pwr = (\text{Phase 1 } pwr + \text{Phase 2 } pwr)/4096$$

where pwr may be WATTS, VARS, or VA.

Note: The constants 6144 and 4096 above are included so that full scale voltage and full scale current will yield full scale power. Proper scaling to actual watts, vars, va, or watt-hours will be performed by the host.

VARS:

$$VARS=(Va\times Ib)-(Vb\times Ia) \text{ (per phase)}$$

Total VARS calculated as per total watts above.

VA:

$$VA=Veff\times Ieff$$

Total VA calculated as per total watts above.

Tables

A. Input Personality Table:

This table is EEPROM based, and binds a specific input number to an input type (voltage, current, temperature), group #, phase #, and set of correction factors. This table is of a fixed size and may have no more than 48 entries. Unused entries will have a value of 0. The values in this table will be determined at installation time.

B. Output Personality Table:

The Output Personality Table is an EEPROM based table which defines each of the parameters to be output, and which parameters are necessary to calculate them. The number of entries (up to 64) in the table is unique to the site, and is determined at installation time. The entries are arranged in the order in which they are to be output. There may be no more than 64 entries in this table.

When donuts are used, both voltage and current readings from the selected donut(s) will be used for power (volt-amp) calculations. (ie. using voltage from a donut and current from a CT will not be permitted)

Donuts shall have ID's ranging from 1 to 15. Each installation using donuts must start the donut ID's from 1.

Donuts must be used in groups of three. (Their output is suitable only for use in the 3 wattmeter method.) The ID's of the donuts must be consecutive, the lowest numbered one being assumed to be phase one, and the highest numbered one will be assumed to be phase 3.

Zero entries in the table will be ignored.

C. Input Sequence Table

The Input Sequence Table is RAM based, and built at RTU startup time, based on the Output and Input Personality tables. For each group, this table specifies which inputs must be sampled simultaneously to calculate the desired outputs. The groups are entered into the table in order of their first reference in the Output Personality Table. The Input Personality Table is then referenced to find the input numbers of all phases of a given input type (ie. current) for any group. Each group is terminated by a zero word. The table is terminated by a word set to all ones.

D. Donut Scale Factor Table

This table is EEPROM based and contains the donut's group number, and scaling factors to be applied to donut inputs. Scale factors are unique to each parameter input from each donut. In addition, the temperature input may also have an offset from −1024 to 1023 added to it. This offset is added after the scaling factor has been applied. The entries are arranged in order of donut ID's.

Data Formats:

A. Incoming Donut Data Format:

| word | bits | function |
|---|---|---|
| 1 | 11-8 | don't care |
| | 7-4 | donut id |
| | 3-0 | aux. id |
| 2 | 11-0 | Va (cosine component of voltage) |

-continued

| word | bits | function |
|---|---|---|
| 3 | 11-0 | Vb (sine component of voltage) |
| 4 | 11-0 | Ia (cosine component of current) |
| 5 | 11-0 | Ib (sine component of current) |
| 6 | 11-0 | Aux |
| 7 | 11-0 | CRC word |

B. Host Transmission Format

For data types 0-6:

| word | bits | fuction |
|---|---|---|
| 1 | 7-6 | always zero |
| | 5-0 | value |
| 2 | 7-6 | always one |
| | 5-0 | MS 6 bits of value |
| 3 | 7-6 | always one |
| | 5-0 | LS 6 bits of value |

For data type 7 (KWH):

| word | bits | function |
|---|---|---|
| 1 | 7 | always one |
| | 6 | always zero |
| | 5-0 | value |
| 2 | 7-6 | always one |
| | 5-0 | MS 6 bits of value |
| 3 | 7-6 | always one |
| | 5-0 | LS 6 bits of value |

C. Upload/Download format:

| byte | bits | fuction |
|---|---|---|
| 0-4 | 0-7 | sync character - SYN ( 16) |
| 5 | 0-7 | table I.D. - ASCII digit 0-3 where: |
| | | 0 - I.D. table |
| | | 1 - Input Personality Table |
| | | 2 - Output Personality Table |
| | | 3 - Donut Scale Factor Table |
| 6-7 | 0-7 | byte count - of bytes of table transmitted |
| 8-N | 0-7 | table data - N = byte count + 8 |
| N+1-N+2 | 0-7 | CRC word, CRC includes bytes 5 thru N |

E. Fourier constant table

In the Fourier analysis, the values sin (s×40)/4.5 and cos (s×40)/4.5 (where s ranges from 1 to 9) are constants, and thus may be stored in a table. This avoids needless computation. Each entry will be a 32 bit floating point number. There will be 9 entries for each table. (sine and cosine)

F. Analog Input Buffer

There are 48 of these buffers, one per A/D channel. The number of buffers actually used is installation dependent. These buffers accept raw input from the A/D, and hold the results of intermediate calculations until output time. The intermediate values are the cosine and sine components oo the Fourier analysis of the 9 input samples, the effective value (computed from these components), total wattage, watt seconds, and kilowatt hours. The last three parameters are only defined for Analog Input buffers corresponding to phase 1 CT's.

G. Digital Input Buffer

There are 16 digital input buffers in the system. The number of buffers actually used is installation dependent. These buffers are similar in function to the analog input buffers, but their format is different due to the fact that data from donuts has already been analyzed, and voltage, current and temperature data are sent from each donut, being equivalent to three analog inputs. The data contained in these tables are the cosine and sine components of voltage, cosine and sine components of current, temperature, effective voltage and current, total watts, watt seconds, and kilowatt hours. The last three parameters are used only in buffers corresponding to donuts connected to phase one of a group.

GLOSSARY

Figure 63:
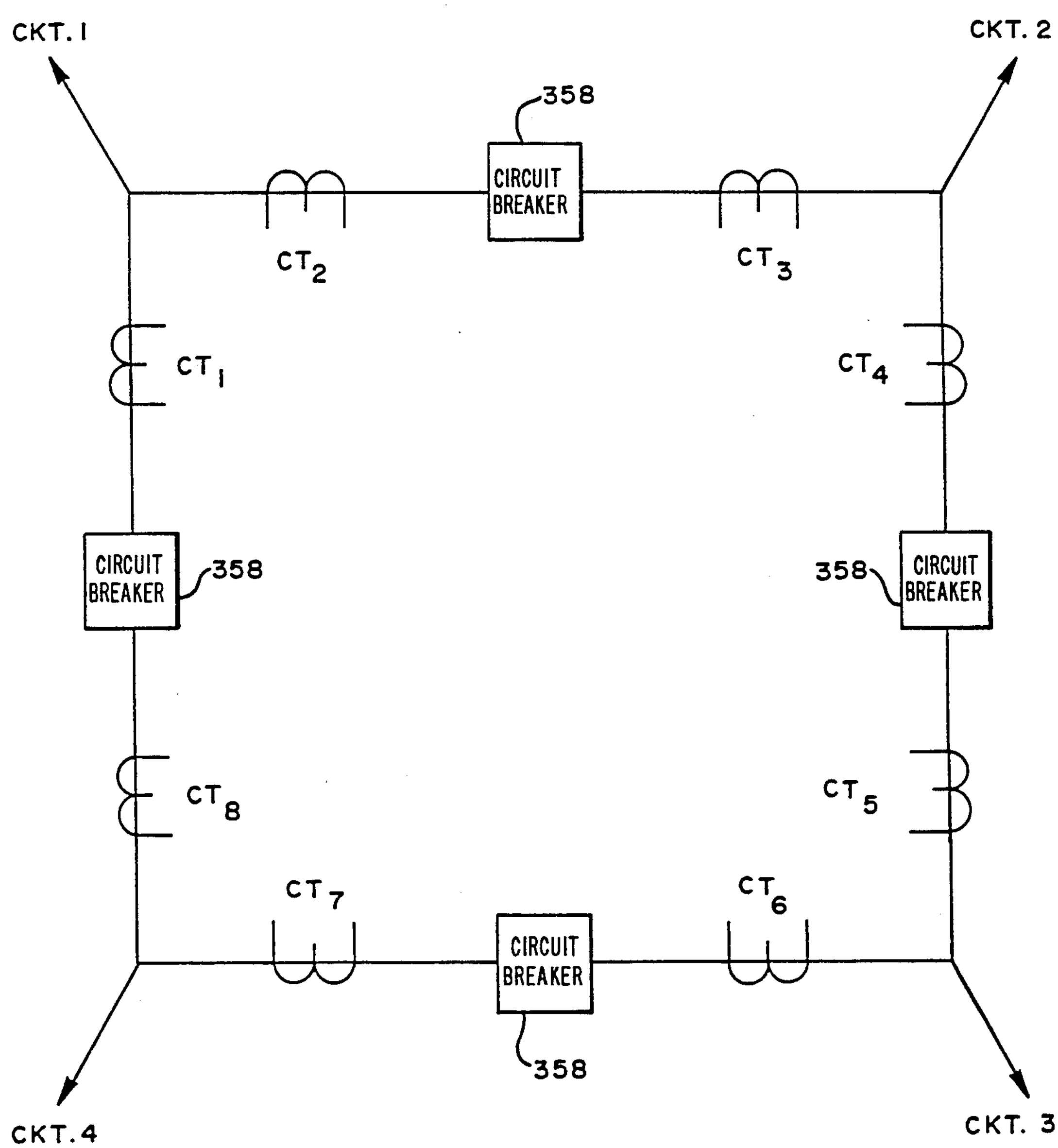
FIG. 63 is a diagram of a type of substation that may be monitored by the electronics shown in FIG. 62.

Breaker-and-a-half method:

Method used to calculate parameters when the substation bus is configured as shown in FIG. 63. Such a configuration is called a Ring Bus. In this configuration, any given circuit is fed from two sources. As a result, two CT's are used to calculate the current in the circuit, one CT on each source. As a result, any parameter requiring current must be calculated in a special way. The currents from each source must be summed and then used in the calculation. This is true whether the effective value (Ieff) is used, or the components (Ia, Ib) are used. To calculate power, then, the results of 3 inputs are now necessary rather than two as before. Circuit breakers are identified as 358.

Circuit:

Three (or four) wires whose purpose is to transmit power from the power company. Also called a bus.

Closter:

A collection of inputs which must be sampled at the same time due to phase considerations. (ie. A given voltage group and all the currents related to it through the output personality table constitute a cluster. Also, an 'entry' in the input sequence table)

Current Group:

A three phase circuit (3 or 4 conductor) whose current is measured. There may be a maximum of 23 current groups.

Donut: Remote power line monitoring device—linked to RTI via radio link.

I:

Current (abbr.)

Ia:

Cosine component of current waveform.

Ib:

Sine component of current waveform.

Phase:

1. A power carrying wire in a circuit or bus.
2. Time relationship between two signals, (often voltage and current) usually expressed in degrees or radians. (ie. The phase relationship between any two phases of a three phase circuit is 120 degrees)

V:

Voltage (abbr.)

Va:

Cosine component of voltage waveform.

Vb:

Sine component of voltage waveform.

VA:

Volt Amps—The vector sum of resistive (watts) and reactive power (VARS).

Voltage Group:

A three phase circuit (3 or 4 conductor) whose voltage is used both as a frequency reference and as a voltage reference for subsequent calculations. There may be a maximum of five of these voltage groups (1 per cluster).

Receiver Operation

Figure 64:
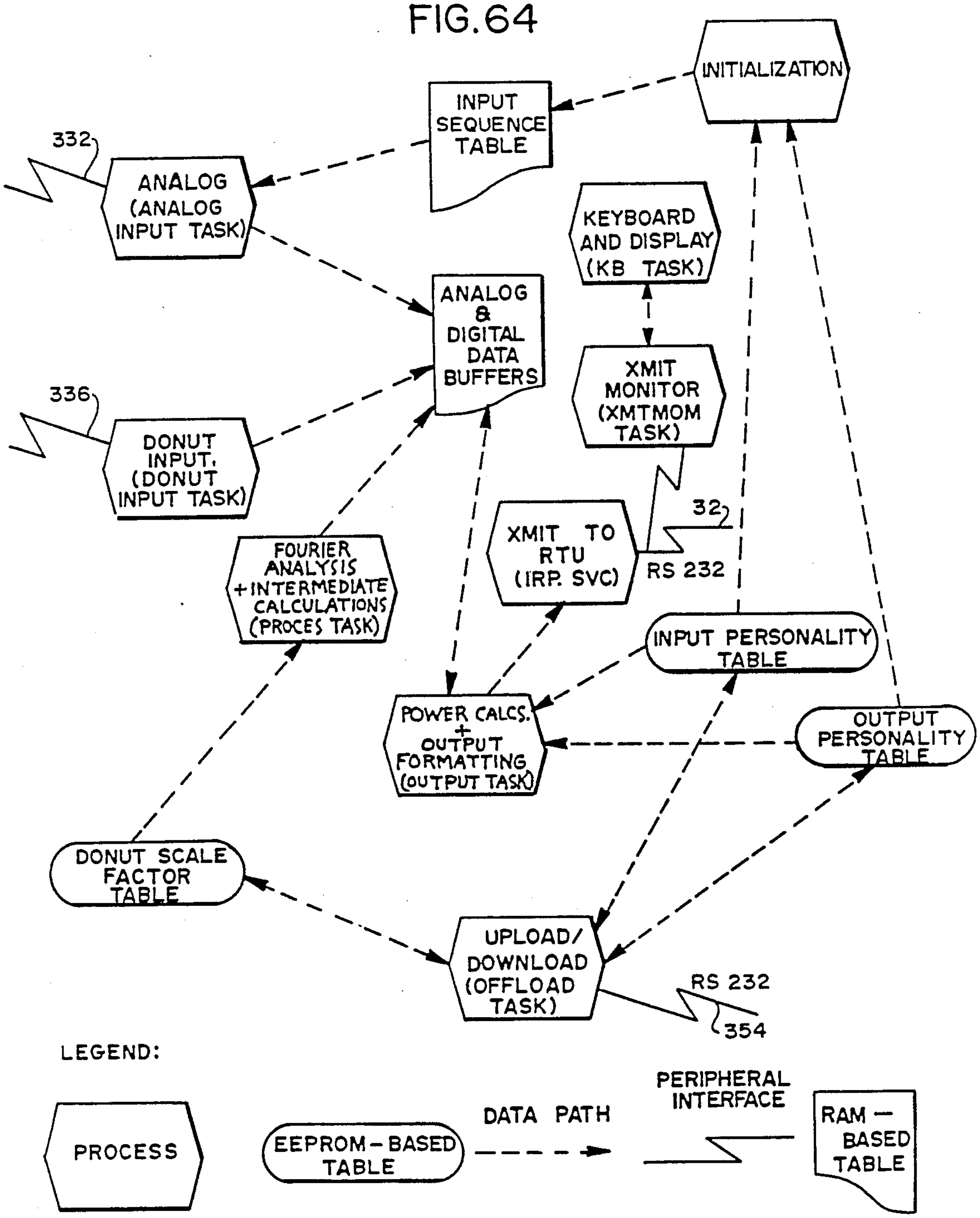
FIG. 64 is a state diagram of a program that may be utilized in the receiver 24.

A state diagram for the program of the central processing unit 334 of FIG. 62 of the receiver 24 is shown in FIG. 64. Processing tasks are indicated by the six-sided blocks. Tables stored in the electrically erasable read only memory 349 are indicated by the elongated oval boxes. Data paths are shown by dotted lines and peripheral interfaces are indicated by zig-zag lines. The transformer inputs 332 and donut input 336 are shown in the upper left. The RS232 port 354 is shown in the lower right and the output RS232 port 32 is indicated in the middle of the diagram.

The donut scale factor table is shown in FIG. 65. Since donuts are normally operated in groups of three for three-phased power measurement, word Ø comprises the group number of the donut (GP), followed by the phase number of the donut (PH). The following words are the voltage scale factor, current scale factor, temperature scale factors, and temperature offset respectively. Temperature offset is an 11 bit value, sign extended to 16 bits. All two word values are a floating point. There is, of course, a separate scale factor table for each of the fifteen donuts provided for. The donut scale factor tables are stored in the electrically erasable read only memory 349.

FIG. 66 is a table of the digital input buffers. There are sixteen required, one to store the received value of each of the fifteen donuts and one to act as a receiver buffer for the serial port of the communication board 106.

Word Ø comprises, in addition to the donut ID and a number called buffer age, indicating how long since the information in the buffer has been updated; the following flags:

DI (Data In)—Set when all data has been received and is ready for analysis. Clear when ready for new data.

AC (Analysis Complete)—Set when effective value and temperature scaling calculations are complete.

VP (Valid Power)—Set if total watts has already been calculated.

IT (Input Type)—Always 3. Identifies this buffer as donut input.

All single word values are 12 bits, sign extended to 16 bits. All double word values are floating point. Buffer age is the number of times this data has been used. The first buffer (buffer Ø) is used to assemble incoming donut data. Words 14–16 are defined for Ø1 donuts only. Word Ø in the buffer number Ø is used for the dnout status map. The digital input buffers are stored in the read only memory 346.

FIG. 67 is the input personality table of which there are 48 corresponding to the 48 potential transformer and current transformer inputs. IT identifies the input type which may be voltage, current, or temperature. Link is the input number of the next phase of this group of donuts. It is −1 if there are no other donuts in the group. Correction factor number 1 is used for correcting voltage values. Each of the four correction factors corresponds to a range of input values from the current transformers. Again, as with the donuts, the group number identifies groups of transformers associated with a single power line and PH identifies the phase number of the particular transformer. VG identifies the voltage group that the current is to be associated (that is, sampled) with. It is used, of course, only when the table is used to store values from a current transformer. The input personality tables are stored in the electrically erasable read only memory 349.

48 analog input buffers are provided to store measurements received from the 48 current potential transformers. The form of each of these buffers is shown in FIG. 68.

The follow flags are provided:

DI (Data In)—Set when all raw data has been received and sign extended. Clear when buffer is ready for more data.

AC (Analysis Complete)—Set when Fourier analysis and effective value computations are complete.

VP (Valid Power)—Set if total watts value has already been calculated.

IT (Input Type)—Ø=voltage, 1=current, 2=temperature.

Words 1-9 and 10-18 are 12 bit values, sign extended to 16 bits. All 2 word values are floating point. Words 16-18 are defined for Ø1 of current inputs only. Words 10-18 are undefined for temperature inputs. VP only applies to buffers associated with Ø1 current inputs. If IT=2 (temperature), the first sample will be converted to floating point and stored at offset 1Ø.

In operation, transmissions are received randomly from the donuts 20, transmitted in Manchester code to the serial port to the communications board 106. The checked sum (CRC) is calculated and if it agrees with the check sum (CRC) received, an interrupt is provided to the central processing unit 334, which then transfers the data to data bus 338. The central processing unit 68000 applies the scale factors and temperature offset to the received values, and calculates the Temperature, effective Voltage ($V_{EFF}$), effective Current ($I_{EFF}$), Scaled Temperature, Total Watts, Watt Seconds and Kilowatt hours from the received data and stores the data in the appropriate Digital Input Buffer in random access memory 346.

In the analog board 340, each of the 48 transformer inputs is sampled in turn. After its condition has been converted to digital form, an interrupt is generated, and the data is supplied to data bus 338. It should be noted that the analog board 340 causes the inputs from the potential and current transformers 332 to be Fourier sampled nine times just as current and voltage are sampled in the donuts (see FIG. 34). Thus, the data supplied to the data bus 338 from the analog board 340 comprises 9 successive values over nine alternating current cycles. After all nine have been stored in the random access memory 346, and the appropriate correction factors (FIG. 67) applied, the fundamental sine and cosine Fourier components are calculated just as in the donuts 20.

Then the effective value of current or voltage is calculated and, if appropriate, the Total Watts, Watt Seconds, and Kilowatt hours, and the entire table (FIG. 68) stored in the random access memory 346.

When the receiver 24 is initially set up, the appropriate donut scale factors (FIG. 65) are loaded through RS232 port 354 into the electrical erasable read only memory 349, and these are used to modify the values received from the donuts 20 before they are recorded in the digital input buffers of the random access memory 346. Similarly, an input personality table (FIG. 67) is stored in the electrical erasable read only memory 349 corresponding to each of the current and potential transformers and this is utilized to apply the appropriate corrections to the data received by the analog board 340 before it is recorded in the analog input buffers of the random access memory 346. The scaled data stored in the digital input buffers and the corrected data stored in the analog input buffers is then assembled into a frame or message containing all of the defined data from all of the donuts 20 and all of the transformers 332 and transmitted via transmission link 32 to a receiver which may be the remote terminal interface of the prior art as previously described.

The form of the analog-to-digital, multiplexed input sample and hold circuitry and program in the receiver 24 may be essentially the same as that in the donut. The same is true for the Fourier component calculation program and the calculation of the check sum (CRC). The programs are appropriately modified to run in the 68000 central processing unit with its associated memories.

If harmonic data is desired, then higher Fourier harmonics are calculated in the donuts 20 and transmitted to the receiver 24. The receiver then uses the higher harmonic values to calculate the amplitude of each harmonic it is desired to measure.

The frequency at any donut 20 may be determined, if desired, by measuring the time between transmissions received from the donut as these are an integral multiple (W, see FIG. 34) of the line frequency at the donut. Alternatively, the donut may employ an accurate quartz clock to measure the time between zero crossings (FIG. 34) and transmit this frequency measurement to the receiver.

If desired, power factor may be calculated from the Fourier components and stored in the input buffers (FIGS. 66 and 68). Reactive power (Vars) may be calculated from the Fourier components rather than real power (Watts) as selected by an additional flag in each of the Donut Scale Factor Tables (FIG. 65) and the Input Personality Table (FIG. 67). Alternatively, all of these calculations and others, as well as other information such as frequency, may be stored in expanded Input Buffers (FIGS. 66 and 68).

The electrical erasable read only memory 349 may be unloaded through the RS232 port 354 when desired to check the values stored therein. They may also be displayed in the display 352 and entered or changed by means of the keyboard 350.

The output from the receiver 24 is a frame of 64 (for example) data values from the Input Buffers (FIGS. 66 and 68) chosen by an output Personality Table (not shown) stored in the electrically erasable read only memory 349. This frame of values is transmitted to the Moore remote terminal unit once each second. The output personality table may be displayed on display 352 and entered by keyboard 350 or entered on read out through RS232 port 354.

Practical Application

It will thus be seen that a number of separate novel concepts have been applied to develop a practical state estimator module which may be applied to live power lines; a module which is capable of measuring the temperature of the power line, the ambient temperature, the voltage and current of the line; the frequency and harmonic content of the line; and transmits this information to a receiver where power information such as real and reactive power and power factor may be calculated.

Thus, we have provided a state estimator module which may be installed to all of the live power lines leading to and from a substantion and to both sides of power transformers in the substation, and thus provide the totality of information required for complete remote control of the power station from a power control center, and also provide for local control. Our state estimator modules may be installed on live monitored circuits in an existing substation having current and voltage transformers and our receiver used to collect this totality of information and transmit it to a remote terminal unit and thence to a power system control center.

Some of the important concepts which make this novel system possible are the metallic toroidal housing for the module (which is a high frequency but not a low frequency shunt about its contents); the supporting hub and spoke means; spring loaded temperature sensors; novel voltage measuring means; transmission of Fourier components; random burst transmission on a single radio channel with the timing between bursts being artfully chosen to minimize simultaneous transmissions from two or more donuts; novel hinge clamp which may be operated by a novel hot stick mounted tool facilitating the mounting of the module to a energized power conductor; and the concept that such hot stick mounted modules when distributed throughout a power delivery system, can provide for total automatic dynamic state estimator control.

It will thus be seen that the objects set forth above, among those made apparent from the preceding description, are efficiently attained and, since certain changes may be made in the above circuits, constructions and systems, without departing from the scope of the invention, it is intended that all matter contained in the above description, or shown in the accompanying drawings, shall be interpreted as illustrative and not in a limiting sense.

It is also to be understood that the following claims are intended to cover all of the generic and specific features of the invention herein described and all statements of the scope of the invention which as a matter of language might be said to fall therebetween.

APPENDIX A

Copyright © 1983

Product Development Services, Inc. (PDS)

```
PAGE  001  SUBD03  .SA:0          NMPC SUBSTATION MONITOR  13 JAN 83

00002                      * SUBHDR
00003                      **************************************************************
00004                      **************************************************************
00005                      ***                                                          **
00006                      ***                                                          **
00007                      ***                    NMPC - 803                            **
00008                      ***                                                          **
00009                      ***            N I A G A R A   M O W H A W K                 **
00010                      ***                                                          **
00011                      ***          P O W E R   C O R P O R A T I O N               **
00012                      ***                                                          **
00013                      ***                 SUB-STATION MONITOR                      **
00014                      ***                                                          **
00015                      ***                                                          **
00016                      **************************************************************
00017                      **************************************************************


00019                              OPT     ABS
00021                      * SYSCFG
00022                      **************************************************************
00023                      *                                                            *
00024                      *      SUBSTATION MONITOR                                    *
00025                      *      SYSTEM CONFIGURATION DEFINITIONS                      *
00026                      *                                                            *
00027                      **************************************************************


00029                      ******************************
00030                      *   SYSTEM ADDRESS EQUATES   *
00031                      ******************************

00033        0010       A RAMSTR EQU    $0010     RAM START ADDRESS
00034        0080       A RAMEND EQU    $0080     RAM END ADDRESS PLUS ONE
00035        1800       A PGMSTR EQU    $1800     PROGRAM ROM START ADDRESS
```

```
                        ****************************
                        *   CRC POLYNOMIAL EQUATES  *
                        ****************************
        0018          A POLY1  EQU    $18
        000F          A POLY2  EQU    $0F

                        ****************************
                        *  I/O EQUATES              *
                        ****************************

        0000          A PORTA  EQU    $0000    PORT A DATA REGISTER
        0001          A PORTB  EQU    $0001    PORT B DATA REGISTER
        0004          A PADDR  EQU    $0004    PORT A DATA DIRECTION REGISTER
        0005          A PBDDR  EQU    $0005    PORT B DATA DIRECTION REGISTER
        0008          A CLOCK  EQU    $0008    CLOCK DATA
        0009          A CLOKCR EQU    $0009    CLOCK CONTROL REGISTER

        1000          A DAC00  EQU    $1000    DAC/COMPARATOR LS NIBBLE
        1001          A DAC01  EQU    $1001    DAC/COMPARATOR MID NIBBLE
        1002          A DAC02  EQU    $1002    DAC/COMPARATOR MS NIBBLE
        1003          A DAC03  EQU    $1003    DAC/COMPARATOR CONVERT
        1000          A WDOG   EQU    DAC00    WATCH DOG TIMER
                        ****************************
                        *  TRANSMITTER TIMING       *
                        ****************************
        0054          A XBITS  EQU    84       TRANSMIT 84 DATA BITS
        0003          A XDELAY EQU    3        DELAY 3 BITS BEFORE DISABLE


                        ****************************
                        *   I/O BIT DEFINITIONS     *
                        ****************************

                        *  A SIDE

        000F          A IDMASK EQU    %00001111 DONUT ID JUMPER
        0004          A FREEZE EQU    4        A/D TRACKING REGISTER FREEZE

                        *  B SIDE

        0000          A SHFTIN EQU    0        SHIFT REGISTER DATA
        0001          A MANCTL EQU    1        MANCHESTER ENCODER ENABLE
        0002          A XMTTER EQU    2        TRANSMITTER CONTROL BIT
        0003          A STATUS EQU    3        CYCLE STATUS BIT (FOR TESTING)
        0004          A SHFCLK EQU    4        SHIFT REGISTER CLOCK

        00E0          A SMASK  EQU    %11100000 DAC SAMPLE SELECT MASK
        0000          A SCURR  EQU    %00000000 CURRENT SELECT
        0020          A SVOLT  EQU    %00100000 VOLTAGE SELECT
                        ****************************
                        *   CLOCK CONFIGURATION     *
                        ****************************
        004E          A CLKINT EQU    %01001110 NO IRQ,INTERNAL OSC,DIVIDE BY 64
        0078          A CLKEXT EQU    %01111000 NO IRQ,EXTERNAL OSC,DIVIDE BY 1
        000E          A CLKIRQ EQU    %00001110 IRQ,INTERNAL OSC,DIVIDE BY 64


                        ****************************
                        *   GLOBAL RAM DEFINTIONS   *
                        ****************************

A 0010                         ORG    RAMSTR

A 0010  0001          A LSTTIM RMB    1        LAST CYCLE TIME
A 0011  0001          A CYCTIM RMB    1        SAMPLE TIME (1-1/9 ZC TIME)
A 0012  0001          A REMAIN RMB    1        SAMPLE TIME REMAINDER
A 0013  0002          A XMTTIM RMB    2        TRANSMIT START Z.C. COUNT
A 0015  0001          A ZCFLAG RMB    1        ZERO CROSSING OCCURRED FLAG
A 0016  0001          A ZCCNT  RMB    1        ZERO CROSSING COUNTER
A 0017  0001          A SMPNUM RMB    1        CURRENT SAMPLE NUMBER (0-7)
A 0018  0001          A SMPTIM RMB    1        CURRENT SAMPLE DELAY TIME
A 0019  0001          A SMPFLG RMB    1        SAMPLE TIME FLAG
A 001A  0001          A SYNFLG RMB    1        SYNC MODE FLAG
```

```
00110A 001B     0001     A START  RMB     1         CYCLE START FLAG
00111A 001C     0002     A CURENT RMB     2         CURRENT VALUE
00112A 001E     0002     A VOLTS  RMB     2         VOLTAGE VALUE
00113A 0020     0001     A AUXID  RMB     1         AUXILLIARY VALUE SELECT BITS
00114           0040     A AUX1   EQU.    $40       FIRST AUX VALUE SELECT
00115A 0021     0001     A TRIGIX RMB     1         GETVAL/SUMS TRIG TABLE INDEX
00116A 0022     0007     A MLTBUF RMB     7         MULT MULTIPLICATION BUFFER
00117                      ****************
00118A 0029     0004     A ACCQUO RMB     4         DIVID9 BUFFER
00119A 002D     0004     A ACCVAL RMB     4
00120A 0031     0004     A ACCPOS RMB     4
00121A 0035     0004     A ACCSHF RMB     4
00122A 0039     0004     A ACCSUM RMB     4
00123                      ****************

00125                      ****************
00126           003D     A SUMBUF EQU     *
00127A 003D     0004     A VASUM  RMB     4
00128A 0041     0004     A VBSUM  RMB     4
00129A 0045     0004     A IASUM  RMB     4
00130A 0049     0004     A IBSUM  RMB     4
00131           004D     A SUMCLR EQU     *
00132                      ****************

00134                      ****************
00135           004D     A DATBUF EQU     *         DATA BUFFER
00136A 004D     0002     A IDBYTE RMB     2
00137A 004F     0002     A VA     RMB     2         VOLTAGE FOURIER COSINE SUM
00138A 0051     0002     A VB     RMB     2         VOLTAGE FOURIER SINE SUM
00139A 0053     0002     A IA     RMB     2         CURRENT FOURIER COSINE SUM
00140A 0055     0002     A IB     RMB     2         CURRENT FOURIER SINE SUM
00141A 0057     0002     A AUX    RMB     2         AUXILLIARY DATA VALUE
00142A 0059     0002     A CRCVAL RMB     2         CRC VALUE
00143                      ****************


00145                      *****************************
00146                      *   LOCAL RAM DEFINITIONS   *
00147                      *****************************

00149A 005B     0001     A BYTCNT RMB     1         SHIFT LOCAL COUNTER
00150A 005C     0001     A XTEMP  RMB     1         SHIFT LOCAL STORAGE
00151A 005D     0002     A VALUE  RMB     2         READAC LOCAL STORAGE
00152A 005F     0002     A VALINC RMB     2         READAC LOCAL STORAGE
00153A 0061     0001     A CLKREM RMB     1         CLKINT TIMER VALUE REMAINDER
00154A 0062     0001     A CRCCNT RMB     1         CRC12 LOOP COUNTER
00155A 0063     0001     A SHFCNT RMB     1         CPOLY LOOP COUNTER
00156A 0064     0001     A ABSIGN RMB     1         ABSVAL, ADDSIN, ADDCOS SIGN FLAG
00157                      *****************************
00158                      *  ZERO CROSSING COUNTS     *
00159                      *****************************
00160           0014     A SMPEND EQU     20        SAMPLING COMPLETE
00161           0000     A XMTCNT EQU     0         TIME TO TRANSMIT


00163A 1800                       ORG     PGMSTR    EPROM START ADDRESS
00165                      ***************************
00166                      *  TIMING TABLE           *
00167                      ***************************

00169           1800     A TIMTBL EQU     *
00170A 1800     0025     A        FDB     37        DONUT ID 0
00171A 1802     0029     A        FDB     41        DONUT ID 1
00172A 1804     002B     A        FDB     43        2
00173A 1806     002F     A        FDB     47        3
00174A 1808     0033     A        FDB     51        4
00175A 180A     0035     A        FDB     53        5
00176A 180C     003B     A        FDB     59        6
00177A 180E     003D     A        FDB     61        7
00178A 1810     0040     A        FDB     64        8
00179A 1812     0041     A        FDB     65        9
00180A 1814     0043     A        FDB     67        10
00181A 1816     0047     A        FDB     71        11
```

```
1818     0049      A        FDB    73         12
181A     004D      A        FDB    77         13
181C     004F      A        FDB    79         14
181E     0053      A        FDB    83         15
                        ****************************
                        *   TRIG TABLES            *
                        ****************************

         1820      A SINES  EQU    *
1820     0000      A S0     FDB    0000       SINE 0   (+)
1822     191C      A S1     FDB    6428       SINE 40  (+)
1824     2678      A S2     FDB    9848       SINE 80  (+)
1826     21D4      A S3     FDB    8660       SINE 120 (+)
1828     0D5C      A S4     FDB    3420       SINE 160 (+)
182A     0D5C      A S5     FDB    3420       SINE 200 (-)
182C     21D4      A S6     FDB    8660       SINE 240 (-)
182E     2678      A S7     FDB    9848       SINE 280 (-)
1830     191C      A S8     FDB    6428       SINE 320 (-)

         1832      A COSINE EQU    *
1832     2710      A C0     FDB    10000      COSINE 0   (+)
1834     1DEC      A C1     FDB    7660       COSINE 40  (+)
1836     06C9      A C2     FDB    1737       COSINE 80  (+)
1838     1388      A C3     FDB    5000       COSINE 120 (-)
183A     24B5      A C4     FDB    9397       COSINE 160 (-)
183C     24B5      A C5     FDB    9397       COSINE 200 (-)
183E     1388      A C6     FDB    5000       COSINE 240 (-)
1840     06C9      A C7     FDB    1737       COSINE 280 (+)
1842     1DEC      A C8     FDB    7660       COSINE 320 (+)

                        ****************************
                        *   FOURIER SCALING DIVISOR *
                        ****************************
1844     2710      A DIVIDR FDB    10000      DIVIDE BY 10000 TO SET DECIMAL PO
                        * MAIN
                        *******************************************************
                        *                                                     *
                        *  MAIN:  IS THE SUBSTATION MONITOR BACKGROUND        *
                        *         ROUTINE.                                    *
                        *                                                     *
                        *         CALLING SEQUENCE:                           *
                        *             JMP MAIN (FROM RESET)                   *
                        *                                                     *
                        *******************************************************


         1846      A MAIN   EQU    *
1846 CD 1863       A        JSR    SYNC       SYNCHRONIZE TIMING.
1849 CD 18B1       A        JSR    HKEEP      RESET FOR NEXT PASS.
184C CD 18EB       A        JSR    GETVAL     READ ANALOG VALUES.
184F CD 1A0D       A        JSR    COMPUT     PERFORM NECESSARY CALCULATIONS.
1852 C7 1000       A        STA    WDOG       KICK WATCHDOG.
1855 CD 1A82       A        JSR    CRC12      COMPUTE CHECKSUM.
1858 CD 1AD4       A        JSR    SHIFT      FILL SHIFT REGISTER WITH DATA.
185B CD 1B10       A        JSR    XMIT       TRANSMIT DATA.
185E C7 1000       A        STA    WDOG       KICK WATCHDOG.
1861 20 E3    1846          BRA    MAIN
                        * SYNC
                        *******************************************************
                        *                                                     *
                        *  SYNC:   CHECKS THE FREQUENCY AND ADJUSTS THE       *
                        *          SAMPLE TIMER ACCORDINGLY.                  *
                        *                                                     *
                        *          CALLING SEQUENCE:                          *
                        *              JSR  SYNC                              *
                        *              RETURN                                 *
                        *                                                     *
                        *******************************************************


         1863      A SYNC   EQU    *
1863 9B                     SEI               INHIBIT INTERRUPTS.
1864 A6 FF         A        LDA    #$FF       INITIALIZE Z.C. COUNT.
```

```
1866 B7 16        A          STA   ZCCNT
1868 B7 17        A          STA   ZCCNT+1
186A A6 01        A          LDA   #1        SET SYNC MODE FLAG.
186C B7 1A        A          STA   SYNFLG
186E A6 4E        A          LDA   #CLKINT   DISABLE CLOCK IRQ.
1870 B7 09        A          STA   CLOKCR
1872 9A                      CLI             REALLOW INTERRUPTS.
1873 3F 4F        A          CLR   VA        CLEAR VA FOR CYCLE CALCULATION.
1875 3F 50        A          CLR   VA+1
1877 3F 15        A          CLR   ZCFLAG    RESET ZERO CROSSING FLAG.
1879 AE 0A        A          LDX   #10       SET SYNC COUNT.
187B 3D 15        A SYNWAI   TST   ZCFLAG    ZERO CROSSING OCCURRED?
187D 27 FC   187B            BEQ   SYNWAI    NO.
187F 3F 15        A          CLR   ZCFLAG    YES.  IGNORE FIRST ONE.
1881 3D 15        A SYNNXT   TST   ZCFLAG    ZERO CROSSING OCCURRED?
1883 27 FC   1881            BEQ   SYNNXT    NO.
1885 3F 15        A          CLR   ZCFLAG    YES.  RESET FLAG.
1887 5A                      DEX             TIMED 10 CYCLES?
1888 26 F7   1881            BNE   SYNNXT    NO.
188A AE 05        A          LDX   #$05      YES.  GET MS TIME VALUE.
188C B6 10        A          LDA   LSTTIM    GET LAST CYCLE TIME.
188E B7 50        A          STA   VA+1      SAVE IN SUM BUFFER.
1890 A1 C0        A          CMP   #$C0      CARRY NEEDED?
1892 22 01   1895            BHI   SYNNC     NO.
1894 5C                      INX             YES.  BUMP MS VALUE.
1895 BF 4F        A SYNNC    STX   VA        SAVE MS VALUE.
1897 3F 51        A          CLR   VA+2      RESET LS BYTE.
1899 AE 4F        A          LDX   #VA
189B A6 09        A          LDA   #9        MOVE DIVISOR TO BUFFER.
189D B7 38        A          STA   ACCSHF+3
189F 3F 37        A          CLR   ACCSHF+2
18A1 CD 1C2D      A          JSR   DIV3X2    GET 1-1/9 CYCLE TIME.
18A4 E6 02        A          LDA   2,X
18A6 B7 11        A          STA   CYCTIM    SAVE SAMPLING TIME.
18A8 E6 03        A          LDA   3,X
18AA B7 12        A          STA   REMAIN    SAVE REMAINDER.
18AC A6 01        A          LDA   #1
18AE B7 1B        A          STA   START     SET CYCLE START FLAG.
18B0 81                      RTS

                    * HKEEP
                    ***************************************************
                    *                                                 *
                    *  HKEEP:  MAINTAINS THE SAMPLE TIME INCREMENT AND *
                    *          PERFORMS GENERAL HOUSEKEEPING.          *
                    *                                                 *
                    *          CALLING SEQUENCE:                      *
                    *              JSR HKEEP                          *
                    *              RETURN                             *
                    *                                                 *
                    ***************************************************


             18B1     A HKEEP    EQU   *
18B1 19 00        A          BCLR  FREEZE,PORTA RELEASE TRACKING REGISTER.
18B3 AE 3D        A          LDX   #SUMBUF   GET SUM BUFFER START.
18B5 A6 00        A          LDA   #0
18B7 F7             HKCLR    STA   0,X       CLEAR A BYTE.
18B8 5C                      INX             BUMP BUFFER POINTER.
18B9 A3 4D        A          CPX   #SUMCLR   DONE?
18BB 26 FA   18B7            BNE   HKCLR     NO.  CONTINUE CLEARING.
18BD A6 80        A          LDA   #$80      YES.  INITIALIZE TIMER REMAINDER.
18BF B7 61        A          STA   CLKREM
18C1 B6 00        A          LDA   PORTA     GET DONUT ID NUMBER.
18C3 A4 0F        A          AND   #IDMASK   MASK TO VALID BITS.
18C5 B7 4E        A          STA   IDBYTE+1 STORE IN DATA BUFFER.
18C7 3F 4D        A          CLR   IDBYTE
18C9 BE 4E        A          LDX   IDBYTE+1 GET ID NUMBER.
18CB 58                      ASLX            MULTIPLY BY TWO.
18CC D6 1801      A          LDA   TIMTBL+1,X GET TIMING TABLE ENTRY.
18CF A0 01        A          SUB   #1        COMPUTE TRANSMIT TIME.
18D1 B7 14        A          STA   XMTTIM+1
18D3 D6 1800      A          LDA   TIMTBL,X
18D6 A2 00        A          SBC   #0
```

```
18D8 B7 13          A         STA    XMTTIM
18DA B6 20          A         LDA    AUXID     GET AUXILLIARY ID.
18DC AB 20          A         ADD    #$20      BUMP TO NEXT AUX. VALUE.
18DE A1 E0          A         CMP    #$E0      DONE ALL?
18E0 26 02       18E4         BNE    HK01      NO.
18E2 A6 40          A         LDA    #AUX1     YES.  RESET TO FIRST.
18E4 B7 20          A HK01    STA    AUXID     SAVE AUXILLIARY ID.
18E6 BA 4E          A         ORA    IDBYTE+1  STORE IN DATA BUFFER.
18E8 B7 4E          A         STA    IDBYTE+1
18EA 81                       RTS              RETURN.
                      * GETVAL
                      ***********************************************************
                      *                                                         *
                      *   GETVAL:  MONITORS THE SAMPLING TIMER AND              *
                      *            UPDATES THE CURRENT VALUE BUFFER.            *
                      *                                                         *
                      *            CALLING SEQUENCE:                            *
                      *                JSR GETVAL                               *
                      *                RETURN                                   *
                      *                                                         *
                      ***********************************************************


             18EB     A GETVAL EQU    *
18EB B6 15          A         LDA    ZCFLAG    ZERO CROSSING OCCURRED?
18ED 27 FC       18EB         BEQ    GETVAL    NO.
18EF 3F 15          A         CLR    ZCFLAG    YES.  RESET FLAG.
18F1 3F 21          A         CLR    TRIGIX    RESET TRIG VALUE INDEX.
18F3 3D 19          A GVWAIT TST    SMPFLG    TIME TO SAMPLE?
18F5 27 FC       18F3         BEQ    GVWAIT    NO.
18F7 3F 19          A         CLR    SMPFLG    YES.  RESET SAMPLE FLAG.
18F9 C7 1000        A         STA    WDOG      KICK WATCHDOG TIMER.
18FC CD 190C        A         JSR    SAMPLE    READ ANALOG VALUE.
18FF B6 21          A         LDA    TRIGIX    BUMP TRIG VALUE INDEX.
1901 AB 02          A         ADD    #2
1903 B7 21          A         STA    TRIGIX
1905 B6 17          A         LDA    ZCCNT+1   DONE ALL NINE SAMPLES?
1907 A1 14          A         CMPA   #SMPEND
1909 25 E8       18F3         BLO    GVWAIT    NO.
190B 81                       RTS              YES.  RETURN.
                      * SAMPLE
                      ***********************************************************
                      *                                                         *
                      *  SAMPLE:  READS ALL ANALOG DATA VALUES.                 *
                      *                                                         *
                      *           CALLING SEQUENCE:                             *
                      *               JSR SAMPLE                                *
                      *               RETURN                                    *
                      *                                                         *
                      *  C. 13 MS                                               *
                      ***********************************************************


             190C     A SAMPLE EQU    *
190C B6 00          A         LDA    PORTA     GET PORT STATUS.
190E A4 1F          A         AND    #$FF-SMASK MASK OFF DAC SELECT BITS.
1910 AA 00          A         ORA    #SCURR    SET CURRENT SELECT.
1912 B7 00          A         STA    PORTA     SELECT CURRENT.
1914 CD 1B94        A         JSR    READAC    GET CURRENT VALUE.
1917 B7 1C          A         STA    CURENT    SAVE VALUE.
1919 BF 1D          A         STX    CURENT+1
191B B6 00          A         LDA    PORTA     SELECT VOLTAGE.
191D A4 1F          A         AND    #$FF-SMASK
191F AA 20          A         ORA    #SVOLT
1921 B7 00          A         STA    PORTA
1923 CD 1B94        A         JSR    READAC    GET VOLTAGE VALUE.
1926 B7 1E          A         STA    VOLTS     SAVE VALUE.
1928 BF 1F          A         STX    VOLTS+1
192A CD 1949        A         JSR    SUMS      COMPUTE CURRENT SUMS.
192D B6 17          A         LDA    ZCCNT+1   DONE ALL 9?
192F A1 14          A         CMP    #SMPEND
1931 26 13       1946         BNE    SAMRET    NO.
```

```
00400A 1933 A6 4E         A         LDA     #CLKINT  YES.  DISABLE CLOCK INTERRUPTS.
00401A 1935 B7 09         A         STA     CLOKCR
00402A 1937 B6 00         A         LDA     PORTA    GET PORT STATUS.
00403A 1939 A4 1F         A         AND     #$FF-SMASK MASK OFF DAC SELECT BITS.
00404A 193B BA 20         A         ORA     AUXID    SET AUXILLIARY DATA BITS.
00405A 193D B7 00         A         STA     PORTA    SELECT AUXILLIARY DATA.
00406A 193F CD 1B94       A         JSR     READAC   GET CURRENT VALUE.
00407A 1942 B7 57         A         STA     AUX      SAVE MS BYTE.
00408A 1944 BF 58         A         STX     AUX+1    SAVE LS BYTE.
00409A 1946 19 00         A SAMRET BCLR     FREEZE,PORTA RELEASE TRACKING REGISTER.
00410A 1948 81                      RTS              RETURN.
00412                       * SUMS
00413                       ********************************************************
00414                       *                                                      *
00415                       *   SUMS: MULTIPLIES THE VOLTAGE AND CURRENT TIMES     *
00416                       *         THE PHASE ANGLE TRIG VALUES AND SUMS THE     *
00417                       *         RESULTS.                                     *
00418                       *                                                      *
00419                       *         CALLING SEQUENCE:                            *
00420                       *             JSR SUMS                                 *
00421                       *             RETURN                                   *
00422                       *                                                      *
00423                       ********************************************************

00425             1949    A SUMS    EQU     *
00426A 1949 AE 1E         A         LDX     #VOLTS   MOVE VOLTAGE TO BUFFER.
00427A 194B CD 19AA       A         JSR     ABSVAL
00428A 194E BE 21         A         LDX     TRIGIX   GET TRIG VALUE INDEX.
00429A 1950 D6 1832       A         LDA     COSINE,X MOVE TRIG VALUE TO BUFFER.
00430A 1953 B7 25         A         STA     MLTBUF+3
00431A 1955 D6 1833       A         LDA     COSINE+1,X
00432A 1958 B7 26         A         STA     MLTBUF+4
00433A 195A CD 1CD2       A         JSR     MULT     MULTIPLY VOLTS BY COSINE.
00434A 195D AE 3D         A         LDX     #VASUM   GET SUM ADDRESS.
00435A 195F AD 63      19C4         BSR     ADDCOS   ADD RESULT INTO SUM.

00437A 1961 AE 1E         A         LDX     #VOLTS   MOVE VOLTAGE TO BUFFER.
00438A 1963 CD 19AA       A         JSR     ABSVAL
00439A 1966 BE 21         A         LDX     TRIGIX   GET TRIG VALUE INDEX.
00440A 1968 D6 1820       A         LDA     SINES,X  MOVE TRIG VALUE TO BUFFER.
00441A 196B B7 25         A         STA     MLTBUF+3
00442A 196D D6 1821       A         LDA     SINES+1,X
00443A 1970 B7 26         A         STA     MLTBUF+4
00444A 1972 CD 1CD2       A         JSR     MULT     MULTIPLY VOLTS BY SINE.
00445A 1975 AE 41         A         LDX     #VBSUM   GET SUM ADDRESS.
00446A 1977 AD 57      19D0         BSR     ADDSIN   ADD RESULT INTO SUM.

00448A 1979 AE 1C         A         LDX     #CURENT  MOVE CURRENT TO BUFFER.
00449A 197B CD 19AA       A         JSR     ABSVAL
00450A 197E BE 21         A         LDX     TRIGIX   GET TRIG VALUE INDEX.
00451A 1980 D6 1832       A         LDA     COSINE,X MOVE TRIG VALUE TO BUFFER.
00452A 1983 B7 25         A         STA     MLTBUF+3
00453A 1985 D6 1833       A         LDA     COSINE+1,X
00454A 1988 B7 26         A         STA     MLTBUF+4
00455A 198A CD 1CD2       A         JSR     MULT     MULTIPLY CURRENT BY COSINE.
00456A 198D AE 45         A         LDX     #IASUM   GET SUM ADDRESS.
00457A 198F AD 33      19C4         BSR     ADDCOS   ADD RESULT INTO SUM.

00459A 1991 AE 1C         A         LDX     #CURENT  MOVE CURRENT TO BUFFER.
00460A 1993 CD 19AA       A         JSR     ABSVAL
00461A 1996 BE 21         A         LDX     TRIGIX   GET TRIG VALUE INDEX.
00462A 1998 D6 1820       A         LDA     SINES,X  MOVE TRIG VALUE TO BUFFER.
00463A 199B B7 25         A         STA     MLTBUF+3
00464A 199D D6 1821       A         LDA     SINES+1,X
00465A 19A0 B7 26         A         STA     MLTBUF+4
00466A 19A2 CD 1CD2       A         JSR     MULT     MULTIPLY VOLTS BY SINE.
00467A 19A5 AE 49         A         LDX     #IBSUM   GET SUM ADDRESS.
00468A 19A7 AD 27      19D0         BSR     ADDSIN   ADD RESULT INTO SUM.

PAGE  013  SUBD03  .SA:0          NMPC SUBSTATION MONITOR  13 JAN 83

00470A 19A9 81                      RTS              RETURN.
```

```
                          * SUMS
                          ************************************************************
                          *
                          *     ABSVAL:  MOVES THE ABSOLUTE VALUE OF THE VALUE AT
                          *              X TO THE MULTIPLY BUFFER AND SETS THE SIGN
                          *              FLAG FOR LATER USE.
                          *
                          *              CALLING SEQUENCE:
                          *                  X = VALUE ADDRESS
                          *                  JSR ABSVAL
                          *                  RETURN
                          *                  ABSIGN = SIGN FLAG ($FF = NEGATIVE)
                          *
                          ************************************************************
           19AA        A ABSVAL EQU    *
19AA F6                         LDA    0,X       MOVE VALUE TO BUFFER.
19AB B7 23             A        STA    MLTBUF+1
19AD E6 01             A        LDA    1,X
19AF B7 24             A        STA    MLTBUF+2
19B1 3F 64             A        CLR    ABSIGN    RESET SIGN FLAG.
19B3 3D 23             A        TST    MLTBUF+1  VALUE POSITIVE?
19B5 2A 0C        19C3          BPL    ABSRET    YES.  RETURN WITH ABSIGN=0.
19B7 33 23             A        COM    MLTBUF+1  NO.  TWOS COMPLEMENT VALUE.
19B9 33 24             A        COM    MLTBUF+2
19BB 3C 24             A        INC    MLTBUF+2
19BD 26 02        19C1          BNE    ABSNEG    CARRY?  NO.
19BF 3C 23             A        INC    MLTBUF+1  YES.  BUMP MS BYTE.
19C1 33 64             A ABSNEG COM    ABSIGN    SET NEGATIVE VALUE FLAG.
19C3 81                  ABSRET RTS              RETURN.
                          * SUMS
                          ************************************************************
                          *
                          *     ADDCOS:  ADDS THE SIGNED COSINE PRODUCT TO THE SUM.
                          *     ADDSIN:  ADDS THE SIGNED SINE PRODUCT TO THE SUM.
                          *
                          *              CALLING SEQUENCE:
                          *                  ABSIGN = VALUE SIGN ($00 = POSITIVE)
                          *                                      ($FF = NEGATIVE)
                          *                  X = SUM ADDRESS
                          *                  JSR ADDCOS/ADDSIN
                          *                  RETURN
                          *
                          ************************************************************

           19C4        A ADDCOS EQU    *
19C4 B6 21             A        LDA    TRIGIX    GET TRIG INDEX.
19C6 A1 06             A        CMP    #6        VALUE POSITIVE?
19C8 25 0C        19D6          BLO    ASPOS     YES.  TEST RESULT SIGN.
19CA A1 0E             A        CMP    #14       NO.  VALUE NEGATIVE?
19CC 25 0A        19D8          BLO    ASNEG     YES.  TEST RESULT SIGN.
19CE 20 06        19D6          BRA    ASPOS     POSITIVE.  TEST RESULT SIGN.

           19D0        A ADDSIN EQU    *
19D0 B6 21             A        LDA    TRIGIX    GET TRIG INDEX.
19D2 A1 0A             A        CMP    #10       IS TRIG VALUE POSITIVE?
19D4 24 02        19D8          BHS    ASNEG     NO.
19D6 33 64             A ASPOS  COM    ABSIGN    INVERT SIGN FLAG.
19D8 3D 64             A ASNEG  TST    ABSIGN    IS VALUE NEGATIVE?
19DA 26 1A        19F6          BNE    ASADD     YES.  ADD RESULT.
19DC 20 00        19DE          BRA    ASSUB     NO.  SUBTRACT RESULT.
19DE E6 03             A ASSUB  LDA    3,X       NO.  SUBTRACT VALUE FROM SUM.
19E0 B0 24             A        SUB    MLTBUF+2
19E2 E7 03             A        STA    3,X
19E4 E6 02             A        LDA    2,X
19E6 B2 23             A        SBC    MLTBUF+1
19E8 E7 02             A        STA    2,X
19EA E6 01             A        LDA    1,X
19EC B2 28             A        SBC    MLTBUF+6
19EE E7 01             A        STA    1,X
19F0 F6                         LDA    0,X
19F1 B2 27             A        SBC    MLTBUF+5
19F3 F7                         STA    0,X
```

```
00546A 19F4 20 16     1A0C          BRA    ASRET     RETURN.
00547A 19F6 E6 03        A ASADD    LDA    3,X       ADD VALUE TO SUM.
00548A 19F8 BB 24        A          ADD    MLTBUF+2
00549A 19FA E7 03        A          STA    3,X
00550A 19FC E6 02        A          LDA    2,X
00551A 19FE B9 23        A          ADC    MLTBUF+1
00552A 1A00 E7 02        A          STA    2,X
00553A 1A02 E6 01        A          LDA    1,X
00554A 1A04 B9 28        A          ADC    MLTBUF+6
00555A 1A06 E7 01        A          STA    1,X
00556A 1A08 F6                      LDA    0,X
00557A 1A09 B9 27        A          ADC    MLTBUF+5
00558A 1A0B F7                      STA    0,X

PAGE  016  SUBD03  .SA:0         NMPC SUBSTATION MONITOR  13 JAN 83

00559A 1A0C 81              ASRET  RTS               RETURN.

00561                       * COMPUT
00562                       ***********************************************************
00563                       *                                                         *
00564                       *   COMPUT:  PERFORMS NECESSARY DATA MANIPULATIONS.       *
00565                       *                                                         *
00566                       *            CALLING SEQUENCE:                            *
00567                       *                JSR COMPUT                               *
00568                       *                RETURN                                   *
00569                       *                                                         *
00570                       *  C. 35 MS                                               *
00571                       ***********************************************************


00573            1A0D      A COMPUT EQU    *
00574A 1A0D C6 1844        A        LDA    DIVIDR    MOVE DIVISOR TO BUFFER.
00575A 1A10 B7 37          A        STA    ACCSHF+2
00576A 1A12 C6 1845        A        LDA    DIVIDR+1
00577A 1A15 B7 38          A        STA    ACCSHF+3
00578A 1A17 AE 3D          A        LDX    #VASUM    GET FOURIER VOLTAGE SUM
00579A 1A19 CD 1BFA        A        JSR    DIVABS    GET DIVIDEND ABSOLUTE VALUE.
00580A 1A1C CD 1C31        A        JSR    DIV4X2    DIVIDE VALUE.
00581A 1A1F CD 1C1A        A        JSR    DIVCNV    RECONVERT TO SIGNED RESULT.
00582A 1A22 E6 02          A        LDA    2,X       MOVE VALUE TO DATA BUFFER.
00583A 1A24 B7 4F          A        STA    VA
00584A 1A26 E6 03          A        LDA    3,X
00585A 1A28 B7 50          A        STA    VA+1

00587A 1A2A C6 1844        A        LDA    DIVIDR    MOVE DIVISOR TO BUFFER.
00588A 1A2D B7 37          A        STA    ACCSHF+2
00589A 1A2F C6 1845        A        LDA    DIVIDR+1
00590A 1A32 B7 38          A        STA    ACCSHF+3
00591A 1A34 AE 41          A        LDX    #VBSUM    GET FOURIER VOLTAGE SUM.
00592A 1A36 CD 1BFA        A        JSR    DIVABS    GET DIVIDEND ABSOLUTE VALUE.
00593A 1A39 CD 1C31        A        JSR    DIV4X2    DIVIDE VALUE.
00594A 1A3C CD 1C1A        A        JSR    DIVCNV    RECONVERT TO SIGNED RESULT.
00595A 1A3F E6 02          A        LDA    2,X       MOVE VALUE TO DATA BUFFER.
00596A 1A41 B7 51          A        STA    VB
00597A 1A43 E6 03          A        LDA    3,X
00598A 1A45 B7 52          A        STA    VB+1

00600A 1A47 C6 1844        A        LDA    DIVIDR    MOVE DIVISOR TO BUFFER.
00601A 1A4A B7 37          A        STA    ACCSHF+2
00602A 1A4C C6 1845        A        LDA    DIVIDR+1
00603A 1A4F B7 38          A        STA    ACCSHF+3
00604A 1A51 AE 45          A        LDX    #IASUM    GET FOURIER CURRENT SUM.
00605A 1A53 CD 1BFA        A        JSR    DIVABS    GET DIVIDEND ABSOLUTE VALUE.
00606A 1A56 CD 1C31        A        JSR    DIV4X2    DIVIDE VALUE.
00607A 1A59 CD 1C1A        A        JSR    DIVCNV    RECONVERT TO SIGNED RESULT.
00608A 1A5C E6 02          A        LDA    2,X       MOVE VALUE TO DATA BUFFER.
00609A 1A5E B7 53          A        STA    IA
00610A 1A60 E6 03          A        LDA    3,X
00611A 1A62 B7 54          A        STA    IA+1

00613A 1A64 C6 1844        A        LDA    DIVIDR    MOVE DIVISOR TO BUFFER.
00614A 1A67 B7 37          A        STA    ACCSHF+2
```

```
1A69 C6 1845      A          LDA    DIVIDR+1
1A6C B7 38        A          STA    ACCSHF+3
1A6E AE 49        A          LDX    #IBSUM    GET FOURIER CURRENT SUM.
1A70 CD 1BFA      A          JSR    DIVABS    GET DIVIDEND ABSOLUTE VALUE.
1A73 CD 1C31      A          JSR    DIV4X2    DIVIDE VALUE.
1A76 CD 1C1A      A          JSR    DIVCNV    RECONVERT TO SIGNED RESULT.
1A79 E6 02        A          LDA    2,X       MOVE VALUE TO DATA BUFFER.
1A7B B7 55        A          STA    IB
1A7D E6 03        A          LDA    3,X
1A7F B7 56        A          STA    IB+1

1A81 81                      RTS              RETURN.

                  * CRC12
                  **************************************************
                  *
                  *   CRC12:  COMPUTES A CYCLIC REDUNDANCY CHECK VALUE
                  *           FOR THE DATA IN THE DATA BUFFER.
                  *
                  *           CALLING SEQUENCE:
                  *               JSR CRC12
                  *               RETURN
                  *
                  **************************************************


          1A82    A CRC12    EQU    *
1A82 A6 09        A          LDA    #9        SET BYTE COUNTER.
1A84 B7 62        A          STA    CRCCNT
1A86 3F 59        A          CLR    CRCVAL    INITIALIZE CRC VALUE.
1A88 3F 5A        A          CLR    CRCVAL+1
1A8A AE 40        A          LDX    #DATBUF   GET DATA BUFFER START ADDRESS.
1A8C F6             CRCNXT   LDA    0,X       GET MS 4 BITS.
1A8D A4 0F        A          AND    #$0F
1A8F B8 59        A          EOR    CRCVAL    OR INTO CRC VALUE.
1A91 B7 59        A          STA    CRCVAL
1A93 5C                      INX              BUMP DATA POINTER.
1A94 F6                      LDA    0,X       GET NEXT MS 2 BITS.
1A95 A4 C0        A          AND    #$C0
1A97 B8 5A        A          EOR    CRCVAL+1  OR INTO CRC VALUE.
1A99 B7 5A        A          STA    CRCVAL+1
1A9B AD 1B     1AB8          BSR    CPOLY     OR CRC WITH POLYNOMIAL.
1A9D F6                      LDA    0,X       GET MS 4 BITS.
1A9E 44                      LSRA
1A9F 44                      LSRA
1AA0 A4 0F        A          AND    #$0F
1AA2 B8 59        A          EOR    CRCVAL    OR INTO CRC VALUE.
1AA4 B7 59        A          STA    CRCVAL
1AA6 F6                      LDA    0,X       GET LS 2 BITS.
1AA7 47                      ASRA             SHIFT TO BITS 7,6.
1AA8 46                      RORA
1AA9 46                      RORA
1AAA A4 C0        A          AND    #$C0
1AAC B8 5A        A          EOR    CRCVAL+1
1AAE B7 5A        A          STA    CRCVAL+1
1AB0 5C                      INX              BUMP DATA POINTER.
1AB1 AD 05     1AB8          BSR    CPOLY     OR CRC WITH POLYNOMIAL.
1AB3 3A 62        A          DEC    CRCCNT    DONE?
1AB5 26 D5     1A8C          BNE    CRCNXT    NO.  CONTINUE.
1AB7 81                      RTS              YES.  RETURN.
                  * CRC12
                  **************************************************
                  *                                                *
                  *   CPOLY:  PERFORMS THE EXCLUSIVE OR OF THE CRC *
                  *           VALUE WITH THE POLYNOMIAL.           *
                  *                                                *
                  *           CALLING SEQUENCE:                    *
                  *               JSR CPOLY                        *
                  *               RETURN                           *
                  *               X IS PRESERVED                   *
                  *                                                *
                  **************************************************
```

```
00688            1AB8      A CPOLY  EQU    *
00689A 1AB8 A6 06          A        LDA    #6         SET SHIFT COUNTER.
00690A 1ABA B7 63          A        STA    SHFCNT
00691A 1ABC 38 5A          A CP00   ASL    CRCVAL+1 SHIFT CRC VALUE.
00692A 1ABE 39 59          A        ROL    CRCVAL
00693A 1AC0 09 59 0C 1ACF           BRCLR  4,CRCVAL,CP01 BIT 12 SET?  NO.
00694A 1AC3 B6 59          A        LDA    CRCVAL     YES.  OR WITH POLYNOMIAL.
00695A 1AC5 A8 18          A        EOR    #POLY1
00696A 1AC7 B7 59          A        STA    CRCVAL
00697A 1AC9 B6 5A          A        LDA    CRCVAL+1
00698A 1ACB A8 0F          A        EOR    #POLY2
00699A 1ACD B7 5A          A        STA    CRCVAL+1
00700A 1ACF 3A 63          A CP01   DEC    SHFCNT     DONE?
00701A 1AD1 26 E9     1ABC          BNE    CP00       NO.  CONTINUE SHIFTING.
00702A 1AD3 81                      RTS               YES.  RETURN.
00704                      * SHIFT
00705                      *******************************************************
00706                      *                                                     *
00707                      *    SHIFT:  LOADS THE SHIFT REGISTER WITH CURRENT    *
00708                      *            DATA.                                    *
00709                      *                                                     *
00710                      *            CALLING SEQUENCE:                        *
00711                      *                JSR SHIFT                            *
00712                      *                RETURN                               *
00713                      *                                                     *
00714                      *******************************************************


00716            1AD4      A SHIFT  EQU    *
00717A 1AD4 A6 07          A        LDA    #7         SET WORD COUNT.
00718A 1AD6 B7 5B          A        STA    BYTCNT
00719A 1AD8 AE 4D          A        LDX    #DATBUF    GET DATA BUFFER START.
00720A 1ADA F6               SHFNXT LDA    0,X        GET A BYTE.
00721A 1ADB 5C                      INCX              BUMP DATA POINTER.
00722A 1ADC 48                      ASLA              DISCARD UNUSED BITS.
00723A 1ADD 48                      ASLA
00724A 1ADE 48                      ASLA
00725A 1ADF 48                      ASLA
00726A 1AE0 AD 17     1AF9          BSR    SHIFT4     TOGGLE INTO SHIFT REGISTER.
00727A 1AE2 F6                      LDA    0,X        GET NEXT BYTE.
00728A 1AE3 5C                      INCX
00729A 1AE4 AD 13     1AF9          BSR    SHIFT4     TOGGLE INTO SHIFT REGISTER.
00730A 1AE6 AD 11     1AF9          BSR    SHIFT4     TOGGLE INTO SHIFT REGISTER.
00731A 1AE8 3A 5B          A        DEC    BYTCNT     DONE?
00732A 1AEA 26 EE     1ADA          BNE    SHFNXT     NO.
00733A 1AEC A6 00          A        LDA    #0         YES.  FILL UP 96 BIT REGISTER.
00734A 1AEE AD 09     1AF9          BSR    SHIFT4     SHIFT IN 4 ZEROS.
00735A 1AF0 AD 07     1AF9          BSR    SHIFT4     SHIFT IN FOUR ZEROS.
00736A 1AF2 AE 03          A        LDX    #3
00737A 1AF4 AD 07     1AFD          BSR    SHFAGN     SHIFT IN ANOTHER 3 ZEROS.
00738A 1AF6 16 01          A        BSET   STATUS,PORTB SET STATUS FLAG FOR TEST.
00739A 1AF8 81                      RTS               RETURN.


00741            1AF9      A SHIFT4 EQU    *
00742A 1AF9 BF 5C          A        STX    XTEMP      SAVE X.
00743A 1AFB AE 04          A        LDX    #4         SET BIT COUNT.
00744A 1AFD 48               SHFAGN ASLA              GET NEXT BIT.
00745A 1AFE 24 04     1B04          BCC    SHFCLR     SET?  NO.
00746A 1B00 10 01          A        BSET   SHFTIN,PORTB YES.  SET DATA BIT.
00747A 1B02 20 02     1B06          BRA    SHFTOG
00748A 1B04 11 01          A SHFCLR BCLR   SHFTIN,PORTB CLEAR DATA BIT.
00749A 1B06 18 01          A SHFTOG BSET   SHFCLK,PORTB TOGGLE DATA SHIFT CLOCK.
00750A 1B08 19 01          A        BCLR   SHFCLK,PORTB
00751A 1B0A 5A                      DECX              DONE?
00752A 1B0B 26 F0     1AFD          BNE    SHFAGN     NO.
00753A 1B0D BE 5C          A        LDX    XTEMP      YES.  RESTORE X.
00754A 1B0F 81                      RTS               RETURN.
00756                      * XMIT
00757                      *******************************************************
00758                      *                                                     *
00759                      *    XMIT:  TRANSMITS THE DATA BLOCK.                 *
```

```
                         *                                              *
                         *          CALLING SEQUENCE:                   *
                         *             JSR XMIT                         *
                         *             RETURN                           *
                         *                                              *
                         ************************************************


            1B10       A XMIT    EQU      *
     1B10 3D 15        A         TST      ZCFLAG    ZERO CROSSING OCCURRED?
     1B12 27 FC     1B10         BEQ      XMIT      NO.
     1B14 3F 15        A         CLR      ZCFLAG    YES.  RESET FLAG.
     1B16 C7 1000      A         STA      WDOG      KICK WATCHDOG TIMER.
     1B19 B6 16        A         LDA      ZCCNT     TIME TO TRANSMIT?
     1B1B B1 13        A         CMPA     XMTTIM
     1B1D 26 F1     1B10         BNE      XMIT      NO.
     1B1F B6 17        A         LDA      ZCCNT+1   MAYBE.
     1B21 B1 14        A         CMPA     XMTTIM+1 TIME TO TRANSMIT?
     1B23 25 EB     1B10         BLO      XMIT      NO.
     1B25 14 01        A         BSET     XMTTER,PORTB YES.  ENABLE TRANSMITTER.
     1B27 A6 4E        A         LDA      #CLKINT   DISABLE CLOCK INTERRUPTS.
     1B29 B7 09        A         STA      CLOKCR
     1B2B A6 0A        A         LDA      #10
     1B2D B7 08        A         STA      CLOCK     SET CLOCK FOR 1 MS.
     1B2F B6 08        A XMWAIT  LDA      CLOCK     GET CURRENT CLOCK VALUE.
     1B31 26 FC     1B2F         BNE      XMWAIT    TIME UP?  NO.
     1B33 A6 78        A         LDA      #CLKEXT   YES.  SET UP CLOCK FOR EXT. INPUT
     1B35 B7 09        A         STA      CLOKCR
     1B37 A6 57        A         LDA      #XBITS+XDELAY SET DATA BIT COUNT.
     1B39 B7 08        A         STA      CLOCK
     1B3B 13 01        A         BCLR     MANCTL,PORTB ENABLE MANCHESTER ENCODER.
     1B3D B6 08        A XMWMAN  LDA      CLOCK     ALL DATA TRANSMITTED?
     1B3F 26 FC     1B3D         BNE      XMWMAN    NO.
     1B41 12 01        A         BSET     MANCTL,PORTB YES.  DISABLE MANCHESTER ENCO
     1B43 15 01        A         BCLR     XMTTER,PORTB DISABLE TRANSMITTER.
     1B45 A6 4E        A         LDA      #CLKINT   SET CLOCK FOR INTERNAL OSCILLATOR
     1B47 B7 09        A         STA      CLOKCR
     1B49 81                     RTS                RETURN.
                         * INTRPT
                         ************************************************
                         *                                              *
                         *  ZCINT:  PROCESSES ZERO CROSSING INTERRUPTS. *
                         *                                              *
                         *          CALLING SEQUENCE:                   *
                         *             FROM HARDWARE IRQ VECTOR         *
                         *             RETURN FROM INTERRUPT            *
                         *                                              *
                         ************************************************


            1B4A       A ZCINT   EQU      *
     1B4A 3D 1B        A         TST      START     TIME TO INITIATE CYCLE?
     1B4C 27 12     1B60         BEQ      ZCGO      NO.
     1B4E 18 00        A         BSET     FREEZE,PORTA YES.  FREEZE ANALOGS.
     1B50 3F 1B        A         CLR      START     RESET CYCLE INITIATE FLAG.
     1B52 A6 01        A         LDA      #1
     1B54 B7 19        A         STA      SMPFLG    SET TIME TO SAMPLE FLAG.
     1B56 17 01        A         BCLR     STATUS,PORTB CLEAR STATUS BIT.
     1B58 B6 11        A         LDA      CYCTIM    SET CLOCK.
     1B5A B7 08        A         STA      CLOCK
     1B5C A6 0E        A         LDA      #CLKIRQ   ENABLE CLOCK INTERRUPTS.
     1B5E B7 09        A         STA      CLOKCR
     1B60 3D 1A        A ZCGO    TST      SYNFLG    INITIATE SYNC MODE?
     1B62 27 0A     1B6E         BEQ      ZCBUMP    NO.
     1B64 A6 4E        A         LDA      #CLKINT   YES.  RESET CLOCK PRESCALER.
     1B66 B7 09        A         STA      CLOKCR
     1B68 A6 FF        A         LDA      #$FF
     1B6A B7 08        A         STA      CLOCK     INITIALIZE CLOCK VALUE.
     1B6C 3F 1A        A         CLR      SYNFLG    RESET SYNC MODE FLAG.
     1B6E B6 08        A ZCBUMP  LDA      CLOCK     GET CURRENT CLOCK READING.
     1B70 43                     COMA               COMPLEMENT TO GET ELAPSED TIME.
     1B71 B7 10        A         STA      LSTTIM    SAVE AS LAST CYCLE TIME.
     1B73 A6 01        A         LDA      #1        SET ZERO CROSSING OCCURRED FLAG.
```

```
00832A 1B75 B7 15       A        STA    ZCFLAG
00833A 1B77 3C 17       A        INC    ZCCNT+1  BUMP ZERO CROSSING COUNT.
00834A 1B79 26 02    1B7D        BNE    ZCRET    CARRY?  NO.
00835A 1B7B 3C 16       A        INC    ZCCNT    YES.  BUMP MS BYTE.
00836A 1B7D 80            ZCRET  RTI             RETURN.

00838                     * INTRPT
00839                     ************************************************
00840                     *                                              :
00841                     *   CLINT:  PROCESSES CLOCK INTERRUPTS.
00842                     *                                              :
00843                     *          CALLING SEQUENCE:
00844                     *              FROM HARDWARE CLOCK VECTOR      :
00845                     *              RETURN FROM INTERRUPT
00846                     *                                              :
00847                     ************************************************

00849           1B7E    A CLINT  EQU    *
00850A 1B7E 18 00       A        BSET   FREEZE,PORTA FREEZE ANALOG VALUES.
00851A 1B80 1F 09       A        BCLR   7,CLOKCR RESET IRQ FLAG.
00852A 1B82 A6 01       A        LDA    #1
00853A 1B84 B7 19       A        STA    SMPFLG   SET TIME TO SAMPLE FLAG.
00854A 1B86 BE 11       A        LDX    CYCTIM   RESET CLOCK.
00855A 1B88 B6 12       A        LDA    REMAIN   GET TIMER REMAINDER VALUE.
00856A 1B8A BB 61       A        ADD    CLKREM   ADD TO REMAINDER ACCUMULATOR.
00857A 1B8C B7 61       A        STA    CLKREM
00858A 1B8E 24 01    1B91        BCC    CLKSTR   CARRY?  NO.
00859A 1B90 5C                   INX             YES.  ADJUST TIMER VALUE.
00860A 1B91 BF 08       A CLKSTR STX    CLOCK
00861A 1B93 80                   RTI             RETURN.
00863                     * READAC
00864                     ************************************************
00865                     *                                              )
00866                     *  READAC:  READS THE DAC/COMPARATOR CIRCUIT TO  )
00867                     *           DETERMINE TRANSDUCER VALUES.         )
00868                     *                                              ;
00869                     *           CALLING SEQUENCE:                  )
00870                     *               JSR READAC                     :
00871                     *               RETURN                         )
00872                     *               A,X = 12 BIT VALUE             :
00873                     *                                              )
00874                     ************************************************

00876           1B94    A READAC EQU    *
00877A 1B94 AE 08       A        LDX    #$08     GET INITIAL TEST VALUE.
00878A 1B96 BF 5D       A        STX    VALUE    SAVE AS MS TEST VALUE.
00879A 1B98 BF 5F       A        STX    VALINC   SAVE AS MS INCREMENTAL VALUE.
00880A 1B9A AE 00       A        LDX    #0
00881A 1B9C BF 5E       A        STX    VALUE+1  RESET LS TEST VALUE.
00882A 1B9E BF 60       A        STX    VALINC+1 RESET LS INCREMENTAL VALUE.

00884A 1BA0 3D 5F       A RDLOOP TST    VALINC   GET INCREMENATAL VALUE.
00885A 1BA2 26 04    1BA8        BNE    RDMORE   DONE?  NO.  CONTINUE.
00886A 1BA4 3D 60       A        TST    VALINC+1 MAYBE.  CHECK LS BYTE.
00887A 1BA6 27 43    1BEB        BEQ    RDEND    DONE?  YES.
00888A 1BA8 B6 5E       A RDMORE LDA    VALUE+1  NO.  GET LS NIBBLE OF VALUE.
00889A 1BAA A4 0F       A        AND    #$0F
00890A 1BAC C7 1000     A        STA    DAC00    WRITE TO DAC.
00891A 1BAF B6 5E       A        LDA    VALUE+1  GET MIDDLE NIBBLE.
00892A 1BB1 44                   LSRA
00893A 1BB2 44                   LSRA
00894A 1BB3 44                   LSRA
00895A 1BB4 44                   LSRA
00896A 1BB5 C7 1001     A        STA    DAC01    WRITE TO DAC.
00897A 1BB8 B6 5D       A        LDA    VALUE    GET MS NIBBLE.
00898A 1BBA A4 0F       A        AND    #$0F
00899A 1BBC C7 1002     A        STA    DAC02    WRITE TO DAC.
00900A 1BBF C7 1003     A        STA    DAC03    INITIATE CONVERSION.
00901A 1BC2 A6 0A       A        LDA    #10      GIVE DAC A CHANCE TO THINK.
00902A 1BC4 4A            RDWAIT DECA            WAITED LONG ENOUGH?
00903A 1BC5 26 FD    1BC4        BNE    RDWAIT   NO.
00904A 1BC7 34 5F       A        LSR    VALINC   YES.  DIVIDE INCREMENTAL VALUE B
```

```
1BC9 36 60          A          ROR   VALINC+1
1BCB B6 01          A          LDA   PORTB     GET COMPARATOR VALUE.
1BCD 2A 0E    1BDD             BPL   RDADD     GREATER THAN?  YES.

1BCF B6 5E          A          LDA   VALUE+1   NO.  GET VALUE.
1BD1 B2 60          A          SBC   VALINC+1  SUBTRACT INCREMENTAL VALUE.
1BD3 B7 5E          A          STA   VALUE+1
1BD5 B6 5D          A          LDA   VALUE
1BD7 B2 5F          A          SBC   VALINC
1BD9 B7 5D          A          STA   VALUE
1BDB 20 C3    1BA0             BRA   RDLOOP    TEST AGAIN.

1BDD B6 5E          A RDADD    LDA   VALUE+1   GET VALUE.
1BDF BB 60          A          ADD   VALINC+1  ADD INCREMENTAL VALUE.
1BE1 B7 5E          A          STA   VALUE+1
1BE3 B6 5D          A          LDA   VALUE
1BE5 B9 5F          A          ADC   VALINC
1BE7 B7 5D          A          STA   VALUE
1BE9 20 B5    1BA0             BRA   RDLOOP    TEST AGAIN.

1BEB B6 5D          A RDEND    LDA   VALUE     GET MS VALUE BYTE.
1BED A5 08          A          BIT   #$08      IS MS VALUE BIT SET?
1BEF 26 04    1BF5             BNE   RDSET     YES.
1BF1 AA F8          A          ORA   #$F8      NO.  CONVERT TO NEGATIVE TWOS COM
1BF3 20 02    1BF7             BRA   RDRET
1BF5 A4 07          A RDSET    AND   #$07      CONVERT TO POSITIVE TWOS COMPLEME
1BF7 BE 5E          A RDRET    LDX   VALUE+1
1BF9 81                        RTS             RETURN.
                      * DIVUTL
                      ***********************************************
                      *                                             *
                      *  DIVABS:  GETS THE TWO'S COMPLEMENT OF THE VALUE  *
                      *           AT X, IF NEGATIVE, AND SETS A SIGN FLAG.  *
                      *                                             *
                      *           CALLING SEQUENCE:                 *
                      *               X = VALUE ADDRESS (4 BYTES)   *
                      *               JSR DIVABS                    *
                      *               RETURN                        *
                      *               ABSIGN = SIGN ($FF = NEGATIVE)  *
                      *                             ($00 = POSITIVE)  *
                      *                                             *
                      ***********************************************

           1BFA     A DIVABS EQU   *
1BFA 3F 64          A        CLR   ABSIGN    RESET NEGATIVE VALUE FLAG.
1BFC 7D                      TST   0,X       NEGATIVE VALUE?
1BFD 2A 05    1C04           BPL   DARET     NO.
1BFF CD 1C05        A        JSR   COMP2     YES.  TWO'S COMPLEMENT IT.
1C02 33 64          A        COM   ABSIGN    SET NEGATIVE VALUE FLAG.
1C04 81               DARET  RTS             RETURN.
                      * DIVUTL
                      ***********************************************
                      *                                             *
                      *  COMP2:  GETS THE TWO'S COMPLEMENT OF THE VALUE  *
                      *          AT X.                              *
                      *                                             *
                      *           CALLING SEQUENCE:                 *
                      *               X = VALUE ADDRESS (4 BYTES)   *
                      *               JSR COMP2                     *
                      *               RETURN                        *
                      *                                             *
                      ***********************************************

           1C05     A COMP2  EQU   *
1C05 73                      COM   0,X       GET TWO'S COMPLEMENT.
1C06 63 01          A        COM   1,X
1C08 63 02          A        COM   2,X
1C0A 63 03          A        COM   3,X
1C0C 6C 03          A        INC   3,X
1C0E 26 09    1C19           BNE   CMPRET    CARRY? NO.
1C10 6C 02          A        INC   2,X       YES.  PROPAGATE IT.
```

```
00978A 1C12 26 05    1C19          BNE    CMPRET    CARRY?  NO.
00979A 1C14 6C 01       A          INC    1,X       YES.  PROPAGATE IT.
00980A 1C16 26 01    1C19          BNE    CMPRET    CARRY?  NO.
00981A 1C18 7C                     INC    0,X       YES.  PROPAGATE IT.
00982A 1C19 81              CMPRET RTS              RETURN.
00984                       * DIVUTL
00985                       ***************************************************
00986                       *                                                 *
00987                       *    DIVCNV:  FINDS THE TWO'S COMPLEMENT OF THE FOUR    *
00988                       *             BYTE VALUE AT X, IF 'ABSIGN' IS NON-ZERO. *
00989                       *             ALSO SHIFTS RESULT RIGHT ONE NIBBLE.      *
00990                       *                                                 *
00991                       *             CALLING SEQUENCE:                   *
00992                       *                 X = VALUE ADDRESS               *
00993                       *                 JSR DIVCNV                      *
00994                       *                 RETURN                          *
00995                       *                                                 *
00996                       ***************************************************

00998            1C1A       A DIVCNV EQU    *
00999A 1C1A 3D 64       A          TST    ABSIGN    IS VALUE NEGATIVE?
01000A 1C1C 27 02    1C20          BEQ    DCRET     NO.  RETURN.
01001A 1C1E AD E5    1C05          BSR    COMP2     YES.  GET TWO'S COMPLEMENT.
01002A 1C20 A6 04       A   DCRET  LDA    #4        SET SHIFT COUNT.
01003A 1C22 74              DIV16  LSR    0,X       SHIFT RIGHT ONE NIBBLE.
01004A 1C23 66 01       A          ROR    1,X
01005A 1C25 66 02       A          ROR    2,X
01006A 1C27 66 03       A          ROR    3,X
01007A 1C29 4A                     DECA             DONE?
01008A 1C2A 26 F6    1C22          BNE    DIV16     NO.
01009A 1C2C 81                     RTS              YES.  RETURN.
01011                       * DIVID9
01012                       ***************************************************
01013                       *                                                 *
01014                       *    DIV3X2:  DIVIDES A THREE BYTE VALUE BY A TWO     *
01015                       *             BYTE VALUE.                         *
01016                       *    DIV4X2:  DIVIDES A FOUR BYTE VALUE BY A TWO      *
01017                       *             BYTE VALUE.                         *
01018                       *                                                 *
01019                       *             CALLING SEQUENCE:                   *
01020                       *                 X = ADDRESS OF DIVIDEND         *
01021                       *                 ACCSHF+2,3 = DIVISOR            *
01022                       *                 JSR DIV4X2/DIV3X2/DIV2X2        *
01023                       *                 RETURN                          *
01024                       *                 X = ADDRESS OF FOUR BYTE QUOTIENT *
01025                       *                                                 *
01026                       *    NOTE:  THIS ROUTINE HAS NO PROTECTION AGAINST    *
01027                       *           DIVISION BY ZERO.                     *
01028                       *                                                 *
01029                       ***************************************************

01031            1C2D       A DIV3X2 EQU    *
01032A 1C2D 3F 2D       A          CLR    ACCVAL    RESET MS BYTE.
01033A 1C2F 20 04    1C35          BRA    DIVST2
01034            1C31       A DIV4X2 EQU    *
01035A 1C31 F6                     LDA    0,X
01036A 1C32 B7 2D       A          STA    ACCVAL
01037A 1C34 5C                     INX
01038A 1C35 F6              DIVST2 LDA    0,X
01039A 1C36 B7 2E       A          STA    ACCVAL+1
01040A 1C38 5C                     INX
01041A 1C39 F6                     LDA    0,X
01042A 1C3A B7 2F       A          STA    ACCVAL+2
01043A 1C3C 5C                     INX
01044A 1C3D F6                     LDA    0,X
01045A 1C3E B7 30       A          STA    ACCVAL+3
01046A 1C40 AE 2D       A          LDX    #ACCVAL   GET DIVIDEND ADDRESS.
01047A 1C42 A6 00       A          LDA    #0
01048A 1C44 B7 35       A          STA    ACCSHF+0 RESET MS DIVISOR BYTES.
01049A 1C46 B7 36       A          STA    ACCSHF+1
01050A 1C48 B7 39       A          STA    ACCSUM+0 RESET WORKING LOCATIONS.
```

```
01051A 1C4A B7 3A        A        STA    ACCSUM+1
01052A 1C4C B7 3B        A        STA    ACCSUM+2
01053A 1C4E B7 3C        A        STA    ACCSUM+3
01054A 1C50 B7 29        A        STA    ACCQUO+0
01055A 1C52 B7 2A        A        STA    ACCQUO+1
01056A 1C54 B7 2B        A        STA    ACCQUO+2
01057A 1C56 B7 2C        A        STA    ACCQUO+3
01058A 1C58 B7 32        A        STA    ACCPOS+1
01059A 1C5A B7 33        A        STA    ACCPOS+2
01060A 1C5C B7 34        A        STA    ACCPOS+3
01061A 1C5E A6 01        A        LDA    #%00000001 SET POSITION REGISTER.
01062A 1C60 B7 34        A        STA    ACCPOS+3
01063A 1C62 AD 09     1C6D        BSR    SHFTLF   LEFT JUSTIFY VALUES.
01064A 1C64 AD 1A     1C80 DIVAGN BSR    SUBPR    PERFORM DIVIDE.
01065A 1C66 AD 59     1CC1        BSR    SHFTRT   SHIFT RIGHT.
01066A 1C68 24 FA     1C64        BCC    DIVAGN   DONE?  NO.
01067A 1C6A AE 29        A        LDX    #ACCQUO  YES.  GET QUOTIENT ADDRESS.
01068A 1C6C 81                    RTS             RETURN.
01070          1C6D      A SHFTLF EQU    *
01071A 1C6D 38 34        A        ASL    ACCPOS+3 SHIFT POSITION BIT.
01072A 1C6F 39 33        A        ROL    ACCPOS+2
01073A 1C71 39 32        A        ROL    ACCPOS+1
01074A 1C73 39 31        A        ROL    ACCPOS+0
01075A 1C75 38 38        A        ASL    ACCSHF+3 SHIFT DIVISOR.
01076A 1C77 39 37        A        ROL    ACCSHF+2
01077A 1C79 39 36        A        ROL    ACCSHF+1
01078A 1C7B 39 35        A        ROL    ACCSHF+0
01079A 1C7D 2A EE     1C6D        BPL    SHFTLF   LEFT JUSTIFIED?  NO.
01080A 1C7F 81                    RTS             YES.  RETURN.

01082          1C80      A SUBPR  EQU    *
01083A 1C80 E6 03        A        LDA    3,X
01084A 1C82 B0 38        A        SUB    ACCSHF+3
01085A 1C84 B7 3C        A        STA    ACCSUM+3
01086A 1C86 E6 02        A        LDA    2,X
01087A 1C88 B2 37        A        SBC    ACCSHF+2
01088A 1C8A B7 3B        A        STA    ACCSUM+2
01089A 1C8C E6 01        A        LDA    1,X
01090A 1C8E B2 36        A        SBC    ACCSHF+1
01091A 1C90 B7 3A        A        STA    ACCSUM+1
01092A 1C92 F6                    LDA    0,X
01093A 1C93 B2 35        A        SBC    ACCSHF+0
01094A 1C95 B7 39        A        STA    ACCSUM+0
01095A 1C97 25 27     1CC0        BCS    SURET    BORROW?  YES.
01096A 1C99 B6 29        A        LDA    ACCQUO+0
01097A 1C9B BA 31        A        ORA    ACCPOS+0
01098A 1C9D B7 29        A        STA    ACCQUO+0
01099A 1C9F B6 2A        A        LDA    ACCQUO+1
01100A 1CA1 BA 32        A        ORA    ACCPOS+1
01101A 1CA3 B7 2A        A        STA    ACCQUO+1
01102A 1CA5 B6 2B        A        LDA    ACCQUO+2
01103A 1CA7 BA 33        A        ORA    ACCPOS+2
01104A 1CA9 B7 2B        A        STA    ACCQUO+2
01105A 1CAB B6 2C        A        LDA    ACCQUO+3
01106A 1CAD BA 34        A        ORA    ACCPOS+3
01107A 1CAF B7 2C        A        STA    ACCQUO+3
01108A 1CB1 B6 39        A        LDA    ACCSUM+0
01109A 1CB3 F7                    STA    0,X
01110A 1CB4 B6 3A        A        LDA    ACCSUM+1
01111A 1CB6 E7 01        A        STA    1,X
01112A 1CB8 B6 3B        A        LDA    ACCSUM+2
01113A 1CBA E7 02        A        STA    2,X
01114A 1CBC B6 3C        A        LDA    ACCSUM+3
01115A 1CBE E7 03        A        STA    3,X
01116A 1CC0 81             SURET  RTS             RETURN.

01118A 1CC1 34 35        A SHFTRT LSR    ACCSHF+0 SHIFT RIGHT.
01119A 1CC3 36 36        A        ROR    ACCSHF+1
01120A 1CC5 36 37        A        ROR    ACCSHF+2
01121A 1CC7 36 38        A        ROR    ACCSHF+3
01122A 1CC9 34 31        A        LSR    ACCPOS+0
01123A 1CCB 36 32        A        ROR    ACCPOS+1
```

```
1CCD 36 33       A         ROR     ACCPOS+2
1CCF 36 34       A         ROR     ACCPOS+3
1CD1 81                    RTS
                      * MULT
                      ***********************************************************
                      *                                                         *
                      *   MULT:  PERFORMS A 16 BIT BY 16 BIT MULTIPLICATION.    *
                      *                                                         *
                      *          CALLING SEQUENCE:                              *
                      *              MLTBUF+1,2 = VALUE 1                       *
                      *              MLTBUF+3,4 = VALUE 2                       *
                      *              JSR MULT                                   *
                      *              RETURN                                     *
                      *              MLTBUF+5,6,1,2 = PRODUCT                   *
                      *                                                         *
                      ***********************************************************

          1CD2       A MULT    EQU     *
1CD2 AE 22       A         LDX     #MLTBUF   GET BUFFER POINTER.
1CD4 A6 10       A         LDA     #16
1CD6 F7                    STA     0,X       SET BIT COUNTER.
1CD7 6F 05       A         CLR     5,X       CLEAR PRODUCT BYTES.
1CD9 6F 06       A         CLR     6,X
1CDB 66 01       A         ROR     1,X       SHIFT MULTIPLIER.
1CDD 66 02       A         ROR     2,X
1CDF 24 0C    1CED MULNXT  BCC     MULROT    BIT SHIFTED OUT?  NO.
1CE1 E6 06       A         LDA     6,X       YES.  ADD MULTIPLICAND TO PRODUC
1CE3 EB 04       A         ADD     4,X
1CE5 E7 06       A         STA     6,X
1CE7 E6 05       A         LDA     5,X
1CE9 E9 03       A         ADC     3,X
1CEB E7 05       A         STA     5,X
1CED 66 05       A MULROT  ROR     5,X
1CEF 66 06       A         ROR     6,X
1CF1 66 01       A         ROR     1,X
1CF3 66 02       A         ROR     2,X
1CF5 7A                    DEC     0,X       DONE?
1CF6 26 E7    1CDF         BNE     MULNXT    NO.
1CF8 81                    RTS               YES.  RETURN.
                      * PRODUCT IN MLTBUF+5,6,1,2

                      * RESET
                      ***********************************************************
                      *                                                         
                      *   RESET:  HANDLES POWER-ON RESET INITIALIZATION.        
                      *                                                         
                      *           CALLING SEQUENCE:                             
                      *               FROM HARDWARE VECTOR                      
                      *               JMP  MAIN                                 
                      *                                                         
                      ***********************************************************

          1CF9       A RESET   EQU     *
1CF9 9B                    SEI               INHIBIT INTERRUPTS.
1CFA 9C                    RSP               RESET STACK IF NOT A HARDWARE RE
1CFB AE 10       A         LDX     #RAMSTR   GET RAM START POINTER.
1CFD 7F            RSTCLR  CLR     0,X       INITIALIZE RAM.
1CFE 5C                    INX               BUMP RAM POINTER.
1CFF A3 80       A         CPX     #RAMEND   DONE ALL?
1D01 26 FA    1CFD         BNE     RSTCLR    NO.  CONTINUE.
1D03 A6 F0       A         LDA     #$F0      SET PORT A DATA DIRECTION.
1D05 B7 04       A         STA     PADDR
1D07 A6 1F       A         LDA     #$1F      SET PORT B DATA DIRECTION.
1D09 B7 05       A         STA     PBDDR
1D0B A6 46       A         LDA     #$46      SET CLOCK (NO IRQ, DIVIDE BY 64)
1D0D B7 09       A         STA     CLOKCR
1D0F A6 FF       A         LDA     #$FF      INITIALIZE CLOCK.
1D11 B7 08       A         STA     CLOCK
1D13 15 01       A         BCLR    XMTTER,PORTB INHIBIT TRANSMITTER.
1D15 12 01       A         BSET    MANCTL,PORTB INHIBIT MANCHESTER ENCODER.
1D17 AE A0       A         LDX     #160      INITIALIZE CYCLE TIME.
1D19 BF 10       A         STX     LSTTIM
1D1B AE B2       A         LDX     #178      INITIALIZE SAMPLE TIMER VALUE.
1D1D BF 11       A         STX     CYCTIM
```

```
01201A 1D1F 9A                  CLI               ENABLE INTERRUPTS.
01202A 1D20 CC 1846     A       JMP    MAIN       JUMP TO MAINLINE.
01204                         * UPDATES
01205                         ***********************************************
01206                         *
01207                         *                                             *
01208                         *  PROGRAM REVISION HISTORY                   *
01209                         *                                             *
01210                         ***********************************************
01211
01212                         * 00 - 08 JAN 83   INITIAL PROTOTYPE VERSION
01213                         * 01 - 10 JAN 83   MISCELLANEOUS CLEANUP
01214                         * 02 - 11 JAN 83   DIVUTL ADDED, MISC CLEANUP
01215                         * 03 - 11 JAN 83   ADDED SHIFT RIGHT TO DIVCNV
01216                         *      13 JAN 83   CORRECTED TRANSMIT TIMING
                              *                  ADDED SPARE AUX VALUE
01218                         * VECTOR
01219                         ***************************************************
01220                         *                                                 *
01221                         *                                                 *
01222                         *                                                 *
01223                         *     HARDWARE RESET AND INTERRUPT VECTOR         *
01224                         *               DEFINITIONS                       *
01225                         *                                                 *
01226                         ***************************************************

01228A 1FF6
01229A 1FF6     1CF9     A      ORG    $1FF6
01230A 1FF8     1B7E     A      FDB    RESET      WAIT STATE INTERRUPT (WAI)
01231A 1FFA     1B4A     A      FDB    CLINT      CLOCK INTERRUPT VECTOR
01232A 1FFC     1CF9     A      FDB    ZCINT      INTERRUPT VECTOR (IRQ)
01233A 1FFE     1CF9     A      FDB    RESET      INTERRUPT VECTOR (SWI)
                                FDB    RESET      POWER ON RESET
01235                           END
TOTAL ERRORS 00000--00000


0064 ABSIGN 00156*00492 00500 00530 00531 00950 00954 00999
19C1 ABSNEG 00498 00500*
19C3 ABSRET 00494 00501*
19AA ABSVAL 00427 00438 00449 00460 00487*
0031 ACCPOS 00120*01058 01059 01060 01062 01071 01072 01073 01074 01097 01100
            01103 01106 01122 01123 01124 01125
0029 ACCQUO 00118*01054 01055 01056 01057 01067 01096 01098 01099 01101 01102
            01104 01105 01107
0035 ACCSHF 00121*00284 00285 00575 00577 00588 00590 00601 00603 00614 00616
            01048 01049 01075 01076 01077 01078 01084 01087 01090 01093 01118
            01119 01120 01121
0039 ACCSUM 00122*01050 01051 01052 01053 01085 01088 01091 01094 01108 01110
            01112 01114
002D ACCVAL 00119*01032 01036 01039 01042 01045 01046
19C4 ADDCOS 00435 00457 00518*
19D0 ADDSIN 00446 00468 00526*
19F6 ASADD  00532 00547*
19D8 ASNEG  00523 00529 00531*
19D6 ASPOS  00521 00524 00530*
1A0C ASRET  00546 00559*
19DE ASSUB  00533 00534*
0057 AUX    00141*00407 00408
0040 AUX1   00114*00333
0020 AUXID  00113*00329 00334 00404


005B BYTCNT 00149*00718 00731
1832 C0     00202*
1834 C1     00203*
1836 C2     00204*
1838 C3     00205*
183A C4     00206*
```

```
183C C5      00207*
183E C6      00208*
1840 C7      00209*
1842 C8      00210*
1B7E CLINT   00849*01230
0078 CLKEXT  00091*00785
004E CLKINT  00090*00259 00400 00779 00794 00823
000E CLKIRQ  00092*00819
0061 CLKREM  00153*00316 00856 00857
1B91 CLKSTR  00858 00860*
0008 CLOCK   00051*00782 00783 00788 00790 00818 00826 00828 00860 01193
0009 CLOKCR  00052*00260 00401 00780 00786 00795 00820 00824 00851 01191
1C19 CMPRET  00976 00978 00980 00982*
1C05 COMP2   00953 00970*01001
1A0D COMPUT  00232 00573*
1832 COSINE  00201*00429 00431 00451 00453
1ABC CP00    00691*00701
1ACF CP01    00693 00700*
1AB8 CPOLY   00655 00670 00688*
1A82 CRC12   00234 00640*
0062 CRCCNT  00154*00642 00671
1A8C CRCNXT  00646*00672
0059 CRCVAL  00142*00643 00644 00648 00649 00653 00654 00660 00661 00667 00668

             00691 00692 00693 00694 00696 00697 00699
001C CURENT  00111*00387 00388 00448 00459
0011 CYCTIM  00101*00288 00817 00854 01199
1000 DAC00   00054*00058 00890
1001 DAC01   00055*00896
1002 DAC02   00056*00899
1003 DAC03   00057*00900
1C04 DARET   00952 00955*
004D DATBUF  00135*00645 00719
1C20 DCRET   01000 01002*
1C22 DIV16   01003*01008
1C2D DIV3X2  00286 01031*
1C31 DIV4X2  00580 00593 00606 00619 01034*
1BFA DIVABS  00579 00592 00605 00618 00949*
1C64 DIVAGN  01064*01066
1C1A DIVCNV  00581 00594 00607 00620 00998*
1844 DIVIDR  00215*00574 00576 00587 00589 00600 00602 00613 00615
1C35 DIVST2  01033 01038*
0004 FREEZE  00073*00308 00409 00812 00850
18EB GETVAL  00231 00351*00353
18F3 GVWAIT  00356*00357 00366
18E4 HK01    00332 00334*
18B7 HKCLR   00311*00314
18B1 HKEEP   00230 00307*
0053 IA      00139*00609 00611
0045 IASUM   00129*00456 00604
0055 IB      00140*00622 00624
0049 IBSUM   00130*00467 00617
004D IDBYTE  00136*00319 00320 00321 00335 00336


000F IDMASK  00072*00318
0010 LSTTIM  00100*00275 00830 01197
1846 MAIN    00228*00238 01202
0001 MANCTL  00078*00789 00792 01195
0022 MLTBUF  00116*00430 00432 00441 00443 00452 00454 00463 00465 00489 00491
             00493 00495 00496 00497 00499 00535 00538 00541 00544 00548 00551
             00554 00557 01143
1CDF MULNXT  01150*01162
1CED MULROT  01150 01157*
1CD2 MULT    00433 00444 00455 00466 01142*
0004 PADDR   00049*01187
0005 PBDDR   00050*01189
1800 PGMSTR  00035*00163
0018 POLY1   00040*00695
000F POLY2   00041*00698
0000 PORTA   00047*00308 00317 00382 00385 00389 00392 00402 00405 00409 00812
             00850
0001 PORTB   00048*00738 00746 00748 00749 00750 00778 00789 00792 00793 00816
             00906 01194 01195
```

```
0080 RAMEND 00034*01183
0010 RAMSTR 00033*00098 01180
1BDD RDADD  00907 00917*
1BEB RDEND  00887 00925*
1BA0 RDLOOP 00884*00915 00923
1BA8 RDMORE 00885 00888*
1BF7 RDRET  00929 00931*
1BF5 RDSET  00927 00930*
1BC4 RDWAIT 00902*00903
1B94 READAC 00386 00393 00406 00876*

0012 REMAIN 00102*00290 00855
1CF9 RESET  01177*01229 01232 01233
1CFD RSTCLR 01181*01184
1820 S0     00191*
1822 S1     00192*
1824 S2     00193*
1826 S3     00194*
1828 S4     00195*
182A S5     00196*
182C S6     00197*
182E S7     00198*
1830 S8     00199*
190C SAMPLE 00360 00381*
1946 SAMRET 00399 00409*
0000 SCURR  00084*00384
1AFD SHFAGN 00737 00744*00752
0004 SHFCLK 00081*00749 00750
1B04 SHFCLR 00745 00748*
0063 SHFCNT 00155*00690 00700
1ADA SHFNXT 00720*00732
0000 SHFTIN 00077*00746 00748
1C6D SHFTLF 01063 01070*01079
1B06 SHFTOG 00747 00749*
1CC1 SHFTRT 01065 01118*
1AD4 SHIFT  00235 00716*
1AF9 SHIFT4 00726 00729 00730 00734 00735 00741*
1820 SINES  00190*00440 00442 00462 00464
00E0 SMASK  00083*00383 00390 00403
0014 SMPEND 00160*00365 00398

0019 SMPFLG 00108*00356 00358 00815 00853
0017 SMPNUM 00106*
0018 SMPTIM 00107*
001B START  00110*00292 00810 00813
0003 STATUS 00080*00738 00816
1C80 SUBPR  01064 01082*
003D SUMBUF 00126*00309
004D SUMCLR 00131*00313
1949 SUMS   00396 00425*
1CC0 SURET  01095 01116*
0020 SVOLT  00085*00391
1863 SYNC   00229 00252*
001A SYNFLG 00109*00258 00821 00827
1895 SYNNC  00278 00280*
1881 SYNNXT 00269*00270 00273
187B SYNWAI 00266*00267
1800 TIMTBL 00169*00323 00326
0021 TRIGIX 00115*00355 00361 00363 00428 00439 00450 00461 00519 00527
004F VA     00137*00262 00263 00276 00280 00281 00282 00583 00585
005F VALINC 00152*00879 00882 00884 00886 00904 00905 00910 00913 00918 00921
005D VALUE  00151*00878 00881 00888 00891 00897 00909 00911 00912 00914 00917
            00919 00920 00922 00925 00931
003D VASUM  00127*00434 00578
0051 VB     00138*00596 00598
0041 VBSUM  00128*00445 00591
001E VOLTS  00112*00394 00395 00426 00437
1000 WDOG   00058*00233 00237 00359 00771
0054 XBITS  00063*00787
0003 XDELAY 00064*00787
```

```
1B10 XMIT    00236 00767*00769 00774 00777
0000 XMTCNT  00161*
0002 XMTTER  00079*00778 00793 01194
0013 XMTTIM  00103*00325 00328 00773 00776
1B2F XMWAIT  00783*00784
1B3D XMWMAN  00790*00791
005C XTEMP   00150*00742 00753
1B6E ZCBUMP  00822 00828*
0016 ZCCNT   00105*00255 00256 00364 00397 00772 00775 00833 00835
0015 ZCFLAG  00104*00264 00266 00268 00269 00271 00352 00354 00768 00770 00832
1B60 ZCGO    00811 00821*
1B4A ZCINT   00809*01231
1B7D ZCRET   00834 00836*
```

APPENDIX B

Copyright © 1983

Product Development Services, Inc. (PDS)

```
MOTOROLA M68000 ASM VERSION  1.30RTI :  0.        .ACIA    .SA 03/21/83 04:54:29

                ACIA     IDNT     0,8                ACIA I/O port handler  3/21/83
                         OPT      PCS,BRS
                *
                *
                * SUBROUTINE:    AUXIO/HOSTIO
                *
                * REVISED:       3/21/83
                *
                * AUTHOR:        D. A. ZEICHNER
                *
                * PURPOSE:       IRP SVC ROUTINES FOR 6850 ACIA
                *
                * INPUTS:        None.
                *
                * OUTPUTS:       Character transmitted or received as appropriate.
                *
                * EXTERNAL REFERENCES/DEFINITIONS:
                *
                         XDEF     AUXIO
                         XDEF     HOSTIO
                *
                *
                * HARDWARE REFERENCES:
                *
                         XREF     AUXACIA
                         XREF     HOSTACIA
                *
                * RAM REFERENCES:
                *
                         XREF.S   5:AUXIO$
                         XREF.S   5:AUXOQ$
                         XREF.S   5:AUXTRAK
                         XREF.S   5:HSTIQ$
                         XREF.S   5:HSTOQ$
```

```
                         XREF.S   5:HOSTRAK
                         XREF.S   5:T_OFFLOD
                         XREF.S   5:T_OUTPUT
                         XREF.S   5:T_XMON
                    *
                    * EPROM (PROGRAM) REFERENCES:
                    *
                         XREF.S   9:DEQUE
                         XREF.S   9:DISPLY
                         XREF.S   9:ENQUE
                    *
                    REGS REG      A0-A3/D0/D1
                    *
                    *
       00000009          SECTION  PROM
                    *
9 00000000          AUXIO PUSH    REGS              SAVE REGISTERS
9 00000004 45FAFFFA      LEA      T_OFFLOD(PC),A2   POINT TO TASK FRAME
9 00000008 41FAFFF6      LEA      AUXOQ$(PC),A0     ASSUME OUTPUT
9 0000000C 4241          CLR      D1                (NO TASK FRAME OR FLAGS FOR OUTPUT)
9 0000000E 43F900000000  LEA      AUXACIA,A1        POINT TO ACIA
9 00000014 47FAFFEA      LEA      AUXTRAK(PC),A3    POINT TO TRACKING REGISTER
9 00000018 08110000      BTST     #0,(A1)
9 0000001C 6754          BEQ      ACOUT             THE XMITTER INTERRUPTED
                    *
9 0000001E 41FAFFE0      LEA      AUXIQ$(PC),A0     POINT TO QUEUE
9 00000022 323C0800      MOVE     #F$PDI,D1         GET WAKEUP FLAGS
9 00000026 602C          BRA      ACIN
                    *
                    *
                    *
9 00000028          HOSTIO PUSH   REGS              SAVE REGISTERS
9 0000002C 41FAFFD2      LEA      HSTOQ$(PC),A0     ASSUME XMITTER INTERRUPTED
9 00000030 45FAFFCE      LEA      T_OUTPUT(PC),A2
9 00000034 323C0200      MOVE     #F$XMIT,D1
9 00000038 43F900000000  LEA      HOSTACIA,A1       POINT TO ACIA
9 0000003E 47FAFFC0      LEA      HOSTRAK(PC),A3    POINT TO TRACKING REGISTER
9 00000042 08110000      BTST     #0,(A1)
9 00000046 672A          BEQ      ACOUT             GO XMIT CHARACTER

9 00000048 41FAFFB6      LEA      HSTIQ$(PC),A0     GET QUEUE POINTER
9 0000004C 45FAFFB2      LEA      T_XMON(PC),A2     GET TASK FRAME POINTER
9 00000050 323C0080      MOVE     #F$MON,D1         & WAKEUP FLAGS
                    *
                    *
9 00000054 10290002 ACIN MOVE.B   2(A1),D0          GET DATA FROM ACIA
9 00000058 08130007      BTST     #7,(A3)
9 0000005C 6746          BEQ      ACXIT             RECVD IRP DISABLED
9 0000005E 4EBAFFA0      JSR      ENQUE(PC)         PUT ON QUEUE
9 00000062 6402          BCC      ACROK             & RETURN OK
9 00000064 4E71          NOP                        NOP IN CASE QUEUE FILLS UP
                    *
9 00000066 304A     ACROK MOVE    A2,A0             POINT TO TASK FRAME
9 00000068 3001          MOVE     D1,D0             GET STARTUP FLAGS
9 0000006A 6738          BEQ      ACXIT             NO STARTUP FLAGS - QUIT NOW
9 0000006C               XSVC     READY             WAKE HIM UP
9 00000070 6032          BRA      ACXIT             & RETURN
                    *
                    *
9 00000072 1013     ACOUT MOVE.B  (A3),D0           CHECK TRACK-REG FOR XMIT IRP
9 00000074 08110002      BTST     #2,(A1)           CHECK FOR CARRIER ON ACIA
9 00000078 6630          BNE      NOCAR             WE DON'T HAVE A CARRIER DETECT!
9 0000007A 02000060      AND.B    #$60,D0
9 0000007E 0C000020      CMP.B    #$20,D0           XMIT ENABLED
9 00000082 6620          BNE      ACXIT
                    *
9 00000084 4EBAFF7A      JSR      DEQUE(PC)         GET DATA FROM QUEUE
9 00000088 6506          BCS      IRPOFF            QUEUE EMPTY - TURN OFF XMITTER
9 0000008A 13400002      MOVE.B   D0,2(A1)          TRANSMIT CHARACTER
9 0000008E 6014          BRA      ACXIT             DONE - RETURN
                    *
```

```
403 9 00000090 1013          IRPOFF   MOVE.B   (A3),D0              GET TRACKING REGISTER
404 9 00000092 08800005               BCLR     #5,D0                TURN OFF XMIT ENABLE
405 9 00000096 1280                   MOVE.B   D0,(A1)              SHUT OFF XMITTER
406 9 00000098 1680                   MOVE.B   D0,(A3)              AND UPDATE TRACKING REGISTER
407 9 0000009A 304A                   MOVE     A2,A0
408 9 0000009C 3001                   MOVE     D1,D0
409 9 0000009E 6704                   BEQ      ACXIT                NO ONE TO WAKE UP
410 9 000000A0                        XSVC     READY
411                          *
412 9 000000A4               ACXIT    PULL     REGS                 RESTORE REGISTERS
413 9 000000A8 4E73                   RTE                           & RETURN
414                          *
415                          *
416 9 000000AA 1013          NOCAR    MOVE.B   (A3),D0              GET TRACKING REGISTER
417 9 000000AC 08800007               BCLR     #7,D0                & TURN OFF RECEIVE IRP
418 9 000000B0 1280                   MOVE.B   D0,(A1)              SHUT OFF RECEIVER
419 9 000000B2 1680                   MOVE.B   D0,(A3)              & UPDATE TRACKING REGISTER
420                          *
421 9 000000B4 41FA0008               LEA      MSG0(PC),A0          GET THE MESSAGE
422 9 000000B8 4EBAFF46               JSR      DISPLY(PC)           PRINT IT
423 9 000000BC 60E6                   BRA      ACXIT                & QUIT
424                          *
425                          * MESSAGES:
426                          *
427 9 000000BE 0C2020204E4F MSG0     DC.B     FF,'  NO CARRIER',EOT
428
429                          *
430                          *
431                                   END

****** TOTAL ERRORS      0--
****** TOTAL WARNINGS    0--


MOTOROLA M68000 ASM VERSION  1.30RTI :   0.        .ACIA    .SA 03/21/83 04:54:29


SYMBOL TABLE LISTING


SYMBOL NAME     SECT   VALUE      CROSS-REF (LINENUMBERS)


.1SEC                 0000000A    -19
.AIOSIZ               00000038    -80
.AOOSIZ               00000038    -81
.COSINE               00000014    -44
.DIOSIZ               0000001C    -82
.EFFECT               0000001C    -43
.HIOSIZ               000000C8    -84
.HOOSIZ               00000180    -85
.ICOS                 0000000A    -51
.IEFF                 00000018    -55
.ISCALE               00000006    -67
.ISIN                 0000000E    -52
.KWH                  00000024    -62
.PIOSIZ               0000003F    -83
.RBFSIZ               00000400    -86
.SAMPLE               00000002    -42
.SCALE1               00000004    -73
.SCALE2               00000008    -74
.SCALE3               0000000C    -75
.SCALE4               00000010    -76
.SINE                 00000018    -45
.SPNJP     MACR  *               -291
.STEMP                0000001C    -56
.TEMP                 00000012    -53
.TOFSET               0000000E    -69
.TSCALE               0000000A    -68
.VCOS                 00000002    -49
```

```
 .VEFF                   00000014    -54
 .VSCALE                 00000002    -66
 .VSIN                   00000006    -50
 .WATTS                  00000020    -60
 .WATTSEC                00000022    -61
 ACIN              9     00000054   -377   359
 ACOUT             9     00000072   -391   355   370
 ACKOK             9     00000066   -384   381
 ACXIT             9     000000A4   -411   379   386   388   396   401   409   423
 AIBENT$                 00000026    -33
 AUXACIA   XREF    x     00000000   -321   352
 AUXIO     XDEF    9     00000000   -347  -315
 AUXIQ$    XREF    5     00000000   -326   357
 AUXOQ$    XREF    5     00000000   -327   350
 AUXTRAK   XREF    5     00000000   -328   353
 CHGENT                  00000034   -228
 CNTR                    0000002E   -119
 CPR                     00000024   -118
 CR                      0000000D    -25
 CTRL13                  00000000   -124
 CTRL2                   00000002   -125
 DEQUE     XREF    9     00000000   -338   398
 DEVINI                  00000014   -220
 DI$DEV                  0000000A   -257
 DI$EVF                  00000000   -254
 DI$IOM                  0000001B   -262
 DI$ISV                  00000006   -256
 DI$LNK                  00000016   -260
 DI$OWN                  00000002   -255
 DI$PTR                  00000012   -259
 DI$QUE                  0000000E   -258
 DI$RSO                  0000001A   -261
 DI$SIZ                  00000020   -265
 DI$STA                  0000001C   -263
 DI$USK                  0000001E   -264
 DIRENT$                 00000026    -32
 DISFLY    XREF    9     00000000   -339   422
 DSFTENT$                00000010    -36
 EEPROM                  00000007     -7
 ENQUE     XREF    9     00000000   -340   380
 EOT                     00000004    -22   427
 EOS       MACR    x                -180     1   210   211   212   213   214   220   221   222   223   224   225   226
                                     227   228   229   230   237   238   239   240   241   242   243   244   245   246
                                     254   255   256   257   258   259   260   261   262   263   264   271   272   273
                                     277   278   279   280   281   282   283   284
 ETX                     00000003    -21
 EX$DV0                  0000000A   -277
 EX$DV1                  0000000E   -278
 EX$DV2                  00000012   -279
 EX$DV3                  00000016   -280
 EX$DV4                  0000001A   -281
 EX$DV5                  0000001E   -282
 EX$DV6                  00000022   -283
 EX$DV7                  00000026   -284
 EX$NXT                  00000006   -273
 EX$SIZ                  0000002A   -285
 EX$TIM                  00000000   -271
 EX$TSK                  00000002   -272
 EXEC                    00000000   -210
 F$ASMPL                 00004000    -90
 F$DNUT                  00000400    -94
 F$EEPM                  00000040    -98
 F$KYBD                  00000100    -96
 F$MON                   00000080    -97   374
 F$OST                   00001000    -92
 F$PDI                   00000800    -93   358
 F$PROC                  00002000    -91
 F$XMIT                  00000200    -95   366
 FF                      0000000C    -24   427
 HOSTACIA  XREF    x     00000000   -322   367
 HOSTIO    XDEF    9     0000002B   -362  -316
```

| | | | | | | | | | | | | | | | | | |
|---|---|---|---|---|---|---|---|---|---|---|---|---|---|---|---|---|---|
| HOSTRAK | XREF | 5 | 00000000 | -331 | 368 | | | | | | | | | | | | |
| HSTIO$ | XREF | 5 | 00000000 | -329 | 372 | | | | | | | | | | | | |
| HSTOQ$ | XREF | 5 | 00000000 | -330 | 364 | | | | | | | | | | | | |
| HT | | | 00000009 | -23 | | | | | | | | | | | | | |
| IFTENT$ | | | 00000014 | -34 | | | | | | | | | | | | | |
| IFFOFF | | 9 | 00000090 | -403 | 399 | | | | | | | | | | | | |
| MAXAGE | | | 00000004 | -16 | | | | | | | | | | | | | |
| MSGO | | 9 | 0000008E | -427 | 421 | | | | | | | | | | | | |
| NEXTSK | | | 00000030 | -227 | | | | | | | | | | | | | |
| NOCAR | | 9 | 000000AA | -416 | 393 | | | | | | | | | | | | |
| ONESEC | | | 0003D090 | -13 | | | | | | | | | | | | | |
| ONETIK | | | 000009C4 | -15 | | | | | | | | | | | | | |
| OFTENT$ | | | 00000004 | -35 | | | | | | | | | | | | | |
| PAAR | | | 00000014 | -112 | | | | | | | | | | | | | |
| PACR | | | 0000000C | -108 | | | | | | | | | | | | | |
| PADDR | | | 00000004 | -104 | | | | | | | | | | | | | |
| PADR | | | 00000010 | -110 | | | | | | | | | | | | | |
| PBAR | | | 00000016 | -113 | | | | | | | | | | | | | |
| PBCR | | | 0000000E | -109 | | | | | | | | | | | | | |
| PBDDR | | | 00000006 | -105 | | | | | | | | | | | | | |
| PBDR | | | 00000012 | -111 | | | | | | | | | | | | | |
| PCDDR | | | 00000008 | -106 | | | | | | | | | | | | | |
| PCDR | | | 00000018 | -114 | | | | | | | | | | | | | |
| PGCR | | | 00000000 | -102 | | | | | | | | | | | | | |
| PIVR | | | 0000000A | -107 | | | | | | | | | | | | | |
| PROM | | | 00000009 | -6 | 346 | | | | | | | | | | | | |
| PSR | | | 0000001A | -115 | | | | | | | | | | | | | |
| PSRR | | | 00000002 | -103 | | | | | | | | | | | | | |
| PULL | MACR | * | | -149 | 1 | 412 | | | | | | | | | | | |
| PUSH | MACR | * | | -134 | 1 | 348 | 363 | | | | | | | | | | |
| RAM | | | 00000005 | -8 | | | | | | | | | | | | | |
| RDYALL | | | 00000008 | -212 | | | | | | | | | | | | | |
| READY | | | 00000004 | -211 | 367 | 410 | | | | | | | | | | | |
| REGS | REG | * | | -342 | 348 | 363 | 412 | | | | | | | | | | |
| RELEAS | | | 0000002C | -226 | | | | | | | | | | | | | |
| RESERV | | | 00000028 | -225 | | | | | | | | | | | | | |
| RESTRT | | | 0000003C | -230 | | | | | | | | | | | | | |
| S60 | | | 000039DF | -12 | | | | | | | | | | | | | |
| SAV$ | | | 0000002A | -284 | -283 | -282 | -281 | -280 | -279 | -278 | -277 | -273 | -272 | -271 | -269 | -264 | -263 |
| | | | | -262 | -261 | -260 | -259 | -258 | -257 | -256 | -255 | -254 | -252 | -246 | -245 | -244 | -243 |
| | | | | -242 | -241 | -240 | -239 | -238 | -237 | -235 | -230 | -229 | -228 | -227 | -226 | -225 | -224 |
| | | | | -223 | -222 | -221 | -220 | -214 | -213 | -212 | -211 | -210 | -206 | -1 | 1 | 210 | 211 |
| | | | | 212 | 213 | 214 | 220 | 221 | 222 | 223 | 224 | 225 | 226 | 227 | 228 | 229 | 230 |
| | | | | 237 | 238 | 239 | 240 | 241 | 242 | 243 | 244 | 245 | 246 | 247 | 254 | 255 | 256 |
| | | | | 257 | 258 | 259 | 260 | 261 | 262 | 263 | 264 | 265 | 271 | 272 | 273 | 277 | 278 |
| | | | | 279 | 280 | 281 | 282 | 283 | 284 | 285 | | | | | | | |
| SPACE | | | 00000020 | -26 | | | | | | | | | | | | | |
| STX | | | 00000002 | -20 | | | | | | | | | | | | | |
| SUSPEN | | | 0000000C | -213 | | | | | | | | | | | | | |
| TCR | | | 00000020 | -116 | | | | | | | | | | | | | |
| TIMR1 | | | 00000004 | -126 | | | | | | | | | | | | | |
| TIMR2 | | | 00000008 | -127 | | | | | | | | | | | | | |
| TIMR3 | | | 0000000C | -128 | | | | | | | | | | | | | |
| TIVR | | | 00000022 | -117 | | | | | | | | | | | | | |
| TK$CON | | | 00000012 | -243 | | | | | | | | | | | | | |
| TK$ENT | | | 00000004 | -238 | | | | | | | | | | | | | |
| TK$ID | | | 00000000 | -237 | | | | | | | | | | | | | |
| TK$LPT | | | 00000016 | -244 | | | | | | | | | | | | | |
| TK$NXT | | | 0000001A | -245 | | | | | | | | | | | | | |
| TK$RSO | | | 0000001E | -246 | | | | | | | | | | | | | |
| TK$SIZ | | | 00000022 | -247 | | | | | | | | | | | | | |
| TK$SSP | | | 00000008 | -239 | | | | | | | | | | | | | |
| TK$STF | | | 0000000C | -240 | | | | | | | | | | | | | |
| TK$STM | | | 0000000E | -241 | | | | | | | | | | | | | |
| TK$TIM | | | 00000010 | -242 | | | | | | | | | | | | | |
| TSKEND | | | 00000038 | -229 | | | | | | | | | | | | | |
| TSKINI | | | 00000010 | -214 | | | | | | | | | | | | | |
| TSR | | | 00000034 | -120 | | | | | | | | | | | | | |
| T_OFFLOD | XREF | 5 | 00000000 | -332 | 349 | | | | | | | | | | | | |
| T_OUTPUT | XREF | 5 | 00000000 | -333 | 365 | | | | | | | | | | | | |

```
T_XMON    XREF  5   00000000  -334   373
WAIT                0000001C  -222
WAITCN              00000020  -223
WAITLF              00000024  -224
WAKEUP              00000018  -221
XSVC      MACR  *             -200     1    387    410
```

```
                    ADIRP   IDNT   0,6                        A/D Interrupt Service 3/1/83
                            OPT    PCS,BRS
                    *
                    *
                    * SUBROUTINE:   ADIRP
                    *
                    * REVISED:      3/1/83
                    *
                    * AUTHOR:       D. A. ZEICHNER
                    *
                    * PURPOSE:      DIGITIZE INPUTS AS DICTATED BY THE INPUT SEQUENCE TABLE.
                    *
                    * INPUTS:       ANALOG TASK FRAME + TK$RS0:   CLUSTER POINTER - 2 BYTES
                    *               ANALOG TASK FRAME + TK$RS0+2: SAMPLE NUMBER
                    *
                    *               (CLUSTER POINTER POINTS TO THE FIRST INPUT SEQUENCE
                    *               TABLE ENTRY FOR THIS CLUSTER)
                    *
                    * OUTPUTS:      UPDATED ANALOG INPUT BUFFERS.
                    *
                    * REGISTER USAGE:
                    *
                    *        A0 - ADDRESS OF ANALOG TASK FRAME (T_ANALOG)
                    *        A1 - ADDRESS OF CURRENT INPUT PERSONALITY TABLE ENTRY
                    *        A2 - ADDRESS OF CURRENT ANALOG INPUT BUFFER
                    *
```

75

```
                    *        D0,D1 - TEMPORARY
                    *
                    * EXTERNAL REFERENCES/DEFINITIONS:
                    *
                            XDEF    ADIRP
                    *
                    * HARDWARE REFERENCES:
                    *
                            XREF    ADCTRL
                            XREF    CTRLP
                            XREF    DATAP
                    *
                    * RAM REFERENCES:
                    *
                            XREF.S  5:EX.RAM
                            XREF.S  5:T_ANALOG
                    *
                    * LOCAL ASSIGNMENTS:
                    *
          0000001E  CPTR    EQU     TK$RS0              OFFSET TO START OF CLUSTER PTR
                    *
                    *                          *** THE BYTE TK$RS0+2 IS NOT AVAILABLE FOR
                    *                              USE! THIS LOCATION IS USED BY ANALOG
                    *                              AS PART OF THE SAMPLE NUMBER (SNUM).
                    *
          00000021  SNUM    EQU     TK$RS0+3            SAMPLE NUMBER
          00000000  ALLOFF  EQU     $0                  CTRS OFF, UNFREEZE, ZERO CROSS DISABLED
          00000060  ZROFF   EQU     $60                 COUNTERS RUNNING, ZERO CROSS DISABLED
          00000006  CHOLD   EQU     6                   CTR HOLD BIT (ACTIVE LOW)
          00000005  UNFRZ   EQU     5                   UNFREEZE BIT (ACTIVE LOW - MUST TOGGLE)
          00000004  ZCEN    EQU     4                   0 CROSS ENABLE BIT (ACTIVE HIGH)
                    *
```

```
                         REGS     REG       A0-A2/D0-D1          REGISTER LIST
                         *

MOTOROLA M68000 ASM VERSION  1.30RTI :   0.        .ADIRP   .SA 03/02/83 13:37:38

                         *
              00000009            SECTION  PROM
                         *
9 00000000 13FC00600000 ADIRP    MOVE.B   #ZROFF,PADR+ADCTRL    DISABLE 0 CROSS, INPUTS FROZEN, CTRS ON
           0010
9 00000008                        PUSH     REGS                 SAVE REGISTERS
                         *
9 0000000C 41FAFFF2               LEA      T_ANALOG(PC),A0      GET PTR TO TASK FRAME
9 00000010 0C2800090021           CMP.B    #9,SNUM(A0)          SAMPLE COUNT = 9?
9 00000016 6D26                   BLT      NXTSAM               NO - DO NEXT SAMPLE
                         *
                         * WE HAVE TAKEN 9 SAMPLES ALREADY. STOP THE PERIOD
                         * COUNTER & DISABLE THE ZERO CROSSING DETECTOR
                         * SO WE WON'T GET ANY MORE INTERRUPTS FROM HERE.
                         * THE PERIOD OF THIS WAVEFORM IS IN COUNTER.#5.
                         *
9 00000018                        DSV$     5                    SHUT DOWN & SAVE PERIOD COUNTER
9 00000020 13FC00000000           MOVE.B   #ALLOFF,PADR+ADCTRL  MAKE SURE WE DON'T HAVE COUNTER IRPS.
           0010
9 00000028 303C4000               MOVE     #F$ASMPL,D0          FLAGS (TASK FRAME ALREADY IN A0)
9 0000002C                        XSVC     READY                WAKE UP ANALOG TASK
9 00000030 43FAFFCE               LEA      EX.RAM(PC),A1        POINTER TO EXEC RAM
9 00000034 23480006               MOVE.L   A0,EX$NXT(A1)        MAKE ANALOG TASK THE NEXT TO RUN
9 00000038                        PULL     REGS                 RESTORE ALL REGISTERS
9 0000003C 4E73                   RTE
                         *
9 0000003E 3268001E     NXTSAM   MOVE     CPTR(A0),A1          GET CLUSTER POINTER INTO A1.
                         *
9 00000042 10290001     NXTINP   MOVE.B   1(A1),D0             GET INPUT #
9 00000046 08C00007               BSET     #7,D0                DISABLE CONVERSION BIT
9 0000004A 13C000000018           MOVE.B   D0,PCDR+ADCTRL       SELECT INPUT
9 00000050 08B900070000           BCLR     #7,PCDR+ADCTRL       START CONVERSION
           0018
9 00000058 08F900070000           BSET     #7,PCDR+ADCTRL       ALLOW A/D TO BE READ
           0018
9 00000060 247C00000000           MOVE.L   #ADCTRL,A2           POINT TO A/D CONVERTER PI/T
                         *
9 00000066 010A0010     CONLUP   MOVEP    PADR(A2),D0          READ A/D
9 0000006A 4A40                   TST      D0                   SET 'N' BIT
9 0000006C 6BF8                   BMI      CONLUP               NOT DONE - WAIT
                         *
                         * CONVERSION FINISHED, DIGITIZED VALUE IN D0.
                         * USING SAMPLE COUNT, CALCULATE OFFSET TO APPROPRIATE
                         * ENTRY IN INPUT BUFFER. 2ND WORD OF 1ST ENTRY
                         * PROVIDES POINTER TO START OF BUFFER.
                         *
9 0000006E 02400FFF               AND      #$FFF,D0             ISOLATE A/D DATA
9 00000072 12280021               MOVE.B   SNUM(A0),D1          GET SAMPLE NUMBER
9 00000076 E341                   ASL      #1,D1
9 00000078 4881                   EXT      D1                   CALCULATE OFFSET FROM 1ST SAMPLE
9 0000007A 34690002               MOVE     2(A1),A2             GET PTR TO ANALOG INPUT BUFFER
9 0000007E 35801002               MOVE     D0,,SAMPLE(A2,D1)    MOVE VALUE INTO BUFFER
9 00000082 43E90004               LEA      4(A1),A1             BUMP PTR TO NEXT 1ST ENTRY
9 00000086 0C51FFFF               CMP      #$FFFF,(A1)          END OF CLUSTER?
9 0000008A 66B6                   BNE      NXTINP               NO - DO NEXT INPUT
                         *
9 0000008C 52280021               ADD.B    #1,SNUM(A0)          YES - BUMP SAMPLE NUMBER
                         *
```

```
9 00000090 0C2800090021          CMP.B   #9,SNUM(A0)          LAST SAMPLE TAKEN?
9 00000096 6D34                  BLT     NOTLAST              NO - JUST UNFREEZE INPUTS & RETURN
                       *
                       * LAST SAMPLE HAS BEEN TAKEN: STOP SAMPLE COUNTER,
                       * - (LETTING PERIOD COUNTER RUN)
                       * - UNFREEZE INPUTS AND SELECT FIRST INPUT IN
                       *   CLUSTER, (PERIOD TIMING REFERENCE)
                       * - CLEAR THAN ENABLE ZERO CROSSING DETECTOR.
                       *
9 0000009B                       DSA$    4                    STOP SAMPLE COUNTER
9 000000A0 3268001E              MOVE    CPTR(A0),A1          GET 1ST INPUT IN CLUSTER
9 000000A4 10290001              MOVE.B  1(A1),D0
9 000000A8 08C00007              BSET    #7,D0                DON'T START A/D THIS TIME -
9 000000AC 13C000000018          MOVE.B  D0,PCDR+ADCTRL       JUST SELECT
                       *
9 000000B2 08B900050000          BCLR    #UNFRZ,PADR+ADCTRL   UNFREEZE INPUTS (PULSE LINE)
           0010
9 000000BA 08F900050000          BSET    #UNFRZ,PADR+ADCTRL
           0010
                       *
9 000000C2 08F900040000          BSET    #ZCEN,PADR+ADCTRL    & ENABLE 0 CROSSING DETECTOR
           0010
9 000000CA 6010                  BRA     ADXIT
                       *
9 000000CC 08B900050000 NOTLAST  BCLR    #UNFRZ,PADR+ADCTRL   JUST UNFREEZE INPUTS (PULSE LINE)
           0010
9 000000D4 08F900050000          BSET    #UNFRZ,PADR+ADCTRL
           0010
                       *
9 0000000C              ADXIT    PULL    REGS                 RESTORE REGISTERS
9 000000E0 4E73                  RTE
                       *
                       *
                                 END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | GET$ | MACR | * | |
| .AIOSIZ | | | 0000003B | GOF$ | MACR | * | |
| .AOOSIZ | | | 00000038 | GON$ | MACR | * | |
| .COSINE | | | 00000014 | HT | | | 00000009 |
| .DIOSIZ | | | 0000001C | INIL$ | MACR | * | |
| .EFFECT | | | 0000001C | IPTENT$ | | | 00000014 |
| .HIOSIZ | | | 00000010 | LAM$ | MACR | * | |
| .HOOSIZ | | | 00000180 | LOD$ | MACR | * | |
| .ICOS | | | 0000000A | MAXAGE | | | 00000004 |
| .IEFF | | | 00000018 | MMR | | | 00000000 |
| .ISCALE | | | 00000006 | MMK$ | MACR | * | |
| .ISIN | | | 0000000E | NEXTSK | | | 00000030 |
| .KWH | | | 00000024 | NOSEO$ | MACR | * | |
| .PIOSIZ | | | 0000003F | NOTLAST | | 9 | 000000CC |
| .REFSIZ | | | 00000400 | NXTINP | | 9 | 00000042 |
| .SAMPLE | | | 00000002 | NXTSAM | | 9 | 0000003E |
| .SCALE1 | | | 00000004 | ONESEC | | | 00030090 |
| .SCALE2 | | | 00000008 | ONETIM | | | 000009C4 |
| .SCALE3 | | | 0000000C | OPTENT$ | | | 00000004 |
| .SCALE4 | | | 00000010 | PAAR | | | 00000014 |
| .SINE | | | 00000018 | PACR | | | 0000000C |
| .SPNJP | MACR | * | | PADDR | | | 00000004 |
| .STEMP | | | 0000001C | PADR | | | 00000010 |

| | | | | | | | |
|---|---|---|---|---|---|---|---|
| .TEMP | | | 00000012 | FBAR | | | 00000016 |
| .TOFSET | | | 0000000E | FBCR | | | 0000000E |
| .TSCALE | | | 0000000A | FBDDR | | | 00000006 |
| .VCOS | | | 00000002 | FBDR | | | 00000012 |
| .VEFF | | | 00000014 | FCDDR | | | 00000008 |
| .VSCALE | | | 00000002 | PCDF | | | 00000018 |
| .VSIN | | | 00000006 | FGCR | | | 00000000 |
| .WATTS | | | 00000020 | PIVR | | | 0000000A |
| .WATTSEC | | | 00000022 | PROM | | | 00000009 |
| A1R | | | 00000002 | PSR | | | 0000001A |
| A2R | | | 00000004 | PSRR | | | 00000002 |
| ADCTRL | XREF | * | 00000000 | FULL | MACR | * | |
| ADIPP | XDEF | 9 | 00000000 | PUSH | MACR | * | |
| ADXIT | | 9 | 0000000C | RAM | | | 00000005 |
| AIBENT$ | | | 00000026 | RDYALL | | | 00000008 |
| ALLOFF | | | 00000000 | READ$ | MACR | * | |
| ARM$ | MACR | * | | READY | | | 00000004 |
| B16$ | MACR | * | | REGS | REG | * | |
| BYTE$0 | | | 0000FFC8 | RELEAS | | | 0000002C |
| C1L | | | 00000006 | RESERV | | | 00000028 |
| C1M | | | 00000008 | RESTRT | | | 0000003C |
| C2L | | | 0000000A | RITE$ | MACR | * | |
| C2M | | | 0000000C | RST$ | MACR | * | |
| C3L | | | 0000000E | S60 | | | 0000370F |
| C3M | | | 00000010 | SAV$ | MACR | * | |
| C4L | | | 00000012 | SAV$ | | | 0000002A |
| C4M | | | 00000014 | SEO$ | MACR | * | |
| C5L | | | 00000016 | SET$ | MACR | * | |
| C5M | | | 00000018 | SNUM | | | 00000021 |
| CHGENT | | | 00000034 | SPACE | | | 00000020 |
| CHOLD | | | 00000006 | STA$ | MACR | * | |
| CLR$ | MACR | * | | STA1R$ | MACR | * | |
| CMR$ | MACR | * | | STA2R$ | MACR | * | |
| CNT5$ | MACR | * | | START$ | MACR | * | |
| CNTR | | | 0000002E | STC1L$ | MACR | * | |
| CONLUP | | 9 | 00000066 | STC1M$ | MACR | * | |
| CPR | | | 00000024 | STC2L$ | MACR | * | |
| CPTR | | | 0000001E | STC2M$ | MACR | * | |
| CR | | | 0000000D | STC3L$ | MACR | * | |
| CTRLP | XREF | * | 00000000 | STC3M$ | MACR | * | |
| DATAP | XREF | * | 00000000 | STC4L$ | MACR | * | |
| DEVINI | | | 00000014 | STC4M$ | MACR | * | |
| DI$DEV | | | 0000000A | STC5L$ | MACR | * | |
| DI$EVF | | | 00000000 | STC5M$ | MACR | * | |
| DI$IDM | | | 0000001B | STCEQU | | 0 | 00000000 |
| DI$ISV | | | 00000006 | STMMR$ | MACR | * | |
| DI$LNK | | | 00000016 | STP$ | MACR | * | |
| DI$OWN | | | 00000002 | STX | | | 00000002 |
| DI$PTR | | | 00000012 | SUSPEN | | | 0000000C |
| DI$QUE | | | 0000000E | TCR | | | 00000020 |
| DI$RS0 | | | 0000001A | TEACR$ | MACR | * | |
| DI$SIZ | | | 00000020 | TECL$ | MACR | * | |
| DI$STA | | | 0000001C | TECM$ | MACR | * | |
| DI$USR | | | 0000001E | TEMMR$ | MACR | * | |
| DIBENT$ | | | 00000026 | TIVR | | | 00000022 |
| DSA$ | MACR | * | | TK$CON | | | 00000012 |
| DSFTENT$ | | | 00000010 | TK$ENT | | | 00000004 |
| DSV$ | MACR | * | | TK$ID | | | 00000000 |
| EEPROM | | | 00000007 | TK$LPT | | | 00000016 |
| EOT | | | 00000004 | TK$NXT | | | 0000001A |
| EOS | MACR | * | | TK$RS0 | | | 0000001E |
| ETX | | | 00000003 | TK$SIZ | | | 00000022 |
| EX$DV0 | | | 0000000A | TK$SSP | | | 00000008 |
| EX$DV1 | | | 0000000E | TK$STF | | | 0000000C |
| EX$DV2 | | | 00000012 | TK$STM | | | 0000000E |
| EX$DV3 | | | 00000016 | TK$TIM | | | 00000010 |
| EX$DV4 | | | 0000001A | TSKEND | | | 00000038 |
| EX$DV5 | | | 0000001E | TSKINI | | | 00000010 |
| EX$DV6 | | | 00000022 | TSK | | | 00000034 |
| EX$DV7 | | | 00000026 | T_ANALOG | XREF | 5 | 00000000 |
| EX$NXT | | | 00000006 | UNFRZ | | | 00000005 |

```
EX$SIZ                 0000002A   UPACR$     MACR   *
EX$TIM                 00000000   UPC1M$     MACR   *
EX$TSK                 00000002   UPC2M$     MACR   *
EX.RAM     XREF   5    00000000   UPC3M$     MACR   *
EXEC                   00000000   UPC4M$     MACR   *
F$ASMPL                00004000   UPC5M$     MACR   *
F$DMUT                 00000400   UPDCL$     MACR   *
F$EEPM                 00000040   UPMMR$     MACR   *
F$KYED                 00000100   WAIT                  0000001C
F$MON                  00000080   WAITCN                00000020
F$OST                  00001000   WAITLP                00000024
F$PDI                  00000800   WAKEUP                00000018
F$PROC                 00002000   XSVC       MACR   *
F$XMIT                 00000200   ZCEN                  00000004
FF                     0000000C   ZROFF                 00000060

                  ANALOG  IDNT    0,12                 Analog Input Task  3/11/83
                          OPT     PCS,BRS
                  *
                  *
                  * SUBROUTINE:   ANALOG
                  *
                  * REVISED:      3/11/83
                  *
                  * AUTHOR:       D. A. ZEICHNER
                  *
                  * PURPOSE:      Analog data acquisition task.
                  *
                  * INPUTS:       N/A
                  *
                  * OUTPUTS:      N/A
                  *
                  * EXTERNAL REFERENCES/DEFINITIONS:
                  *
                          XDEF    ANALOG
                  *
                  * HARDWARE REFERENCES:
                  *
                          XREF    ADCTRL
                          XREF    CTRLP
                          XREF    DATAP
                  *
                  * RAM REFERENCES:
                  *
                          XREF.S  5:AIB$
                          XREF.S  5:CSM$
                          XREF.S  5:IST$
                          XREF.S  5:PRCIO$
                          XREF.S  5:RAMTBL
                          XREF.S  5:T_ANALOG
                  *
                  * PROM REFERENCES:
                  *
                          XREF.S  9:ENQUE
                          XREF.S  9:TIMRD
                          XREF.S  9:TIMWR
                  *
                  * LOCAL ASSIGNMENTS:
                  *
        0000001E  ISPTR   EQU     TK$RS0        INPUT SEQUENCE TABLE ENTRY POINTER
        00000020  SNUM    EQU     TK$RS0+2      SAMPLE NUMBER
                  *
        00000000  CLNUM   EQU     0             STACK OFFSET TO CLUSTER NUMBER
        00000002  CSPTR   EQU     2             STACK OFFSET TO CLUSTER STATUS MASK POINTER
                  *
        00000000  HALT    EQU     $0            ZERO CROSS & FREEZE DISABLED, CTRS OFF
        00000070  RUN     EQU     $70           0 CROSS ON, CTRS ON, ALLOW INPUTS TO FREEZE
                  *
        0000001E  CSMAP   EQU     30            OFFSET TO CLUSTER STATUS MAP
                  *
```

```
                            *
              00000009            SECTION  PROM
                            *
9 00000000 42A7            ANALOG  CLR.L    -(A7)                MAKE LOCAL SCRATCH SPACE ON STACK
9 00000002 4DFAFFFC                LEA      T_ANALOG(PC),A6      GET POINTER TO TASK FRAME
9 00000006 41FAFFF8                LEA      IST$(PC),A0
9 0000000A 3D48001E                MOVE     A0,ISPTR(A6)         INITIALIZE CLUSTER POINTER
                            *
9 0000000E 3017            ANALUP  MOVE     CLNUM(A7),D0         GET CLUSTER NUMBER
9 00000010 C0FC0006                MULU     #6,D0                CALCULATE BYTE OFFSET TO CLUSTER MASK
9 00000014 45FAFFEA                LEA      CSM$(PC),A2          GET START OF CLUSTER MASKS
9 00000018 43F20000                LEA      (A2,D0),A1           CALC POINTER TO CLUSTER STATUS MASK
9 0000001C 3F490002                MOVE     A1,CSPTR(A7)         & SAVE IN STACK FOR LATER
                            *
9 00000020 13FC00000000            MOVE.B   #HALT,ADCTRL+PADR    DISABLE 0 CROSS /UNFREEZE INPUTS /STOP CTRS
           0010
9 00000028 41F80000                LEA      0,A0                 CLR MS WORD
9 0000002C 426E0020                CLR      SNUM(A6)             RESET SAMPLE #
9 00000030 306E001E                MOVE     ISPTR(A6),A0         GET PTR TO IST
9 00000034 10280001                MOVE.B   1(A0),D0             GET INPUT # OF PERIOD REFERENCE
9 00000038 08C00007                BSET     #7,D0                DON'T START A/D -
9 0000003C 13C000000018            MOVE.B   D0,ADCTRL+PCDR       JUST SELECT PERIOD REFERENCE
                            *
9 00000042 3017                    MOVE     CLNUM(A7),D0         GET CLUSTER NUMBER
9 00000044 4EBAFFBA                JSR      TIMRD(PC)            GET TIMER VALUE
9 00000048                         RITE$    C4,LR,D0             SET SAMPLE COUNTER (CTR #4)
9 00000064                         LOD$     4,5                  PRESET PERIOD & SAMPLE COUNTERS
9 0000006C                         ARM$     4,5                  ARM PERIOD & SAMPLE COUNTERS
                            *
9 00000074 13FC00700000            MOVE.B   #RUN,ADCTRL+PADR     ALLOW ANALOG INPUTS TO FREEZE /ENABLE ALL
           0010
9 0000007C 303C4000                MOVE     #F$ASMPL,D0
9 00000080 7206                    MOVEQ    #6,D1                WAIT 6 TICKS
9 00000082                         XSVC     SUSPEN               WAIT TILL SAMPLING DONE
                            *
9 00000086 13FC00000000            MOVE.B   #HALT,ADCTRL+PADR    DISABLE 0 CROSS /UNFREEZE INPUTS /STOP CTRS
           0010
9 0000008E 4A6E000C                TST      TK$STF(A6)           DO WE HAVE A TIME OUT ?
9 00000092 6B24                    BMI      DATAON               YES - BUT CONTINUE ANYWAY, NOT DONE YET

                            *
                            * ALL 9 SAMPLES HAVE BEEN TAKEN & STORED, AND THE PERIOD COUNTER
                            * CONTAINS THE TIME TAKEN BY TWO CYCLES OF THE REFERENCE WAVEFORM.
                            * CALCULATE THE NEW SAMPLE TIME & SAVE IT.
                            * NORMAL TIME (60 HZ.) FOR 2 CYCLES =$20805. SINCE THE TIMER IS
                            * ONLY 16 BITS, WE ASSUME THE COUNTER TO HAVE A RANGE OF
                            * $18000 - $27FFF , BY SIGN EXTENDING THE COUNT AND ADDING $20000.
                            * THIS ALLOWS A RANGE OF ABOUT + / -  14 HZ.
                            *
                            * MAYBE THIS RANGE SHOULD BE CHANGED TO  + / -  2.5 HZ., ANYTHING
                            * OUT SIDE THIS RANGE WOULD ASSUME 60 HZ.

9 00000094                         READ$    C5,HR,C              READ PERIOD TIME FROM STC CHIP
9 000000A2 3001                    MOVE     D1,D0
9 000000A4 48C0                    EXT.L    D0                   SIGN EXTEND COUNT
9 000000A6 068000020000            ADD.L    #$20000,D0           RESTORE MS WORD FROM COUNTER
9 000000AC 80FC0009                DIVU     #9,D0                & DIVIDE BY 9 (SAMPLE TIME CALCULATION)
9 000000B0 4840                    SWAP     D0                   PUT NEW TIME IN MS WORD
9 000000B2 3017                    MOVE     CLNUM(A7),D0         & CLUSTER NUMBER IN LS WORD
9 000000B4 4EBAFF4A                JSR      TIMWR(PC)            & SAVE NEW SAMPLE TIME
                            *
                            * GET CLUSTER STATUS MASK FOR THIS CLUSTER, & "OR" IT WITH
                            * THE CLUSTER STATUS MAP TO INDICATE THAT ALL OF THE BUFFERS
                            * IN THIS CLUSTER ARE UNAVAILABLE FOR NEW DATA. (THE DATA IN
                            * THEM HAS NOT BEEN PROCESSED YET.)
                            *
9 000000B8 45FAFF46        DATAON  LEA      CSM$(PC),A2          GET START ADR OF CLUSTER STATUS MASKS/MAP
9 000000BC 326F0002                MOVE     CSPTR(A7),A1         GET PTR TO CURRENT CLUSTER STATUS MASK
                            *
9 000000C0 2011                    MOVE.L   (A1),D0              GET 1ST 4 BYTES OF MASK
```

```
9 000000C2 81AA001E         OR.L    D0,CSMAP(A2)        & 'OR' WITH 1ST 4 BYTES OF MAP
                  *
9 000000C6 30290004         MOVE    4(A1),D0            DO THE SAME W/ THE LAST 2 BYTES OF MASK
9 000000CA 816A0022         OR      D0,CSMAP+4(A2)
                  *
                  * STEP THRU TABLE UNTIL WE REACH THE END OF THIS CLUSTER,
                  * QUEUEING BUFFER ADDRESSES AS WE GO.
                  *
9 000000CE 41F80000         LEA     0,A0                CLEAR MSW ADDRESS REGISTER
9 000000D2 306E001E         MOVE    ISPTR(A6),A0        GET POINTER TO START OF CLUSTER
9 000000D6 0C58FFFF  EMPCLS CMP     #$FFFF,(A0)+        END OF CLUSTER?
9 000000DA 671A             BEQ     ENDCLS              YES - GET OUT OF LOOP
                  *
9 000000DC 3018             MOVE    (A0)+,D0            GET BUFFER ADRS FROM TABLE & BUMP ENTRY
9 000000DE                  PUSH    A0                  SAVE A0
9 000000E2 41FAFF1C         LEA     FRCIO$(PC),A0       GET QUEUE ADDRESS
                  *
9 000000E6 4EBAFF18  REQUE  JSR     ENQUE(PC)
9 000000EA 6404             BCC     OOK                 QUEUE WENT OK
                  * This condition will never occur if the Q is big enough *
9 000000EC 612E             BSR     WAITQ               NG - WAIT & RETRY
9 000000EE 60F6             BRA     REQUE
                  *
9 000000F0           OOK    PULL    A0                  RESTORE INPUT SEQ TABLE POINTER
9 000000F4 60E0             BRA     EMPCLS              & TRY AGAIN
                  *
                  * WE'RE NOW POINTING TO START OF NEXT CLUSTER.
                  * IF ENTRY IS $FFFF, THEN WE'VE DONE ALL CLUSTERS.
                  * OR ELSE, WAIT TILL OUTPUT HAS FINISHED PROCESSING.
                  *
9 000000F6 5257      ENDCLS ADDQ    #1,CLNUM(A7)        BUMP CLUSTER NUMBER
9 000000F8 3D48001E         MOVE    A0,ISPTR(A6)        SAVE NEW PTR IN TASK FRAME
9 000000FC 0C50FFFF         CMP     #$FFFF,(A0)
9 00000100 6600FF0C         BNE     ANALUP              MORE TO DO - KEEP GOING
9 00000104 303C1000         MOVE    #F$OST,D0           WAIT TILL XMIT OK
9 00000108 4241             CLR     D1                  NO TIME OUT
9 0000010A                  XSVC    SUSPEN
9 0000010E 41FAFEF0         LEA     IST$(PC),A0
9 00000112 3D48001E         MOVE    A0,ISPTR(A6)        RESET INPUT SEQUENCE TABLE POINTER
9 00000116 4257             CLR     CLNUM(A7)           AND CLUSTER NUMBER
9 00000118 6000FEF4         BRA     ANALUP
                  *
                  *
                  * SUBROUTINES:
                  *
                  * WAITQ - WAIT UNTIL THE PROCESS INPUT QUEUE IS NOT FULL.
                  *         (IE. TILL A BUFFER HAS BEEN PROCESSED)
                  *
9 0000011C           WAITQ  PUSH    D0/A0               SAVE REGS
9 00000120 303C2000         MOVE    #F$PROC,D0          WAIT FOR PROCES TO FINISH A BUFFER
9 00000124 4241             CLR     D1                  NO TIMEOUT
9 00000126                  XSVC    SUSPEN
9 0000012A                  PULL    D0/A0               RESTORE REGISTERS
9 0000012E 4E75             RTS
                  *
                  *
                            END

****** TOTAL ERRORS     0--
****** TOTAL WARNINGS   0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | GOF$ | MACR | * | |
| .AIOSIZ | | | 00000038 | GON$ | MACR | * | |
| .AOOSIZ | | | 00000038 | HALT | | | 00000000 |
| .COSINE | | | 00000014 | HT | | | 00000009 |
| .DIOSIZ | | | 0000001C | INTL$ | MACR | * | |
| .EFFECT | | | 0000001C | IPTENT$ | | | 00000014 |
| .HIOSIZ | | | 000000C8 | ISPTR | | | 0000001E |
| .HOOSIZ | | | 00000180 | IST$ | XREF | 5 | 00000000 |
| .ICOS | | | 0000000A | LAN$ | MACR | * | |
| .IEFF | | | 00000018 | LOD$ | MACR | * | |
| .ISCALE | | | 00000006 | MAXAGE | | | 00000004 |
| .ISIN | | | 0000000E | MMR | | | 00000000 |
| .KWH | | | 00000024 | MMR$ | MACR | * | |
| .PIOSIZ | | | 0000003F | NEXTSK | | | 00000030 |
| .REFSIZ | | | 00000400 | NOSEQ$ | MACR | * | |
| .SAMPLE | | | 00000002 | ONESEC | | | 0003D090 |
| .SCALE1 | | | 00000004 | ONETIK | | | 000009C4 |
| .SCALE2 | | | 00000008 | OPTENT$ | | | 00000004 |
| .SCALE3 | | | 0000000C | PAAR | | | 00000014 |
| .SCALE4 | | | 00000010 | PACR | | | 0000000C |
| .SINE | | | 00000018 | PADDR | | | 00000004 |
| .SFNJP | MACR | * | | PADR | | | 00000010 |
| .STEMP | | | 0000001C | PBAR | | | 00000016 |
| .TEMP | | | 00000012 | PBCR | | | 0000000E |
| .TOFSET | | | 0000000E | PBDDR | | | 00000006 |
| .TSCALE | | | 0000000A | PBDR | | | 00000012 |
| .VCOS | | | 00000002 | PCDDR | | | 00000008 |
| .VEFF | | | 00000014 | PCDR | | | 00000018 |
| .VSCALE | | | 00000002 | PGCR | | | 00000000 |
| .VSIN | | | 00000006 | PIVR | | | 0000000A |
| .WATTS | | | 00000020 | PRCIO$ | XREF | 5 | 00000000 |
| .WATTSEC | | | 00000022 | PROM | | | 00000009 |
| A1R | | | 00000002 | PSR | | | 0000001A |
| A2R | | | 00000004 | PSRR | | | 00000002 |
| ADCTRL | XREF | * | 00000000 | PULL | MACR | * | |
| AIB$ | XREF | 5 | 00000000 | PUSH | MACR | * | |
| AIBENT$ | | | 00000026 | QOK | | 9 | 000000F0 |
| ANALOG | XDEF | 9 | 00000000 | RAM | | | 00000005 |
| ANALUP | | 9 | 0000000E | RAMTBL | XREF | 5 | 00000000 |
| ARM$ | MACR | * | | RDYALL | | | 00000008 |
| B16$ | MACR | * | | READ$ | MACR | * | |
| BMPCLS | | 9 | 00000006 | READY | | | 00000004 |
| BYTE$0 | | | 0000FF15 | RELEAS | | | 0000002C |
| C1L | | | 00000006 | REQUE | | o | 000000E6 |
| C1M | | | 00000008 | RESERV | | | 00000028 |
| C2L | | | 0000000A | RESTRT | | | 0000003C |
| C2M | | | 0000000C | RITE$ | MACR | * | |
| C3L | | | 0000000E | RST$ | MACR | * | |
| C3M | | | 00000010 | RUN | | | 00000070 |
| C4L | | | 00000012 | S60 | | | 000039DF |
| C4M | | | 00000014 | SAV$ | MACR | * | |
| C5L | | | 00000016 | SAV$ | | | 0000002A |
| C5M | | | 00000018 | SEQ$ | MACR | * | |
| CHGENT | | | 00000034 | SET$ | MACR | * | |
| CLNUM | | | 00000000 | SNUM | | | 00000020 |
| CLR$ | MACR | * | | SPACE | | | 00000020 |
| CMR$ | MACR | * | | STA$ | MACR | * | |
| CNT5$ | MACR | * | | STA1R$ | MACR | * | |
| CNTR | | | 0000002E | STA2R$ | MACR | * | |
| CPR | | | 00000024 | START$ | MACR | * | |
| CR | | | 00000000 | STC1L$ | MACR | * | |
| CSM$ | XREF | 5 | 00000000 | STC1M$ | MACR | * | |
| CSMAP | | | 0000001E | STC2L$ | MACR | * | |

| | | | | | | | |
|---|---|---|---|---|---|---|---|
| CSPTR | | | 00000002 | STC2M$ | MACR | * | |
| CTRL13 | | | 00000000 | STC3L$ | MACR | * | |
| CTRL2 | | | 00000002 | STC3M$ | MACR | * | |
| CTRLP | XREF | * | 00000000 | STC4L$ | MACR | * | |
| DATAON | | 9 | 000000B8 | STC4M$ | MACR | * | |
| DATAP | XREF | * | 00000000 | STC5L$ | MACR | * | |
| DEVINI | | | 00000014 | STC5M$ | MACR | * | |
| DI$DEV | | | 0000000A | STCEQU | | 0 | 00000000 |
| DI$EVF | | | 00000000 | STMMR$ | MACR | * | |
| DI$ION | | | 00000018 | STP$ | MACR | * | |
| DI$ISV | | | 00000006 | STX | | | 00000002 |
| DI$LNK | | | 00000016 | SUSPEN | | | 0000000C |
| DI$OWN | | | 00000002 | TCR | | | 00000020 |
| DI$PTR | | | 00000012 | TEACR$ | MACR | * | |
| DI$QUE | | | 0000000E | TECL$ | MACR | * | |
| DI$PSO | | | 0000001A | TECM$ | MACR | * | |
| DI$SIZ | | | 00000020 | TEMMR$ | MACR | * | |
| DI$STA | | | 0000001C | TIMR1 | | | 00000004 |
| DI$USR | | | 0000001E | TIMR2 | | | 00000008 |
| DIBENT$ | | | 00000026 | TIMR3 | | | 0000000C |
| DSA$ | MACR | * | | TIMRD | XREF | 9 | 00000000 |
| DSFTENT$ | | | 00000010 | TIMWR | XREF | 9 | 00000000 |
| DSV$ | MACR | * | | TIVR | | | 00000022 |
| EEPROM | | | 00000007 | TK$CON | | | 00000012 |
| ENDCLS | | 9 | 000000F6 | TK$ENT | | | 00000004 |
| ENQUE | XREF | 9 | 00000000 | TK$ID | | | 00000000 |
| EOT | | | 00000004 | TK$LPT | | | 00000016 |
| EQS | MACR | * | | TK$NXT | | | 0000001A |
| ETX | | | 00000003 | TK$RSO | | | 0000001E |
| EX$DV0 | | | 0000000A | TK$SIZ | | | 00000022 |
| EX$DV1 | | | 0000000E | TK$SSP | | | 00000008 |
| EX$DV2 | | | 00000012 | TK$STF | | | 0000000C |
| EX$DV3 | | | 00000016 | TK$STM | | | 0000000E |
| EX$DV4 | | | 0000001A | TK$TIM | | | 00000010 |
| EX$DV5 | | | 0000001E | TSKEND | | | 00000038 |
| EX$DV6 | | | 00000022 | TSKINI | | | 00000010 |
| EX$DV7 | | | 00000026 | TSR | | | 00000034 |
| EX$NXT | | | 00000006 | T_ANALOG | XREF | 5 | 00000000 |
| EX$SIZ | | | 0000002A | UPACR$ | MACR | * | |
| EX$TIM | | | 00000000 | UPC1M$ | MACR | * | |
| EX$TSK | | | 00000002 | UPC2M$ | MACR | * | |
| EXEC | | | 00000000 | UPC3M$ | MACR | * | |
| F$ASMPL | | | 00004000 | UPC4M$ | MACR | * | |
| F$DMUT | | | 00000400 | UPC5M$ | MACR | * | |
| F$EEPM | | | 00000040 | UPDCL$ | MACR | * | |
| F$KYED | | | 00000100 | UPMMR$ | MACR | * | |
| F$MON | | | 00000080 | WAIT | | | 0000001C |
| F$OST | | | 00001000 | WAITCN | | | 00000020 |
| F$PDI | | | 00000800 | WAITLP | | | 00000024 |
| F$PROC | | | 00002000 | WAITQ | | 9 | 0000011C |
| F$XMIT | | | 00000200 | WAKEUP | | | 00000018 |
| FF | | | 0000000C | XSVC | MACR | * | |
| GET$ | MACR | * | | | | | |

MOTOROLA M68000 ASM VERSION 1.30RTI : 0. .BUFINI .SA 02/16/83 15:15:41

```
BUFINI: IDNT    0,5              Buffer Initializer  2/16/83
        OPT     PCS,BRS
*
* SUBROUTINE:   BUFINI
*
* REVISED:      2/16/83
*
* AUTHOR:       D. A. ZEICHNER
*
* PURPOSE:      INITIALIZE BOTH ANALOG AND DIGITAL INPUT BUFFERS.
*
* INPUTS:       NONE.
```

```
                         *
                         * OUTPUTS:      NONE.
                         *
                         * EXTERNAL REFERENCES/DEFINITIONS:

                                 XDEF     BUFINI
                         *
                         * RAM REFERENCES:
                         *
                                 XREF.S   5:AIB$
                                 XREF.S   5:DIB$
                         *
                         * EEPROM REFERENCES:
                         *
                                 XREF     IPT$
                         *

                         *
            00000009             SECTION  PROM                 READ ONLY SECTION (PSCT)
                         *
  9 00000000 41FAFFFE    BUFINI: LEA      AIB$(PC),A0          PTR TO ANALOG INPUT BUFFERS
  9 00000004 43F900000000        LEA      IPT$,A1              PTR TO INPUT PERSONALTY TABLE
                         *
                                 FOR      D7 = #0 TO #47 DO
  9 00000010             Z_L1.001
                         *
  9 00000010 7025                  MOVEQ    #AIBENT$-1,D0
  9 00000012 6146                  BSR      CLRLUP             CLEAR OUT AIB
                         *
  9 00000014 3007                  MOVE     D7,D0              GET INPUT NUMBER
  9 00000016 EB40                  ASL      #5,D0              POSITION INPUT NUMBER
  9 00000018 3211                  MOVE     (A1),D1            GET INPUT TYPE
  9 0000001A 0241C000              AND      #$C000,D1          ISOLATE IT
  9 0000001E E649                  LSR      #3,D1              POSITION INPUT TYPE
  9 00000020 8240                  OR       D0,D1              BUILD HEADER
  9 00000022 3081                  MOVE     D1,(A0)            SAVE HEADER IN BUFFER
                         *
  9 00000024 41E80026              LEA      AIBENT$(A0),A0     BUMP PTR TO NEXT AIB
  9 00000028 43E90014              LEA      IPTENT$(A1),A1     BUMP PTR TO NEXT IPT ENTRY
                         *
                                 ENDF                          END OF AIB INIT LOOP
                         *
                         * NOW DO THE SAME FOR DIGITAL INPUT BUFFERS
                         *


  9 00000034 41FAFFCA            LEA      DIB$(PC),A0          PTR TO DIB'S
                         *
                                 FOR      D7 = #0 TO #15 DO
  9 0000003E             Z_L1.003
                         *
  9 0000003E 7025                  MOVEQ    #DIBENT$-1,D0
  9 00000040 6118                  BSR      CLRLUP             CLEAR OUT THIS DIB
                         *
  9 00000042 3007                  MOVE     D7,D0
  9 00000044 EF40                  ASL      #7,D0              POSITION INPUT NUMBER
  9 00000046 00401800              OR       #$1800,D0          SET INPUT TYPE TO 3
  9 0000004A 3080                  MOVE     D0,(A0)            SAVE IN HEADER
                         *
  9 0000004C 41E80026              LEA      DIBENT$(A0),A0     BUMP PTR TO NEXT ENTRY
                                 ENDF
                         *
  9 00000058 4E75                RTS                           DONE!
                         *
                         *
                         * SUBROUTINES:
                         *
                         * CLRLUP - CLEAR A BLOCK OF MEMORY.
                         *
                         * A0 - ADDRESS OF BLOCK
                         * D0 - # OF BYTES-1 TO CLEAR
```

```
                              *
9 0000005A 42300000   CLRLUP  CLR.B   (A0,D0)          CLEAR TABLE ENTRY
9 0000005E 51C8FFFA           DBRA    D0,CLRLUP
9 00000062 4E75               RTS
                              *
                              *
                              END

****** TOTAL ERRORS      0--
****** TOTAL WARNINGS    0--
```

SYMBOL TABLE LISTING

| SYMBOL NAME | SECT | | VALUE | SYMBOL NAME | SECT | | VALUE |
|---|---|---|---|---|---|---|---|
| .1SEC | | | 0000000A | F$ASHPL | | | 00004000 |
| .AIOSIZ | | | 00000038 | F$DNUT | | | 00000400 |
| .AOOSIZ | | | 00000038 | F$KYBD | | | 00000100 |
| .COSINE | | | 00000014 | F$MON | | | 00000080 |
| .DIOSIZ | | | 0000001C | F$OST | | | 00001000 |
| .EFFECT | | | 0000001C | F$PDI | | | 00000800 |
| .HIOSIZ | | | 00000010 | F$PROC | | | 00002000 |
| .HOOSIZ | | | 00000180 | F$XMIT | | | 00000200 |
| .ICOS | | | 0000000A | FF | | | 0000000C |
| .IEFF | | | 00000018 | HT | | | 00000009 |
| .ISCALE | | | 00000006 | IPT$ | XREF | * | 00000000 |
| .ISIN | | | 0000000E | IPTENT$ | | | 00000014 |
| .KWH | | | 00000024 | MAXAGE | | | 00000004 |
| .PIOSIZ | | | 0000003F | ONESEC | | | 00030090 |
| .REFSIZ | | | 00000400 | ONETIK | | | 000009C4 |
| .SAMPLE | | | 00000002 | OPTENT$ | | | 00000004 |
| .SCALE1 | | | 00000004 | PAAR | | | 00000014 |
| .SCALE2 | | | 00000008 | PACR | | | 0000000C |
| .SCALE3 | | | 0000000C | PADDR | | | 00000004 |
| .SCALE4 | | | 00000010 | PADR | | | 00000010 |
| .SINE | | | 00000018 | PBAR | | | 00000016 |
| .STEMP | | | 0000001C | PBCR | | | 0000000E |
| .TEMP | | | 00000012 | PBDDR | | | 00000006 |
| .TOFSET | | | 0000000E | PBDR | | | 00000012 |
| .TSCALE | | | 0000000A | PCDDR | | | 00000008 |
| .VCOS | | | 00000002 | PCDR | | | 00000018 |
| .VEFF | | | 00000014 | PGCR | | | 00000000 |
| .VSCALE | | | 00000002 | PIVR | | | 0000000A |
| .VSIN | | | 00000006 | PROM | | | 00000009 |
| .WATTS | | | 00000020 | PSR | | | 0000001A |
| .WATTSEC | | | 00000022 | PSRR | | | 00000002 |
| AIB$ | XREF | 5 | 00000000 | PULL | MACR | * | |
| AIBENT$ | | | 00000026 | PUSH | MACR | * | |
| BUFINI | XDEF | 9 | 00000000 | RAM | | | 00000005 |
| CLRLUP | | 9 | 0000005A | S60 | | | 0003 9DF |
| CNTR | | | 0000002E | SPACE | | | 00000020 |
| CPR | | | 00000024 | STX | | | 00000002 |
| CR | | | 00000000 | TCR | | | 00000020 |
| DIB$ | XREF | 5 | 00000000 | TIVR | | | 00000022 |
| DIBENT$ | | | 00000026 | TSR | | | 00000034 |
| DSFTENT$ | | | 00000010 | Z_L1.001 | | 9 | 00000010 |
| EEPROM | | | 00000007 | Z_L1.003 | | 9 | 0000003E |
| EOT | | | 00000004 | Z_L2.000 | | 9 | 0000002E |
| ETX | | | 00000003 | Z_L2.002 | | 9 | 00000052 |

```
              XDEF    BUFRDY
        *
        * RAM REFERENCES:
        *
              XREF.S  5:AIB$
              XREF.S  5:DIB$
        *
        * EEPROM REFERENCES:
        *
              XREF    IPT$
        *
```

```
                            BUFRDY  IDNT    0,6                 CHECK BUFFERS READY FOR OUTPUT PROCESSING 3/18/83
                                    OPT     PCS,BRS
                            *
                            * SUBROUTINE:   BUFRDY
                            *
                            * REVISED:      3/18/83
                            *
                            * AUTHOR:       D. A. ZEICHNER
                            *
                            * PURPOSE:      GIVEN A POINTER TO AN OUTPUT PERSONALITY TABLE ENTRY,
                            *               DETERMINE THAT THE BUFFERS REQUIRED TO CALCULATE THIS
                            *               OUTPUT VALUE CONTAIN VALID DATA. (THAT IS, THE AC FLAG
                            *               IN THE BUFFERS ARE SET.)
                            *
                            * INPUTS:       A0 - POINTS TO OPT ENTRY.
                            *
                            * OUTPUTS:      A0 - PRESERVED.
                            *               A1-A2/D0-D2 - DESTROYED.
                            *               CARRY SET IF BUFFER NOT READY.
                            *
                            *
                            * EXTERNAL REFERENCES/DEFINITIONS:
                            *
                                    XDEF    BUFRDY
                            *
                            * RAM REFERENCES:
                            *
                                    XREF.S  S:AIB$
                                    XREF.S  S:DIB$
                            *
                            * EEPROM REFERENCES:
                            *
                                    XREF    IPT$
                            *
                            *
          00000009                  SECTION PROM
                            *
9 00000000 1410             BUFRDY  MOVE.B  (A0),D2             GET OUTPUT TYPE
9 00000002 EA0A                     LSR.B   #5,D2               ISOLATE IT.
9 00000004 652A                     BCS     MONAD               D BIT WAS SET - ENTRY IS MONADIC
9 00000006 0C020003                 CMP.B   #3,D2               FREQUENCY?
9 0000000A 672E                     BEQ     BUFXIT              YES - ALWAYS READY. (NO BUFFERS)
9 0000000C 6D22                     BLT     MONAD               LESS THAN 3 - ENTRY IS MONADIC
                            *
                            * IF OUTPUT TYPE IS > 3, AND THE D BIT IS CLEAR, WE HAVE A DYADIC
                            * PARAMETER. IN THIS CASE, WE HAVE TO CHECK OUT THE CHAIN POINTED
                            * TO BY THE 1ST (& POSSIBLY THE 2ND) CURRENT INPUT NUMBERS. OTHERWISE,
                            * OTHERWISE, WE NEED ONLY CHECK OUT THE BUFFER CHAIN INDICATED BY THE
                            * VOLTAGE INPUT NUMBER.
                            *
9 0000000E 30280002                 MOVE    2(A0),D0            GET 2ND CURRENT INPUT #
9 00000012 0240003F                 AND     #$3F,D0             REMOVE ALL JUNK BITS
9 00000016 0C40003F                 CMP     #$3F,D0             UNUSED?
9 0000001A 6704                     BEQ     NO2ND               YES - TRY 1ST CURRENT INPUT #
9 0000001C 611E                     BSR     BUFCHN              TRACE BUFFER CHAIN
9 0000001E 651A                     BCS     BUFXIT              NOT READY - EXIT BAD
                            *
9 00000020 3010             NO2ND   MOVE    (A0),D0             GET 1ST CURRENT INPUT #
9 00000022 0240003F                 AND     #$3F,D0
9 00000026 0C40003F                 CMP     #$3F,D0             UNUSED?
9 0000002A 67F4                     BEQ     NO2ND               ERROR - TRY AGAIN !
9 0000002C 610E                     BSR     BUFCHN
9 0000002E 650A                     BCS     BUFXIT              NOT READY - EXIT BAD
                            *
                            * NOW CHECK THE VOLTAGE INPUT NUMBER CHAIN. THIS IS DONE
                            * IN ANY CASE. (EXCEPT FREQUENCY, WHICH IS ALWAYS OK.)
                            *
9 00000030 3010             MONAD   MOVE    (A0),D0             GET 1ST WORD OF OPT ENTRY
9 00000032 EC48                     LSR     #6,D0               JUSTIFY INPUT NUMBER
9 00000034 0240003F                 AND     #$3F,D0
9 00000038 6102                     BSR     BUFCHN              TRACE BUFFER CHAIN
```

```
                         *
9 0000003A 4E75          BUFXIT   RTS                                 THIS WAY OUT!
                         *
                         *
                         * SUBROUTINES:
                         *
                         * BUFCHN - TRACE A CHAIN OF BUFFERS, AND RETURN W/ THE CARRY SET IF
                         *          ANY ONE IS NOT READY.
                         *
                         *        A0 - PTR TO OPT ENTRY
                         *        D0 - INPUT NUMBER
                         *        D2 - OUTPUT TYPE
                         *
                         *        A1, A2, D0, D1 DESTROYED.
                         *
9 0000003C 08100001      BUFCHN   BTST     #1,(A0)
9 00000040 6730                   BEQ      ABUF                       INPUT TYPE IS ANALOG.
                         *
                         * INPUT TYPE IS DIGITAL. THE INPUT NUMBER POINTS TO THE
                         * 1ST OF THREE BUFFERS IF THE OUTPUT TYPE > 3. IF < 3,
                         * THE INPUT NUMBER POINTS TO A SINGLE BUFFER. (SAME RULES
                         * APPLY FOR ANALOG INPUT)
                         *
9 00000042 43FAFFBC               LEA      DIB$(PC),A1                POINT TO DIGITAL INPUT BUFFERS
9 00000046 C0FC0026               MULU     #DIBENT$,D0                CALCULATE OFFSET TO 1ST BUFFER
9 0000004A 083100060000           BTST     #6,(A1,D0)                 BUFFER READY?
9 00000050 6756                   BEQ      BUFBSY                     NO - RETURN BAD
9 00000052 0C020003               CMP.B    #3,D2
9 00000056 6D4A                   BLT      BUFIDL                     SINGLE BUFFER PARAMETER - WE'RE FINISHED
9 00000058 06400026               ADD      #DIBENT$,D0                OK - BUMP OFFSET TO NEXT BUFFER
9 0000005C 083100060000           BTST     #6,(A1,D0)                 2ND BUFFER READY?
9 00000062 6744                   BEQ      BUFBSY                     NO - EXIT BAD
9 00000064 06400026               ADD      #DIBENT$,D0                OK - BUMP OFFSET TO LAST BUFFER
9 00000068 083100060000           BTST     #6,(A1,D0)
9 0000006E 6632                   BNE      BUFIDL                     LAST BUFFER READY - EXIT OK
9 00000070 6036                   BRA      BUFBSY                     NOT READY - EXIT BAD
                         *
                         * INPUT TYPE IS ANALOG. FOLLOW CHAIN IN-INPUT PERSONALITY TABLE.
                         *
9 00000072 43FAFF8C      ABUF     LEA      AIB$(PC),A1                POINT TO ANALOG INPUT BUFFERS
9 00000076 45F900000000           LEA      IPT$,A2                    POINT TO INPUT PERSONALITY TABLE
                         *
9 0000007C 3200          ALUP     MOVE     D0,D1                      SAVE INPUT # IN D1.
9 0000007E C0FC0026               MULU     #AIBENT$,D0                OFFSET TO ANALOG BUFFER
9 00000082 083100060000           BTST     #6,(A1,D0)                 IS BUFFER READY?
9 00000088 671E                   BEQ      BUFBSY                     NO - EXIT BAD
9 0000008A 0C020003               CMP.B    #3,D2
9 0000008E 6D12                   BLT      BUFIDL                     DONE - ONLY NEED TO CHECK 1 BUFFER
9 00000090 C2FC0014               MULU     #IPTENT$,D1                OFFSET TO IPT ENTRY
9 00000094 30321000               MOVE     (A2,D1),D0                 GET LINK TO NEXT BUFFER IN D0.
9 00000098 0240003F               AND      #$3F,D0                    MASK OUT EXTRA BITS
9 0000009C 0C40003F               CMP      #$3F,D0                    END OF CHAIN?
9 000000A0 66DA                   BNE      ALUP                       NO - CONTINUE
                         *
9 000000A2 023C00FE      BUFIDL   AND      #$FE,CCR                   CLEAR CARRY, AND
9 000000A6 4E75                   RTS                                 RETURN OK!
                         *
9 000000A8 003C0001      BUFBSY   OR       #1,CCR                     SET CARRY
9 000000AC 4E75                   RTS                                 & RETURN BAD
                         *
                         *
                                  END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .ISEC | | 0000000A | EOT | | 00000004 |
| .AIOSIZ | | 00000038 | ETX | | 00000003 |
| .AODSIZ | | 00000038 | F$ASMPL | | 00004000 |
| .COSINE | | 00000014 | F$DMUT | | 00000400 |
| .DIOSIZ | | 0000001C | F$EEPM | | 00000040 |
| .EFFECT | | 0000001C | F$KYBD | | 00000100 |
| .HIOSIZ | | 000000C8 | F$MON | | 00000080 |
| .HOOSIZ | | 00000180 | F$OST | | 00001000 |
| .ICOS | | 0000000A | F$PDI | | 00000800 |
| .IEFF | | 00000018 | F$PROC | | 00002000 |
| .ISCALE | | 00000006 | F$XMIT | | 00000200 |
| .ISIN | | 0000000E | FF | | 0000000C |
| .KWH | | 00000024 | HT | | 00000009 |
| .PIOSIZ | | 0000003F | IPT$ | XREF * | 00000000 |
| .RBFSIZ | | 00000400 | IPTENT$ | | 00000014 |
| .SAMPLE | | 00000002 | MAXAGE | | 00000004 |
| .SCALE1 | | 00000004 | MONAD | 9 | 00000030 |
| .SCALE2 | | 00000008 | MO2ND | 9 | 00000020 |
| .SCALE3 | | 0000000C | ONESEC | | 0003D090 |
| .SCALE4 | | 00000010 | ONETIK | | 000009C4 |
| .SINE | | 00000018 | OPTENT$ | | 00000004 |
| .STEMP | | 0000001C | PAAR | | 00000014 |
| .TEMP | | 00000012 | PACR | | 0000000C |
| .TOFSET | | 0000000E | PADDR | | 00000004 |
| .TSCALE | | 0000000A | PADR | | 00000010 |
| .VCOS | | 00000002 | PBAR | | 00000016 |
| .VEFF | | 00000014 | PBCR | | 0000000E |
| .VSCALE | | 00000002 | PBDDR | | 00000006 |
| .VSIN | | 00000006 | PBDR | | 00000012 |
| .WATTS | | 00000020 | PCDDR | | 00000008 |
| .WATTSEC | | 00000022 | PCDR | | 00000018 |
| ABUF | 9 | 00000072 | PGCR | | 00000000 |
| AIB$ | XREF 5 | 00000000 | PIVR | | 0000000A |
| AIBENT$ | | 00000026 | PROM | | 00000069 |
| ALUP | 9 | 0000007C | PSR | | 0000001A |
| BUFBSY | 9 | 000000A8 | PSRR | | 00000002 |
| BUFCHN | 9 | 0000003C | PULL | MACR * | |
| BUFIDL | 9 | 000000A2 | PUSH | MACR * | |
| BUFRDY | XDEF 9 | 00000000 | RAM | | 00000005 |
| BUFXIT | 9 | 0000003A | S60 | | 000039DF |
| CNTR | | 0000002E | SPACE | | 00000020 |
| CPR | | 00000024 | STX | | 00000002 |
| CR | | 00000000 | TCR | | 00000020 |
| CTRL13 | | 00000000 | TIMR1 | | 00000004 |
| CTRL2 | | 00000002 | TIMR2 | | 00000008 |
| DIB$ | XREF 5 | 00000000 | TIMR3 | | 0000000C |
| DIBENT$ | | 00000026 | TIVR | | 00000022 |
| DSFTENT$ | | 00000010 | TSR | | 00000034 |
| EEPROM | | 00000007 | | | |

```
CRC16   IDNT    0,3                     Update CRC word  2/08/83
        OPT     PCS,BRS
*
* SUBROUTINE:   CRC
*
* REVISED:      2/08/83
*
* AUTHOR:       D. A. ZEICHNER
*
* PURPOSE:      UPDATE CRC WORD. 16 BIT WORD (CRC16)
*               IS UPDATED A BYTE AT A TIME.
*
* INPUTS:       D0 - INCOMING BYTE
*               D7 - INCOMING WORD OF CRC TO BE UPDATED
*
```

```
                       * OUTPUTS:      D7 - UPDATED CRC WORD
                       *
                       * EXTERNAL REFERENCES/DEFINITIONS:
                       *
                               XDEF    CRC16
                       *
                       * LOCAL ASSIGNMENTS:
                       *
         00008005      C16POLY EQU     $8005              16 BIT CRC POLYNOMIAL
                       *
                       REGS    REG     D0-D1              REGISTER LIST
                       *
                       *
         00000009              SECTION PROM
                       *
                       * WE HAVE A 16 BIT CRC. SHIFT LEFT 8 TIMES,
                       * AND XOR W/ POLYNOMIAL IF CARRY.
                       *
  9 00000000           CRC16   PUSH    REGS               SAVE D0,D1
  9 00000004 E140              ASL     #8,D0              LEFT JUSTIFY INCOMING BYTE
  9 00000006 7207              MOVEQ   #7,D1              # OF INCOMING DATA BITS (-1)
  9 00000008 B147              EOR     D0,D7              EOR INCOMING DATA INTO CRC WORD
                       *
  9 0000000A E347      SHF16   ASL.W   #1,D7
  9 0000000C 6404              BCC     SHF16S             NO CARRY, SKIP XOR
  9 0000000E 0A478005          EOR.W   #C16POLY,D7        CARRY - XOR W/ POLYNOMIAL
                       *
  9 00000012 51C9FFF6  SHF16S  DBRA    D1,SHF16           DECREMENT COUNT & DO IT AGAIN
                       *
  9 00000016           CRCXIT  PULL    REGS               RESTORE REGISTERS
  9 0000001A 4E75              RTS                        AND RETURN
                       *
                       *
                               END

***** TOTAL ERRORS      0--
***** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIOSIZ | | 00000038 | F$DMUT | | 00000400 |
| .AOOSIZ | | 00000038 | F$KYBD | | 00000100 |
| .COSINE | | 00000014 | F$MON | | 00000080 |
| .DIOSIZ | | 0000001C | F$OST | | 00001000 |
| .EFFECT | | 0000001C | F$PDI | | 00000800 |
| .HIOSIZ | | 00000010 | F$PROC | | 00002000 |
| .HOOSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 00030090 |
| .PIOSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |

```
.VCOS                      00000002  FGCR               00000000
.VEFF                      00000014  PIVR               0000000A
.VSCALE                    00000002  PROM               00000009
.VSIN                      00000006  PSR                0000001A
.WATTS                     00000020  PSRR               00000002
.WATTSEC                   00000022  PULL     MACR  *
AIBENT$                    00000026  PUSH     MACR  *
C16POLY                    00008005  RAM                00000005
CNTR                       0000002E  REGS     REG   *
CPR                        00000024  S60                000039DF
CR                         0000000D  SHF16          9   0000000A
CRC16       XDEF   9       00000000  SHF16S         9   00000012
CRCXIT             9       00000016  SPACE              00000020
DIBENT$                    00000026  STX                00000002
DSFTENT$                   00000010  TCR                00000020
EEPROM                     00000007  TIVR               00000022
EOT                        00000004  TSR                00000034
ETX                        00000003
```

```
                      CRCTST  IDNT    0,2              BLOCK CRC CALCULATION     1/19/83
                              OPT     PCS,BRS
                      *
                      * SUBROUTINE:   CRCTST
                      *
                      * REVISED:      1/19/83
                      *
                      * AUTHOR:       D. A. ZEICHNER
                      *
                      * PURPOSE:      CALCULATE 16 BIT CRC OF SPECIFIED BLOCK OF MEMORY.
                      *
                      * INPUTS:       A0 - POINTER TO MEMORY BLOCK
                      *               D1 - # OF BYTES TO CHECK
                      *
                      * OUTPUTS:      A0 - ADDRESS FOLLOWING SPECIFIED BLOCK
                      *               D1 - ZERO
                      *               D0 - DESTROYED
                      *               D7 - 16 BIT CRC WORD
                      *
                      * EXTERNAL REFERENCES/DEFINITIONS:
                      *
                              XDEF    CRCTST
                      *
                      * EPROM (PROGRAM) REFERENCE:
                      *
                              XREF.S  9:CRC16
                      *
                      *
        00000009              SECTION PROM
                      *
9 00000000 5341       CRCTST  SUBQ    #1,D1            ADJUST BYTE COUNT
                      *
9 00000002 1018       CRCLUP  MOVE.B  (A0)+,D0         GET BYTE
9 00000004 6100FFFA           BSR     CRC16            AND UPDATE CRC
9 00000008 51C9FFF8           DBRA    D1,CRCLUP
9 0000000C 4E75               RTS
                      *
                      *
                              END

****** TOTAL ERRORS    0--
****** TOTAL WARNINGS  0--
```

SYMBOL TABLE LISTING

| SYMBOL NAME | SECT | VALUE | SYMBOL NAME | SECT | VALUE |
| --- | --- | --- | --- | --- | --- |
| .1SEC | | 0000000A | EOT | | 00000004 |
| .AIOSIZ | | 00000038 | ETX | | 00000003 |
| .AOOSIZ | | 00000038 | F$ASHFL | | 00004000 |
| .COSINE | | 00000014 | F$DNUT | | 00000400 |
| .DIOSIZ | | 0000001C | F$KYBD | | 00000100 |
| .EFFECT | | 0000001C | F$MON | | 00000080 |
| .HIOSIZ | | 00000010 | F$OST | | 00001000 |
| .HOOSIZ | | 00000180 | F$PDI | | 00000800 |
| .ICOS | | 0000000A | F$PROC | | 00002000 |
| .IEFF | | 00000018 | F$XMIT | | 00000200 |
| .ISCALE | | 00000006 | FF | | 0000000C |
| .ISIN | | 0000000E | HT | | 00000009 |
| .KWH | | 00000024 | IPTENT$ | | 00000014 |
| .PIOSIZ | | 0000003F | MAXAGE | | 00000004 |
| .REFSIZ | | 00000400 | ONESEC | | 00030090 |
| .SAMPLE | | 00000002 | ONETIK | | 000009C4 |
| .SCALE1 | | 00000004 | OPTENT$ | | 00000004 |
| .SCALE2 | | 00000008 | PAAR | | 00000014 |
| .SCALE3 | | 0000000C | PACR | | 0000000C |
| .SCALE4 | | 00000010 | PADDR | | 00000004 |
| .SINE | | 00000018 | PADR | | 00000010 |
| .STEMP | | 0000001C | PBAR | | 00000016 |
| .TEMP | | 00000012 | PBCR | | 0000000E |
| .TOFSET | | 0000000E | PBDDR | | 00000006 |
| .TSCALE | | 0000000A | PBDR | | 00000012 |
| .VCOS | | 00000002 | PCDDR | | 00000008 |
| .VEFF | | 00000014 | PCDR | | 00000018 |
| .VSCALE | | 00000002 | PGCR | | 00000000 |
| .VSIN | | 00000006 | PIVR | | 0000000A |
| .WATTS | | 00000020 | PROM | | 00000009 |
| .WATTSEC | | 00000022 | PSR | | 0000001A |
| AIBENT$ | | 00000026 | PSRR | | 00000002 |
| CNTR | | 0000002E | PULL | MACR | * |
| CPR | | 00000024 | PUSH | MACR | * |
| CR | | 0000000D | RAM | | 00000005 |
| CRC16 | XREF 9 | 00000000 | S60 | | 000039DF |
| CRCLUP | 9 | 00000002 | SPACE | | 00000020 |
| CRCTST | XDEF 9 | 00000000 | STX | | 00000002 |
| DIBENT$ | | 00000026 | TCR | | 00000020 |
| DSFTENT$ | | 00000010 | TIVR | | 00000022 |
| EEPROM | | 00000007 | TSR | | 00000034 |

```
DEQUE   IDNT    0,3                                     REMOVE DATA FROM QUEUE     1/19/83
        OPT     PCS,BRS
*
* SUBROUTINE:   DEQUE
*
* STARTED:      1/19/83
*
* AUTHOR:       D. A. ZEICHNER
*
* PURPOSE:      REMOVE DATA FROM QUEUE.
*
* INPUTS:       A0 - POINTER TO QUEUE HEADER BLOCK OF THE FORMAT:
*
*                    DS.W QUEUE HEAD POINTER
*                    DS.W QUEUE TAIL POINTER
*                    DS.W QUEUE END POINTER
*                    DS.W QUEUE STATUS BYTE
*                    DS.B QUEUE STORAGE AREA
*
* OUTPUTS:      D0 - BYTE/WORD DEQUED.
*               CARRY SET IF QUEUE EMPTY
*               Z FLAG SET (EQUAL) IF DEQUE SUCCESSFUL
```

```
                          *
                          * EXTERNAL REFERENCES/DEFINITIONS:
                          *
                                  XDEF     DEQUE
                          *
                          * LOCAL ASSIGNMENTS:
                          *
             00000007     QSTAT   EQU      7                    OFFSET TO QUEUE STATUS BYTE
             00000004     QEND    EQU      4                    OFFSET TO END OF QUEUE POINTER
             00000002     QTAIL   EQU      2                    OFFSET TO QUEUE TAIL POINTER
             00000001     QSIZE   EQU      1                    QUEUE ELEMENT SIZE BIT
             00000000     QHEAD   EQU      0                    OFFSET TO QUEUE HEAD POINTER
             00000000     QFULL   EQU      0                    QUEUE FULL BIT
                          *
                          *
             00000009             SECTION  PROM
                          *
9 00000000                DEQUE   PUSH     A1                   SAVE A1
                          *
9 00000004 32680002               MOVE     QTAIL(A0),A1         GET QUEUE TAIL POINTER
9 00000008 08A800000007           BCLR     #QFULL,QSTAT(A0)     RESET QUEUE FULL FLAG
                                  IF       <EQ> THEN
9 00000010 B2D0                     CMPA.W   QHEAD(A0),A1       FULL FLAG WAS ALREADY CLEAR - IS Q EMPTY?
9 00000012 672A                     BEQ      DEQMT              YES - EXIT BAD
                                  ENDI
9 00000014                Z_L1.000
                          *
9 00000014 082800010007           BTST     #QSIZE,QSTAT(A0)     TEST BYTE FLAG
                          *
                          * IF THE WORD FLAG IS SET, THEN
                          * REMOVE A FULL WORD FROM THE QUEUE.
                          *
                                  IF       <NE> THEN
9 0000001C 3019                     MOVE.W   (A1)+,D0
                                  ELSE
9 00000020                Z_L1.003
9 00000020 1019                     MOVE.B   (A1)+,D0
                                  ENDI
9 00000022                Z_L2.005
                          *
                          * IF WE HAVE REACHED THE END OF THE
                          * QUEUE, THEN ROLLOVER TO THE TOP
                          *
                                  IF       A1 <EQ> QEND(A0) THEN
9 00000028 43E80008                 LEA      8(A0),A1           QUEUE STARTS 8 BYTES AFTER HEADER
                                  ENDI
9 0000002C                Z_L1.006
                          *
9 0000002C 31490002               MOVE     A1,QTAIL(A0)         .UPDATE QUEUE TAIL POINTER
9 00000030 023C00FC               AND      #$FC,CCR             CLEAR CARRY & OVERFLOW
9 00000034 003C0004               OR       #4,CCR               & SET Z FLAG
                          *
9 00000038                DEQXIT  PULL     A1                   RESTORE A1
9 0000003C 4E75                   RTS                           AND RETURN
                          *
9 0000003E 003C0001       DEQMT   OR       #1,CCR               SET CARRY
9 00000042 60F4                   BRA      DEQXIT               & RETURN
                          *
                          *
                                  END

****** TOTAL ERRORS       0--
****** TOTAL WARNINGS     0--
```

SYMBOL TABLE LISTING

| SYMBOL NAME | | SECT | VALUE | SYMBOL NAME | | SECT | VALUE |
|---|---|---|---|---|---|---|---|
| .ISEC | | | 0000000A | F$MON | | | 00000080 |
| .AIOSIZ | | | 00000038 | F$OST | | | 00001000 |
| .AOQSIZ | | | 00000038 | F$PDI | | | 00000800 |
| .COSINE | | | 00000014 | F$PROC | | | 00002000 |
| .DIOSIZ | | | 0000001C | F$XMIT | | | 00000200 |
| .EFFECT | | | 0000001C | FF | | | 0000000C |
| .HIOSIZ | | | 00000010 | HT | | | 00000009 |
| .HOOSIZ | | | 00000180 | IPTENT$ | | | 00000014 |
| .ICOS | | | 0000000A | MAXAGE | | | 00000004 |
| .IEFF | | | 00000018 | ONESEC | | | 0003D090 |
| .ISCALE | | | 00000006 | ONETIK | | | 000009C4 |
| .ISIN | | | 0000000E | OPTENT$ | | | 00000004 |
| .KWH | | | 00000024 | PAAR | | | 00000014 |
| .PIOSIZ | | | 0000003F | PACR | | | 0000000C |
| .RBFSIZ | | | 00000400 | PADDR | | | 00000004 |
| .SAMPLE | | | 00000002 | PADR | | | 00000010 |
| .SCALE1 | | | 00000004 | PBAR | | | 00000016 |
| .SCALE2 | | | 00000008 | PBCR | | | 0000000E |
| .SCALE3 | | | 0000000C | PBDDR | | | 00000006 |
| .SCALE4 | | | 00000010 | PBDR | | | 00000012 |
| .SINE | | | 00000018 | PCDDR | | | 00000008 |
| .STEMP | | | 0000001C | PCDR | | | 00000018 |
| .TEMP | | | 00000012 | PGCR | | | 00000000 |
| .TOFSET | | | 0000000E | PIVR | | | 0000000A |
| .TSCALE | | | 0000000A | PROM | | | 00000009 |
| .VCOS | | | 00000002 | PSR | | | 0000001A |
| .VEFF | | | 00000014 | PSRR | | | 00000002 |
| .VSCALE | | | 00000002 | PULL | MACR | * | |
| .VSIN | | | 00000006 | PUSH | MACR | * | |
| .WATTS | | | 00000020 | QEND | | | 00000004 |
| .WATTSEC | | | 00000022 | QFULL | | | 00000000 |
| AIBENT$ | | | 00000026 | QHEAD | | | 00000000 |
| CNTR | | | 0000002E | QSIZE | | | 00000001 |
| CPR | | | 00000024 | QSTAT | | | 00000007 |
| CR | | | 00000000 | QTAIL | | | 00000002 |
| DEQNT | | 9 | 0000003E | RAM | | | 00000005 |
| DEQUE | XDEF | 9 | 00000000 | S60 | | | 000039DF |
| DEQXIT | | 9 | 00000038 | SPACE | | | 00000020 |
| DIBENT$ | | | 00000026 | STX | | | 00000002 |
| DSFTENT$ | | | 00000010 | TCR | | | 00000020 |
| EEPROM | | | 00000007 | TIVR | | | 00000022 |
| EOT | | | 00000004 | TSR | | | 00000034 |
| ETY | | | 00000003 | Z_L1.000 | | 9 | 00000014 |
| F$ASMPL | | | 00004000 | Z_L1.003 | | 9 | 00000020 |
| F$DNUT | | | 00000400 | Z_L1.006 | | 9 | 0000002C |
| F$KYED | | | 00000100 | Z_L2.005 | | 9 | 00000022 |

```
DIRP    IDNT    0,4                         Donut interrupt service  1/17/83
        OPT     PCS,BRS
*
* SUBROUTINE:   DIRP
*
* REVISED:      1/17/83
*
* AUTHOR:       D. A. ZEICHNER
*
* PURPOSE:      DONUT RECEIVER INTERRUPT SERVICE
*
* INPUTS:       DONUT RECEIVER (DRCVR)
*
* OUTPUTS:      DONUT INPUT QUEUE (DNTIO$)
*
* EXTERNAL REFERENCES/DEFINITIONS:
*
        XDEF    DIRP
*
```

```
                          * HARDWARE REFERENCES:
                          *
                                  XREF     DRCVR
                          *
                          * RAM PEFERENCES:
                          *
                                  XREF.S   5:DNTIO$
                          *
                          * EPROM (PROGRAM) REFERENCES:
                          *
                                  XFEF.S   9:ENQUE
                          *

                          *
            00000009              SECTION  PROM
                          *
9 00000000                DIRP    PUSH     D0/A0              SAVE REGISTERS
9 00000004 41F900000000           LEA      DRCVR,A0           POINT TO DONUT RECVR PI/T
9 0000000A 01080010               MOVEP    PADR(A0),D0        & GET INCOMING DATA
9 0000000E 41FAFFF0               LEA      DNTIO$(PC),A0      GET QUEUE ADDRESS
                          *
                          * IF QUEUE FILLS UP, TOO BAD. WE JUST CAN'T
                          * PROCESS STUFF ANY FASTER THAN THIS. (MAYBE
                          * MAKE A BIGGER QUEUE?)
                          *
9 00000012 4EBAFFEC               JSR      ENQUE(PC)          SAVE DATA ON QUEUE
9 00000016 6402                   BCC      DEXIT
                          *
                          * THIS NOP IS HERE SO WE CAN USE THE ANALYZER
                          * TO SEE IF WE'RE OVERFLOWING THE QUEUE.
                          *
9 00000018 4E71                   NOP                         JUST SO WE CAN SEE IF WE GET OVERFLOW.
                          *
9 0000001A                DEXIT   PULL     D0/A0              RESTORE REGISTERS
9 0000001E 4E73                   RTE
                          *
                          *
                                  END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | ENQUE | XREF 9 | 00000000 |
| .AIQSIZ | | 00000038 | EOT | | 00000004 |
| .AOQSIZ | | 00000038 | ETX | | 00000003 |
| .COSINE | | 00000014 | F$ASMPL | | 00004000 |
| .DIQSIZ | | 0000001C | F$DNUT | | 00000400 |
| .EFFECT | | 0000001C | F$KYBD | | 00000100 |
| .HIQSIZ | | 00000010 | F$MON | | 00000080 |
| .HOQSIZ | | 00000180 | F$OST | | 00001000 |
| .ICOS | | 0000000A | F$PDI | | 00000800 |
| .IEFF | | 00000018 | F$PROC | | 00002000 |
| .ISCALE | | 00000006 | F$XMIT | | 00000200 |
| .ISIN | | 0000000E | FF | | 0000000C |
| .KWH | | 00000024 | HT | | 00000009 |
| .PIQSIZ | | 0000003F | IPTENT$ | | 00000014 |
| .RBFSIZ | | 00000400 | MAXAGE | | 00000004 |
| .SAMPLE | | 00000002 | ONESEC | | 00030090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |
| .SCALE4 | | 00000010 | PACR | | 0000000C |
| .SINE | | 00000018 | PADDR | | 00000004 |
| .STEMP | | 0000001C | PADR | | 00000010 |
| .TEMP | | 00000012 | PBAR | | 00000016 |
| .TOFSET | | 0000000E | PBCR | | 0000000E |

```
.TSCALE                 0000000A   PEDDR              00000006
.VCOS                   00000002   PEDR               00000012
.VEFF                   00000014   PCDDR              00000008
.VSCALE                 00000002   PCDR               00000018
.VSIN                   00000006   PGCR               00000000
.WATTS                  00000020   PIVR               0000000A
.WATTSEC                00000022   PROM               00000009
AIBENT$                 00000026   PSR                0000001A
CNTR                    0000002E   PSRR               00000002
CPR                     00000024   PULL      MACR  *
CR                      00000000   PUSH      MACR  *
DEXIT             9     0000001A   RAM                00000005
DIBENT$                 00000026   S60                0000390F
DIRP      XDEF    9     00000000   SPACE              00000020
DNTIO$    XREF    5     00000000   STX                00000002
DRCVR     XREF    *     00000000   TCR                00000020
DSFTENT$                00000010   TIVR               00000022
EEPROM                  00000007   TSR                00000034
```

```
                        DISPLY  IDNT    0,8               Front panel display handler  2/23/83
                                OPT     PCS,BRS
                        *
                        * SUBROUTINE:   DISPLY/DISPCH
                        *
                        * REVISED:      2/23/83
                        *
                        * AUTHOR:       D. A. ZEICHNER
                        *
                        * PURPOSE:      WRITE STRING (CHARACTER) TO FRONT PANEL.
                        *               3 CONTROL CHARACTERS ARE SUPPORTED.
                        *               THEY ARE:
                        *
                        *                  CR ($D) - POSITION CURSOR AT START OF LINE
                        *                  FF ($C) - FILL DISPLAY W/ BLANKS & DO CR
                        *                  HT ($9) - MOVE CURSOR BACK TO ITS POSITION UPON ENTRY
                        *
                        * INPUTS:       A0 - POINTS TO STRING TERMINATED BY EOT ($4). (DISPLY)
                        *               D0 - CONTAINS BYTE TO BE DISPLAYED. (DISPCH)
                        *
                        * OUTPUTS:      A0 - POINTS TO BYTE FOLLOWING EOT. (DISPLY ONLY)
                        *               ALL OTHER REGISTERS PRESERVED.
                        *
                        * NOTE:   DISPCH PRESERVES D0 FOR ALL VALUES EXCEPT FORMFEED. IN THIS CASE,
                        *         THE LS WORD OF D0 IS RETURNED AS ZERO. (ALSO DISPCH ON ITS OWN WILL
                        *         TRY TO DISPLAY AN EOT. IT WILL APPEAR AS A SPACE)
                        *
                        * EXTERNAL REFERENCES/DEFINITIONS:
                        *
                                XDEF    DISPLY
                                XDEF    DISPCH
                        *
                        * HARDWARE REFERENCES:
                        *
                                XREF    PANEL
                        *
                        * LOCAL DATA AREA:
                        *
           00000005             SECTION RAM
                        *
 5 00000000 00000004    DISPTR  DS.L    1                 DISPLAY POINTER
 5 00000004 00000004    OLDPTR  DS.L    1                 OLD DISPLAY POINTER
                        *

                        *
           00000009             SECTION PROM
                        *
 9 00000000             DISPLY  PUSH    D0/A1
 9 00000004 43FAFFFE            LEA     OLDPTR(PC),A1     GET ADDR OF OLD POINTER
 9 00000008 22BAFFF6            MOVE.L  DISPTR(PC),(A1)   SAVE INCOMING CURSOR POSITION
                                WHILE.B (A0) <NE> #EOT DO
 9 0000000C             Z_L1.000
 9 00000012 1018                  MOVE.B  (A0)+,D0        GET CHARACTER
```

```
9 00000014 610A              BSR     DISPCH            & DISPLAY IT
                             ENDW
9 00000018          Z_L2.001
9 00000018 5248              ADDQ    #1,A0             BUMP A0 PAST EOT
9 0000001A                   PULL    A1/D0
9 0000001E 4E75              RTS                       & RETURN
                    *
                    *
9 00000020          DISPCH   PUSH    A0/A1
9 00000024 41FAFFDA          LEA     DISPTR(PC),A0
9 00000028 227AFFD6          MOVE.L  DISPTR(PC),A1     GET DISPLAY POINTER
                    *
                             IF.B    D0 <EQ> #CR THEN
9 00000032 227C00000020        MOVE.L  #PANEL+32,A1    RESET POINTER TO START OF DISPLAY
9 00000038 603E                BRA     DSPSKP
                             ELSE
9 0000003C          Z L1.003
                               IF.B    D0 <EQ> #FF THEN  CLEAR THE DISPLAY & RESET DISPLAY POINTER
9 00000042 700F                  MOVEQ   #15,D0        # OF CHARACTERS -1
9 00000044 227C00000000          MOVE.L  #PANEL,A1
                    *
9 0000004A 4211     CLRLUP       CLR.B   (A1)
9 0000004C 5449                  ADDQ    #2,A1         BUMP TO NEXT COLUMN
9 0000004E 51C8FFFA              DBRA    D0,CLRLUP
                    *
9 00000052 2089                  MOVE.L  A1,(A0)       UPDATE DISPLAY POINTER
9 00000054 6024                  BRA     DSPXIT
                               ELSE
9 00000058          Z_L1.006
                                 IF.B    D0 <EQ> #HT THEN
9 0000005E 227AFFA4                MOVE.L  OLDPTR(PC),A1  RESTORE PREVIOUS POSITION
9 00000062 6014                    BRA     DSPSKP
                                 ENDI
9 00000064          Z_L1.009
                               ELSE
9 00000064          Z_L2.008
9 00000064 B3FC00000000          CMP.L   #PANEL,A1
9 0000006A 6F0C                  BLE     DSPSKP        PTR OUT OF RANGE - SKIP REST OF DISPLAY
9 0000006C B3FC00000020          CMP.L   #PANEL+32,A1
9 00000072 6E04                  BGT     DSPSKP        PTR OUT OF RANGE - SKIP REST OF DISPLAY
                    *
9 00000074 5549                  SUBQ    #2,A1         PTR IN RANGE - MOVE PTR TO NEXT COLUMN
9 00000076 1280                  MOVE.B  D0,(A1)       & MOVE CHARACTER TO DISPLAY
                    *
                    DSPSKP     ENDI
9 00000078          Z_L2.005
9 00000078 2089                MOVE.L  A1,(A0)         REPLACE DISPLAY POINTER
                    *
9 0000007A          DSPXIT     PULL    A0-A1           RESTORE REGS
9 0000007E 4E75                RTS                     AND RETURN
                    *
                    *
                               END

****** TOTAL ERRORS     0--
****** TOTAL WARNINGS   0--
 SYMBOL TABLE LISTING


 SYMBOL NAME    SECT  VALUE       SYMBOL NAME    SECT  VALUE


 .1SEC                0000000A    F$DNUT               00000400
 .AIQSIZ              0000003B    F$KYBD               00000100
 .AOQSIZ              0000003B    F$MON                00000080
 .COSINE              00000014    F$OST                00001000
 .DIQSIZ              0000001C    F$PDI                00000800
 .EFFECT              0000001C    F$PROC               00002000
 .HIQSIZ              00000010    F$XMIT               00000200
 .HOQSIZ              000001B0    FF                   0000000C
 .ICOS                0000000A    HT                   00000009
```

```
.IEFF                   00000018   IPTENT$              00000014
.ISCALE                 00000006   MAXAGE               00000004
.ISIN                   0000000E   OLDPTR           5   00000004
.KWH                    00000024   ONESEC               0003D090
.PIOSIZ                 0000003F   ONETIK               000009C4
.RBFSIZ                 00000400   OPTENT$              00000004
.SAMPLE                 00000002   PAAR                 00000014
.SCALE1                 00000004   PACR                 0000000C
.SCALE2                 00000008   PADDR                00000004
.SCALE3                 0000000C   PADR                 00000010
.SCALE4                 00000010   PANEL     XREF   *   00000000
.SINE                   00000018   PBAR                 00000016
.STEMP                  0000001C   PBCR                 0000000E
.TEMP                   00000012   PBDDR                00000006
.TOFSET                 0000000E   PBDR                 00000012
.TSCALE                 0000000A   PCDDR                00000008
.VCOS                   00000002   PCDR                 00000018
.VEFF                   00000014   PGCR                 00000000
.VSCALE                 00000002   PIVR                 0000000A
.VSIN                   00000006   PROM                 00000009
.WATTS                  00000020   PSR                  0000001A
.WATTSEC                00000022   PSRR                 00000002
AIBENT$                 00000026   PULL      MACR   *
CLRLUP              9   0000004A   PUSH      MACR   *
CNTR                    0000002E   RAM                  00000005
CPR                     00000024   S60                  0003970F
CR                      00000000   SPACE                00000020
DIBENT$                 00000026   STX                  00000002
DISPCH      XDEF    9   00000020   TCR                  00000020
DISPLY      XDEF    9   00000000   TIVR                 00000022
DISPTR              5   00000000   TSR                  00000034
DSPTENT$                00000010   Z_L1.000         9   0000000C
DSPSKP              9   00000078   Z_L1.003         9   0000003C
DSPXIT              9   0000007A   Z_L1.006         9   00000058
EEPROM                  00000007   Z_L1.009         9   00000064
EOT                     00000004   Z_L2.001         9   00000018
ETX                     00000003   Z_L2.005         9   00000078
F$ASMPL                 00004000   Z_L2.008         9   00000064
```

```
        DWLOAD  IDNT    0,8                 DOWN LOAD SELECTED TABLE   3/02/83
                OPT     PCS,BRS
        *
        *
        * SUBROUTINE:   DWLOAD
        *
        * STARTED:      3/02/83
        *
        * AUTHOR:       D. A. ZEICHNER
        *
        * PURPOSE:      LOAD NEW INPUT PERSONALITY TABLE, OUTPUT PERSONALITY
        *               TABLE, DONUT SCALE FACTOR TABLE, OR ID. TABLE FROM THE
        *               PROGRAMMING HOST.
        *
        * INPUTS:       NONE.
        *
        * OUTPUTS:      SELECTED TABLE IS UPDATED IF LOAD WENT OK. THE CARRY
        *               IS SET IF ANY ERROR OCCURRED.
        *               ALL REGISTERS ARE DESTROYED.
        *
        * LOCAL STACK SPACE USED: 4 BYTES
        *
        * EXTERNAL REFERENCES/DEFINITIONS:
        *
                XDEF    DWLOAD
        *
        * HARDWARE REFERENCE:
        *
                XREF    ADCTRL
        *
        * RAM REFERENCES:
        *
```

```
                                XREF.S   5:RCVBUF
                                XREF.S   5:T_ANALOG
                                XREF.S   5:T_DIAG
                                XREF.S   5:T_DONUT
                                XREF.S   5:T_KB
                                XREF.S   5:T_OUTPUT
                                XREF.S   5:T_PROCES
                                XREF.S   5:T_XMON
                       *
                       * EPROM (PROGRAM) REFERENCES:
                       *
                                XREF.S   9:EEPMOV
                                XREF.S   9:RCVCHR
                                XREF.S   9:TBLTBL
                       *
                       * LOCAL ASSIGNMENTS:
                       *
           00000000    BCOUNT   EQU      0                 LOCAL STACK OFFSET TO BYTE COUNT
           00000002    TBLID    EQU      2                 LOCAL STACK OFFSET TO TABLE ID
                       *
                       *
           00000009             SECTION  PROM
                       *
9 00000000 4FEFFFFC    DNLOAD   LEA      -4(SP),SP         ALLOCATE LOCAL SCRATCH SPACE
9 00000004 41FAFFFA             LEA      RCVBUF(PC),A0
9 00000008 303C03FF             MOVE     #.RBFSIZ-1,D0     NUMBER OF BYTES -1
                       *
9 0000000C 50D8        SETLUP   ST.B     (A0)+             SET BUFFER TO ALL ONES
9 0000000E 51C8FFFC             DBRA     D0,SETLUP
                       *
9 00000012 4EBAFFEC             JSR      RCVCHR(PC)        GET MSB OF BYTE COUNT
9 00000016 650000BE             BCS.L    DNERR             TRANSMISSION QUIT - ERROR
                       *
9 0000001A 1E80                 MOVE.B   D0,BCOUNT(SP)     SAVE MSB OF BYTE COUNT ON STACK
9 0000001C 4EBAFFE2             JSR      RCVCHR(PC)        GET LSB OF BYTE COUNT
9 00000020 650000B4             BCS.L    DNERR             TRANSMISSION QUIT - ERROR
9 00000024 1F400001             MOVE.B   D0,BCOUNT+1(SP)   SAVE LSB OF BYTE COUNT
                       *
9 00000028 4247                 CLR      D7                INITIALIZE CRC
9 0000002A 4EBAFFD4             JSR      RCVCHR(PC)        GET TABLE ID
9 0000002E 0C000030             CMP.B    #'0',D0           VALID?
9 00000032 6D0000A2             BLT.L    DNERR             NO - RETURN BAD
9 00000036 0C000033             CMP.B    #'3',D0
9 0000003A 6E00009A             BGT.L    DNERR
9 0000003E 1F400002             MOVE.B   D0,TBLID(SP)      OK - SAVE TABLE ID IN STACK
9 00000042 41FAFFBC             LEA      RCVBUF(PC),A0     GET POINTER TO RECEIVE BUFFER
9 00000046 3217                 MOVE     BCOUNT(SP),D1     GET BYTE COUNT
9 00000048 5B41                 SUBQ     #5,D1             CALC # OF BYTES TO SAVE IN BUFFER (-1)
                       *
9 0000004A 0C410400             CMP.W    #.RBFSIZ,D1       # OF BYTES > BUFFER SIZE,(1K) ?
9 0000004E 6C000086             BGE.L    DNERR             YES- BUFFER OVERFLOW, EXIT
                       *
                       * READ IN TABLE DATA & SAVE IN BUFFER
                       *
9 00000052             DNLUP    PUSH     D1/A0             SAVE BYTE COUNT & BUFFER POINTER
9 00000056 4EBAFFA8             JSR      RCVCHR(PC)        WAIT FOR NEXT CHARACTER
9 0000005A                      PULL     D1/A0             RESTORE BYTE COUNT & BUFFER POINTER
9 0000005E 6576                 BCS      DNERR             TRANSMITTER FAILED - ERROR
9 00000060 10C0                 MOVE.B   D0,(A0)+          GOT CHARACTER - SAVE IN BUFFER
9 00000062 51C9FFEE             DBRA     D1,DNLUP
                       *
9 00000066 4EBAFF98             JSR      RCVCHR(PC)        GET MSB OF CRC
9 0000006A 656A                 BCS      DNERR             XMIT FAILED - EXIT BAD
9 0000006C 4EBAFF92             JSR      RCVCHR(PC)        GET LSB OF CRC
9 00000070 6564                 BCS      DNERR             XMIT FAILED - EXIT BAD.
                       *
9 00000072 4A47                 TST.W    D7                CRC OK?
9 00000074 6660                 BNE      DNERR             NO - EXIT BAD
                       *
9 00000076 4EBAFF88             JSR      RCVCHR(PC)        WAIT FOR ETX
9 0000007A 655A                 BCS      DNERR             NEVER CAME - ERROR
```

```
9 0000007C 0C000003          CMP.B   #ETX,D0              DID WE GET AN ETX?
9 00000080 6654              BNE     DNERR                NO - ERROR
                      *
                      * GOT TABLE INTO INPUT BUFFER OK. STOP ALL OTHER TASKS,
                      * AND UPDATE THE APPROPRIATE TABLE.
                      *
9 00000082 41FA005B          LEA     STABLE(PC),A0        PTR TO LIST OF TASKS TO STOP
                      *
9 00000086 2250       STLUP  MOVE.L  (A0),A1              GET TASK FRAME FROM LIST
9 00000088 4A98              TST.L   (A0)+                CHECK FOR END & BUMP PTR.
9 0000008A 670A              BEQ     STEND                NO MORE TO DO - QUIT
9 0000008C 4269000C          CLR     TK$STF(A1)           SUSPEND THIS GUY
9 00000090 4269000E          CLR     TK$STM(A1)           & MAKE SURE HE NEVER WAKES UP!
9 00000094 60F0              BRA     STLUP
                      *
9 00000096 41FAFF6B   STEND  LEA     TBLTBL(PC),A0        PTR TO LIST OF TABLE SIZES & ADDRS.
9 0000009A 102F0002          MOVE.B  TBLID(SP),D0
9 0000009E 04400030          SUB     #$30,D0              CONVERT TO BINARY
9 000000A2 4880              EXT.W   D0                   SIGN EXTEND TO 16 BITS
9 000000A4 C0FC0006          MULU    #6,D0                CALCULATE OFFSET
9 000000A8 34300000          MOVE    (A0,D0),D2           GET TABLE SIZE (+4 FROM UPLOAD)
9 000000AC 22700002          MOVE.L  2(A0,D0),A1          GET DESTINATION TABLE ADDRESS
9 000000B0 5942              SUBQ    #4,D2                ADJUST TABLE SIZE FOR MOVE
9 000000B2 41FAFF4C          LEA     RCVBUF(PC),A0        PTR TO RECEIVE BUFFER
9 000000B6                   PUSH    A0-A1/D2             PRESERVE REGS. FOR MOVE VERF
9 000000BA 4EBAFF44          JSR     EEPMOV(PC)           MOVE TBLID'S TO EEPROM
9 000000BE                   PULL    A0-A1/D2             RESTORE REGS.
9 000000C2 5342              SUBQ    #1,D2                ADDJUST BYTE COUNT FOR VERF LOOP
                      *
                      * VERIFY THAT MOVE WENT OK.
                      *
9 000000C4 B308       VRFLUP CMP.B   (A0)+,(A1)+
9 000000C6 660E              BNE     DNERR                NO VERIFY - ERROR
9 000000C8 51CAFFFA          DBRA    D2,VRFLUP
                      *
                      * NO PROBLEMS - CLEAR CARRY AND RETURN OK
                      *
9 000000CC 023C00FE          AND     #$FE,CCR             CLEAR CARRY
                      *
9 000000D0 4FEF0004   DNXIT  LEA     4(SP),SP             CLEAN UP STACK
9 000000D4 4E75              RTS                          & RETURN TO CALLER
                      *
9 000000D6 003C0001   DNERR  OR      #1,CCR               SET CARRY
9 000000DA 60F4              BRA     DNXIT                & EXIT BAD
                      *
                      *
                      * LOCAL TABLES:
                      *
                      * STABLE - TABLE OF TASK FRAMES TO BE STOPPED.
                      *
9 000000DC 00000000   STABLE DC.L    T_ANALOG
9 000000E0 00000000          DC.L    T_DIAG
9 000000E4 00000000          DC.L    T_DONUT
9 000000E8 00000000          DC.L    T_KB
9 000000EC 00000000          DC.L    T_OUTPUT
9 000000F0 00000000          DC.L    T_PROCES
9 000000F4 00000000          DC.L    T_XMON
9 000000F8 00000000          DC.L    0                    END OF TABLE
                      *
                      *
                             END

****** TOTAL ERRORS      0--
****** TOTAL WARNINGS    0--
 SYMBOL TABLE LISTING


SYMBOL NAME    SECT   VALUE      SYMBOL NAME    SECT   VALUE
.ISEC                 0000000A   F$KYBD                00000100
.AIOSIZ               00000038   F$MON                 00000080
```

| | | | | | | | |
|---|---|---|---|---|---|---|---|
| .ADOSIZ | | | 00000038 | F$OST | | | 00001000 |
| .COSINE | | | 00000014 | F$FDI | | | 00000800 |
| .DIOSIZ | | | 0000001C | F$PROC | | | 00002000 |
| .EFFECT | | | 0000001C | F$XMIT | | | 00000200 |
| .HIOSIZ | | | 00000010 | FF | | | 0000000C |
| .HOOSIZ | | | 00000180 | HT | | | 00000009 |
| .ICOS | | | 0000000A | IPTENT$ | | | 00000014 |
| .IEFF | | | 00000018 | MAXACE | | | 00000004 |
| .ISCALE | | | 00000006 | NEXTSK | | | 00000030 |
| .ISIN | | | 0000000E | ONESEC | | | 00030090 |
| .KWH | | | 00000024 | ONETIK | | | 000009C4 |
| .PIOSIZ | | | 0000003F | OPTENT$ | | | 00000004 |
| .RBFSIZ | | | 00000400 | PAAR | | | 00000014 |
| .SAMPLE | | | 00000002 | PACR | | | 0000000C |
| .SCALE1 | | | 00000004 | PADDR | | | 00000004 |
| .SCALE2 | | | 00000008 | PADR | | | 00000010 |
| .SCALE3 | | | 0000000C | PBAR | | | 00000016 |
| .SCALE4 | | | 00000010 | PBCR | | | 0000000E |
| .SINE | | | 00000018 | PBDDR | | | 00000006 |
| .SPNJP | MACR | x | | PBDR | | | 00000012 |
| .STEMP | | | 0000001C | PCDDR | | | 00000008 |
| .TEMP | | | 00000012 | PCDR | | | 00000018 |
| .TOFSET | | | 0000000E | PGCR | | | 00000000 |
| .TSCALE | | | 0000000A | PIVR | | | 0000000A |
| .VCOS | | | 00000002 | PROM | | | 00000009 |
| .VEFF | | | 00000014 | PSR | | | 0000001A |
| .VSCALE | | | 00000002 | PSRR | | | 00000002 |
| .VSIN | | | 00000006 | PULL | MACR | x | |
| .WATTS | | | 00000020 | PUSH | MACR | x | |
| .WATTSEC | | | 00000022 | RAM | | | 00000005 |
| ADCTRL | XREF | x | 00000000 | RCVBUF | XREF | 5 | 00000060 |
| AIBENT$ | | | 00000026 | RCVCHR | XREF | 9 | 00000000 |
| BCOUNT | | | 00000000 | RDYALL | | | 00000008 |
| CHGENT | | | 00000034 | READY | | | 00000004 |
| CNTR | | | 0000002E | RELEAS | | | 0000002C |
| CPR | | | 00000024 | RESERV | | | 00000028 |
| CK | | | 0000000D | RESTRT | | | 0000003C |
| DEVINI | | | 00000014 | S60 | | | 000039DF |
| DI$DEV | | | 0000000A | SAV$ | | | 0000002A |
| DI$EVF | | | 00000000 | SETLUP | | 9 | 0000000C |
| DI$IOM | | | 0000001B | SPACE | | | 00000020 |
| DI$ISV | | | 00000006 | STABLE | | 9 | 0000005C |
| DI$LNK | | | 00000016 | STEND | | 9 | 00000096 |
| DI$OWN | | | 00000002 | STLUP | | 9 | 00000086 |
| DI$PTR | | | 00000012 | STX | | | 00000002 |
| DI$QUE | | | 0000000E | SUSPEN | | | 0000000C |
| DI$RSO | | | 0000001A | TBLID | | | 00000002 |
| DI$SIZ | | | 00000020 | TBLTBL | XREF | 9 | 00000000 |
| DI$STA | | | 0000001C | TCR | | | 00000020 |
| DI$USR | | | 0000001E | TIVR | | | 00000022 |
| DIBENT$ | | | 00000026 | TK$CON | | | 00000012 |
| DNERR | | 9 | 00000006 | TK$ENT | | | 00000004 |
| DNLOAD | XDEF | 9 | 00000000 | TK$ID | | | 00000000 |
| DNLUP | | 9 | 00000052 | TK$LPT | | | 00000016 |
| DNXIT | | 9 | 00000000 | TK$NXT | | | 0000001A |
| DSFTENT$ | | | 00000010 | TK$RSO | | | 0000001E |
| EEPMOV | XREF | 9 | 00000000 | TK$SIZ | | | 00000022 |
| EEPROM | | | 00000007 | TK$SSP | | | 00000008 |
| EOT | | | 00000004 | TK$STF | | | 0000000C |
| EOS | MACR | x | | TK$STM | | | 0000000E |
| ETX | | | 00000003 | TK$TIM | | | 00000010 |
| EX$DV0 | | | 0000000A | TSKEND | | | 00000038 |
| EX$DV1 | | | 0000000E | TSKINI | | | 00000010 |
| EX$DV2 | | | 00000012 | TSR | | | 00000034 |
| EX$DV3 | | | 00000016 | T_ANALOG | XREF | 5 | 00000000 |
| EX$DV4 | | | 0000001A | T_DIAG | XREF | 5 | 00000000 |
| EX$DV5 | | | 0000001E | T_DONUT | XREF | 5 | 00000000 |
| EX$DV6 | | | 00000022 | T_KB | XREF | 5 | 00000000 |
| EX$DV7 | | | 00000026 | T_OUTPUT | XREF | 5 | 00000000 |
| EX$NXT | | | 00000006 | T_PROCES | XREF | 5 | 00000000 |
| EX$SIZ | | | 0000002A | T_XMON | XREF | 5 | 00000000 |

```
EX$TIM          00000000   VRFLUP          9   000000C4
EX$TSK          00000002   WAIT                0000001C
EXEC            00000000   WAITCH              00000020
F$ASNFL         00004000   WAITLP              00000024
F$DNUT          00000400   WAKEUP              00000018
F$EEPM          00000040   XSVC        MACR  *
                       DONUT    IDNT     0,4                DONUT INPUT TASK  1/17/83
                                OPT      PCS,BRS
                       *
                       *
                       * SUBROUTINE:    DONUT
                       *
                       * REVISED:       1/17/83
                       *
                       * AUTHOR:        D. A. ZEICHNER
                       *
                       * PURPOSE:       BACKGROUND DONUT DATA ACQUISITION TASK.
                       *
                       * INPUTS:        DONUT INPUT QUEUE (DNTIO$)
                       *
                       * OUTPUTS:       UPDATED DONUT INPUT BUFFER
                       *
                       * NOTE: A6 CONTAINS POINTER TO LAST BUFFER UPDATED.
                       *
                       * EXTERNAL REFERENCES/DEFINITIONS:
                       *
                                XDEF     DONUT
                       *
                       * RAM REFERENCES:
                       *
                                XREF.S   5:DIB$
                                XREF.S   5:DNTIO$
                                XREF.S   5:PRCIO$
                       *
                       * EPROM (PROGRAM) REFERENCES:
                       *
                                XREF.S   9:DEQUE
                                XREF.S   9:ENQUE
                                XREF.S   9:FFPIFP
                       *
                       * LOCAL ASSIGNMENTS:
                       *
          0000000E     MSGSIZ   EQU      14                 MESSAGE LENGTH INCLUDING CRC
          0000000E     FSTWD    EQU      14                 FIRST WORD INDICATOR BIT #
                       *
                       *
          00000009              SECTION  PROM
                       *
  9       00000000     DONUT    EQU      *
                       *
  9 00000000 43FAFFFE  NEWBUF   LEA      DIB$(PC),A1        INIT BUFFER POINTER
                       *
  9 00000004 41FAFFFA  MORBUF   LEA      DNTIO$(PC),A0
  9 00000008 4EBAFFF6           JSR      DEQUE(PC)          GET NEXT WORD FROM QUEUE
  9 0000000C 6406               BCC      OK                 GOT IT.
  9 0000000E                    XSVC     EXEC               QUEUE EMPTY - LET SOMEONE ELSE RUN
  9 00000012 60F0               BRA      MOREUF             TRY AGAIN
                       *
  9 00000014 0800000E  OK       BTST     #FSTWD,D0          1ST WORD FLAG SET?
                       *
                                IF       <NE> THEN          THIS IS FIRST WORD
  9 0000001A 43FAFFE4             LEA      DIB$(PC),A1      RESET BUFFER POINTER
  9 0000001E 0880000E             BCLR     #FSTWD,D0        CLEAR 1ST WORD BIT
                                ELSE                        THIS IS NOT 1ST WORD
  9 00000024           Z_L1.000
  9 00000024 487AFFDA             PEA      DIB$(PC)
  9 00000028 B30F                 CMP.L    (A7)+,A1         AT START OF BUFFER?
  9 0000002A 6704                 BEQ      NEWBUF           SHOULDN'T BE - LOOK FOR NEW 1ST WORD
                                ENDI
  9 0000002C           Z_L2.002
                       *
```

```
9 0000002C 3280                       MOVE    D0,(A1)             SAVE WORD IN BUFFER
9 0000002E 02590FFF                   AND     #$FFF,(A1)+         MASK TO 12 BITS & BUMP POINTER
                            *
9 00000032 487AFFDA                   PEA     DIB$+MSGSIZ
9 00000036 B30F                       CMP.L   (A7)+,A1            MESSAGE DONE?
9 00000038 6DCA                       BLT     MOREBUF             NO - KEEP GOING
                            *
9 0000003A 4A40                       TST     D0                  CRC OK?
9 0000003C 6BC2                       BMI     NEWBUF              NO - START OVER
                            *
                            * GET DONUT ID FROM HEADER WORD, LOCATE BUFFER, AND
                            * SEE IF IT IS READY FOR MORE INPUT. IF NOT, START OVER.
                            *
9 0000003E 41FAFFC0                   LEA     DIB$(PC),A0         GET PTR TO RECEIVE BUFFER
9 00000042 3010                       MOVE    (A0),D0             GET HEADER
9 00000044 0240000F                   AND     #$F,D0              ISOLATE DONUT ID
9 00000048 67B6                       BEQ     NEWBUF              DON'T ACCEPT DELIVERY OF DONUT #0.
9 0000004A C0FC0026                   MULU    #DIBENT$,D0         CALCULATE OFFSET TO PROPER INPUT BUFFER
9 0000004E 08F000070000               BSET    #7,(A0,D0)          TEST & SET DI FLAG.
9 00000054 66AA                       BNE     NEWBUF              WAS ALREADY SET - START OVER
9 00000056 02709FF00000               AND     #$9FF0,(A0,D0)      CLEAR AC, VP FLAGS, & BUFFER AGE
                            *
                            * MOVE RECEIVED DATA TO INPUT BUFFER. (SCRAP THE 1ST WORD)
                            *
9 0000005C 4DF00000                   LEA     (A0,D0),A6          SAVE ADDRESS OF BUFFER FOR LATER
9 00000060 41F00002                   LEA     2(A0,D0),A0         SET A0 PAST HEADER WORD OF BUFFER
9 00000064 43FAFF9C                   LEA     DIB$+2(PC),A1       SET A1 PAST HEADER WORD RECEIVED
9 00000068 303C0005                   MOVE    #(MSGSIZ-4)/2,D0    # OF WORDS TO MOVE -2 (DON'T MOVE LAST)
                            *
9 0000006C 3E19             MOVLUP    MOVE    (A1)+,D7            GET WORD
9 0000006E 04470800                   SUB     #$800,D7            CONVERT TO BINARY
9 00000072 48C7                       EXT.L   D7                  SIGN EXTEND TO 32 BITS
9 00000074 4EBAFF8A                   JSR     FFPIFP(PC)          CONVERT TO FLOATING POINT
9 00000078 20C7                       MOVE.L  D7,(A0)+            & MOVE TO DONUT INPUT BUFFER
9 0000007A 51C8FFF0                   DBRA    D0,MOVLUP
                            *
9 0000007E 3091                       MOVE    (A1),(A0)           MOVE LAST WORD (TEMP) WITHOUT CONVERSION
                            *
9 00000080 300E             QUELUP    MOVE    A6,D0
9 00000082 41FAFF7C                   LEA     PRCIQ$(PC),A0
9 00000086 4EBAFF78                   JSR     ENQUE(PC)           PUT BUFFER ADR ON PROCESS INPUT QUEUE
9 0000008A 6400FF74                   BCC.L   NEWBUF              QUEUE WENT OK - DO NEXT ONE
9 0000008E 303C2000                   MOVE    #F$PROC,D0          FLAG TO WAIT FOR
9 00000092 4241                       CLR     D1                  NO TIME INVOLVED
9 00000094                            XSVC    SUSPEN
9 00000098 60E6                       BRA     QUELUP              TRY AGAIN
                            *
                            *
                                      END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$DMUT | | 00000400 |
| .AIOSIZ | | 00000038 | F$KYBD | | 00000100 |
| .AOOSIZ | | 00000038 | F$MON | | 00000080 |
| .COSINE | | 00000014 | F$OST | | 00001000 |
| .DIOSIZ | | 0000001C | F$PDI | | 00000800 |
| .EFFECT | | 0000001C | F$PROC | | 00002000 |
| .HIOSIZ | | 00000010 | F$XMIT | | 00000200 |
| .HOOSIZ | | 00000180 | FF | | 0000000C |
| .ICOS | | 0000000A | FFPIFP | XREF 9 | 00000000 |
| .IEFF | | 00000018 | FSTHD | | 0000000E |
| .ISCALE | | 00000006 | HT | | 00000009 |
| .ISIN | | 0000000E | IPTENT$ | | 00000014 |
| .KWH | | 00000024 | MAXAGE | | 00000004 |

```
.PIOSIZ                0000003F   MOREUF          9   00000004
.RBFSIZ                00000400   MOVLUP          9   0000006C
.SAMPLE                00000002   MSGSIZ              0000000E
.SCALE1                00000004   NEWBUF          9   00000000
.SCALE2                00000008   NEXTSK              00000030
.SCALE3                0000000C   OK              9   00000014
.SCALE4                00000010   ONESEC              00030090
.SINE                  00000018   ONETIK              000009C4
.SPNJP     MACR  *                OPTENT$             00000004
.STEMP                 0000001C   PAAR                00000014
.TEMP                  00000012   PACR                0000000C
.TOFSET                0000000E   PADDR               00000004
.TSCALE                0000000A   PADR                00000010
.VCOS                  00000002   PBAR                00000016
.VEFF                  00000014   PBCR                0000000E
.VSCALE                00000002   PBDDR               00000006
.VSIN                  00000006   PBDR                00000012
.WATTS                 00000020   PCDDR               00000008
.WATTSEC               00000022   PCDR                00000018
AIBENT$                00000026   PGCR                00000000
CHGENT                 00000034   PIVR                0000000A
CNTR                   0000002E   PRCIO$   XREF   5   00000000
CPR                    00000024   PROM                00000009
CR                     00000000   PSR                 0000001A
DEQUE      XREF  9     00000000   PSRR                00000002
DEVINI                 00000014   PULL     MACR   *
DI$DEV                 0000000A   PUSH     MACR   *
DI$EVF                 00000000   QUELUP          9   00000080
DI$ION                 00000018   RAM                 00000005
DI$ISV                 00000006   RDYALL              00000008
DI$LNK                 00000016   READY               00000004
DI$OWN                 00000002   RELEAS              0000002C
DI$FTR                 00000012   RESERV              00000028
DI$QUE                 0000000E   RESTRT              0000003C
DI$RSO                 0000001A   S60                 000539DF
DI$SIZ                 00000020   SAV$                0000002A
DI$STA                 0000001C   SPACE               00000020
DI$USK                 0000001E   STX                 00000002
DIB$       XREF  5     00000000   SUSPEN              0000000C
DIBENT$                00000026   TCR                 00000020
DNTIO$     XREF  5     00000000   TIVR                00000022
DONUT      XDEF  9     00000000   TK$CON              00000012
DSFTENT$               00000010   TK$ENT              00000004
EEPROM                 00000007   TK$ID               00000000
ENQUE      XREF  9     00000000   TK$LPT              00000016
EOT                    00000004   TK$NXT              0000001A
EOS        MACR  *                TK$RSO              0000001E
ETX                    00000003   TK$SIZ              00000022
EX$DV0                 0000000A   TK$SSP              00000008
EX$DV1                 0000000E   TK$STF              0000000C
EX$DV2                 00000012   TK$STN              0000000E
EX$DV3                 00000016   TK$TIN              00000010
EX$DV4                 0000001A   TSKEND              00000038
EX$DV5                 0000001E   TSKINI              00000010
EX$DV6                 00000022   TSR                 00000034
EX$DV7                 00000026   WAIT                0000001C
EX$NXT                 00000006   WAITCN              00000020
EX$SIZ                 0000002A   WAITLP              00000024
EX$TIN                 00000000   WAKEUP              00000018
EX$TSK                 00000002   XSVC     MACR   *
EXEC                   00000000   Z_L1.000        9   00000024
F$ASMPL                00004000   Z_L2.002        9   0000002C
```

```
EEPMOV   IDNT   0,1                 EEPROM BLOCK MOVE     3/18/83
         OPT    PCS,BRS
*
*
* SUBROUTINE:    EEPMOV
*
* REVISED:       3/18/83
*
* AUTHOR:        T. WEBER
```

```
                        *
                        * PURPOSE:      MOVE A BLOCK OF DATA TO EEPROM  (on the Communications board).
                        *
                        * INPUTS:       A0 - SOURCE ADDRESS OF MEMORY BLOCK
                        *               A1 - DESTINATION ADDRESS
                        *               D2 - # OF BYTES TO MOVE
                        *
                        * OUTPUTS:      ALL REGISTERED DESTROYED
                        *
                        * EXTERNAL REFERENCES/DEFINITIONS:
                        *
                                XDEF    EEPMOV
                                XDEF    LCKOUT
                        *
                        * HARDWARE REFERENCE:
                        *
                                XREF    DRCVR
                        *
                        * LOCAL ASSIGNMENTS:
                        *
                        REGS    REG     A0-A1/D2
                        *
               00000005         SECTION RAM
  5 00000000 00000002   LCKOUT  DS.W    1
                        *
                        *
               00000009         SECTION PROM
                        *
  9            00000000 EEPMOV  EQU     *
                        *
  9 00000000 08F900000000 SETLOC BSET   #0,LCKOUT           SET LOCK OUT
               0000
  9 00000008 6714               BEQ     BGIN
                        *
  9 0000000A                    PUSH    REGS
  9 0000000E 303C0040           MOVE    #F$EEPM,D0          WAIT ON FLAGS TO SUSPEN
  9 00000012 4241               CLR     D1                  NO TIME OUT
  9 00000014                    XSVC    SUSPEN              WAIT FOR MOVE TO FINISH'
  9 00000018                    PULL    REGS
  9 0000001C 60E2               BRA     SETLOC              TRY TO GAIN ACCESS AGAIN
                        *
  9 0000001E 08F900040000 BGIN  BSET.B  #4,PADR+DRCVR       ENABLE EEPROM
               0010
  9 00000026 5342               SUBQ    #1,D2               ADJUST BYTE COUNT FOR LOOP
                        *
  9 00000028 12D8       BMVLUP  MOVE.B  (A0)+,(A1)+         MOVE A BYTE
  9 0000002A                    PUSH    REGS                SAVE POINTERS AFTER MOVE
  9 0000002E 4240               CLR     D0                  CLEAR FLAGS
  9 00000030 7202               MOVEQ   #2,D1               WAIT 2 TICKS BETWEEN MOVES
  9 00000032                    XSVC    SUSPEN
  9 00000036                    PULL    REGS                RESTORE POINTERS
  9 0000003A 51CAFFEC           DBRA    D2,BMVLUP           ANY MORE BYTES TO MOVE?
                        *
  9 0000003E 08B900000000 EXIT  BCLR    #0,LCKOUT           MAKE AVAILABLE TO OTHER TASKS
               0000
  9 00000046 08B900040000       BCLR.B  #4,PADR+DRCVR       WRITE PROTECT EEPROM
               0010
  9 0000004E 303C0040           MOVE    #F$EEPM,D0          SET WAIT ON FLAGS
  9 00000052                    XSVC    RDYALL              WAKEUP EVERYONE WAITING TO GET IN HERE
  9 00000056 4E75               RTS
                        *
                        *
                        *
                                END

****** TOTAL ERRORS      0--
****** TOTAL WARNINGS    0--
 SYMBOL TABLE LISTING
 SYMBOL NAME     SECT  VALUE        SYMBOL NAME     SECT   VALUE
 .1SEC               0000000A       EXEC                   00000000
 .AIOSIZ             0000003B       EXIT              9    0000003E
```

| | | | | | | | |
|---|---|---|---|---|---|---|---|
| .ADDSIZ | | | 00000038 | F$ASHPL | | | 00004000 |
| .COSINE | | | 00000014 | F$DMUT | | | 00000400 |
| .DIOSIZ | | | 0000001C | F$EEPM | | | 00000040 |
| .EFFECT | | | 0000001C | F$KYBD | | | 00000100 |
| .HIOSIZ | | | 000000C8 | F$MON | | | 00000080 |
| .HOOSIZ | | | 00000180 | F$OST | | | 00001000 |
| .ICOS | | | 0000000A | F$PDI | | | 00000800 |
| .IEFF | | | 0000001B | F$PROC | | | 00002000 |
| .ISCALE | | | 00000006 | F$XMIT | | | 00000200 |
| .ISIN | | | 0000000E | FF | | | 0000000C |
| .KWH | | | 00000024 | HT | | | 00000009 |
| .PIOSIZ | | | 0000003F | IPTENT$ | | | 00000014 |
| .REFSIZ | | | 00000400 | LCKOUT | XDEF | 5 | 00000000 |
| .SAMPLE | | | 00000002 | MAXAGE | | | 00000004 |
| .SCALE1 | | | 00000004 | NEXTSK | | | 00000030 |
| .SCALE2 | | | 00000008 | ONESEC | | | 0003D090 |
| .SCALE3 | | | 0000000C | ONETIK | | | 000009C4 |
| .SCALE4 | | | 00000010 | OPTENT$ | | | 00000004 |
| .SINE | | | 00000018 | PAAR | | | 00000014 |
| .SPMJP | MACR | * | | PACR | | | 0000000C |
| .STEMP | | | 0000001C | PADDR | | | 00000004 |
| .TEMP | | | 00000012 | PADR | | | 00000010 |
| .TOFSET | | | 0000000E | PBAR | | | 00000016 |
| .TSCALE | | | 0000000A | PBCR | | | 0000000E |
| .VCOS | | | 00000002 | PBDDR | | | 00000006 |
| .VEFF | | | 00000014 | PBDR | | | 00000012 |
| .VSCALE | | | 00000002 | PCDDR | | | 00000008 |
| .VSIN | | | 00000006 | PCDR | | | 00000018 |
| .WATTS | | | 00000020 | PGCR | | | 00000000 |
| .WATTSEC | | | 00000022 | PIVR | | | 0000000A |
| AIBENT$ | | | 00000026 | PROM | | | 00000009 |
| BGIN | | 9 | 0000001E | PSR | | | 0000001A |
| BMVLUP | | 9 | 0000002B | PSRR | | | 00000002 |
| CHGENT | | | 00000034 | PULL | MACR | * | |
| CNTR | | | 0000002E | PUSH | MACR | * | |
| CPR | | | 00000024 | RAM | | | 00000005 |
| CR | | | 0000000D | RDYALL | | | 0000000B |
| CTRL13 | | | 00000000 | READY | | | 00000004 |
| CTRL2 | | | 00000002 | REGS | REG | * | |
| DEVINI | | | 00000014 | RELEAS | | | 0000002C |
| DI$DEV | | | 0000000A | RESERV | | | 00000028 |
| DI$EVF | | | 00000000 | RESTRT | | | 0000003C |
| DI$IOM | | | 0000001B | S60 | | | 000039DF |
| DI$ISV | | | 00000006 | SAV$ | | | 0000002A |
| DI$LNK | | | 00000016 | SETLOC | | 9 | 00000000 |
| DI$OWN | | | 00000002 | SPACE | | | 00000020 |
| DI$PTR | | | 00000012 | STX | | | 00000002 |
| DI$QUE | | | 0000000E | SUSPEN | | | 0000000C |
| DI$RSO | | | 0000001A | TCP | | | 00000020 |
| DI$SIZ | | | 00000020 | TIMR1 | | | 00000004 |
| DI$STA | | | 0000001C | TIMR2 | | | 00000008 |
| DI$USR | | | 0000001E | TIMR3 | | | 0000000C |
| DIBENT$ | | | 00000026 | TIVR | | | 00000022 |
| DRCVR | XREF | * | 00000000 | TK$CDN | | | 00000012 |
| DSFTENT$ | | | 00000010 | TK$ENT | | | 00000004 |
| EEPMOV | XDEF | 9 | 00000000 | TK$ID | | | 00000000 |
| EEPROM | | | 00000007 | TK$LPT | | | 00000016 |
| EOT | | | 00000004 | TK$NXT | | | 0000001A |
| EOS | MACR | * | | TK$RSO | | | 0000001E |
| ETX | | | 00000003 | TK$SIZ | | | 00000022 |
| EX$DV0 | | | 0000000A | TK$SSP | | | 00000008 |
| EX$DV1 | | | 0000000E | TK$STF | | | 0000000C |
| EX$DV2 | | | 00000012 | TK$STM | | | 0000000E |
| EX$DV3 | | | 00000016 | TK$TIM | | | 00000010 |
| EX$DV4 | | | 0000001A | TSKEND | | | 00000038 |
| EX$DV5 | | | 0000001E | TSKINI | | | 00000010 |
| EX$DV6 | | | 00000022 | TSK | | | 00000034 |
| EX$DV7 | | | 00000026 | WAIT | | | 0000001C |
| EX$NXT | | | 00000006 | WAITCN | | | 00000020 |
| EX$SIZ | | | 0000002A | WAITLP | | | 00000024 |
| EX$TIM | | | 00000000 | WAKEUP | | | 00000018 |
| EX$TSK | | | 00000002 | XSVC | MACR | * | |

```
                          EFFVAL  IDNT    0,11                 CALCULATE EFFECTIVE VALUES   3/30/83
                                  OPT     PCS,BRS
                          *
                          * SUBROUTINE:   EFFVAL
                          *
                          * REVISED:      3/30/83
                          *               Revised due to the conversation with Dick S., at 5:40 pm.
                          *               In which everything less than 512 will still be scaled.
                          *               Previously, this condition fell thru to a NOSCALE routine.
                          *               Floating point constants have also been changed .
                          *
                          * AUTHOR:       D. A. ZEICHNER
                          *
                          * PURPOSE:      GIVEN AN INPUT BUFFER CALCULATE ALL APPROPRIATE EFFECTIVE
                          *               VALUES, AND STORE IN THE BUFFER.  ALSO, SCALE THE VALUES IF
                          *               APPROPRIATE.
                          *
                          * INPUTS:       A0 - POINTER TO INPUT BUFFER TO PROCESS
                          *
                          * OUTPUTS:      PROCESSED BUFFER. ALL REGISTERS PRESERVED.
                          *
                          * EXTERNAL REFERENCES/DEFINITIONS:
                          *
                                  XDEF    EFFVAL
                          *
                          * RAM REFERENCES:
                          *
                                  XREF.S  5:ISTS
                          *
                          * EEPROM REFERENCES:
                          *
                                  XREF    DSFTS
                                  XREF    IFTS
                          *
                          * EPROM (PROGRAM) REFERENCES:
                          *
                                  XREF.S  9:FFPADD
                                  XREF.S  9:FFPCMP
                                  XREF.S  9:FFPIFP
                                  XREF.S  9:FFPMUL
                                  XREF.S  9:FFPSQRT
                                  XREF.S  9:FFPSUB
                          *
                          * FLOATING POINT CONSTANTS:
                          *
                          *K512      EQU    $8000004A         512 (START OF 1ST CURRENT SCALE RANGE)
                          *
             8000004A     K$200     EQU    $8000004A          200 (START OF 2ND CURRENT SCALE RANGE)
             8000004B     K$400     EQU    $8000004B          400 (START OF 3RD CURRENT SCALE RANGE)
             C000004B     K$600     EQU    $C000004B          600 (START OF LAST CURRENT SCALE RANGE)
                          *
                          *
             00000009     *       SECTION  PROM
                          *
9 00000000                EFFVAL  PUSH    D0-D1/D3-D7/A0-A1    SAVE INCOMING REGISTERS
                          *
9 00000004 1010                   MOVE.B  (A0),D0              GET INPUT TYPE
9 00000006 E608                   LSR.B   #3,D0                ISOLATE INPUT TYPE
9 00000008 02000003               AND.B   #3,D0
9 0000000C 0C000003               CMP.B   #3,D0
9 00000010 67000000               BEQ.L   DBUF                 TYPE IS 3 - WE HAVE A DIGITAL INPUT BUFFER
                          *
                          * BUFFER IS ANALOG - IF WE HAVE A TEMPERATURE,
                          * CONVERT 1ST ENTRY TO FLOATING POINT & SAVE
                          * IN BUFFER.
                          *
9 00000014 0C000002               CMP.B   #2,D0
9 00000018 6616                   BNE     VOLTS                NOT TEMP - CHECK FOR VOLTAGE OR CURRENT
                          *
                          * TYPE IS TEMPERATURE - CONVERT.
                          *
```

```
9 0000001A 3E280002              MOVE     .SAMPLE(A0),D7         GET RAW SAMPLE
9 0000001E 04470800              SUB      #$800,D7               CONVERT TO 2'S COMPLEMENT
9 00000022 48C7                  EXT.L    D7                     SIGN EXTEND TO 32 BITS
9 00000024 4EBAFFDA              JSR      FFFIFP(PC)             CONVERT TO FLOATING POINT (D5 DESTROYED)
9 00000028 2147001C              MOVE.L   D7,.EFFECT(A0)         AND STORE IN BUFFER
9 0000002C 6000011C              BRA.L    EFFXIT
                        *
9 00000030 3210         VOLTS    MOVE     (A0),D1                CALC. PTR TO IPT ENTRY
9 00000032 EA49                  LSR      #5,D1
9 00000034 0241003F              AND      #$3F,D1                ISOLATE INPUT NUMBER
9 00000038 C2FC0014              MULU     #IPTENT$,D1            CALCULATE OFFSET
9 0000003C 43F900000000          LEA      IPT$,A1                POINT TO IPT
                        *
                                 IF.B     D0 <EQ> #0 THEN        BUFFER IS VOLTAGE INPUT
                        *
9 00000048 2C311004                 MOVE.L   .SCALE1(A1,D1),D6   GET SCALE FACTOR
9 0000004C 2E280014                 MOVE.L   .COSINE(A0),D7      GET COSINE COMPONENT,
9 00000050 4EBAFFAE                 JSR      FFPMUL(PC)          SCALE IT,
9 00000054 21470014                 MOVE.L   D7,.COSINE(A0)      SAVE IN BUFFER
9 00000058 2007                     MOVE.L   D7,D0               & IN D0
                        *
9 0000005A 2E280018                 MOVE.L   .SINE(A0),D7        GET SINE COMPONENT,
9 0000005E 4EBAFFA0                 JSR      FFPMUL(PC)          SCALE IT,
9 00000062 21470018                 MOVE.L   D7,.SINE(A0)        & SAVE IN BUFFER.
                        *
9 00000066 610000E8                 BSR.L    HYPOT               CALC THE SQRT OF SUM OF SQUARES
9 0000006A 2147001C                 MOVE.L   D7,.EFFECT(A0)      & SAVE IN BUFFER
                        *
                                 ELSE                            BUFFER TYPE IS CURRENT
9 00000070              Z_L1.000
                        *
9 00000070 20280014                 MOVE.L   .COSINE(A0),D0      GET COSINE COMPONENT,
9 00000074 2E280018                 MOVE.L   .SINE(A0),D7        SINE COMPONENT,
9 00000078 61000006                 BSR.L    HYPOT               CALC. SQRT. OF SUM OF SQUARES,
9 0000007C 2147001C                 MOVE.L   D7,.EFFECT(A0)      & SAVE IN BUFFER
                        *
                        * GET THE SCALING FACTOR BASED ON THE VALUE
                        * OF D7. IF D7 < 512, THEN DON'T SCALE AT ALL.  ** NOT TRUE ANYMORE ! **
                        *
                        *        MOVE.L #K512,D6
                        *        JSR    FFPCMP(PC)
                        *        BMI    NOSCALE
                        *
9 00000080 2C3C8000004A          MOVE.L   #K$200,D6
9 00000086 4EBAFF78              JSR      FFPCMP(PC)
9 0000008A 6B2A                  BMI      SCALE1
                        *
9 0000008C 2C3C8000004B          MOVE.L   #K$400,D6
9 00000092 4EBAFF6C              JSR      FFPCMP(PC)
9 00000096 6B18                  BMI      SCALE2
                        *
9 00000098 2C3CC000004B          MOVE.L   #K$600,D6
9 0000009E 4EBAFF60              JSR      FFPCMP(PC)
9 000000A2 6B06                  BMI      SCALE3
                        *
9 000000A4 20311010     SCALE4   MOVE.L   .SCALE4(A1,D1),D0
9 000000A8 6010                  BRA      EFF0
                        *
9 000000AA 2031100C     SCALE3   MOVE.L   .SCALE3(A1,D1),D0
9 000000AE 600A                  BRA      EFF0
                        *
9 000000B0 20311008     SCALE2   MOVE.L   .SCALE2(A1,D1),D0
9 000000B4 6004                  BRA      EFF0
                        *
9 000000B6 20311004     SCALE1   MOVE.L   .SCALE1(A1,D1),D0
                        *
9 000000BA 2C00         EFF0     MOVE.L   D0,D6                  GET SCALE FACTOR (EFF VALUE ALREADY IN D7)
9 000000BC 4EBAFF42              JSR      FFPMUL(PC)             SCALE EFFECTIVE VALUE
9 000000C0 2147001C              MOVE.L   D7,.EFFECT(A0)         & STORE IN BUFFER
                        *
9 000000C4 2E00                  MOVE.L   D0,D7                  GET SCALE FACTOR
```

```
9 000000C6 2C2B0014          MOVE.L  .COSINE(A0),D6
9 000000CA 4EBAFF34          JSR     FFPMUL(PC)           SCALE COSINE COMPONENT
9 000000CE 21470014          MOVE.L  D7,.COSINE(A0)
                      *
9 000000D2 2E00              MOVE.L  D0,D7                GET SCALE FACTOR
9 000000D4 2C2B0018          MOVE.L  .SINE(A0),D6
9 000000D8 4EBAFF26          JSR     FFPMUL(PC)           SCALE SINE COMPONENT
9 000000DC 21470018          MOVE.L  D7,.SINE(A0)
                      *
                      NOSCALE  ENDI
  9 000000E0          Z_L2.002
9 000000E0 6068              BRA     EFFXIT               DONE!
                      *
                      *
                      * INPUT HAS A DONUT BUFFER
                      *
9 000000E2 3010       DBUF   MOVE    (A0),D0              GET DONUT NUMBER
9 000000E4 EE48              LSR     #7,D0
9 000000E6 0240000F          AND     #$F,D0               & ISOLATE INPUT NUMBER
                      *
9 000000EA C0FC0010          MULU    #DSFTENT$,D0         CALC OFFSET TO DSFT ENTRY 4 THIS DONUT
9 000000EE 227C00000000      MOVE.L  #DSFT$,A1
9 000000F4 43F10002          LEA     2(A1,D0),A1          SET POINTER TO 1ST SCALE FACTOR
                      *
                      * SCALE VOLTAGE & CURRENT COMPONENTS:
                      *
                             FOR     D1 = #0 TO #4 BY #4 DO
  9 000000FE          Z_L1.004
                      *
9 000000FE 2C19              MOVE.L  (A1)+,D6             GET SCALING FACTOR
9 00000100 2E301002          MOVE.L  .VCOS(A0,D1),D7      GET COSINE COMPONENT OF V (OR I)
9 00000104 4EBAFEFA          JSR     FFPMUL(PC)           SCALE IT
9 00000108 21871002          MOVE.L  D7,.VCOS(A0,D1)      PUT BACK INTO THE BUFFER
9 0000010C 2007              MOVE.L  D7,D0                ! SAVE IN D0.
                      *
9 0000010E 2E301006          MOVE.L  .VSIN(A0,D1),D7      GET SINE COMPONENT OF V (OR I)
9 00000112 4EBAFEEC          JSR     FFPMUL(PC)
9 00000116 21871006          MOVE.L  D7,.VSIN(A0,D1)
9 0000011A 6134              BSR     HYPOT                CALCULATE EFFECTIVE VALUE
9 0000011C 21871014          MOVE.L  D7,.VEFF(A0,D1)      & STORE IN BUFFER
                             ENDF
                      *
                      * SCALE TEMPERATURE & ADD OFFSET:
                      *
9 00000128 3E280012          MOVE    .TEMP(A0),D7         GET RAW TEMP VALUE
9 0000012C 48C7              EXT.L   D7
9 0000012E 4EBAFED0          JSR     FFPIFP(PC)           CONVERT TEMP TO FLOATING POINT
9 00000132 2C19              MOVE.L  (A1)+,D6             GET TEMPERATURE SCALE FACTOR
9 00000134 4EBAFECA          JSR     FFPMUL(PC)           & SCALE TEMP
9 00000138 2C07              MOVE.L  D7,D6                SAVE SCALED TEMP FOR A SECOND
9 0000013A 3E11              MOVE    (A1),D7              GET OFFSET (INTEGER)
9 0000013C 48C7              EXT.L   D7                   SIGN EXTEND TO 32 BITS
9 0000013E 4EBAFEC0          JSR     FFPIFP(PC)           CONVERT TO FLOATING POINT
9 00000142 4EBAFEBC          JSR     FFPADD(PC)           & ADD TO SCALED TEMPERATURE
9 00000146 2147001C          MOVE.L  D7,.STEMP(A0)        & STORE IN SCALED TEMP FIELD
                      *
                      * THIS WAY OUT!!!!
                      *
9 0000014A            EFFXIT PULL    D0-D1/D3-D7/A0-A1    RESTORE INCOMING REGISTERS
9 0000014E 4E75              RTS                          AND RETURN
                      *
                      *
                      * LOCAL SUBROUTINES:
                      *
                      * HYPOT - CALCULATE THE SQUARE ROOT OF THE SUM OF THE SQUARES. (HYPOTENUSE)
                      *
                      * CALCULATION PERFORMED: C = SQRT(A**2 + B**2)
                      *
                      * INPUTS: D0 - B IN EQN. SHOWN ABOVE.
                      *         D7 - A IN EQN. SHOWN ABOVE.
                      *
```

```
                          * OUTPUTS: D7 - RESULT
                          *          D0 - CONTAINS B**2
                          *          D3,D4,D5 DESTROYED
                          *
9 00000150 2C07           HYPOT   MOVE.L  D7,D6
9 00000152 4EBAFEAC               JSR     FFPMUL(PC)       SQUARE B
9 00000156 CF40                   EXG     D7,D0            & SAVE IN D0
9 00000158 2C07                   MOVE.L  D7,D6
9 0000015A 4EBAFEA4               JSR     FFPMUL(PC)       SQUARE A
9 0000015E 2C00                   MOVE.L  D0,D6
9 00000160 4EBAFE9E               JSR     FFPADD(PC)       ADD SQUARES OF A & B
9 00000164 4EBAFE9A               JSR     FFPSQRT(PC)      & TAKE SQUARE ROOT.
9 00000168 4E75                   RTS
                          *
                          *
                                  END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | FF | | | 0000000C |
| .AIOSIZ | | | 0000003B | FFPADD | XREF | 9 | 00000000 |
| .AOOSIZ | | | 0000003B | FFPCMP | XREF | 9 | 00000000 |
| .COSINE | | | 00000014 | FFPIFP | XREF | 9 | 00000000 |
| .DIOSIZ | | | 0000001C | FFPMUL | XREF | 9 | 00000000 |
| .EFFECT | | | 0000001C | FFPSQRT | XREF | 9 | 00000000 |
| .HIOSIZ | | | 000000C8 | FFPSUB | XREF | 9 | 00000000 |
| .HOOSIZ | | | 00000180 | HT | | | 00000009 |
| .ICOS | | | 0000000A | HYPOT | | 9 | 00000150 |
| .IEFF | | | 00000018 | IPT$ | XREF | * | 00000000 |
| .ISCALE | | | 00000006 | IPTENT$ | | | 00000014 |
| .ISIN | | | 0000000E | IST$ | XREF | 5 | 00000000 |
| .KWH | | | 00000024 | K$200 | | | 8000004A |
| .PIOSIZ | | | 0000003F | K$400 | | | 8000004B |
| .RBFSIZ | | | 00000400 | K$600 | | | C000004B |
| .SAMPLE | | | 00000002 | MAXAGE | | | 00000004 |
| .SCALE1 | | | 00000004 | NOSCALE | | 9 | 000000E0 |
| .SCALE2 | | | 00000008 | ONESEC | | | 00030090 |
| .SCALE3 | | | 0000000C | ONETIK | | | 000009C4 |
| .SCALE4 | | | 00000010 | OPTENT$ | | | 00000004 |
| .SINE | | | 00000018 | PAAR | | | 00000014 |
| .STEMP | | | 0000001C | PACR | | | 0000000C |
| .TEMP | | | 00000012 | PADDR | | | 00000004 |
| .TOFSET | | | 0000000E | PADR | | | 00000010 |
| .TSCALE | | | 0000000A | PBAR | | | 00000016 |
| .VCOS | | | 00000002 | PBCR | | | 0000000E |
| .VEFF | | | 00000014 | PBDDR | | | 00000006 |
| .VSCALE | | | 00000002 | PBDR | | | 00000012 |
| .VSIN | | | 00000006 | PCDDR | | | 00000008 |
| .WATTS | | | 00000020 | PCDR | | | 00000018 |
| .WATTSEC | | | 00000022 | PGCR | | | 00000000 |
| AIBENT$ | | | 00000026 | PIVR | | | 0000000A |
| CNTR | | | 0000002E | PROM | | | 00000009 |
| CPR | | | 00000024 | PSP | | | 0000001A |
| CR | | | 0000000D | PSRR | | | 00000002 |
| CTRL13 | | | 00000000 | PULL | MACR | * | |
| CTRL2 | | | 00000002 | PUSH | MACR | * | |
| DBUF | | 9 | 000000E2 | RAM | | | 00000005 |
| DIBENT$ | | | 00000026 | S60 | | | 0000390F |
| DSFT$ | XREF | * | 00000000 | SCALE1 | | 9 | 000000B6 |
| DSFTENT$ | | | 00000010 | SCALE2 | | 9 | 000000E0 |
| EEPROM | | | 00000007 | SCALE3 | | 9 | 000000AA |
| EFFO | | 9 | 0000008A | SCALE4 | | 9 | 000000A4 |
| EFFVAL | XDEF | 9 | 00000000 | SPACE | | | 00000020 |
| EFFXIT | | 9 | 0000014A | STX | | | 00000002 |

```
EOT                 00000004     TCR                00000020
ETX                 00000003     TIMR1              00000004
F$ASHFL             00004000     TIMR2              00000008
F$CMUT              00000400     TIMR3              0000000C
F$EEPM              00000040     TIVR               00000022
F$KTED              00000100     TSR                00000034
F$MON               00000080     VOLTS           9  00000030
F$OST               00001000     Z_L1.000        9  00000070
F$PDI               00000800     Z_L1.004        9  000000FE
F$PROC              00002000     Z_L2.002        9  000000E0
F$XMIT              00000200     Z_L2.003        9  00000122
                        ENQUE    IDNT    0,4                PUT DATA ON QUEUE    1/19/83
                                 OPT     PCS,BRS
                        *
                        * SUBROUTINE:    ENQUE
                        *
                        * REVISED:       1/19/83
                        *
                        * AUTHOR:        D. A. ZEICHNER
                        *
                        * PURPOSE:       PUT DATA ON QUEUE.
                        *
                        * INPUTS:        D0 - BYTE (WORD) TO BE QUEUED.
                        *                A0 - POINTER TO QUEUE HEADER BLOCK OF THE FORMAT:
                        *
                        *                     DS.W QUEUE HEAD POINTER
                        *                     DS.W QUEUE TAIL POINTER
                        *                     DS.W QUEUE END POINTER
                        *                     DS.W QUEUE STATUS BYTE
                        *                     DS.B QUEUE STORAGE AREA
                        *
                        * OUTPUTS:       CARRY SET IF QUEUE FULL.
                        *                Z FLAG SET (EQUAL) IF SUCCESSFUL.
                        *                ALL OTHER REGISTERS PRESERVED.
                        *
                        * EXTERNAL REFERENCES/DEFINITIONS:
                        *
                                 XDEF    ENQUE
                        *
                        * LOCAL ASSIGNMENTS:
                        *
           00000008     QDATA    EQU     8                  OFFSET TO QUEUE DATA AREA
           00000007     QSTAT    EQU     7                  OFFSET TO QUEUE STATUS BYTE
           00000004     QEND     EQU     4                  OFFSET TO END OF QUEUE POINTER
           00000002     QTAIL    EQU     2                  OFFSET TO QUEUE TAIL POINTER
           00000001     QSIZE    EQU     1                  QUEUE ELEMENT SIZE BIT
           00000000     QFULL    EQU     0                  QUEUE FULL BIT
           00000000     QHEAD    EQU     0                  OFFSET TO QUEUE HEAD POINTER
                        *
PUT DATA ON QUEUE
                        *
           00000009              SECTION PROM
                        *
  9 00000000            ENQUE    PUSH    A1                 SAVE A1
                        *
  9 00000004 082800000007        BTST    #QFULL,QSTAT(A0)   IS QUEUE FULL?
  9 0000000A 6636                BNE     ENQFUL             YES - EXIT BAD
                        *
  9 0000000C 3250                MOVE    (A0),A1            GET HEAD POINTER
  9 0000000E 082800010007        BTST    #QSIZE,QSTAT(A0)   TEST WORD FLAG
                        *
                        * IF THE WORD FLAG IS SET, THEN
                        * PUT A FULL WORD ON THE QUEUE.
                        *
                                 IF      <NE> THEN
  9 00000016 32C0                  MOVE.W  D0,(A1)+
                                 ELSE
  9 0000001A            Z_L1.000
  9 0000001A 12C0                  MOVE.B  D0,(A1)+
                                 ENDI
  9 0000001C            Z_L2.002
                        *
```

```
                              * IF WE HAVE REACHED THE END OF THE
                              * QUEUE, THEN ROLLOVER TO THE TOP
                              *
                                        IF     A1 <EQ> QEND(A0) THEN
9 00000022 43E80008                      LEA     QDATA(A0),A1       QUEUE STARTS 8 BYTES AFTER HEADER
                                        ENDI
9 00000026                    Z_L1.003
                              *
                                        IF     A1 <EQ> QTAIL(A0) THEN IS QUEUE FULL NOW?
9 0000002C 08E800000007                  BSET    #QFULL,QSTAT(A0)    YES - SET QUEUE FULL FLAG
                                        ENDI
9 00000032                    Z_L1.006
                              *
9 00000032 3089                         MOVE   A1,QHEAD(A0)        RESTORE HEAD POINETER
                              *
9 00000034 023C00FC                     AND    #$FC,CCR            CLEAR CARRY & OVERFLOW
9 00000038 003C0004                     OR     #4,CCR              & SET ZERO FLAG
                              *
9 0000003C                    ENDXIT    PULL   A1                  RESTORE A1
9 00000040 4E75                         RTS                        AND RETURN
                              *
9 00000042 003C0001           ENOFUL    OR     #1,CCR              SET CARRY
9 00000046 60F4                         BRA    ENDXIT              AND RETURN BAD
                              *
                              *
                                        END
```

****** TOTAL ERRORS      0--
****** TOTAL WARNINGS    0--

SYMBOL TABLE LISTING

| SYMBOL NAME | SECT | VALUE | SYMBOL NAME | SECT | VALUE |
|---|---|---|---|---|---|
| .1SEC | | 0000000A | F$OST | | 00001000 |
| .AIQSIZ | | 00000038 | F$PDI | | 00000800 |
| .AOQSIZ | | 00000038 | F$PROC | | 00002000 |
| .COSINE | | 00000014 | F$XMIT | | 00000200 |
| .DIQSIZ | | 0000001C | FF | | 0000000C |
| .EFFECT | | 0000001C | HT | | 00000009 |
| .HIQSIZ | | 00000010 | IPTENT$ | | 00000014 |
| .HOQSIZ | | 00000180 | MAXACE | | 00000004 |
| .ICOS | | 0000000A | ONESEC | | 00030D90 |
| .IEFF | | 00000018 | ONETIK | | 000009C4 |
| .ISCALE | | 00000006 | OPTENT$ | | 00000004 |
| .ISIN | | 0000000E | PAAR | | 00000014 |
| .KWH | | 00000024 | PACR | | 0000000C |
| .PIQSIZ | | 0000003F | PADDR | | 00000004 |
| .RBFSIZ | | 00000400 | PADR | | 00000010 |
| .SAMPLE | | 00000002 | PBAR | | 00000016 |
| .SCALE1 | | 00000004 | PBCR | | 0000000E |
| .SCALE2 | | 00000008 | PBDDR | | 00000006 |
| .SCALE3 | | 0000000C | PBDR | | 00000012 |
| .SCALE4 | | 00000010 | PCDDR | | 00000008 |
| .SINE | | 00000018 | PCDR | | 00000018 |
| .STEMP | | 0000001C | PGCR | | 00000000 |
| .TEMP | | 00000012 | PIVR | | 0000000A |
| .TOFSET | | 0000000E | PSOM | | 00000009 |
| .TSCALE | | 0000000A | PSR | | 0000001A |
| .VCOS | | 00000002 | PSRR | | 00000002 |
| .VEFF | | 00000014 | PULL | MACR | * |
| .VSCALE | | 00000002 | PUSH | MACR | * |
| .VSIN | | 00000006 | QDATA | | 00000008 |
| .WATTS | | 00000020 | QEND | | 00000004 |
| .WATTSEC | | 00000022 | QFULL | | 00000000 |
| AIBENT$ | | 00000026 | QHEAD | | 00000000 |
| CNTR | | 0000002E | QSIZE | | 00000001 |
| CPF | | 00000024 | QSTAT | | 00000007 |
| CR | | 0000000D | QTAIL | | 00000002 |
| DIBENT$ | | 00000026 | RAM | | 00000005 |

```
DSFTENT$                 00000010      S60                 0000390F
EEFROM                   00000007      SPACE               00000020
ENQFUL             9     00000042      STX                 00000002
ENQUE      XDEF    9     00000000      TCR                 00000020
ENQXIT             9     0000003C      TIVR                00000022
EOT                      00000004      TSR                 00000034
ETX                      00000003      Z_L1.000      9     0000001A
F$ASMPL                  00004000      Z_L1.003      9     00000026
F$DHUT                   00000400      Z_L1.006      9     00000032
F$KYBD                   00000100      Z_L2.002      9     0000001C
F$MON                    00000080
                            EXEC      IDNT      0,5                    TASK MANAGER PACKAGE 3/15/83
                                      OPT       FCS,BRS
                            *
                            *
                            * TASKMASTER FOR THE 68000
                            *
           00000009                   SECTION  9
                            *
                                      XDEF      EXECSW
                                      XDEF      XECINI
                                      XDEF      TIMINT
                            *
                            * HARDWARE REFERENCES:
                            *
                                      XREF      DRCVR
                                      XREF      WTCHDOG
                            *
                            * RAM REFERENCES:
                            *
                                      XREF.S    5:EX.RAM
                            *
                            * EPROM (PROGRAM) REFERENCES:
                            *
                                      XREF.S    9:WDFEED

                            *
                            * CONDITIONAL ASSEMBLY OPTIONS:
                            *
           00000000         INROPT    EQU       0                      NO INTERRUPT SERVICE HANDLER
           00000000         DEVOPT    EQU       0                      NO DEVICE HANDLING ROUTINES
                            *
                                      IFEQ      DEVOPT
                            *
                            * NO DEVICE HANDLING ROUTINES HAVE BEEN SELECTED. IF
                            * ANY OF THEM SHOULD BE CALLED, PERFORM A DYNAMIC HALT.
                            * (SUCH A BLOW UP MAKES IT EASIER TO LOCATE CALLING ERRORS
                            * DURING DEBUGGING.)
                            *
 9         00000000         .DEVINI   EQU       *
 9         00000000         .RESERV   EQU       *
 9         00000000         .RELEAS   EQU       *
 9         00000000         .WAKEUP   EQU       *
 9         00000000         .WAIT     EQU       *
 9         00000000         .WAITLP   EQU       *
 9         00000000         .WAITCN   EQU       *
 9 00000000 2C5F                      MOVE.L    (A7)+,A6               RESTORE A6 SO WE CAN SEE IT.
 9 00000002 60FE                      BRA.S     *                      DYNAMIC HALT!
                            *
                                      ENDC
                            *
                            * QUESTION TO ANSWER: HOW WILL WE LOCATE TASK MGR. RAM?
                            *
                            *         THE ANSWER TO THIS QUESTION AFFECTS HOW WE WRITE ROUTINES
                            *         THAT ACCESS LOCAL RAM. IE. SHOULD THE RAM BLOCK BE RELATIVE
                            *         TO THE REST OF THE TASK MGR. OR NOT? FOR NOW, WE'LL FOLLOW
                            *         THE 6809'S LEAD, AND PROVIDE A LOCATION WHOSE VALUE IS THE
                            *         START ADDRESS OF LOCAL RAM. (IE. TO BE BURNED INTO PROM BY
                            *         - THE EXEC INITIALLY SETS UP AND SAVES A6, TO BE REFERENCED
                            *           AS THE START OF EX$RAM -
                            *
```

```
9 00000004 00000000   EX$RAM  DC.L    EX.RAM              ;Burn start adr of local ram here.

                      *
                      * EXECSW - TRAP #15 HANDLER. CALLS THE APPROPRIATE ROUTINE AS DETERMINED
                      *          BY THE 2 BYTE ARGUMENT FOLLOWING THE TRAP INSTRUCTION. ALL
                      *          REGISTERS ARE INTACT (EXCEPT FOR CCR) GOING INTO THE SELECTED
                      *          ROUTINE. IT IS THE CALLED ROUTINE'S RESPONSIBILITY TO SAVE ANY
                      *          REGISTERS EXCEPT FOR A6, WHICH IS SAVED BY EXECSW. THE CALLED
                      *          ROUTINE MUST RESTORE A6 BEFORE RETURNING.
                      *
9 00000008 48E700E2   EXECSW  MOVEM.L A0-A2/A6,-(A7)      save task ptr,user stack & exec ram ptr.
9 0000000C 206F0012           MOVE.L  18(SP),A0           get return address
9 00000010 3250               MOVE    (A0),A1             get trap argument (offset to table entry)
9 00000012 54AF0012           ADDQ.L  #2,18(SP)           bump rtn adr past argument
9 00000016 41FA0012           LEA     SWTBL(PC),A0        get ptr. to jump table
9 0000001A 2C7AFFEB           MOVE.L  EX$RAM,A6           index ptr. A6 = start of exec ram
9 0000001E 2F7090000008       MOVE.L  (A0,A1),8(SP)       put subroutine adr on stack
9 00000024 4CDF0300           MOVEM.L (A7)+,A0/A1         restore stack & rte from there
9 00000028 4E75               RTS                         xfer control to desired routine
                      *
                      * SWTBL - SUBROUTINE VECTORS
                      *
9 0000002A 00000006   SWTBL   DC.L    .EXEC
9 0000002E 0000014E           DC.L    .READY
9 00000032 00000120           DC.L    .RDYALL
9 00000036 000000C2           DC.L    .SUSPEN
9 0000003A 00000078           DC.L    .TSKINI
9 0000003E 00000000           DC.L    .DEVINI
9 00000042 00000000           DC.L    .WAKEUP
9 00000046 00000000           DC.L    .WAIT
9 0000004A 00000000           DC.L    .WAITCN
9 0000004E 00000000           DC.L    .WAITLP
9 00000052 00000000           DC.L    .RESERV
9 00000056 00000000           DC.L    .RELEAS
9 0000005A 00000192           DC.L    .NEXTSK
9 0000005E 00000160           DC.L    .CHGENT
9 00000062 0000016A           DC.L    .TSPEND
9 00000066 0000017B           DC.L    .RESTRT
                      *
                      *
                      * XECINI - INITIALIZE TASK MANAGER RAM. CALL THIS ROUTINE (BY JSR!)
                      *          BEFORE ANY OTHER TASK MANAGER CALLS.
                      *
9 0000006A 207AFF98   XECINI  MOVE.L  EX$RAM,A0           GET START OF RAM
9 0000006E 7029               MOVEQ   #EX$SIZ-1,D0        # OF BYTES TO CLEAR - 1
                      *
9 00000070 4218       XECO    CLR.B   (A0)+
9 00000072 51C8FFFC           DBRA    D0,XECO
9 00000076 4E75               RTS
                      *
                      *
                              IFNE    DEVOPT              DEVICE HANDLING OPTIONS
                              ENDC
                      *
                      *
                      *.TSKINI - Initialize & install a task frame. The last task installed is
                      *          the first (next) to run. Caller must NOT use same supervisor
                      *          visor stack as task being initialized!!!
                      *
                      *         A0 - Pointer to task frame to initialize.
                      *         A1 - Task ID. (4 bytes)
                      *         A2 - Task entry point.
                      *         A3 - Supervisor stack pointer for this task.
                      *         A4 - User stack pointer for this task.
                      *         A5 - Data stack pointer for this task.
                      *
                      * NOTE:  Task priorities are not implemented in this version!
                      *
                      * D0 destroyed. A3 represents present system stack pointer.
                      * (with status, pc, user sp, and data sp on it.)
                      *
9 00000078 7021       .TSKINI MOVEQ   #TK$SIZ-1,D0        # OF BYTES TO CLEAR -1
```

```
                          *
9 0000007A 42300000    TSKCLR   CLR.B    (A0,D0)              CLEAR OUT TASK FRAME
9 0000007E 51C8FFFA             DBRA     D0,TSKCLP
                          *
                          * Put all necessary state information on the supervisor stack for this
                          * task. To keep task frame size down, we are only keeping the supervisor
                          * stack pointer in the task frame. The status register, pc, data sp, and
                          * user sp are kept in the supervisor stack.
                          *
9 00000082 48D00600             MOVEM.L  A1-A2,TK$ID(A0)      Set task ID & entry point
9 00000086 270A                 MOVE.L   A2,-(A3)             Set pc to entry point
9 00000088 373C0000             MOVE     #0,-(A3)             Set task status to user, all irps on
9 0000008C 48E3000C             MOVEM.L  A4-A5,-(A3)          Put user sp & data sp on super stack
9 00000090 21480008             MOVE.L   A3,TK$SSP(A0)        & save ssp in task frame
                          *
                          * Supervisor stack now:
                          *
                          * (high memory)    Program Counter     4 bytes
                          *                  Status Register     2 bytes
                          *                  Data Stack Ptr      4 bytes
                          * SSP ->           User Stack Ptr      4 bytes
                          *
                          * Now, set bit 15 in the state mask (with the time count set to zero)
                          * so that this task will be suspended until user calls READY with an
                          * activation pattern of $8000.
                          *
9 00000094 08E80007000E         BSET     #7,TK$STM(A0)        Start up by bit 15 only (time flag)
                          *
                          * Install this task frame in the ring.
                          *
9 0000009A 200D                 MOVE.L   A5,D0                Save A5 - Data stack pointer
9 0000009C 2A6E0006             MOVE.L   EX$NXT(A6),A5        Get ptr to last frame installed
9 000000A0 BBFC00000000         CMP.L    #0,A5                Do we have a prior task frame?
9 000000A6 6606                 BNE      TSK2                 Yes - continue
                          *
                          * This is the first frame to be installed. Set its next pointer to itself
                          * and A5 pointing to it to get the ring started.
                          *
9 000000A8 2148001A             MOVE.L   A0,TK$NXT(A0)        We're the next (only) task on the ring
                          *
                          * TO INSTALL NEW TASK FRAME:
                          *
                          *        Set next of new frame (one pointed to by A0) equal to
                          *        next of old frame (one pointed to by EX$NXT).
                          *
                          *        Set next of old frame equal to new frame.
                          *
                          *        Set EX$NXT equal to new frame.
                          *
9 000000AE 216D001A001A TSK2    MOVE.L   TK$NXT(A5),TK$NXT(A0) Move old next to new next
9 000000B4 2B48001A             MOVE.L   A0,TK$NXT(A5)        Set old next to new
9 000000B8 2D480006             MOVE.L   A0,EX$NXT(A6)        & make new next to run
9 000000BC 2A40                 MOVE.L   D0,A5                Restore A5
9 000000BE 600000CE             BRA.L    .EXIT                & return
                          *
                                IFNE     DEVOPT
                                ENDC
                          *
                          * AND FALL INTO '.SUSPEN'
                          *
                          *
                          * GENERAL INTERRUPT SERVICE WAIT
                          *
                          * ENTER WITH D0 = EVENT FLAGS
                          *            D1 = TIME LIMIT
                          *
                          * All registers are destroyed, (except A5)
                          *
9          000000C2    .SUSPEN  EQU      *
9 000000C2 206E0002             MOVE.L   EX$TSK(A6),A0        ;point to the task, to suspend
9 000000C6 00408000             OR       #$8000,D0            ;set msbit of timer event flags
```

```
9 000000CA 3140000E          MOVE    D0,TK$STM(A0)          ;set new state mask
9 000000CE 4268000C          CLR     TK$STF(A0)             ;clear flags = inactive state
9 000000D2 31410010          MOVE    D1,TK$TIM(A0)          ;set task time out value
                   ** AND FALL INTO '.EXEC'
                   *
                   * .EXEC - Search for an active task
                   *        - Interrupt status is preserved
                   *
                   * All registers are destroyed except A6.
                   *
9          000000D6 .EXEC    EQU     *
                   *        * save old task status *
9 000000D6 206E0002          MOVE.L  EX$TSK(A6),A0          ;Current task
9 000000DA 4E6B              MOVE.L  USP,A3                 ;Move to an address reg.
9 000000DC 2F0B              MOVE.L  A3,-(A7)               ;Save user sp on system sp
9 000000DE 214F0008          MOVE.L  A7,TK$SSP(A0) .        ;Save system sp in task frame
                   *        * point to next task from exec ram *
9 000000E2 41EEFFEC          LEA     EX$NXT-TK$NXT(A6),A0   ;Force the next frame pointer
                   *
                   *        * active task loop *
                   *
9 000000E6 2068001A TSTKLP   MOVE.L  TK$NXT(A0),A0          ;Ring pointer set
                   *        * while looking for an active task, we will feed the WATCH DOG
9 000000EA 4EBAFF14          JSR     WDFEED(PC)
9 000000EE 4A68000C          TST     TK$STF(A0)             ;Any active flags set for this task
9 000000F2 67F2              BEQ     TSTKLP                 ;No, try next on ring
                   *                                        ;Yes, get him ready to run
9 000000F4 2D480002          MOVE.L  A0,EX$TSK(A6)          ;Make him the current task
9 000000F8 2D68001A0006      MOVE.L  TK$NXT(A0),EX$NXT(A6)  ;Get next task ptr from current
9 000000FE 2E680008          MOVE.L  TK$SSP(A0),A7          ;Get ssp for new task
9 00000102 2C5F              MOVE.L  (A7)+,A6               ;Get user stack ptr. off stack
9 00000104 4E66              MOVE.L  A6,USP                 ;Got to put it in an A reg.

                   *
9 00000106 60000086          BRA.L   .EXIT                  ;Go run the task

                   *
                   * TASK ACTIVATOR ROUTINES
                   * CALLED FROM INTERRUPT OR FOREGROUND
                   *
                   *  .RDYALL: D0 = event flags
                   *          If TK$TIM hits 0 , activate task
                   *
                   *  .READY:  Reactivate task after suspend
                   *           D0 = event flags
                   *           A0 = task frame
                   *
                   *  TIMINT: Task time interrupt service. Invoked
                   *          by real time clock interrupt.
                   *
                   * All registers preserved.
                   *
                   * NOTE:  TIMINT is not part of the exec as supplied, but is required for any
                   *        application which uses a real time clock.  Because of the wide var-
                   *        iety of RTC circuitry, TIMINT will probably be unique to each ap-
                   *        plication.  It has been included here (in this application) because
                   *        it is both logically and physically appropriate.
                   *
9 0000010A 08F900000000 TIMINT BSET  #0,TSP+DRCUR           ;Clear timer interrupt
           0034
9 00000112 2F00              MOVE.L  D0,-(A7)               ;Save D0
9 00000114 303C8000          MOVE    #$8000,D0
9 00000118                   XSVC    RDYALL                 ;Tick everyone's time
9 0000011C 201F              MOVE.L  (A7)+,D0               ;Restore D0
9 0000011E 4E73              RTE                            ;& return
                   *
9          00000120 .RDYALL  EQU     *                      ;Activate task ring test
9 00000120 2F08              MOVE.L  A0,-(A7)               ;Save A0
9 00000122 206E0006          MOVE.L  EX$NXT(A6),A0          ;Point to first task in ring
9 00000126 4A40              TST     D0                     ;Process time?
9 00000128 6A02              BPL     FINTSK                 ;no - check flags
```

```
9 0000012A 5256                     ADDQ.W   #1,EX$TIM(A6)        ;yes-inc system time
                            *
                            *         * DO ALL TASKS *
                            *
9 0000012C 4A40             FINTSK  TST      D0                   ;msb of time evntflag = 1?
9 0000012E 6A0C                     BPL      CALRDY               ;no trap to Ready
9 00000130 4A680010                 TST      TK$TIM(A0)           ;task time = 0?
9 00000134 670A                     BEQ      NXTTSK               ;yes, leave timer alone
9 00000136 53680010                 SUBQ     #1,TK$TIM(A0)        ;no, decrement task time
                            *                                    ;time = 0 now?
9 0000013A 6604                     BNE      NXTTSK               ;no, don't wake him up yet
                            *
9 0000013C                  CALRDY  XSVC     READY                ;yes, get him Ready to go
                            *
9 00000140 2068001A         NXTTSK  MOVE.L   TK$NXT(A0),A0        ;point to next task
9 00000144 B1EE0006                 CMP.L    EX$NXT(A6),A0        ;done all tasks yet?
9 00000148 66E2                     BNE      FINTSK               ;no - keep going
9 0000014A 205F                     MOVE.L   (A7)+,A0             ;restore A0
9 0000014C 6040                     BRA      .EXIT                ;we checked all the tasks - bye!
                            *
                            *
                            * .READY - Activate selected task by given event flags.
                            *
                            * A0 - pointer to task frame
                            * D0 - event flags
                            *
                            * All registers preserved.
                            *
9 0000014E 48E78080         .READY  MOVEM.L  A0/D0,-(A7)          ;preserve registers
9 00000152 C068000E                 AND      TK$STM(A0),D0        ;input flags = flags to wait on
9 00000156 8168000C                 OR       D0,TK$STF(A0)        ;result bits match = active flags
9 0000015A 4CDF0101                 MOVEM.L  (A7)+,A0/D0          ;restore registers
9 0000015E 602E                     BRA      .EXIT                ;and return
                            *
                            *
                            *****************************
                            * SUPPORT COMMANDS FOR THE EXEC
                            *****************************
                            *
                            * .CHGENT - Change reentry point of this task
                            *
                            *      A0  = the new PC
                            *
                            * All registers preserved.
                            *
9            00000160       .CHGENT EQU      *
9 00000160 2C6E0002                 MOVE.L   EX$TSK(A6),A6        ;get current task
9 00000164 2D480004                 MOVE.L   A0,TK$ENT(A6)        ;new entry in frame
9 00000168 6024                     BRA      .EXIT                ;restore A6 & return
                            *
                            *.TSKEND - Suspend and resume task at new entry point
                            *
                            *      D0 = Event Flags
                            *      D1 = Timer
                            *
                            * All registers destroyed.
                            *
9            0000016A       .TSKEND EQU      *
9 0000016A 206E0002                 MOVE.L   EX$TSK(A6),A0
9 0000016E 2F6800040006             MOVE.L   TK$ENT(A0),6(A7)     ;save new entry in SSP
9 00000174 6000FF4C                 BRA.L    .SUSPEN
                            *
                            * .RESTRT - Restart this task
                            *          (This is a HELP facility, begining from scratch)
                            *         ***WARNING*** if not careful, the return to
                            *                        SSP & PC may get overwritten!
                            *
                            * User required input:
                            *      A0 - Pointer to reinitialize task frame
                            *      A2 - PC, task entry point
                            *      A3 - SSP, supervisior stack pointer
                            *      A4 - USP, user stack pointer
```

```
                                *       A5 - DSP, data stack pointer
                                *
                                * A3 reflects SSF w/ restart data on stack, all other registers preserved.
                                *
9            00000178           .RESTRT  EQU     *
9 00000178 270A                          MOVE.L  A2,-(A3)            ;set pc to entry point
9 0000017A 4263                          CLR     -(A3)               ;set task status to user,irps on
9 0000017C 48E3000C                      MOVEM.L A4-A5,-(A3)         ;put user & data ss on super stack
9 00000180 21480008                      MOVE.L  A3,TK$SSP(A0)       ;and save ssp in task frame
9 00000184 08E80007000E                  BSET    #7,TK$STN(A0)       ;start up by msbit only (time flag)
9 0000018A 6002                          BRA     .EXIT
                                *
                                *
                                         IFNE    DEVOPT              DEVICE HANDLER OPTION
                                         ENDC
                                *
9 0000018C 4E71                          NOP                         Keeps the assembler happy on conditional assembly
                                *
9 0000018E 2C5F                 .EXIT    MOVE.L  (A7)+,A6            ;restore A6
9 00000190 4E73                          RTE
                                *
                                * .NEXTSK - Let a specific task run, not the next one in the link chain.
                                *           (Right now we just call the EXEC, later it might suspend too)
                                *
                                * Enter with: A0 = Task frame address
                                *
                                * All registers destroyed. (except A6)
                                *
9 00000192 2D480006             .NEXTSK  MOVE.L  A0,EX$NXT(A6)       ;set this task to run next
9 00000196 6000FF3E                      BRA.L   .EXEC
                                *
                                ************************************************************************
                                * End of support routines                                              *
                                ************************************************************************
                                *
                                *
                                         IFNE    IRFOPT
                                         ENDC
                                *
                                *
                                         END

****** TOTAL ERRORS       0--
****** TOTAL WARNINGS     0--
```

SYMBOL TABLE LISTING

| SYMBOL NAME | SECT | VALUE | SYMBOL NAME | | SECT | VALUE |
|---|---|---|---|---|---|---|
| .1SEC | | 0000000A | EX$SIZ | | | 0000002A |
| .AIOSIZ | | 00000038 | EX$TIM | | | 00000000 |
| .AOOSIZ | | 00000038 | EX$TSK | | | 00000002 |
| .CHGENT | 9 | 00000160 | EX.RAM | XREF | 5 | 00000000 |
| .COSINE | | 00000014 | EXEC | | | 00000006 |
| .DEVINI | 9 | 00000000 | EXECSW | XDEF | 9 | 00000008 |
| .DIOSIZ | | 0000001C | F$ASMPL | | | 00004000 |
| .EFFECT | | 0000001C | F$DNUT | | | 00000400 |
| .EXEC | 9 | 000000D6 | F$EEPM | | | 00000040 |
| .EXIT | 9 | 0000018E | F$KYED | | | 00000100 |
| .HIOSIZ | | 000000C8 | F$MON | | | 00000080 |
| .HOOSIZ | | 00000180 | F$OST | | | 00001000 |
| .ICOS | | 0000000A | F$PDI | | | 00000800 |
| .IEFF | | 00000018 | F$PROC | | | 00002000 |
| .ISCALE | | 00000006 | F$XMIT | | | 00000200 |
| .ISIN | | 0000000E | FF | | | 0000000C |
| .KWH | | 00000024 | FINTSK | | 9 | 0000012C |
| .NEXTSK | 9 | 00000192 | HT | | | 00000009 |
| .PIOSIZ | | 0000003F | IPTENT$ | | | 00000014 |
| .RBFSIZ | | 00000400 | IRFOPT | | | 00000000 |
| .RDYALL | 9 | 00000120 | MAXAGE | | | 00000004 |

```
.READY           9  0000014E  NEXTSK              00000030
.RELEAS          9  00000000  NXTTSK           9  00000140
.RESERV          9  00000000  ONESEC              00030090
.RESTRT          9  00000178  ONETIK              000009C4
.SAMPLE             00000002  OPTENT$             00000004
.SCALE1             00000004  PAAR                00000014
.SCALE2             00000008  PACR                0000000C
.SCALE3             0000000C  PADDR               00000004
.SCALE4             00000010  PADR                00000010
.SINE               00000018  PBAR                00000016
.SPNJP    MACR   *            PBCR                0000000E
.STEMP              0000001C  PBDDR               00000006
.SUSPEN          9  000000C2  PBDR                00000012
.TEMP               00000012  PCDDR               00000008
.TOFSET             0000000E  PCDR                00000018
.TSCALE             0000000A  PGCR                00000000
.TSKEND          9  0000016A  PIVR                0000000A
.TSKINI          9  00000078  PROM                00000009
.VCOS               00000002  PSR                 0000001A
.VEFF               00000014  PSRR                00000002
.VSCALE             00000002  PULL      MACR   *
.VSIN               00000006  PUSH      MACR   *
.WAIT            9  00000000  RAM                 00000005
.WAITCN          9  00000000  RDTALL              00000008
.WAITLP          9  00000000  READY               00000004
.WAKEUP          9  00000000  RELEAS              0000002C
.WATTS              00000020  RESERV              00000028
.WATTSEC            00000022  RESTRT              0000003C
AIBENT$             00000026  SEQ                 000039DF
CALRDY           9  0000013C  SAV$                00000024
CHGENT              00000034  SPACE               00000020
CNTR                0000002E  STX                 00000002
CPR                 00000024  SUSPEN              0000000C
CR                  0000000D  SWTBL            9  0000002A
CTRL13              00000000  TCR                 00000020
CTRL2               00000002  TIMINT    XDEF   9  0000010A
DEVINI              00000014  TIMR1               00000004
DEVOPT              00000000  TIMR2               00000008
DI$DEV              0000000A  TIMR3               0000000C
DI$EVF              00000000  TIVR                00000022
DI$IOM              0000001B  TK$CON              00000012
DI$ISV              00000006  TK$ENT              00000004
DI$LNK              00000016  TK$ID               00000000
DI$OWN              00000002  TK$LPT              00000016
DI$PTR              00000012  TK$NXT              0000001A
DI$QUE              0000000E  TK$RSO              0000001E
DI$RSO              0000001A  TK$SIZ              00000022
DI$SIZ              00000020  TK$SSP              00000008
DI$STA              0000001C  TK$STF              0000000C
DI$USR              0000001E  TK$STM              0000000E
DIBENT$             00000026  TK$TIM              00000010
DRCVR     XREF   *  00000000  TSK2             9  000000AE
DSFTENT$            00000010  TSKCLR           9  0000007A
EEPROM              00000007  TSKEND              00000035
EOT                 00000004  TSKINI              00000010
EOS       MACR   *            TSR                 00000034
ETX                 00000003  TSTKLP           9  000000E6
EX$DV0              0000000A  WAIT                0000001C
EX$DV1              0000000E  WAITCN              00000020
EX$DV2              00000012  WAITLP              00000024
EX$DV3              00000016  WAKEUP              00000018
EX$DV4              0000001A  WDFEED    XREF   9  00000000
EX$DV5              0000001E  WTCHDOG   XREF   *  00000000
EX$DV6              00000022  XECO             9  00000070
EX$DV7              00000026  XECINI    XDEF   9  0000006A
EX$NXT              00000006  XSVC      MACR   *
EX$RAM           9  00000004
          FORMAT  IDNT  0,6              FORMAT DATA FOR TRANSMISSION   3/11/83
                  OPT   FCS,BRS
          *
          * SUBROUTINE:   FORMAT
          *
```

```
                                 * REVISED:      3/11/83
                                 *
                                 * AUTHOR:       D. A. ZEICHNER
                                 *
                                 * PURPOSE:      CONVERT INCOMING FLOATING POINT VALUE INTO A 12 BIT OFFSET
                                 *               BINARY INTEGER REPRESENTED BY AN ASCII HEADER BYTE AND
                                 *               TWO ASCII DATA BYTES.
                                 *
                                 * INPUTS:       A0 - POINTER TO OUTPUT PERSONALITY TABLE (OPT) ENTRY- 4 BYTES
                                 *               D0 - VALUE TO BE FORMATTED.
                                 *
                                 * OUTPUTS:      D0 - 1ST BYTE OF MESSAGE
                                 *               D1 - 2ND BYTE OF MESSAGE
                                 *               D2 - 3RD BYTE OF MESSAGE
                                 *               ALL OTHER REGISTERS PRESERVED.
                                 *
                                 * EXTERNAL REFERENCES/DEFINITIONS:
                                 *
                                         XDEF    FORMAT
                                 *
                                 * EEPROM REFERENCES:
                                 *
                                         XREF    OPT$
                                 *
                                 * EPROM (PROGRAM) REFERENCES:
                                 *
                                         XREF.S  9:ROUND
                                 *
                                 *
              00000009                   SECTION PROM
                                 *
  9 00000000                     FORMAT  PUSH    D5-D7
                                 *
  9 00000004 2E00                        MOVE.L  D0,D7
  9 00000006 4EBAFFF8                    JSR     ROUND(PC)         ROUND & CONVERT TO INTEGER
  9 0000000A 06470800                    ADD     #$800,D7          CONVERT TO 12 BIT OFFSET BINARY
  9 0000000E 0C470FFF                    CMP     #$FFF,D7          OVER FULL SCALE ? .
  9 00000012 6306                        BLS     OK
  9 00000014 2E3C00000FFF                MOVE.L  #$FFF,D7          YES ACT LIKE FULL SCALE
                                 *
  9 0000001A 3207                OK      MOVE    D7,D1             & SAVE IN D1 & D2
  9 0000001C 3407                        MOVE    D7,D2
                                 *
                                 * CALCULATE OUTPUT NUMBER
                                 *
  9 0000001E 2008                        MOVE.L  A0,D0
  9 00000020 048000000000                SUB.L   #OPT$,D0
  9 00000026 80FC0004                    DIVU    #OPTENT$,D0
                                 *
  9 0000002A 1E10                        MOVE.B  (A0),D7           GET OUTPUT TYPE
  9 0000002C EA0F                        LSR.B   #5,D7
                                         IF      D7 <EQ> #7 THEN
  9 00000034 08C00007                      BSET    #7,D0           SET HEADER FOR KWH
                                         ENDI
  9 00000038                     Z_L1.000
                                 *
                                 * NOW FORMAT THE TWO DATA BYTES.
                                 *
  9 00000038 EC49                        LSR     #6,D1             ISOLATE M.S. 6 BITS
  9 0000003A 004100C0                    OR      #$C0,D1           SET 2 M.S. BITS IN 1ST DATA BYTE
  9 0000003E 004200C0                    OR      #$C0,D2           SET 2 M.S. BITS IN 2ND DATA BYTE
                                 *
  9 00000042                             PULL    D5-D7             RESTORE REGISTERS
  9 00000046 4E75                        RTS                       & RETURN
                                 *
                                 *
                                         END

****** TOTAL ERRORS      0--
****** TOTAL WARNINGS    0--
```

SYMBOL TABLE LISTING

| SYMBOL NAME | SECT | VALUE | SYMBOL NAME | SECT | | VALUE |
|---|---|---|---|---|---|---|
| .1SEC | | 0000000A | F$KYBD | | | 00000100 |
| .AIOSIZ | | 00000038 | F$MON | | | 00000080 |
| .AOOSIZ | | 00000038 | F$OST | | | 00001000 |
| .COSINE | | 00000014 | F$PDI | | | 00000800 |
| .DIOSIZ | | 0000001C | F$PROC | | | 00002000 |
| .EFFECT | | 0000001C | F$XMIT | | | 00000200 |
| .HIOSIZ | | 000000C8 | FF | | | 0000000C |
| .HOOSIZ | | 00000180 | FORMAT | XDEF | 9 | 00000000 |
| .ICOS | | 0000000A | HT | | | 00000009 |
| .IEFF | | 00000018 | IPTENT$ | | | 00000014 |
| .ISCALE | | 00000006 | MAXAGE | | | 00000004 |
| .ISIN | | 0000000E | OK | | 9 | 0000001A |
| .KWH | | 00000024 | ONESEC | | | 0003D090 |
| .PIOSIZ | | 0000003F | ONETIK | | | 000009C4 |
| .RBFSIZ | | 00000400 | OPT$ | XREF | * | 00000000 |
| .SAMPLE | | 00000002 | OPTENT$ | | | 00000004 |
| .SCALE1 | | 00000004 | PAAR | | | 00000014 |
| .SCALE2 | | 00000008 | PACR | | | 0000000C |
| .SCALE3 | | 0000000C | PADDR | | | 00000004 |
| .SCALE4 | | 00000010 | PADR | | | 00000010 |
| .SINE | | 00000018 | PBAR | | | 00000016 |
| .STEMP | | 0000001C | PBCR | | | 0000000E |
| .TEMP | | 00000012 | PBDDR | | | 00000006 |
| .TOFSET | | 0000000E | PBDR | | | 00000012 |
| .TSCALE | | 0000000A | PCDDR | | | 00000008 |
| .VCOS | | 00000002 | PCDR | | | 00000018 |
| .VEFF | | 00000014 | PGCR | | | 00000000 |
| .VSCALE | | 00000002 | PIVR | | | 0000000A |
| .VSIN | | 00000006 | PROM | | | 00000009 |
| .WATTS | | 00000020 | PSR | | | 0000001A |
| .WATTSEC | | 00000022 | PSRR | | | 00000002 |
| AIBENT$ | | 00000026 | PULL | MACR | * | |
| CNTR | | 0000002E | PUSH | MACR | * | |
| CPR | | 00000024 | RAM | | | 00000005 |
| CR | | 0000000D | ROUND | XREF | 9 | 00000000 |
| CTRL13 | | 00000000 | S60 | | | 0000390F |
| CTRL2 | | 00000002 | SPACE | | | 00000020 |
| DIBENT$ | | 00000026 | STX | | | 00000002 |
| DSFTENT$ | | 00000010 | TCR | | | 00000020 |
| EEPROM | | 00000007 | TIMR1 | | | 00000004 |
| EOT | | 00000004 | TIMR2 | | | 00000008 |
| ETX | | 00000003 | TIMR3 | | | 0000000C |
| F$ASMPL | | 00004000 | TIVR | | | 00000022 |
| F$DMUT | | 00000400 | TSR | | | 00000034 |
| F$EEPM | | 00000040 | Z_L1.000 | | C | 00000038 |

```
HDWINI  IDNT    0,12                    Hardware Initializer  3/21/83
        OPT     PCS,BRS
*
*
* SUBROUTINE:   HDWINI
*
* REVISED:      3/21/83
*
* AUTHOR:       D. A. ZEICHNER
*
* PURPOSE:      INITIALIZE ALL HARDWARE IN THE RTI.
*
* INPUTS:       NONE.
*
* OUTPUTS:      NONE. NO REGISTERS PRESERVED.
*
* EXTERNAL REFERENCES/DEFINITIONS:
*
        XDEF    HDWINI
*
```

```
                         * HARDWARE REFERENCES:
                         *
                                XREF    ADCTRL
                                XREF    AUXACIA
                                XREF    CTRLP
                                XREF    DATAP
                                XREF    DRCVR
                                XREF    HOSTACIA
                                XREF    WTCHDOG
                         *
                         * RAM REFERENCES:
                         *
                                XREF.S  5:AUXTRAK
                                XREF.S  5:HOSTRAK
                                XREF.S  5:RAMTBL
                         *
                         * EPROM (PROGRAM) REFERENCES:
                         *
                                XREF.S  9:MDINIT
                         *
                         *
              00000009          SECTION PROM
                         *
                         *
9             00000000   HDWINI  EQU     *
                         *
                         * Initialize PI/T on data acquisition board to provide A/D
                         * data & control lines; and analog input selection.  The
                         * PI/T is set up to behave as a garden variety PIA.
                         *
                         * (Unidirectional 8 bit mode, bit I/O - no hand shaking, no irqs)
                         *
                         * OCCUPIES IRP VECTORS $40-$43 (UNUSED) AND $44 (TIMER - ALSO UNUSED)
                         *
9 00000000 41F900000000         LEA     ADCTRL,A0           POINT TO PI/T
9 00000006 10BC0000             MOVE.B  #0,PGCR(A0)         ALL HANDSHAKE LINES DISABLED
9 0000000A 117C00000002         MOVE.B  #0,PSRR(A0)         NO DMA, IRP FROM ANY PORT
9 00000010 117C00700004         MOVE.B  #$70,PADDR(A0)      PORT A
9 00000016 117C00000006         MOVE.B  #$0,PBDDR(A0)       PORT B ALL INPUT LINES
9 0000001C 117C00800018         MOVE.B  #$80,PCDR(A0)       MAKE SURE A/D IS OFF FIRST!
9 00000022 117C00EF0008         MOVE.B  #$EF,PCDDR(A0)      PORT C ALL OUTPUT LINES
9 00000028 117C00C0000C         MOVE.B  #$C0,PACR(A0)       BIT I/O ON PORTS A & B. (NO DBL BUF,
9 0000002E 117C00C0000E         MOVE.B  #$C0,PBCR(A0)       NO HANDSHAKE, NO IRPS... STD PIA)
                         *
                         * DISABLE ZERO CROSSING DETECTOR, HOLD COUNTERS
                         * (SAMPLE & PERIOD), AND UNFREEZE ANALOG LINES.
                         *
9 00000034 42280010             CLR.B   PADR(A0)


                         *
                         * Initialize PTM - PROGRAMMABLE TIMER MODULE , MC6840 SERIES
                         *
                         * OCCUPIES IRP VECTOR $78
                         *
9 00000038 4EBAFFC6             JSR     MDINIT(PC)
                         *
                         * Initialize PI/T on I/O board to read 12 bit shift register from
                         * donut receiver (double buffered mode), & provide 10 ms. interrupts.
                         *
                         * OCCUPIES IPP VECTORS $50-$57. ($52 & $54 USED)
                         *
9 0000003C 41F900000000         LEA     DRCVR,A0            POINT TO PI/T
9 00000042 10BC0040             MOVE.B  #$40,PGCR(A0)       UNIDIRECTIONAL 16 BIT MODE, H1-4 LO TRUE
9 00000046 117C00180002         MOVE.B  #$18,PSRR(A0)       NO DMA, IRP ON, H1 HIGHEST PRIORITY
9 0000004C 117C00300004         MOVE.B  #$30,PADDR(A0)      A & B ARE INPUTS
9 00000052 117C00000006         MOVE.B  #0,PBDDR(A0)
9 00000058 117C0050000A         MOVE.B  #$50,PIVR(A0)       PORT INTERRUPT VECTOR
9 0000005E 117C003A000E         MOVE.B  #$3A,PBCR(A0)       DBL BUF IN, PULSED HSHAKE, IRP FROM H3
9 00000064 117C00A00020         MOVE.B  #$A0,TCR(A0)        SET UP TIMER PARAMETERS, TIMER OFF
9 0000006A 117C00540022         MOVE.B  #$54,TIVR(A0)       TIMER IRP VECTOR
9 00000070 203C000009C4         MOVE.L  #ONETIM,D0          10 MS. TICK @ 8 MHZ.
```

```
9 00000076 01C80024          MOVEP.L  D0,CFR(A0)
                      *
                      * INITIALIZE RTU COMMUNICATION ACIA (HOSTACIA)
                      *
9 0000007A 13FC00030000       MOVE.B   #$3,HOSTACIA         MASTER RESET ACIA
           0000
9 00000082 13FC001D0000       MOVE.B   #$1D,HOSTACIA        RX IFF OFF, 8 BITS, ODD PARITY, 1 SB, /16
           0000
9 0000008A 41FAFF74           LEA      HOSTRAK(PC),A0
9 0000008E 10BC001D           MOVE.B   #$1D,(A0)            SET UP HOST ACIA TRACKING REGISTER
                      *
                      * INITIALIZE AUXILIARY COMMUNICATION ACIA (AUXACIA)
                      *
9 00000092 13FC00030000       MOVE.B   #$3,AUXACIA          MASTER RESET
           0000
9 0000009A 13FC00950000       MOVE.B   #$95,AUXACIA         CONFIGURED AS ABOVE, BUT 8 BITS, NO PARITY
           0000
9 000000A2 41FAFF5C           LEA      AUXTRAK(PC),A0
9 000000A6 10BC0095           MOVE.B   #$95,(A0)            SET UP AUX ACIA TRACKING REGISTER
                      *
                      * INITIALIZE STC.
                      *
9 000000AA                    START$
9 000000C2                    INTL$
9 0000010A 4E75               RTS
                      *
                      *
                      * INITIALIZATION TABLES:
                      *
                      * INITIALIZE TABLE FOR STC:
                      *
9 000001DC            INITBL  TEMMR$   BIN,DOP,DOB,OFF,0,F1,OFF,OFF,OFF
9 000001DE                    TEACR$   0
9 000001E0                    TEACR$   0                    ALARMS NOT USED
9 000001E2                    TECL$    0
9 000001E4                    TECM$    OFF,,,,,,,,          COUNTERS 1-3 NOT USED
9 000001E6                    TECL$    0
9 000001E8                    TECM$    OFF,,,,,,,,
9 000001EA                    TECL$    0
9 000001EC                    TECM$    OFF,,,,,,,,
9 000001EE                    TECL$    $60                  COUNT FOR 60 HZ. SAMPLING PERIOD
9 000001F0                    TECM$    HLG,R,F1,OFF,L,REP,BIN,DN,HTC
9 000001F2                    TECL$    0                    INITIAL PERIOD COUNT
9 000001F4                    TECM$    HLGM,R,F1,OFF,L,REP,BIN,UP,IOH
                      *
                      *
                              END

****** TOTAL ERRORS      0--
****** TOTAL WARNINGS    0--
SYMBOL TABLE LISTING


SYMBOL NAME     SECT  VALUE      SYMBOL NAME     SECT   VALUE


.ISEC                 0000000A   HOSTACIA  XREF   *   00000000
.AIOSIZ               00000038   HOSTRAK   XREF   5   00000000
.AOOSIZ               00000038   HT                   00000009
.COSINE               00000014   INITBL           9   000001DC
.DIOSIZ               0000001C   INTL$     MACR   *
.EFFECT               0000001C   IPTENT$              00000014
.HIOSIZ               000000C8   LAM$      MACR   *
.HOOSIZ               00000180   LOD$      MACR   *
.ICOS                 0000000A   LOP.000          9   000000CE
.IEFF                 00000018   MAXAGE               00000004
.ISCALE               00000006   MMR                  00000000
.ISIN                 0000000E   MMR$      MACR   *
.KHH                  00000024   MMR$0                00007080
.PIOSIZ               0000003F   MOSEO$    MACR   *
.REFSIZ               00000400   ONESEC               00030090
```

```
.SAMPLE                00000002   ONETIK                000009C4
.SCALE1                00000004   OPTENT$               00000004
.SCALE2                00000008   PAAR                  00000014
.SCALE3                0000000C   PACR                  0000000C
.SCALE4                00000010   PADDR                 00000004
.SINE                  00000018   PADR                  00000010
.STEMP                 0000001C   PBAR                  00000016
.TEMP                  00000012   PBCR                  0000000E
.TOFSET                0000000E   PBDDR                 00000005
.TSCALE                0000000A   PBDR                  00000012
.VCOS                  00000002   PCDDR                 00000008
.VEFF                  00000014   PCDR                  00000018
.VSCALE                00000002   PGCR                  00000000
.VSIN                  00000006   PIVR                  0000000A
.WATTS                 00000020   PROM                  00000009
.WATTSEC               00000022   PSR                   0000001A
A1R                    00000002   PSRR                  00000002
A2R                    00000004   PULL      MACR  *
AGCTRL    XREF  *      00000000   PUSH      MACR  *
AIBENT$                00000026   RAM                   00000005
ARMS      MACR  *                 RAMTEL    XREF  5     00000000
AUXACIA   XREF  *      00000000   READ$     MACR  *
AUXTRAK   XREF  5      00000000   RITE$     MACR  *
B16$      MACR  *                 RST$      MACR  *
C1L                    00000006   S60                   000039DF
C1M                    00000008   SAV$      MACR  *
C2L                    0000000A   SED$      MACR  *
C2M                    0000000C   SET$      MACR  *
C3L                    0000000E   SPACE                 00000020
C3M                    00000010   STA$      MACR  *
C4L                    00000012   STA1R$    MACR  *
C4M                    00000014   STA2R$    MACR  *
C5L                    00000016   START$    MACR  *
C5M                    00000018   STC1L$    MACR  *
CLF$      MACR  *                 STC1M$    MACR  *
CMR$      MACR  *                 STC2L$    MACR  *
CMR$0                  0000682C   STC2M$    MACR  *
CNT5$     MACR  *                 STC3L$    MACR  *
CNTR                   0000002E   STC3M$    MACR  *
CPR                    00000024   STC4L$    MACR  *
CR                     00000000   STC4M$    MACR  *
CTRL13                 00000000   STC5L$    MACR  *
CTRL2                  00000002   STC5M$    MACR  *
CTRLP     XREF  *      00000000   STCEQU          0     00000000
DATAP     XREF  *      00000000   STMMR$    MACR  *
DIBENT$                00000026   STP$      MACR  *
DRCVR     XREF  *      00000000   STX                   00000002
DSA$      MACR  *                 TCR                   00000020
DSFTENT$               00000010   TEACR$    MACR  *
DSV$      MACR  *                 TECL$     MACR  *
EEPROM                 00000007   TECM$     MACR  *
EOT                    00000004   TEMMR$    MACR  *
ETX                    00000003   TIMR1                 00000004
F$ASMPL                00004000   TIMR2                 00000008
F$DMUT                 00000400   TIMR3                 0000000C
F$EEPM                 00000040   TIVR                  00000022
F$KYBD                 00000100   TSR                   00000034
F$MON                  00000080   UPACR$    MACR  *
F$OST                  00001000   UPC1M$    MACR  *
F$PDI                  00000800   UPC2M$    MACR  *
F$PROC                 00002000   UPC3M$    MACR  *
F$XMIT                 00000200   UPC4M$    MACR  *
FF                     0000000C   UPC5M$    MACR  *
GET$      MACR  *                 UPDCL$    MACR  *
GOF$      MACR  *                 UPMMR$    MACR  *
GON$      MACR  *                 WDINIT    XREF  9     00000000
HDWINI    XDEF  9      00000000   WTCHDOG   XREF  *     00000000
                 INIT   IDNT   0,14            System Initializer  3/21/83
                        OPT    PCS,BRS
                 *
                 *
```

```
* SUBROUTINE:   INIT
*
* REVISED:      3/21/83
*
* AUTHOR:       D. A. ZEICHNER
*
* PURPOSE:      INITIALIZE SYSTEM HARDWARE, TABLES, BUFFERS, & TASKS.
*
* INPUTS:       NONE.
*
* OUTPUTS:      NONE.
*
* EXTERNAL REFERENCES/DEFINITIONS:
*
        XDEF    INIT
        XDEF    INIT0
*
* RAM REFERENCES:
*
        XREF.S  5:AUXTRAM
        XREF.S  5:EX.RAM
        XREF.S  5:HOSTRAM
        XREF.S  5:LCKOUT
*
* QUEUES:
*
        XREF.S  5:AUXIQ$
        XREF.S  5:AUXOQ$
        XREF.S  5:DNTIQ$
        XREF.S  5:HSTIQ$
        XREF.S  5:HSTOQ$
        XREF.S  5:PRCIQ$
*
* STACKS:
*
        XREF.S  5:S_ANALOG
        XREF.S  5:S_DIAG
        XREF.S  5:S_DONUT
        XREF.S  5:S_KB
        XREF.S  5:S_OFFLOD
        XREF.S  5:S_OUTPUT
        XREF.S  5:S_PROCES
        XREF.S  5:S_XMON
*
* TASK FRAMES:
*
        XREF.S  5:T_ANALOG
        XREF.S  5:T_DIAG
        XREF.S  5:T_DONUT
        XREF.S  5:T_KB
        XREF.S  5:T_OFFLOD
        XREF.S  5:T_OUTPUT
        XREF.S  5:T_PROCES
        XREF.S  5:T_XMON
*
* EEPROM REFERENCES:
*
        XREF    EPMEND
        XREF    EPMSTR
        XREF    SITEID
*
* EPROM (PROGRAM) REFERENCES:
*
        XREF.S  9:ANALOG
        XREF.S  9:BUFINI
        XREF.S  9:CRCTST
        XREF.S  9:DIAG
        XREF.S  9:DISPCH
        XREF.S  9:DONUT
        XREF.S  9:EEPMOV
        XREF.S  9:HDWINI
```

```
        XREF.S  9:KB
        XREF.S  9:KBTAP
        XREF.S  9:OFFLOD
        XREF.S  9:OUTPUT
        XREF.S  9:PROCES
        XREF.S  9:TBLINI
        XREF.S  9:TIMWR
        XREF.S  9:QUEINI
        XREF.S  9:VECINT
        XREF.S  9:HOSTRT
        XREF.S  9:XECINI
        XREF.S  9:XMTMON
*
* HARDWARE REFERENCES:
*
        XREF    AUXACIA
        XREF    ADCTRL
        XREF    DRCVR
        XREF    HOSTACIA
        XREF    KEYBRD
        XREF    PANEL
        XREF    WTCHDOG
*
*
* LOCAL MACROS:
*
* QUEUE PARAMETER INITIALIZER MACRO:
*
*       QUE[.B] QUEUE ADDR,NO. OF ELEMENTS
*
* ELEMENT SIZE DEFAULTS TO WORD. (SIZE IS EITHER WORD OR BYTE)
*
QUE     MACRO
        IFNC    '\0','B'
        DC.W    \2!$8000        QUEUE SIZE (ELEMENT IS WORD)
        ENDC
        IFC     '\0','B'
        DC.W    \2              QUEUE SIZE (ELEMENT IS BYTE)
        ENDC
        DC.W    \1              QUEUE HEADER BLOCK ADDRESS
        ENDM
*
* DEVICE LIST INITIALIZER MACRO - BUILD TABLE OF DICT PARAMETERS.
*
* CALLING SEQUENCE:
*
*       DEV     DICT ADR, IRP SVC ADR, DEV ADR, Q PTR, USR PTR,
*               DEVICE STATUS MASK, PRIORITY CHAIN LEVEL
*
DEV     MACRO
        IFNE    NARG-7
        FAIL    99              * WRONG NUMBER OF ARGUMENTS
        ENDC
        DC.L    \1              DICT ADDRESS
        DC.L    \2              IRP SVC ADDRESS
        DC.L    \3              DEVICE ADDRESS
        DC.L    \4              QUEUE POINTER
        DC.L    \5              USER POINTER
        DC.B    \6              DEVICE STATUS MASK
        DC.B    \7              PRIORITY CHAIN LEVEL
        ENDM
*
* TASK PARAMETER LIST INITIALIZER MACRO:
*
* CALLING SEQUENCE:
*
*       TSK     TASK FRAME ADR, ID, ENTRY POINT, USER SP,
*               SUPERVISOR SP SIZE, DATA SP
*
* NOTE: The user stack pointer starts at the address given in the
*       macro call, and the system stack pointer starts at the user
*       sp + the supervisor stack size.
*
```

```
                         * NOTE:  Task ID must be enclosed in single quotes.
                         *
                         TSK     MACRO
                                 IFNE    NARG-6
                                 FAIL    99                * WRONG NUMBER OF ARGUMENTS *
                                 MEXIT
                                 ENDC
                                 DC.L    \1                TASK FRAME ADDRESS
                                 DC.L    \2                TASK ID
                                 DC.L    \3                TASK ENTRY POINT
                                 DC.L    \4+\5             SUPERVISOR SP
                                 DC.L    \4                USER SP
                                 DC.L    \6                DATA SP
                                 ENDM
                         *
                         *
             00000009            SECTION  PROM
                         *
  9 00000000 4E71        INIT    NOP                          START OF PROGRAM FOR VMEBUG
  9 00000002 4240                CLR     D0
  9 00000004 6004                BRA     INIT1
  9 00000006 303CFFFF    INIT0   MOVE    #-1,D0               DEBUG ENTRY
                         *
  9 0000000A 4E70        INIT1   RESET
  9 0000000C 4EBAFFF2            JSR     VECINT(PC)           SETUP VECTOR IRPS
  9 00000010 2E7C00000000        MOVE.L  #S_OFFLOD,A7         GET SSP FOR RESTARTS FROM OFFLOD
  9 00000016 007C2700            OR      #$2700,SR            TURN OFF ALL IRPS FOR NOW
  9 0000001A 4EBAFFE4            JSR     BUFINI(PC)           INIT ANALOG & DIGITAL INPUT BUFFERS
  9 0000001E 4EBAFFE0            JSR     TBLINI(PC)           BUILD INPUT SEQUENCE TABLE
  9 00000022 4EBAFFDC            JSR     HDWINI(PC)           INITIALIZE THE HARDWARE
                         *
  9 00000026 700C                MOVEQ   #FF,D0               CLEAR DISPLAY (W/ FORM FEED)
  9 00000028 4EBAFFD6            JSR     DISPCH(PC)
                         *
                         * INITIALIZE ALL QUEUES:
                         *
  9 0000002C 4DFA0162            LEA     QTABLE(PC),A6
                         *
  9 00000030 4C9E0101    IQLUP   MOVEM   (A6)+,A0/D0
  9 00000034 4EBAFFCA            JSR     QUEINI(PC)           INITIALIZE QUEUE
  9 00000038 4A56                TST     (A6)                 MORE TO DO?
  9 0000003A 66F4                BNE     IQLUP                YES - CONTINUE
                         *
                         * INITIALIZE TIMER VALUES FOR ALL CLUSTERS
                         * TO APPROPRIATE TIME FOR 60 HZ INPUT.
                         *
  9 0000003C 303C39DF            MOVE    #S60,D0              SAMPLE TIME FOR 60HZ WAVEFORM
  9 00000040 4840                SWAP    D0                   PUT IN MOST SIGNIFICANT WORD
                         *
                                 FOR     D0 = #0 TO #4 DO
  9 00000048             Z_L1.001
  9 00000048 2200                  MOVE.L  D0,D1              PRESERVE D0 THRU CALL
  9 0000004A 4EBAFFB4              JSR     TIMWR(PC)          INITIALIZE CLUSTERS 0-4
  9 0000004E 2001                  MOVE.L  D1,D0              RESTORE D0
                                 ENDF
                         *
  9 00000058 4EBAFFA6            JSR     XECINI(PC)           INITIALIZE THE EXEC.
                         *
                         * INSTALL ALL TASK FRAMES.
                         *
  9 0000005C 4DFA009E            LEA     TSKTBL(PC),A6
                         *
  9 00000060 4CDE3F00    ITSKLUP MOVEM.L (A6)+,A0-A5          GET PARAMETERS FROM TSKTBL
  9 00000064                     XSVC    TSKINI               INITIALIZE TASK FRAME
  9 00000068 4A96                TST.L   (A6)                 ALL TASKS INSTALLED?
  9 0000006A 66F4                BNE     ITSKLUP              NO - CONTINUE
                         *
                         * CHECK ID TABLE FOR NON-ASCII CHARACTERS. IF WE FIND
                         * ONE, THEN ONLY START UP THE OFFLOD TASK (T_OFFLOD),
                         * OTHERWISE START EVERYBODY.
                         *
  9 0000006C 41F900000000        LEA     SITEID,A0
```

```
9 00000072 700F               MOVEQ   #15,D0               # OF CHARACTERS TO CHECK  (-1)
                     *
9 00000074 0C100020  ISITLUP  CMP.B   #$20,(A0)
9 00000078 6D1A               BLT     ONETSK               NOT ASCII - START UP OFFLOD ONLY
9 0000007A 0C18007F           CMP.B   #$7F,(A0)+
9 0000007E 6E14               BGT     ONETSK
9 00000080 51C8FFF2           DBRA    D0,ISITLUP           CONTINUE TILL ALL CHARACTERS DONE.
                     *
                     * ALL CHARACTERS IN SITE ID ARE ASCII. THIS MEANS WE'VE BEEN
                     * INITIALIZED BEFORE, SO START UP ALL TASKS.
                     *
9 00000084 207C00000000       MOVE.L  #DRCVR,A0            POINT TO DONUT RECEIVER
9 0000008A 08D00005           BSET    #5,PGCR(A0)          & TURN DONUT RECEIVE IRP ON
9 0000008E 4DFA006C           LEA     TSKTBL(PC),A6        POINT TO START OF TASK TABLE
9 00000092 6004               BRA     IWAKEUP              & WAKE UP ALL TASKS
                     *
                     * HAVE NEVER BEEN INITIALIZED BEFORE. START UP OFFLOD TASK ONLY.
                     *
9 00000094 4DFA000E  ONETSK   LEA     LASTSK(PC),A6        OFFLOD IS LAST TASK ON LIST
                     *
9 00000098 303C8000  IWAKEUP  MOVE    #$8000,D0            UNCONDITIONAL WAKE UP FLAG
9 0000009C 207C00000000       MOVE.L  #TPCUR,A0            GET ADR OF 10 MS. TIMER
9 000000A2 08E800000020       BSET    #0,TCR(A0)           & START IT UP.
                     *
                     * WAKE UP LOOP
                     *
9 000000A8 2056      IWAKLUP  MOVE.L  (A6),A0              GET TASK FRAME FROM INIT TABLE
9 000000AA                    XSVC    READY                WAKE UP THIS TASK
9 000000AE 4DEE0018           LEA     24(A6),A6            POINT TO NEXT TASK FRAME
9 000000B2 4A96               TST.L   (A6)                 MORE TO GO?
9 000000B4 66F2               BNE     IWAKLUP              YES - CONTINUE
                     *
9 000000B6 41FAFF48           LEA     EX.RAM(PC),A0        POINT TO EXEC'S RAM
9 000000BA 43FAFF44           LEA     T_OFFLOD(PC),A1      POINT TO OFFLOD TASK FRAME
9 000000BE 21490002           MOVE.L  A1,EX$TSK(A0)        MAKE OFFLOD THE PRESENT TASK
9 000000C2 4E67               MOVE.L  A7,USP               SET UP USP
9 000000C4 4FFA00CA           LEA     S_OFFLOD+400(PC),A7  ASSUME PROPER SUPER STACK
9 000000C8 46FC0000           MOVE    #0,SR                MAKE OURSELVES MORTAL
                     *
                     * CALCULATE CRC FOR EEPROM - (MUST BE MOVED AFTER TIMER HAS STARTED).
                     *
9 000000CC 41F900000000       LEA     EPMSTR,A0            GET START OF EEPROM
9 000000D2 323C0000           MOVE    #EPMEND-EPMSTR,D1    # OF BYTES TO CHECK
9 000000D6 4247               CLR     D7                   INIT CRC WORD
9 000000D8 4EBAFF26           JSR     CRCTST(PC)           CALCULATE CRC WORD
                     *
9 000000DC 43F900000000       LEA     EPMEND,A1            DESTINATION OF MOVE
9 000000E2 3F07               MOVE    D7,-(A7)             SAVE THE SOURCE OF THE MOVE
9 000000E4 204F               MOVE.L  A7,A0                GET SOURCE POINTER
9 000000E6 7402               MOVEQ   #2,D2                TWO BYTES TO MOVE
9 000000E8 08B800000000       BCLR    #0,LCKOUT            INITIALIZE TASK LOCK OUT BIT
9 000000EE 4EBAFF10           JSR     EEPMOV(PC)           MOVE CRC WORD TO EEPROM
9 000000F2 548F               ADDQ.L  #2,A7                RESTORE STACK
                     *
9 000000F4 4EBAFF0A           JSR     WDSTRT(PC)           START THE PTM  - WATCHDOG
                     *
9 000000F8 4EFAFF06           JMP     OFFLOD(PC)           AND DO IT!
                     *
                     * AND WE'RE ON THE AIR!
                     *
                     *
                     * INITIALIZATION PARAMETER TABLES:
                     *
                     * TABLE OF PARAMETERS TO INITIALIZE TASK FRAMES:
                     *
                     * (LAST ONE IN LIST IS 1ST TO GO)
                     *
                     **
                     *   NOTE: FOR TESTING WITHOUT THE BOTHER OF DIAG & DONUT, THEY HAVE
                     **        NOT BEEN MADE READY TO RUN. (NEVER INITIALIZED)-- REMOVE LATER!
```

```
9 000000FC              TSKTBL   TSK      T_ANALOG,'ANLG',ANALOG,S_ANALOG,400,0
                        *        TSK      T_DONUT,'DNUT',DONUT,S_DONUT,400,0
9 00000114                       TSK      T_PROCES,'PROC',PROCES,S_PROCES,400,0
9 0000012C                       TSK      T_OUTPUT,'OUTT',OUTPUT,S_OUTPUT,400,0
9 00000144                       TSK      T_KB,'KYBD',KB,S_KB,400,0
9 0000015C                       TSK      T_XMON,'XMON',XMTMON,S_XMON,400,0
                        *        TSK      T_DIAG,'DIAG',DIAG,S_DIAG,400,0
9 00000174              LASTSK   TSK      T_OFFLOD,'OFLD',OFFLOD,S_OFFLOD,400,0
                        *
9 000001BC 00000000              DC.L     0                    END OF TASK PARAMETER TABLE
                        *
                        * TABLE OF PARAMETERS TO INITIALIZE QUEUES:
                        *
9 00000190              QTABLE   QUE.B    AUXIO$,.AIQSIZ       AUXILIARY INPUT QUEUE (ELEMENT SIZE BYTE)
9 00000194                       QUE.B    AUXOO$,.AOQSIZ       AUXILIARY OUTPUT QUEUE
9 00000198                       QUE      DNTIO$,.DIQSIZ       DONUT INPUT QUEUE (ELEMENT SIZE WORD)
9 0000019C                       QUE.B    HSTIO$,.HIQSIZ       HOST INPUT QUEUE
9 000001A0                       QUE.B    HSTOO$,.HOQSIZ       HOST OUTPUT QUEUE
9 000001A4                       QUE      PRCIO$,.PIQSIZ       PROCESS INPUT QUEUE (ELEMENT SIZE WORD)
                        *
9 000001A8 0000                  DC.W     0                    END OF QUEUE PARAMETER TABLE
                        *
                        *
                                 END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .ISEC | | | 0000000A | INIT1 | | 9 | 0000000A |
| .AIQSIZ | | | 00000038 | IPTENT$ | | | 00000014 |
| .AOQSIZ | | | 00000038 | IQLUP | | 9 | 00000030 |
| .COSINE | | | 00000014 | ISITLUP | | 9 | 00000074 |
| .DIQSIZ | | | 0000001C | ITSKLUP | | 9 | 00000060 |
| .EFFECT | | | 0000001C | IWAKEUP | | 9 | 0000009E |
| .HIQSIZ | | | 000000C8 | IWAKLUP | | 9 | 000000A8 |
| .HOQSIZ | | | 00000180 | KB | XREF | 9 | 00000000 |
| .ICOS | | | 0000000A | KBIRP | XREF | 9 | 00000000 |
| .IEFF | | | 00000018 | KEYBRD | XREF | * | 00000000 |
| .ISCALE | | | 00000006 | LASTSK | | 9 | 00000174 |
| .ISIN | | | 0000000E | LCKOUT | XREF | 5 | 00000000 |
| .KWH | | | 00000024 | MAXAGE | | | 00000004 |
| .PIQSIZ | | | 0000003F | NEXTSK | | | 00000030 |
| .RRFSIZ | | | 00000400 | OFFLOD | XREF | 9 | 00000000 |
| .SAMPLE | | | 00000002 | ONESEC | | | 00030090 |
| .SCALE1 | | | 00000004 | ONETIK | | | 000008C4 |
| .SCALE2 | | | 00000008 | ONETSK | | 9 | 00000094 |
| .SCALE3 | | | 0000000C | OPTENT$ | | | 00000004 |
| .SCALE4 | | | 00000010 | OUTPUT | XREF | 9 | 00000000 |
| .SINE | | | 00000018 | PAAR | | | 00000014 |
| .SPNJP | MACR | * | | PACR | | | 0000000C |
| .STEMP | | | 0000001C | PADDR | | | 00000004 |
| .TEMP | | | 00000012 | PADR | | | 00000010 |
| .TOFSET | | | 0000000E | PANEL | XREF | * | 00000000 |
| .TSCALE | | | 000000CA | PBAR | | | 00000016 |
| .VCOS | | | 00000002 | PBCR | | | 0000000E |
| .VEFF | | | 00000014 | PBDDR | | | 00000006 |
| .VSCALE | | | 00000002 | PBDR | | | 00000012 |
| .VSIN | | | 00000006 | PCDDR | | | 00000008 |
| .WATTS | | | 00000020 | PCDR | | | 0000001E |
| .WATTSEC | | | 00000022 | PGCR | | | 00000000 |
| ADCTRL | XREF | * | 00000000 | PIVR | | | 0000000A |
| AIBENT$ | | | 00000026 | PRCIO$ | XREF | 5 | 00000000 |
| ANALOG | XREF | 9 | 00000000 | PROCES | XREF | 9 | 00000000 |
| AUXACIA | XREF | * | 00000000 | PROM | | | 00000009 |
| AUXIO$ | XREF | 5 | 00000000 | PSR | | | 0000001A |
| AUXOO$ | XREF | 5 | 00000000 | PSRR | | | 00000002 |

```
AUXTRAK   XREF  5  00000000   FULL      MACR  *
BUFINI    XREF  9  00000000   PUSH      MACR  *
CHGENT             00000034   DTABLE          9  00000190
CNTR               0000002E   QUE       MACR  *
CPR                00000024   QUEINI    XREF  9  00000000
CR                 0000000D   RAM                00000035
CRCTST    XREF  9  00000000   RDYALL             0000000B
CTRL13             00000000   READY              00000004
CTRL2              00000002   RELEAS             0000002C
DEV       MACR  *             RESERV             00000028
DEVINI             00000014   RESTRT             0000003C
DI$DEV             0000000A   S60                00003FDF
DI$EVF             00000000   SAV$               0000002A
DI$ISV             00000006   SPACE              00000020
DI$LNK             00000016   STX                00000002
DI$OWN             00000002   SUSPEN             0000000C
DI$PTR             00000012   S_ANALOG  XREF  5  00000000
DI$QUE             0000000E   S_DIAG    XREF  5  00000000
DI$RSO             0000001A   S_DONUT   XREF  5  00000000
DI$SIZ             00000020   S_KB      XREF  5  00000000
DI$STA             0000001C   S_OFFLOD  XREF  5  00000000
DI$USR             0000001E   S_OUTPUT  XREF  5  00000000
DIAG      XREF  9  00000000   S_PROCES  XREF  5  00000000
DIBENT$            00000026   S_XMON    XREF  5  00000000
DISPCH    XREF  9  00000000   TBLINI    XREF  9  00000000
DNTIO$    XREF  5  00000000   TCR                00000020
DONUT     XREF  9  00000000   TIMR1              00000004
DRCVR     XREF  *  00000000   TIMR2              00000008
DSFTENT$           00000010   TIMR3              0000000C
EEPMOV    XREF  9  00000000   TIMWR     XREF  9  00000000
EEPROM             00000007   TIVR               00000022
EOT                00000004   TK$CON             00000012
EPMEND    XREF  *  00000000   TK$ENT             00000004
EPMSTF    XREF  *  00000000   TK$ID              00000000
EOS       MACR  *             TK$LFT             00000016
ETX                00000003   TK$NXT             0000001A
EX$DV0             0000000A   TK$RSO             0000001E
EX$DV1             0000000E   TK$SIZ             00000022
EX$DV2             00000012   TK$SSP             00000008
EX$DV3             00000016   TK$STF             0000000C
EX$DV4             0000001A   TK$STK             0000000E
EX$DV5             0000001E   TK$TIM             00000010
EX$DV6             00000022   TSK       MACR  *
EX$DV7             00000026   TSKEND             00000038
EX$NXT             00000006   TSKINI             00000010
EX$SIZ             0000002A   TSKTBL          9  000000FC
EX$TIM             00000006   TSR                00000034
EX$TSK             00000002   T_ANALOG  XREF  5  00000000
EX.RAM    XREF  5  00000000   T_DIAG    XREF  5  00000000
EXEC               00000000   T_DONUT   XREF  5  00000000
F$ASMPL            00004000   T_KB      XREF  5  00000000
F$DNUT             00000400   T_OFFLOD  XREF  5  00000000
F$EEPM             00000040   T_OUTPUT  XREF  5  00000000
F$KYBD             00000100   T_PROCES  XREF  5  00000000
F$MON              00000080   T_XMON    XREF  5  00000000
F$OST              00001000   VECINT    XREF  9  00000000
F$PDI              00000800   WAIT               0000001C
F$PROC             00002000   WAITCN             00000020
F$XMIT             00000200   WAITLP             00000024
FF                 0000000C   WAKEUP             00000018
HDWINI    XREF  9  00000000   WDSTRT    XREF  9  00000000
HOSTACIA  XREF  *  00000000   WTCHDOG   XREF  *  00000000
HOSTRAK   XREF  5  00000000   XECINI    XREF  9  00000000
HSTIO$    XREF  5  00000000   XMTMON    XREF  9  00000000
HSTOO$    XREF  5  00000000   XSVC      MACR  *
HT                 00000009   Z_L1.001        9  00000046
INIT      XDEF  9  00000000   Z_L2.000        9  00000052
INITO     XDEF  9  00000006

165                KB   IDNT   0,9            Keyboard handler task  3/3/83
166                     OPT    PCS,BRS
```

```
                         *
                         *
                         * SUBROUTINE:    KB
                         *
                         * REVISED:       3/3/83
                         *
                         * AUTHOR:        D. A. ZEICHNER
                         *
                         * PURPOSE:       Monitor keyboard, and provide the appropriate response
                         *                to keyboard input.
                         *
                         * INPUTS:        None.
                         *
                         * OUTPUTS:       None.
                         *
                         * EXTERNAL REFERENCES/DEFINITIONS:
                         *
                                XDEF    KB
                                XDEF    BINASC
                         *
                         * HARDWARE REFERENCES:
                         *
                                XREF    HOSTACIA
                         *
                         * RAM REFERENCES:
                         *
                                XREF.S  5:HOSTRAK
                                XREF.S  5:T_KB
                                XREF.S  5:T_XMON
                         *
                         * EEPROM REFERENCES:
                         *
                                XREF    RAMERR
                         *
                         * PROM REFERENCES:
                         *
                                XREF.S  9:DISPCH
                                XREF.S  9:DISPLY
                                XREF.S  9:FFPAFP
                                XREF.S  9:FFFFPI
                         *
                         * LOCAL ASSIGNMENTS:
                         *
            0000000F     UPRQ   EQU     $F                  UPLOAD REQUEST KEY       N/A
            0000000E     ERLC   EQU     $E                  ERROR LOG DISPLAY KEY
            0000000D     PTMN   EQU     $D                  POINT MONITOR KEY
                         *
            00000000     TEMP   EQU     0                   STACK OFFSET TO LOCAL WORK AREA
                         *
                         *
                         *
            00000009            SECTION PROM
                         *
  9 00000000 4DFAFFFE    KB     LEA     T_KB(PC),A6         POINTER TO TASK FRAME
  9 00000004 42A7               CLR.L   -(A7)               ALLOCATE LOCAL SCRATCH SPACE
                         *
                         * KEYBOARD TASK PROCESSING:
                         *
  9 00000006 303C0100    KBLUP  MOVE    #F$KYBD,D0          WAIT FOR KEYBOARD
  9 0000000A 4241               CLR     D1                  NO TIMEOUT
  9 0000000C                    XSVC    SUSPEN
                         *
                         * TURN OFF XMTMON IRP & SUSPEND IT SO IT WON'T TRY TO WRITE ON
                         * THE DISPLAY WHILE WE'RE IN HERE. ALSO, BLANK THE DISPLAY.
                         *
  9 00000010 08B800070000       BCLR    #7,HOSTRAK          CLEAR IRP BIT IN TRACKING REGISTER
  9 00000016 13FAFFE80000       MOVE.B  HOSTRAK(PC),HOSTACIA & SHUT OFF RCVR IRP.
             0000
                         *
                         * BY CLEARING THE STATE FLAGS IN XMTMON & SHUTTING OFF HIS RCVR IRP,
                         * WE HAVE GUARANTEED THAT HE WILL NOT RUN AGAIN UNTIL THE NEXT CHAR.
                         * RECEIVED AFTER WE TURN THE RCVR IRP BACK ON.
```

```
                               *
9 0000001E 41FAFFE0                    LEA     T_XMON(PC),A0       NOW SUSPEND THE TASK.
9 00000022 4268000C                    CLR     TK$STF(A0)
                               *
9 00000026 700C                        MOVEQ   #FF,D0              PUT FORMFEED IN D0
9 00000028 4EBAFFD6                    JSR     DISPCH(PC)          & DISPLAY IT (CLEAR SCREEN)
                               *
9 0000002C 102E001E                    MOVE.B  TK$RSO(A6),D0       GET KEY RECEIVED
9 00000030 6100011A                    BSR.L   XKEY                TRANSLATE KEY
                               *
9 00000034 0C00000F                    CMP.B   #UPRQ,D0            UPLOAD REQUEST?
9 00000038 6602                        BNE     KB1
                               *
                               * CALL XMTCHR W/ UPLOAD REQUEST.
                               * (WE'LL IMPLEMENT THIS THING LATER)
                               *
9 0000003A 60CA                        BRA     KBLUP
                               *
9 0000003C 0C00000E            KB1     CMP.B   #ERLG,D0            EXAMINE ERROR LOG?
9 00000040 665E                        BNE     KB2
                               *
9 00000042 41FA016C                    LEA     LOGMSG(PC),A0       YES - PROMPT FOR LOG NUMBER
9 00000046 4EBAFFB8                    JSR     DISPLY(PC)
                               *
                               * NEXT KEY IS ERROR LOG TO BE EXAMINED.
                               *
9 0000004A 610000E8                    BSR.L   GETKEY              WAIT FOR KEYBOARD OR 10 SECONDS
9 0000004E 6B000084                    BMI.L   KBERR               TIMEOUT - CLEAR DISPLAY & START OVER
                               *
9 00000052 0C000033                    CMP.B   #'3',D0             LOG NUMBER MUST BE BETWEEN 0 AND 3
9 00000056 620000AC                    BHI.L   KBERR               ERROR - CLEAR SCREEN & RETRY
                               *
9 0000005A 0240000F                    AND     #F,D0               CONVERT TO BINARY
9 0000005E 3200                        MOVE    D0,D1               & SAVE IN D1.
9 00000060 41FA00FC                    LEA     MSGS(PC),A0
9 00000068 41F00000                    LEA     (A0,D0),A0          GET ADDRESS OF MESSAGE
9 0000006C 4EBAFF92                    JSR     DISPLY(PC)          & DISPLAY ON SCREEN
9 00000070 41F900000000                LEA     RAMERR,A0
9 00000076 10301000                    MOVE.B  (A0,D1),D0          RETRIEVE ERROR COUNT
9 0000007A 0280000000FF                AND.L   #FF,D0              CLEAR 3 MSB'S
                               *
                               * GOT ERROR COUNT IN D0. CONVERT TO ASCII DECIMAL.
                               *
9 00000080 6100006E                    BSR.L   BINASC              CONVERT TO DECIMAL
                               *
                               * WE NOW HAVE A 4 DIGIT ASCII DECIMAL NUMBER IN D0. SCRAP THE
                               * LEADING DIGIT (ALWAYS 0), PUT TERMINATOR ON THE MESSAGE.
                               * SAVE IN STACK, & DISPLAY IT.
                               *
9 00000084 E180                        ASL.L   #8,D0               MAKE ROOM FOR TERMINATOR
9 00000086 103C0004                    MOVE.B  #EOT,D0
9 0000008A 2F00                        MOVE.L  D0,-(A7)            SAVE ERROR COUNT ON STACK
9 0000008C 204F                        MOVE.L  A7,A0
9 0000008E 4EBAFF70                    JSR     DISPLY(PC)          & DISPLAY ERROR COUNT
9 00000092 4FEF0004                    LEA     4(A7),A7            DEALLOCATE STACK SCRATCH SPACE
9 00000096 6000FF6E                    BRA     KBLUP
                               *
9 0000009A 0C000000            KB2     CMP.B   #PTMN,D0            POINT MONITOR?
9 0000009E 6664                        BNE     KBERR               NO - INVALID KEY
9 000000A0 41FA0104                    LEA     PTMSG(PC),A0
9 000000A4 4EBAFF5A                    JSR     DISPLY(PC)          GIVE POINT MONITOR MESSAGE
9 000000A8 6100008A                    BSR.L   GETKEY              WAIT FOR TIME OF KEY
9 000000AC 6B56                        BMI     KBERR               TIMEOUT - START OVER
                               *
9 000000AE 0C00003A                    CMP.B   #$3A,D0             SEE IF DECIMAL KEY > 9 .
9 000000B2 6250                        BHI     KBERR               INVALID KEY
9 000000B4 1E50                        MOVE.B  D0,TEMP(A7)         SAVE KEY IN STACK
9 000000B6 4EBAFF48                    JSR     DISPCH(PC)          & DISPLAY IT
9 000000BA 6178                        BSR     GETKEY              GET NEXT KEY
9 000000BC 6B46                        BMI     KBERR               TIMEOUT - START OVER
                               *
```

```
9 000000BE 0C00003A          CMP.B   #$3A,D0            SEE IF DECIMAL KEY > 9
9 000000C2 6C40              BGE     KBEPR              INVALID KEY
9 000000C4 0C000030          CMP.B   #$30,D0
9 000000C8 6D3A              BLT     KBEPR              INVALID KEY
9 000000CA 4EBAFF34          JSR     DISPCH(PC)
9 000000CE 1F400001          MOVE.B  D0,TEMP+1(A7)      SAVE IN STACK
9 000000D2 0C573633          CMP     #'63',(A7)         VALID POINT NUMBER?
9 000000D6 6E2C              BGT     KBEPR              NO - ERROR
                     *
                     * GOT A VALID POINT NUMBER. CONVERT FROM ASCII TO BINARY, DISPLAY A SPACE
                     * BEFORE THE VALUE OF THE POINT NUMBER, AND SAVE IN XMTMON'S TASK FRAME.
                     *
9 000000D8 41D7              LEA     TEMP(A7),A0        POINT TO ASCII POINT NUMBER
9 000000DA 4EBAFF24          JSR     FFFAFP(PC)         CONVERT TO FLOATING POINT
9 000000DE 4EBAFF20          JSR     FFFFPI(PC)         AND TO INTEGER.
9 000000E2 303C0020          MOVE    #$20,D0            SPACE FOR DISPCH
9 000000E6 4EBAFF18          JSR     DISPCH(PC)         DO IT
9 000000EA 41FAFF14          LEA     T_XMON(PC),A0      GET XMTMON'S TASK FRAME
9 000000EE 1147001E          MOVE.B  D7,TK$RS0(A0)      & SAVE POINT NUMBER THERE
9 000000F2 08F900070000      BSET    #7,HOSTRAK         TURN ON XMTMON IFF
9 000000F8 13FAFF6A0000      MOVE.B  HOSTRAK(PC),HOSTACIA
9 00000100 6000FF04          BRA     KBLUP
                     *
                     * SOME KIND OF ERROR - BLANK SCREEN & START OVER.
                     *
9 00000104 303C000C  KBEPR   MOVE    #FF,D0             DISPLAY FORM FEED TO BLANK DISPLAY
9 00000108 4EBAFEF6          JSR     DISPCH(PC)         CLEAR DISPLAY
9 0000010C 6000FEF8          BRA     KBLUP              & START OVER
                     *
                     *
                     * SUBROUTINES:
                     *
                     * BINASC - INCOMING 12 BITS IN D0. 4 ASCII
                     *          DECIMAL CHARS RETURNED IN D0.
                     *
                     * D0, D1, D2 DESTROYED.
                     *
9 00000110 028000000FFF BINASC AND.L  #$FFF,D0          RESTRICT TO 12 BITS
9 00000116 2200              MOVE.L  D0,D1              & SAVE IN D1
9 00000118 243C000003E8      MOVE.L  #1000,D2
                     *
9 0000011E 82C2      BINLUP  DIVU    D2,D1              CALC VALUE OF THIS DECADE
9 00000120 00010030          OR.B    #'0',D1            CONVERT TO ASCII
9 00000124 E180              ASL.L   #8,D0              MAKE ROOM FOR DIGIT
9 00000126 1001              MOVE.B  D1,D0              & PUT IT IN
9 00000128 4841              SWAP    D1                 REMAINDER BECOMES NEW DIVISOR
9 0000012A 48C1              EXT.L   D1
9 0000012C 84FC000A          DIVU    #10,D2             GET SET FOR NEXT DECADE
9 00000130 66EC              BNE     BINLUP
9 00000132 4E75              RTS                        DONE - RETURN
                     *
                     *
                     * GETKEY - WAIT FOR KEY OR TIMEOUT. IF KEY RECEIVED,
                     *          IT IS RETURNED IN D0. IF TIMEOUT, NEGATIVE
                     *          FLAG IS SET.
                     *
                     * IF NOT TIMEOUT, D0 HAS KEY. ALL OTHER REGISTERS DESTROYED.
                     *
9 00000134 303C0100  GETKEY  MOVE    #F$KYBD,D0         WAIT FOR TIME OR KEY
9 00000138 323C03E8          MOVE    #1000,D1           10 SECONDS
9 0000013C                   XSVC    SUSPEN
9 00000140 102E001E          MOVE.B  TK$RS0(A6),D0      GET KEY (IF ANY)
9 00000144 6106              BSR     XKEY               TRANSLATE KEY
9 00000146 4A6E000C          TST     TK$STF(A6)         SET NEGATIVE FLAG IF TIMEOUT
9 0000014A 4E75              RTS                        & RETURN
                     *
                     * XKEY - TRANSLATE THE VALUE IN D0, TO CORRESPOND TO THE FACE VALUE
                     *        ON THE KEYBOARD.
                     *
9 0000014C 2F08      XKEY    MOVE.L  A0,-(A7)           SAVE REG
```

```
9 0000014E 41FA0072                  LEA      KEYTBL(PC),A0         TABLE ADDRESS
9 00000152 0240000F                  AND      #$F,D0                CLEAR MSByte OF INPUT KEY
9 00000156 10300000                  MOVE.B   (A0,D0),D0            GET KEY FROM XLATE TABLE
9 0000015A 205F                      MOVE.L   (A7)+,A0              RESTORE REG
9 0000015C 4E75                      RTS
                           *
                           * MESSAGES & TABLES:
                           *
9 0000015E 04              MSGS      DC.B     RAMSG-MSGS
9 0000015F 15                        DC.B     ROMSG-MSGS
9 00000160 26                        DC.B     RSMSG-MSGS
9 00000161 37                        DC.B     CPUMSG-MSGS
                           *
9 00000162 0C2020202052 RAMSG        DC.B     FF,'    RAM ERRORS',CR,EOT
                           *
9 00000173 0C2020202052 ROMSG        DC.B     FF,'    ROM ERRORS',CR,EOT
9 00000184 0C2020202052 RSMSG        DC.B     FF,'    RESTARTS  ',CR,EOT
                           *
9 00000195 0C2020202043 CPUMSG       DC.B     FF,'    CPU ERRORS',CR,EOT
                           *
9 000001A6 0C504F494E54 PTMSG        DC.B     FF,'POINT # ',EOT
                           *
9 000001B0 0C4552524F52 LOGMSG       DC.B     FF,'ERROR TYPE (0-3)',EOT
                           *
                           *
                           * KEYBOARD ASCII TRANSLATION TABLE:
                           *
9 000001C2 31              KEYTBL    DC.B     '1'          KEY POSITION  0
9 000001C3 32                        DC.B     '2'          KEY POSITION  1
9 000001C4 33                        DC.B     '3'          KEY POSITION  2
9 000001C5 7F                        DC.B     $7F          KEY POSITION  3
9 000001C6 34                        DC.B     '4'          KEY POSITION  4
9 000001C7 35                        DC.B     '5'          KEY POSITION  5
9 000001C8 36                        DC.B     '6'          KEY POSITION  6
9 000001C9 7F                        DC.B     $7F          KEY POSITION  7
9 000001CA 37                        DC.B     '7'          KEY POSITION  8
9 000001CB 38                        DC.B     '8'          KEY POSITION  9
9 000001CC 39                        DC.B     '9'          KEY POSITION  10
9 000001CD 7F                        DC.B     $7F          KEY POSITION  11
9 000001CE 30                        DC.B     '0'          KEY POSITION  12
9 000001CF 0F                        DC.B     $F           KEY POSITION  13  = FUNCTION FOR UPLOAD
9 000001D0 0E                        DC.B     $E           KEY POSITION  14  = FUNCTION FOR ERROR LOG
9 000001D1 0D                        DC.B     $D           KEY POSITION  15  = FUNCTION FOR PT.MONITOR
                           *
                                     END

****** TOTAL ERRORS      0--
****** TOTAL WARNINGS    0--
SYMBOL TABLE LISTING
```

| SYMBOL NAME | SECT | VALUE | SYMBOL NAME | SECT | VALUE |
|---|---|---|---|---|---|
| .1SEC | | 0000000A | F$XMIT | | 00000200 |
| .AIOSIZ | | 00000038 | FF | | 0000000C |
| .AOOSIZ | | 00000038 | FFPAFP | XREF 9 | 00000000 |
| .COSINE | | 00000014 | FFFFPI | XREF 9 | 00000000 |
| .DIOSIZ | | 0000001C | GETKEY | 9 | 00000134 |
| .EFFECT | | 0000001C | HOSTACIA | XREF * | 00000000 |
| .HIOSIZ | | 000000C8 | HOSTRAK | XREF 5 | 00000000 |
| .HOOSIZ | | 00000180 | HT | | 00000009 |
| .ICOS | | 0000000A | IPTENT$ | | 00000014 |
| .IEFF | | 00000018 | KB | XDEF 9 | 00000000 |
| .ISCALE | | 00000006 | KB1 | 9 | 0000003C |
| .ISIN | | 0000000E | KB2 | 9 | 0000009A |
| .KHH | | 00000024 | KBERR | 9 | 00000104 |
| .PIOSIZ | | 0000003F | KBLUP | 9 | 00000006 |
| .REFSIZ | | 00000400 | KEYTBL | 9 | 000001C2 |
| .SAMPLE | | 00000002 | LOGMSG | 9 | 000001B0 |
| .SCALE1 | | 00000004 | MAXAGE | | 00000004 |

```
.SCALE2                 00000008  MSGS             9  0000015E
.SCALE3                 0000000C  NEXTSK              00000030
.SCALE4                 00000010  ONESEC              00030090
.SINE                   00000018  ONETIK              000009C4
.SPNJP     MACR   *               OPTENT$             00000004
.STEMP                  0000001C  PAAR                00000014
.TEMP                   00000012  PACR                0000000C
.TOFSET                 0000000E  PADDR               00000004
.TSCALE                 0000000A  PADR                00000010
.VCOS                   00000002  PBAR                00000016
.VEFF                   00000014  PBCR                0000000E
.VSCALE                 00000002  PBDDR               00000006
.VSIN                   00000006  PBDR                00000012
.WATTS                  00000020  PCDDR               00000008
.WATTSEC                00000022  PCDR                00000018
AIBENT$                 00000026  PGCR                00000000
BINASC     XDEF   9     00000110  PIVR                0000000A
BINLUP            9     0000011E  PROM                00000009
CHGENT                  00000034  PSR                 0000001A
CNTR                    0000002E  PSRR                00000002
CPR                     00000024  PTHN                0000000D
CPUMSG            9     00000195  PTMSG            9  000001A6
CR                      0000000D  PULL      MACR   *
CTRL13                  00000000  PUSH      MACR   *
CTRL2                   00000002  RAM                 00000005
DEVINI                  00000014  RAMERR    XREF   *  00000000
DI$DEV                  0000000A  RAMSG            9  00000162
DI$EVF                  00000000  RDYALL              00000008
DI$ION                  0000001B  READY               00000004
DI$ISV                  00000006  RELEAS              0000002C
DI$LNK                  00000016  RESERV              00000028
DI$OWN                  00000002  RESTRT              0000003C
DI$PTP                  00000012  ROMSG            9  00000173
DI$QUE                  0000000E  RSMSG            9  00000184
DI$SIZ                  00000020  SAV$                0000002A
DI$STA                  0000001C  SPACE               00000020
DI$USR                  0000001E  STX                 00000002
DIBENT$                 00000026  SUSPEN              0000000C
DISPCH     XREF   9     00000000  TCR                 00000020
DISPLY     XREF   9     00000000  TEMP                00000000
DSFTENT$                00000010  TIMR1               00000004
EEPROM                  00000007  TIMR2               00000008
EOT                     00000004  TIMR3               0000000C
EOS        MACR   *               TIVR                00000022
EPLG                    0000000E  TK$CON              00000012
ETX                     00000003  TK$ENT              00000004
EX$DV0                  0000000A  TK$ID               00000000
EX$DV1                  0000000E  TK$LPT              00000016
EX$DV2                  00000012  TK$NXT              0000001A
EX$DV3                  00000016  TK$RS0              0000001E
EX$DV4                  0000001A  TK$SIZ              00000022
EX$DV5                  0000001E  TK$SSP              00000008
EX$DV6                  00000022  TK$STF              0000000C
EX$DV7                  00000026  TK$STM              0000000E
EX$NXT                  00000006  TK$TIM              00000010
EX$SIZ                  0000002A  TSKEND              00000038
EX$TIM                  00000000  TSKINI              00000010
EX$TSP                  00000002  TSR                 00000034
EXEC                    00000000  T_KB      XREF   5  00000000
F$ASMPL                 00004000  T_XMON    XREF   5  00000000
F$DNUT                  00000400  UPPQ                0000000F
F$EEPM                  00000040  WAIT                0000001C
F$KYBD                  00000100  WAITCN              00000020
F$MON                   00000080  WAITLP              00000024
F$OST                   00001000  WAKEUP              00000018
F$PDI                   00000800  XKEY             9  0000014C
F$PROC                  00002000  XSVC      MACR   *

                  KBIRP     IDNT      0,7                 Keyboard Interrupt Service 1/20/83
                            OPT       PCS,BRS
                  *
                  *
```

```
                            * SUBROUTINE:    KBIRP
                            *
                            * REVISED:       1/20/83
                            *
                            * AUTHOR:        D. A. ZEICHNER
                            *
                            * PURPOSE:       When a key is struck, retrieve it and save in the reserved
                            *                area of the task frame. In this way, we are allowing for
                            *                the buffering of only one character.
                            *
                            * INPUTS:        None.
                            *
                            * OUTPUTS:       New key in TK$RS0 of KB'S task frame.
                            *                All registers preserved.
                            *
                            * EXTERNAL REFERENCES/DEFINITIONS:
                            *
                                   XDEF     KBIRP
                            *
                            * HARDWARE REFERENCES:
                            *
                                   XREF     KEYBRD
                            *
                            * RAM REFERENCES:
                            *
                                   XREF.S   5:T_KB
                            *
           00000009                SECTION  PROM
                            *
9 00000000                  KBIRP  PUSH     A0/D0                  SAVE REGISTERS
9 00000004 41FAFFFA                LEA      T_KB(PC),A0            POINT TO TASK FRAME
9 00000008 117900000000            MOVE.B   KEYBRD,TK$RS0(A0)      GET KEY
           001E
9 00000010 0228000F001E            AND.B    #$F,TK$RS0(A0)         MASK OUT MS NIBBLE
9 00000016 303C0100                MOVE     #F$KYBD,D0             GET WAKEUP FLAGS, AND
9 0000001A                         XSVC     READY                  WAKE UP KEYBOARD TASK
9 0000001E                         PULL     A0/D0                  RESTORE REGISTERS
9 00000022 4E73                    RTE
                            *
                            *
                                   END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIOSIZ | | 00000038 | F$DMUT | | 00000400 |
| .AOOSIZ | | 00000038 | F$KYBD | | 00000100 |
| .COSINE | | 00000014 | F$MON | | 00000080 |
| .DIOSIZ | | 0000001C | F$OST | | 00001000 |
| .EFFECT | | 0000001C | F$PDI | | 00000800 |
| .HIOSIZ | | 00000010 | F$PROC | | 00002000 |
| .HOOSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPTENT$ | | 00000014 |
| .ISIN | | 0000000E | KBIRP | XDEF 9 | 00000000 |
| .KWH | | 00000024 | KEYBRD | XREF * | 00000000 |
| .PIOSIZ | | 0000003F | MAXAGE | | 00000004 |
| .REFSIZ | | 00000400 | NEXTSK | | 00000030 |
| .SAMPLE | | 00000002 | ONESEC | | 00030090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |

```
.SCALE4                  00000010   FACR                 0000000C
.SINE                    00000018   FADDR                00000004
.SFNJP    MACR  *                   FADR                 00000010
.STEMP                   0000001C   FBAR                 00000016
.TEMP                    00000012   FBCR                 0000000E
.TOFSET                  0000000E   PBDDR                00000006
.TSCALE                  0000000A   PBDR                 00000012
.VCOS                    00000002   PCDDR                00000008
.VEFF                    00000014   PCDR                 00000018
.VSCALE                  00000002   PGCR                 00000000
.VSIN                    00000006   PIVR                 0000000A
.WATTS                   00000020   PROM                 00000009
.WATTSEC                 00000022   PSR                  0000001A
AIRENT$                  00000026   PSPR                 00000002
CHGENT                   00000034   PULL       MACR  *
CNTR                     0000002E   PUSH       MACR  *
CPR                      00000024   RAM                  00000005
CR                       0000000D   RDYALL               00000008
DEVINI                   00000014   READY                00000004
DI$DEV                   0000000A   RELEAS               0000002C
DI$EVF                   00000000   RESERV               00000028
DI$ION                   0000001B   RESTRT               0000003C
DI$ISV                   00000005   S60                  000039DF
DI$LNK                   00000016   SAV$                 0000002A
DI$OWN                   00000002   SPACE                00000020
DI$PTR                   00000012   STX                  00000002
DI$QUE                   0000000E   SUSPEN               0000000C
DI$RSO                   0000001A   TCR                  00000020
DI$SIZ                   00000020   TIVR                 00000022
DI$STA                   0000001C   TK$CON               00000012
DI$USR                   0000001E   TK$ENT               00000004
DIRENT$                  00000026   TK$ID                00000000
EEPROM                   00000007   TK$NXT               0000001A
EOT                      00000004   TK$RSO               0000001E
EOS       MACR  *                   TK$SIZ               00000022
ETX                      00000003   TK$SSP               00000008
EX$DV0                   0000000A   TK$STF               0000000C
EX$DV1                   0000000E   TK$STM               0000000E
EX$DV2                   00000012   TK$TIM               00000010
EX$DV3                   00000016   TSKEND               00000038
EX$DV4                   0000001A   TSKINI               00000010
EX$DV5                   0000001E   TSR                  00000034
EX$DV6                   00000022   T_PB       XREF   5  00000000
EX$DV7                   00000026   WAIT                 0000001C
EX$NXT                   00000006   WAITCN               00000020
EX$SIZ                   0000002A   WAITLP               00000024
EX$TIM                   00000000   WAKEUP               00000018
EX$TSK                   00000002   XSVC       MACR  *
EXEC                     00000000

            OFFLOD   IDNT    0,3              RTI Auxiliary line monitor task  3/09/83
                     OPT     PCS,BRS
            *
            *
            * SUBROUTINE:    OFFLOD
            *
            * REVISED:       3/09/83
            *
            * AUTHOR:        D. A. ZEICHNER
            *
            * PURPOSE:       Monitor the programming I/O port, and switch to the
            *                function requested.
            *
            * INPUTS:        None.
            *
            * OUTPUTS:       None.
            *
            * EXTERNAL REFERENCES/DEFINITIONS:
            *
                     XDEF    OFFLOD
                     XDEF    ACKMSG
                     XDEF    NAKMSG
            *
```

```
                       * RAM REFERENCES:
                       *
                               XREF.S   5:AUXIO$
                       *
                       * EPROM (PSCT) REFERENCES:
                       *
                               XREF.S   9:DEQUE
                               XREF.S   9:DNLOAD
                               XREF.S   9:QUEINI
                               XREF.S   9:RCVCHR
                               XREF.S   9:UPLOAD
                               XREF.S   9:XMTMSG
                       *
                       * LOCAL ASSIGNMENTS:
                       *
            00000003   ID      EQU      3                   TABLE ID.
            00000000   BCT     EQU      0                   Message byte count
                       *
                        *
            00000009            SECTION PROM
                        *
9 00000000 42A7        OFFLOD  CLR.L    -(A7)               Message work space
                        *
9 00000002 41FA008E    OFFBEGN LEA      ACKMSG(PC),A0
9 00000006 4EBAFFF8            JSR      XMTMSG(PC)          Xmit ACK msg to show we're ok
                        *
9           0000000A   OFFLUP  EQU      *                   OFFLOD task loop
9 0000000A 303C0B00            MOVE     #F$FDI,D0
9 0000000E 4241                CLR      D1
9 00000010                     XSVC     SUSPEN              Wait until character is received
                        *
9 00000014 41FAFFEA            LEA      AUXIO$(PC),A0
9 00000018 4EBAFFE6            JSR      DEQUE(PC)           Get character from input queue
9 0000001C 0C000002            CMP.B    #STX,D0             Was it an STX?
9 00000020 6658                BNE      OFFERR              No - give NAK msg & wait for next msg
9 00000022 4EBAFFDC            JSR      RCVCHR(PC)          Wait for character
9 00000026 6552                BCS      OFFERR              Timeout - send NAK & start over
                        *
9 00000028 0C000044            CMP.B    #'D',D0             Is incoming character 'D'?
9 0000002C 6608                BNE      OFF1
9 0000002E 4EBAFFD0            JSR      DNLOAD(PC)          Yes - download following table
9 00000032 6546                BCS      OFFERR              Error in download - send NAK msg
9 00000034 60CC                BRA      OFFBEGN             Send ACK & wait for next msg
                        *
9 00000036 0C000030    OFF1    CMP.B    #'0',D0             Is incoming character 0 - 3?
9 0000003A 6D36                BLT      OFF2
9 0000003C 0C000033            CMP.B    #'3',D0
9 00000040 6E30                BGT      OFF2
                        *                               Validate message
9 00000042 3F400003            MOVE     D0,ID(A7)           Save table ID.
9 00000046 4EBAFFB8            JSR      RCVCHR(PC)          Get byte count (msb)
9 0000004A 652E                BCS      OFFERR
9 0000004C 1E80                MOVE.B   D0,BCT(A7)
9 0000004E 4EBAFFB0            JSR      RCVCHR(PC)
9 00000052 6526                BCS      OFFERR
9 00000054 1F400001            MOVE.B   D0,BCT+1(A7)
9 00000058 5357                SUB      #1,BCT(A7)
9 0000005A 6B1E                BMI      OFFERR              Byte count does not match up
                        *
9 0000005C 4EBAFFA2    RCVLUP  JSR      RCVCHR(PC)
9 00000060 6518                BCS      OFFERR
9 00000062 5357                SUB      #1,BCT(A7)
9 00000064 6AF6                BPL      RCVLUP
9 00000066 0C000003            CMP.B    #ETX,D0             End of message ?
9 0000006A 660E                BNE      OFFERR
                        *
9 0000006C 4EBAFF92            JSR      UPLOAD(PC)          Yes - upload selected table,
9 00000070 6098                BRA      OFFLUP              Wait for next msg
                        *
9 00000072 0C000052    OFF2    CMP.B    #'R',D0             Is incoming character 'R'?
9 00000076 6602                BNE      OFFERR              No - send NAK & start over
```

```
                         *
                         * We have a request for a restart here.
                         * What we would like to do is a RESET,
                         * Reinitialize the PC & SSP as per power up.
                         * & jump back to init. To do this, we need
                         * a special trap to get us into the supervisor
                         * state.  TRAP #14 will restart the system.
                         *
9 00000078 4E4E                   TRAP    #14          Set trap 14 to point to following code
                         *
9 0000007A 41FAFF84      OFFERR   LEA     AUXIO#(PC),A0
9 0000007E 303C0038               MOVE    #.AIOSIZ,D0
9 00000082 4EBAFF7C               JSR     QUEINI(PC)   Reinitialize (clear) input queue
                         *
9 00000086 41FA0010               LEA     NAKMSG(PC),A0
9 0000008A 4EBAFF74               JSR     XMTMSG(PC)   Send NAK msg
9 0000008E 6000FF7A               BRA     OFFLUP       & start over
                         *
                         *
                         * MESSAGES:
                         *
9 00000092 050221000103 ACKMSG    DC.B    5,STX,'!',0,1,ETX
                         *
9 00000098 05023F000103 NAKMSG    DC.B    5,STX,'?',0,1,ETX
                         *
                         *
                                  END

****** TOTAL ERRORS      0--
****** TOTAL WARNINGS    0--
```

SYMBOL TABLE LISTING

| SYMBOL NAME | SECT | | VALUE | SYMBOL NAME | | SECT | VALUE |
|---|---|---|---|---|---|---|---|
| .1SEC | | | 0000000A | F#KYBD | | | 00000100 |
| .AIOSIZ | | | 00000038 | F#MON | | | 00000080 |
| .AOOSIZ | | | 00000038 | F#OST | | | 00001000 |
| .COSINE | | | 00000014 | F#PDI | | | 00000800 |
| .DIOSIZ | | | 0000001C | F#PROC | | | 00002000 |
| .EFFECT | | | 0000001C | F#XMIT | | | 00000200 |
| .HIGSIZ | | | 000000C8 | FF | | | 0000000C |
| .HOOSIZ | | | 00000180 | HT | | | 00000009 |
| .ICOS | | | 0000000A | ID | | | 00000003 |
| .IEFF | | | 00000018 | IFTENT# | | | 00000014 |
| .ISCALE | | | 00000006 | MAXAGE | | | 00000004 |
| .ISIN | | | 0000000E | NAKMSG | XDEF | 9 | 00000098 |
| .KWH | | | 00000024 | NEXTSK | | | 00000030 |
| .PIOSIZ | | | 0000003F | OFF1 | | 9 | 00000036 |
| .RBFSIZ | | | 00000400 | OFF2 | | 9 | 00000072 |
| .SAMPLE | | | 00000002 | OFFBEGN | | 9 | 00000002 |
| .SCALE1 | | | 00000004 | OFFERR | | 9 | 0000007A |
| .SCALE2 | | | 00000008 | OFFLOD | XDEF | 9 | 00000000 |
| .SCALE3 | | | 0000000C | OFFLUP | | 9 | 0000000A |
| .SCALE4 | | | 00000010 | ONESEC | | | 00030090 |
| .SINE | | | 00000018 | ONETIK | | | 000009C4 |
| .SPMJP | MACR | * | | OPTENT# | | | 00000004 |
| .STEMP | | | 0000001C | PAAR | | | 00000014 |
| .TEMP | | | 00000012 | PACR | | | 0000000C |
| .TOFSET | | | 0000000E | PADDR | | | 00000004 |
| .TSCALE | | | 0000000A | PADR | | | 00000010 |
| .VCOS | | | 00000002 | PBAR | | | 00000016 |
| .VEFF | | | 00000014 | PBCR | | | 0000000E |
| .VSCALE | | | 00000002 | PBDDR | | | 00000006 |
| .VSIN | | | 00000006 | PBDR | | | 00000012 |
| .WATTS | | | 00000020 | PCDDR | | | 0000000E |
| .WATTSEC | | | 00000022 | PCDR | | | 00000018 |
| ACKMSG | XDEF | 9 | 00000092 | PGCR | | | 0000000C |
| AISENT# | | | 00000026 | PIVR | | | 0000000A |
| AUXIO# | XREF | 5 | 00000000 | PROM | | | 00000009 |
| BCT | | | 00000000 | PSR | | | 0000001A |

```
CHGENT           00000034   FSRR              00000002
CNTF             0000002E   FULL    MACR  *
CFF              00000024   PUSH    MACR  *
CR               0000000D   QUEINI  XREF  9   00000000
CTRL13           00000000   RAM               00000005
CTRL2            00000002   RCVCHR  XREF  9   00000000
DEQUE   XREF  9  00000000   RCVLUF        9   0000005C
DEVINI           00000014   RDTALL            00000008
DI$DEV           0000000A   READY             00000004
DI$EVF           00000000   RELEAS            0000002C
DI$IOW           0000001B   RESERV            0000002B
DI$ISV           00000006   RESTAT            0000003C
DI$LIM           00000016   SAC               0000002F
DI$OWN           00000002   SAVE              0000002A
DI$RSO           0000001A   SUSPEN            0000000C
DI$SIZ           00000020   TCR               00000020
DI$STA           0000001C   TIMR1             00000004
DI$USR           0000001E   TIMR2             00000008
DIBENT$          00000026   TIMR3             0000000C
DNLOAD  XREF  9  00000000   TIVR              00000022
DSFTENT$         00000010   TK$CON            00000012
EEPROM           00000007   TK$ENT            00000004
EOT              00000004   TK$ID             00000000
EOS     MACR  *             TK$LPT            00000016
ETX              00000003   TK$NXT            0000001A
EX$DV0           0000000A   TK$RSO            0000001E
EX$DV1           0000000E   TK$SIZ            00000022
EX$DV2           00000012   TK$SSP            00000008
EX$DV3           00000016   TK$STF            0000000C
EX$DV4           0000001A   TK$STM            0000000E
EX$DV5           0000001E   TK$TIM            00000010
EX$DV6           00000022   TSKEND            00000038
EX$DV7           00000026   TSKINI            00000010
EX$NXT           00000006   TSR               00000034
EX$SIZ           0000002A   UPLOAD  XREF  9   00000000
EX$TIM           00000008   WAIT              0000001C
EX$TSK           00000002   WAITCN            00000020
EXEC             00000000   WAITLP            00000024
F$ASNPL          00004000   WAKEUP            00000018
F$DNUT           00000400   XMTMSG  XREF  9   00000000
F$EEPM           00000040   XSVC    MACR  *
```

```
OUTPUT   IDNT    0,11                         Output value calculation task  3/10/83
         OPT     PCS,BRS
*
*
* SUBROUTINE:    OUTPUT
*
* REVISED:       3/10/83
*
* AUTHOR:        D. A. ZEICHNER
*
* PURPOSE:       TASK TO CALCULATE OUTPUT VALUES AS DICTATED BY THE
*                OUTPUT PERSONALITY TABLE.
*
* INPUTS:        N/A
*
* OUTPUTS:       N/A
*
* OUTPUT RESERVES 2 BYTES OF STACK SPACE FOR LOCAL DATA.
*
* EXTERNAL REFERENCES/DEFINITIONS:
*
         XDEF     OUTPUT
*
* HARDWARE REFERENCES:
*
         XREF     HOSTACIA
*
* RAM REFERENCES:
*
```

```
                               XREF.S   5:AIB$
                               XREF.S   5:CSM$
                               XREF.S   5:DIB$
                               XREF.S   5:HOSTRAK
                               XREF.S   5:HSTOO$
                               XREF.S   5:T_ANALOG
                               XREF.S   5:T_OUTPUT
                      *
                      * EEPROM REFERENCES:
                      *
                               XREF     OPT$
                      *
                      * PROM REFERENCES:
                      *
                               XREF.S   9:BUFFDY
                               XREF.S   9:ENQUE
                               XREF.S   9:OUTVAL
                      *
                      * LOCAL ASSIGNMENTS:
                      *
            00000000  OUTPTR   EQU      0                    STACK OFFSET TO OPT POINTER
            00000100  OPTEND   EQU      256                  OFFSET TO END OF OUTPUT PERSONALITY TABLE
                      *
                      *
            00000009           SECTION  PROM
                      *
9 00000000 487900000000 OUTPUT PEA      OPT$
9 00000006 4DFAFFF8            LEA      T_OUTPUT(PC),A6      GET TASK FRAME
9 0000000A 307C00630010        MOVE     #99,TK$TIM(A6)       SET TASK TIMER TO 1 SEC. (-1 TICK)
                      *
9 00000010 2057       OUTLUP   MOVE.L   OUTPTR(A7),A0        GET OPT POINTER
9 00000012 3010                MOVE     (A0),D0              GET OPT ENTRY
9 00000014 EC48                LSR      #6,D0                ISOLATE VOLTAGE INPUT #
9 00000016 0240003F            AND      #$3F,D0
9 0000001A 0C40003F            CMP      #$3F,D0              IS THIS ENTRY VALID?
9 0000001E 673C                BEQ      NXTENT               NO - SKIP IT
                      *
9 00000020 4EBAFFDE            JSR      BUFFDY(PC)           ARE APPROPRIATE BUFFERS READY?
9 00000024 6406                BCC      BUFOK                YES - GO CALCULATE OUTPUT VALUE
9 00000026                     XSVC     EXEC                 NO - LET SOMEONE ELSE RUN
9 0000002A 60E4                BRA      OUTLUP
                      *
9 0000002C 4EBAFFD2   BUFOK    JSR      OUTVAL(PC)
                      *
9 00000030 41FAFFCE            LEA      HSTOO$(PC),A0        GET ADDRESS OF OUTPUT QUEUE
                      *
9 00000034 610000EA            BSR.L    QBYTE                PUT 1ST BYTE ON QUEUE
9 00000038 3001                MOVE     D1,D0
9 0000003A 610000E4            BSR.L    QBYTE                PUT 2ND BYTE ON QUEUE
9 0000003E 3002                MOVE     D2,D0
9 00000040 610000DE            BSR.L    QBYTE                PUT LAST BYTE ON QUEUE
                      *
                      * SEE IF THIS ENTRY INVOLVED DONUTS. IF SO, BUMP THEIR AGES,
                      * AND IF ANY IS TOO OLD, CLEAR ITS DATA TO ZERO.
                      *
9 00000044 2057                MOVE.L   OUTPTR(A7),A0        GET OPT POINTER
9 00000046 08100004            BTST     #4,(A0)              DONUT BIT SET?
9 0000004A 6710                BEQ      NXTENT               NO - GO TO NEXT
                      *
                      * WE'VE GOT DONUTS. GET DONUT ID FROM OPT ENTRY, CALCULATE
                      * ADDRESS OF BUFFER & CHECK ITS AGE. DO THE SAME FOR THE
                      * TWO BUFFERS IMMEDIATELY FOLLOWING, ALSO.
                      *
9 0000004C 3010                MOVE     (A0),D0              GET DONUT ID
9 0000004E EC40                ASR      #6,D0                RIGHT JUSTIFY
9 00000050 0240000F            AND      #$F,D0               MASK OUT SPURIOUS BITS
9 00000054 C0FC0024            MULU     #DIBENT$,D0          CALCULATE OFFSET TO 1ST BUFFER OF TRIAD
9 00000058 45FAFFA6            LEA      DIB$(PC),A2          POINT TO DONUT BUFFERS
                      *
9 0000005C 5897       NXTENT   ADDQ.L   #4,OUTPTR(A7)        BUMP POINTER TO NEXT ENTRY
9 0000005E 0C9700000100        CMP.L    #OPT$+OPTEND,OUTPTR(A7) END OF TABLE?
```

```
9 00000064 60AA               BLT     OUTLUP              NO - DO NEXT ENTRY
                       *
                       * All entries done. Set our startup mask (TK$STM) to $8000,
                       * clear out the state flags (TK$STF), and call EXEC. This
                       * will suspend us until our clock times out.  Calling SUSPEN
                       * would alter the value of the clock, and we're interested in
                       * waiting for the remaining time left on the clock.
                       *
9 00000066 307C8000000E       MOVE    #$8000,TK$STM(A6)   STARTUP ON TIMEOUT ONLY
9 0000006C 426E000C           CLR     TK$STF(A6)          MAKE SURE WE'RE SUSPENDED
9 00000070 526E0010           ADDQ    #1,TK$TIM(A6)       & WE HAVE AT LEAST 1 TICK TO WAIT
9 00000074                    XSVC    EXEC
                       *
                       * The one second tick has arrived. Reset our task clock to one
                       * second, start up the transmitter, reset the AC & VP flags for
                       * all buffers, wait for the transmitter buffer to be empty, and
                       * start at the top of the Output Personality Table again.
                       *
9 00000078 307C00630010       MOVE    #59,TK$TIM(A6)      RESET TIMEOUT CLOCK TO 1 SEC. (-1 TICK)
9 0000007E 41FAFF80           LEA     HOSTRAK(PC),A0      GET POINTER TO TRACKING REGISTER
9 00000082 00100020           OR.B    #$20,(A0)           TURN ON XMIT IRP
9 00000086 130000000000       MOVE.B  (A0),HOSTACIA
                       *
                       * CLEAR AC & VP FLAGS IN DONUT BUFFERS 1 - 15 AND ALL ANALOG BUFFERS.
                       * ALSO BUMP AGES OF THESE DONUT BUFFERS, AND ZERO OUT ANY TOO OLD.
                       *
                       * NOTE: BUFFERS WHOSE DATA AREAS ARE ZEROED OUT HAVE THEIR AGES SET
                       *       TO $F. THIS ALLOWS US TO TEST FOR UNUSED DONUT BUFFERS. IF
                       *       A BUFFER HAS ITS AGE = $1F, NO ONE HAS ACCESSED IT SINCE
                       *       THE LAST TIME IT WAS ZEROED OUT. IN THIS CASE, THERE IS NO
                       *       POINT IN BUMPING ITS AGE & HAVING TO ZERO IT OUT AGAIN
                       *       SOMEDAY. (WE'LL HOLD OFF THE AGING PROCESS UNTIL THE DONUT
                       *       TASK RECEIVES SOME STUFF FOR IT & SETS THE AGE TO ZERO)
                       *
                       * WARNING: THE ABOVE MEANS THAT MAXAGE MAY NOT EXCEED $1E!!!!!
                       *
9 0000008C 41FAFF72           LEA     DIB$(PC),A0         POINT TO DIGITAL INPUT BUFFERS
                       *
                              FOR     D0 = #DIBENT$ TO #DIBENT$*15 BY #DIBENT$ DO
9 00000096             Z_L1.001
9 00000096 32300000            MOVE    (A0,D0),D1
9 0000009A 0241001F            AND     #$1F,D1            ISOLATE BUFFER AGE
9 0000009E 0C41001F            CMP     #$1F,D1            UNUSED BUFFER?
9 000000A2 6722                BEQ     NXTBUF             YES - DON'T BOTHER WITH AGE
                       *
                               IF      D1 <GE> #MAXAGE THEN BUFFER IS TOO OLD - ZERO OUT DATA
9 000000AA 43F00002              LEA     2(A0,D0),A1      CALC START ADR OF DATA
9 000000AE 343C0021              MOVE    #33,D2           # OF BYTES TO CLEAR (-1)
                       *
9 000000B2 42312000    CLRLUP    CLR.B   (A1,D2)
9 000000B6 51CAFFFA              DBRA    D2,CLRLUP
9 000000BA 0030001F0001          OR.B    #$1F,1(A0,D0)    SET AGE TO $1F (MARK AS UNUSED)
                               ELSE                       JUST BUMP BUFFER AGE
9 000000C2             Z_L1.002
9 000000C2 52700000              ADDQ    #1,(A0,D0)
                               ENDI
9 000000C6             Z_L2.004
                       *
9 000000C6 02709FFF0000 NXTBUF AND     #$9FFF,(A0,D0)     RESET AC & VP FLAGS
                              ENDF
                       *
9 000000D6 41FAFF28           LEA     AIB$(PC),A0         POINT TO ANALOG INPUT BUFFERS
                              FOR     D0 = #0 TO #AIBENT$*47 BY #AIBENT$ DO
9 000000E0             Z_L1.006
9 000000E0 02709FFF0000        AND     #$9FFF,(A0,D0)     RESET AC & VP FLAGS
                              ENDF
                       *
9 000000F0 2EBC00000000       MOVE.L  #OPT$,OUTPTR(A7)    RESET OUTPUT PERSONALITY TABLE PTR
                       *
                       * Make all Analog buffers free by clearing the cluster status map.
                       * This will reactivate the contining collection of raw input data.
                       *
```

```
9 000000F6 41FAFF08          LEA     CSM$(PC),A0          POINT TO CLUSTER STATUS MASK
9 000000FA 42A8001E          CLR.L   30(A0)               CLEAROUT THE FIRST 2 WORDS
9 000000FE 42680022          CLR     34(A0)               &      THE LAST WORD OF THE MAP
                      *
9 00000102 41FAFEFC          LEA     T_ANALOG(PC),A0      TALK TO ANAOLG
9 00000106 303C1000          MOVE    #F$OST,D0            OK TO GET MORE DATA
9 0000010A                   XSVC    READY
                      *
                      * Wait until the output queue has been emptied before continuing.
                      *
                      * Can't call SUSPEN because it would wreck the task timer.
                      * Just set up the startup mask, clear the state flags, &
                      * call EXEC.
                      *
9 0000010E 3D7C8200000E      MOVE    #$8000+F$XMIT,TK$STm(A6)
9 00000114 426E000C          CLR     TK$STF(A6)
9 00000118                   XSVC    EXEC
9 0000011C 6000FEF2          BRA     OUTLUP               & DO IT AGAIN
                      *
                      *
                      * SUBROUTINES:
                      *
                      * OBYTE - PUT A BYTE ON THE QUEUE & LET SOMEONE ELSE
                      *         RUN IF QUEUE IS FULL.
                      *
9 00000120 4EBAFEDE   OBYTE  JSR     ENQUE(PC)            QUEUE THE BYTE
9 00000124 640E              BCC     OXIT                 NO PROBLEM - QUIT NOW
9 00000126                   PUSH    D0-D2/A0             SAVE REGISTERS
9 0000012A                   XSVC    EXEC                 & LET SOMEONE ELSE RUN
9 0000012E                   PULL    D0-D2/A0
9 00000132 60EC              BRA     OBYTE                TRY AGAIN
                      *
9 00000134 4E75       OXIT   RTS
                      *
                      *
                             END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$PDI | | 00000800 |
| .AIOSIZ | | 00000038 | F$PROC | | 00002000 |
| .AOOSIZ | | 00000038 | F$XMIT | | 00000200 |
| .COSINE | | 00000014 | FF | | 0000000C |
| .DIQSIZ | | 0000001C | HOSTACIA | XREF * | 00000000 |
| .EFFECT | | 0000001C | HOSTRAK | XREF 5 | 00000000 |
| .HIQSIZ | | 000000C8 | HSTOO$ | XREF 5 | 00000000 |
| .HOOSIZ | | 00000180 | HT | | 00000009 |
| .ICOS | | 0000000A | IPTENT$ | | 00000014 |
| .IEFF | | 00000018 | MAXAGE | | 00000004 |
| .ISCALE | | 00000006 | NEXTSK | | 00000030 |
| .ISIN | | 0000000E | NXTBUF | 9 | 000000C6 |
| .KWH | | 00000024 | NXTENT | 9 | 0000005C |
| .PIOSIZ | | 0000003F | ONESEC | | 00030090 |
| .REFSIZ | | 00000400 | ONETIK | | 000009C4 |
| .SAMPLE | | 00000002 | OPT$ | XREF * | 00000000 |
| .SCALE1 | | 00000004 | OPTENP | | 00000100 |
| .SCALE2 | | 00000008 | OPTENT$ | | 00000004 |
| .SCALE3 | | 0000000C | OUTLUP | 9 | 00000010 |
| .SCALE4 | | 00000010 | OUTPTR | | 00000000 |
| .SINE | | 00000018 | OUTPUT | XDEF 9 | 00000000 |
| .SPNJP | MACR * | | OUTVAL | XREF 9 | 00000000 |
| .STEMP | | 0000001C | PAAR | | 00000014 |
| .TEMP | | 00000012 | PACR | | 0000000C |
| .TOFSET | | 0000000E | PADDR | | 00000004 |
| .TSCALE | | 0000000A | PADR | | 00000010 |
| .VCOS | | 00000002 | PBAR | | 00000016 |

```
.VEFF                  00000014   PECR                     0000000E
.VSCALE                00000002   PEDDR                    00000006
.VSIN                  00000006   PEDR                     00000012
.WATTS                 00000020   PCDDR                    00000008
.WATTSEC               00000022   PCDR                     00000018
AIB$      XREF    5    00000000   PGCR                     00000000
AIBENT$                00000026   PIVR                     0000000A
BUFOK             9    0000002C   PROM                     00000009
BUFRDY    XREF    9    00000000   PSR                      0000001A
CHGENT                 00000034   PSRR                     00000002
CLFLUP            9    00000082   PULL       MACR    *
CNTR                   0000002E   PUSH       MACR    *
CPR                    00000024   QBYTE              9     00000120
CR                     00000000   QBIT               9     00000134
CSH$      XREF    5    00000000   RAM                      00000005
CTRL13                 00000000   RDYALL                   00000008
CTRL2                  00000002   READY                    00000004
DEVINI                 00000014   RELEAS                   0000002C
DI$DEV                 0000000A   RESERV                   00000028
DI$EVF                 00000000   RESTRT                   0000003C
DI$IOM                 00000018   S60                      000039DF
DI$ISV                 00000006   SAV$                     0000002A
DI$LNK                 00000016   SPACE                    00000020
DI$OWN                 00000002   STX                      00000002
DI$QUE                 0000000E   TCR                      00000020
DI$RSO                 0000001A   TIMR1                    00000004
DI$SIZ                 00000020   TIMR2                    00000008
DI$STA                 0000001C   TIMR3                    0000000C
DI$USR                 0000001E   TIVP                     00000022
DIB$      XREF    5    00000000   TK$CON                   00000012
DIBENT$                00000026   TK$ENT                   00000004
DSFTENT$               00000010   TK$ID                    00000000
EEPROM                 00000007   TK$LPT                   00000016
ENQUE     XREF    9    00000000   TK$NXT                   0000001A
EOT                    00000004   TK$RSO                   0000001E
EQS       MACR    *               TK$SIZ                   00000022
ETX                    00000003   TK$SSP                   00000008
EX$DV0                 0000000A   TK$STF                   0000000C
EX$DV1                 0000000E   TK$STM                   0000000E
EX$DV2                 00000012   TK$TIM                   00000010
EX$DV3                 00000016   TSKEND                   00000038
EX$DV4                 0000001A   TSKINI                   00000010
EX$DV5                 0000001E   TSR                      00000034
EX$DV6                 00000022   T_ANALOG   XREF    5     00000000
EX$DV7                 00000026   T_OUTPUT   XREF    5     00000000
EX$NXT                 00000006   WAIT                     0000001C
EX$SIZ                 0000002A   WAITCN                   00000020
EX$TIM                 00000000   WAITLP                   00000024
EX$TSK                 00000002   WAKEUP                   00000018
EXEC                   00000000   XSVC       MACR    *
F$ASMPL                00004000   Z_L1.001           9     00000096
F$DMUT                 00000400   Z_L1.002           9     000000C2
F$EEPM                 00000040   Z_L1.006           9     000000E0
F$KYBD                 00000100   Z_L2.000           9     000000D0
F$MON                  00000080   Z_L2.004           9     000000C6
F$OST                  00001000   Z_L2.005           9     000000EA
```

```
        OUTVAL   IDNT    0,0                  CALCULATE OUTPUT POINT    1/18/83
                 OPT     PCS,BRS
*
* SUBROUTINE:    OUTVAL
*
* REVISED:       1/18/83
*
* AUTHOR:        D. A. ZEICHNER
*
* PURPOSE:       CALCULATE THE VALUE SPECIFIED BY THE GIVEN OUTPUT PERSONALITY
*                TABLE (OPT) ENTRY, AND FORMAT IT FOR TRANSMISSION TO THE RTU.
*
* INPUTS:        A0 - POINTER TO OPT ENTRY
*
```

```
                              * OUTPUTS:      D0 - 1ST BYTE OF FORMATTED OUTPUT
                              *               D1 - 2ND BYTE OF FORMATTED OUTPUT
                              *               D2 - 3RD BYTE OF FORMATTED OUTPUT
                              *               ALL OTHER REGISTERS PRESERVED
                              *
                              * EXTERNAL REFERENCES/DEFINITIONS:
                              *
                                      XDEF    OUTVAL
                              *
                              * RAM REFERENCES:
                              *
                                      XREF.S  5:AIB$
                                      XREF.S  5:DIB$
                              *
                              * EPROM (PROGRAM) REFERENCES:
                              *
                                      XREF.S  9:FFPDIV
                                      XREF.S  9:FFPIFP
                                      XREF.S  9:FFPMUL
                                      XREF.S  9:FFPSUB
                                      XREF.S  9:FORMAT
                                      XREF.S  9:PWRCAL
                                      XREF.S  9:ROUND
                                      XREF.S  9:TIMRD
                              *
                              * LOCAL ASSIGNMENTS:
                              *
              D9030054        K888880 EQU     $D9030054         CONSTANT = 888880
              CCB3334A        K818.8  EQU     $CCB3334A         CONSTANT = 818.8
              F0000046        K60     EQU     $F0000046         CONSTANT = 60
                              *
              00000400        WATICK  EQU     $400              # OF WATT SECONDS/KWH
                              *
              00000000        TYPE    EQU     0                 STACK OFFSET TO OUTPUT TYPE
              00000002        INUM    EQU     2                 STACK OFFSET TO INPUT NUMBER
                              *
                              *
              00000009                SECTION PROM
                              *
 9 00000000                   OUTVAL  PUSH    D0/D3-D7/A1       SAVE REGISTERS (D0 FOR LOCAL WORK SPACE)
                              *
                              * SET A1 TO POINT TO ANALOG OR DIGITAL INPUT BUFFERS
                              * ACCORDING TO THE STATE OF THE D BIT IN THE SPECIFIED
                              * OUTPUT PERSONALITY TABLE ENTRY.
                              *
 9 00000004 08100004                  BTST    #4,(A0)           ANALOG OR DIGITAL INPUT?
                              *
                                      IF      <EQ> THEN
 9 0000000A 227C00000000                MOVE.L  #AIB$,A1        ANALOG - POINT TO ANALOG INPUT BUFFERS
                                      ELSE
 9 00000012                   Z_L1.000
 9 00000012 227C00000000                MOVE.L  #DIB$,A1        DIGITAL - POINT TO DIGITAL INPUT BUFFERS
                                      ENDI
 9 00000018                   Z_L2.002
                              *
 9 00000018 3010                      MOVE    (A0),D0           GET OPT ENTRY
 9 0000001A EC48                      LSR     #6,D0             RIGHT JUSTIFY INPUT NUMBER
 9 0000001C 3F400002                  MOVE    D0,INUM(SP)       & SAVE IN STACK
 9 00000020 026F003F0002              AND     #$3F,INUM(SP)     ISOLATE INPUT NUMBER
 9 00000026 EE48                      LSR     #7,D0             JUSTIFY OUTPUT TYPE (ALREADY ISOLATED)
 9 00000028 3E80                      MOVE    D0,TYPE(SP)       & SAVE IN STACK
                              *
 9 0000002A 0C400003                  CMP     #3,D0             IS OUTPUT TYPE FREQUENCY?
 9 0000002E 67000090                  BEQ.L   FREQDEV           YES - GO READ TIMER & CALC FREQ DEVIATION
 9 00000032 6E20                      BGT     POWER             OUTPUT TYPE IS POWER OF SOME SORT.
                              *
                              * OUTPUT VALUE IS VOLTAGE, CURRENT, OR TEMP.
                              * RETRIEVE VALUE FROM APPROPRIATE BUFFER, &
                              * FINISH UP.
                              *
                              * THE BUFFER OFFSET CALCULATION IS THE SAME FOR EITHER BUFFER TYPE.
                              *
```

```
9 00000034 322F0002          MOVE    INUM(SP),D1           GET INPUT #
9 00000038 C2FC0026          MULU    #AIBENT$,D1           CALCULATE OFFSET TO BUFFER
9 0000003C 08100004          BTST    #4,(A0)               IS THIS OUTPUT DONUT DERIVED?
                      *
                             IF      <NE> THEN             GET RESULT FROM DONUT BUFFER
9 00000042 E540                ASL     #2,D0               CALC OFST TO VOLTAGE/CURRENT/TEMP
9 00000044 D041                ADD     D1,D0               .VEFF(A1,D0) NOW POINTS TO DESIRED VALUE
9 00000046 20310014            MOVE.L  .VEFF(A1,D0),D0     RETRIEVE VALUE
                      *
                             ELSE                          GET RESULT FROM ANALOG BUFFER
9 0000004C            Z_L1.003
9 0000004C 2031101C            MOVE.L  .EFFECT(A1,D1),D0   RETRIEVE VALUE
                             ENDI
9 00000050            Z_L2.005
9 00000050 600000A0          BRA.L   FINISH                FORMAT VALUE & RETURN
                      *
                      * OUTPUT TYPE IS SOME SORT OF POWER. IF WATTS, WATT SECONDS, & KWH
                      * HAVE NOT BEEN UPDATED, DO THEM NOW.
                      *
9 00000054 3210       POWER  MOVE    (A0),D1               GET CURRENT INPUT #1
9 00000056 0241003F          AND     #$3F,D1               & ISOLATE IT
                      *
                      * SEE IF REQUESTED VALUE WAS KWH OR WATTS.
                      *
                      KWHOK  IF      TYPE(SP) <EQ> #4 THEN WATTS WAS REQUESTED
9 00000096 3E290020            MOVE    .WATTS(A1),D7
9 0000009A 48C7                EXT.L   D7                  SIGN EXTEND ARGUMENT TO 32 BITS
9 0000009C 4EBAFF62            JSR     FFPIFP(PC)          CONVERT TO FLOATING POINT FOR FORMAT
9 000000A0 2007                MOVE.L  D7,D0               PUT VALUE INTO D0 FOR FORMAT
9 000000A2 604E                BRA     FINISH              & FINISH UP
                             ENDI
9 000000A4            Z_L1.006
                      *
                             IF      TYPE(SP) <EQ> #7 THEN KWH WAS REQUESTED
9 000000AA 3E290024            MOVE    .KWH(A1),D7         GET KWH
9 000000AE 48C7                EXT.L   D7                  EXTEND TO 32 BITS
9 000000B0 4EBAFF4E            JSR     FFPIFP(PC)
9 000000B4 2007                MOVE.L  D7,D0
9 000000B6 603A                BRA     FINISH
                             ENDI
9 000000B8            Z_L1.009
                      *
                      * REQUESTED OUTPUT WAS NOT WATTS OR KWH.
                      * GO CALCULATE REQUESTED VALUE.
                      *
9 000000B8 3017              MOVE    TYPE(SP),D0           GET OUTPUT TYPE
9 000000BA 4EBAFF44          JSR     PWRCAL(PC)
9 000000BE 6032              BRA     FINISH                & FINISH UP
                      *
                      * READ APPROPRIATE TIMER, & CALCULATE FREQUENCY
                      * DEVIATION.
9 0000005A C2FC0026          MULU    #AIBENT$,D1           CALC. OFFSET TO BUFFER
                      *
9 0000005E 43F11000          LEA     (A1,D1),A1            GET POINTER TO DESIRED BUFFER
9 00000062 08110005          BTST    #5,(A1)               WATTS & KWH CALCULATED YET?
9 00000066 6628              BNE     KWHOK                 YES - SKIP CALCULATION
                      *
9 00000068 7004              MOVEQ   #4,D0                 CALCULATE WATTS
9 0000006A 4EBAFF94          JSR     PWRCAL(PC)
9 0000006E 2E00              MOVE.L  D0,D7
9 00000070 4EBAFF8E          JSR     ROUND(PC)             ROUND & CONVERT RESULT TO INTEGER
                      *
                      * SINCE THE OFFSETS TO WATTS, WATT-SEC, & KWH ARE THE SAME FOR
                      * BOTH ANALOG AND DIGITAL INPUT BUFFERS, WE DON'T NEED TO TEST
                      * FOR BUFFER TYPE HERE.
                      *
9 00000074 33470020          MOVE    D7,.WATTS(A1)         UPDATE WATTS
9 00000078 DE690022          ADD     .WATTSEC(A1),D7       ACCUMULATE WATT SECONDS THIS TICK
                      *
                      * DIVIDE ACCUMULATED WATT SECONDS BY # OF WATT SECONDS / KWH. THE
                      * REMAINDER IS THE NEW VALUE OF .WATTSEC, AND THE INTEGER PART IS
```

```
                              * ADDED TO ACCUMULATED KILOWATT HOURS.
                              *
9 0000007C 48C7                      EXT.L    D7              SIGN EXTEND TO 32 BITS
9 0000007E 8FFC0400                  DIVS     #WATICK,D7      DIVIDE BY # OF WATTSEC/KWH
9 00000082 DF690024                  ADD      D7,.KWH(A1)     ADD QUOTIENT TO OLD KWH VALUE
9 00000086 4847                      SWAP     D7              GET REMAINDER (NEW WATT SECONDS VALUE)
9 00000088 33470022                  MOVE     D7,.WATTSEC(A1) UPDATE WATT SECONDS
9 0000008C 08D10005                  BSET     #5,(A1)         SET UP FLAG IN BUFFER
                              *
9 000000C0 302F0002           FREQDEV MOVE    INUM(SP),D0     GET TIMER (CLUSTER) NUMBER
9 000000C4 4EBAFF3A                  JSR      TIMRD(PC)       DESIRED TIMER COUNT IN D0
                              *
                              * NOTE: IF TIMRD GOES WRONG, THEN WHAT DO WE DO?
                              *        RIGHT NOW, WE LET THE COUNTER NUMBER
                              *        EQUAL THE TIMER COUNT.
                              *
                              * FREQUENCY DEVIATION IS CALCULATED AS FOLLOWS:
                              *
                              *        DEV. = ((888880/D0) - 60) * 818.8
                              *
9 000000C8 3E00                      MOVE     D0,D7
9 000000CA 48C7                      EXT.L    D7              SIGN EXTEND TO 32 BITS
9 000000CC 4EBAFF32                  JSR      FFPIFP(PC)      CONVERT TO FLOATING POINT
9 000000D0 2C07                      MOVE.L   D7,D6           PUT IN DENOMINATOR
9 000000D2 2E3CD9030054              MOVE.L   #K888880,D7
9 000000D8 4EBAFF26                  JSR      FFPDIV(PC)      CHECK FOR DIVIDE BY ZERO 1ST?
9 000000DC 2C3CF0000046              MOVE.L   #K60,D6
9 000000E2 4EBAFF1C                  JSR      FFPSUB(PC)
9 000000E6 2C3CCCB3334A              MOVE.L   #K818.8,D6
9 000000EC 4EBAFF12                  JSR      FFPMUL(PC)      RESULT IN D7
9 000000F0 2007                      MOVE.L   D7,D0           PUT IN D0 FOR FORMAT
                              *
                              * FORMAT DATA FOR TRANSMISSION & RETURN TO CALLER
                              *
9 000000F2 4EBAFF0C           FINISH JSR      FORMAT(PC)      FORMAT D0
9 000000F6 4FEF0004                  LEA      4(SP),A7        SCRAP LOCAL WORK AREA
9 000000FA                           PULL     D3-D7/A1        RESTORE REGISTERS
9 000000FE 4E75                      RTS                      & RETURN
                              *
                              *
                                     END

****** TOTAL ERRORS      0--
****** TOTAL WARNINGS    0--
```

SYMBOL TABLE LISTING

| SYMBOL NAME | SECT | VALUE | SYMBOL NAME | | SECT | VALUE |
|---|---|---|---|---|---|---|
| .1SEC | | 0000000A | FFPMUL | XREF | 9 | 00000000 |
| .AIOSIZ | | 00000038 | FFPSUB | XREF | 9 | 00000000 |
| .AOOSIZ | | 00000038 | FINISH | | 9 | 000000F2 |
| .COSINE | | 00000014 | FORMAT | XREF | 9 | 00000000 |
| .DIOSIZ | | 0000001C | FREQDEV | | 9 | 000000C0 |
| .EFFECT | | 0000001C | HT | | | 00000009 |
| .HIOSIZ | | 00000010 | INUM | | | 00000002 |
| .HOOSIZ | | 00000180 | IPTENT$ | | | 00000014 |
| .ICOS | | 0000000A | K60 | | | F0000046 |
| .IEFF | | 00000018 | K818.8 | | | CCB3334A |
| .ISCALE | | 00000006 | K888880 | | | D9030054 |
| .ISIN | | 0000000E | KWHOK | | 9 | 00000090 |
| .KWH | | 00000024 | MAXAGE | | | 00000004 |
| .PIOSIZ | | 0000003F | ONESEC | | | 00030090 |
| .REFSIZ | | 00000400 | ONETIK | | | 000009C4 |
| .SAMPLE | | 00000002 | OPTENT$ | | | 00000004 |
| .SCALE1 | | 00000004 | OUTVAL | XDEF | 9 | 00000000 |
| .SCALE2 | | 00000008 | PAAR | | | 00000014 |
| .SCALE3 | | 0000000C | PACR | | | 0000000C |
| .SCALE4 | | 00000010 | PADDR | | | 00000004 |
| .SINE | | 00000018 | PADR | | | 00000010 |

```
.STEMP                  0000001C
.TEMP                   00000012
.TOFSET                 0000000E
.TSCALE                 0000000A
.VCOS                   00000002
.VEFF                   00000014
.VSCALE                 00000002
.VSIN                   00000006
.WATTS                  00000020
.WATTSEC                00000022
AIB$       XREF    5    00000000
AIBENT$                 00000026
CNTR                    0000002E
CPR                     00000024
CR                      0000000D
DIB$       XREF    5    00000000
DIBENT$                 00000026
DSFTENT$                00000010
EEPROM                  00000007
EOT                     00000004
ETX                     00000003
F$ASHPL                 00004000
F$DNUT                  00000400
F$KYBD                  00000100
F$MON                   00000080
F$OST                   00001000
F$PDI                   00000800
F$PPOC                  00002000
F$XMIT                  00000200
FF                      0000000C
FFPDIV     XREF    9    00000000
FFPIFP     XREF    9    00000000

FBAR                    00000016
FBCR                    0000000E
FBDDR                   00000006
FBDR                    00000012
PCDDR                   00000008
PCDR                    00000018
PGCR                    00000000
PIVR                    0000000A
POWER              9    00000054
PROM                    00000009
PSR                     0000001A
PSRR                    00000002
PULL       MACR    *
PUSH       MACR    *
PWRCAL     XREF    9    00000000
RAM                     00000005
ROUND      XREF    9    00000000
S60                     0000390F
SPACE                   00000020
STX                     00000002
TCR                     00000020
TIMRD      XREF    9    00000000
TIVR                    00000022
TSR                     00000034
TYPE                    00000000
WATICK                  00000400
Z_L1.000           9    00000012
Z_L1.003           9    0000004C
Z_L1.006           9    000000A4
Z_L1.009           9    000000E8
Z_L2.002           9    00000018
Z_L2.005           9    00000050

                    PROCES  IDNT    0,6              IMMEDIATE BUFFER PROCESSING   3/10/83
                            OPT     PCS,BRS
                    *
                    *
                    * SUBROUTINE:   PROCES
                    *
                    * REVISED:      3/10/83
                    *
                    * AUTHOR:       D. A. ZEICHNER
                    *
                    * PURPOSE:      PROCESS THIS BUFFER. ONLY 'IMMEDIATE' PROCESSING IS
                    *               PERFORMED. THAT IS, CALCULATIONS WHICH REQUIRE ONLY
                    *               DATA FOUND WITHIN THE BUFFER. (IE. FOURIER TRANSFORM
                    *               AND EFFECTIVE VALUE CALCULATIONS)
                    *
                    * INPUTS:       N/A (THIS IS A TASK SHELL)
                    *
                    * OUTPUTS:      N/A
                    *
                    * EXTERNAL REFERENCES/DEFINITIONS:
                    *
                            XDEF    PROCES
                    *
                    * RAM REFERENCES:
                    *
                            XREF.S  5:PRCIO$
                    *
                    * EPROM (PROGRAM) REFERENCES:
                    *
                            XREF.S  9:DEQUE
                            XREF.S  9:EFFVAL
                            XREF.S  9:XFORM
                    *
                    *
          00000009          SECTION PROM
                    *
9 00000000 41FAFFFE PROCES  LEA     PRCIO$(PC),A0     POINT TO INPUT QUEUE
9 00000004 4EBAFFFA         JSR     DEQUE(PC)
9 00000008 640A             BCC     GOTBUF            QUEUE NOT EMPTY - CONTINUE
```

```
9 0000000A 4240              CLR    D0                    EMPTY - WAIT FOR A WHILE
9 0000000C 7203              MOVEQ  #3,D1                 ABOUT THE THREE TICKS IS GOOD
9 0000000E                   XSVC   SUSPEN
9 00000012 60EC              BRA    PROCES                TRY AGAIN
                     *
9 00000014 02800000FFFF GOTBUF AND.L #$FFFF,D0            CLEAR MSW
9 0000001A 2040              MOVE.L D0,A0
9 0000001C 08D00006          BSET   #6,(A0)               SET AC FLAG.
9 00000020 6712              BEQ    DOBUF                 WASN'T PREVIOUSLY SET - GO DO BUFFER
                     *
                     *...Actually this test is inappropriate, since we can't access Proces
                     *   unless we can set the AC flag ....

9 00000022                   PUSH   D0                    AC ALREADY SET - SAVE D0, AND
9 00000026 4240              CLR    D0                    WAIT FOR A WHILE AGAIN
9 00000028 7203              MOVEQ  #3,D1                 ABOUT THE THREE TICKS IS GOOD
9 0000002A                   XSVC   SUSPEN
9 0000002E                   PULL   D0
9 00000032 60E0              BRA    GOTBUF                TRY AGAIN.
                     *
9 00000034 1010      DOBUF   MOVE.B (A0),D0               GET BUFFER HEADER
9 00000036 E608              LSR.B  #3,D0                 ISOLATE INPUT TYPE
9 00000038 02400003          AND    #3,D0
                     *
9 0000003C 0C400001          CMP    #1,D0                 INPUT VOLTAGE OR CURRENT?
9 00000040 6E12              BGT    NOFOUR                NO - SKIP FOURIER ANALYSIS
9 00000042 4EBAFFBC          JSR    XFORM(PC)             YES - DO FOURIER ANALYSIS
                     *
9 00000046 43E80002          LEA    .SAMPLE(A0),A1        1st RAW DATA ENTRY IN AIB$
9 0000004A 7008              MOVEQ  #8,D0                 ADJUST BUFFER # FOR CLEAR LOOP
9 0000004C 32FC0800  CLRBUF  MOVE   #$800,(A1)+           CLEAR INPUT BUFFER
9 00000050 51C8FFFA          DBRA   D0,CLRBUF             GO AROUND AGAIN ?
                     *
9 00000054 4EBAFFAA  NOFOUR  JSR    EFFVAL(PC)            CALCULATE EFFECTIVE VALUES
9 00000058 0C000003          CMP.B  #3,D0                 STILL HAS INPUT TYPE FROM BEFORE
9 0000005C 67A2              BEQ    PROCES                TYPE IS DONUT - READY TO START W/ NEXT ONE
                     *
9 0000005E 303C2000          MOVE   #F$PROC,D0
9 00000062                   XSVC   RDYALL                WAKE UP EVERYBODY WAITING FOR US
9 00000066 6098              BRA    PROCES                & DO IT AGAIN!
                     *
                     *
                             END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIOSIZ | | 00000038 | F$DNUT | | 00000400 |
| .AOOSIZ | | 00000038 | F$EEPM | | 00000040 |
| .COSINE | | 00000014 | F$KYBD | | 00000100 |
| .DIOSIZ | | 0000001C | F$MON | | 00000050 |
| .EFFECT | | 0000001C | F$OST | | 00001000 |
| .HIOSIZ | | 000000C8 | F$PDI | | 00000800 |
| .HOOSIZ | | 00000180 | F$PROC | | 00002000 |
| .ICOS | | 0000000A | F$XMIT | | 00000200 |
| .IEFF | | 00000018 | FF | | 0000000C |
| .ISCALE | | 00000006 | GOTBUF | 9 | 00000014 |
| .ISIN | | 0000000E | HT | | 00000009 |
| .KWH | | 00000024 | IPTENT$ | | 00000014 |
| .PIOSIZ | | 0000003F | MAXAGE | | 00000004 |
| .REFSIZ | | 00000400 | NEXTSK | | 00000030 |
| .SAMPLE | | 00000002 | NOFOUR | 9 | 00000054 |
| .SCALE1 | | 00000004 | ONESEC | | 00030090 |
| .SCALE2 | | 00000008 | ONETIK | | 000009C4 |
| .SCALE3 | | 0000000C | OPTENT$ | | 00000004 |
| .SCALE4 | | 00000010 | PAAP | | 00000014 |

```
.SINE                   0000001B   PACR                      0000000C
.SPNJP     MACR   *                PADDR                     00000004
.STEMP                  0000001C   PADR                      00000010
.TEMP                   00000012   PBAR                      00000016
.TOFSET                 0000000E   PBCR                      0000000E
.TSCALE                 0000000A   PBDOR                     00000006
.VCOS                   00000002   PBDR                      00000012
.VEFF                   00000014   PCDOR                     00000008
.VSCALE                 00000002   PCDR                      00000018
.VSIN                   00000006   PGCR                      00000000
.WATTS                  00000020   PIVR                      0000000A
.WATTSEC                00000022   PRCID$     XREF   5       00000000
AIBENT$                 00000026   PROCES     XREF   9       00000000
CHCENT                  00000034   PROM                      00000005
CLRBUF            9     0000004C   PSR                       0000001A
CNTR                    0000002E   PSRR                      00000002
CPR                     00000024   PULL       MACR   *
CR                      00000000   PUSH       MACR   *
CTRL13                  00000000   RAM                       00000005
CTRL2                   00000002   RDYALL                    00000008
DEQUE      XREF   9     00000000   READY                     00000004
DEVINI                  00000014   RELEAS                    0000002C
DI$DEV                  0000000A   RESERV                    00000028
DI$EVF                  00000000   RESTRT                    0000003C
DI$ION                  0000001B   S60                       000039DF
DI$ISV                  00000006   SAV$                      0000002A
DI$LNK                  00000016   SPACE                     00000020
DI$OWN                  00000002   STX                       00000002
DI$PTR                  00000012   SUSPEN                    0000000C
DI$QUE                  0000000E   TCR                       00000020
DI$RS0                  0000001A   TIMR1                     00000004
DI$SIZ                  00000020   TIMR2                     00000008
DI$STA                  0000001C   TIMR3                     0000000C
DI$USR                  0000001E   TIVR                      00000022
DIBENT$                 00000026   TK$CON                    00000012
DOBUF             9     00000034   TK$ENT                    00000004
DSFTENT$                00000010   TK$ID                     00000000
EEPROM                  00000007   TK$LPT                    00000016
EFFVAL     XREF   9     00000000   TK$NXT                    0000001A
EOT                     00000004   TK$RS0                    0000001E
EOS        MACR   *                TK$SIZ                    00000022
ETX                     00000003   TK$SSP                    00000008
EX$DV0                  0000000A   TK$STF                    0000000C
EX$DV1                  0000000E   TK$STN                    0000000E
EX$DV2                  00000012   TK$TIN                    00000010
EX$DV3                  00000016   TSKEND                    00000038
EX$DV4                  0000001A   TSKINI                    00000010
EX$DV5                  0000001E   TSR                       00000034
EX$DV6                  00000022   WAIT                      0000001C
EX$DV7                  00000026   WAITCH                    00000020
EX$NXT                  00000006   WAITLF                    00000024
EX$SIZ                  0000002A   WAKEUP                    00000018
EX$TIN                  00000000   XFORM      XREF   9       00000000
EX$TSK                  00000002   XSVC       MACR   *
EXEC                    00000000
```

```
          PWRCAL   IDNT     0,7                         POWER CALCULATIONS    2/16/83
                   OPT      PCS,BRS
          *
          * SUBROUTINE:     PWRCAL
          *
          * REVISED:        2/16/83
          *
          * AUTHOR:         D. A. ZEICHNER
          *
          * PURPOSE:        GIVEN A SPECIFIC OUTPUT PERSONALITY TABLE ENTRY, CALCULATE
          *                 WATTS, VARS OR VA, AND RETURN TO THE USER.
          *
          * INPUTS:         A0 - POINTER TO OUTPUT PERSONALITY TABLE (OPT) ENTRY
          *                 D0 - PARAMETER TO BE CALCULATED:
          *                      4 - WATTS
          *                      5 - VA
```

```
                         *               6 - VARS
                         *
                         * OUTPUTS:      D0 - VALUE OF PARAMETER CALCULATED. (IN FLOATING POINT)
                         *               CARRY SET IF A0 POINTS TO INVALID ENTRY OR PARAMETER
                         *               SPEC OUT OF RANGE.
                         *
                         * EXTERNAL REFERENCES/DEFINITIONS:
                         *
                                 XDEF    PWRCAL
                         *
                         * RAM REFERENCES:
                         *
                                 XREF.S  5:AIB$
                                 XREF.S  5:DIB$
                         *
                         * EEPROM REFERENCE:
                         *
                                 XREF    IPT$
                         *
                         * EPROM (PROGRAM) REFERENCES:
                         *
                                 XREF.S  9:FFPADD
                                 XREF.S  9:FFPDIV
                                 XREF.S  9:FFPIFP
                                 XREF.S  9:FFPMUL
                                 XREF.S  9:FFPSUB
                         *
                         * LOCAL STACK OFFSETS:
                         *
           00000000      V0      EQU     0                      VOLTAGE INPUT #
           00000001      I1      EQU     1                      1ST CURRENT INPUT #
           00000002      I2      EQU     2                      2ND CURRENT INPUT #
           00000003      FUNC    EQU     3                      FUNCTION CODE
           00000004      PSCAL   EQU     4                      POWER SCALE FACTOR (2 BYTES)
                         *
                         *
           00000009              SECTION PROM
                         *
9 00000000               PWRCAL  PUSH    D1-D7/A1-A6
                         *
9 00000004 4FEFFFFA              LEA     -6(SP),SP              ALLOCATE LOCAL SCRATCH SPACE
9 00000008 1F400003              MOVE.B  D0,FUNC(SP)            SAVE FUNCTION CODE IN STACK
                         *
9 0000000C 3410                  MOVE    (A0),D2                GET OPT ENTRY
9 0000000E 1F420001              MOVE.B  D2,I1(SP)              SAVE 1ST CURRENT INPUT IN STACK
                         *
9 00000012 EC4A                  LSR     #6,D2                  RIGHT JUSTIFY VOLTAGE INPUT #
9 00000014 1E82                  MOVE.B  D2,V0(SP)              SAVE IN STACK
                         *
9 00000016 1F6800030002          MOVE.B  3(A0),I2(SP)           PUT 2ND CURRENT INPUT # IN STACK
                         *
9 0000001C 02973F3F3F07          AND.L   #$3F3F3F07,V0(SP)      MASK OUT EXTRA BITS IN V0, I1, I2, & FUNC
                         *
9 00000022 0C2F00040003          CMP.B   #4,FUNC(SP)            CHECK THAT FUNCTION CODE IS IN RANGE
9 00000028 6D0000EE              BLT.L   PWRERR
9 0000002C 0C2F00060003          CMP.B   #6,FUNC(SP)
9 00000032 6E0000E4              BGT.L   PWRERR
                         *
9 00000036 247C00000000          MOVE.L  #0,A2                  SET ACCUMULATED POWER TO ZERO.
9 0000003C 426F0004              CLR     PSCAL(SP)              INITIALIZE POWER SCALE FACTOR.
                         *
                                 WHILE.B V0(SP) <LT> #$3F AND PSCAL(SP) <LT> #$1900 DO.L
9 00000040               Z_L1.000
9 00000052 1017                     MOVE.B  V0(SP),D0           GET ALL 3 INPUT NUMBERS FOR PTRCAL
9 00000054 122F0001                 MOVE.B  I1(SP),D1
9 00000058 142F0002                 MOVE.B  I2(SP),D2
9 0000005C 61000106                 BSR.L   PTRCAL              CALCULATE OFFSETS & GET NEXT INPUT NUMBERS
9 00000060 40C7                     MOVE    SR,D7               SAVE CCR WHILE WE STORE NEW INPUT NUMBERS
9 00000062 1E83                     MOVE.B  D3,V0(SP)           SAVE NEW INPUT NUMBERS
9 00000064 1F440001                 MOVE.B  D4,I1(SP)
9 00000068 1F450002                 MOVE.B  D5,I2(SP)
9 0000006C 44C7                     MOVE    D7,CCR              RESTORE CONDITION CODES
                         *
```

```
                             *
                                     IF      <CC> THEN          WE HAVE ANALOG DERIVED DATA
                                       IF.B    FUNC(SP) <NE> #5 THEN DOING WATTS OR VARS - GET COMPONENTS
                             *
 9 00000078 4CF118000014                 MOVEM.L  .COSINE(A1,D0),A3-A4 GET COSINE & SINE VOLTAGE COMPONENTS
 9 0000007E 4CF160001014                 MOVEM.L  .COSINE(A1,D1),A5-A6 GET COSINE & SINE CURRENT COMPONENTS
 9 00000084 44C7                         MOVE     D7,CCR            GET CCR BACK AGAIN
                             *
                                         IF       <PL> THEN         WE HAVE TWO INPUT CURRENTS
 9 00000088 2E0D                           MOVE.L  A5,D7            ADD COSINE COMPONENTS
 9 0000008A 2C312014                       MOVE.L  .COSINE(A1,D2),D6
 9 0000008E 4EBAFF70                       JSR     FFFADD(PC)
 9 00000092 2A47                           MOVE.L  D7,A5            & SAVE SUM
                             *
 9 00000094 2E0E                           MOVE.L  A6,D7            DO THE SAME WITH THE SINE COMPONENTS
 9 00000096 2C312018                       MOVE.L  .SINE(A1,D2),D6
 9 0000009A 4EBAFF64                       JSR     FFFADD(PC)
 9 0000009E 2C47                           MOVE.L  D7,A6
                                         ENDI
 9 000000A0                  Z_L1.007
                                       ELSE                         WE'RE DOING VA - GET EFFECTIVE VALUES
 9 000000A2                  Z_L1.005
 9 000000A2 2671001C                     MOVE.L   .EFFECT(A1,D0),A3 GET EFFECTIVE VOLTAGE
 9 000000A6 2A71101C                     MOVE.L   .EFFECT(A1,D1),A5 GET EFFECTIVE CURRENT
 9 000000AA 44C7                         MOVE     D7,CCR            RESTORE CONDITION CODES
                             *

                                         IF       <PL> THEN
 9 000000AE 2E0D                           MOVE.L  A5,D7            BREAKER & A HALF - SUM BOTH CURRENTS
 9 000000B0 2C31201C                       MOVE.L  .EFFECT(A1,D2),D6 GET SECOND EFFECTIVE CURRENT VALUE
 9 000000B4 4EBAFF4A                       JSR     FFFADD(PC)
 9 000000B8 2A47                           MOVE.L  D7,A5
                                         ENDI
 9 000000BA                  Z_L1.011
                                       ENDI
 9 000000BA                  Z_L2.010
                                     ELSE                           WE HAVE DONUT DERIVED DATA
 9 000000BC                  Z_L1.003
                             *

                                       IF.B    FUNC(SP) <NE> #5 THEN DOING WATTS OR VARS - GET COMPONENTS
 9 000000C4 4CF178000002                 MOVEM.L  .VCOS(A1,D0),A3-A6 SET UP A3-A6 AS ABOVE (ALL FROM SAME BUF)
                             *
                                       ELSE                         WE'RE DOING VA - GET EFFECTIVE VALUES
 9 000000CC                  Z_L1.015
 9 000000CC 26710014                     MOVE.L   .VEFF(A1,D0),A3
 9 000000D0 2A710018                     MOVE.L   .IEFF(A1,D0),A5
                                       ENDI
 9 000000D4                  Z_L2.017
                                     ENDI
 9 000000D4                  Z_L2.014
                             *
                             * CALL THE APPROPRIATE ROUTINE BASED ON THE
                             * VALUE OF THE INCOMING FUNCTION CODE.
                             *
 9 000000D4 102F0003                 MOVE.B   FUNC(SP),D0
 9 000000D8 5900                     SUBQ.B   #4,D0
 9 000000DA E340                     ASL      #1,D0             CALCULATE OFFSET INTO VECTOR TABLE
 9 000000DC 4880                     EXT      D0                CLEAR MSB OF WORD
 9 000000E2 4EB10000                 JSR      (A1,D0)           DO THE COMPUTED JSR
                             *
                             * ACCUMULATE THE RESULT IN A2.
                             *
 9 000000E6 2C0A                     MOVE.L   A2,D6             GET TOTAL
 9 000000E8 4EBAFF16                 JSR      FFFADD(PC)        ACCUMULATE RESULT
 9 000000EC 2447                     MOVE.L   D7,A2
 9 000000EE 066F08000004             ADD      #$800,FSCAL(SP)   BUMP SCALE FACTOR
                             *
                                   ENDW
 9 000000F8                  Z_L2.001
 9 000000F8 3E2F0004               MOVE     FSCAL(SP),D7        GET SCALING FACTOR,
 9 000000FC 48C7                   EXT.L    D7                  SIGN EXTEND TO 32 BITS,
 9 000000FE 4EBAFF00               JSR      FFFIFP(PC)          & CONVERT TO FLOATING POINT
```

```
9 00000102 2C07               MOVE.L   D7,D6
9 00000104 2E0A               MOVE.L   A2,D7                GET ACCUMULATED POWER VALUE
                        *
                              IF       <NE> THEN            ALLOW DIVIDE IF NUMERATOR NON-ZERO
9 00000108 4EBAFEF6             JSR      FFFDIV(PC)
                              ENDI
  9 0000010C            Z_L1.018
9 0000010C 2007               MOVE.L   D7,D0                PUT RESULT IN D0
                        *
9 0000010E 4FEF0006     PWRXIT  LEA      6(SP),A7             DEALLOCATE LOCAL STACK SPACE
9 00000112                    PULL     D1-D7/A1-A6          RESTORE REGISTERS
9 00000116 4E75               RTS                           & RETURN
                        *
9 00000118 4280         PWPERR  CLR.L    D0                   SET RESULT TO 0
9 0000011A 003C0001           OR.B     #1,CCR               SET CARRY
9 0000011E 60EE               BRA      PWRXIT               & RETURN BAD
                        *
                        *
9 00000120 6004         VECTOR  BRA      WATTS
9 00000122 6036               BRA      VA
9 00000124 601A               BRA      VARS
                        *
                        * WATTS, VARS, VA SUBROUTINES:
                        *
                        * INPUTS: A3 - VA (VEFF FOR VA)
                        *         A4 - VB
                        *         A5 - IA (IEFF FOR VA)
                        *         A6 - IB
                        *
                        * OUTPUT: D7 - RESULT
                        *
                        * WATTS - EQN. PERFORMED: D7 = (VB * IB) + (VA * IA)
                        *
9 00000126 2E0C         WATTS   MOVE.L   A4,D7
9 00000128 2C0E               MOVE.L   A6,D6
9 0000012A 4EBAFED4           JSR      FFFMUL(PC)           (VB * IB)
                        *
9 0000012E 2007               MOVE.L   D7,D0
9 00000130 2E0B               MOVE.L   A3,D7
9 00000132 2C0D               MOVE.L   A5,D6
9 00000134 4EBAFECA           JSR      FFFMUL(PC)           (VA * IA)
                        *
9 00000138 2C00               MOVE.L   D0,D6
9 0000013A 4EBAFEC4           JSR      FFFADD(PC)           ADD THE TWO TOGETHER
9 0000013E 4E75               RTS                           & RETURN
                        *
                        *
                        * VARS - EQN. PERFORMED: D7 = (VA * IB) - (VB * IA)
                        *
9 00000140 2E0C         VARS    MOVE.L   A4,D7
9 00000142 2C0D               MOVE.L   A5,D6
9 00000144 4EBAFEBA           JSR      FFFMUL(PC)           (VB * IA)
                        *
9 00000148 2007               MOVE.L   D7,D0                SAVE INTERMEDIATE RESULT
9 0000014A 2E0B               MOVE.L   A3,D7
9 0000014C 2C0E               MOVE.L   A6,D6
9 0000014E 4EBAFEB0           JSR      FFFMUL(PC)           (VA * IB)
                        *
9 00000152 2C00               MOVE.L   D0,D6
9 00000154 4EBAFEAA           JSR      FFFSUB(PC)           DO SUBTRACTION OF TWO TERMS
9 00000158 4E75               RTS                           & RETURN
                        *
                        *
                        * VA - EQN. PERFORMED: D7 = VEFF * IEFF
                        *
9 0000015A 2C0B         VA      MOVE.L   A3,D6
9 0000015C 2E0D               MOVE.L   A5,D7
9 0000015E 4EBAFEA0           JSR      FFFMUL(PC)
9 00000162 4E75               RTS
                        *
```

```
                         *
                         * PTRCAL - CALCULATE POINTER TO APPROPRIATE INPUT BUFFER.
                         *
                         * INPUTS: A0 - POINTS TO OPT ENTRY
                         *         D0 - VOLTAGE INPUT #
                         *         D1 - 1ST CURRENT INPUT # (ANALOG ONLY)
                         *         D2 - 2ND CURRENT INPUT # (ANALOG ONLY)
                         *
                         * OUTPUT: A1 - POINTS TO START OF APPROPRIATE INPUT BUFFER TYPE. (AIB/DIB)
                         *         D0 - OFFSET TO VOLTAGE INPUT BUFFER
                         *         D1 - OFFSET TO CURRENT INPUT BUFFER #1
                         *         D2 - OFFSET TO CURRENT INPUT BUFFER #2 (IF USED)
                         *         D3 - NEXT VOLTAGE INPUT BUFFER ($3F IF END)
                         *         D4 - NEXT CURRENT INPUT BUFFER #1
                         *         D5 - NEXT CURRENT INPUT BUFFER #2
                         *
                         *         CARRY IS SET IF OUTPUT WAS DONUT DERIVED
                         *         NEGATIVE BIT IS SET IF ONLY 1 CURRENT INPUT USED & INPUT WAS ANALOG.
                         *
9 00000164 08100004      PTRCAL  BTST    #4,(A0)         PROCESSING DONUT DATA?
9 00000168 665C                  BNE     PTRDNT          YES - GO CALC POINTER
                         *
                         * INPUT WAS ANALOG. CALCULATE OFFSET TO BUFFER, & GET
                         * INPUT NUMBER OF NEXT PHASE FOR VOLTAGE & CURRENT(S)
                         * FROM INPUT PERSONALITY TABLE.
                         *
9 0000016A 43F900000000          LEA     IPT$,A1         SET POINTER TO INPUT PERSONALITY TABLE
                         *
9 00000170 0240003F              AND     #$3F,D0         ISOLATE INPUT NUMBER
9 00000174 3600                  MOVE    D0,D3
9 00000176 C0FC0026              MULU    #AIBENT$,D0     CALCULATE OFFSET TO ANALOG INPUT BUFFER
9 0000017A C6FC0014              MULU    #IPTENT$,D3     CALCULATE OFFSET TO IPT ENTRY
9 0000017E 36313000              MOVE    (A1,D3),D3      GET LINK
9 00000182 0243003F              AND     #$3F,D3         & ISOLATE IT
                         *
                         * DO THE SAME FOR THE 1ST CURRENT INPUT
                         *
9 00000186 0241003F              AND     #$3F,D1         ISOLATE INPUT NUMBER
9 0000018A 3801                  MOVE    D1,D4
9 0000018C C2FC0026              MULU    #AIBENT$,D1
9 00000190 C8FC0014              MULU    #IPTENT$,D4
9 00000194 38314000              MOVE    (A1,D4),D4
9 00000198 0244003F              AND     #$3F,D4
                         *
                         * AND AGAIN FOR THE 2ND CURRENT INPUT IF WE HAVE ONE.
                         * IF WE DON'T, SET THE OFFSET TO -1, & THE LINK TO $3F.
                         *
9 0000019C 0242003F              AND     #$3F,D2         ISOLATE INPUT NUMBER
9 000001A0 3A02                  MOVE    D2,D5           SAVE FOR IPT CALCS.
                         *
                                 IF      D2 <NE> #$3F THEN
9 000001A8 C4FC0026                MULU    #AIBENT$,D2
9 000001AC CAFC0014                MULU    #IPTENT$,D5     CALC. OFFSET TO IPT ENTRY
9 000001B0 3A315000                MOVE    (A1,D5),D5      GET NEXT LINK
9 000001B4 0245003F                AND     #$3F,D5         & ISOLATE IT
                                 ELSE
  6 000001B4             Z_L1.021
9 000001BA 343CFFFF                MOVE    #-1,D2          SET OFFSET TO -1
                                 ENDI
  9 000001BE             Z_L2.023
                         *
9 000001BE 43FAFE40              LEA     AIB$(PC),A1     SET A1 TO POINT TO ANALOG INPUT BUFFERS
9 000001C2 4A42                  TST     D2              SET N BIT AS APPROPRIATE & CLEAR CARRY.
9 000001C4 4E75                  RTS                     RETURN
                         *
                         * INPUT WAS DONUT DERIVED. VOLTAGE & CURRENT COME FROM
                         * THE SAME BUFFER. THE LINK TO THE NEXT BUFFER IS OBTAINED
                         * BY SIMPLY INCREMENTING THE INCOMING INPUT NUMBER.
                         *
                         * NOTE: WE HAVE NO WAY OF KNOWING WHEN WE'RE DONE HERE, SO
                         *       YOU'LL JUST HAVE TO WATCH OUT FOR YOURSELF.
```

```
                     *
9 000001C6 43FAFE38  PTRONT  LEA   DIB$(PC),A1        SET POINTER TO DONUT INPUT BUFFERS
                     *
9 000001CA 0240000F          AND   #$F,D0             ISOLATE DONUT ID
9 000001CE 3600              MOVE  D0,D3
9 00000100 5243              ADDQ  #1,D3              CALCULATE NEXT DONUT ID
9 00000102 C0FC0026          MULU  #DIBENT$,D0        CALC OFFSET TO DONUT INPUT BUFFER
9 00000106 003C0001          OR    #1,CCR             SET CARRY BIT
9 000001DA 4E75              RTS                      & RETURN
                     *
                     *
                             END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | HT | | | 00000009 |
| .AIOSIZ | | | 00000038 | I1 | | | 00000001 |
| .AOOSIZ | | | 00000038 | I2 | | | 00000002 |
| .COSINE | | | 00000014 | IPT$ | XREF | * | 00000000 |
| .DIOSIZ | | | 0000001C | IPTENT$ | | | 00000014 |
| .EFFECT | | | 0000001C | MAXAGE | | | 00000004 |
| .HIOSIZ | | | 00000010 | ONESEC | | | 00030090 |
| .HOOSIZ | | | 00000180 | ONETIK | | | 000009C4 |
| .ICOS | | | 0000000A | OPTENT$ | | | 00000004 |
| .IEFF | | | 00000018 | PAAR | | | 00000014 |
| .ISCALE | | | 00000006 | PACR | | | 0000000C |
| .ISIN | | | 0000000E | PADDR | | | 00000004 |
| .KWH | | | 00000024 | PADR | | | 00000010 |
| .PIOSIZ | | | 0000003F | PBAR | | | 00000016 |
| .REFSIZ | | | 00000400 | PBCR | | | 0000000E |
| .SAMPLE | | | 00000002 | PBDDR | | | 00000006 |
| .SCALE1 | | | 00000004 | PBDR | | | 00000012 |
| .SCALE2 | | | 00000008 | PCDDR | | | 00000008 |
| .SCALE3 | | | 0000000C | PCDR | | | 00000018 |
| .SCALE4 | | | 00000010 | PGCR | | | 00000000 |
| .SINE | | | 00000018 | PIVR | | | 0000000A |
| .STEMP | | | 0000001C | PROM | | | 00000009 |
| .TEMP | | | 00000012 | PSCAL | | | 00000004 |
| .TOFSET | | | 0000000E | PSR | | | 0000001A |
| .TSCALE | | | 0000000A | PSRR | | | 00000002 |
| .VCOS | | | 00000002 | PTRCAL | | 9 | 00000164 |
| .VEFF | | | 00000014 | PTRONT | | 9 | 000001C6 |
| .VSCALE | | | 00000002 | PULL | MACR | * | |
| .VSIN | | | 00000006 | PUSH | MACR | * | |
| .WATTS | | | 00000020 | PWRCAL | XDEF | 9 | 00000000 |
| .WATTSEC | | | 00000022 | PWREFF | | 9 | 00000118 |
| AIB$ | XREF | 5 | 00000000 | PWRWIT | | 9 | 0000010E |
| AIBENT$ | | | 00000026 | RAM | | | 00000005 |
| CNTR | | | 0000002E | S60 | | | 000039DF |
| CPR | | | 00000024 | SPACE | | | 00000020 |
| CR | | | 0000000D | STX | | | 00000002 |
| DIB$ | XREF | 5 | 00000000 | TCR | | | 00000020 |
| DIBENT$ | | | 00000026 | TIVR | | | 00000022 |
| DSPTENT$ | | | 00000010 | TSR | | | 00000034 |
| EEPROM | | | 00000007 | V0 | | | 00000000 |
| EOT | | | 00000004 | VA | | 9 | 0000015A |
| ETX | | | 00000003 | VARS | | 9 | 00000140 |
| F$ASMPL | | | 00004000 | VECTOR | | 9 | 00000120 |
| F$DNUT | | | 00000400 | WATTS | | 9 | 00000126 |
| F$KYBD | | | 00000100 | Z_L1.000 | | 9 | 00000040 |
| F$MON | | | 00000080 | Z_L1.003 | | 9 | 000000EC |
| F$DST | | | 00001000 | Z_L1.005 | | 9 | 000000A2 |
| F$PDI | | | 00000800 | Z_L1.007 | | 9 | 000000A0 |
| F$PROC | | | 00002000 | Z_L1.011 | | 9 | 000000BA |
| F$XMIT | | | 00000200 | Z_L1.015 | | 9 | 000000CC |
| FF | | | 0000000C | Z_L1.018 | | 9 | 0000010C |

```
FFFADD    XREF  9  00000000    Z_L1.021       9   000001BA
FFFDIV    XREF  9  00000000    Z_L2.001       9   000000F8
FFFIFP    XREF  9  00000000    Z_L2.010       9   000000BA
FFFMUL    XREF  9  00000000    Z_L2.014       9   00000004
FFFSUB    XREF  9  00000000    Z_L2.017       9   00000004
FUNC               00000003    Z_L2.023       9   000001BE
                         QUEINI  IDNT    0,2                      QUEUE INITIALIZER    1/19/83
                                 OPT     FCS,FRS,BRS
                         *
                         * SUBROUTINE:   QUEINI
                         *
                         * STARTED:      1/19/83
                         *
                         * AUTHOR:       D. A. ZEICHNER
                         *
                         * PURPOSE:      BUILD A QUEUE HEADER BLOCK OF THE FORMAT:
                         *
                         *                         DS.W  QUEUE HEAD POINTER
                         *                         DS.W  QUEUE TAIL POINTER
                         *                         DS.W  END OF QUEUE POINTER
                         *                         DS.W  QUEUE STATUS WORD
                         *                         DS.B  DATA SPACE
                         *
                         * INPUTS:       A0 - POINTER TO START OF QUEUE HEADER BLOCK.
                         *               D0 - # OF ELEMENTS IN QUEUE. (SIZE IS WORD IF
                         *                    BIT 15 IS SET, ELSE BYTE)
                         *
                         * OUTPUTS:      D0, D1, A1 DESTROYED. ALL OTHERS PRESERVED.
                         *
                         * EXTERNAL REFERENCES/DEFINITIONS:
                         *
                                 XDEF    QUEINI
                         *
                         * LOCAL ASSIGNMENTS:
                         *
            00000000     QHEAD   EQU     0                        OFFSET TO QUEUE HEAD POINTER
            00000002     QTAIL   EQU     2                        OFFSET TO QUEUE TAIL POINTER
            00000004     QEND    EQU     4                        OFFSET TO END OF QUEUE POINTER
            00000007     QSTAT   EQU     7                        OFFSET TO QUEUE STATUS BYTE
            00000001     QSIZE   EQU     1                        QUEUE ELEMENT SIZE BIT
                         *
                         *
            00000009             SECTION PROM
                         *
  9 00000000 42680006    QUEINI  CLR.W   QSTAT-1(A0)              CLEAR QUEUE STATUS & PRECEEDING BYTE
  9 00000004 43E80008            LEA     8(A0),A1                 CALCULATE START OF QUEUE DATA
  9 00000008 3089                MOVE.W  A1,QHEAD(A0)             & INIT HEAD & TAIL PTRS
  9 0000000A 31490002            MOVE.W  A1,QTAIL(A0)
                         *
  9 0000000E 0800000F            BTST    #15,D0                   MSB SET?
                                 IF      <NE> THEN
  9 00000014 E340                  ASL     #1,D0                  SIZE WAS WORD - MULT. D0 BY 2
  9 00000016 08E800010007          BSET    #1,QSTAT(A0)           SET WORD FLAG IN STATUS BYTE
                                 ENDI
  9 0000001C             Z_L1.000
                         *
  9 0000001C 43F10000            LEA     (A1,D0),A1               CALC. END OF QUEUE
  9 00000020 31490004            MOVE.W  A1,QEND(A0)              STORE END OF QUEUE POINTER
  9 00000024 4E75                RTS                              & RETURN
                         *
                         *
                                 END

****** TOTAL ERRORS     0--
****** TOTAL WARNINGS   0--
SYMBOL TABLE LISTING
SYMBOL NAME     SECT  VALUE       SYMBOL NAME     SECT  VALUE
.1SEC                 00000004    F$MON                 00000080
.AIOSIZ               00000036    F$OST                 00001000
.AOOSIZ               00000038    F$FDI                 00000800
.COSINE               00000014    F$FROC                00002000
```

```
.DIOSIZ    0000001C   F$INIT              00000200
.EFFECT    0000001C   FF                  0000000C
.HIOSIZ    000000C8   HT                  00000009
.HOOSIZ    00000180   IFTENT$             00000014
.ICOS      0000000A   MAXAGE              00000004
.IEFF      00000018   ONESEC              0003D090
.ISCALE    00000006   ONETIK              000009C4
.ISIN      0000000E   OFTENT$             00000004
.KWH       00000024   PAAR                00000014
.PIOSIZ    0000003F   PACR                0000000C
.REFSIZ    00000400   PADDR               00000004
.SAMPLE    00000002   PADR                00000010
.SCALE1    00000004   PBAR                00000016
.SCALE2    00000008   PBCR                0000000E
.SCALE3    0000000C   PBDDR               00000006
.SCALE4    00000010   PBDR                00000012
.SINE      00000018   PCDDR               00000008
.STEMP     0000001C   PCDR                00000018
.TEMP      00000012   PGCR                00000000
.TOFSET    0000000E   PIVR                0000000A
.TSCALE    0000000A   PROM                00000009
.VCOS      00000002   PSR                 0000001A
.VEFF      00000014   PSRR                00000002
.VSCALE    00000002   PULL     MACR   *
.VSIN      00000006   PUSH     MACR   *
.WATTS     00000020   QEND                00000004
.WATTSEC   00000022   QHEAD               00000000
AIBENT$    00000026   QSIZE               00000001
CNTR       0000002E   QSTAT               00000007
CPR        00000024   QTAIL               00000002
CR         0000000D   QUEINI   XDEF   9   00000000
CTRL13     00000000   RAM                 00000005
CTRL2      00000002   S60                 000039DF
DIBENT$    00000026   SPACE               00000020
DSFTENT$   00000010   STX                 00000002
EEPROM     00000007   TCR                 00000020
EOT        00000004   TIMR1               00000004
ETX        00000003   TIMR2               00000008
F$ASMPL    00004000   TIMR3               0000000C
F$DMUT     00000400   TIVR                00000022
F$EEPM     00000040   TSR                 00000034
F$KYED     00000100   Z_L1.000        9   0000001C
```

```
        RCVCHR  IDNT    0,2                       Auxiliary port character receiver  1/14/83
                OPT     PCS,BRS
        *
        *
        * SUBROUTINE:   RCVCHR
        *
        * REVISED:      1/14/83
        *
        * AUTHOR:       D. A. ZEICHNER
        *
        * PURPOSE:      GET A CHARACTER FROM THE AUX INPUT QUEUE &
        *               UPDATE INCOMING CRC WORD.
        *
        * INPUTS:       D7 - CRC WORD TO UPDATE
        *
        * OUTPUTS:      D0 - CHARACTER RECEIVED
        *               D7 - UPDATED CRC (IF CHARACTER RECEIVED)
        *               CARRY SET IF TIMEOUT (100MS BEFORE CHARACTER REC'D)
        *               ALL OTHER REGISTERS DESTROYED
        *
        * EXTERNAL REFERENCES/DEFINITIONS:
        *
                XDEF    RCVCHR
        *
        * RAM REFERENCES:
        *
                XREF.S  S:AUXIO$
        *
        * EPROM (PROGRAM) REFERENCES:
```

```
                          *
                                  XREF.S   9:CRC16
                                  XREF.S   9:DEQUE
                          *
                          *
               00000009           SECTION  PROM
                          *
 9 00000000 41FAFFFE      RCVCHR  LEA      AUXIQ$(PC),A0        GET POINTER TO AUX INPUT QUEUE
 9 00000004 4EBAFFFA              JSR      DEQUE(PC)            GET CHARACTER FROM QUEUE
 9 00000008 641A                  BCC      RCVOK                GOT CHARACTER - UPDATE CRC
                          *
                          * SET UP TO WAIT FOR 100 MS. OR AUX INPUT QUEUE
                          * NOT EMPTY FLAG.
                          *
 9 0000000A                       PUSH     D7/A0                SAVE D7 & A0 THRU TASK CHANGE
 9 0000000E 303C0800              MOVE     #F$PDI,D0            WAIT FOR PROGRAMMING DATA IN (Q NOT MT)
 9 00000012 720A                  MOVEQ    #10,D1               OR 10 TICKS (100 MS.)
 9 00000014                       XSVC     SUSPEN
 9 00000018                       PULL     D7/A0                RESTORE CRC & QUEUE POINTER
 9 0000001C 4EBAFFE2              JSR      DEQUE(PC)            GET CHARACTER FROM QUEUE
 9 00000020 6402                  BCC      RCVOK                GOT CHARACTER - UPDATE CRC
                          *
                          * COULDN'T GET CHARACTER FROM QUEUE AFTER
                          * 100 MS. EXIT WITH CARRY SET. (DONE BY DEQUE)
                          *
 9 00000022 4E75          RCVXIT  RTS                           & RETURN
                          *
 9 00000024 4EBAFFDA      RCVOK   JSR      CRC16(PC)            GOT CHARACTER - UPDATE CRC
 9 00000028 60F8                  BRA      RCVXIT               & FINISH UP
                          *
                          *
                                  END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | EX$TSK | | 00000002 |
| .AIQSIZ | | 00000038 | EXEC | | 00000000 |
| .AOQSIZ | | 00000038 | F$ASMPL | | 00004000 |
| .COSINE | | 00000014 | F$DNUT | | 00000400 |
| .DIQSIZ | | 0000001C | F$KYBD | | 00000100 |
| .EFFECT | | 0000001C | F$MON | | 00000080 |
| .HIQSIZ | | 00000010 | F$OST | | 00001000 |
| .HOQSIZ | | 00000180 | F$PDI | | 00000800 |
| .ICOS | | 0000000A | F$PROC | | 00002000 |
| .IEFF | | 00000018 | F$XMIT | | 00000200 |
| .ISCALE | | 00000006 | FF | | 0000000C |
| .ISIN | | 0000000E | HT | | 00000009 |
| .KWH | | 00000024 | IPTENT$ | | 00000014 |
| .PIQSIZ | | 0000003F | MAXAGE | | 00000004 |
| .REFSIZ | | 00000400 | NEXTSK | | 00000030 |
| .SAMPLE | | 00000002 | ONESEC | | 00030090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |
| .SCALE4 | | 00000010 | PACR | | 0000000C |
| .SINE | | 00000018 | PADDR | | 00000004 |
| .SPMJP | MACR | * | PADR | | 00000010 |
| .STEMP | | 0000001C | PBAR | | 00000016 |
| .TEMP | | 00000012 | PBCR | | 0000000E |
| .TOFSET | | 0000000E | PBDDR | | 00000006 |
| .TSCALE | | 0000000A | PBDR | | 00000012 |
| .VCOS | | 00000002 | PCDDR | | 00000008 |
| .VEFF | | 00000014 | PCDR | | 00000018 |
| .VSCALE | | 00000002 | PGCR | | 00000000 |
| .VSIN | | 00000006 | PIVR | | 0000000A |

```
.WATTS               00000020   FROM               00000009
.WATTSEC             00000022   FSR                0000001A
AIBENT$              00000026   FSRR               00000002
AUXIO$    XREF  5    00000000   FULL     MACR  *
CHGENT               00000034   PUSH     MACR  *
CNTR                 0000002E   RAM                00000005
CPR                  00000024   RCVCHR   XDEF  9   00000000
CR                   00000000   RCVOK          9   00000024
CRC16     XREF  9    00000000   RCVXIT         9   00000022
DEQUE     XREF  9    00000000   RDYALL             00000008
DEVINI               00000014   READY              00000004
DI$DEV               0000000A   RELEAS             0000002C
DI$EVF               00000000   RESERV             00000028
DI$IOM               00000018   RESTRT             0000003C
DI$ISV               00000006   S60                000039DF
DI$LNK               00000016   SAV$               0000002A
DI$OWN               00000002   SPACE              00000020
DI$PTR               00000012   STX                00000002
DI$QUE               0000000E   SUSPEN             0000000C
DI$RSO               0000001A   TCR                00000020
DI$SIZ               00000020   TIVR               00000022
DI$USR               0000001E   TK$ENT             00000004
DIBENT$              00000026   TK$ID              00000000
DSFTENT$             00000010   TK$LFT             00000016
EEPROM               00000007   TK$NXT             0000001A
EOT                  00000004   TK$RSO             0000001E
EOS       MACR  *               TK$SIZ             00000022
ETX                  00000003   TK$SSP             00000008
EX$DV0               0000000A   TK$STF             0000000C
EX$DV1               0000000E   TK$STM             0000000E
EX$DV2               00000012   TK$TIM             00000010
EX$DV3               00000016   TSKEND             00000038
EX$DV4               0000001A   TSKINI             00000010
EX$DV5               0000001E   TSR                00000034
EX$DV6               00000022   WAIT               0000001C
EX$DV7               00000026   WAITCN             00000020
EX$NXT               00000006   WAITLP             00000024
EX$SIZ               0000002A   WAKEUP             00000018
EX$TIM               00000000   XSVC     MACR  *

                    ROUND      IDNT     0,1                ROUND FLOATING POINT VALUE    1/19/83
                               OPT      PCS,BRS
                    *
                    * SUBROUTINE:    ROUND
                    *
                    * REVISED:       1/19/83
                    *
                    * AUTHOR:        D. A. ZEICHNER
                    *
                    * PURPOSE:       ROUND A NUMBER IN MOTOROLA FFP FORMAT AND CONVERT TO
                    *                INTEGER FORMAT. ROUNDING IS ACHIEVED BY ADDING .5 TO
                    *                A POSITIVE NUMBER, OR SUBTRACTING .5 FROM A NEGATIVE
                    *                NUMBER.
                    *
                    * INPUTS:        D7 - FLOATING POINT NUMBER TO BE ROUNDED
                    *
                    * OUTPUTS:       D7 - ROUNDED INTEGER. D5, D6 DESTROYED.
                    *
                    * EXTERNAL REFERENCES/DEFINITIONS:
                    *
                               XDEF     ROUND
                    *
                    * EPROM (PROGRAM) REFERENCES:
                    *
                               XREF.S   9:FFPADD
                               XREF.S   9:FFPFPI
                    *
                    * LOCAL ASSIGNMENTS:
                    *
         80000040   K.5        EQU      $80000040          CONSTANT .5
                    *
                    *
         00000009              SECTION  PROM
```

```
                              *
9 00000000 4A87               ROUND    TST.L    D7
9 00000002 6716                        BEQ      RNDXIT          INCOMING VALUE IS ZERO - QUIT NOW
                              *
9 00000004 2C3C80000040                MOVE.L   #K.5,D6
9 0000000A 4A07                        TST.B    D7
9 0000000C 6A04                        BPL      RNDO            VALUE IS POSITIVE - GO ADD CONSTANT
9 0000000E 08C60007                    BSET     #7,D6           VALUE IS NEGATIVE - MAKE CONSTANT NEGATIVE
                              *
9 00000012 4EBAFFEC           RNDO     JSR      FFPADD(PC)      ADD CONSTANT
9 00000016 4EBAFFE8                    JSR      FFPFPI(PC)      & CONVERT TO INTEGER
                              *
9 0000001A 4E75               RNDXIT   RTS
                              *
                              *
                                       END

****** TOTAL ERRORS     0--
****** TOTAL WARNINGS   0--
SYMBOL TABLE LISTING
```

| SYMBOL NAME | SECT | VALUE | SYMBOL NAME | SECT | VALUE |
|---|---|---|---|---|---|
| .ISEC | | 0000000A | F$NON | | 00000080 |
| .AIOSIZ | | 00000038 | F$OST | | 00001000 |
| .AOOSIZ | | 00000038 | F$FDI | | 00000800 |
| .COSINE | | 00000014 | F$PROC | | 00002000 |
| .DIOSIZ | | 0000001C | F$XMIT | | 00000200 |
| .EFFECT | | 0000001C | FF | | 0000000C |
| .HIOSIZ | | 00000010 | FFPADD | XREF 9 | 00000000 |
| .HOOSIZ | | 00000180 | FFPFPI | XREF 9 | 00000000 |
| .ICOS | | 0000000A | HT | | 00000009 |
| .IEFF | | 00000018 | IPTENT$ | | 00000014 |
| .ISCALE | | 00000006 | K.5 | | 80000040 |
| .ISIN | | 0000000E | MAXAGE | | 00000004 |
| .KWH | | 00000024 | ONESEC | | 0003D090 |
| .PIOSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACK | | 0000000C |
| .SCALE2 | | 00000008 | PADDR | | 00000004 |
| .SCALE3 | | 0000000C | PAOR | | 00000010 |
| .SCALE4 | | 00000010 | PBAR | | 00000016 |
| .SINE | | 00000016 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR | * |
| AIBENT$ | | 00000026 | PUSH | MACR | * |
| CNTR | | 0000002E | RAM | | 00000005 |
| CPR | | 00000024 | RNDO | 9 | 00000012 |
| CR | | 0000000D | RNDXIT | 9 | 0000001A |
| DIBENT$ | | 00000026 | ROUND | XDEF 9 | 00000000 |
| DSFTENT$ | | 00000010 | S60 | | 000039DF |
| EEPROM | | 00000007 | SPACE | | 00000020 |
| EOT | | 00000004 | STX | | 00000002 |
| ETX | | 00000003 | TCR | | 00000020 |
| F$ASMPL | | 00004000 | TIVR | | 00000022 |
| F$DNUT | | 00000400 | TSR | | 00000034 |
| F$KYBD | | 00000100 | | | |

```
              KTIEPM   IDNT     0,4              EEPROM definitions  3/09/83
                       OPT      PCS,BRS
              *
```

```
                          * EEPROM TABLE DEFINITIONS
                          *
                          * EXTERNAL REFERENCES/DEFINITIONS:
                          *
                                   XDEF     CPUERR
                                   XDEF     DSFT$
                                   XDEF     EPMEND
                                   XDEF     EPMSTR
                                   XDEF     RSTERR
                                   XDEF     IPT$
                                   XDEF     OPT$
                                   XDEF     RAMERR
                                   XDEF     ROMERR
                                   XDEF     SITEID
                          *
           00000007                SECTION  EEPROM
                          *
  7        00000000       EPMSTR   EQU      *                  START OF EEPROM
  7        00000FFE       EPMEND   EQU      *+$FFE             ADR OF EEPROM CRC
                          *
                          * I.D. TABLE:
                          *
  7 00000000 00000001     RAMERR   DS.B     1                  # OF RAM FAILURES
  7 00000001 00000001     ROMERR   DS.B     1                  # OF PROM/EEPROM FAILURES
  7 00000002 00000001     RSTERR   DS.B     1                  # OF RESTARTS OCCURRED
  7 00000003 00000001     CPUERR   DS.B     1                  # OF CPU FAILURES
  7 00000004 0000000C              DS.B     12                 EXPANSION
  7 00000010 00000010     SITEID   DS.B     16                 SITE NAME
                          *
                          * INPUT PERSONALITY TABLE:
                          *
  7 00000020 000003C0     IPT$     DS.B     48*IPTENT$         48 ENTRIES
                          *
                          * DOUNT SCALE FACTOR TABLE:
                          *
  7 000003E0 00000100     DSFT$    DS.B     16*DSFTENT$        16 ENTRIES
                          *
                          * OUTPUT PERSONALITY TABLE:
                          *
  7 000004E0 00000100     OPT$     DS.B     64*4               64 ENTRIES
                          *
                          *
                                   END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$EEPM | | 00000040 |
| .AIOSIZ | | 0000003B | F$KYBD | | 00000100 |
| .AOOSIZ | | 0000003B | F$MON | | 00000080 |
| .COSINE | | 00000014 | F$OST | | 00001000 |
| .DIOSIZ | | 0000001C | F$PDI | | 00000800 |
| .EFFECT | | 0000001C | F$PROC | | 00002000 |
| .HIOSIZ | | 000000C8 | F$XMIT | | 00000200 |
| .HOOSIZ | | 00000190 | FF | | 0000000C |
| .ICOS | | 0000000A | HT | | 00000009 |
| .IEFF | | 00000018 | IPT$ | XDEF 7 | 00000020 |
| .ISCALE | | 00000006 | IPTENT$ | | 00000014 |
| .ISIN | | 0000000E | MAXAGE | | 00000004 |
| .KWH | | 00000024 | ONESEC | | 00030090 |
| .PIOSIZ | | 0000003F | ONETIK | | 000009C4 |
| .RBFSIZ | | 00000400 | OPT$ | XDEF 7 | 000004E0 |
| .SAMPLE | | 00000002 | OPTENT$ | | 00000004 |
| .SCALE1 | | 00000004 | PAAR | | 00000014 |
| .SCALE2 | | 00000008 | PACR | | 0000000C |
| .SCALE3 | | 0000000C | PADDR | | 00000004 |

```
.SCALE4                  00000010   PADR                  00000010
.SINE                    00000018   PBAR                  00000016
.STEMP                   0000001C   PBCR                  0000000E
.TEMP                    00000012   PBDDR                 00000006
.TOFSET                  0000000E   PBDR                  00000012
.TSCALE                  0000000A   PCDDR                 00000008
.VCOS                    00000002   PCDR                  00000018
.VEFF                    00000014   PGCR                  00000000
.VSCALE                  00000002   PIVR                  0000000A
.VSIN                    00000006   PROM                  00000009
.WATTS                   00000020   PSR                   0000001A
.WATTSEC                 00000022   PSRR                  00000002
AIBENT$                  00000026   PULL      MACR  *
CNTR                     0000002E   PUSH      MACR  *
CPR                      00000024   RAM                   00000005
CPUERR     XDEF   7      00000003   RAMERR    XDEF  7     00000000
CR                       0000000D   ROMERR    XDEF  7     00000001
CTRL13                   00000000   RSTERR    XDEF  7     00000002
CTRL2                    00000002   S60                   0000350F
DIBENT$                  00000026   SITEID    XDEF  7     00000010
DSFT$      XDEF   7      000003E0   SPACE                 00000020
DSFTENT$                 00000010   STX                   00000002
EEPROM                   00000007   TCR                   00000020
EOT                      00000004   TIMR1                 00000004
EPMEND     XDEF   7      00000FFE   TIMR2                 00000008
EPMSTR     XDEF   7      00000000   TIMR3                 0000000C
ETX                      00000003   TIVR                  00000022
F$ASMPL                  00004000   TSR                   00000034
F$OMUT                   00000400

                            RTIEQU/SCRAP;NOX,SCRAP;NOX,SCRAP;NOX;RDSZ=100
****** ERROR   310--
                            SCRAP   IDNT    0,0            SCRATCH / STACK AREA (DEBUG)
                                    OPT     PCS,FRS,BRS
                            *
                            * THIS IS JUST A SCRATCH AREA THAT WE CAN
                            * USE FOR ANYTHING WE WANT WHILE DEBUGGING
                            * IN THE XORMAX. (SYMBUG NEEDS DECLARED MEMORY)
                            *
                            * EXTERNAL REFERENCES/DEFINITIONS:
                            *
                                    XDEF    STACK
                                    XDEF    STUB
                            *
                                    XREF.S  SINGEN
                            *
                            *
               00000009             SECTION PROM
                            *
  9 00000000 000000FE               DS.B    $FE
  9 000000FE 00000002       STACK   DS.B    2              TOP OF STACK
                            *
                            * BY DECLARING THE STACK AS ABOVE, STUB FALLS ON A PAGE BOUNDARY.
                            *
                            * THIS LOOP PUTS SAMPLE DATA IN ALL THE BUFFERS IN THE INPUT
                            * SEQUENCE TABLE. AFTER USE, THIS AREA MAY BE USED AS SCRATCH
                            * SPACE.
                            *
  9 00000100 4DF8011A       STUB    LEA     BUFLST,A6      GET ADDRESS OF BUFFER LIST
  9 00000104 305E                   MOVE    (A6)+,A0
                            *
  9 00000106 303C07FF       SLOOP   MOVE    #$7FF,D0
  9 0000010A 4EB80000               JSR     SINGEN         INITIALIZE BUFFER
  9 0000010E 305E                   MOVE    (A6)+,A0       GET POINTER TO NEXT BUFFER
  9 00000110 B0FC0000               CMP     #0,A0
  9 00000114 66F0                   BNE     SLOOP
                            *
  9 00000116 4E71                   NOP                    END OF INITIALIZER
  9 00000118 4E71                   NOP
                            *
  9 0000011A 0404042A0450   BUFLST  DC.W    $404,$42A,$450,$476,$49C,$4C2,$580,$5A6,$5CC
  9 0000012C 04E8050E0534           DC.W    $4E8,$50E,$534,$55A
```

```
196 9 00000134 0A400A660A8C          DC.W     $A40,$A66,$A8C,$9CE,$9F4,$A1A
197 9 00000140 0000                  DC.W     0
198                        *
199 9 00000142 00000200              DS.W     $100                  MORE USER SCRATCH SPACE
200                        *
201                        *
202                                  END

****** TOTAL ERRORS      1--  0
****** TOTAL WARNINGS    0--  0

SYMBOL TABLE LISTING


SYMBOL NAME     SECT   VALUE      CROSS-REF (LINENUMBERS)


.1SEC                  0000000A   -14
.AIOSIZ                00000038   -80
.AOOSIZ                00000038   -81
.COSINE                00000014   -44
.DIOSIZ                0000001C   -82
.EFFECT                0000001C   -43
.HOOSIZ                00000180   -84
.ICOS                  0000000A   -51
.IEFF                  00000018   -55
.ISCALE                00000006   -67
.ISIN                  0000000E   -52
.KWH                   00000024   -62
.PIOSIZ                0000003F   -83
.REFSIZ                00000400   -85
.SAMPLE                00000002   -42
.SCALE1                00000004   -73
.SCALE2                00000008   -74
.SCALE3                0000000C   -75
.SCALE4                00000010   -76
.SINE                  00000018   -45
.STEMP                 0000001C   -56
.TEMP                  00000012   -53
.TOFSET                0000000E   -69
.TSCALE                0000000A   -68
.VCOS                  00000002   -49
.VEFF                  00000014   -54
.VSCALE                00000002   -66
.VSIN                  00000006   -50
.WATTS                 00000020   -60
.WATTSEC               00000022   -61
AIBENT$                00000026   -33
BUFLST          9      0000011A   -194    162
CNTR                   0000002E   -117
CPR                    00000026   -116
CR                     0000000D   -25
DIBENT$                00000026   -32
DSFTENT$               00000010   -36
EEPROM                 00000007   -7
EOT                    00000004   -22
ETX                    00000003   -21
F$ASMPL                00004000   -89
F$GNUT                 00000400   -93
F$KYED                 00000100   -95
F$MON                  00000080   -96
F$OST                  00001000   -91
F$PDI                  00000800   -92
F$PROC                 00002000   -90
F$XMIT                 00000200   -94
FF                     0000000C   -24
HT                     00000009   -23
IPTENT$                00000014   -34
MAXAGE                 00000004   -16
ONESEC                 00030090   -13
ONETIK                 000009C4   -15
OPTENT$                00000004   -35
```

```
FAAR                 00000014   -110
FACR                 0000000C   -106
FADDR                00000004   -102
FADR                 00000010   -108
FBAR                 00000016   -111
FBCR                 0000000E   -107
FBDDR                00000006   -103
FBDR                 00000012   -109
PCDDR                00000008   -104
PCDR                 00000018   -112
PGCR                 00000000   -100
PIVR                 0000000A   -105
PROM                 00000009     -6    171
PSR                  0000001A   -113
PSRR                 00000002   -101
PULL      MACR  *               -139
PUSH      MACR  *               -124
RAM                  00000005     -8
S60                  000039DF    -12
SINGEN    XREF  *    00000000   -167    166
SLOOP           9    00000106   -185    189
SPACE                00000020    -26
STACK     XDEF  9    000000FE   -174   -164
STUB      XDEF  9    00000100   -182   -165
STX                  00000002    -20
TCR                  00000020   -114
TIVR                 00000022   -115
TSR   .              00000034   -118

        RTIRAM   IDNT     0,5               RTI ram definition  2/03/83
                 OPT      PCS
        *
        *
        * EXTERNAL REFERENCES/DEFINITIONS:
        *
        * TABLES/BUFFERS:
        *
                 XDEF     AIB$
                 XDEF     CSA$
                 XDEF     DIB$
                 XDEF     IST$
        *
        * QUEUES:
        *
                 XDEF     AUXIQ$
                 XDEF     AUXOQ$
                 XDEF     DATIQ$
                 XDEF     HSTIQ$
                 XDEF     HSTOQ$
                 XDEF     PFCIQ$
                 XDEF     PCVBUF
        *
        * TASKS:
        *
                 XDEF     T_ANALOG
                 XDEF     T_DIAG
                 XDEF     T_DONUT
                 XDEF     T_KB
                 XDEF     T_OFFLOG
                 XDEF     T_OUTPUT
                 XDEF     T_PROCES
                 XDEF     T_XMON
        *
        * STACKS:
        *
                 XDEF     S_ANALOG
                 XDEF     S_DIAG
                 XDEF     S_DONUT
                 XDEF     S_KB
                 XDEF     S_OFFLOG
                 XDEF     S_OUTPUT
                 XDEF     S_PROCES
```

```
                              XDEF    S_XMON
                        *
                              XDEF    AUXTRAK
                              XDEF    EX.RAM
                              XDEF    HOSTRAK
                              XDEF    RAMEND
                              XDEF    RAMSTR
                              XDEF    RAMTBL
                        *
                        *
             00000005         SECTION  5                    RAM SECTION
                        *
  5          00000000   RAMSTR   EQU     *
  5          00004000   RAMEND   EQU     *+$4000            16KB OF RAM FOR NOW
                        *
                        * ANALOG INPUT BUFFERS:
                        *
  5 00000000 00000720   AIB$     DS.B    AIBENT$*48         48 ANALOG INPUT BUFFERS
                        *
                        * DIGITAL INPUT BUFFERS:
                        *
  5 00000720 00000260   DIB$     DS.B    DIBENT$*16         16 DIGITAL INPUT BUFFERS
                        *
                        * INPUT SEQUENCE TABLE:
                        *
  5 00000980 000000D2   IST$     DS.W    105                105 WORDS FOR INPUT SEQ. TABLE
                        *
                        * CLUSTER STATUS MASKS & MAP.
                        *
                        * NOTE: THE 1ST 5 GROUPS OF 3 WORDS
                        *       EACH ARE THE CLUSTER STATUS
                        *       MASKS 0-4, AND THE LAST 3
                        *       WORDS ARE THE CLUSTER STATUS
                        *       MAP.
                        *
  5 00000A52 00000024   CSM$     DS.W    18                 CLUSTER STATUS MASKS & MAP
                        *
                        *
                        * QUEUES:
                        *
  5 00000A76 00000008   AUXIQ$   DS.W    4                  PROGRAMMING PORT (AUX) INPUT QUEUE
  5 00000A7E 00000038            DS.B    .AIQSIZ
                        *
  5 00000AB6 00000008   AUXOQ$   DS.W    4                  PROGRAMMING PORT (AUX) OUTPUT QUEUE
  5 00000ABE 00000038            DS.B    .AOQSIZ
                        *
  5 00000AF6 00000008   DNTIQ$   DS.W    4                  DONUT RECEIVER QUEUE
  5 00000AFE 00000038            DS.W    .DIQSIZ            (ELEMENT SIZE IS WORD, NOT BYTE)

                        *
  5 00000B36 00000008   HSTIQ$   DS.W    4                  INPUT QUEUE FROM HOST (XMTMON)
  5 00000B3E 000000C8            DS.B    .HIQSIZ

                        *
  5 00000C06 00000008   HSTOQ$   DS.W    4                  OUTPUT QUEUE TO HOST
  5 00000C0E 00000180            DS.B    .HOQSIZ
                        *
  5 00000D8E 00000008   PRCIQ$   DS.W    4                  PROCESS INPUT QUEUE
  5 00000D96 0000007E            DS.W    .PIQSIZ            (ELEMENT SIZE IS WORD, NOT BYTE)
                        *
  5 00000E14 00000400   RCVBUF   DS.B    .REFSIZ            DOWNLOAD BUFFER (NOT REALLY QUEUE)
                        *
                        * ACIA STATUS TRACKING REGISTERS:
                        *
  5 00001214 00000001   AUXTRAK  DS.B    1                  AUX ACIA TRACKING REGISTER
  5 00001215 00000001   HOSTRAK  DS.B    1                  HOST ACIA TRACKING REGISTER
                        *
                        * TASK FRAMES:
                        *
  5 00001216 00000022   T_ANALOG DS.B    TK$SIZ             A/D PROCESSING TASK
  5 00001238 00000022   T_DONUT  DS.B    TK$SIZ             DONUT INPUT PROCESSING TASK
  5 0000125A 00000022   T_OFFLOD DS.B    TK$SIZ             UP/DN LOAD TASK
```

```
5 0000127C 00000022   T_PROCES DS.B    TK$SIZ              BUFFER PROCESSING TASK
5 0000129E 00000022   T_OUTPUT DS.B    TK$SIZ              OUTPUT CALCULATIONS TASK
5 000012C0 00000022   T_KB     DS.B    TK$SIZ              KEYBOARD TASK
5 000012E2 00000022   T_XMON   DS.B    TK$SIZ              XMIT MONITOR TASK
5 00001304 00000022   T_DIAG   DS.B    TK$SIZ              DIAGNOSTIC TASK
                      *
                      * TASK STACKS:
                      *
                      * NOTE:  THESE ALLOCATIONS INCLUDE BOTH USER & SUPERVISOR STACKS.
                      *        THE SUPERVISOR STACK SIZE IS DETERMINED IN TSKINI. FOR
                      *        NOW, WE'LL USE 60 BYTES OF SPACE FOR THE SUPERVISOR STACK.
                      *        (THIS ASSUMES THAT THE EXEC DOES NOT SAVE ALL REGISTERS ON
                      *        TASK CHANGE AND THAT ALL TASKS ARE RUNNING IN USER MODE)
                      *        THE STACK FORMAT IS AS FOLLOWS:
                      *
                      *              DS.L  USRSIZ       USER STACK SIZE
                      *        LABEL DS.L  SUPERSIZ     SUPER STACK SIZE
                      *
5 00001326 00000190            DS.L    100
5 000014B6 00000190   S_ANALOG DS.L    100
                      *
5 00001646 00000190            DS.L    100
5 000017D6 00000190   S_OUTPUT DS.L    100
                      *
5 00001966 00000190            DS.L    100
5 00001AF6 00000190   S_OFFLOD DS.L    100
                      *
5 00001C86 00000190            DS.L    100
5 00001E16 00000190   S_PROCES DS.L    100
                      *
5 00001FA6 00000190            DS.L    100
5 00002136 00000190   S_OUTPUT DS.L    100
                      *
5 000022C6 00000190            DS.L    100
5 00002456 00000190   S_KB     DS.L    100
                      *
5 000025E6 00000190            DS.L    100
5 00002776 00000190   S_XMON   DS.L    100
                      *
5 00002906 00000190            DS.L    100
5 00002A96 00000190   S_DIAG   DS.L    100
                      *
                      * RAM TABLE FOR STC PACKAGE:
                      *
5 00002C26 0000001A   RAMTBL   DS.B    26
                      *
5 00002C40 0000003C   EX.RAM   DS.L    15                  RAM FOR EXEC
                      *
                      *
                               END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$XMIT | | 00000200 |
| .AIOSIZ | | 00000038 | FF | | 0000000C |
| .AOOSIZ | | 00000038 | HOSTRAW | XDEF 5 | 00001215 |
| .COSINE | | 00000014 | HSTIO$ | XDEF 5 | 00000836 |
| .DIOSIZ | | 0000001C | HSTOO$ | XDEF 5 | 00000C06 |
| .EFFECT | | 0000001C | HT | | 00000009 |
| .HIOSIZ | | 000000C8 | IPTENT$ | | 00000014 |
| .HOOSIZ | | 00000180 | IST$ | XDEF 5 | 00000980 |
| .ICOS | | 0000000A | MAXAGE | | 00000004 |
| .IEFF | | 00000018 | NEXTSK | | 00000030 |
| .ISCALE | | 00000006 | ONESEC | | 0003D090 |
| .ISIN | | 0000000E | ONETIK | | 000009C4 |

| | | | | | | | |
|---|---|---|---|---|---|---|---|
| .KWH | | | 00000024 | OPTENT$ | | | 00000004 |
| .PIOSIZ | | | 0000003F | FAAR | | | 00000014 |
| .REFSIZ | | | 00000400 | FACR | | | 0000000C |
| .SAMPLE | | | 00000002 | FADDR | | | 00000004 |
| .SCALE1 | | | 00000004 | FADR | | | 00000010 |
| .SCALE2 | | | 00000008 | FBAR | | | 00000016 |
| .SCALE3 | | | 0000000C | FBCR | | | 0000000E |
| .SCALE4 | | | 00000010 | FBDDR | | | 00000006 |
| .SINE | | | 00000018 | FBDR | | | 00000012 |
| .SPNJP | MACR | * | | FCDDR | | | 00000008 |
| .STEMP | | | 0000001C | FCDR | | | 00000018 |
| .TEMP | | | 00000012 | FGCR | | | 00000000 |
| .TOFSET | | | 0000000E | FIVR | | | 0000000A |
| .TSCALE | | | 0000000A | FRCIO$ | XDEF | 5 | 00000DEE |
| .VCOS | | | 00000002 | FROM | | | 00000009 |
| .VEFF | | | 00000014 | FSR | | | 0000001A |
| .VSCALE | | | 00000002 | PSRR | | | 00000002 |
| .VSIN | | | 00000006 | PULL | MACR | * | |
| .WATTS | | | 00000020 | PUSH | MACR | * | |
| .WATTSEC | | | 00000022 | RAM | | | 00000005 |
| AIB$ | XDEF | 5 | 00000000 | RAMEND | XDEF | 5 | 00004000 |
| AIBENT$ | | | 00000026 | RAMSTR | XDEF | 5 | 00000000 |
| AUXIO$ | XDEF | 5 | 00000A76 | RAMTBL | XDEF | 5 | 00002C26 |
| AUXOO$ | XDEF | 5 | 00000AB6 | RCVBUF | XDEF | 5 | 00000E14 |
| AUXTRAK | XDEF | 5 | 00001214 | RDYALL | | | 00000008 |
| CHGENT | | | 00000034 | READY | | | 00000004 |
| CNTR | | | 0000002E | RELEAS | | | 0000002C |
| CPR | | | 00000024 | RESERV | | | 00000028 |
| CR | | | 0000000D | RESTRT | | | 0000003C |
| CSM$ | XDEF | 5 | 00000A52 | S60 | | | 000039DF |
| CTRL13 | | | 00000000 | SAV$ | | | 0000002A |
| CTRL2 | | | 00000002 | SPACE | | | 00000020 |
| DEVINI | | | 00000014 | STX | | | 00000002 |
| DI$DEV | | | 0000000A | SUSPEN | | | 0000000C |
| DI$EVF | | | 00000000 | S_ANALOG | XDEF | 5 | 000014B6 |
| DI$ION | | | 0000001B | S_DIAG | XDEF | 5 | 00002A96 |
| DI$ISV | | | 00000006 | S_DONUT | XDEF | 5 | 000017D6 |
| DI$LNK | | | 00000016 | S_MB | XDEF | 5 | 00002456 |
| DI$OWN | | | 00000002 | S_OFFLOD | XDEF | 5 | 00001AF6 |
| DI$PTR | | | 00000012 | S_OUTPUT | XDEF | 5 | 00002136 |
| DI$QUE | | | 0000000E | S_PROCES | XDEF | 5 | 00001E16 |
| DI$RSO | | | 0000001A | S_XMON | XDEF | 5 | 00002776 |
| DI$SIZ | | | 00000020 | TCR | | | 00000020 |
| DI$STA | | | 0000001C | TIMR1 | | | 00000004 |
| DI$USR | | | 0000001E | TIMR2 | | | 00000008 |
| DIB$ | XDEF | 5 | 00000720 | TIMR3 | | | 0000000C |
| DIBENT$ | | | 00000026 | TIVR | | | 00000022 |
| DNTIO$ | XDEF | 5 | 00000AF6 | TK$COM | | | 00000012 |
| DSPTENT$ | | | 00000010 | TK$ENT | | | 00000004 |
| EEPROM | | | 00000007 | TK$ID | | | 00000000 |
| EOT | | | 00000004 | TK$LPT | | | 00000016 |
| EOS | MACR | * | | TK$NXT | | | 0000001A |
| ETX | | | 00000003 | TK$PSO | | | 0000001E |
| EX$DV0 | | | 0000000A | TK$SIZ | | | 00000022 |
| EX$DV1 | | | 0000000E | TK$SSP | | | 00000008 |
| EX$DV2 | | | 00000012 | TK$STP | | | 0000000C |
| EX$DV3 | | | 00000016 | TK$STA | | | 0000000E |
| EX$DV4 | | | 0000001A | TK$TIM | | | 00000010 |
| EX$DV5 | | | 0000001E | TSKEND | | | 00000038 |
| EX$DV6 | | | 00000022 | TSKINI | | | 00000010 |
| EX$DV7 | | | 00000026 | TSR | | | 00000034 |
| EX$NXT | | | 00000006 | T_ANALOG | XDEF | 5 | 00001216 |
| EX$SIZ | | | 0000002A | T_DIAG | XDEF | 5 | 00001304 |
| EX$TIM | | | 00000000 | T_DONUT | XDEF | 5 | 00001238 |
| EX$TSK | | | 00000002 | T_MB | XDEF | 5 | 000012C0 |
| EX.RAM | XDEF | 5 | 00002C40 | T_OFFLOD | XDEF | 5 | 0000125A |
| EXEC | | | 00000000 | T_OUTPUT | XDEF | 5 | 0000129E |
| F$ASHPL | | | 00004000 | T_PROCES | XDEF | 5 | 0000127C |
| F$DNUT | | | 00000400 | T_XMON | XDEF | 5 | 000012E2 |
| F$EEPM | | | 00000040 | WAIT | | | 0000001C |
| F$KYED | | | 00000100 | WAITCN | | | 00000020 |

```
F$MON                  00000080    WAITLP              00000024
F$OST                  00001000    WAKEUP              00000018
F$PDI                  00000800    XSVC        MACR  *
F$PROC                 00002000
                              SINCOS  IDNT    1,0                SINE/COSINE TABLES     1/19/83
                                      OPT     PCS,BRS
                              *
                              * REVISED:      1/19/83
                              *
                              * AUTHOR:       D. A. ZEICHNER
                              *
                              * PURPOSE:      SINE & COSINE TABLES FOR USE BY XFORM
                              *
                              * EXTERNAL REFERENCES/DEFINITIONS:
                              *
                                      XDEF    COSINE$
                                      XDEF    SINE$
                              *
                              *
          00000009                    SECTION  PROM
                              *
                              * NOTE:  SAMPLES ARE ACTUALLY TAKEN EVERY 80 DEGREES, BUT SINCE THE
                              *        SAMPLING PERIOD IS STRETCHED OUT OVER 2 CYCLES, THE EFFECT
                              *        IS THE SAME AS IF SAMPLES HAD BEEN TAKEN EVERY 40 DEGREES
                              *        OVER THE SPACE OF A SINGLE CYCLE.
                              *
                              *        THE ORDER OF THE ENTRIES IN THE TABLES REFLECTS THE ACTUAL
                              *        ORDER IN WHICH THE SAMPLES ARE TAKEN. I.E. THE 3RD ENTRY IN
                              *        THE SINE$ TABLE IS USED IN PROCESSING THE 3RD SAMPLE IN THE
                              *        ANALOG INPUT BUFFER.
                              *
                              *        THE ENTRIES IN THE TABLES ARE THE SINE(OR COSINE) OF THE ANGLE
                              *        DIVIDED BY 4.5. THE 4.5 APPEARS AS A CONSTANT IN THE FOURIER
                              *        EQUATION, AND IS INCLUDED IN THE TABLE TO AVOID UNNECESSARY
                              *        CALCULATION. (SEE EQN. SECTION OF DESIGN SPEC FOR DETAILS)
                              *
 9 00000000 E38E393E          COSINE$ DC.L    $E38E393E          COS(0)/4.5
 9 00000004 9E0F893C                  DC.L    $9E0F893C          COS(80)/4.5
 9 00000008 D5D4EDEE                  DC.L    $D5D4EDEE          COS(160)/4.5
 9 0000000C E38F45ED                  DC.L    $E38F45ED          COS(240)/4.5
 9 00000010 AE50D33E                  DC.L    $AE50D33E          COS(320)/4.5
 9 00000014 AE51F33E                  DC.L    $AE51F33E          COS(400)/4.5
 9 00000018 E38C36ED                  DC.L    $E38C36ED          COS(480)/4.5
 9 0000001C D5D585EE                  DC.L    $D5D585EE          COS(560)/4.5
 9 00000020 9E08FE3C                  DC.L    $9E08FE3C          COS(640)/4.5
                              *
                              *
 9 00000024 00000000          SINE$   DC.L    $00000000          SIN(0)/4.5
 9 00000028 E01920E3                  DC.L    $E01920E3          SIN(80)/4.5
 9 0000002C 9EA8F03D                  DC.L    $9EA8F03D          SIN(160)/4.5
 9 00000030 C51155EE                  DC.L    $C51155EE          SIN(240)/4.5
 9 00000034 92458E2E                  DC.L    $92458E2E          SIN(320)/4.5
 9 00000038 924458E3E                 DC.L    $924458E3E         SIN(400)/4.5
 9 0000003C C512373E                  DC.L    $C512373E          SIN(480)/4.5
 9 00000040 9EA5EAED                  DC.L    $9EA5EAED          SIN(560)/4.5
 9 00000044 E0197AEE                  DC.L    $E0197AEE          SIN(640)/4.5
                              *
                              *
                                      END

****** TOTAL ERRORS      0--
****** TOTAL WARNINGS    0--
SYMBOL TABLE LISTING


SYMBOL NAME    SECT   VALUE        SYMBOL NAME     SECT   VALUE


.1SEC                 0000000A     F$ASMPL                00004000
.AIOSIZ               0000003B     F$DNUT                 00000400
.AOOSIZ               00000036     F$KYBD                 00000100
```

```
.COSINE       00000014   F$MON              00000080
.DIOSIZ       0000001C   F$OST              00001000
.EFFECT       0000001C   F$PDI              00000800
.HIOSIZ       00000010   F$PROC             00002000
.HOGSIZ       00000180   F$XMIT             00000200
.ICOS         0000000A   FF                 0000000C
.IEFF         00000018   HT                 00000009
.ISCALE       00000006   IPTENT$            00000014
.ISIN         0000000E   MAXAGE             00000004
.KWH          00000024   ONESEC             0003D090
.PIOSIZ       0000003F   ONETIK             000009C4
.RCFSIZ       00000400   OPTENT$            00000004
.SAMPLE       00000002   PAAR               00000014
.SCALE1       00000004   PACR               0000000C
.SCALE2       00000008   PADDR              00000004
.SCALE3       0000000C   PADR               00000010
.SCALE4       00000010   PBAR               00000016
.SINE         00000018   PBCR               0000000E
.STEMP        0000001C   PBDDR              00000006
.TEMP         00000012   PBDR               00000012
.TOFSET       0000000E   PCDDR              00000008
.TSCALE       0000000A   PCDR               00000018
.VCOS         00000002   PGCR               00000000
.VEFF         00000014   PIVR               0000000A
.VSCALE       00000002   PROM               00000009
.VSIN         00000006   PSR                0000001A
.WATTS        00000020   PSRR               00000002
.WATTSEC      00000022   PULL     MACR   *
AIBENT$       00000026   PUSH     MACR   *
CNTR          0000002E   RAM                00000005
COSINE$  XDEF  9  00000000   S60            000039DF
CPR           00000024   SINE$    XDEF   9  00000024
CR            0000000D   SPACE              00000020
DIBENT$       00000026   STX                00000002
DSPTENT$      00000010   TCR                00000020
EEPROM        00000007   TIVR               00000022
EOT           00000004   TSR                00000034
ETX           00000003
```

```
          TBLINI   IDNT     0,3                INITIALIZE INPUT SEQUENCE TABLE   2/16/83
                   OPT      PCS,BRS
          *
          * SUBROUTINE:     TBLINI
          *
          * STARTED:        2/16/83
          *
          * AUTHOR:         D. A. ZEICHNER
          *
          * PURPOSE:        BUILD THE INPUT SEQUENCE TABLE AND CLUSTER STATUS MASKS.
          *
          * INPUTS:         NONE.
          *
          * OUTPUTS:        INITIALIZED INPUT SEQUENCE TABLE AND CLUSTER STATUS MASKS.
          *
          * INTERNAL REGISTER ALLOCATION:
          *
          *          A0 - POINTS TO CLUSTER STATUS MAP
          *          A1 - POINTS TO INPUT PERSONALITY TABLE
          *          A2 - POINTS TO NEXT INPUT SEQUENCE TABLE ENTRY
          *          A3 - GP SCRATCH REGISTER
          *
          *          D0 - GP SCRATCH REGISTER
          *          D1 - GP SCRATCH REGISTER
          *          D4 - LAST GROUP BUILT IN INPUT SEQUENCE TABLE
          *          D5 - PRESENT INPUT PERSONALITY TABLE ENTRY #
          *          D6 - PRESENT VOLTAGE GROUP #
          *          D7 - OFFSET INTO INPUT PERSONALITY TABLE
          *
          * EXTERNAL REFERENCES/DEFINITIONS:
          *
                   XDEF     TBLINI
          *
```

```
                              * RAM REFERENCES:
                              *
                                      XREF.S   S:AIB$
                                      XREF.S   S:CSM$
                                      XREF.S   S:IST$
                              *
                              * EEPROM REFERENCE:
                              *
                                      XREF     IPT$
                              *
                              *
             00000009 .               SECTION  PROM
                              *
  9 00000000 41FAFFFE         TBLINI  LEA      CSM$(PC),A0        A0 POINTS TO CLUSTER STATUS MAP
  9 00000004 43F900000000             LEA      IPT$,A1            A1 POINTS TO INPUT PERSONALITY TABLE
  9 0000000A 45FAFFF4                 LEA      IST$(PC),A2        A2 POINTS TO INPUT SEQUENCE TABLE
                              *
                              * INITIALIZE IST ENTRIES TO -1.
                              *
  9 0000000E 303C00C8                 MOVE     #203,D0            NUMBER OF BYTES TO INIT. (-1)
                              *
  9 00000012 50F20000         SETLUP  ST       (A2,D0)            SET BYTE IN TABLE TO -1
  9 00000016 51C8FFFA                 DBRA     D0,SETLUP          LOOP UNTIL DONE
                              *
                              * INITIALIZE CLUSTER STATUS MASKS TO 0.
                              *
  9 0000001A 7023                     MOVEQ    #35,D0             NUMBER OF BYTES TO INIT. (-1)
                              *
  9 0000001C 42300000         CLRLUP  CLR.B    (A0,D0)            SET BYTE TO 0.
  9 00000020 51C8FFFA                 DBRA     D0,CLRLUP          LOOP UNTIL DONE
                              *
                              * BUILD TABLE BY VOLTAGE GROUP #. WITHIN VOLTAGE GROUPS,
                              * SAVE VOLTAGES FIRST, THEN CURRENTS IN ORDER FOUND IN
                              * IPT.
                              *
                              * NOTE: D6 CONTAINS VOLTAGE GROUP #, AND D5
                              *         CONTAINS IPT ENTRY NUMBER.
                              *
                                      FOR      D6 = #0 TO #4 DO
  9 0000002A                  Z_L1.001
                              *
  9 0000002A 4287                       CLR.L    D7               CLEAR IPT ENTRY OFFSET
                              *
                                        FOR      D5 = #0 TO #47 DO
  9 00000032                  Z_L1.003
                              *
                              * GET IPT ENTRY
                              *
  9 00000032 10317000                     MOVE.B  (A1,D7),D0      GET IPT ENTRY
  9 00000036 E208                         LSR.B   #1,D0           ISOLATE INPUT TYPE & GROUP #
                              *
                              * DOES IT = 0 AND GP = D6?
                              *
                                          IF.B    D0 <EQ> D6 THEN
  9 0000003C 617C                           BSR     ISTINT        SAVE INPUT # & BUFFER PTR
  9 0000003E 61000094                       BSR.L   SETCSM        SET APPROPRIATE BIT IN CSM
                              *
                                          ENDI
  9 00000042                  Z_L1.004
  9 00000042 06470014                     ADD     #IPTENT$,D7     BUMP IPT OFFSET TO NEXT ENTRY
                                        ENDF                      END ENTRY
                              *
                              * NOW DO ALL CURRENTS FOR
                              * THIS VOLTAGE GROUP.
                              *
  9 0000004E 4287                       CLR.L    D7               INIT. IPT ENTRY OFFSET
                              *
  9 00000056                  Z_L1.008
                              *
                              * GET IPT ENTRY
                              *
```

```
9 00000056 10317000            MOVE.B   (A1,D7),D0         GET IFT ENTRY
9 0000005A EC08                LSR.B    #6,D0              ISOLATE INPUT TYPE
                     *
                     * IF IT = 1 (CURRENT) AND VG = GROUP (CURRENT INPUT BELONGS
                     * TO GROUP BEING PROCESSED), THEN MAKE A NEW IST ENTRY.
                     *
                               IF.B     D0 <EQ> #1 THEN
9 00000062 10317003              MOVE.B   3(A1,D7),D0      GET VG OF THIS ENTRY
9 00000066 02000007              AND.B    #7,D0            ISOLATE VG
                                 IF.B     D0 <EQ> D6 THEN
9 0000006E 614A                    BSR      ISTINT         SET NEXT IST ENTRY
9 00000070 6162                    BSR      SETCSM         SET BIT IN CSM
                                 ENDI
  9 00000072         Z_L1.011
                               ENDI
  9 00000072         Z_L1.009
9 00000072 06470014            ADD      #IFTENT$,D7        BUMP OFFSET TO NEXT IFT ENTRY
                             ENDF                          END ENTRY
                     *
                     * IF THE PRECEDING WORD IS $FFFF, THEN THERE WERE NO ENTRIES FOR
                     * THIS VOLTAGE GROUP. IN THIS CASE, DON'T BUMP IST$ POINTER.
                     *
                             IF       -2(A2) <NE> #$FFFF THEN
9 00000086 544A                ADDQ     #2,A2              BUMP IST POINTER TO NEXT WORD
                             ENDI
  9 00000088         Z_L1.015
                           ENDF                            END GROUP
                     *
                     * BACK IST POINTER UP ONE WORD, AND
                     * APPEND TEMPERATURE INPUT (IF ANY)
                     * TO THIS LAST GROUP.
                     *
9 00000090 554A            SUBQ     #2,A2                  BACK UP IST PTR
9 00000092 4247            CLR      D7                     CLEAR OFFSET INTO IFT
9 00000094 1C04            MOVE.B   D4,D6                  SET GROUP TO LAST VALID.
                     *
                           FOR      D5 = #0 TO #47 DO
  9 0000009C         Z_L1.019
9 0000009C 10317000          MOVE.B   (A1,D7),D0           GET 1ST BYTE OF IFT ENTRY
9 000000A0 EC08              LSR.B    #6,D0                ISOLATE INPUT TYPE
                     *
                             IF.B     D0 <EQ> #2 THEN
9 000000A8 6110                BSR      ISTINT             BUILD A NEW IST ENTRY
9 000000AA 6128                BSR      SETCSM             & SET THE APPROPRIATE CSM BIT
                             ENDI
  9 000000AC         Z_L1.020
9 000000AC 06470014          ADD      #IFTENT$,D7          BUMP OFFSET TO NEXT IFT ENTRY
                           ENDF
                     *
9 000000B8 4E75            RTS                             THIS WAY OUT!!!!!!
                     *
                     *
                     * SUBROUTINES:
                     *
                     * ISTINT - INITIALIZES AN INPUT SEQUENCE TABLE (IST) ENTRY.
                     *          THE 1ST WORD OF THE ENTRY IS SET TO THE VALUE
                     *          IN ENTRY, AND THE 2ND WORD IS SET TO POINT TO
                     *          THE ANALOG INPUT BUFFER CORRESPONDING TO THE
                     *          ENTRY NUMBER. THE PRESENT IST ENTRY POINTER IS
                     *          ALSO INCREMENTED.
                     *
                     * INPUTS: ENTRY - INPUT NUMBER TO BE INSERTED IN LOW 5 BITS OF
                     *                 1ST WORD OF CURRENT IST ENTRY.
                     *         A2 - POINTS TO PRESENT IST ENTRY
                     *
                     * OUTPUT: A2 - POINTS TO NEXT IST ENTRY
                     *         A3 - POINTS TO ENTRY'TH ANALOG INPUT BUFFER (AIB)
                     *         D0 - OFFSET TO ENTRY'TH AIB
                     *
9 000000BA 15450001  ISTINT MOVE.B D5,1(A2)                STORE INPUT # IN THIS IST ENTRY
9 000000BE 3005             MOVE   D5,D0                   CALCULATE OFFSET TO BUFFER
```

```
9 000000C0 C0FC0026            MULU    #AIEENT$,D0         CALCULATE OFFSET TO TABLE
9 000000C4 47FAFF3A            LEA     AIB$(PC),A3
9 000000C8 47F30000            LEA     (A3,D0),A3          CALCULATE POINTER TO BUFFER
9 000000CC 354B0002            MOVE    A3,2(A2)            SAVE POINTER
9 000000D0 584A                ADDQ    #4,A2               BUMP TO NEXT ENTRY
9 000000D2 4E75                RTS                         DONE!
                       *
                       * SETCSM - SET THE APPROPRIATE BIT IN THE PROPER CLUSTER STATUS MASK.
                       *          BIT 47 IS THE MSB, AND CORRESPONDS TO INPUT #47
                       *
                       * INPUTS: D6 - CSM IN WHICH TO SET BIT.
                       *         D5 - BIT IN CSM TO BE SET.
                       *
                       * OUTPUT: D0,D1 DESTROYED
                       *         D4 - CONTAINS PRESENT GROUP PROCESSED (D6)
                       *
9 000000D4 3806        SETCSM  MOVE    D6,D4               UPDATE LAST GROUP PROCESSED
9 000000D6 3006                MOVE    D6,D0               GET GROUP # & CALC BYTE OFFSET TO CSM
9 000000D8 C0FC0006            MULU    #6,D0               EACH ENTRY IS 6 BYTES LONG
                       *
                       * NOW SET OFFSET TO POINT TO BYTE IN
                       * WHICH SPECIFIED BIT IS CONTAINED.
                       * NOTE THAT BIT #47-40 ARE IN THE 1ST
                       * BYTE.
                       *
9 000000DC 722F                MOVEQ   #47,D1
9 000000DE 9245                SUB     D5,D1
9 000000E0 E649                LSR     #3,D1               CALCULATE BYTE OFFSET INTO CSM
9 000000E2 D041                ADD     D1,D0               TO BYTE CONTAINING SPECIFIED BIT
                       *
9 000000E4 0BF00000            BSET    D5,(A0,D0)          SET THE BIT
9 000000E8 4E75                RTS
                       *
                       *
                               END
```

****** TOTAL ERRORS 0

SYMBOL TABLE LISTING

| SYMBOL NAME | SECT | VALUE | SYMBOL NAME | SECT | VALUE |
|---|---|---|---|---|---|
| .ISEC | | 0000000A | FF | | 0000000C |
| .AIOSIZ | | 00000038 | HT | | 00000009 |
| .AOOSIZ | | 00000038 | IPT$ | XREF | * 00000000 |
| .COSINE | | 00000014 | IPTENT$ | | 00000014 |
| .DIOSIZ | | 0000001C | IST$ | XREF 5 | 00000000 |
| .EFFECT | | 0000001C | ISTINT | 9 | 000000BA |
| .HIOSIZ | | 00000010 | MAXAGE | | 00000004 |
| .HOOSIZ | | 00000180 | ONESEC | | 00030090 |
| .ICOS | | 0000000A | ONETIK | | 000009C4 |
| .IEFF | | 00000018 | OPTENT$ | | 00000004 |
| .ISCALE | | 00000006 | PAAR | | 00000014 |
| .ISIN | | 0000000E | PACR | | 0000000C |
| .KWH | | 00000024 | PADDR | | 00000004 |
| .PIOSIZ | | 0000003F | PADR | | 00000010 |
| .REFSIZ | | 00000400 | PBAR | | 00000016 |
| .SAMPLE | | 00000002 | PBCR | | 0000000E |
| .SCALE1 | | 00000004 | PBDDR | | 00000005 |
| .SCALE2 | | 00000008 | PBDR | | 00000012 |
| .SCALE3 | | 0000000C | PCDDR | | 00000008 |
| .SCALE4 | | 00000010 | PCDR | | 00000018 |
| .SINE | | 00000018 | PGCR | | 00000000 |
| .STEMP | | 0000001C | PIVR | | 0000000A |
| .TEMP | | 00000012 | PROM | | 00000009 |
| .TOFSET | | 0000000E | PSR | | 0000001A |
| .TSCALE | | 0000000A | PSRR | | 00000002 |
| .VCOS | | 00000002 | PULL | MACR * | |
| .VEFF | | 00000014 | PUSH | MACR * | |
| .VSCALE | | 00000002 | RAM | | 00000005 |

| | | | | | | | |
|---|---|---|---|---|---|---|---|
| .VSIN | | | 00000006 | S60 | | | 000039DF |
| .WATTS | | | 00000020 | SETCSM | | 9 | 00000004 |
| .WATTSEC | | | 00000022 | SETLUP | | 9 | 00000012 |
| AIE$ | XREF | 5 | 00000000 | SPACE | | | 00000020 |
| AIEENT$ | | | 00000026 | STX | | | 00000002 |
| CLRLUP | | 9 | 0000001C | TBLINI | XDEF | 9 | 00000000 |
| CNTR | | | 0000002E | TCR | | | 00000020 |
| CPR | | | 00000024 | TIVR | | | 00000022 |
| CR | | | 0000000D | TSR | | | 00000034 |
| CSM$ | XREF | 5 | 00000000 | Z_L1.001 | | 9 | 0000002A |
| DIEENT$ | | | 00000026 | Z_L1.003 | | 9 | 00000032 |
| DSPTENT$ | | | 00000010 | Z_L1.004 | | 9 | 00000042 |
| EEPROM | | | 00000007 | Z_L1.006 | | 9 | 00000056 |
| EOT | | | 00000004 | Z_L1.009 | | 9 | 00000072 |
| ETX | | | 00000003 | Z_L1.011 | | 9 | 00000072 |
| F$ASMFL | | | 00004000 | Z_L1.015 | | 9 | 00000086 |
| F$DMUT | | | 00000400 | Z_L1.019 | | 9 | 0000009C |
| F$KYBD | | | 00000100 | Z_L1.020 | | 9 | 000000AC |
| F$MON | | | 00000080 | Z_L2.000 | | 9 | 0000008A |
| F$OST | | | 00001000 | Z_L2.002 | | 9 | 00000048 |
| F$PDI | | | 00000800 | Z_L2.007 | | 9 | 00000078 |
| F$PROC | | | 00002000 | Z_L2.018 | | 9 | 00000082 |
| F$XMIT | | | 00000200 | | | | |

```
                              TIMGR   IDNT     0,3                  TIMER MANAGER  1/17/83
                                      OPT      PCS,BRS
                              *
                              * SUBROUTINE:    TIMRD/TIMWR
                              *
                              * REVISED:       1/17/83
                              *
                              * AUTHOR:        D. A. ZEICHNER
                              *
                              * PURPOSE:       UPDATE/RETRIEVE THE SAMPLING PERIOD FOR THE SPECIFIED CLUSTER
                              *
                              * INPUTS:        D0 - BITS 31-16 NEW VALUE OF SPECIFIED CLUSTER
                              *                     BITS 15-0  CLUSTER # TO READ/UPDATE
                              *
                              * OUTPUTS:       D0 - BITS 15-0 VALUE OF SPECIFIED CLUSTER
                              *                CARRY SET IF INVALID CLUSTER #
                              *
                              * EXTERNAL REFERENCES/DEFINITIONS:
                              *
                                      XDEF     TIMRD
                                      XDEF     TIMWR
                              *
                              * LOCAL DATA AREA:
                              *
            00000005                  SECTION  RAM
                              *
  5 00000000 0000000A         CTRTBL  DS.W     5                    COUNTER STORAGE
                              *
                              *
            00000009                  SECTION  PROM
                              *
  9 00000000                  TIMRD   PUSH     A0/D1
  9 00000004 0C400004                 CMP      #4,D0
  9 00000008 622A                     BHI      TIMERR               GROUP # OUT OF RANGE - QUIT
  9 0000000A E340                     ASL      #1,D0                CALCULATE OFFSET
  9 0000000C 41FAFFF2                 LEA      CTRTBL(PC),A0
  9 00000010 30300000                 MOVE     (A0,D0),D0           READ SPECIFIED TIMER
  9 00000014 6018                     BRA      TIMXIT
                              *
  9 00000016                  TIMWR   PUSH     A0/D1
  9 0000001A 0C400004                 CMP      #4,D0                GROUP # IN RANGE?
  9 0000001E 6214                     BHI      TIMERR               NO - QUIT NOW
  9 00000020 3200                     MOVE     D0,D1                YES - ISOLATE GROUP #
  9 00000022 E341                     ASL      #1,D1                AND CALCULATE OFFSET INTO TABLE
  9 00000024 4840                     SWAP     D0                   GET TIMER VALUE INTO LOWER HALF OF D0
  9 00000026 41FAFFD8                 LEA      CTRTBL(PC),A0        POINT TO COUNTER TABLE
  9 0000002A 31801000                 MOVE     D0,(A0,D1)           & STORE VALUE IN TABLE
                              *
```

```
  9 0000002E          TIMXIT  PULL    A0/D1             RESTORE REGISTERS
  9 00000032 4E75             RTS                       & RETURN OK
                      *
  9 00000034 023C0001 TIMERR  AND     #1,CCR            SET CARRY
  9 00000038 60F4             BRA     TIMXIT            & RETURN BAD
                      *
                      *
                              END

****** TOTAL ERRORS      0--
****** TOTAL WARNINGS    0--
SYMBOL TABLE LISTING
```

| SYMBOL NAME | SECT | VALUE | SYMBOL NAME | SECT | VALUE |
|---|---|---|---|---|---|
| .ISEC | | 0000000A | F$ONUT | | 00000400 |
| .AIOSIZ | | 00000038 | F$KYBD | | 00000100 |
| .AOOSIZ | | 00000038 | F$MON | | 00000080 |
| .COSINE | | 00000014 | F$OST | | 00001000 |
| .DIOSIZ | | 0000001C | F$PDI | | 00000800 |
| .EFFECT | | 0000001C | F$PROC | | 00002000 |
| .HIOSIZ | | 00000010 | F$XMIT | | 00000200 |
| .HOOSIZ | | 00000180 | FF | | 0000000C |
| .ICOS | | 0000000A | HT | | 00000009 |
| .IEFF | | 00000018 | IPTENT$ | | 00000014 |
| .ISCALE | | 00000006 | MAXAGE | | 00000004 |
| .ISIN | | 0000000E | ONESEC | | 00030D90 |
| .KWH | | 00000024 | ONETIK | | 000009C4 |
| .PIOSIZ | | 0000003F | OPTENT$ | | 00000004 |
| .RBFSIZ | | 00000400 | PAAR | | 00000014 |
| .SAMPLE | | 00000002 | PACR | | 0000000C |
| .SCALE1 | | 00000004 | PADDR | | 00000004 |
| .SCALE2 | | 00000008 | PADR | | 00000010 |
| .SCALE3 | | 0000000C | PBAR | | 00000016 |
| .SCALE4 | | 00000010 | PBCR | | 0000000E |
| .SINE | | 00000018 | PBDDR | | 00000006 |
| .STEMP | | 0000001C | PBDR | | 00000012 |
| .TEMP | | 00000012 | PCDDR | | 00000008 |
| .TOFSET | | 0000000E | PCDR | | 00000018 |
| .TSCALE | | 0000000A | PGCR | | 00000000 |
| .VCOS | | 00000002 | PIVR | | 0000000A |
| .VEFF | | 00000014 | PROM | | 00000009 |
| .VSCALE | | 00000002 | PSR | | 0000001A |
| .VSIN | | 00000006 | PSRR | | 00000002 |
| .WATTS | | 00000020 | PULL | MACR | * |
| .WATTSEC | | 00000022 | PUSH | MACR | * |
| AIBENT$ | | 00000026 | RAM | | 00000005 |
| CNTR | | 0000002E | S&O | | 000039DF |
| CPR | | 00000024 | SPACE | | 00000020 |
| CR | | 0000000D | STX | | 00000002 |
| CTRTBL | 5 | 00000000 | TCR | | 00000020 |
| DIBENT$ | | 00000026 | TIMERR | 9 | 00000034 |
| DSPTENT$ | | 00000010 | TIMRD | XDEF 9 | 00000000 |
| EEPROM | | 00000007 | TIMWR | XDEF 9 | 00000016 |
| EOT | | 00000004 | TIMXIT | 9 | 0000002E |
| ETX | | 00000003 | TIVR | | 00000022 |
| F$ASNPL | | 00004000 | TSR | | 00000034 |

```
          UPLOAD  IDNT    0,6                 Transmit selected table to host 3/09/83
                  OPT     PCS,BRS
          *
          *
          * SUBROUTINE:   UPLOAD
          *
          * REVISED:      3/09/83
          *
          * AUTHOR:       D. A. ZEICHNER
          *
          * PURPOSE:      Format and transmit selected table to host.
          *
```

```
                              * INPUTS:          D0 - Table I.D. (ASCII 0-3)
                              *
                              * OUTPUTS:         No registers preserved.
                              *                  No exception processing.
                              *
                              * EXTERNAL REFERENCES/DEFINITIONS:
                              *
                                     XDEF     UPLOAD
                                     XDEF     TBLTBL
                              *
                              * HARDWARE REFERENCES:
                              *
                                     XREF     HOSTACIA
                              *
                              * RAM REFERENCES:
                              *
                                     XREF.S   5:HOSTRAM
                                     XREF.S   5:T_KB
                                     XREF.S   5:T_XMON
                              *
                              * EEPROM REFERENCES:
                              *
                                     XREF     DSFT$
                                     XREF     IPT$
                                     XREF     OPT$
                                     XREF     RAMERR
                              *
                              * EPROM (PROGRAM) REFERENCES:
                              *
                                     XREF.S   9:DISPCH
                                     XREF.S   9:XMTCHR
                                     XREF.S   9:XMTMSG
                              *
                              *
              00000009               SECTION  PROM
                              *
  9           00000000        UPLOAD EQU      *
                              *
                              * DISABLE KEYBOARD & XMTMON TASKS
                              *
  9 00000000 41FAFFFE                LEA      T_KB(PC),A0
  9 00000004 346B000E                MOVE     TK$STM(A0),A2        Save state mask
  9 00000008 426B000E                CLR      TK$STM(A0)
  9 0000000C 426B000C                CLR      TK$STF(A0)           & make sure task is dead!
                              *
  9 00000010 08B800070000            BCLR     #7,HOSTRAM           Clear IRF bit in tracking reg.
  9 00000016 13FAFFE80000            MOVE.B   HOSTRAM(PC),HOSTACIA & Shut off receive IRF
             0000
  9 0000001E 41FAFFE0                LEA      T_XMON(PC),A0        Suspend XMTMON task
  9 00000022 426B000C                CLR      TK$STF(A0)           Flags cleared, it really won't run now!
                              *
  9 00000026 4880                    EXT      D0                   Clear MSB of function code (TBL #)
                              *
                              * Calculate index to table sizes.
                              * Message size in D1, table address in A1.
                              * Message size is # of bytes transmitted,
                              * excluding header and byte count itself.
                              *
  9 00000028 3200                    MOVE     D0,D1
  9 0000002A 04410030                SUB      #$30,D1              Convert to binary
  9 0000002E C2FC0006                MULU     #6,D1                * 4 for offset.
  9 00000032 41FA0060                LEA      TBLTBL(PC),A0
  9 00000036 22701002                MOVE.L   2(A0,D1),A1          Get address of table.
  9 0000003A 32301000                MOVE     (A0,D1),D1           Get # of bytes in table to move.
                              *
                              * Transmit message header.
                              *
  9 0000003E C141                    EXG      D0,D1                Save table ID for a minute
  9 00000040 41FA004E                LEA      HDRMSG(PC),A0        Pointer to message
  9 00000044 4EBAFFBA                JSR      XMTMSG(PC)           Send header
                              *
```

```
                                * Transmit byte count (MSB first)
                                *
9 00000048 E058                         ROR     #8,D0
9 0000004A 4EBAFFB4                     JSR     XMTCHR(PC)
9 0000004E E058                         ROR     #8,D0
9 00000050 4EBAFFAE                     JSR     XMTCHR(PC)
                                *
9 00000054 C141                         EXG     D0,D1           Get table ID back
9 00000056 4247                         CLR     D7              Initialize CRC
9 00000058 4EBAFFA6                     JSR     XMTCHR(PC)      Transmit Table ID.
9 0000005C 5841                         SUBQ    #5,D1           Adjust msg size for table size -1
                                *
9 0000005E 1019                 UPLUP   MOVE.B  (A1)+,D0        Get next byte of table
9 00000060 4EBAFF9E                     JSR     XMTCHR(PC)      & transmit it.
9 00000064 51C9FFF8                     DBRA    D1,UPLUP
                                *
                                * Transmit CRC & message trailer.
                                *
9 00000068 3007                         MOVE    D7,D0           Get CRC
9 0000006A E058                         ROR     #8,D0           Isolate MSB first
9 0000006C 4EBAFF92                     JSR     XMTCHR(PC)      Xmit it
9 00000070 E058                         ROR     #8,D0           Same for LSB
9 00000072 4EBAFF8C                     JSR     XMTCHR(PC)
9 00000076 303C0003                     MOVE    #ETX,D0         Send End Of Text. (trailer)
9 0000007A 4EBAFF84                     JSR     XMTCHR(PC)
                                *
9 0000007E 303C000C                     MOVE    #FF,D0          Clear out display
9 00000082 4EBAFF7C                     JSR     DISPCH(PC)

                                * Re-enable keyboard task.
9 00000086 41FAFF78                     LEA     T_KB(PC),A0
9 0000008A 314A000E                     MOVE    A2,TK$STM(A0)   Put state mask back
                                *
9 0000008E 4E75                 UPXIT   RTS                     This way out.
                                *
                                *
                                * Messages & Tables:
                                *
9 00000090 020255               HDRMSG  DC.B    2,STX,'U'
                                *
                                * Message sizes are calculated as follows:
                                *
                                *       # of bytes in table + 1 for ID + 2 for CRC + 1 for ETX
                                *
9 00000094 0024                 TBLTBL  DC.W    36
9 00000096 00000000                     DC.L    RAMERR          Start of ID table
                                *
9 0000009A 03C4                         DC.W    (48*IPTENT$)+4
9 0000009C 00000000                     DC.L    IPT$            Start of Input Personality table
                                *
9 000000A0 0104                         DC.W    (64*4)+4
9 000000A2 00000000                     DC.L    OPT$            Start of Output Personality table
                                *
9 000000A6 0104                         DC.W    (16*DSFTENT$)+4
9 000000A8 00000000                     DC.L    DSFT$           Start of donut scale factor table
                                *
                                *
                                        END

****** TOTAL ERRORS      0--
****** TOTAL WARNINGS    0--
SYMBOL NAME   SECT  VALUE        SYMBOL NAME    SECT   VALUE

.1SEC               0000000A     FF                    0000000C
.AIOSIZ             0000003A     HT                    00000009
.AOOSIZ             00000038     IPT$      XREF   *    00000000
.COSINE             00000014     IPTENT$               00000014
.DIOSIZ             0000001C     IST$      XREF   5    00000000
.EFFECT             0000001C     ISTINT           9    000000EA
.HIOSIZ             00000010     MAXAGE                00000004
```

| | | | | | | | |
|---|---|---|---|---|---|---|---|
| .HOOSIZ | | | 00000160 | ONESEC | | | [illegible] |
| .ICOS | | | 0000000A | ONETIK | | | 000009C4 |
| .IEFF | | | 00000018 | OPTENT$ | | | [illegible] |
| .ISCALE | | | 00000006 | FAAR | | | 00000014 |
| .ISIN | | | 0000000E | FACR | | | 0000000C |
| .KWH | | | 00000024 | FADDF | | | 00000004 |
| .PIOSIZ | | | 0000003F | FADF | | | 00000010 |
| .REFSIZ | | | 00000400 | FBAR | | | 0000001C |
| .SAMPLE | | | 00000002 | FBCR | | | 0000000E |
| .SCALE1 | | | 00000004 | FBDDF | | | 00000006 |
| .SCALE2 | | | 00000005 | FBDR | | | 00000012 |
| .SCALE3 | | | 0000000C | FCDDF | | | 0000000E |
| .SCALE4 | | | 00000010 | FCDR | | | 00000018 |
| .SINE | | | 00000018 | FGCR | | | 00000000 |
| .STEMP | | | 0000001C | FIVR | | | 0000000A |
| .TEMP | | | 00000012 | FROM | | | 00000009 |
| .TOFSET | | | 0000000E | FSR | | | 0000001A |
| .TSCALE | | | 0000000A | PSRF | | | 00000002 |
| .VCOS | | | 00000002 | PULL | MACR | * | |
| .VEFF | | | 00000014 | PUSH | MACR | * | |
| .VSCALE | | | 00000002 | RAM | | | 00000005 |
| .VSIN | | | 00000006 | S60 | | | 000039DF |
| .WAITS | | | 00000020 | SETCOM | | 9 | 00000004 |
| .WAITSEC | | | 00000022 | SETLUP | | 9 | 00000012 |
| AIB$ | XREF | 5 | 00000000 | SPACE | | | 00000020 |
| AIBENT$ | | | 00000026 | STX | | | 00000002 |
| CLRLUP | | 9 | 0000001C | TELINI | XDEF | 9 | 00000000 |
| CNTR | | | 0000002E | TCR | | | 00000020 |
| CPR | | | 00000024 | TIVR | | | 00000022 |
| CR | | | 0000000D | TSR | | | 00000034 |
| CSM$ | XREF | 5 | 00000000 | Z_L1.001 | | 9 | 0000002A |
| DIBENT$ | | | 00000026 | Z_L1.003 | | 9 | 00000032 |
| DSFTENT$ | | | 00000010 | Z_L1.004 | | 9 | 00000042 |
| EEPROM | | | 00000007 | Z_L1.008 | | 9 | 00000056 |
| EOT | | | 00000004 | Z_L1.009 | | 9 | 00000072 |
| ETX | | | 00000003 | Z_L1.011 | | 9 | 00000072 |
| F$ASMPL | | | 00004000 | Z_L1.015 | | 9 | 00000083 |
| F$DMUT | | | 00000400 | Z_L1.019 | | 9 | 0000009C |
| F$KYED | | | 00000100 | Z_L1.020 | | 9 | 000000AC |
| F$MON | | | 00000080 | Z_L2.000 | | 9 | 0000008A |
| F$OST | | | 00001000 | Z_L2.002 | | 9 | [illegible] |
| F$PDI | | | 00000800 | Z_L2.007 | | 9 | [illegible] |
| F$PFOC | | | 00002000 | Z_L2.018 | | 9 | [illegible] |
| F$WAIT | | | 00000200 | | | | |
| DIBENT$ | | | 00000026 | TK$CON | | | 00000012 |
| DISPCH | XREF | 9 | 00000000 | TK$ENT | | | 00000004 |
| DSFT$ | XREF | * | 00000000 | TK$ID | | | 00000000 |
| DSFTENT$ | | | 00000010 | TK$LPT | | | 00000016 |
| EEPROM | | | 00000007 | TK$NXT | | | 0000001A |
| EOT | | | 00000004 | TK$RSO | | | 0000001E |
| EOS | MACR | * | | TK$SIZ | | | 00000022 |
| ETX | | | 00000003 | TK$SSP | | | 00000008 |
| EX$DV0 | | | 0000000A | TK$STP | | | 0000000C |
| EX$DV1 | | | 0000000E | TK$STM | | | 0000000E |
| EX$DV2 | | | 00000012 | TK$TIM | | | 00000010 |
| EX$DV3 | | | 00000016 | TSKEND | | | 00000036 |
| EX$DV4 | | | 0000001A | TSKINI | | | 00000010 |
| EX$DV5 | | | 0000001E | TSR | | | 00000034 |
| EX$DV6 | | | 00000022 | T_KB | XREF | 5 | 00000000 |
| EX$DV7 | | | 00000026 | T_XMON | XREF | 5 | 00000000 |
| EX$NXT | | | 00000006 | UPLOAD | XDEF | 9 | 00000000 |
| EX$SIZ | | | 0000002A | UPLUP | | 9 | 0000005E |
| EX$TIM | | | 00000000 | UPXIT | | 9 | 0000006E |
| EX$TSK | | | 00000002 | WAIT | | | 0000001C |
| EXEC | | | 00000000 | WAITCN | | | 00000020 |
| F$ASMPL | | | 00004000 | WAITLP | | | 00000024 |
| F$DMUT | | | 00000400 | WAKEUP | | | 00000018 |
| F$EEPM | | | 00000040 | XMTCHR | XREF | 9 | 00000000 |
| F$KYED | | | 00000100 | XMTMSG | XREF | 9 | 00000000 |
| F$MON | | | 00000080 | XSVC | MACR | * | |

```
                             VECINT  IDNT    0,6                    VECTOR INITIALIZATION  3/21/83
                                     OPT     FCS,BRS
                             *
                             * INTERRUPT  VECTORS INITIALIZATION SETUP ROUTINES:
                             *  ( FOR RTI & VMEBUG )
                             *
                             * EXTERNAL REFERENCES/DEFINITIONS:
                             *
                                     XDEF    VECINT
                             *
                                     XREF    TRAP15
                                     XREF    START
                             *
                             * EPROM (PROGRAM) REFERENCES:
                             *
                                     XREF.S  9:EXECSH
                                     XREF.S  9:DIRP
                                     XREF.S  9:ADIRP
                                     XREF.S  9:HOSTIO
                                     XREF.S  9:INIT
                                     XREF.S  9:AUXIO
                                     XREF.S  9:TIMINT
                                     XREF.S  9:KBIRP
                                     XREF.S  9:WDIRP

                             *
              00000009               SECTION  PROM

                             *
                             * SINCE THE REAL GUTS OF VMEBUG ARE NOT PRESENT, WE WILL
                             * REASSIGN ALL IRP VECTORS FROM 0 TO $3FC , TO THE WATCHDOG.
                             *
9 00000000 4A40              VECINT  TST     D0
9 00000002 6B24                      BMI     VECDEB                 DEBUGGING
9 00000004 41F80000                  LEA     0,A0                   POINTER TO VECTOR 0
9 00000008 303C00FF                  MOVE.W  #255,D0                ADJUST COUNT
9 0000000C 43FAFFF2                  LEA     WDIRP(PC),A1           GET THE WATCHDOG!
9 00000010 20C9              REASSN  MOVE.L  A1,(A0)+               REASSIGN & BUMP TO NEXT VECTOR
9 00000012 51C8FFFC                  DBRA    D0,REASSN              MORE VECTORS?
                             *
9 00000016 41FAFFE8                  LEA     WDIRP(PC),A0
9 0000001A 21C80078                  MOVE.L  A0,$78                 INSTALL WATCHDOG VECTOR
                             *
9 0000001E 41F900000000              LEA     START,A0
9 00000024 21C8007C                  MOVE.L  A0,$7C                 INSTALL VMEBUG VECTOR
                             *
                             * RTI VECTORS- SIMULATE POWER ON RESET, INITIALIZE OUR VECTORS,
                             *              SET SYSTEM STACK POINTER, & JUMP TO INIT.
                             *
9 00000028 41FAFFD6          VECDEB  LEA     INIT(PC),A0
9 0000002C 21C800B8                  MOVE.L  A0,$B8                 INSTALL TRAP 14 (RESTART)
                             *
9 00000030 41FAFFCE                  LEA     EXECSH(PC),A0
9 00000034 21C800BC                  MOVE.L  A0,$BC                 INSTALL TRAP 15 (TASK MANAGER)
                             *
9 00000038 41FAFFC6                  LEA     DIRP(PC),A0
9 0000003C 21C80148                  MOVE.L  A0,$52*4               INSTALL DONUT IRP SVC VECTOR
                             *
9 00000040 41FAFFBE                  LEA     TIMINT(PC),A0
9 00000044 21C80150                  MOVE.L  A0,$54*4               INSTALL RTC VECTOR
                             *
9 00000048 41FAFFB6                  LEA     KBIRP(PC),A0
9 0000004C 21C80184                  MOVE.L  A0,$61*4               INSTALL KEYBOARD VECTOR
                             *
9 00000050 41FAFFAE                  LEA     AUXIO(PC),A0
9 00000054 21C80074                  MOVE.L  A0,$74                 INSTALL HOST PORT IRP VECTOR
                             *
9 00000058 41FAFFA6                  LEA     ADIRP(PC),A0
9 0000005C 21C8018C                  MOVE.L  A0,$63*4               INSTALL A/D VECTOR
                             *
9 00000060 41FAFF9E                  LEA     HOSTIO(PC),A0
```

```
9 00000064 21C80190          MOVE.L   A0,$190          INSTALL AUX PORT VECTOR
                       *
9 00000068 4E75              RTS                       RETURN TO INIT
                       *
                       *

                             END
```

```
****** TOTAL ERRORS      0--
****** TOTAL WARNINGS    0--
SYMBOL TABLE LISTING
```

| SYMBOL NAME | SECT | | VALUE | SYMBOL NAME | SECT | | VALUE |
|---|---|---|---|---|---|---|---|
| .1SEC | | | 0000000A | F$MON | | | 00000080 |
| .AIOSIZ | | | 00000038 | F$OST | | | 00001000 |
| .AOOSIZ | | | 00000038 | F$PDI | | | 00000800 |
| .COSINE | | | 00000014 | F$PROC | | | 00002000 |
| .DIOSIZ | | | 0000001C | F$XMIT | | | 00000200 |
| .EFFECT | | | 0000001C | FF | | | 0000000C |
| .HIOSIZ | | | 000000C8 | HOSTIO | XREF | 9 | 00000000 |
| .HOOSIZ | | | 00000180 | HT | | | 00000009 |
| .ICOS | | | 0000000A | INIT | XREF | 9 | 00000000 |
| .IEFF | | | 00000018 | IPTENT$ | | | 00000014 |
| .ISCALE | | | 00000006 | KEIRP | XREF | 9 | 00000000 |
| .ISIN | | | 0000000E | MAXAGE | | | 00000004 |
| .KWH | | | 00000024 | ONESEC | | | 00030090 |
| .PIOSIZ | | | 0000003F | ONETIK | | | 00003FC4 |
| .PRPSIZ | | | 00000400 | OPTENT$ | | | 00000004 |
| .SAMPLE | | | 00000002 | PAAR | | | 00000014 |
| .SCALE1 | | | 00000004 | PACR | | | 0000000C |
| .SCALE2 | | | 00000008 | PADDR | | | 00000004 |
| .SCALE3 | | | 0000000C | PADR | | | 00000010 |
| .SCALE4 | | | 00000010 | PBAR | | | 00000016 |
| .SINE | | | 00000018 | PBCR | | | 0000000E |
| .STEMP | | | 0000001C | PBDDR | | | 00000006 |
| .TEMP | | | 00000012 | PBDR | | | 00000012 |
| .TOFSET | | | 0000000E | PCDDR | | | 00000008 |
| .TSCALE | | | 0000000A | PCDR | | | 00000018 |
| .VCOS | | | 00000002 | PGCR | | | 00000000 |
| .VEFF | | | 00000014 | PIVR | | | 0000000A |
| .VSCALE | | | 00000002 | PROM | | | 00000009 |
| .VSIN | | | 00000006 | PSR | | | 0000001A |
| .WATTS | | | 00000020 | PSRR | | | 00000002 |
| .WATTSEC | | | 00000022 | PULL | MACR | * | |
| ADIRP | XREF | 9 | 00000000 | PUSH | MACR | * | |
| AIBENT$ | | | 00000026 | RAM | | | 00000005 |
| AUXIO | XREF | 9 | 00000000 | REASSN | | 9 | 00000010 |
| CNTR | | | 0000003E | SOD | | | 0000390F |
| CPF | | | 00000024 | SPACE | | | 00000020 |
| CR | | | 00000000 | START | XREF | * | 00000000 |
| CTRL13 | | | 00000000 | STX | | | 00000002 |
| CTRL2 | | | 00000002 | TCR | | | 00000020 |
| DIBENT$ | | | 00000026 | TIMINT | XREF | 9 | 00000000 |
| DIPP | XREF | 9 | 00000000 | TIMR1 | | | 00000004 |
| DSPTENT$ | | | 00000010 | TIMR2 | | | 00000008 |
| EEPROM | | | 00000007 | TIMR3 | | | 0000000C |
| EOT | | | 00000004 | TIVR | | | 00000022 |
| ETX | | | 00000003 | TRAP15 | XREF | * | 00000000 |
| EXECSW | XREF | 9 | 00000000 | TSR | | | 00000034 |
| F$ASMPL | | | 00004000 | VECDEB | | 9 | 0000002B |
| F$CNJT | | | 00000400 | VECINT | XDEF | 9 | 00000000 |
| F$EEPM | | | 00000040 | WDIPP | XREF | 9 | 00000000 |
| F$KYED | | | 00000100 | | | | |

```
                       WDINIT   IDNT     0,0                Watchdog Initializer  3/16/83
                                OPT      FCS,BRS
                       *
                       *
                       * SUBROUTINE:     WDINIT
```

```
                        *
                        * REVISED:      3/15/83
                        *
                        * AUTHOR:       T. WEBER
                        *
                        * PURPOSE:      INITIALIZE THE PTM MC6840.
                        *
                        * INPUTS:       NONE.
                        *
                        * OUTPUTS:      A0 - ONLY REGISTER PRESERVED.
                        *
                        * EXTERNAL REFERENCES DEFINITIONS:
                        *
                                XDEF    WDINIT
                                XDEF    WDSTRT
                                XDEF    WDFEED
                        *
                        * HARDWARE REFERENCES:
                        *
                                XREF    WTCHDOG
                        *
                        *
           00000009             SECTION PROM
                        *
                        *
 9         00000000     WDINIT  EQU     *
                        *
                        * Initialize PTM - PROGRAMMABLE TIMER MODULE , MC6840 SERIES
                        *
                        * OCCUPIES IRP VECTOR $78
                        *
 9 00000000                     PUSH    A0                  SAVE REG
 9 00000004 41F900000000        LEA     WTCHDOG,A0          POINT TO PTM
 9 0000000A 42280002            CLR.B   CTRL2(A0)           ENABLE WRITE TO CTRL REG. 3
 9 0000000E 10BC0040            MOVE.B  #$40,(A0)           CTR 3 OUTPUT OFF, REP COUNT, IRP ENABLE
                        *
 9 00000012 117C00010002        MOVE.B  #1,CTRL2(A0)        ENABLE WRITE TO CTRL REG. 1
 9 00000018 10BC0001            MOVE.B  #1,(A0)             RESET TIMER & CLEAR IRPS
 9 0000001C 303C4E20            MOVE    #$4E20,D0           1 SEC COUNT @ 1200 BAUD X 16 CLOCK
 9 00000020 01880000C           MOVEP   D0,TIMR3(A0)        SET THE COUNTER
 9 00000024                     PULL    A0                  RESTORE REG
 9 00000028 4E75                RTS
                        *
                        *
                        *
                        * WDSTRT - START THE WATCH DOG
                        *
 9         0000002A     WDSTRT  EQU     *
 9 0000002A                     PUSH    A0
 9 0000002E 41F900000000        LEA     WTCHDOG,A0          POINT TO PTM
 9 00000034 4210                CLR.B   (A0)                START TIMER (bit 0)
 9 00000036                     PULL    A0
 9 0000003A 4E75                RTS
                        *
                        *

                        *
                        * WDFEED - FEED THE WATCHDOG
                        *
 9         0000003C     WDFEED  EQU     *
 9 0000003C                     PUSH    A0                  SAVE A0
 9 00000040 41F900000000        LEA     WTCHDOG,A0          POINT TO PTM
 9 00000046 10BC0001            MOVE.B  #1,(A0)             TOGGLE CONTROL REG 1
 9 0000004A 4210                CLR.B   (A0)                TO TICK TIMER
 9 0000004C                     PULL    A0
 9 00000050 4E75                RTS
                        *
                        *
                                END

****** TOTAL ERRORS      0--
****** TOTAL WARNINGS    0--
```

SYMBOL TABLE LISTING

| SYMBOL NAME | SECT | VALUE | CROSS-REF (LINENUMBERS) | | |
|---|---|---|---|---|---|
| .1SEC | | 0000000A | -14 | | |
| .AIQSIZ | | 0000003B | -80 | | |
| .AOQSIZ | | 0000003B | -81 | | |
| .COSINE | | 00000014 | -44 | | |
| .DIQSIZ | | 0000001C | -82 | | |
| .EFFECT | | 0000001C | -43 | | |
| .HIQSIZ | | 000000C8 | -84 | | |
| .HOQSIZ | | 00000180 | -85 | | |
| .ICOS | | 0000000A | -51 | | |
| .IEFF | | 00000018 | -55 | | |
| .ISCALE | | 00000006 | -67 | | |
| .ISIN | | 0000000E | -52 | | |
| .KWH | | 00000024 | -62 | | |
| .PIQSIZ | | 0000003F | -83 | | |
| .RBFSIZ | | 00000400 | -86 | | |
| .SAMPLE | | 00000002 | -42 | | |
| .SCALE1 | | 00000004 | -73 | | |
| .SCALE2 | | 00000008 | -74 | | |
| .SCALE3 | | 0000000C | -75 | | |
| .SCALE4 | | 00000010 | -76 | | |
| .SINE | | 00000018 | -45 | | |
| .STEMP | | 0000001C | -56 | | |
| .TEMP | | 00000012 | -53 | | |
| .TOFSET | | 0000000E | -69 | | |
| .TSCALE | | 0000000A | -68 | | |
| .VCOS | | 00000002 | -49 | | |
| .VEFF | | 00000014 | -54 | | |
| .VSCALE | | 00000002 | -66 | | |
| .VSIN | | 00000006 | -50 | | |
| .WATTS | | 00000020 | -60 | | |
| .WATTSEC | | 00000022 | -61 | | |
| AIBENT$ | | 00000026 | -33 | | |
| CNTR | | 0000002E | -119 | | |
| CFF | | 00000024 | -118 | | |
| CR | | 00000000 | -25 | | |
| CTRL13 | | 00000000 | -124 | | |
| CTRL2 | | 00000002 | -125 | 204 | 207 |
| DIBENT$ | | 00000026 | -32 | | |
| DSPTENT$ | | 00000010 | -36 | | |
| EEPROM | | 00000007 | -7 | | |
| EOT | | 00000004 | -22 | | |
| ETX | | 00000003 | -21 | | |
| F$ASMPL | | 00004000 | -90 | | |
| F$DNUT | | 00000400 | -94 | | |
| F$EEPM | | 00000040 | -98 | | |
| F$KYBD | | 00000100 | -96 | | |
| F$MON | | 00000080 | -97 | | |
| F$OST | | 00001000 | -92 | | |
| F$PDI | | 00000800 | -93 | | |
| F$PROC | | 00002000 | -91 | | |
| F$XMIT | | 00000200 | -95 | | |
| HT | | 00000009 | -23 | | |
| IPTENT$ | | 00000014 | -34 | | |
| MAXAGE | | 00000004 | -16 | | |
| ONESEC | | 00030D90 | -13 | | |
| ONETIK | | 000009C4 | -15 | | |
| OPTENT$ | | 00000004 | -35 | | |
| PAAR | | 00000014 | -112 | | |
| PACR | | 0000000C | -108 | | |
| PADDR | | 00000004 | -104 | | |
| PADR | | 00000010 | -110 | | |
| PBAR | | 00000016 | -113 | | |
| PBCR | | 0000000E | -109 | | |
| PBDDR | | 00000006 | -105 | | |
| PBDR | | 00000012 | -111 | | |
| PCDDR | | 00000008 | -106 | | |

```
PCDR                      00000018  -114
PGCR                      00000000  -102
PIVR                      0000000A  -107
PROM                      00000009    -6   193
PSR                       0000001A  -115
PSRR                      00000002  -103
PULL       MACR    *                -149     1   211   223   236
PUSH       MACR    *                -134     1   202   220   232
RAM                       00000005    -6
S60                       0000390F   -12
SPACE                     00000020   -26
STX                       00000002   -20
TCR                       00000020  -116
TIMR1                     00000004  -126
TIMR2                     00000008  -127
TIMR3                     0000000C  -128   210
TIVR                      00000022  -117
TSR                       00000034  -120
WDFEED     XDEF    9      0000003C  -231  -185
WDINIT     XDEF    9      00000000  -196  -183
WDSTRT     XDEF    9      0000002A  -219  -184
WTCHDOG    XREF    *      00000000  -189   203   221   233
165                            WDIRP    IDNT    0,0                  Watchdog Interrupt Service 3/09/83
166                                     OPT     PCS,BRS
167                            *
300                            *
301                            * SUBROUTINE:    WDIRP
302                            *
303                            * REVISED:       3/09/83
304                            *
305                            * AUTHOR:        T. WEBER
306                            *
307                            * PURPOSE:       This interrupt happens in the event that no one has
308                            *                ticked the PTM (watchdog), in a while. The timer will be
309                            *                reactivated, thus illiminating a stall situation.
310                            *
311                            * INPUTS:        None.
312                            *
313                            * OUTPUTS:       None.
314                            *
315                            * EXTERNAL REFERENCES/DEFINITIONS:
316                            *
317                                     XDEF    WDIRP
318                            *
319                            * EEPROM REFERENCES:
320                            *
321                                     XREF    RSTERR
322                            *
323                            * EPROM (PROGRAM) REFERENCES:
324                            *
325                                     XREF.S  9:EEPMOV
326                                     XREF.S  9:INIT
327                                     XREF.S  9:WDINIT
328                            *
329              00000009               SECTION PROM
330                            *
331 9 00000000 41F900000000 WDIRP    LEA     RSTERR,A0            GET ADRESS OF # OF RESTARTS FROM EEPROM
332 9 00000006 0C1000FF               CMP.B   #$FF,(A0)            HIT $FF YET ?
333 9 0000000A 671A                   BEQ     OVRFLW               YES - JUST RESTART
334                            *
335 9 0000000C 4EBAFFF2               JSR     WDINIT(PC)           DISABLE WATCH DOG
336 9 00000010 027CF8FF               AND     #$F8FF,SR            IRP LEVEL 0
337                            *
338 9 00000014 1F10                   MOVE.B  (A0),-(A7)           WE ONLY NEED A BYTE BUT WE GOT A WORD
339 9 00000016 5217                   ADD.B   #1,(A7)              NO - BUMP ERROR COUNT IN MEMORY
340 9 00000018 2248                   MOVE.L  A0,A1                SETUP MOVE DESTINATION
341 9 0000001A 204F                   MOVE.L  A7,A0                SETUP MOVE SOURCE
342 9 0000001C 7401                   MOVEQ   #1,D2                ONLY 1 BYTE TO MOVE INTO EEPROM
343 9 0000001E 4EBAFFE0               JSR     EEPMOV(PC)
344 9 00000022 4FEF0002               LEA     2(A7),A7             RESTORE STACK
345                            *
```

```
9 00000026 4E4E        OVRFLW   TRAP     #14                    RESET

                    *
                    *
                             END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$OUUT | | 00000400 |
| .AIOSIZ | | 0000003E | F$EEPM | | 00000040 |
| .ACOSIZ | | 00000038 | F$KYED | | 00000100 |
| .COSINE | | 00000014 | F$MON | | 00000080 |
| .DIGSIZ | | 0000001C | F$OST | | 00001000 |
| .EFFECT | | 0000001C | F$PDI | | 00000800 |
| .HIOSIZ | | 000000C8 | F$PROC | | 00002000 |
| .HOGSIZ | | 00000190 | F$*MIT | | 00000200 |
| .ICOS | | 0000000A | FF | | 0000000C |
| .IEFF | | 00000018 | HT | | 00000009 |
| .ISCALE | | 00000006 | INIT | XREF 9 | 00000000 |
| .ISIN | | 0000000E | IPTENT$ | | 00000014 |
| .KKH | | 00000024 | MANAGE | | 00000004 |
| .PIOSIZ | | 0000003F | NEXTSK | | 00000030 |
| .REFSIZ | | 00000400 | ONESEC | | 00030040 |
| .SAMPLE | | 00000002 | ONETIM | | 000009C4 |
| .SCALE1 | | 00000004 | OPTENT$ | | 00000004 |
| .SCALE2 | | 00000008 | OVRFLW | 9 | 00000026 |
| .SCALE3 | | 0000000C | PAAP | | 00000014 |
| .SCALE4 | | 00000010 | PACR | | 0000000C |
| .SINE | | 00000018 | PACDP | | 00000004 |
| .SPMUP | MACR * | . | PADP | | 00000010 |
| .STEMP | | 0000001C | PEAP | | 00000016 |
| .TEMP | | 00000012 | PECR | | 0000000E |
| .TOFSET | | 0000000E | PEDDP | | 00000006 |
| .TSCALE | | 0000000A | PEDP | | 00000012 |
| .VCOS | | 00000002 | PCDDP | | 00000008 |
| .VEFF | | 00000014 | PCDP | | 00000018 |
| .VSCALE | | 00000002 | PCCP | | 00000000 |
| .VSIN | | 00000006 | PIVP | | 0000000A |
| .WATTS | | 00000020 | PROC | | 00000009 |
| .WATTSEC | | 00000022 | PSR | | 0000001A |
| AIBENT$ | | 00000026 | PSPP | | 00000002 |
| CHGENT | | 00000034 | PULL | MACR * | |
| CNTP | | 0000002E | PUSH | MACR * | |
| CPP | | 00000024 | PAN | | 00000005 |
| CP | | 00000000 | RDYALL | | 00000002 |
| CTPL13 | | 00000030 | READY | | 00000004 |
| CTRL2 | | 00000002 | RELEAS | | 0000002C |
| DEVINI | | 00000014 | RESERV | | 00000026 |
| DI$DEV | | 0000000A | RESTRT | | [illegible] |
| DI$EVF | | 00000000 | RSTEPP | XREF * | 00000000 |
| DI$ION | | 0000001E | SEG | | 0000350F |
| DI$ISV | | 00000006 | SAV$ | | 0000002A |
| DI$LNK | | 00000016 | SPACE | | 00000020 |
| DI$GNM | | 00000002 | STX | | 00000002 |
| DI$PTP | | 00000012 | SUBPEM | | 0000000C |
| DI$QLE | | 0000000E | TCP | | 00000020 |
| DI$PEG | | 0000001A | TIMP1 | | 00000004 |
| DI$SIZ | | 00000020 | TIMP2 | | 0000000E |
| DI$USR | | 0000001E | TIVP | | 00000022 |
| DIBENT$ | | 00000026 | TK$CON | | 00000012 |
| DSPTENT$ | | 00000010 | TK$ENT | | 00000004 |
| EEPMOV | XREF 9 | 00000000 | TK$ID | | 00000000 |
| EEPROM | | 00000007 | TK$LPT | | 00000016 |
| EOT | | 00000004 | TK$NXT | | 0000001A |

```
EOS        MACR  *                  TK$RSO              0000001E
ETX                  00000003       TK$SIZ              00000022
EX$DV0               0000000A       TK$SSP              0000000B
EX$DV1               0000000E       TK$STF              0000000C
EX$DV2               00000012       TK$STM              0000000E
EX$DV3               00000016       TK$TIM              00000010
EX$DV4               0000001A       TSKEND              00000038
EX$DV5               0000001E       TSKINI              00000010
EX$DV6               00000022       TSR                 00000034
EX$DV7               00000026       WAIT                0000001C
EX$NXT               00000006       WAITCH              00000020
EX$SIZ               0000002A       WAITLP              00000024
EX$TIM               00000000       WAKEUP              00000018
EX$TSK               00000002       WDINIT    XFEF  9   00000000
EXEC                 00000000       WDIRP     XDEF  9   00000000
F$ASHFL              00004000       XSVC      MACR  *

                         XFORM   IDNT    0,2                  CALCULATE FOURIER COMPONENTS   1/19/83
                                 OPT     PCS,FRS,BRS
                         *
                         * SUBROUTINE:   XFORM
                         *
                         * STARTED:      1/19/83
                         *
                         * AUTHOR:       D. A. ZEICHNER
                         *
                         * PURPOSE:      FROM THE RAW DATA GIVEN IN THE SPECIFIED ANALOG INPUT BUFFER,
                         *               CALCULATE THE PEAK SINE AND COSINE COMPONENTS AND SAVE IN
                         *               THE BUFFER.
                         *
                         * INPUTS:       A0 - POINTER TO ANALOG INPUT BUFFER TO PROCESS.
                         *
                         * OUTPUTS:      PROCESSED BUFFER. ALL REGISTERS PRESERVED.
                         *
                         * EXTERNAL REFERENCES/DEFINITIONS:
                         *
                                 XDEF    XFORM
                         *
                         * EPROM (PROGRAM) REFERENCES:
                         *
                                 XREF.S  9:COSINE$
                                 XREF.S  9:FFPADD
                                 XREF.S  9:FFPIFP
                                 XREF.S  9:FFPMUL
                                 XREF.S  9:SINE$
                         *
                         *
            00000009             SECTION PROM
                         *
  9 00000000             XFORM   PUSH    D0-D7/A1-A3          SAVE REGISTERS
                         *
  9 00000004 4281                CLR.L   D1                   INITIALIZE COSINE COMPONENT
  9 00000006 4282                CLR.L   D2                   INITIALIZE SINE COMPONENT
  9 00000008 43FAFFF6            LEA     COSINE$(PC),A1       SET PTR TO COSINE TABLE
  9 0000000C 45FAFFF2            LEA     SINE$(PC),A2         SET PTR TO SINE TABLE
                         *
                                 FOR     A3 = #.SAMPLE TO #.SAMPLE+16 BY #2 DO
  9 00000016             Z_L1.001
  9 00000016 3E30B000              MOVE    (A0,A3),D7         GET RAW SAMPLE
  9 0000001A 04470800              SUB     #$800,D7           CONVERT TO 2'S COMPLEMENT
  9 0000001E 48C7                  EXT.L   D7                 SIGN EXTEND TO 32 BITS
  9 00000020 4EBAFFDE              JSR     FFPIFP(PC)         CONVERT TO FLOATING POINT
  9 00000024 2007                  MOVE.L  D7,D0              SAVE IN D0 FOR LATER
                         *
                         * ACCUMULATE COSINE COMPONENT
                         *
  9 00000026 2C19                  MOVE.L  (A1)+,D6           GET COSINE COEFFICIENT
  9 00000028 4EBAFFD6              JSR     FFPMUL(PC)
  9 0000002C 2C01                  MOVE.L  D1,D6
  9 0000002E 4EBAFFD0              JSR     FFPADD(PC)         ACCUMULATE COSINE VALUE
  9 00000032 2207                  MOVE.L  D7,D1
                         *
```

```
                         * NOW FOR SINE COMPONENT
                         *
9 00000034 2E00                    MOVE.L   D0,D7              RESTORE CONVERTED RAW VALUE
9 00000036 2C1A                    MOVE.L   (A2)+,D6           GET SINE COEFFICIENT
9 00000038 4EBAFFC6                JSR      FFFMUL(PC)
9 0000003C 2C02                    MOVE.L   D2,D6
9 0000003E 4EBAFFC0                JSR      FFFADD(PC)         ACCUMULATE SINE VALUE
9 00000042 2407                    MOVE.L   D7,D2
                         *
                                 ENDF
                         *
                         * SAVE COMPUTED COSINE & SINE COMPONENTS IN INPUT BUFFER.
                         *
9 0000004C 21410014              MOVE.L   D1,.COSINE(A0)
9 00000050 21420018              MOVE.L   D2,.SINE(A0)
                         *
9 00000054                       PULL     D0-D7/A1-A3          RESTORE REGISTERS
9 00000058 4E75                  RTS                           & RETURN
                         *
                         *
                                 END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$MON | | 00000080 |
| .AIOSIZ | | 00000038 | F$OST | | 00001000 |
| .AOOSIZ | | 00000038 | F$PDI | | 00000800 |
| .COSINE | | 00000014 | F$PROC | | 00002000 |
| .DIOSIZ | | 0000001C | F$XMIT | | 00000200 |
| .EFFECT | | 0000001C | FF | | 0000000C |
| .HIOSIZ | | 00000010 | FFPADD | XREF 9 | 00000000 |
| .HOOSIZ | | 00000180 | FFPIFF | XREF 9 | 00000000 |
| .ICOS | | 0000000A | FFPMUL | XREF 9 | 00000000 |
| .IEFF | | 00000018 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 0003D090 |
| .PIOSIZ | | 0000003F | ONETIK | | 000005C4 |
| .REFSIZ | | 00000400 | OPTENT$ | | 00000004 |
| .SAMPLE | | 00000002 | PAAR | | 00000014 |
| .SCALE1 | | 00000000 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR * | |
| AIBENT$ | | 00000026 | PUSH | MACR * | |
| CNTR | | 0000002E | RAM | | 00000005 |
| COSINE$ | XREF 9 | 00000000 | S60 | | 000039DF |
| CPR | | 00000024 | SINE$ | XREF 9 | 00000000 |
| CR | | 0000000D | SPACE | | 00000020 |
| DIBENT$ | | 00000026 | STX | | 00000002 |
| DSFTENT$ | | 00000010 | TCR | | 00000020 |
| EEPROM | | 00000007 | TIVR | | 00000022 |
| EOT | | 00000004 | TSR | | 00000034 |
| ETX | | 00000003 | XFORM | XREF 9 | 00000000 |

```
F$ASMPL              00004000     Z_L1.001         9   00000016
F$DHUT               00000400     Z_L2.000         9   00000046
F$KYBD               00000100
                           XMTCHR   IDNT      0,4                      Xmit byte to programming host 1/20/83
                                    OPT       PCS,BRS
                           *
                           *
                           * SUBROUTINE:      XMTCHR
                           *
                           * REVISED:         1/20/83
                           *
                           * AUTHOR:          D. A. ZEICHNER
                           *
                           * PURPOSE:         Put a character on the programming host transmit queue,
                           *                  and updates the CRC in D7.
                           *
                           * INPUTS:          D0 - byte to be queued.
                           *                  D7 - CRC (16 bits) to be updated.
                           *
                           * OUTPUTS:         D7 - Updated CRC
                           *                  D0, D1, A0 preserved
                           *
                           * EXTERNAL REFERENCES/DEFINITIONS:
                           *
                                    XDEF      XMTCHR
                           *
                           * HARDWARE REFERENCES:
                           *
                                    XREF      AUXACIA
                           *
                           * RAM REFERENCES:
                           *
                                    XREF.S    5:AUXOQ$
                                    XREF.S    5:AUXTRAK
                           *
                           * PROM REFERENCES:
                           *
                                    XREF.S    9:CRC16
                                    XREF.S    9:ENQUE
                           *
                           *
                           REGS     REG       D0-D1/D7/A0
                           *

                           *
               00000009             SECTION   PROM
                           *
9 00000000 2F08            XMTCHR   MOVE.L    A0,-(A7)               Save A0
9 00000002 41FAFFFC                 LEA       AUXOQ$(PC),A0          Get output queue
                           *
9 00000006 4EBAFFF8        XMTQUE   JSR       ENQUE(PC)              Put data on queue
9 0000000A 6412                     BCC       XMTOK                  Queue went ok - finish up
9 0000000C                          PUSH.L    REGS                   Save registers thru task change
9 00000010 4240                     CLR       D0
9 00000012 720A                     MOVEQ     #10,D1
9 00000014                          XSVC      SUSPEN                 Wait 10 ticks (100ms)
9 00000018                          PULL.L    REGS                   Restore registers
9 0000001C 60E8                     BRA       XMTQUE                 & try again.
                           *
9 0000001E 4EBAFFE0        XMTOK    JSR       CRC16(PC)              Update CRC
9 00000022 41FAFFDC                 LEA       AUXTRAK(PC),A0         Get XMIT
9 00000026 08D00005                 BSET      #5,(A0)                Xmit irq on
9 0000002A 13FAFFD40000             MOVE.B    AUXTRAK(PC),AUXACIA    Update ACIA control register
           0000
9 00000032 205F                     MOVE.L    (A7)+,A0               Restore A0
9 00000034 4E75                     RTS                              & return
                           *
                           *
                                    END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | EX$TSK | | 00000002 |
| .AIOSIZ | | 00000038 | EXEC | | 00000000 |
| .AOOSIZ | | 00000038 | F$ASMPL | | 00004000 |
| .COSINE | | 00000014 | F$DNUT | | 00000400 |
| .DIOSIZ | | 0000001C | F$KYED | | 00000100 |
| .EFFECT | | 0000001C | F$MON | | 00000080 |
| .HIOSIZ | | 00000010 | F$OST | | 00001000 |
| .HOOSIZ | | 00000180 | F$PDI | | 00000800 |
| .ICOS | | 0000000A | F$PROC | | 00002000 |
| .IEFF | | 00000018 | F$XMIT | | 00000200 |
| .ISCALE | | 00000006 | FF | | 0000000C |
| .ISIN | | 0000000E | HT | | 00000009 |
| .KWH | | 00000024 | IPTENT$ | | 00000014 |
| .PIOSIZ | | 0000003F | MAXAGE | | 00000004 |
| .REFSIZ | | 00000400 | NEXTSK | | 00000030 |
| .SAMPLE | | 00000002 | ONESEC | | 0003D090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |
| .SCALE4 | | 00000010 | PACR | | 0000000C |
| .SINE | | 00000018 | PADDR | | 00000004 |
| .SPNJP | MACR * | | PADR | | 00000010 |
| .STEMP | | 0000001C | PBAR | | 00000016 |
| .TEMP | | 00000012 | PBCR | | 0000000E |
| .TOFSET | | 0000000E | PBDDR | | 00000006 |
| .TSCALE | | 0000000A | PBDR | | 00000012 |
| .VCOS | | 00000002 | PCDDR | | 00000008 |
| .VEFF | | 00000014 | PCDR | | 00000018 |
| .VSCALE | | 00000002 | PGCR | | 00000000 |
| .VSIN | | 00000006 | PIVR | | 0000000A |
| .WATTS | | 00000020 | PROM | | 00000009 |
| .WATTSEC | | 00000022 | PSR | | 0000001A |
| AIBENT$ | | 00000026 | PSRR | | 00000002 |
| AUXACIA | XREF * | 00000000 | PULL | MACR * | |
| AUXOO$ | XREF 5 | 00000000 | PUSH | MACR * | |
| AUXTRAK | XREF 5 | 00000000 | RAM | | 00000005 |
| CHGENT | | 00000034 | RDYALL | | 00000008 |
| CNTR | | 0000002E | READY | | 00000004 |
| CPR | | 00000024 | REGS | REG * | |
| CR | | 0000000D | RELEAS | | 0000002C |
| CRC16 | XREF 9 | 00000000 | RESERV | | 00000028 |
| DEVINI | | 00000014 | RESTRT | | 0000003C |
| DI$DEV | | 0000000A | S60 | | 0000390F |
| DI$EVF | | 00000000 | SAV$ | | 0000002A |
| DI$ION | | 0000001B | SPACE | | 00000020 |
| DI$ISV | | 00000006 | STX | | 00000002 |
| DI$LNK | | 00000016 | SUSPEN | | 0000000C |
| DI$OWN | | 00000002 | TCR | | 00000020 |
| DI$PTR | | 00000012 | TIVR | | 00000022 |
| DI$QUE | | 0000000E | TK$CON | | 00000012 |
| DI$RSO | | 0000001A | TK$ENT | | 00000004 |
| DI$STA | | 0000001C | TK$LPT | | 00000016 |
| DI$USR | | 0000001E | TK$NXT | | 0000001A |
| DIBENT$ | | 00000026 | TK$RSO | | 0000001E |
| DSPTENT$ | | 00000010 | TK$SIZ | | 00000022 |
| EEPROM | | 00000007 | TK$SSP | | 00000008 |
| ENQUE | XREF 9 | 00000000 | TK$STP | | 0000000C |
| EOT | | 00000004 | TK$STM | | 0000000E |
| EOS | MACR * | | TK$TIM | | 00000010 |
| ETX | | 00000003 | TSKEND | | 00000038 |
| EX$DV0 | | 0000000A | TSKINI | | 00000010 |
| EX$DV1 | | 0000000E | TSR | | 00000034 |
| EX$DV2 | | 00000012 | WAIT | | 0000001C |
| EX$DV3 | | 00000016 | WAITCN | | 00000020 |
| EY$DV4 | | 0000001A | WAITLP | | 00000024 |

```
EX$DV5                  0000001E     WAKEUP                  00000018
EX$DV6                  00000022     XMTCHR     XDEF   9     00000000
EX$DV7                  00000026     XMTGK             9     0000001E
EX$NXT                  00000006     XMTQUE            9     00000006
EX$SIZ                  0000002A     XSVC       MACR   *
EX$TIM                  00000000

                              XMTMON   IDNT    0,7                   RTI - RTU channel monitor  3/08/83
                                       OPT     PCS,BRS
                              *
                              *
                              * SUBROUTINE:   XMTMON
                              *
                              * REVISED:      3/08/83
                              *
                              * AUTHOR:       D. A. ZEICHNER
                              *
                              * PURPOSE:      MONITOR THE RTI - RTU COMMUNICATION LINK, AND DISPLAY
                              *               THE SELECTED POINT.
                              *
                              * INPUTS:       THE POINT # TO BE MONITORED IS IN THE TASK FRAME.
                              *
                              * OUTPUTS:      N/A
                              *
                              * NOTE:   THIS TASK USES 4 BYTES OF STACK FOR LOCAL DATA.
                              *
                              * EXTERNAL REFERENCES/DEFINITIONS:
                              *
                                       XDEF    XMTMON
                              *
                              * RAM REFERENCES:
                              *
                                       XREF.S  5:HSTIO$
                                       XREF.S  5:T_XMON
                              *
                              * EPROM (PROGRAM) REFERENCES:
                              *
                                       XREF.S  9:BINASC
                                       XREF.S  9:DEQUE
                                       XREF.S  9:DISPLY
                              *
                              * LOCAL ASSIGNMENTS:
                              *
               00000000       PTVAL    EQU     0                     OFFSET TO POINT VALUE BEING ASSEMBLED
                              *
                              *
               00000009                SECTION PROM
                              *
  9 00000000 4DFAFFFE         XMTMON   LEA     T_XMON(PC),A6         POINTER TO TASK FRAME
  9 00000004 4FEFFFFA                  LEA     -6(A7),A7             RESERVE SCRATCH AREA ON STACK
  9 00000008 3F7C09040004              MOVE    #(HT*256)+EOT,PTVAL+4(A7) PUT HT, EOT PAIR IN SCRATCH AREA
                              *
  9 0000000E 6130             XMTLUP   BSR     GETCHR                WAIT FOR CONSOLE INPUT
  9 00000010 66FC                      BNE     XMTLUP                NOT A POINT # , JUST WAIT
                              *
  9 00000012 0240003F         XMTOK    AND     #$3F,D0               THIS IS A NEW POINT NUMBER - ISOLATE IT
  9 00000016 B02E001E                  CMP.B   TK$RS0(A6),D0         IS THIS THE DESIRED POINT?
  9 0000001A 66F2                      BNE     XMTLUP                NO - WAIT FOR NEXT
                              *
                              * THIS IS THE POINT WE WANT DISPLAYED. GET THE NEXT
                              * 2 CHARACTERS, ASSEMBLE THE 12 BIT VALUE, CONVERT
                              * TO ASCII, AND DISPLAY IT.
                              *
  9 0000001C 6122                      BSR     GETCHR                GET NEXT BYTE (1ST OF 12 BIT VALUE)
  9 0000001E 67EE                      BEQ     XMTLUP                POINT # - START OVER
                              *
  9 00000020 0240003F                  AND     #$3F,D0               ISOLATE THE 6 BITS OF DATA
  9 00000024 ED40                      ASL     #6,D0                 & MOVE TO MS HALF OF WORD.
  9 00000026 3E80                      MOVE    D0,PTVAL(A7)          SAVE IN STACK
                              *
  9 00000028 6116                      BSR     GETCHR                GET NEXT BYTE (2ND OF 12 BIT VALUE)
  9 0000002A 67E2                      BEQ     XMTLUP                POINT # - START OVER
```

```
9 0000002C 0240003F                 AND    #$3F,D0              ISOLATE THE DATA
9 00000030 8057                     OR     FTVAL(A7),D0         PUT 2 HALVES TOGETHER
9 00000032 4EBAFFCC                 JSR    BINASC(PC)           CONVERT TO DECIMAL ASCII
9 00000036 2E80                     MOVE.L D0,FTVAL(A7)         OVERWRITE SCRATCH AREA W/ ASCII EQUIVALENT
9 00000038 204F                     MOVE.L A7,A0                STRING POINTER FOR DISPLY
9 0000003A 4EBAFFC4                 JSR    DISPLY(PC)           AND DISPLAY IT.
9 0000003E 60CE                     BRA    WATLUP               NOW DO IT AGAIN.
                       *
                       *
                       * SUBROUTINES:
                       *
                       * GETCHR  - WAIT FOR A CHARACTER FROM THE RTI - RTU COMMUNICATION
                       *           MONITOR. DEFINE TYPE OF INPUT AND RETURN IT IN D0.
                       *         - Z FLAG SET (EQUAL), IF BYTE IS A POINT #
                       *         - CLEARED (NOT EQUAL),IF BYTE IS A DATA VALUE.
                       *
9 00000040 41FAFFBE    GETCHR       LEA    HSTIO$(PC),A0        GET POINTER TO INPUT QUEUE
9 00000044 4EBAFFBA                 JSR    DEQUE(PC)            # GET CHAR - CARRY SET IF NONE
9 00000048 640C                     BCC    GETOK                GOT A CHAR OK
                       *
9 0000004A 303C0080                 MOVE   #F$MON,D0            TASK FLAGS
9 0000004E 4241                     CLR    D1                   NO TIMEOUT ON CONSOLE INPUT
9 00000050                          XSVC   SUSPEN               WAIT FOR CHARACTER
9 00000054 60EA                     BRA    GETCHR               TRY AGAIN TO GET A CHARACTER

                       * GOT A CHARACTER FROM THE Q , CHECK FOR POINT # OF DATA ***

9 00000056 08000006    GETOK        BTST   #6,D0                START OF AN OUTPUT POINT ?
                       *
                       *
9 0000005A 4E75        GETXIT       RTS
                       *
                       *
                                    END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$EEPM | | 00000040 |
| .AIOSIZ | | 00000038 | F$KYBD | | 00000100 |
| .AOOSIZ | | 00000038 | F$MON | | 00000080 |
| .COSINE | | 00000014 | F$OST | | 00001000 |
| .DIOSIZ | | 0000001C | F$PDI | | 00000800 |
| .EFFECT | | 0000001C | F$PROC | | 00002000 |
| .HIOSIZ | | 000000C8 | F$XMIT | | 00000200 |
| .HOOSIZ | | 00000180 | FF | | 0000000C |
| .ICOS | | 0000000A | GETCHR | 9 | 00000040 |
| .IEFF | | 00000018 | GETOK | 9 | 00000056 |
| .ISCALE | | 00000006 | GETXIT | 9 | 0000005A |
| .ISIN | | 0000000E | HSTIO$ | XREF 5 | 00000000 |
| .KWH | | 00000024 | HT | | 00000009 |
| .PIOSIZ | | 0000003F | IPTENT$ | | 00000014 |
| .REFSIZ | | 00000400 | MAXAGE | | 00000004 |
| .SAMPLE | | 00000002 | NEXTSK | | 00000030 |
| .SCALE1 | | 00000004 | ONESEC | | 00030D90 |
| .SCALE2 | | 00000008 | ONETIK | | 000009C4 |
| .SCALE3 | | 0000000C | OPTENT$ | | 00000004 |
| .SCALE4 | | 00000010 | PAAR | | 00000014 |
| .SINE | | 00000018 | PACR | | 0000000C |
| .SPNJP | MACR * | | PADDR | | 00000004 |
| .STEMP | | 0000001C | PADR | | 00000010 |
| .TEMP | | 00000012 | PBAR | | 00000016 |
| .TOFSET | | 0000000E | PBCR | | 0000000E |
| .TSCALE | | 0000000A | PBDDR | | 00000006 |

```
.VCOS                  00000002   PBDR                  00000012
.VEFF                  00000014   PCDDR                 00000008
.VSCALE                00000002   PCDR                  00000018
.VSIN                  00000006   PGCR                  00000000
.WATTS                 00000020   PIVR                  0000000A
.WATTSEC               00000022   PROM                  00000039
AIBENT$                00000026   PSR                   0000001A
BINASC    XREF   9     00000000   PSRR                  00000002
CHGENT                 00000034   PTVAL                 00000000
CNTR                   0000002E   PULL     MACR   *
CPR                    00000024   PUSH     MACR   *
CR                     0000000D   RAM                   00000005
CTRL13                 00000000   RDYALL                00000008
CTRL2                  00000002   READY                 00000004
DEQUE     XREF   9     00000000   RELEAS                0000002C
DEVINI                 00000014   RESERV                00000028
DI$DEV                 0000000A   RESTRT                0000003C
DI$EVF                 00000000   S60                   000039CF
DI$ION                 0000001B   SAV$                  0000002A
DI$ISV                 00000006   SPACE                 00000020
DI$LNK                 00000016   STX                   00000002
DI$OWN                 00000002   SUSPEN                0000000C
DI$PTR                 00000012   TCR                   00000020
DI$QUE                 0000000E   TIMR1                 00000004
DI$RSO                 0000001A   TIMR2                 00000008
DI$STA                 0000001C   TIVR                  00000022
DI$USR                 0000001E   TK$CON                00000012
DIBENT$                00000026   TK$ENT                00000004
DISPLY    XREF   9     00000000   TK$ID                 00000000
DSPTENT$               00000010   TK$LPT                00000016
EEPROM                 00000007   TK$NXT                0000001A
EOT                    00000004   TK$RSO                0000001E
EOS       MACR   *                TK$SIZ                00000022
ETX                    00000003   TK$SSP                00000008
EX$DV0                 0000000A   TK$STF                0000000C
EX$DV1                 0000000E   TK$STM                0000000E
EX$DV2                 00000012   TK$TIM                00000010
EX$DV3                 00000016   TSKEND                00000039
EX$DV4                 0000001A   TSKINI                00000010
EX$DV5                 0000001E   TSR                   00000034
EX$DV6                 00000022   T_XMON   XREF   5     00000000
EX$DV7                 00000026   WAIT                  0000001C
EX$NXT                 00000006   WAITCN                00000020
EX$SIZ                 0000002A   WAITLP                00000024
EX$TIM                 00000000   WAKEUP                0000001E
EX$TSK                 00000002   XMTLUP          9     0000000E
EXEC                   00000000   XMTMON   XDEF   9     00000000
F$ASMFL                00004000   XMTOK           9     00000012
F$DNUT                 00000400   XSVC     MACR   *

         XMTMSG  IDNT    0,4                  Xmit msg to programming host 1/20/83
                 OPT     PCS,BRS
         *
         * SUBROUTINE:   XMTMSG
         *
         * STARTED:      1/20/83
         *
         * AUTHOR:       D. A. ZEICHNER
         *
         * PURPOSE:      Transmit message to programming host.
         *
         * INPUTS:       A0 - Pointer to message. 1st byte is # of characters to
         *                    be transmitted.
         *
         * OUTPUTS:      D7 - updated CRC
         *               D0, D1, A0 preserved.
         *
         * EXTERNAL REFERENCES/DEFINITIONS:
         *
                 XDEF    XMTMSG
         *
         * ERROR (PROGRAM) REFERENCE:
```

```
                               *
                                      XREF.S   9:XMTCHR
                               *
                               REGS   REG      D0-D1/A0
                               *
                               *
             00000009                 SECTION  FROM
                               *
  9 00000000                   XMTMSG PUSH.L   REGS                  Save registers
                               *
  9 00000004 1218                     MOVE.B   (A0)+,D1              Get byte count
  9 00000006 024100FF                 AND      #$FF,D1               Clear MSb of count
  9 0000000A 5341                     SUBQ     #1,D1                 Adjust for loop count
                               *
  9 0000000C 1018              XMTLUP MOVE.B   (A0)+,D0              Get character
  9 0000000E 4EBAFFF0                 JSR      XMTCHR(PC)            Transmit it
  9 00000012 51C9FFF8                 DBRA     D1,XMTLUP             & repeat until done
                               *
  9 00000016                          PULL.L   REGS                  Restore registers
  9 0000001A 4E75                     RTS                            & return
                               *
                               *
                                      END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$FYED | | 00000100 |
| .AIOSIZ | | 00000038 | F$MON | | 00000080 |
| .AOOSIZ | | 00000038 | F$OST | | 00001000 |
| .COSINE | | 00000014 | F$PDI | | 00000800 |
| .DIOSIZ | | 0000001C | F$PROC | | 00002000 |
| .EFFECT | | 0000001C | F$XMIT | | 00000200 |
| .HIOSIZ | | 00000010 | FF | | 0000000C |
| .HOOSIZ | | 00000180 | HT | | 00000009 |
| .ICOS | | 0000000A | IPTENT$ | | 00000014 |
| .IEFF | | 00000018 | MAXAGE | | 00000004 |
| .ISCALE | | 00000006 | ONESEC | | 00030D40 |
| .ISIN | | 0000000E | ONETIC | | 000007C4 |
| .LWH | | 00000024 | OPTENT$ | | 00000004 |
| .PIOSIZ | | 0000003F | PAAR | | 00000014 |
| .REFSIZ | | 00000400 | PACR | | 0000000C |
| .SAMPLE | | 00000002 | PADDR | | 00000004 |
| .SCALE1 | | 00000004 | PADR | | 00000010 |
| .SCALE2 | | 00000008 | PBAR | | 00000016 |
| .SCALE3 | | 0000000C | PBCR | | 0000000E |
| .SCALE4 | | 00000010 | PBDDR | | 00000006 |
| .SINE | | 00000018 | PBDR | | 00000012 |
| .STEMP. | | 0000001C | PCDDR | | 00000008 |
| .TEMP | | 00000012 | PCDR | | 00000018 |
| .TOFSET | | 0000000E | PGCR | | 00000000 |
| .TSCALE | | 0000000A | PIVR | | 0000000A |
| .VCOS | | 00000002 | FROM | | 00000009 |
| .VEFF | | 00000014 | PSR | | 0000001A |
| .VSCALE | | 00000002 | PSRR | | 00000002 |
| .VSIN | | 00000006 | PULL | MACR | * |
| .WATTS | | 00000020 | PUSH | MACR | * |
| .WATTSEC | | 00000022 | RAM | | 00000035 |
| AIBENT$ | | 00000026 | REGS | REG | * |
| CNTR | | 0000002E | S60 | | 0000390F |
| CPR | | 00000024 | SPACE | | 00000020 |
| CR | | 0000000D | STX | | 00000002 |
| DIBENT$ | | 00000026 | TCR | | 00000020 |
| DSFTENT$ | | 00000010 | TIVR | | 00000022 |
| EEPROM | | 00000007 | TSR | | 00000034 |
| EOT | | 00000004 | XMTCHR | XREF 9 | 00000000 |

```
ETX            00000003   XHTLUF           9   0000000C
F$ASMFL        00004000   XHTMSG    XGEF   9   00000000
F$DNUT         00000400
```

Having described my invention, what I claim as new and desire to secure by Letters Patent is:

1. Apparatus for measuring at least one characteristic of a power line conductor comprising:
- a housing removably attachable to said conductor;
- means for measuring the amplitude of at least one cyclic characteristic of power transmitted on said conductor;
- said means for measuring including means for timing amplitude measurements such that said measurements occur at a plurality of different intervals within the period of a cycle of said cyclic characteristic;
- said timing means including means for delaying said measurements by a fixed time interval such that each of said measurements is taken in a different cycle for a plurality of cycles; and
- wherein said measurements are taken over a period of n cycles with the time duration of each cycle equaling t and said fixed time interval between measurements equaling $t+(1/n)t$;
- means for calculating Fourier components of said cyclic characteristic from said measurements;
- means for transmitting said Fourier components to a remote receiver; and
- said means for measuring, means for calculating and means for transmitting each being contained in said housing.

2. Apparatus as defined in claim 1 further including means for measuring conductor temperature, conductor voltage, and conductor current.

3. Apparatus as defined in claim 2 wherein said measurements are analog values and including processing means for converting said analog values into digital values.

4. Apparatus as defined in claim 3 wherein said processing means includes means for forming said digital values into a digital message to be transmitted to said remote receiver.

5. Apparatus as defined in claim 4 wherein said data message includes an apparatus identification number, a voltage value, a current value, and an auxiliary value.

6. Apparatus as defined in claim 5 wherein said auxiliary value is one of a number of selectable characteristics including conductor temperature.

7. Apparatus as defined in claim 6 wherein said one of a number of selectable characteristics represented by said auxiliary value is identified by an auxiliary parameter number included in said data message.

8. Apparatus as defined in claim 7 wherein an auxiliary value corresponding to a different selectable characteristic is transmitted on each successive transmission and the auxiliary parameter number rotates among the numbers identifying said selectable characteristics.

9. Apparatus as defined in claim 3 further including central timing means and wherein said means for processing and said means for transmitting are controlled by said central timing means and said central timing means is synchronized to the zero-crossings of alternating current carried on said conductor.

10. Apparatus as defined in claim 4 wherein said processing means includes means for calculating an error check value and said error check value is transmitted as part of said digital message.

11. Apparatus as defined in claim 1 wherein said means for measuring includes means for converting said measurements from analog values to digital values.

12. Apparatus as defined in claim 11 wherein said means for calculating Fourier components includes means for computing a check value and said means for transmitting includes means for transmitting said check value with said Fourier components.

13. Apparatus as defined in claim 12 wherein said receiver includes means for calculating a check value, means for comparing said calculated check value to said check value transmitted with said Fourier components, and means for disregarding said transmitted Fourier components if said compared check values are not the same.

14. Apparatus as defined in claim 1 wherein said means for measuring measures the amplitude of voltage and current simultaneously.

15. Apparatus as defined in claim 14 wherein said receiver receives the Fourier components of voltage and current and includes means for calculating real and reactive power values from said received components.

16. Apparatus as defined in claim 1 wherein said cyclic characteristic of power is voltage.

17. Apparatus as defined in claim 1 wherein said cyclic characteristic of power is current.

18. Apparatus for measuring at least one characteristic of a power line conductor comprising:
- means for measuring the amplitude of at least one cyclic characteristic of power transmitted on said conductor;
- means for controlling said means for measuring such that said measurements occur at a plurality of different intervals within the period of a cycle of said cyclic characteristic;
- said means for controlling including means for delaying said measurements by a fixed time interval such that each of said measurements is taken in a different cycle for a plurality of cycles;
- means for calculating Fourier components of said cyclic characteristic from said measurements; and
- wherein said measurements are taken over a period of n cycles with the time duration of each cycle equaling t and said fixed time interval between measurements equaling $t+(1/n)t$.

19. Apparatus as defined in claim 18 wherein said means for measuring measures the amplitude of voltage and current simultaneously.

20. Apparatus as defined in claim 19 further including means for transmitting said Fourier components of voltage and current to a remote receiver.

21. Apparatus as defined in claim 20 wherein said receiver includes means for calculating real and reactive power from said received Fourier components.

22. Apparatus as defined in claim 21 further including a housing removably attachable to said conductor, said means for measuring, means for controlling, means for calculating Fourier components and means for transmitting each being contained in said housing.

* * * * *